United States Patent [19]

Shindo et al.

[11] Patent Number: 5,738,731
[45] Date of Patent: Apr. 14, 1998

[54] PHOTOVOLTAIC DEVICE

[75] Inventors: Masahiro Shindo, Toyonaka; Daisuke Kosaka, Takarazuka; Tetsuo Hikawa; Akira Takata, both of kobe; Yukihiro Ukai, Suita; Takashi Sawada, Kobe; Toshifumi Asakawa, Yamato, all of Japan

[73] Assignees: Mega Chips Corporation, Suita; Crystal Device Corporation, Toyonaka, both of Japan

[21] Appl. No.: 298,800

[22] Filed: Aug. 31, 1994

[30] Foreign Application Priority Data

| Nov. 19, 1993 | [JP] | Japan | 5-314147 |
| Nov. 19, 1993 | [JP] | Japan | 5-314470 |
| Nov. 22, 1993 | [JP] | Japan | 5-316108 |
| Dec. 10, 1993 | [JP] | Japan | 5-341322 |
| Dec. 20, 1993 | [JP] | Japan | 5-345314 |
| Dec. 27, 1993 | [JP] | Japan | 5-350297 |
| Dec. 28, 1993 | [JP] | Japan | 5-354139 |
| Feb. 9, 1994 | [JP] | Japan | 6-155505 |

[51] Int. Cl.$^6$ ............................ H01L 31/06; H01L 31/078
[52] U.S. Cl. ............................ 136/249; 257/184; 257/440; 136/262; 136/260
[58] Field of Search ............................ 136/249 TJ, 252, 136/260–262, 264–265; 257/184, 440, 461

[56] References Cited

U.S. PATENT DOCUMENTS

| 3,457,467 | 7/1969 | Amsterdam et al. | 136/261 |
| 4,163,987 | 8/1979 | Kamath et al. | 136/262 |
| 4,255,211 | 3/1981 | Fraas | 136/249 TJ |
| 4,445,965 | 5/1984 | Milnes | 437/81 |
| 4,681,982 | 7/1987 | Yoshida | 136/249 TJ |
| 4,881,979 | 11/1989 | Lewis | 136/249 TJ |

FOREIGN PATENT DOCUMENTS

| 2-184594 | 7/1990 | Japan. |
| 2-196086 | 8/1990 | Japan. |
| 2-229792 | 9/1990 | Japan. |
| 6-128072 | 5/1994 | Japan. |

OTHER PUBLICATIONS

S.M. Rossnagel et al, "Ion Beam Deposition, Film Modification and Synthesis," Mrs Bulletin vol. XIII, No. 12, pp. 40–45 (Dec. 1988).

J.S. Williams, "Subsurface Processing of Electronic Materials Assisted by Atomic Displacements," Mrs Bulletin vol. 17, No. 6, pp. 47–51 (Jun. 1992).

*Primary Examiner*—Aaron Weisstuch
*Attorney, Agent, or Firm*—Oblon, Spivak, McClelland, Maier & Neustadt, P.C.

[57] ABSTRACT

A solar cell comprising:

a first junction part having a first conductivity type first semiconductor film and a second conductivity type second semiconductor film formed on an upper surface of said first semiconductor film; and a second junction part having a first conductivity type third semiconductor film formed on an upper surface of said second semiconductor film and a second conductivity type fourth semiconductor formed on an upper surface of said third semiconductor film, said junction parts arranged from that having a larger forbidden band width along the direction of progress of light through said semiconductor layers, said first, second, third, and fourth semiconductor films being formed of single-crystalline filming;

wherein an interlayer conductor prepared from a metal forming ohmic junctions with each of said junction parts and having a thickness capable of transmitting light therethrough is interposed between said first and second junction parts; and wherein said second semiconductor film arranged on one side of said interlayer conductor is different in crystal orientation from said third semiconductor film arranged on the other side of said interlayer conductor.

6 Claims, 209 Drawing Sheets

F I G. 3 1
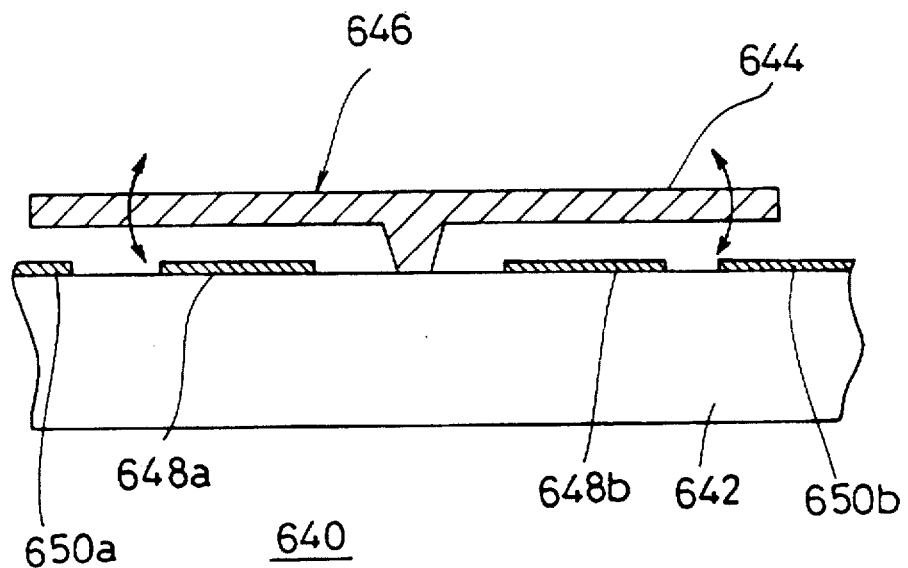
F I G. 3 2
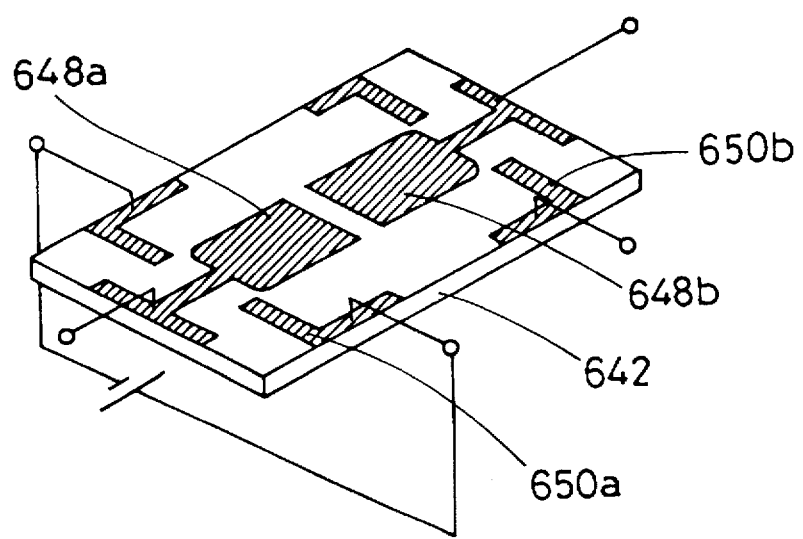

F I G . 33
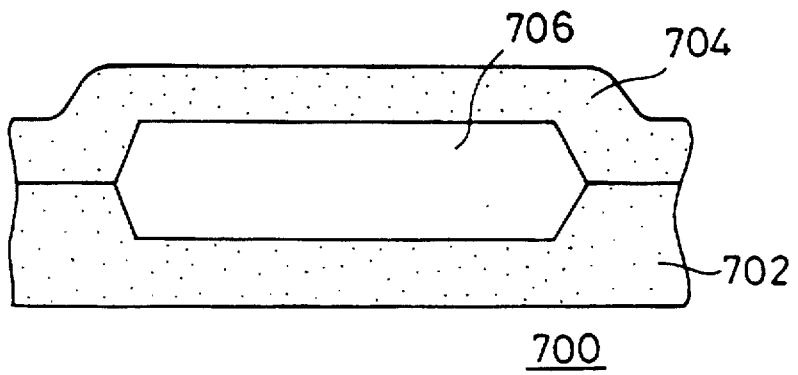
F I G . 34
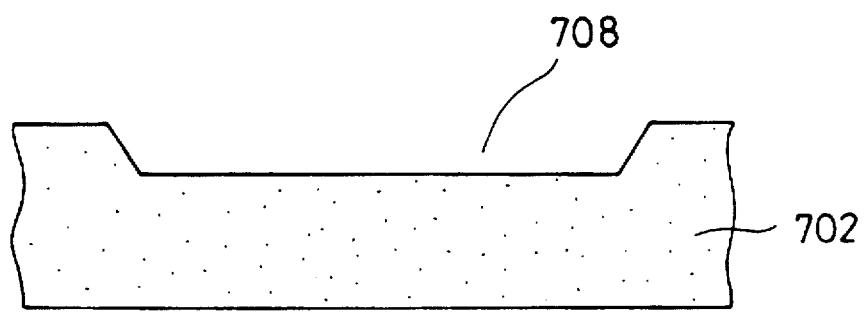

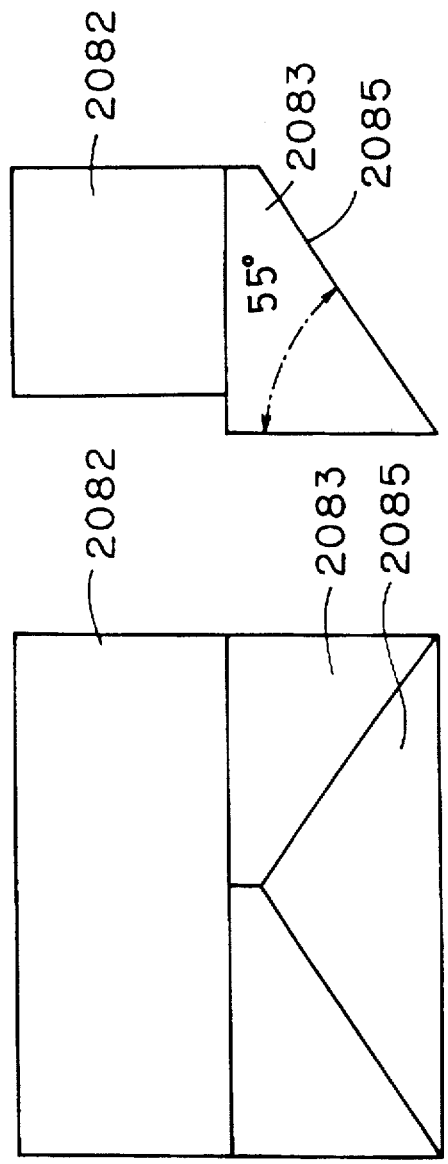
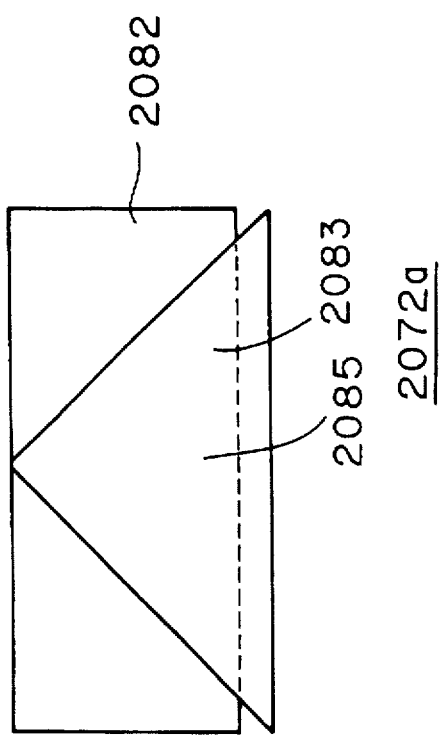
FIG. 91B
FIG. 91A
FIG. 91C

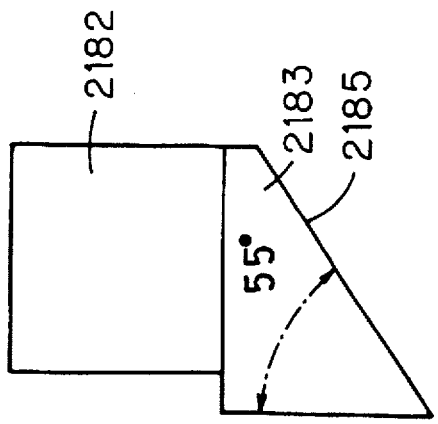
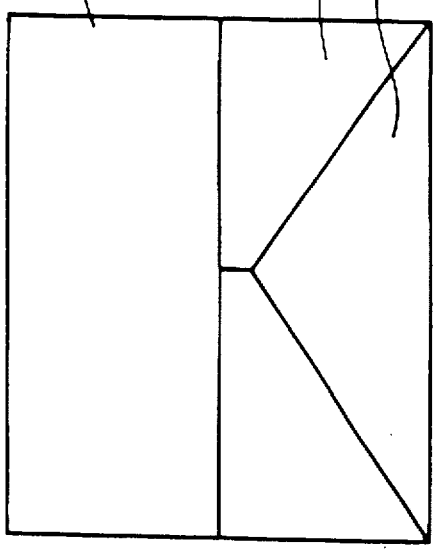
FIG.112B
FIG.112A
FIG.112C

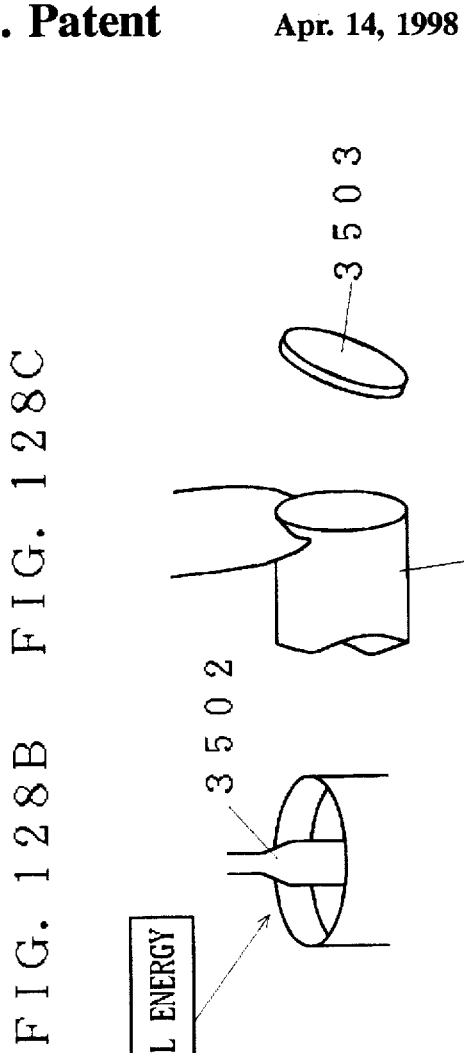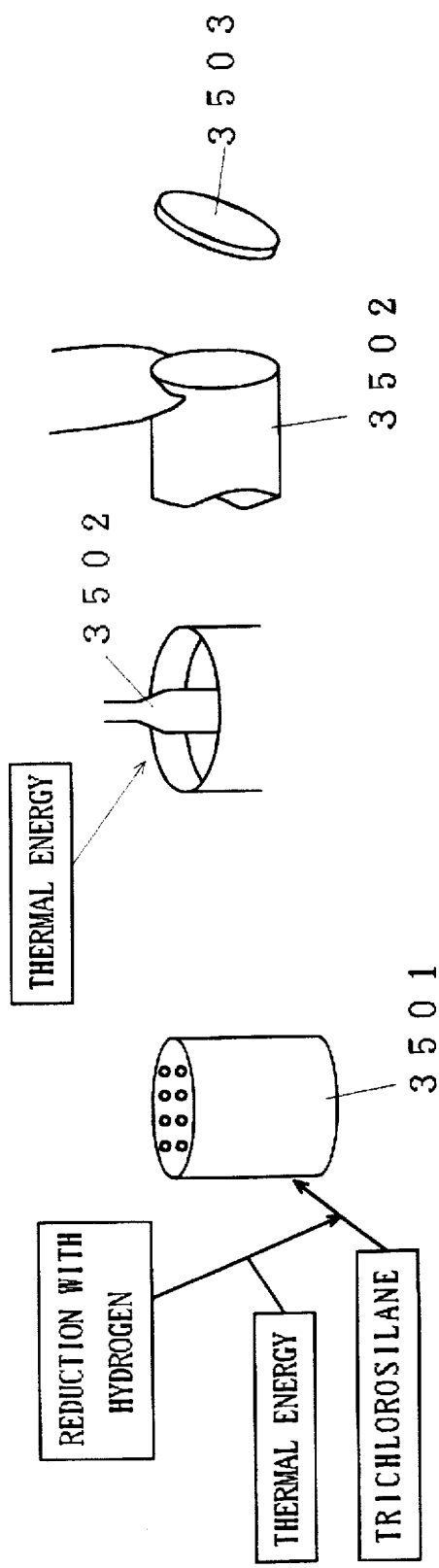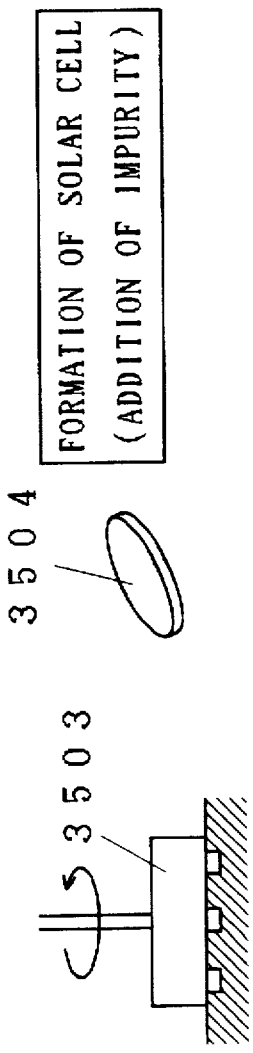

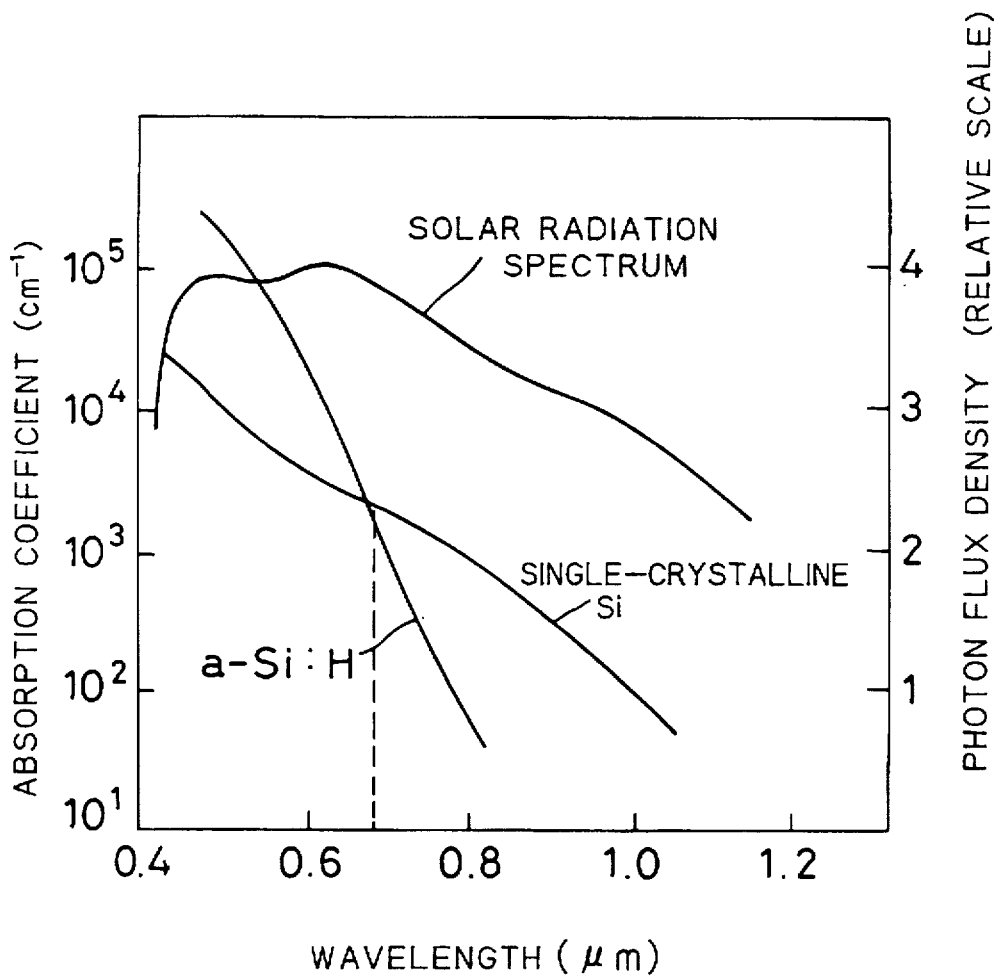
F I G . 1 4 1

FIG. 143

PHYSICAL CONSTANT OF AMORPHOUS Si:H AND SINGLE-CRYSTALLINE Si

| PHYSICAL CONSTANT (300°) | | AMORPHOUS Si:H | SINGLE-CRYSTALLINE Si |
|---|---|---|---|
| LOCALIZED LEVEL DENSITY | $N_3$ (cm$^{-3}$eV$^{-1}$) | $10^{16} \sim 10^{17}$ | $\sim 10^{12}$ |
| ELECTRON MOBILITY | $\mu_e$ (cm V$^{-1}$sec$^{-1}$) | $0.8 \sim 10^{-2}$ | 1500 |
| HOLE MOBILITY | $\mu_p$ (cm V$^{-1}$sec$^{-1}$) | $10^{-2} \sim 10^{-3}$ | 500 |
| HOLE DIFFUSION LENGTH | $L_p$ ($\mu$m) | $0.2 \sim 1$ | 200 |
| ELECTRON LIFETIME | $\tau_e$ (sec) | $\sim 10^{-5}$ | $2.5 \times 10^{-3}$ |
| HOLE LIFETIME | $\tau_p$ (sec) | $\sim 10^{-5}$ | $2.5 \times 10^{-3}$ |
| DARK CONDUCTIVITY (p & n LAYER) | $\sigma_d$ ($\Omega^{-1}$cm$^{-1}$) | $1 \sim 10*$ | $10^3 \sim 10^4$ |
| DARK CONDUCTIVITY (i LAYER) | $\sigma_d$ ($\Omega^{-1}$cm$^{-1}$) | $10^{-8} \sim 10^{-11}$ | $4 \times 10^{-6}$ |
| PHOTOCONDUCTIVITY** | $\sigma_{pd}$ ($\Omega^{-1}$cm$^{-1}$) | $10^{-3} \sim 10^{-4}$ | $\sim 10^0$ |
| OPTICAL BAND-GAP | $E_{opt}$ (eV) | $1.5 \sim 1.8$ | 1.1 |
| LIGHT ABSORPTION COEFFICIENT*** | $\alpha$ (cm$^{-1}$) | $1.5 \sim 3 \times 10^4$ | $5 \times 10^3$ |

*) MICROCRYSTALLINE Si  **) 100mW/cm$^2$

***) INCIDENT PHOTON ENERGY (h$\nu$) : 2eV

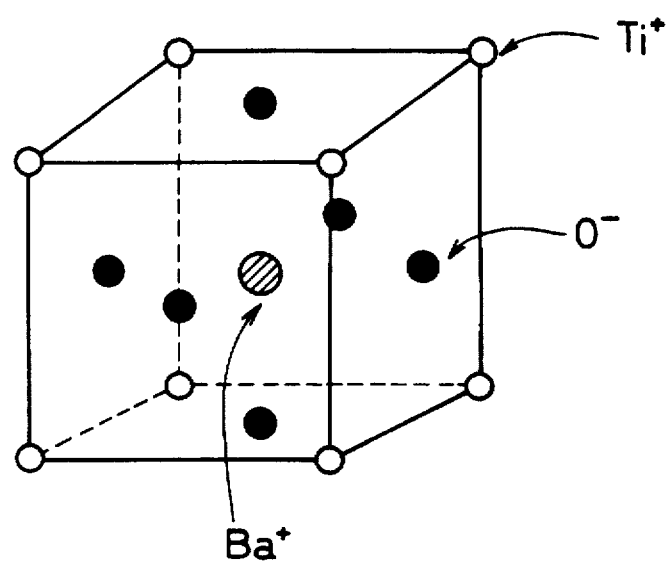
F I G . 1 5 1

F I G . 153
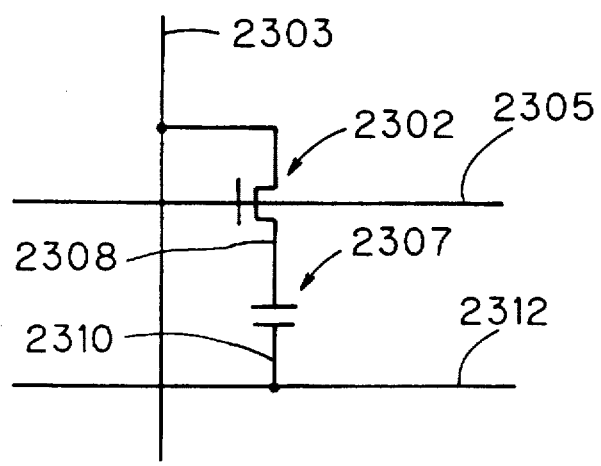

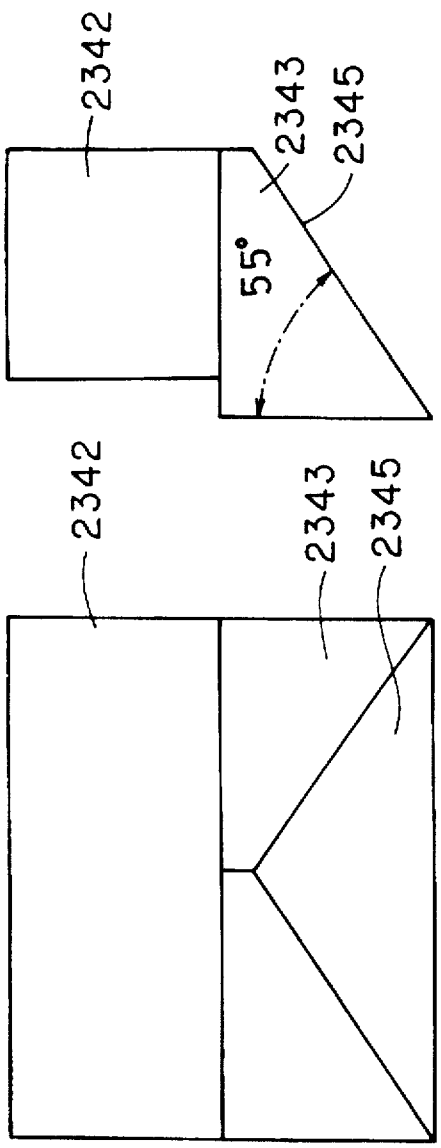
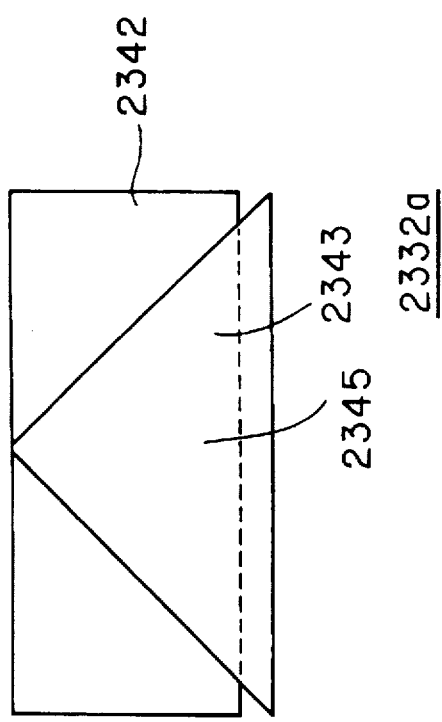

F I G. 1 9 5
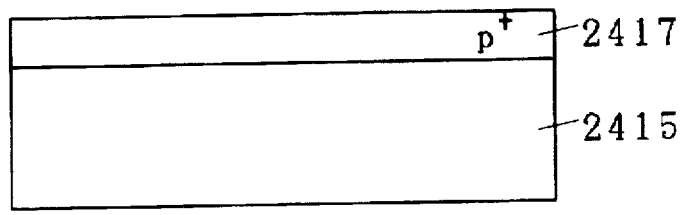

2500

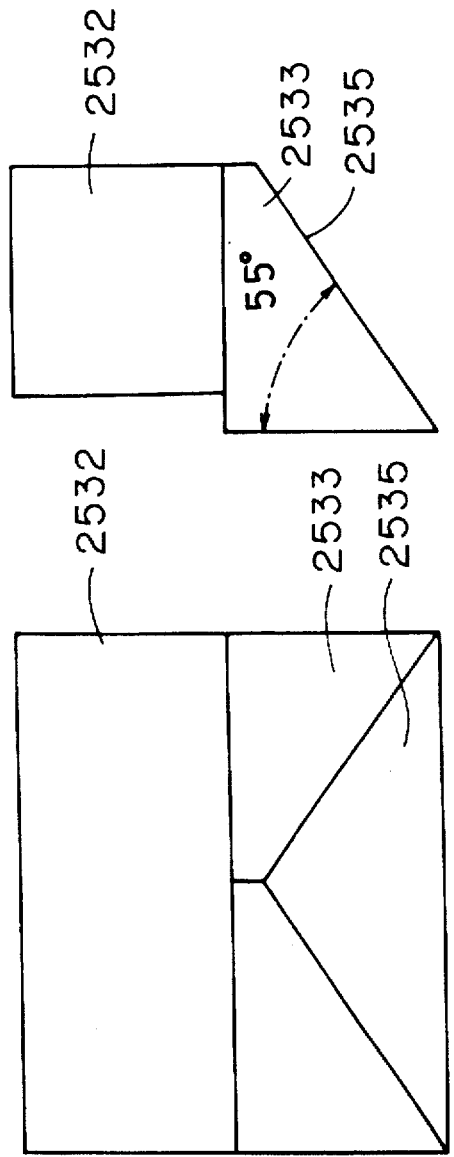
FIG. 223B
FIG. 223A
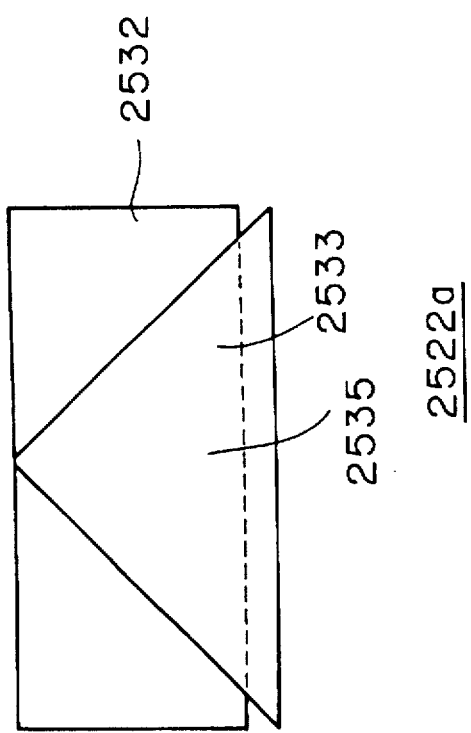
FIG. 223C

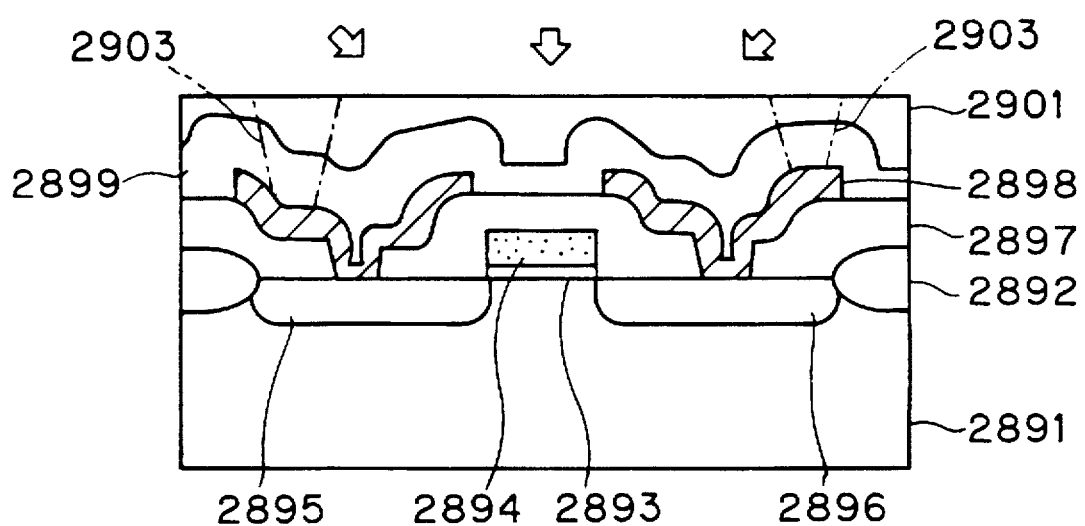
F I G. 278

F I G. 288
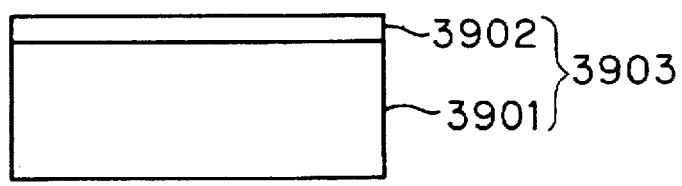
F I G. 289
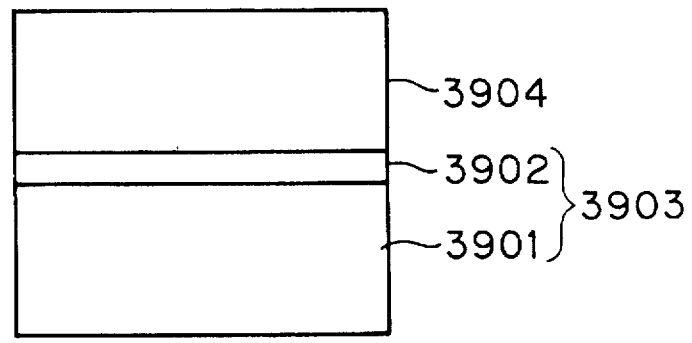
F I G. 290
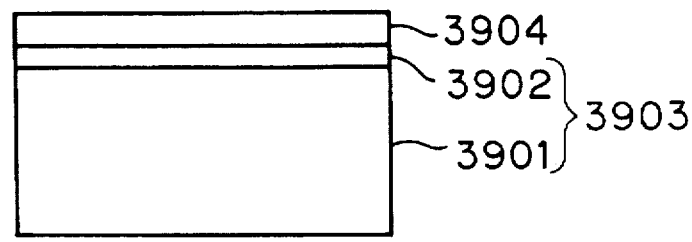

PHOTOVOLTAIC DEVICE

BACKGROUND OF THE INVENTION

1. Field of the Invention

The present invention relates to a capable semiconductor device such as a micromachine, a solar battery having a high energy conversion efficiency, a volatile or a nonvolatile memory, a load of a memory cell of an SRAM, a field effective thin film transistor (hereinafter referred to as "TFT") which is used as a display device of a wide-screen, high-precision active-matrix type liquid crystal display and a liquid crystal display which comprises a pixel electrode and a thin film transistor. The present invention also relates to a method for manufacturing such a semiconductor device.

2. Background of the Invention (Prior Art 1)

A prototype of a micromachine, which is typically an apparatus of fine dimensions in the units of micrometers or less having a mechanical motion mechanism, is prepared by redeployment of a semiconductor technique mainly implementing simultaneous formation on a semiconductor wafer by transfer of a mask pattern or the like.

<Micromachine Having Movable Part>

FIG. 77 is a front sectional view showing a sectional structure of an electrostatic motor 3000 which is manufactured by a conventional method. In this electrostatic motor 3000, a nitride film ($Si_{34}$ film) 3004 is formed on a single-crystalline Si substrate 3002, and a rotary shaft 3014 and a stator 3010 of polycrystalline Si are fixedly formed on the nitride film 3004, while a ring-shaped rotator 3008 of polycrystalline Si is stopped to the rotary shaft 3014 with a clearance. Thus, the rotator 3008 is rotatable about the rotary shaft 3014.

The stator 3010 is formed by a plurality of members, being electrically isolated from each other, which are radially arranged at prescribed intervals to enclose the rotator 3008. Alternating voltages which are out of phase with each other are independently applied to these members of the stator 3010. Consequently, electrostatic attractive or repulsive force is generated between the stator 3010 and the rotator 3008, and a bearer of such force is successively moved between the respective members, thereby rotating the rotator 3008. It is reported that the rotator 3008 is 100 μm in diameter and 2.5 μm in thickness.

FIG. 78 is a process diagram showing a certain stage in a method of manufacturing the electrostatic motor 3000. In manufacturing of the electrostatic motor 3000, a technique of forming sacrifice layers and etching the same is employed in order to isolate the rotator 3008, the stator 3010, the rotary shaft 3014 and the nitride film 3004 serving as an underlayer from each other and defining clearances therebetween. In order to manufacture the electrostatic motor 3000, an $SiO_2$ layer is first temporarily formed on an upper surface of the nitride film 3004 and selectively removed to form a first sacrifice layer 3006, for selectively filling up spaces corresponding to clearances. A polycrystalline Si layer is stacked thereon by CVD (chemical vapor deposition) or the like. Thereafter this polycrystalline Si layer is selectively removed to be formed into the shapes of the rotator 3008 and the stator 3010. Another sacrifice layer 3012 is newly formed so that another polycrystalline Si layer is newly stacked thereon, whereafter this polycrystalline Si layer is selectively removed to be formed into the shape of the rotary shaft 3014. Finally, the two sacrifice layers 3006 and 3012 are entirely removed by etching, thereby completing the electrostatic motor 3000 shown in FIG. 77.

<Micromachine Having Deformed Part>

FIG. 79 is a plan view showing an electrostatic linear actuator 3030 which is manufactured by a conventional method. In this actuator 3030, fixed electrodes 3040 of polycrystalline Si and movable parts 3036 of polycrystalline Si are formed on a single-crystalline Si substrate 3032. The comb-shaped fixed electrodes 3040 are fixed onto the single-crystalline Si substrate 3032 in base portions thereof, so that comb-shaped protrusions are upwardly raised from the single-crystalline Si substrate 3032. On the other hand, the movable parts 3036 are fixed to the single-crystalline Si substrate 3032 only in support portions 3034, so that other portions are entirely upwardly raised from the single-crystalline Si substrate 3032. The movable parts 3036 have comb-shaped forward end portions 3038, which are fitted with the fixed electrodes 3040 with no contact.

When voltages are applied to the fixed electrodes 3040, electrostatic attractive or repulsive force acts across the same and the forward end portions 3038, whereby the forward end portions 3038 are straightly displaced in a horizontal plane. At this time, members coupling the forward end portions 3038 with the support portions 3034, which are elastic members serving as sources of restoring force for the displacement of the forward end portions 3038, are elastically deformed following the displacement of the forward end portions 3038.

A method of manufacturing the actuator 3030 also employs a step of forming a sacrifice layer and removing the same by etching, similarly to the method of manufacturing the electrostatic motor 3000. Namely, a sacrifice layer is first formed on the single-crystalline Si substrate 3032, so that a polycrystalline Si layer is formed thereon. Thereafter the polycrystalline Si layer is selectively removed, to be formed into the shapes of the movable parts 3036 and the fixed electrodes 3040. Finally, the sacrifice layer is entirely removed by etching, to complete the actuator 3030.

<Micromachine Having Cavity>

FIG. 80 is a fragmented perspective view showing a part of a pressure sensor 3100 which is manufactured by a conventional method. In this pressure sensor 3100, a lower housing 3102 and an upper housing 3104 having grooves are joined with each other to form a hollow vessel defining a cavity 3106 in its interior. A plate-type oscillator 3108 is inserted in this cavity 3106. All of the lower housing 3102, the upper housing 3104 and the oscillator 3108 are made of single-crystalline Si.

Only an end portion of the oscillator 3108 is in contact with an inner wall portion defining the cavity 3106 to be supported by the hollow vessel, while all of the remaining portions are separated from the inner walls. Therefore, it is possible to excite natural oscillation in the oscillator 3108 by applying a stationary magnetic field and an oscillating current from the exterior. The lower housing 3102 is coupled with a diaphragm (not shown) which receives a pressure to be measured. The diaphragm is deformed upon application of the pressure, whereby the oscillator 3108 is also deformed. Upon such deformation of the oscillator 3108, the natural frequency deviates in response to the degree of the displacement. The level of the pressure is measured by detecting the deviation of the natural frequency. This pressure sensor 3100 has an excellent elastic limit, excellent strength and the like, as well as uniform characteristics since all of the members 3102, 3104 and 3108 are made of single-crystalline Si. Therefore, it is possible to provide these members with large deformation, while implementing a pressure sensor having high reliability.

In order to manufacture the pressure sensor 3100, a technique of junction (also referred to as "cladding") is employed as hereinabove described. After the two housings 3102 and 3104 having grooves and the oscillator 3108 are prepared from single-crystalline Si independently of each other, the two housings 3102 and 3104 are joined with each other at a junction plane 3110 while receiving the oscillator 3108 in the grooves. This junction step is carried out in a vacuum, whereby the cavity 3106 is maintained in a vacuum state also after completion of the apparatus.

<Micromachine Having Diaphragm>

FIG. 81 is a front elevational view showing another pressure sensor 3200 which is manufactured by a conventional method. Junction of single-crystalline Si is employed also in manufacturing of the pressure sensor 3200. Namely, a V-shaped groove 3204 is formed on a single-crystalline Si substrate 3202 by etching, where after a thin substrate 3206 of single-crystalline Si is joined thereto at a junction plane 3208. Thereafter etching is further advanced to expand the V-shaped groove 3204 to be opened in a bottom surface of the substrate 3202. The etching step is carried out with an etchant for selectively etching a specific crystal plane.

In the thin substrate 3206, a portion 3212 covering the groove 3204 serves as a diaphragm which receives a pressure to be measured. The diaphragm 3212 is elastically deformed by such application of the pressure. A piezoresistance element 3210 serving as a distortion gauge is formed in the vicinity of a portion having the maximum distortion following the elastic deformation, i.e., a fixed end of the diaphragm 3212. This piezoresistance element 3210 is formed by selectively implanting impurity ions into a specific portion of an upper surface of the diaphragm 3212. This pressure sensor 3200 is adapted to measure the value of the pressure through an amount of change in electric resistance in the piezoresistance element 3210. According to this pressure sensor 3200, large elastic deformation can be applied to the diaphragm 3212, since this diaphragm 3212 is made of single-crystalline Si.

<Micromachine Provided with Element on Insulating Layer>

FIG. 82 is a front elevational view showing still another pressure sensor 3230 which is manufactured by a conventional method. Junction of single-crystalline Si is employed also in manufacturing of the pressure sensor 3230. Namely, an insulating film 3236 of $SiO_2$ is first formed on a single-crystalline Si substrate 3232 having a diaphragm 3234 on a groove. Then, a single-crystalline Si thin film is joined onto this insulating film 3236. A p-type impurity is previously selectively introduced into this single-crystalline Si thin film, to form a piezoresistance element 3238 of p-type Si for serving as a distortion gauge. After completion of the junction, the single-crystalline Si thin film is etched for leaving the p-type Si portion while selectively removing the remaining portions. At this time, such a property is utilized that Si containing large amounts of an Si oxide ($SiO_2$) and an impurity is at a lower etching rate as compared with Si containing a small amount of impurity. Consequently, only the piezoresistance element 3238 is left on the insulating film 3236 of $SiO_2$. Thereafter a metal interconnection layer 3240 is selectively formed on the insulating film 3236, thereby completing the pressure sensor 3230.

The diaphragm 3224 is elastically deformed upon application of a pressure to be measured, whereby distortion following this elastic deformation changes electric resistance of the piezoresistance element 3238. The value of the pressure is measured through an amount of change of the electric resistance.

In this pressure sensor 3230, the piezoresistance element 3238 is formed on the insulating film 3236, to be electrically isolated from the substrate 3232. Therefore, no current flowing in the piezoresistance element 3238 leaks to the substrate 3232, whereby the amount of change of the electric resistance can be accurately measured.

<Micromachine Having Cantilever>

FIG. 83 is a perspective view showing an acceleration sensor 3300 which is manufactured by a conventional method. In this acceleration sensor 3300, an $SiO_2$ film 3304 is formed on a single-crystalline Si substrate 3302 having a groove 3308, while a cantilever 3306 forming a part of the $SiO_2$ film 3304 protrudes above the groove 3308. Elastic deformation of the cantilever 3306 is detected by a distortion gauge, to measure the value of acceleration or vibration.

In order to manufacture this acceleration sensor 3300, an $SiO_2$ film is formed on the overall surface of the substrate 3302 before formation of the groove 3308, whereafter the $SiO_2$ film is selectively removed to be formed into the shape of the $SiO_2$ 3304 film having a protrusion. Then, the upper surface of the substrate 3302 is selectively etched to be provided with the groove 3308, while the protrusion of the $SiO_2$ film 3304 defines the cantilever 3306.

(Problem of Prior Art 1)

However, the conventional micromachines which are manufactured in the aforementioned manners according to prior art 1 have the following problems:

First, the electrostatic motor 3000 (FIGS. 77 and 78) is so hardly worn that the same cannot withstand practical application to a motor, since both of the rotator 3008 and the rotary shaft 3014 which are in sliding contact with each other are made of polycrystalline Si. These members are made of polycrystalline Si since there is no technique of forming single-crystalline Si on the sacrifice layers 3006 and 3012 which are made of $SiO_2$. In the actuator 3030 (FIG. 79), on the other hand, the level of elastic deformation of the movable parts 3036 is limited due to restriction in elastic limit and strength, since the movable parts 3036 are made of polycrystalline Si. The movable parts 3036 are made of not single-crystalline but polycrystalline Si since the same are formed by stacking Si on the sacrifice layers of $SiO_2$.

In order to implement the complicated structure of the pressure sensor 3100 (FIG. 80) having the cavity 3106 storing the oscillator 3108 in its interior with single-crystalline Si, only the junction technique is generally employable since all members 3102, 3104 and 3108 are made of single-crystalline Si. Thus, the manufacturing steps are complicated since it is necessary to prepare the respective members independently of each other and high dimensional accuracy is required for the respective members to be joined to each other, while the members cannot be easily aligned with each other in junction.

Also in the pressure sensor 3200 (FIG. 81), it is necessary to previously prepare the two members 3202 and 3206 which are made of single-crystalline Si independently of each other for thereafter combining the same with each other by the junction technique, in order to implement the complicated structure provided with the groove 3204. Therefore, the manufacturing steps are complicated and difficult.

Also in the pressure sensor 3230 (FIG. 82), it is necessary to employ the aforementioned junction technique, in order to form the piezoresistance element 3238 of single-crystalline Si on the insulating film 3236 of $SiO_2$. Therefore, the manufacturing steps are complicated and difficult, similarly to the above.

The acceleration sensor 3300 (FIG. 83) is insufficient in elastic limit, strength, uniformity of characteristics and the like since the cantilever 3306 is made of SiO$_2$. In order to manufacture the acceleration sensor 3300 without employing the junction technique, it is necessary to selectively remove the substrate 3302 of single-crystalline Si while leaving the cantilever 3306 by etching. In general, therefore, the cantilever 3306 must be made of SiO$_2$ or the like, dissimilarly to the substrate 3302.

(Prior Art 2)

FIGS. 99 to 102 illustrate steps of manufacturing a solar cell according to Prior Art 2. Description is now made with reference to an exemplary case of forming CdTe and CdS films, which are main materials for the solar cell, by printing, in addition to formation of electrodes. As shown in FIG. 99, a paste-type CdS film 3402 is first screen-printed on an upper surface of a glass substrate 3401. The CdS film 3402 is then dried by irradiation with infrared rays, and thereafter heated in a furnace to about 650° C., to be converted to a sintered semiconductor. Then this CdS film 3402 is doped with an impurity to be converted to an n-type film. Then, a CdTe film 3403 is selectively screen-printed on a part of an upper surface of the CdS film 3402 as shown in FIG. 100, dried and sintered. Then, a carbon electrode 3404 (accepter source) is printed on an upper surface of the CdTe film 3403, dried and baked, as shown in FIG. 101. At this time, an element which is converted to an accepter at about 300° C. is diffused in the CdTe film 3403 to form a strong p-type CdTe layer, thereby forming a p-n junction. Thereafter an Ag—In electrode 3405 is printed/baked on an upwardly exposed portion of the CdS film 3402 while Ag electrodes 3406 are selectively printed/baked on parts of an upper surface of the carbon electrode 3404, as shown in FIG. 102.

While the solar cell shown in FIGS. 99 to 102 employs CdS belonging to the groups II and VI as an n-type film which is formed on a substrate, this film may alternatively be prepared from Si belonging to the group VI or GaAs belonging to the groups III and V, for example.

(Prior Art 3)

FIG. 103A illustrates a conventional solar cell of a tandem structure (stack system). Referring to FIG. 103A, numeral 3407 denotes a first semiconductor part (first heterojunction part), numeral 3408 denotes a second semiconductor part (second heterojunction part), and numeral 3409 denotes a tunnel junction part by high concentration junction. In general, a wavelength range of light which can be absorbed by a semiconductor is widened as a forbidden bandwidth Eg of the semiconductor is reduced, while the coefficient of energy use of the as-absorbed light is contradictorily deteriorated as the forbidden bandwidth is reduced. In the tandem structure, p-n junctions having different forbidden bandwidths Eg are overlappingly arranged in the direction of progress of the light along the order of the forbidden bandwidths Eg. As shown in FIG. 103B, the light is absorbed by the respective materials from a component of a shorter wavelength side, to develop voltages corresponding to Eg$_A$ and Eg$_B$ respectively. The semiconductor parts 3408 and 3409 having respective p-n junctions are connected in series, while excellent connection is attained through a tunnel current of the p$^+$-n$^+$tunnel junction part 3409 with no interposition of a metal therebetween. Referring to FIG. 103B, symbol E$_C$ denotes a lower end of a conduction band, symbol E$_v$ denotes an upper end of a valence band, and symbol E$_F$ denotes a Fermi level, serving as a scale for expressing to which energy level electrons are filled in a solid. These energy gaps are naturally determined by the materials employed for the respective semiconductor films.

The material for the tandem structure may be prepared from a combination of GaAlAs and GaAs, or a combination of a-Si and a-SiGe. A number of at least two is considered for the layers. Prior Art art 3 is also formed by a method of screen printing—drying—sintering in general, similarly to Prior Art2.

(Problem of Prior Arts 2 and 3)

In each of the solar cells according to Prior Art 2 and Prior Art 3 shown in FIGS. 99 to 102, 103A and 103B, however, a single-crystalline thin film cannot be obtained since the solar cell is formed by the method of screen printing—drying—sintering, for example, and its crystal structure is generally amorphous. Thus, it is difficult to add a p-type or n-type impurity as well as to control the amount of introduction of the impurity, due to the heterogeneous crystal structure.

When a single-crystalline semiconductor substrate is employed as an underlayer, it is possible to form a single-crystalline film on an upper surface of the single-crystalline substrate serving as a seed crystal. However, the single-crystalline substrate itself is extremely high-priced, contrarily to requirement for reduction in cost. Further, a single-crystalline film must be formed under high-temperature environment in Prior Art 2 and Prior Art 3, and hence the substrate must be prepared from that which can withstand a high temperature, leading to increase in cost. Particularly when a plurality of semiconductor parts 3407 and 3408 having different forbidden bandwidths are stacked as in Prior Art 3, it is necessary to vary the materials therefor and hence preparation of a seed crystal from the underlayer itself is impossible.

When a semiconductor film is prepared from Si, for example, an absorption coefficient of crystalline Si is only 10$^4$/cm even in a visible part, and a considerably thick plate-type material is required for entirely absorbing sunlight, such that a thickness of several 100 μm is required for a polycrystalline material. On the other hand, an amorphous material may have a relatively small thickness of about 1 μm, for example, since the same has a large absorption coefficient. However, its conversion efficiency is deteriorated to about 5 to 10%, due to low electron mobility and a short carrier life time. To this end, GaAs is suitable as a material, while the same is not suitable in practice due to a high cost. A group II-VI or II-VI compound is also preferable in consideration of an absorption coefficient and wavelengths of absorption ends and hence CdS, for example, has been temporarily studied. However, this material is hardly single-crystallized, and it is difficult to add a p-type or n-type impurity thereto. If the group II-VI or III-V compound can be single-crystallized and doped with an impurity, however, this compound is rather preferable as compared with Si. Thus, awaited is a method which can easily Single-crystallize a group II-VI or III-V compound.

(Prior Arts 4 to 15)

FIG. 127 shows characteristics of materials for general solar cells. As shown in FIG. 127, the solar cells are classified into Si system and compound system ones, depending on the materials as employed. Most of the generally produced solar cells are prepared from Si-system materials. The Si-system materials include crystalline and amorphous materials. The crystalline materials are classified into single-crystalline Si and polycrystalline Si materials, depending on substrates as employed. Among the above, solar cells of the single-crystalline Si and polycrystalline Si materials are generally employed as power systems.

Although a solar cell employing single-crystalline Si has high conversion efficiency of 17% (to 20%), a single-crystalline Si substrate is disadvantageously high-priced.

On the other hand, a solar cell employing polycrystalline Si can be provided at a lower cost than the single-crystalline Si substrate, although its conversion efficiency of 12 to 14% is inferior to that of the single-crystalline Si solar cell. Also in such polycrystalline Si, however, a constant thickness or cutting allowance is required for a bulk substrate as employed so far-as the bulk substrate is formed by cutting an ingot, leading to a high cost for the substrate.

An amorphous Si solar cell is expected in view of reduction in cost. The amorphous Si solar cell is manufactured by stacking thin films through a method such as plasma CVD (chemical vapor deposition). According to this method, the thin films can be formed at a low temperature of 200° to 300° C., whereby a low-priced solar cell can be manufactured since a low-priced glass material or the like can be employed and the amount of the Si material can be extremely reduced as compared with a case of employing single-crystalline or polycrystalline bulk silicon. In order to put this solar cell into practice on a full scale, however, it is necessary to solve a problem of how to improve conversion efficiency, which is 6 to 8% under the present circumstances. Further, the amorphous Si is deteriorated by about 15% (initial deterioration) in several months by time change of the conversion efficiency due to a large amount of crystal defects, and thereafter further deteriorated by about 1 to 2% every year.

Description is now made on directions of research and development which are made by respective makers for solving the aforementioned problems of the prior art.

1) Single-Crystalline Si Solar Cell (Prior Art 4)

As shown in FIG. 128A, a polycrystalline base material 3501 is prepared by trichlorosilane which is lifted by the Czochralski method (CZ method), i.e., reduced with hydrogen with application of thermal energy, and single-crystallized with application of thermal energy of not more than 1500° C. as shown in FIG. 128B to obtain a single-crystalline Si ingot 3502, which in turn is cut into a piece 3503 as shown in FIG. 128C and ground as shown in FIG. 128D, to obtain an Si single-crystalline substrate (wafer) 3504 with addition of-a p-type impurity, as shown in FIG. 128E. When an n-type Si semiconductor layer 3505 shown in FIG. 129B is formed on an upper surface of an Si single-crystalline substrate (wafer) 3504 shown in FIG. 129A to form a p-n junction, on the other hand, employed is vapor phase diffusion employing $PoCl_3$, application diffusion employing $TiO_2$, $SiO_2$ or $P_2O_5$, or ion implantation of directly doping the wafer with $P^+$ ions. Then, a back electrode 3506 and front electrodes 3507 are formed as shown in FIG. 129C, to complete a single-crystalline Si solar cell. However, this method has such a problem that the cost is increased due to employment of large amounts of power and Si materials. Under the present circumstances, the point of the study resides in how to cut the substrate in a small thickness in cutting of the ingot 3502 shown in FIG. 128C and how to reduce loss (cutting allowance) of Si in such slicing, in addition to automation and continuation.

In a single-crystalline Si solar cell, conversion efficiency is improved to cover the high cost of a bulk silicon substrate. In order to prevent reduction of efficiency caused by carrier recombination in the vicinity of a back surface of a substrate, a BSF (back surface field) type solar cell is prepared by introducing an internal electric field into a back surface of a substrate 3504 as shown in FIG. 130A. A $p^+$ layer 3508 is formed on the back surface of the p-type substrate 3504 to provide an internal electric field for accelerating carriers which are generated in the vicinity of the back surface by this electric field so that the same can be effectively extracted as power. Due to this structure, photosensitivity is increased particularly with respect to longer wavelengths, to improve conversion efficiency to about 15%.

FIG. 130B shows a violet cell, which is adapted to prevent reduction of efficiency caused by carrier recombination on a front side (photoreceiving side) of a solar cell. The thickness of an $n^+$ layer 3505 of the solar cell, which is 0.3 to 0.5 μm in general, is reduced by etching to 0.1 to 0.2 μm, thereby preventing carrier recombination in the vicinity of the $n^+$ layer 3505 and improving conversion efficiency.

FIG. 130C shows a CNR solar cell (Comsat non-reflective solar cell) for preventing reduction of efficiency caused by reflection of light on a surface of the solar cell. According to this solar cell, large amounts of fine pyramidal irregularities of 1 to 2 μm are formed on surfaces of a substrate 3504 and an $n^+$ layer 3505, to reduce surface reflection by multiple reflection. Due to this structure, conversion efficiency of 18%, which is at the maximum level in relation to an Si solar cell, is obtained. The thickness of the $n^+$ layer 3505 is set at 0.2 to 0.3 μm here.

FIG. 131 shows relation between a light passage distance and a ratio of light to incident light as to single-crystalline silicon which receives and absorbs sunlight (AM-O) in the exoatmosphere on the average revolution orbit of the earth. This relation shows that single-crystalline silicon of 30 μm absorbs 80% of incident light, and 100 μm is required for absorbing 90% of the incident light with the remaining 10%. Since contribution to absorption is thus reduced with separation from the surface, there is an idea of employing a silicon plate which is thin to some extent. FIG. 132 shows relation between substrate thicknesses of various solar cells and conversion efficiency levels as reached. Referring to FIG. 132, marks +show optimum points which can sufficiently satisfy maximum values in employment of the respective materials. This figure shows that an extremely small thickness of not more than 1 μm is sufficient for amorphous Si (a-Si) having a large absorption coefficient. When a bulk single-crystalline Si substrate is employed, its conversion efficiency cannot exceed that of amorphous Si unless its thickness is in excess of 10 μm, and a thickness of about 70 to 80 μm is required at the optimum point. A solar cell formed with such a thickness can attain conversion efficiency which is close to 20%. Even if the thickness is increased in excess of 80 μm, however, further improvement of the conversion efficiency cannot be expected in comparison with a single-crystalline Si substrate of about 70 to 80 μm in thickness. In general, however, a single-crystalline substrate requires a wafer thickness of about 250 μm and cutting allowance of about 150 μm, and 25 wafers can be generally cut out from an ingot of 1 cm in length. While various cutting methods are studied, a total thickness of 300 μm including a wafer thickness of 200 μm and cutting allowance of 100 μm is the current limit. Namely, it is impossible to produce the aforementioned wafer of 70 to 80 μm in thickness, and it is necessary to employ a wafer of 200 to 400 μm in thickness in practice. Thus, it is difficult to reduce the cost, due to loss of the material.

As to a silicon substrate which is applied to a solar cell, consideration is made on a way to provide a material at the minimum cost by preparing the material from low-purity substandard portions caused on upper and lower end portions of an ingot in a process of manufacturing a wafer for an LSI. However, substandard portions which are obtained from LSI wafer production with dependence of the substrate material on byproducts for LSI use are about 10%, and this leads to a problem of insufficiency in material if only the substandard portions are employed.

2) Polycrystalline Si Solar Cell

A single-crystalline Si solar cell is disadvantageous in such points that the manufacturing process therefor is complicated, manufacturing energy is at a high level and a large amount of Si materials are employed. In order to solve these problems, there have been developed cast methods shown in FIGS. 133 and 134 (Prior Arts 5 and 7), and a ribbon method shown in FIG. 135 (Prior Art 6) for manufacturing polycrystalline Si solar cells. As shown in FIG. 133, a general cast method (Prior Art 5) is adapted to cool (slowly cool) and solidify an Si solution 3511 in a crucible 3512. This method can attain higher productivity as compared with single-crystalline Si, while the as-obtained conversion efficiency is at a relatively high level of 10 to 16%, although this level is slightly inferior to that of single-crystalline Si. FIG. 134 shows a newly proposed cast method (Prior Art 7), which has been developed by New Energy and Industrial Technology Development Organization (NEDO) as a part of Japan Sun Shine Project. An Si solution 3511 which is contained in a crucible 3512 is slowly cooled with the crucible 3512 from above, to obtain a polycrystalline Si ingot of the same shape as the crucible 3512. Referring to FIG. 134, numeral 3531 denotes a heater, numeral 3514 denotes a heat shielding plate, numeral 3515 denotes a support shaft, and numeral 3516 denotes a chamber. A polycrystalline Si solar cell can be formed by slicing the ingot manufactured through the aforementioned step, through a step similar to that for single-crystalline Si.

The ribbon method is adapted to directly obtain a polycrystalline sheet 3521 which is required for a solar cell from an Si solution, as shown in FIG. 135. The raw material can be effectively utilized since there is no need to slice an ingot, dissimilarly to single crystal or cast method polycrystalline Si. In principle, ribbon polycrystalline Si is lifted through a capillary die 3523 which is uprightly provided in a crucible 3522 containing the Si solution. The as-lifted ribbon polycrystalline Si is cut into a proper size with a laser beam, to be worked into a solar cell through a step similar to that for single-crystalline Si. Conversion efficiency is 7 to 14%, which is slightly slower as compared with that obtained by the cast method.

The polycrystalline Si solar cell also has a problem in cost in a point that a large amount of Si raw material must be employed, similarly to the single-crystalline Si solar cell. A general technical problem in Prior Art 6 resides in "how to cut a substrate in a small thickness and how to reduce loss in slicing", since the cost for a substrate material occupies about 25% of the cost for the overall solar cell in a high ratio.

In the cast method, the ingot is sliced with a multi-wire saw, to cause loss of about 120 to 150 μm with respect to a substrate of 400 μm. Namely, the Si raw material is used by 520 to 550 μm, and the future technical subject resides in suppression of the same up to 300 μm. Even if such reduction in thickness is implemented, however, the raw material is consumed about 10 to 100 times as compared with an amorphous Si solar cell as described below or the like.

3) Amorphous Si Solar Cell

An amorphous Si solar cell has excellent characteristics in cost, resource, manufacturing energy and environmental pollution, although the same is still disadvantageous in conversion efficiency and reliability.

The amorphous Si solar cell is manufactured by a method which is absolutely different from that for a solar cell employing a crystalline bulk Si substrate. FIGS. 136 and 137 schematically show a single-chamber reaction furnace method (Prior Art 8) and a continuous separation plasma reaction method (Prior Art 9) respectively. In either method, a raw material gas 3526 such as monosilane ($SiH_4$) is introduced into a reaction chamber 3524 which is maintained in a vacuum of 0.1 to 10 Torr, and an RF electric field 3525 is applied to decompose the raw material gas 3526, thereby forming an amorphous Si layer 3528 on a substrate 3527 of glass or stainless steel. At this time, p-type amorphous Si or n-type amorphous Si is formed when $B_2H_6$ (diborane) 3529 or phosphine ($PH_3$) 3530 is mixed into the raw material gas 3526. Referring to FIG. 137, numeral 3531 denotes a shutter. Thus, a p-n junction can be formed by simply switching the raw material gas 3526. The amorphous Si solar cell requires small manufacturing energy, and the Si layer forming an element is reduced to $1/100$ as compared with single-crystalline and polycrystalline bulk silicon solar cells, to implement reduction in cost. Further, the film formation temperature is so reduced that a low-priced substrate of glass or stainless steel can be employed, to also effectively reduce the cost.

The amorphous Si solar cell is different in principle of power generation and structure from a crystalline Si solar cell. In general, crystalline silicon has a p-n structure as shown in FIG. 138, and photocarriers are moved by diffusion. On the other hand, the amorphous Si solar cell has a p-i-n (p-type - intrinsic - n-type) structure which is prepared by interposing an intrinsic semiconductor layer (i) between a p-type layer (p) and an n-type layer (n) as shown in FIG. 139, and photocarriers are mainly moved by drifting by an electric field contained in the solar cell. Referring to FIG. 139, TCO denotes a transparent conductive oxide film which serves as an electrode, and Gs denotes a glass plate. Due to such provision of the intrinsic semiconductor layer (i), most of electrons and holes are generated by light in a portion having the internal electric field, i.e., a depletion layer, since a space-charge region (depletion layer) in a boundary of an ordinary p-n junction is wide and hence the electrons and holes can be immediately extracted as a photogenerated current. Namely, it is possible to omit a process of movement of minority carriers to a p-n boundary region by diffusion in an ordinary p-n junction. In this case, however, part of incident light is absorbed by a p-type doped layer before reaching the intrinsic semiconductor layer (i) and not effectively utilized for power generation since amorphous Si has a large absorption coefficient while photocarriers are generated mainly in the intrinsic semiconductor layer (i) in the amorphous Si solar cell. FIG. 140 shows comparison of light absorption coefficients with respect to wavelengths (energy of photons) of light in relation to amorphous Si and crystal silicon etc., and FIG. 141 shows comparison of light absorption spectra of amorphous Si:H mixed with hydrogen and single-crystalline Si. It is understood from FIGS. 140 and 141 that the amorphous Si or the amorphous Si:H has a larger absorption coefficient by about 1 digit as compared with the single-crystalline Si in the vicinity of 0.5 μm forming the peak of solar energy. It is also understood that the single-crystalline Si has a larger coefficient absorption by one digit than the amorphous Si on a longer wavelength side beyond the wavelength of 0.7 μm.

FIG. 142 shows light absorption states with parameters of light absorption coefficients, by plotting rates of absorption of photons with respect to distances of light passage while setting values of absorption coefficients. FIG. 142 shows four curves with light absorption coefficients of $10^2$, $10^3$, $10^4$ and $10^5$. It is understood that the amorphous Si can be reduced in thickness as compared with the single-crystalline silicon and is suitable for a thin film structure since a large quantity of light is absorbed in a short distance when the light absorption coefficient is at a high level.

The above description is summarized as follows:

1. An extremely thin layer is sufficient for an amorphous Si type, which has a large absorption coefficient. However, its conversion efficiency is maximum at 14% in theory as shown in FIG. 132, and is extremely low as compared with the conversion efficiency of single-crystalline Si exceeding 20%.

2. While photocarriers are mainly generated in the intrinsic semiconductor layer (i) shown in FIG. 139 in the amorphous Si type, part of incident light is absorbed by the p-type doped layer before reaching the intrinsic semiconductor layer (i), and is not effectively used for power generation. It is important to polycrystallize or single-crystallize the doped layer in order to reduce the doped layer on the incident light side and increase the quantity of light reaching the intrinsic semiconductor layer (i), while it is difficult to attain this. While it is necessary to reduce a process temperature particularly when a low-priced glass substrate or the like is employed, it is difficult to implement this by a conventional method since Si has a high crystallization temperature.

3. In a solar cell employing amorphous Si, remarkable improvement of conversion efficiency can be expected if it is possible to arrange a cell having sensitivity to shorter wavelengths on a light input side (front side) and to arrange a cell having sensitivity to longer wavelengths on a back side, since the wide wavelength range of the sunlight can be effectively utilized. To this end, conversion efficiency is improved if it is possible to arrange amorphous Si on a front cell and to arrange a single-crystalline or polycrystalline silicon thin film on a back side. In order to implement such a structure in the prior art, however, it is necessary to employ a bulk silicon single-crystalline substrate. Thus, a low-priced glass substrate or the like cannot be employed and the substrate is increased in thickness, to sacrifice cost reduction.

4. In a cell having excellent absorption with a large absorption coefficient, it is necessary to effectively extract minority carriers among electrons and holes generated by light in the vicinity of the surface, i.e., electrons in a p-type semiconductor or holes in an n-type semiconductor. To this end, it is important to reduce crystal defects or to reduce the depth of a p-type layer so that the as generated minority carriers can be effectively moved to a depletion layer to be extracted, since a large amount of crystalline defects are inevitably caused in a doped layer (p-type layer in a p-i-n structure) having high concentration of an impurity in the surface part such that electrons and holes are immediately recombined and annihilated. Although a general amorphous Si film contains hydrogen which is coupled with uncoupled ones to reduce defects, defect density is higher by 3 to 5 digits than single-crystalline Si to cause significant loss by surface recombination. Amorphous Si has defect density of $10^{20}/cm^3$, amorphous Si (amorphous Si:H) hydrogenated by glow discharge (plasma CVD) has defect density of $10^{15}$ to $10^{17}/cm^3$, and single-crystalline Si has defect density of $10^{12}/cm^3$.

FIG. 143 shows physical constants of amorphous Si:H and single-crystalline Si. As understood from FIG. 143, electric characteristics of the amorphous Si:H such as mobility of electrons and holes, diffusion length, life times of electrons and holes and the like are inferior to those of single-crystalline silicon, leading to inferior conversion efficiency.

Thus, it is preferable to arrange a crystalline silicon thin film layer on a front side, to form an intrinsic semiconductor layer by an amorphous Si thin film and to arrange a crystalline silicon thin film having an excellent absorption coefficient for a longer wavelength side on a back side, in order to manufacture a solar cell having a smaller amount of silicon material (reduction in thickness) and excellent conversion efficiency by effectively utilizing optical and electric characteristics. In general, However, it is difficult to form a single-crystalline or polycrystalline silicon thin film on an amorphous Si thin film since a single-crystalline or polycrystalline thin film cannot be formed on a low-priced glass substrate and single-crystalline Si can be formed only on a single-crystalline substrate in general.

FIGS. 144 to 147 show exemplary proposals (Prior Arts 10 to 13) in relation to a solar cell of amorphous silicon carbide (amorphous SiC) having sensitivity to short-wave light, which is arranged on a front side on a base of an amorphous Si layer or the like. Referring to each of FIGS. 144 to 147, numeral 3535 denotes a glass substrate, numeral 3536 denotes a transparent conductive oxide (TCO) film, numeral 3537 denotes a p-type amorphous SiC film, numeral 3538 denotes an intrinsic amorphous Si layer, numeral 3539 denotes an n-type amorphous Si film, and numeral 3541 denotes a back-side electrode of aluminum or silver. Referring to FIG. 145, numeral 3542 denotes an n-type microcrystal Si layer, numeral 3543 denotes a $TiO_2$ layer and numeral 3544 denotes a semi-texture structure (SuS) layer, while numeral 3545 in FIG. 146 denotes a graded band-gap amorphous SiC layer, and numeral 3546 in FIG. 147 denotes a highly qualified intrinsic amorphous Si layer. As shown in FIG. 148, performed is improvement/research of arranging an intrinsic amorphous SiGe layer 3547 on a back side (Prior Art 14). However, the absorption coefficient is lowered in relation to longer wavelengths as shown in FIG. 141 since all these layers are prepared from amorphous materials. Thus, this technique is not yet put into practice due to problems of electric characteristics in relation to covering of a wide frequency band. While a polycrystalline Si layer 3548 is arranged on a back end in Prior Art 15 as shown in FIG. 149, the material for the substrate is restricted to a high-priced one in this case since the substrate material must withstand high-temperature environment for crystallizing the polycrystalline Si film 3548.

(Problem of Prior Arts 4 to 15)

The aforementioned problems of Prior Arts 4 to 15 are summarized as follows:

1) A crystalline Si solar cell (Prior Arts 4 to 7) requires a substrate thickness of 200 µm at the minimum and 300 µm in general, since a bulk silicon wafer must be employed. Further, the silicon wafer is cut out from an ingot and hence cutting loss of 120 µto 150 µm is caused leading to requirement for an Si material of 320 to 450 µm in thickness as a whole.

In order to attain conversion efficiency of 20% which is close to the theoretical value, loss of the material is caused since the crystalline Si film may have a thickness of 70 to 80µm, leading to increase in cost.

It is necessary to reduce the thickness of the silicon wafer to minimize loss in cutting in order to reduce the cost, while it is difficult to reduce the thickness below 200 µm in view of the yield, and it is also difficult to reduce the loss in cutting below 100 µm, so far as a multi-wire saw or the like is employed. Thus, cost reduction for the solar cell is limited.

2) In the crystalline Si substrate (Prior Arts 4 to 7), which is mainly prepared by a method of utilizing substandard portions on upper and lower ends of an ingot for an LSI for reducing the cost, the resource therefor tends to be insufficient in general.

3) In the amorphous Si solar cell (Prior Arts 8 to 15), cost reduction can be implemented since the light absorption coefficient in the vicinity of the peak (500 Å) of solar energy is higher by at least one digit as compared with a single-crystalline Si solar cell and hence a larger quantity of light is absorbed in a short distance and the film thickness can be reduced to not more than 1/100 as compared with the single-crystalline solar cell. Further, the amorphous Si is effective for cost reduction since the film forming temperature is at a low level and a low-priced glass substrate can be employed. However, the same has a large amount of crystal defects which is larger by 3 to 5 digits as compared with the single-crystalline Si solar cell, while electrons and holes are easily annihilated by recombination, mobility is lower by 4 to 5 digits leading to inferior conversion efficiency, and the same is easily deteriorated by time change.

(Prior Art 16)

Conventional semiconductor devices (semiconductor memory devices) for serving as mass storage devices include a volatile dynamic random access memory (hereinafter referred to as a DRAM) and an electrically writable/erasable nonvolatile memory such as a flash EPROM.

FIG. 207 is a sectional view showing a semiconductor device for serving as a DRAM according to Prior Art 16, and FIG. 208 illustrates an internal circuit of a ferroelectric memory device employing ferroelectric substances for capacitor parts by Ramtron Corp., for example. Referring to FIGS. 207 and 208, numeral 3601 denotes a p-type semiconductor substrate, numeral 3602 denotes a transistor part, numeral 3603 denotes a bit line, numeral 3604 denotes a LOCOS oxide film, numeral 3605 denotes a polycrystalline (polysilicon/polycide) word line, numeral 3606 denotes a first insulating film, numeral 3607 denotes a capacitance part (data holding part), numeral 3608 denotes a first wire connecting the transistor part 3602 with the capacitance part 3607, numeral 3609 denotes a dielectric film, numeral 3610 denotes an upper electrode of the capacitance part 3607, and numeral 3611 denotes a plate.

In the conventional memory device employing ferroelectric substances for capacitors, a 1-bit memory cell is formed by two transistors and two capacitors as shown in FIG. 208 due to remarkable dispersion in charge quantity caused by the dielectric constant and polarization of the capacitance part 3607, and the capacitors are polarized in opposite directions to guarantee data by detecting the difference therebetween.

In general, the dielectric film 3609 of the capacitance part 3607 is formed by a ferroelectric film. In such a ferroelectric film, dielectric constants of crystals are increased with temperature reduction to cause phase transition by divergence at a certain critical temperature (Curie temperature) thereby causing spontaneous dielectric polarization in a low-temperature phase. Such a ferroelectric film is prepared from PZT consisting of mixed crystals of PbZrO₃ and PbTiO₃ or BST consisting of mixed crystals of BaTiO₃ and SrTiO₃. While such a material is in a perovskite or pyrochlore structure, it is necessary to utilize a perovskite crystal system since a pyrochlore crystal system has a low dielectric constant. In general, the aforementioned ferroelectric film is generally formed by a polycrystalline thin film.

(Prior Art 17)

FIG. 209 is a sectional view showing a semiconductor device for serving as a nonvolatile memory device (EPROM/flash EPROM) according to Prior Art 17. Referring to FIG. 209, numeral 3621 denotes a p-type semiconductor substrate, numeral 3622 denotes a LOCOS oxide layer (SiO₂), numeral 3623 denotes a gate insulating film, numeral 3624 denotes a floating gate, numeral 3625 denotes a control gate, and numeral 3626 denotes an interlayer insulating film which is interposed between the gates 3624 and 3625. The floating gate 3624 is prepared from polycrystalline silicon (polysilicon). The interlayer insulating film 3626 is formed by a multilayer film (oxi-nitride: ONO) consisting of silicon oxide (SiO₂) and silicon nitride (SIN) or independently prepared from silicon oxide (SiO₂), so lo that an SiO₂ layer is in contact with the floating gate 3624 in either case. In formation of this interlayer insulating film 3626, the polysilicon forming the floating gate 3624 is oxidized to grow SiO₂.

(Prior Art 18)

FIG. 210 is a sectional view showing a semiconductor device for serving as a nonvolatile memory device (EPROM/flash EPROM) according to Prior Art 18. Referring to FIG. 210, members having the same functions as those in Prior Art 17 are denoted by similar reference numerals. In the semiconductor device according to Prior Art 18 which aims at a higher degree of integration as compared with that according to Prior Art 17, a source 3627 and a drain 3628 are formed by embedding/diffusion to form a transistor. Also in the semiconductor device according to Prior Art 18, a floating gate 3624 is prepared from polycrystalline silicon (polysilicon) and an interlayer insulating film 3626 is formed by a multilayer film (ONO) consisting of silicon oxide (SiO₂) and silicon nitride (SIN) or independently prepared from silicon oxide (SiO₂), so that an SiO₂ layer is in contact with the floating gate 3624 in either case. In formation of this interlayer insulating film 3626, the polysilicon forming the floating gate 3624 is oxidized to grow SiO₂, similarly to Prior Art 17.

(Prior Art 19)

FIG. 212 is a circuit diagram of a memory cell forming a memory array of a general DRAM according to Prior Art 19. Referring to FIG. 212, symbol 3632 denotes a transistor part, symbol 3633 denotes a bit line, symbol 3635 denotes a word line, and symbol 3637 denotes a capacitance part (data holding part). According to Prior Art 19, a 1-bit memory cell can be formed by a single transistor part and a single capacitance part, whereby it is possible to attain relatively large capacitance.

In such a DRAM which is a volatile memory device, however, information as stored is lost when power is removed. Therefore, it is necessary to regularly supply power in order to hold the stored information, and the application range of this DRAM is disadvantageously limited.

(Prior Art 20)

FIG. 213 is a sectional view showing a memory cell (memory transistor) of a general flash EPROM according to Prior Art 20. Referring to FIG. 213, symbol 3641 denotes a semiconductor substrate, symbol 3642 denotes a floating gate which is formed above the semiconductor substrate 3641, symbol 3643 denotes a control gate which is formed above the floating gate 3642, and symbols 3644 and 3645 denote a source diffusion region and a drain diffusion region which are selectively formed on an upper surface of the semiconductor substrate 3641. A thin gate insulating film (oxide film) is formed in a clearance 3646 between the floating gate 3642 and the semiconductor substrate 3641 for moving electrons through a tunnel phenomenon.

Operation of the flash EPROM is now described. First, the source diffusion region 3644 is grounded and a program voltage is applied to the drain diffusion region 3645 while a voltage is applied to the control gate 3643, whereby the memory cell enters an ON state to allow a current flow. At this time, avalanche breakdown takes place in the vicinity of the drain diffusion region 3645, to generate electron-hole pairs. The holes flow to the ground potential through the semiconductor substrate 3641, while the electrons flow toward a channel 3629 direction into the source diffusion region 3644. However, parts of the electrons are accelerated by an electric field which is developed across the floating gate 3642 and the drain diffusion region 3645, to be injected into the floating gate 3642. Consequently, the threshold voltage of the memory cell is increased. In this state, information "0" is stored. In order to erase the information, on the other hand, the drain diffusion region 3645 is opened, the control gate 3643 is grounded and a voltage is applied to the source diffusion region 3644. Then, a tunnel phenomenon is caused by an electric field which is developed across the source diffusion region 3644 and the floating gate 3642, to extract the electrons from the floating gate 3642. Consequently, the threshold voltage of the memory cell is reduced. In this state, information "1" is stored.

Such a flash EPROM can be regarded as having a higher possibility for mass storage than a DRAM since a 1-bit memory cell can be formed by a single memory transistor. However, this device has a problem of a slow data writing/erasing time. Further, a high electric field is applied to the memory transistor in data writing/erasing to inject or extract electrons through the gate insulating film which is formed in the clearance 3646. Thus, the gate insulating film provided in the clearance 3646 is fatigued with data writing and erasing operations to be gradually reduced in remanence and finally broken. Thus, the number of writing/erasing times is limited.

(Prior Art 21)

In order to solve the aforementioned problems of Prior Art 16 and Prior Art 20, Ramtron Corp. has developed a nonvolatile DRAM (hereinafter referred to its an FRAM) in which a dielectric film of a capacitance part is made of a ferroelectric substance (refer to Nikkei Microdevices, June 1992, pp. 78 to 83 and Japanese Patent Laying-Open Gazettes Nos. 64-66897 (1989), 64-66899 (1989), 1-278063 (1989) and 2-113496 (1990)).

FIG. 214 is a sectional view showing an exemplary ferroelectric DRAM according to Prior Art 21, in which a capacitor part (capacitance part) is made of a ferroelectric substance. An internal circuit of this semiconductor memory device is similar to that of Prior Art 16 shown in FIG. 208, and members having the same functions as those shown in FIG. 208 are denoted by the same reference numerals in the following description. Referring to FIGS. 208 and 214, numeral 3601 denotes a p-type semiconductor substrate, numeral 3602 denotes a transistor part, numeral 3603 denotes a bit line, numeral 3604 denotes a LOCOS oxide film, numeral 3605 denotes a polycrystalline (polysilicon/polycide) word line, numeral 3606 denotes a first insulating film, numeral 3607 denotes a capacitance part (data holding part), numeral 3608 denotes a first wire connecting the transistor part 3602 with the capacitance part 3607, numeral 3609 denotes a dielectric film which is made of a ferroelectric substance, numeral 3610 denotes an upper electrode of the capacitance part 3607, and numeral 3611 denotes a plate.

In the memory device according to Prior Art 21 employing a ferroelectric substance: for a capacitor, a 1-bit memory cell is formed by two transistors and capacitors as shown in FIG. 208 due to remarkable dispersion in charge quantity caused by the dielectric constant and polarization of the capacitance part 3607, and the capacitors are polarized in opposite directions to guarantee data by detecting the difference therebetween.

In such a ferroelectric film which is employed for forming the dielectric film 3609 of the capacitance part 3607, dielectric constants of crystals are increased with temperature reduction to cause phase transition by divergence at a certain critical temperature (Curie temperature) thereby causing spontaneous dielectric polarization in a low-temperature phase. Such a ferroelectric film is prepared from PZT consisting of mixed crystals of $PbZrO_3$ and $PbTiO_3$ or BST consisting of mixed crystals of $BaTiO_3$ and $SrTiO_3$. While such a material is in a perovskite or pyrochlore structure, it is necessary to utilize a perovskite crystal system since a pyrochlore crystal system has a low dielectric constant. In order to implement such a ferroelectric substance having a perovskite crystal structure, an electrode of the ferroelectric substance is generally in a multilayer film structure in which a Pt layer is arranged in an interface with the ferroelectric substance, so that no electrode material (particularly a metal material) enters crystals of the ferroelectric substance to cause a leakage current or deterioration of film characteristics, thereby attaining excellent crystallinity of the ferroelectric substance. In Prior Art 21, the aforementioned ferroelectric film is generally prepared from an amorphous film.

(Prior Art 22)

FIG. 215 illustrates a semiconductor device for serving as a nonvolatile memory device (EPROM/flash EPROM) according to Prior Art 22. As shown in FIG. 215, the semiconductor device according to Prior Art 21 is a ferroelectric gate field effect transistor (hereinafter referred to as MFSFET) in which a memory cell is formed by a transistor 3652 having a gate insulating film 3651 of a ferroelectric substance (refer to Japanese Patent Laying-Open Gazette No. 4-192173 (1992), for example). Referring to FIG. 215, symbol 3653 denotes a p-type semiconductor substrate, symbol 3654 denotes a gate electrode, symbol 3655 denotes a source and symbol 3656 denotes a drain.

Also in the semiconductor device according to Prior Art 22, the ferroelectric film is prepared from PZT consisting of mixed crystals of $PbZrO_3$ and $PbTiO_3$ or BST consisting of mixed crystals of $BaTiO_3$ and $SrTiO_3$. Further, the ferroelectric film is generally prepared from an amorphous film also in the semiconductor device according to Prior Art 22.

(Problem of Prior Art 16)

When the ferroelectric film 3609 for the capacitance part 3607 is formed by a polycrystalline or amorphous thin film in Prior Art 16, a polarization field curve (PE hysteresis curve) with respect to an external electric field is rhomboidally dulled as shown in FIG. 211, to cause dispersion such that remanence is reduced and the dielectric constant is also reduced.

Further, a metal forming the electrode may enter between crystal grains of the ferroelectric film 3609, to cause a leakage current or deterioration in durability. Although there has been proposed a method of depositing a thin $RuO_2$ film on the electrode or adding about several to 10% of La to PZT in order to solve this problem, the dielectric constant is reduced by about 1 digit in either case. While PZT is held by multilayer metals including a Pt layer to be improved in crystallinity in the ferroelectric memory device by Ramtron Corp., for example, the fabrication cost is increased in this case. Thus, none of the aforementioned methods is sufficiently practicable.

As a material for the dielectric film 3609 for the capacitance part 3607 of the conventional DRAM, $SiO_2$, Si—N, $Ta_2O_5$ or the like has been put into practice or studied. The capacitance part generally requires storage capacitance of about 20 to 40 fF, which remains substantially unchanged upon refinement of the device. In a mass storage DRAM, therefore, a capacitive surface area is increased by a complicated structure such as a stack, trench or fin type structure to suppress the cell size. When such a complicated capacitance structure is implemented, however, the number of fabricating steps is inevitably increased. In recent years, therefore, study has been developed to apply a polycrystalline dielectric film having a high dielectric constant to the dielectric film 3609 of the capacitance part 3607. In this case, it is necessary to regulate the crystalline structure in order to suppress dispersion in dielectric constant thereby stabilizing characteristics, while such stabilization of characteristics is limited in a polycrystalline or amorphous thin film. A film thickness of at least 2000 Å, is required in order to obtain a stable film, while the area of the capacitance part 3607 must also be increased in this case and hence it is impossible to cope with refinement of the device.

(Problems of Prior Art 17 and Prior Art 18)

For example, a flash EPROM has a high data reading speed of about several 10 to 200 nsec. in general, while a data writing or erasing operation requires an extremely long time of several//sec. to several msec. depending on the system, and there has been strong requirement for increase in speed. In the semiconductor device having a two-layer structure provided with a floating gate according to each of Prior Art 17 and Prior Art 18, it is necessary to increase a coupling coefficient (GCR) in order to improve writing efficiency etc.

Assuming that $C_1$ represents capacitance between the floating gate 3624 and the semiconductor substrate 3621 and $C_2$ represents that between the floating gate 3624 and the control gate 3625, the coupling coefficient (GCR) is in proportion to $C_2/(C_1+C_2)$. Namely, it is effective to maximize the capacitance $C_2$ between the floating gate 3624 and the control gate 3625. This can be attained by the following three methods:

(1) To reduce the thickness of the interlayer insulating film 3626 which is provided between the gates 3624 and 3625.

(2) To increase the dielectric constant of the interlayer insulating film 3626.

(3) To increase the overlap area of the gates 3624 and 3625.

In practice, however, the device has the following restrictions:

[1] The thickness of the interlayer insulating film 3626 is decided due to requirement in performance for ensuring withstand voltages of about 30 to 40 V for the floating gate 3624 and the control gate 3625. Namely, the thickness must be maintained at a certain degree since the interlayer withstand voltage is disadvantageously reduced if the thickness is reduced. In more concrete terms, the gate insulating film 3623 has a thickness (distance between the floating gate 3624 and the semiconductor substrate 21) of about 20 nm and the interlayer insulating film 3626 has a thickness (distance between the floating gate 3624 and the control gate 25) of about 60 nm ($SiO_2$:10 nm and SiN: 50 nm in ONO structure) in a general F. PROM.

[2] The material for the interlayer insulating film 3626 is restricted to an ONO or $SiO_2$ film, and hence it is impossible to increase the dielectric constant of the interlayer insulating film 3626 so far as such a material is employed. In more concrete terms, $SiO_2$ and ONO films have dielectric constants of about 3.9 and 6 to 9 respectively. It may conceivably be possible to employ a film of BST consisting of mixed crystals of $BaTiO_3$ and $SrTiO_3$) or PLZT obtained by adding La to mixed crystals of $PbZrO_3$ and $PbTiO_3$ as a high dielectric film. This material has a dielectric constant of about 300, which is higher by 30 to 50 times than that of the ONO film. In a conventional fabrication method, however, a thickness of at least 200 nm (300 to 400 nm in practice) is required in order to stabilize the properties of the film, and hence it is necessary to hold the film with multilayer metals including a Pt layer or the like in order to improve crystallinity of the film. Thus, this film is unsuitable for the interlayer insulating film 3626 provided between the gates 3624 and 3625 of the memory device, and is not put into lo practice.

[3] In each of Prior Art 17 and Prior Art 18, the area S1 of the floating gate 3624 is substantially doubled as compared with the area S2 of the channel region so that the capacitance $C_2$ between the floating gate 3624 and the control gate 3625 is larger than the capacitance $C_1$, in order to attain a coupling coefficient of about 0.6. While the capacitance $C_2$ is increased when the overlap area between the floating gate 3624 and the control gate 3625 is thus increased, however, the memory cell area is inevitably increased contrarily to the requirement for miniaturization of the device. In order to attain a coupling coefficient (GCR) of 0.6 to 0.7, the overlap area between the floating gate 3624 and the control gate 3625 is doubled or tripled as compared with the area of the channel region. While it is necessary to reduce the overlap area between the floating gate 3624 and the control gate 3625 in order to reduce the memory cell area, the coupling coefficient cannot be reduced below 0.5, in order to maintain performance of the memory device. In particular, it is possible to reduce the cell area by separating adjacent cells from each other by a trench T (see FIG. 172). In this case, however, the area S1 of the floating gate 3624 must be substantially equalized to the area S2 of the channel region in design, and the coupling coefficient is deteriorated to about 0.4 in this case. Particularly when the semiconductor device according to Prior Art 18 is formed not by embedding/diffusion but $N^+$ injection with a mask of the floating gate 3624 in self alignment, the size of the floating gate 3624 is inevitably equalized to that of the channel region. In this case, the coupling coefficient is extremely reduced.

In each of Prior Art 17 and Prior Art 18, further, the floating gate 3624 is made of polysilicon and grown by oxidation to form the interlayer insulating film 3626, and hence these layers are inferior in crystallinity and not dense in film quality.

Further, it is difficult to form the floating gate 3624 in a flat state due to the polycrystalline structure of its surface, and the floating gate 3624 is generally provided with projections. When the floating gate 3624 is oxidized in this state, the projections are further grown due to a high oxidation speed. These projections extremely reduce the withstand voltage of the interlayer insulating film 3626 provided between the floating gate 3624 and the control gate 3625. Therefore, it is necessary to smooth such projections before oxidation of the floating gate 3624 by implanting $Ar^+$ or $As^+$ into the polysilicon at about 50 keV and bringing the polysilicon surface of the floating gate 3624 into an amorphous state. Thus, the processing steps are increased to increase the fabrication time.

(Problem of Prior Art 19)

In the DRAM according to Prior Art 19 which is a volatile memory device, information as stored is lost when power is removed as hereinabove described. Therefore, it is necessary to regularly supply power in order to hold the stored information, and the application range of this DRAM is limited. While a 1-bit memory cell is formed by a single transistor part and a single capacitance part in the semiconductor device according to Prior Art 19, a concrete system for forming a 1-bit memory cell by only a single transistor part is desired in order to further miniaturize the memory cell.

(Problem of Prior Art 20)

In the semiconductor device according to Prior Art 20, the data writing/erasing is at a slow speed and the gate insulating film provided in the clearance 3646 is fatigued with data writing and erasing operations to be finally broken, as hereinabove described. Thus, the number of writing/erasing times is limited.

(Problem of Prior Art 21)

In the semiconductor device according to Prior Art 21, a 1-bit memory cell is formed by two transistors and two capacitors as shown in FIG. 208, and hence miniaturization of the memory cell is limited. Thus, a concrete system for forming a 1-bit memory cell by only a single transistor part is desired, as hereinabove described.

Further, a multilayer film forming step is complicated in the semiconductor device according to Prior Art 21 due to the multilayer film structure including a Pt layer, and hence simplification of the steps in mass production is limited.

(Problem of Prior Art 22)

Although a 1-bit memory cell is formed by a single transistor in the MFSFET according to Prior Art 22, internal crystallinity is inferior due to an amorphous film which is applied to the gate insulating film 3651 of a ferroelectric substance in particular, and hence its film thickness must be increased to some extent. In order to ensure a constant breakdown voltage for the gate insulating film 3651, therefore, a single transistor memory cell is increased in area. Thus, it is impossible to implement a practical degree of integration when a plurality of cells are arranged in parallel with each other.

In order to implement the MFSFET according to Prior Art 22, it is necessary to form a perovskite crystalline film of a ferroelectric substance on an upper surface of a silicon film (Si), a silicon oxide film ($SiO_2$) or a silicon nitride film (Si—N) as an underlayer. Under the present circumstances, however, there has been announced no effective method of crystallizing a perovskite film of a ferroelectric substance, and it is extremely difficult to single-crystallize the same in particular. Therefore, improvement of polarization field characteristics of the ferroelectric substance with respect to an external electric field is limited. Particularly in formation of a thin film, a problem is caused in stability of characteristics.

(Prior Art 23)

FIG. 231 illustrates a general 6-transistor CMOS-SRAM cell. The SRAM is formed by nMOS transistors N1 and N2, a CMOS flip-flop in which an input and an output of a CMOS inverter pair connected with single ones of pMOS transistors P1 and P2 respectively are cross-connected with each other, and nMOS transfer transistors N3 and N4. When information is "1", the transistors P1 and N2 conduct while the transistors P2 and N1 enter nonconducting states. When information is "0", on the other hand, the transistors P1 and N2 enter nonconducting states while the transistors P2 and N1 conduct. Consequently, no consumption current flows in this cell in a standby state except a leakage current component, whereby power consumption can be saved in the standby state.

FIG. 232 is a sectional view showing a semiconductor device according to prior art 23, in which the pMOS transistor P1 provided in the SRAM shown in FIG. 231 is formed by a TFT. Referring to FIG. 232, numeral 3701 denotes a substrate, numeral 3702 denotes a wire to be connected to a gate of the nMOS transistor N1, numeral 3703 denotes a first insulating film, numeral 3704 denotes a gate of the pMOS transistor P1, numeral 3705 denotes a wire to be connected to gates of the pMOS transistor P2 and the nMOS transistor N2, numeral 3706 denotes a second insulating film, numeral 3707 denotes a drain of the transistor P1, numeral 3708 denotes a source of the transistor P1, and numeral 3709 denotes a channel interposed between the drain 3707 and the source 3708.

In the prior art 23, the wires 3702 and 3705, the gate 3704, the drain 3707, the source 3708 and the channel 3709 are formed by polycrystalline (polysilicon) or amorphous silicon films.

(Prior Art 24)

FIG. 233 is a sectional view showing a semiconductor device according to prior art 24, in which a TFT is built into a display device of an active matrix liquid display. Referring to FIG. 233, numeral 3711 denotes a condensed capacitance part, numeral 3712 denotes a TFT, numeral 3713 denotes a glass substrate, numeral 3714 denotes a lower electrode of aluminum or the like for the condensed capacitance part 3711, numeral 3715 denotes an $Al_2O_3$ film, numeral 3716 denotes a transparent upper electrode (ITO) for the condensed capacitance part 3711, numeral 3717 denotes a gate of MoTa or the like for the TFT 3712, numeral 3718 denotes an Si channel for the TFT 3712, numeral 3719 denotes a source of n+-type Si or the like for the TFT 3712, numeral 3721 denotes a drain of $n^+$-type Si or the like for the TFT 3712, and numeral 3722 denotes a dielectric film (gate insulating film) of $SiN_x$ or $SiO_2$. FIG. 234 is an enlarged sectional view showing the TFT 3712. Referring to FIG. 234, numeral 3723 denotes an $SiN_x$ film for serving as a gate insulating film, numeral 3724 denotes an amorphous Si film, and numeral 3725 denotes an electrode of Mo/Al or the like. Referring to FIG. 234, the TFT 3712 is generally formed in order of the gate 3717, the gate insulating films 3722 and 3723, the amorphous Si film 3724, the Si channel 3718, the source 3719 and the drain 3721, and the electrode 3725. The gate insulating films 3722 and 3723, the lower electrode 3714 for the condensed capacitance part 3711, the gate 3717 and the Si channel 3718 are in polycrystalline or amorphous structures.

(Problem of Prior Art 23)

While the drain 3707, the source 3708 and the channel 3709 of the TFT according to the prior art 23 are formed by polycrystalline (polysilicon) or amorphous silicon films, the ratio of a drain current in an ON state of the transistor to that in an OFF state is small in a TFT employing polysilicon, for example. When an OFF-state current is reduced in order to reduce a standby current of the SRAM in this case, the ON-state current is also reduced such that it takes time to charge the potential of the memory cell immediately after writing from Vcc-Vth to Vcc, and hence the access time is retarded. When the ON-state current is increased, on the other hand, the OFF-state current is also increased to disadvantageously increase the standby current. In a TFT employing amorphous silicon which is mainly applied to an active element for a liquid crystal display, on the other hand, the consumption current comes into question when the TFT is applied to a portable device or a color display, due to a large OFF-state current.

(Problem of Prior Art 24)

In the prior art 24, on the other hand, the gate insulating films 3722 and 3723 which are in amorphous structures are so inferior in crystallinity that these films are increased in thickness to 400 to 500 nm on the TFT side and to at least 200 nm in the dielectric film 3722 on the side of the condensed capacitance part 3711 respectively. Therefore, a large area is required per element for obtaining a sufficient condensed capacitance value, leading to hindrance to high definition. In other words, improvement in numerical aperture is limited.

In the prior art 24, further, the Si channel 3718 is provided in a polycrystalline or amorphous structure, and hence electron mobility in the channel is reduced while resistance values of the lower electrode 3714 for the condensed capacitance part 3711 and the TFT gate 3717 are increased when the same are prepared from general Ta or the like. Therefore, increase in operating speed of the TFT for a driver is limited.

When the lower electrode 3714 for the condensed capacitance part 3711 and the gate 3717 of the TFT 3712 as well as the gate insulating films 3722 and 3723 provided on the upper surfaces thereof are reduced in thickness as shown in FIG. 233, further, it is necessary to form the lower electrode 3714 and the gate 3717 serving as underlayers in flat states. When the lower electrode 3714 and the gate 3717 are made of Al or an Al alloy for attaining low resistance, however, polycrystalline or amorphous structures provided on surfaces thereof may partially define nuclei for growing projections (hillocks) in heat treatment of about 400° C. Thus, a leakage current may be generated in employment. In the prior art 24, therefore, the surfaces of the lower electrode 3714 and the gate 3717 are covered with thick $Al_2O_3$ layers by anodization as shown in FIG. 233, for preventing occurrence of hillocks. In this case, however, the number of members is increased with increase of the fabrication steps, and hence the cost is increased.

(Prior Art 25)

A liquid crystal display (LCD) comprising an electrically insulating transparent substrate which is provided thereon with pixel electrodes of liquid crystal elements and thin-film type active elements for driving the liquid crystal elements for respective pixels which are arranged in the form of a matrix is called an active matrix LCD, and forms the mainstream of commercially available liquid crystal displays. The active elements for driving the liquid crystal elements are typically formed by thin-film transistors (TFT).

FIG. 267 is a circuit diagram showing a circuit structure for one pixel in such an active matrix LCD according to prior art 25. Referring to FIG. 267, a liquid crystal element 3853 for one pixel and a TFT 3854 which is connected in series with this liquid crystal element 3853 for driving the same are arranged at an intersection between a signal line 3851 and a scanning line 3852 which are arranged in the form of a matrix. In this example, the TFT 3854 is formed by a MOS field-effect transistor (MOSFET). The series circuit of the liquid crystal element 3853 and the TFT 3854 is interposed between the signal line 3851 and the ground potential, while a gate electrode G which is a control electrode of the TFT 3854 is connected to the scanning line 3852. When the scanning line 3852 is at a high-level potential, the TFT 3854 enters a conducting state so that a picture signal which is carried by the signal line 3851 is written in the liquid crystal element 3853. When the scanning line 3852 is at a low-level potential, on the other hand, the TFT 3854 enters a cutoff state, to hold the picture signal which is written in the liquid crystal element 3853. A number of scanning lines 3852 are successively brought into high levels one by one, for example, for successively updating images displayed by this unit. A holding capacitance 3855 is connected to the liquid crystal element 3853 for supplementing electrostatic capacitance of the liquid crystal element 3853, so that an image signal which is written in the liquid crystal element 3853 is sufficiently held over a period up to next writing.

(Problem of Prior Art 25)

In relation to the TFT 3854 which is employed for the active matrix LCD, known are two types of TFTs including an amorphous silicon TFT and a polysilicon TFT employing amorphous Si polycrystalline Si (polysilicon) for active layers thereof respectively. The term "active layer" in relation to an element such as a transistor indicates a principal part of an element having semiconductor regions of different conductivity types and a junction therebetween for implementing behavior of a main current which is specific to the element.

<1. Problems of Unit Employing Amorphous Silicon TFT>

An active layer of an amorphous silicon TFT can be formed under a low temperature through chemical vapor deposition (CVD), for example. Therefore, the process maximum temperature for forming such an amorphous silicon TFT can be reduced below 400° C. Thus, a transparent substrate to be provided with the TFT can be prepared from a low-priced glass substrate having a low withstand temperature. In other words, it is possible to fabricate an amorphous silicon TFT at a low cost.

On the other hand, such an amorphous silicon TFT having an active layer of amorphous Si disadvantageously has a small ON-state current, i.e., current upon conduction, since the active layer has low mobility of about 0.2 to 0.5 $cm^2/(V.sec)$. Thus, it is difficult to obtain a high-contrast image having small flicker noise. Further, it is difficult to refine the element due to the small mobility, and hence it is difficult to densely arrange pixels. Consequently, it is difficult to obtain a high-definition image.

Since the active layer is made of amorphous Si, the so-called inverted stagger structure in which a gate electrode is positioned under a channel portion on the side of the transparent substrate is employed. Therefore, it is impossible to use the self-alignment technique of introducing an impurity through the gate electrode serving as a mask. Consequently, the TFT must inevitably be increased in size due to requirement for redundant design of about 5 μm. This also leads to difficulty in provision of a high-definition image. Further, no excellent switching characteristics can be attained since parasitic capacitance between electrodes is increased due to the large-sized TFT, leading to deterioration of picture quality.

In addition, it is difficult to form a circuit for driving the amorphous silicon TFT on a single transparent substrate with the amorphous silicon TFT.

<2. Problems of Unit Employing Polysilicon TFT>

As compared with the amorphous silicon TFT having the aforementioned characteristics, a polysilicon TFT has the following characteristics: The polysilicon TFT has a large ON-state current, i.e., current upon conduction, since its active layer which is made of polycrystalline Si has high mobility of about 10 to 50 cm²/(V.sec.). Therefore, a high-definition image having high contrast and small flicker noise can be easily obtained.

Since the active layer is made of polycrystalline Si, it is possible to employ such a structure that a gate electrode is positioned above a channel portion, i.e., on a side opposite to the transparent substrate. Thus, it is possible to employ the self-alignment structure of introducing an impurity through the gate electrode serving as a mask by preparing the gate electrode from polycrystalline Si, whereby no redundant design is required. This also contributes to a high-definition image. Further, a circuit for driving the polysilicon TFT can be easily formed on a single transparent substrate with the polysilicon TFT, whereby it is possible to advantageously form a miniature unit which is easy to handle.

However, the process maximum temperature of the polysilicon TFT exceeds 600° C. so far as the same is fabricated by a conventional method in prior art 25, since it is necessary to form a polycrystalline Si thin film. Thus, an $SiO_2$ (quartz) substrate having a high withstand temperature must be employed as the transparent substrate to be provided with the TFT and the like. Namely, the fabrication cost is increased in a unit employing the polysilicon TFT.

As hereinabove described, a unit employing an amorphous silicon TFT is inferior in picture quality although the same can be fabricated at a low cost, while the polysilicon TFT has a problem of a high fabrication cost although the same has excellent picture quality. In a unit employing a transistor whose active layer is made of single-crystalline Si in place of a polysilicon TFT, further, the fabrication cost is further increased although the picture quality is further improved, while the transistor cannot be provided in the form of a thin film but only a bulk transistor is available, and hence only a reflective LCD can be formed.

(Prior Art 26)

FIGS. 288 to 290 show a semiconductor device of a metal-insulator-semiconductor structure (MIS structure) according to Prior Art 26 employing a cladding system. In the cladding system, an oxide film 3902 is first grown on an Si substrate 3901 to form a first sample 3903 as shown in FIG. 288. Then another silicon wafer sample 3904 is clad thereon as shown in FIG. 289, and the as-clad silicon wafer sample 3904 is scraped to be reduced in thickness as shown in FIG. 290, thereby forming a transistor.

(Prior Art 27)

FIGS. 291 and 292 show a semiconductor device according to Prior Art 27 employing a SIMOX system. According to the SIMOX system, oxygen ions 3912 are ion-implanted in high concentration into a portion of a desired depth in an Si substrate 3911, as shown in FIG. 291. Thereafter a heat treatment is carried out to react the as-implanted oxygen ions 3912 with silicon which is contained in the Si substrate 3911 for forming an $SiO_2$ film 3913 thereby completely dielectric-isolating an upper Si layer 3914 from a lower Si layer 3915 as shown in FIG. 292, so that a heterojunction transistor is formed on the upper surface.

(Prior Art 28)

FIG. 293 illustrates a step of forming a channel in a MOSFET of a general MIS structure or a metal-ferroelectric-semiconductor structure (MFS structure) for serving as an electrically writable/erasable non-volatile memory element according to Prior Art 28. In Prior Art 28, a LOCOS oxide film 3922 and a gate oxide film 3923 are first partially formed on an upper surface of an Si substrate 3921, as shown in FIG. 293. Then, an impurity such as $B^+$ is ion-implanted into the Si substrate 3921 to form a channel, in order to control the threshold value of the MOSFET. At this time, the ion implantation is carried out through the gate oxide film 3923 in the state shown in FIG. 293, or the gate oxide film 3923 is wet-etched after the ion implantation to re-oxidize the Si substrate 3921 for forming a new gate oxide film.

FIG. 294 is a sectional view showing a step of diffusing/forming a source 3924 and a drain 3925 of the general MOSFET according to Prior Art 28. Ions as implanted are generally prepared from $P^+$ or $As^+$ for an NMOS transistor, or $B^+$ or $BF_2^+$ for a PMOS transistor. Referring to FIG. 294, numeral 3926 denotes a gate.

FIG. 295 is a sectional view showing the general MOSFET according to Prior Art 28, in a state immediately after formation of an interconnection film 3927. This interconnection film 3927 is generally prepared from Al—Si or Al—Si—Cu. Referring to FIG. 295, numeral 3928 denotes an insulating film of PSG, BPSG or NSG. An Al alloy/TiN laminate structure may be employed in general, since sufficient reliability may not be attained by interconnection with a single Al alloy layer, following refinement of the device.

FIG. 296 is a sectional view showing the MOSFET of a two-layer interconnection film system according to Prior Art 28. Referring to FIG. 296, numeral 3929 denotes a second interconnection film of Al—Si or Al—Si—Cu, and numeral 3931 denotes an interlayer isolation film. The interlayer isolation film 3931, which is an underlayer for the second interconnection film 3929, is preferably flattened since the second interconnection film 3929 may be disconnected if this film 3931 has a step.

In order to flatten the interlayer isolation film 3931, an NSG, PSG or BPSG film or a multilayer oxide film thereof is first deposited by CVD and thereafter coated with a resist or SOG film by a spin coater, to fill up a step portion by a method such as sintering. Thereafter the as-coated material and the multilayer oxide film are simultaneously etched back to form the interlayer isolation film 3931. At this time, it is necessary to maintain the as-coated material and the multilayer oxide film at the same etching rates.

(Prior Art 29)

FIG. 297 is a sectional view showing an EPROM or a flash EPROM according to Prior Art 29. Referring to FIG. 297, numeral 3935 denotes an Si substrate, numeral 3936 denotes a source, numeral 3937 denotes a drain, numeral 3938 denotes a gate insulating film, numeral 3939 denotes a floating gate, numeral 3941 denotes an interlayer isolation film, and numeral 3942 denotes a control gate. The gate insulating film 3938 is formed by an oxide film which is prepared by thermally oxidizing the Si substrate 3935.

(Prior Art 30)

FIG. 298 is a sectional view showing a planar type NPN bipolar transistor according to Prior Art 30. Referring to FIG. 298, numeral 3945 denotes an n-type collector, numeral 3946 denotes a p-type base, and numeral 3947 denotes an n-type emitter. According to Prior Art 30, impurity ions of P or As are implanted into the n-type collector 3945 and the n-type emitter 3947 while impurity ions of B or $BF_2$ are implanted into the p-type base 3946, and these impurities are diffused and activated by a heat treatment.

(Problem of Prior Art 26)

When the cladding system is employed as in Prior Art 26, however, the cost is increased since an operation for cladding two wafers with each other and scraping the same in high accuracy requires a considerable number of steps.

(Problem of Prior Art 27)

When the SIMOX system is employed as in Prior Art 27, on the other hand, considerably high energy ions are implanted and hence crystals are so significantly defected that it is difficult to attain excellent characteristics.

(Problem of Prior Art 28)

When the method of implanting ions through the gate oxide film 3923 in the state shown in FIG. 293 is employed in Prior Art 28, the film quality is deteriorated to easily cause a leakage current and dielectric breakdown due to passage of the high-energy ions through the gate oxide film 3923, although the threshold value can be controlled in high accuracy.

When the method of wet-etching the gate oxide film 3923 after the ion implantation for re-oxidizing the Si substrate 3921 and forming a new gate oxide film, on the other hand, it is difficult to accurately control the threshold value since an impurity (boron) which is implanted into Si is incorporated in the oxide film during the oxidation step, although a high-quality film can be obtained due to the new oxide film formed after the ion implantation.

Thus, it is difficult to improve the quality of the gate oxide film while accurately controlling the threshold value at the same time.

In Prior Art 28, further, impurity concentration generally exceeds $1 \times 10^{20}$ cm$^{-3}$ after the ion implantation for forming the source 3924 and the drain 3925, to cause a number of defects in the regions provided with the source 3924 and the drain 3925. A heat treatment (annealing) is required in order to recover the defects and activate the impurity. At this time, the impurity is disadvantageously diffused in Si due to the high-temperature treatment, and hence it is difficult to form refined shallow junction. According to Prior Art 28, the gate insulating film 3923 is designed to be about 100 Å in thickness following refinement of the semiconductor device, while such a gate insulating film 3923 is rather inferior in reliability.

In the interconnection film according to Prior Art 28, sufficient reliability cannot be obtained by interconnection through a single Al alloy layer. In order to solve this problem, an Al alloy/TiN laminate structure is generally employed as hereinabove described. In this case, however, the fabrication steps are complicated to cause increase in cost.

Further, Prior Art 28 requires an oxide film of NS, PSG or BPSG and a coating material of resist or SOG provided on its upper surface for flattening the interlayer isolation film 3931 as shown in FIG. 296, while these materials must be maintained at the same etching rates. Thus, it takes time to adjust the materials.

(Problem of Prior Art 29)

In Prior Art 29, the gate insulating film 3923 is designed to be about 100 Å in thickness following refinement of the semiconductor device similarly to Prior Art 28, while the gate insulating film 3923 must be improved in reliability in such a thin film forming technique. Thus, awaited is a technique for increasing the thickness of the gate insulating film 3923 and preventing carrier trap in the film interface and occurrence of a leakage current, thereby remarkably improving the insulating film withstand voltage. Particularly in the case of the EPROM or the flash EPROM according to Prior Art 29, the fabrication steps are complicated to increase the cost due to the four-layer structure of the gate portion as shown in FIG. 297.

(Problem of Prior Art 30)

In Prior Art 30, the size of the base 3946 is easily fluctuated due to large dispersion of its thickness D1, to extremely influence on the electric characteristics of the transistor. In the planar type device according to Prior Art 30, it is necessary to reduce the junction capacitance across the base and the collector as well as that across the emitter and the base in order to improve the switching speed of the transistor. However, it is difficult to reduce these junction capacitances since the emitter and the base are formed by diffusion, as hereinabove described. Further, it is also difficult to reduce the transistor size for a similar reason. FIG. 299 shows a polyemitter transistor structure, which is proposed in relation to a method for solving such a problem. In this structure, an emitter 3947 is formed by a polycrystalline film, so that the junction capacitance across the emitter 3947 and a base 3946 is set at a small value by forming an insulating film 3948. When such a method is employed, it is possible to form an extremely shallow diffusion region of the emitter 3947. However, refinement of the base 3946 is limited since the same is formed by a method similar to that in a planar type device, while the transistor characteristics may be further dispersed as compared with those of the planar type device in view of fabrication steps.

SUMMARY OF THE INVENTION

According to a first aspect of the present invention, a method of manufacturing a micromachine comprising a member which is at least partially separated from a base material comprises:

(a) a step of forming a sacrifice layer on the base material, (b) a step of forming a layer of a prescribed material forming the member on the sacrifice layer, (c) a step of irradiating the layer of the prescribed material with gas beams of low energy levels causing no sputtering of the prescribed material from directions which are perpendicular to a plurality of densest crystal planes having different directions in a single-crystalline layer to be formed under an optimum temperature below a crystallization temperature of the prescribed material during or after the step (b), thereby converting the layer of the prescribed material to a single-crystalline layer, and (d) a step of removing the sacrifice layer after the step (c).

According to a second aspect of the present invention, a method of manufacturing a micromachine comprising a member which is at least partially separated from a base material comprises:

(a) a step of forming a layer of a first material inhibiting progress of etching on a surface of the base material, (b) a step of forming a layer of a second material forming the member on the layer of the first material, (c) a step of irradiating the layer of the second material with gas beams of low energy levels causing no sputtering of the second material from directions which are perpendicular to a plurality of densest crystal planes having different directions in a single-crystalline layer to be formed under an optimum temperature below a crystallization temperature of the second material during or after the step (b), thereby converting the layer of the second material to a single-crystalline layer, and (d) a step of selectively etching the base material for exposing the layer of the first material from a back side of the base material after the step (b).

Preferably, the first material is an electrical insulator, and the second material is a semiconductor.

Preferably, the method further comprises (e) a step of selectively introducing an impurity into the single-crystalline layer of the second material, thereby incorporating a distortion sensor into the single-crystalline layer of the second material.

According to a third aspect of the present invention, a method of manufacturing a micromachine comprising a member which is at least partially separated from a base material comprises:

(a) a step of forming a sacrifice layer on the base material, (b) a step of selectively removing a specific portion of the sacrifice layer, (c) a step of forming a layer of a prescribed material forming the member on the sacrifice layer and a portion of the base material corresponding to the specific portion, (d) a step of irradiating the layer of the prescribed material with gas beams of low energy levels causing no sputtering of the prescribed material from directions which are perpendicular to a plurality of densest crystal planes having different directions in a single-crystalline layer to be formed under an optimum temperature below a crystallization temperature of the prescribed material during or after the step (c), thereby converting the layer of the prescribed material to a single-crystalline layer, and (e) a step of removing the sacrifice layer after the step (d).

Preferably, the method further comprises (f) a step of selectively forming an opening in the layer of the prescribed material in advance of the step (e), and the step (e) comprises (e-1) a step of removing the sacrifice layer by carrying out etching through the opening after the step (f).

According to a fourth aspect of the present invention, a method of manufacturing a micromachine comprising a member which is at least partially separated from a base material comprises:

(a) a step of forming a first sacrifice layer on the base material, (b) a step of forming a layer of a first material on the first sacrifice layer, (c) a step of irradiating the layer of the first material with gas beams of low energy levels causing no sputtering of the first material from directions which are perpendicular to a plurality of densest crystal planes having different directions in a single-crystalline layer to be formed under an optimum temperature below a crystallization temperature of the first material during or after the step (b), thereby converting the layer of the first material to a single-crystalline layer, (d) a step of selectively removing the layer of the first material, (e) a step of forming a second sacrifice layer on an unremoved remaining portion of the layer of the first material and the first sacrifice layer after the step (d), (f) a step of selectively removing specific portions of the first and second sacrifice layers while leaving at least the unremoved remaining portion of the layer of the first material resulting from the step (d), (g) a step of forming a layer of a second material forming the member on the second sacrifice layer and a portion of the base material corresponding to the specific portion, (h) a step of irradiating the layer of the second material with gas beams of low energy levels causing no sputtering of the second material from directions which are perpendicular to a plurality of densest crystal planes having different directions in a single-crystalline layer to be formed under an optimum temperature below a crystallization temperature of the second material during or after the step (g), thereby converting the layer of the second material to a single-crystalline layer, and (i) a step of removing the first and second sacrifice layers after the step (h).

According to a fifth aspect of the present invention, a method of manufacturing a micromachine comprising a member which is at least partially separated from a base material comprises:

(a) a step of forming a concave portion on an upper surface of the base material, (b) a step of filling up the concave portion with a sacrifice layer, (c) a step of forming a layer of a prescribed material forming the member on the sacrifice layer and a portion of the base material corresponding to a peripheral portion of the concave portion, (d) a step of irradiating the layer of the prescribed material with gas beams of low energy levels causing no sputtering of the prescribed material from directions which are perpendicular to a plurality of densest crystal planes having different directions in a single-crystalline layer to be formed under an optimum temperature below a crystallization temperature of the prescribed material during or after the step (c), thereby converting the layer of the prescribed material to a single-crystalline layer, and (e) a step of removing the sacrifice layer after the step (d).

Preferably, the prescribed material is a semiconductor, and the method further comprises (f) a step of selectively introducing an impurity into the single-crystalline layer of the prescribed material, thereby incorporating a distortion sensor into the single-crystalline layer of the prescribed material.

According to a sixth aspect of the present invention, a method of manufacturing a micromachine comprising a member which is at least partially separated from a base material comprises:

(a) a step of forming a concave portion on an upper surface of the base material, (b) a step of filling up the concave portion with a sacrifice layer, (c) a step of forming a layer of a first material which is an insulator on the sacrifice layer and a portion of the base material corresponding to a peripheral portion of the concave portion, (d) a step of forming a layer of a second material which is a semiconductor mainly composing the member on the layer of the first material, (e) a step of irradiating the layer of the second material with gas beams of low energy levels causing no sputtering of the second material from directions which are perpendicular to a plurality of densest crystal planes having different directions in a single-crystalline layer to be formed under an optimum temperature below a crystallization temperature of the second material during or after the step (d), thereby converting the layer of the second material to a single-crystalline layer, and (f) a step of removing the sacrifice layer after the step (e).

According to a seventh aspect of the present invention, a method of manufacturing a micromachine comprising a step of etching a base material comprises:

(a) a step of forming a layer of a prescribed material on the base material, (b) a step of irradiating the layer of the prescribed material with gas beams of low energy levels causing no sputtering of the prescribed material from directions which are perpendicular to a plurality of densest crystal planes having different directions in a single-crystalline layer to be formed under an optimum temperature below a crystallization temperature of the prescribed material during or after the step (a), thereby converting the layer of the prescribed material to a single-crystalline layer having a prescribed crystal orientation provided with high resistance against the etching, and (c) a step of selectively etching the base material for exposing the layer of the prescribed material from a back side of the base material after the step (b).

Preferably, the base material has a single-crystalline structure and the prescribed material is identical to a material forming the base material, and the method further comprises (d) a step of irradiating the layer of the prescribed material with gas beams of low energy levels causing no sputtering of the prescribed material from directions which are perpendicular to a plurality of densest crystal planes having different directions in a single-crystalline layer to be formed under an optimum temperature below a crystallization temperature of the prescribed material after the step (c), thereby converting the layer of the prescribed material to a new single-crystalline layer having the same crystal orientation as the base material.

According to an eighth aspect of the present invention, a method of manufacturing a micromachine comprising a step of etching a base material comprises:

(a) a step of forming a masking member on an upper surface of the base material, (b) a step of selectively removing the masking member, (c) a step of irradiating an upper surface of a prescribed material forming an upper surface portion of the base material with gas beams of low energy levels causing no sputtering of the prescribed material from directions which are perpendicular to a plurality of densest crystal planes having different directions in a single-crystalline layer to be formed under an optimum temperature below a crystallization temperature of the prescribed material after the step (b), thereby converting the upper surface portion of the prescribed material to a single-crystalline layer having a prescribed crystal orientation provided with high resistance against the etching, (d) a step of removing the masking member after the step (c), and (e) a step of carrying out the etching on the base material from the upper surface of the base material, thereby selectively removing a portion of the base material which is not covered with the single-crystalline layer.

Preferably, the prescribed material forming the upper surface portion of the base material has a single-crystalline structure in advance of the step (c), and the method further comprises (f) a step of irradiating the layer of the prescribed material with gas beams of low energy levels causing no sputtering of the prescribed material from directions which are perpendicular to a plurality of densest crystal planes having different directions in a single-crystalline layer to be newly formed under an optimum temperature below a crystallization temperature of the prescribed material after the step (e), thereby converting a single-crystalline layer of the prescribed material to a new single-crystalline layer having the same crystal orientation as that in advance of the step (c).

According to any of the first to eighth aspects of the present invention, the atomic weight of an element forming the gas is preferably lower than the maximum one of the atomic weights of elements forming the material as irradiated.

In the method according to the first aspect of the present invention, the layer of the prescribed material which is formed on the sacrifice layer is irradiated with the gas beams under a prescribed temperature, so that the law of Bravais acts to convert this layer to a single-crystalline layer. It is possible to manufacture a micromachine having a single-crystalline layer on a member such as a beam, a bridge, a diaphragm, a movable part, a hollow vessel or a fluid passage, for example, at least a part of which is not fixed to but separated from a base material, by thereafter removing the sacrifice layer. In the micromachine which is manufactured by this method, therefore, the member separated from the base material has high strength, small abrasion, a high elastic limit, excellent corrosion resistance, and high uniformity of characteristics. Further, the member having a single-crystalline layer is formed on the base material in situ through no junction or incorporation, whereby a highly accurate micromachine which is easy to manufacture is implemented.

In the method according to the second aspect of the present invention, it is possible to manufacture a micromachine having a single-crystalline layer on a member such as a cantilever, a bridge or a diaphragm, for example, having a part which is fixedly supported by a portion of a base material out of selective etching and another part which is extended in a cavity portion formed by selective etching of the base material. In a micromachine which is manufactured by this method, therefore, the member such as a cantilever or a bridge has high strength, small abrasion, a high elastic limit, excellent corrosion resistance, and high uniformity of characteristics. It is possible to apply large elastic deformation to this member, which is excellent in elastic limit in addition to strength. Therefore, this method is suitable for forming a micromachine which serves as an accelerometer, a stress gauge or a pressure gauge utilizing elastic deformation of this member. Further, the member having a single-crystalline layer is formed on the base material in situ through no junction, whereby a highly accurate micromachine which is easy to manufacture is implemented.

In the method according to the second aspect of the present invention, it is possible to manufacture a micromachine in which a member such as a cantilever, a bridge or a diaphragm, for example, has a semiconductor single-crystalline layer and is fixedly supported by a base material through an electrical insulator. In a micromachine which is manufactured by this method, therefore, no signal current leaks to the base material when a electronic circuit element such as a sensor is incorporated in the single-crystalline layer of the member such as a bridge, whereby a normal operation of the electronic circuit element is guaranteed.

In the method according to the second aspect of the present invention, it is possible to manufacture a micromachine in which a member such as a cantilever, a bridge or a diaphragm, for example, has a semiconductor single-crystalline layer and a distortion sensor is incorporated into this single-crystalline layer. This micromachine can serve as an accelerometer, a stress gauge or a pressure gauge since deformation of the member such as a cantilever can be detected by the distortion sensor. Further, the member such as a cantilever is excellent in elastic limit in addition to strength due to the single-crystalline layer, whereby it is possible to apply large elastic deformation to this member.

Thus, an accelerometer, a stress gauge or a pressure gauge having a wide operating region is implemented. Further, the member such as a cantilever having a single-crystalline layer is formed on the base material in situ through no junction, whereby a highly accurate micromachine which is easy to manufacture is implemented.

In the method according to the third aspect of the present invention, it is possible to manufacture a micromachine comprising a member, such as a fixed beam, a hollow vessel or a fluid passage, for example, having a part which is fixedly supported by a base material and another part which has a clearance between the same and the base material, so that this member is provided with a single-crystalline layer. In a micromachine which is manufactured by this method, therefore, the member such as a fixed beam is excellent in strength, abrasion resistance, elastic limit, corrosion resistance, and uniformity of characteristics. Due to the excellent elastic limit in addition to strength, it is possible to apply large elastic deformation to this member. Therefore, this method is suitable for forming a micromachine which serves as an electrostatic actuator, for example. Further, this method is also suitable for forming a micromachine which serves as a fluid filter or a fluid valve, for example, since the member is excellent in corrosion resistance. Further, the member having a single-crystalline layer is formed on the base material in situ through no junction, whereby a highly accurate micromachine which is easy to manufacture is implemented.

In the method according to the third aspect of the present invention, an opening is formed in the material layer to carry out etching through the opening, thereby smoothly removing the sacrifice layer. Therefore, this method is suitable for manufacturing a micromachine which effectuates the opening as such, such as a fluid filter whose opening serves as a fluid passage, for example.

In the method according to the fourth aspect of the present invention, it is possible to manufacture a micromachine comprising a member such as a hollow vessel or a fluid passage, for example, having a part which is fixedly supported by a base material and another part which has a hollow portion between the same and the base material, and another member inserted in the hollow portion, so that both of the members have single-crystalline layers. These members are excellent in strength, abrasion resistance, elastic limit, corrosion resistance, and uniformity of characteristics, due to the single-crystalline layers. This method is suitable for forming a micromachine which serves as a fluid valve, for example, since these members are excellent in corrosion resistance and abrasion resistance. Further, it is possible to apply large deformation to the member which is inserted in the hollow portion since the same is excellent in elastic limit in addition to strength. Therefore, this method is also suitable for forming a micromachine which serves as a pressure gauge having an oscillator which is inserted in the hollow portion. Further, the members having single-crystalline layers are formed on the base material in situ through no junction, whereby a highly accurate micromachine which is easy to manufacture is implemented.

In the method according to the fifth aspect of the present invention, it is possible to manufacture a micromachine provided with a single-crystalline layer on a member such as a cantilever, a bridge or a diaphragm, for example, having a part which is fixedly supported by a peripheral portion of a concave portion of a base material and another part which is extended in a cavity portion defined by the concave portion of the base material. In the micromachine which is manufactured by this method, therefore, the member such as a cantilever or a bridge has high strength, small abrasion, a high elastic limit, excellent corrosion resistance, and high uniformity of characteristics. It is possible to apply large elastic deformation to this member, which is excellent in elastic limit in addition to strength. Therefore, this method is suitable for forming a micromachine which serves as an accelerometer, a stress gauge or a pressure gauge utilizing elastic deformation of this member. Further, the member having a single-crystalline layer is formed on the base material in situ through no junction, whereby a highly accurate micromachine which is easy to manufacture is implemented.

In the method according to the fifth aspect of the present invention, it is possible to manufacture a micromachine provided with a member such as a cantilever, a bridge or a diaphragm, for example, which has a semiconductor layer so that a distortion sensor is incorporated in this single-crystalline layer. This micromachine can serve as an accelerometer, a stress gauge or a pressure gauge since deformation of the member such as a cantilever can be detected by the distortion sensor. Further, it is possible to apply large elastic deformation to the member such as a cantilever, which is excellent in elastic limit in addition to strength due to the single-crystalline layer. Thus, an accelerometer, a stress gauge or a pressure gauge having a wide operating region is implemented. Further, the member having a single-crystalline layer is formed on the base material in situ through no junction, whereby a highly accurate micromachine which is easy to manufacture is implemented.

In the method according to the sixth aspect of the present invention, it is possible to manufacture a micromachine provided with a member such as a cantilever, a bridge or a diaphragm, for example, which has a semiconductor single-crystalline layer and is fixedly supported by a base material through an electrical insulator. In a micromachine which is manufactured by this method, therefore, no signal current leaks to the base material when an electronic circuit element such as a sensor is incorporated into the single-crystalline layer of the member such as a bridge, whereby a normal operation of the electronic circuit element is guaranteed.

In the method according to the seventh aspect of the present invention, a single-crystalline layer having a crystal orientation suppressing progress of etching is formed on a base material in selective etching of the base material, so that this single-crystalline layer is utilized as an etching stopper. Further, the single-crystalline layer is formed by beam irradiation, whereby a single-crystalline layer of a prescribed material, a prescribed crystal orientation and a prescribed crystal structure can be formed on an arbitrary base material in situ with no dependency on the material of the base material, presence/absence of crystallinity, sizes of crystal grains, the crystal structure and the crystal orientation. Thus, it is possible to easily manufacture a micromachine including a single-crystalline layer as an element and having a complicated structure.

In the method according to the seventh aspect of the present invention, the crystal orientation of the single-crystalline layer of a prescribed material is converted to be identical to that of the base material after completion of utilization as an etching stopper. According to this method, therefore, it is possible to manufacture a micromachine having a complicated structure by a material having a constant substance and a constant crystal orientation. In a micromachine which is manufactured by this method, the base material has an integral structure as if the same is grown into a complicated shape. According to this method, therefore, it is possible to manufacture a micromachine which is excellent in strength and uniformity of characteristics of respective parts in particular.

In the method according to the eighth aspect of the present invention, a single-crystalline layer having a crystal orientation suppressing progress of etching is formed on a base material in selective etching of the base material, so that this single-crystalline layer is utilized as an etching mask. Further, the single-crystalline layer is formed by beam irradiation, whereby a single-crystalline layer of a prescribed material, a prescribed crystal orientation and a prescribed crystal structure can be formed on an upper surface of an arbitrary base material in situ with no dependency on the substance of the base material, presence/absence of crystallinity, sizes of crystal grains, the crystal structure and the crystal orientation. Thus, it is possible to easily and accurately manufacture a micromachine having a complicated structure.

In the method according to the eighth aspect of the present invention, the crystal orientation of the single-crystalline layer of a prescribed material is converted to be identical to that of the base material after completion of utilization as an etching mask. According to this method, therefore, it is possible to manufacture a micromachine having no trace of the etching mask. Particularly when the overall base material has a single-crystalline structure, it is possible to manufacture a micromachine having a complicated structure with a material having a constant substance and a constant crystal orientation. In this case, it is possible to manufacture a micromachine which is excellent in strength and uniformity of characteristics of respective parts in particular.

In the method according to any of the first to eighth aspects of the present invention, the atomic weight of the element forming the gas beam is lower than the maximum one of the atomic weights of the elements forming the material as irradiated, whereby most of the atoms forming the as-applied gas are rearwardly scattered on the surface or in the vicinity of the material as irradiated, to hardly remain in this material. Therefore, it is possible to obtain a single-crystalline thin film having a small amount of impurities.

Accordingly, an object of the present invention is to provide a method of manufacturing a micromachine, which can easily and accurately manufacture a micromachine of a complicated structure provided with a single-crystalline substance as its member.

According to a ninth aspect of the present invention, a solar cell comprises a substrate, a first conductivity type first semiconductor film which is formed on an upper surface of the substrate from a material different from that for the substrate, a first electrode which is connected to the first semiconductor film, a second conductivity type second semiconductor film which is formed on an upper surface of the first semiconductor film, and a second electrode which is connected to the second semiconductor film, and the first and second semiconductor films are formed by single-crystalline films.

According to a tenth aspect of the present invention, a solar cell at least comprises a first heterojunction part having a first conductivity type first semiconductor film and a second conductivity type second semiconductor film which is formed on an upper surface of the first semiconductor film, and a second heterojunction part having a first conductivity type third semiconductor film which is formed on an upper surface of the second semiconductor film and a second conductivity type fourth semiconductor film which is formed on an upper surface of the third semiconductor film, and the heterojunction parts are arranged from that having a larger forbidden bandwidth along a direction of progress of light, while the first, second, third and fourth semiconductor films are formed by single-crystalline films.

Preferably, an interlayer conductor having a thickness capable of transmitting light is interposed between the heterojunction parts.

Preferably, the interlayer conductor is prepared from a metal having an ohmic junction property with respect to the heterojunction parts.

Preferably, the second semiconductor film which is arranged on one side of the interlayer conductor is different in crystal orientation from the third semiconductor film which is arranged on another side of the interlayer conductor.

According to the ninth or tenth aspect of the present invention, each of the single-crystalline films is preferably formed by supplying reaction gases under a low temperature below a crystalline temperature and simultaneously applying beams from directions which are perpendicular to densest crystal planes of a plurality of different directions.

According to the ninth or tenth aspect of the present invention, each of the single-crystalline films is preferably formed by applying beams from directions which are perpendicular to densest crystal planes of a plurality of different directions under a low temperature below a crystallization temperature of a previously formed amorphous or polycrystalline thin film.

According to the ninth or tenth aspect of the present invention, each of the single-crystalline films is preferably prepared from a group II–VI compound.

According to the ninth or tenth aspect of the present invention, each of the single-crystalline films is preferably prepared from a group III–V compound.

The present invention is also directed to a method of manufacturing a solar cell. According to an eleventh aspect of the present invention, a method of manufacturing a solar cell comprises a first step of forming a first conductivity type first semiconductor film and an electrode thereof on an upper surface of a substrate of a material which is different from that for the first semiconductor film, and a second step of forming a second conductivity type second semiconductor film and an electrode thereof on an upper surface of the first semiconductor film, and each of the first and second steps includes a step of supplying reaction gases under a low temperature below a crystallization temperature and simultaneously applying beams from directions which are perpendicular to densest crystal planes of a plurality of different directions thereby forming the first or second semiconductor film of a single-crystalline film.

According to a twelfth aspect of the present invention, a method of manufacturing a solar cell comprises a first step of forming a first conductivity type first semiconductor film and an electrode thereof on an upper surface of a substrate of a material which is different from that for the first semiconductor film, and a second step of forming a second conductivity type second semiconductor film and an electrode thereof on an upper surface of the first semiconductor film, and each of the first and second steps includes a step of previously forming an amorphous or polycrystalline thin film and applying beams from directions which are perpendicular to densest crystal planes of a plurality of different directions under a low temperature below a crystallization temperature thereby forming the first or second semiconductor film of a single-crystalline film.

According to a thirteenth aspect of the present invention, a method of manufacturing a solar cell at least comprises a first step of forming a first conductivity type first semiconductor film and an electrode thereof on an upper surface of a substrate of a material which is different from that for the first semiconductor film, a second step of forming a second conductivity type second semiconductor film on an upper surface of the first semiconductor film thereby forming a first heterojunction part, a third step of forming a first conductivity type third semiconductor film on an upper surface of the second semiconductor film, and a fourth step of forming a second conductivity type fourth semiconductor film and an electrode thereof on an upper surface of the third semiconductor film thereby forming a second heterojunction part, and each of the first, second, third and fourth steps comprises a step of supplying reaction gases under a low temperature below a crystalline temperature and simultaneously applying beams from directions which are perpendicular to densest crystal planes of a plurality of different directions thereby forming the first, second, third or fourth semiconductor film of a single-crystalline film.

According to a fourteenth aspect of the present invention, a method of manufacturing a solar cell at least comprises a first step of forming a first conductivity type first semiconductor film and an electrode thereof on an upper surface of a substrate of a material which is different from that for the first semiconductor film, a second step of forming a second conductivity type second semiconductor film on an upper surface of the first semiconductor film thereby forming a first heterojunction part, a third step of forming a first conductivity type third semiconductor film on an upper surface of the second semiconductor film, and a fourth step of forming a second conductivity type fourth semiconductor film and an electrode thereof on an upper surface of the third semiconductor film thereby forming a second heterojunction part, and each of the first, second, third and fourth steps comprises a step of previously forming an amorphous or polycrystalline thin film and applying beams from directions which are perpendicular to densest crystal planes of a plurality of different directions thereby forming the first, second, third or fourth semiconductor film of a single-crystalline film.

According to the thirteenth or fourteenth aspect of the present invention, the method preferably further comprises a step of forming an interlayer conductor of a metal having an ohmic junction property with respect to the heterojunction parts between the heterojunction parts in a thickness capable of transmitting light between the second and third steps.

According to the thirteenth or fourteenth aspect of the present invention, the third semiconductor film is formed to have a crystal orientation which is different from that of the second semiconductor film in the third step.

According to the ninth aspect of the present invention, the respective semiconductor films are formed by single-crystalline films, whereby it is possible to remarkably improve electron mobility upon entrance of light, thereby improving electrical properties. Further, it is possible to easily add impurities since the semiconductor films are single-crystalline.

According to the tenth aspect of the present invention, it is possible to remarkably improve electron mobility upon entrance of light thereby improving electrical properties, by employing a tandem structure for absorbing light in a wide range while forming the respective semiconductor films by single-crystalline films.

According to the tenth of the present invention, the interlayer conductor is interposed between the heterojunction parts, whereby the resistance value of the solar cell can be reduced as compared with a case of merely generating a tunnel current in an interface between heterojunction parts. Particularly according to the tenth aspect of the present invention, it is possible to remarkably reduce the resistance value by providing an ohmic junction property. According to the tenth aspect, further, the interlayer conductor is formed in a thickness capable of transmitting light, whereby light passing through one of the heterojunction parts can be introduced into the other heterojunction part as much as possible, thereby improving light absorptivity.

According to the tenth aspect of the present invention, further, the crystal orientation of the second semiconductor film which is arranged on one side of the interlayer conductor is made different from that of the third semiconductor film which is provided on another side, whereby an ohmic junction of low resistance can be obtained.

In accordance with each of the first to fourteenth aspects of the present invention, it is possible to easily form a single-crystalline film having a regulated crystal orientation in a free thickness under a low temperature even if the underlayer is not of a single-crystalline structure. In particular, the thicknesses of the semiconductor films can be reduced to degrees necessary and insufficient for a solar cell, thereby minimizing the member cost.

According to the ninth or tenth aspect of the present invention, the number of photons which can be absorbed in a semiconductor material is generally reduced as the forbidden bandwidth is increased, while the ratio of an energy component which can be extracted to the exterior from energy of the as-absorbed photons is increased in proportion to the forbidden bandwidth. Thus, it is understood that correlation is caused between conversion efficiency and the forbidden bandwidth when the number of photons which can be absorbed is multiplied by the ratio of the energy component of the photons which can be extracted to the exterior. It is known that the forbidden bandwidth of a group II–VI compound such as CdS or CdTe or a group III–V compound such as GaAs exhibits the highest conversion efficiency in such correlation. In consideration of this, a group II–VI or III–V compound is employed as a material for each semiconductor film, whereby the absorption coefficient and wavelength characteristics on absorption ends are remarkably improved.

Accordingly, an object of the present invention is to provide a solar cell and a method of manufacturing the same, which can facilitate addition of an impurity and control of an amount of introduction thereof through a low-priced substrate.

According to a fifteenth aspect of the present invention, a solar cell comprises a first conductivity type first semiconductor layer which is arranged on a photoreceiving side, a second conductivity type second semiconductor layer which is arranged on a light travelling direction side beyond the first semiconductor layer, and an intrinsic semiconductor layer of an amorphous film which is interposed between the first and second semiconductor layers, and the first semiconductor layer is formed by a single-crystalline film.

According to a sixteenth aspect of the present invention, a solar cell comprises a first conductivity type first semiconductor layer which is arranged on a photoreceiving side, a second conductivity type second semiconductor layer which is arranged on a light travelling direction side beyond the first semiconductor layer, and an intrinsic semiconductor layer of an amorphous film which is interposed between the first and second semiconductor layers, and the first semiconductor layer is formed by a polycrystalline film.

According to the fifteenth or sixteenth aspect of the present invention, the second semiconductor layer is preferably formed by a single-crystalline film.

According to the fifteenth or sixteenth aspect of the present invention, the second semiconductor layer is preferably formed by a polycrystalline film.

According to a seventeenth aspect of the present invention, a solar cell comprises a first conductivity type first semiconductor layer which is arranged on a photoreceiving side, an intrinsic semiconductor layer of an amorphous film which is arranged on a light travelling direction side beyond the first semiconductor layer, a second conductivity type second semiconductor layer which is arranged on a light travelling direction side beyond the intrinsic semiconductor layer, a first conductivity type third semiconductor layer which is arranged on a light travelling direction side of the second semiconductor layer, and another intrinsic semiconductor layer of an amorphous film which is interposed between the first and second semiconductor layers, and the second and third semiconductor layers are formed by single-crystalline films.

According to an eighteenth aspect of the present invention, a solar cell comprises a first conductivity type first semiconductor layer which is arranged on a photoreceiving side, an intrinsic semiconductor layer of an amorphous film which is arranged on a light travelling direction side beyond the first semiconductor layer, a second conductivity type second semiconductor layer which is arranged on a light travelling direction side beyond the intrinsic semiconductor layer, a first conductivity type third semiconductor layer which is arranged on a light travelling direction side of the second semiconductor layer, and another intrinsic semiconductor layer of an amorphous film which is interposed between the first and second semiconductor layers, and the second and third semiconductor layers are formed by polycrystalline films.

According to the seventeenth or eighteenth aspect of the present invention, the first semiconductor layer is preferably formed by a single-crystalline film.

According to the seventeenth or eighteenth aspect of the present invention, the first semiconductor layer is preferably formed by a polycrystalline film.

According to the fifteenth, sixteenth, seventeenth or eighteenth aspect of the present invention, the first semiconductor layer is preferably formed to be smaller in thickness than each intrinsic semiconductor layer.

According to the fifteenth, sixteenth, seventeenth or eighteenth aspect of the present invention, each single-crystalline film is preferably formed by supplying a reaction gas under a low temperature of less than a crystallization temperature and simultaneously applying beams from directions which are perpendicular to densest crystal planes of a plurality of different directions.

According to the fifteenth, sixteenth, seventeenth or eighteenth aspect of the present invention, each single-crystalline film is preferably formed by irradiating a previously formed amorphous thin film with beams from directions which are perpendicular to densest crystal planes of a plurality of different directions under a low temperature of less than a crystallization temperature.

According to the fifteenth, sixteenth, seventeenth or eighteenth aspect of the present invention, each polycrystalline film is preferably formed by supplying a reaction gas under a low temperature of less than a crystallization temperature and simultaneously applying beams from directions which are perpendicular to densest crystal planes of a plurality of different directions.

According to the fifteenth, sixteenth, seventeenth or eighteenth aspect of the present invention, each polycrystalline film is preferably formed by irradiating a previously formed amorphous thin film with beams from directions which are perpendicular to densest crystal planes of a plurality of different directions under a low temperature of less than a crystallization temperature.

The present invention is also directed to a method of manufacturing a solar cell. According to a nineteenth aspect of the present invention, a method of manufacturing a solar cell comprises a first step of forming a first conductivity type first semiconductor layer and an electrode thereof on an upper surface of a substrate consisting of a material which is different from that for the first semiconductor layer, a second step of forming an intrinsic semiconductor layer of an amorphous film on an upper surface of the first semiconductor layer, and a third step of forming a second conductivity type second semiconductor layer and an electrode thereof on an upper surface of the intrinsic semiconductor layer, and the first step includes a step of supplying a reaction gas under a low temperature of less than a crystallization temperature and simultaneously applying beams from directions which are perpendicular to densest crystal planes of a plurality of different directions for forming the first semiconductor layer of a single-crystalline film.

According to a twentieth aspect of the present invention, a method of manufacturing a solar cell comprises a first step of forming a first conductivity type first semiconductor layer and an electrode thereof on an upper surface of a substrate consisting of a material which is different from that for the first semiconductor layer, a second step of forming an intrinsic semiconductor layer of an amorphous film on an upper surface of the first semiconductor layer, and a third step of forming a second conductivity type second semiconductor layer and an electrode thereof on an upper surface of the intrinsic semiconductor layer, and the first step includes a step of previously forming an amorphous thin film and applying beams from directions which are perpendicular to densest crystal planes of a plurality of different directions under a low temperature of less than a crystallization temperature for forming the first semiconductor layer of a single-crystalline film.

According to a twenty-first aspect of the present invention, a method of manufacturing a solar cell comprises a first step of forming a first conductivity type first semiconductor layer and an electrode thereof on an upper surface of a substrate consisting of a material which is different from that for the first semiconductor layer, a second step of forming an intrinsic semiconductor layer of an amorphous film on an upper surface of the first semiconductor layer, and a third step of forming a second conductivity type second semiconductor layer and an electrode thereof on an upper surface of the intrinsic semiconductor layer, and the first step includes a step of supplying a reaction gas under a low temperature of less than a crystallization temperature and simultaneously applying beams from directions which are perpendicular to densest crystal planes of a plurality of different directions for forming the first semiconductor layer of a polycrystalline film.

According to an twenty-second aspect of the present invention, a method of manufacturing a solar cell comprises a first step of forming a first conductivity type first semiconductor layer and an electrode thereof on an upper surface of a substrate consisting of a material which different from that for the first semiconductor layer, a second step of forming an intrinsic semiconductor layer of an amorphous film on an upper surface of the first semiconductor layer, and a third step of forming a second conductivity type second semiconductor layer and an electrode thereof on an upper surface of the intrinsic semiconductor layer, and the first step includes a step of previously forming an amorphous thin film and applying beams from directions which are perpendicular to densest crystal planes of a plurality of different directions under a low temperature of less than a crystallization temperature for forming the first semiconductor layer of a polycrystalline film.

According to the nineteenth, twentieth, twenty-first or twenty-second aspect of the present invention, the third step preferably includes a step of supplying a reaction gas under a low temperature of less than a crystallization temperature and simultaneously applying beams from directions which are perpendicular to densest crystal planes of a plurality of different directions for forming the second semiconductor layer of a single-crystalline film.

According to the nineteenth, twentieth, twenty-first or twenty-second aspect of the present invention, the third step preferably includes a step of previously forming an amorphous thin film and applying beams from directions which are perpendicular to densest crystal planes of a plurality of different directions under a low temperature of less than a crystallization temperature for forming the second semiconductor layer of a single-crystalline film.

According to the nineteenth, twentieth, twenty-first or twenty-second aspect of the present invention, the third step preferably includes a step of supplying a reaction gas under a low temperature of less than a crystallization temperature and simultaneously applying a beam from one direction which is perpendicular to a densest crystal plane for forming the second semiconductor layer of a polycrystalline film.

According to the nineteenth, twentieth, twenty-first or twenty-second aspect of the present invention, the third step preferably includes a step of previously forming an amorphous thin film and applying a beam from one direction which is perpendicular to a densest crystal plane under a low temperature of less than a crystallization temperature for forming the second semiconductor layer of a polycrystalline film.

According to a twenty-third aspect of the present invention, a method of manufacturing a solar cell comprises a first step of forming a first conductivity type first semiconductor layer on an upper surface of a substrate consisting of a material which is different from that for the first semiconductor layer, a second step of forming an intrinsic semiconductor layer of an amorphous film on an upper surface of the first semiconductor layer, and a third step of forming a second conductivity type second semiconductor layer and an electrode thereof on an upper surface of the intrinsic semiconductor layer, and the third step includes a step of supplying a reaction gas under a low temperature of less than a crystallization temperature and simultaneously applying beams from directions which are perpendicular to densest crystal planes of a plurality of different directions for forming the second semiconductor layer of a single-crystalline film.

According to a twenty-fourth aspect of the present invention, a method of manufacturing a solar cell comprises a first step of forming a first conductivity type first semiconductor layer on an upper surface of a substrate consisting of a material which is different from that for the first semiconductor layer, a second step of forming an intrinsic semiconductor layer of an amorphous film on an upper surface of the first semiconductor layer, and a third step of forming a second conductivity type second semiconductor layer and an electrode thereof on an upper surface of the intrinsic semiconductor layer, and the third step includes a step of previously forming an amorphous thin film and applying beams from directions which are perpendicular to densest crystal planes of a plurality of different directions under a low temperature of less than a crystallization temperature for forming the second semiconductor layer of a single-crystalline film.

According to an twenty-fifth aspect of the present invention, a method of manufacturing a solar cell comprises a first step of forming a first conductivity type first semiconductor layer on an upper surface of a substrate consisting of a material which is different from that for the first semiconductor layer, a second step of forming an intrinsic semiconductor layer of an amorphous film on an upper surface of the first semiconductor layer, and a third step of forming a second conductivity type second semiconductor layer and an electrode thereof on an upper surface of the intrinsic semiconductor layer, and the third step includes a step of supplying a reaction gas under a low temperature of less than a crystallization temperature and simultaneously applying a beam from one direction which is perpendicular to a densest crystal plane for forming the second semiconductor layer of a polycrystalline film.

According to a twenty-sixth aspect of the present invention, a method of manufacturing a solar cell comprises a first step of forming a first conductivity type first semiconductor layer on an upper surface of a substrate consisting of a material which is different from that for the first semiconductor layer, a second step of forming an intrinsic semiconductor layer of an amorphous film on an upper surface of the first semiconductor layer, and a third step of forming a second conductivity type second semiconductor layer and an electrode thereof on an upper surface of the intrinsic semiconductor layer, and the third step includes a step of previously forming an amorphous thin film and applying a beam from one direction which is perpendicular to a densest crystal plane under a low temperature of less than a crystallization temperature for forming the second semiconductor layer of a polycrystalline film.

According to a twenty-seventh aspect of the present invention, a method of manufacturing a solar cell comprises a first step of forming a first conductivity type first semiconductor layer and an electrode thereof on an upper surface of a substrate consisting of a material which is different from that for the first semiconductor layer, a second step of forming an intrinsic semiconductor layer of an amorphous film on an upper surface of the first semiconductor layer, a third step of forming a second semiconductor layer of a second conductivity type single-crystalline film on an upper surface of the intrinsic semiconductor layer, and a fourth step of forming a third semiconductor layer of a first conductivity type single-crystalline film and an electrode thereof on an upper surface of the second semiconductor layer, and the third step includes a step of supplying a reaction gas under a low temperature of less than a crystallization temperature and simultaneously applying beams from directions which are perpendicular to densest crystal planes of a plurality of different directions for carrying out single crystallization and forming the semiconductor layer.

According to a twenty-eighth aspect of the present invention, a method of manufacturing a solar cell comprises a first step of forming a first conductivity type first semiconductor layer and an electrode thereof on an upper surface of a substrate consisting of a material which is different from that for the first semiconductor layer, a second step of forming an intrinsic semiconductor layer of an amorphous film on an upper surface of the first semiconductor layer, a third step of forming a second semiconductor layer of a second conductivity type single-crystalline film on an upper surface of the intrinsic semiconductor layer, and a fourth step of forming a third semiconductor layer of a first conductivity type single-crystalline film and an electrode thereof on an upper surface of the second semiconductor layer, and the third step includes a step of previously forming an amorphous thin film and applying beams from directions which are perpendicular to densest crystal planes of a plurality of different directions under a low temperature of less than a crystallization temperature for single-crystallizing the thin film and forming the second semiconductor layer.

According to the twenty-seventh or twenty-eighth aspect of the present invention, the fourth step preferably includes a step of supplying a reaction gas under a low temperature of less than a crystallization temperature and simultaneously applying beams from directions which are perpendicular to densest crystal planes of a plurality of different directions for carrying out single crystallization and forming the third semiconductor layer.

According to the twenty-seventh or twenty-eighth aspect of the present invention, the fourth step preferably includes a step of previously forming an amorphous thin film and applying beams from directions which are perpendicular to densest crystal planes of a plurality of different directions under a low temperature of less than a crystallization temperature for single-crystallizing the thin film and forming the third semiconductor layer.

According to a twenty-ninth aspect of the present invention, a method of manufacturing a solar cell comprises a first step of forming a first conductivity type first semiconductor layer and an electrode thereof on an upper surface of a substrate consisting of a material which is different from that for the first semiconductor layer, a second step of forming an intrinsic semiconductor layer of an amorphous film on an upper surface of the first semiconductor layer, a third step of forming a second semiconductor layer of a second conductivity type polycrystalline film on an upper surface of the intrinsic semiconductor layer, and a fourth step of forming a third semiconductor layer of a first conductivity type polycrystalline film and an electrode thereof on an upper surface of the second semiconductor layer, and the third step includes a step of supplying a reaction gas under a low temperature of less than a crystallization temperature and simultaneously applying a beam from one direction which is perpendicular to a densest crystal plane for carrying out polycrystallization and forming the second semiconductor layer.

According to a thirtieth aspect of the present invention, a method of manufacturing a solar cell comprises a first step of forming a first conductivity type first semiconductor layer and an electrode thereof on an upper surface of a substrate consisting of a material which is different from that for the first semiconductor layer, a second step of forming an intrinsic semiconductor layer of an amorphous film on an upper surface of the first semiconductor layer, a third step of forming a second semiconductor layer of a second conductivity type polycrystalline film on an upper surface of the intrinsic semiconductor layer, and a fourth step of forming a third semiconductor layer of a first conductivity type polycrystalline film and an electrode thereof on an upper surface of the second semiconductor layer, and the third step includes a step of previously forming an amorphous thin film and applying a beam from one direction which is perpendicular to a densest crystal plane under a low temperature of less than a crystallization temperature for polycrystallizing the thin film and forming the second semiconductor layer.

According to the twenty-ninth or thirtieth aspect of the present invention, the fourth step preferably includes a step of supplying a reaction gas under a low temperature of less than a crystallization temperature and simultaneously applying a beam from one direction which is perpendicular to a densest crystal plane for carrying out polycrystallization and forming the third semiconductor layer.

According to the twenty-ninth or thirtieth aspect of the present invention, the fourth step preferably includes a step of previously forming an amorphous thin film and applying a beam from one direction which is perpendicular to a densest crystal plane under a low temperature of less than a crystallization temperature for polycrystallizing the thin film and forming the third semiconductor layer.

According to the twenty-seventh, twenty-eighty, twenty-ninth or thirtieth aspect of the present invention, the first step preferably includes a step of supplying a reaction gas under a low temperature of less than a crystallization temperature and simultaneously applying beams from directions which are perpendicular to densest crystal planes of a plurality of different directions for carrying out single crystallization and forming the first semiconductor layer.

According to the twenty-seventh, twenty-eighth or twenty-ninth or thirtieth aspect of the present invention, the first step preferably includes a step of previously forming an amorphous thin film and applying beams from directions which are perpendicular to densest crystal planes of a plurality of different directions under a low temperature of less than a crystallization temperature for single-crystallizing the thin film and forming the first semiconductor layer.

According to the twenty-seventh, twenty-eighth, twenty-ninth or thirtieth aspect of the present invention, the first step preferably includes a step of supplying a reaction gas under a low temperature of less than a crystallization temperature and simultaneously applying a beam from one direction which is perpendicular to a densest crystal plane for carrying out polycrystallization and forming the first semiconductor layer.

According to the twenty-seventh, twenty-eighth, twenty-ninth or thirtieth aspect of the present invention, the first step preferably includes a step of previously forming an amorphous thin film and applying a beam from one direction which is perpendicular to a densest crystal plane under a low temperature of less than a crystallization temperature for polycrystallizing the thin film and forming the first semiconductor layer.

According to a thirty-first aspect of the present invention, a method of manufacturing a solar cell comprises a first step of forming a third semiconductor layer of a first conductivity type single-crystalline film on an upper surface of a back substrate consisting of a material which is different from that for the third semiconductor layer, a second step of forming a second semiconductor layer of a second conductivity type single-crystalline film on an upper surface of the third semiconductor layer, a third step of forming an intrinsic semiconductor layer of an amorphous film on an upper side of the second semiconductor layer, and a fourth step of forming a first conductivity type first semiconductor layer and an electrode thereof on an upper surface of the intrinsic semiconductor layer, and the first step includes a step of supplying a reaction gas under a low temperature of less than a crystallization temperature and simultaneously applying beams from directions which are perpendicular to densest crystal planes of a plurality of different directions for carrying out single crystallization and forming the third semiconductor layer.

According to an twenty-second aspect of the present invention, a method of manufacturing a solar cell comprises a first step of forming a third semiconductor layer of a first conductivity type single-crystalline film on an upper surface of a back substrate consisting of a material which is different from that for the third semiconductor layer, a second step of forming a second semiconductor layer of a second conductivity type single-crystalline film on an upper surface of the third semiconductor layer, a third step of forming an intrinsic semiconductor layer of an amorphous film on an upper side of the second semiconductor layer, and a fourth step of forming a first conductivity type first semiconductor layer and an electrode thereof on an upper surface of the intrinsic semiconductor layer, and the first step includes a step of previously forming an amorphous thin film and applying beams from directions which are perpendicular to densest crystal planes of a plurality of different directions under a low temperature of less than a crystallization temperature for single-crystallizing the thin film and forming the third semiconductor layer.

According to the thirty-first or thirty-second aspect of the present invention, the second step preferably includes a step of supplying a reaction gas under a low temperature of less than a crystallization temperature and simultaneously applying beams from directions which are perpendicular to densest crystal planes of a plurality of different directions for carrying out single crystallization and forming the second semiconductor layer.

According to the thirty-first or thirty-second aspect of the present invention, the second step preferably includes a step of previously forming an amorphous thin film and applying beams from directions which are perpendicular to densest crystal planes of a plurality of different directions under a low temperature of less than a crystallization temperature for single-crystallizing the thin film and forming the second semiconductor layer.

According to a thirty-third aspect of the present invention, a method of manufacturing a solar cell comprises a first step of forming a third semiconductor layer of a first conductivity type polycrystalline film on an upper surface of a back substrate consisting of a material which is different from that for the third semiconductor layer, a second step of forming a second semiconductor layer of a second conductivity type polycrystalline film on an upper surface of the third semiconductor layer, a third step of forming an intrinsic semiconductor layer of an amorphous film on an upper side of the second semiconductor layer, and a fourth step of forming a first conductivity type first semiconductor layer and an electrode thereof on an upper surface of the intrinsic semiconductor layer, and the first step includes a step of supplying a reaction gas under a low temperature of less than a crystallization temperature and simultaneously applying a beam from one direction which is perpendicular to a densest crystal plane for carrying out polycrystallization and forming the third semiconductor layer.

According to a thirty-fourth aspect of the present invention, a method of manufacturing a solar cell comprises a first step of forming a third semiconductor layer of a first conductivity type polycrystalline film on an upper surface of a back substrate consisting of a material which is different from that for the third semiconductor layer, a second step of forming a second semiconductor layer of a second conductivity type polycrystalline film on an upper surface of the third semiconductor layer, a third step of forming an intrinsic semiconductor layer of an amorphous film on an upper side of the second semiconductor layer, and a fourth step of forming a first conductivity type first semiconductor layer and an electrode thereof on an upper surface of the intrinsic semiconductor layer, and the first step includes a step of previously forming an amorphous thin film and applying a beam from one direction which is perpendicular to a densest crystal plane under a low temperature of less than a crystallization temperature for polycrystallizing the thin film and forming the third semiconductor layer.

According to the thirty-third or thirty-fourth aspect of the present invention, the second step preferably includes a step of supplying a reaction gas under a low temperature of less than a crystallization temperature and simultaneously applying a beam from one direction which is perpendicular to a densest crystal plane for carrying out polycrystallization and forming the second semiconductor layer.

According to the thirty-third or thirty-fourth aspect of the present invention, the second step preferably includes a step of previously forming an amorphous thin film and applying a beam from one direction which is perpendicular to a densest crystal plane under a low temperature of less than a crystallization temperature for polycrystallizing the thin film and forming the second semiconductor layer.

According to the thirty-first, thirty-second, thirty-third or thirty-fourth aspect of the present invention, the fourth step preferably includes a step of supplying a reaction gas under a low temperature of less than a crystallization temperature and simultaneously applying beams from directions which are perpendicular to densest crystal planes of a plurality of different directions for carrying out single crystallization and forming the first semiconductor layer.

According to the thirty-first, thirty-second, thirty-third or thirty-fourth aspect of the present invention, the fourth step preferably includes a step of previously forming an amorphous thin film and applying beams from directions which are perpendicular to densest crystal planes of a plurality of different directions under a low temperature of less than a crystallization temperature for single-crystallizing the thin film and forming the first semiconductor layer.

According to the thirty-first, thirty-second, thirty-third or thirty-fourth aspect of the present invention, the fourth step preferably includes a step of supplying a reaction gas under a low temperature of less than a crystallization temperature and simultaneously applying a beam from one direction which is perpendicular to a densest crystal plane for carrying out polycrystallization and forming the first semiconductor layer.

According to the thirty-first, thirty-second, thirty-third or thirty-fourth aspect of the present invention, the fourth step preferably includes a step of previously forming an amorphous thin film and applying a beam from one direction which is perpendicular to a densest crystal plane under a low temperature of less than a crystallization temperature for polycrystallizing the thin film and forming the first semiconductor layer.

According to any of the fifteenth to twenty-second and twenty-seventh to thirty-fourth aspects of the present invention, the first semiconductor layer provided on the photoreceiving side of the solar cell having a p-i-n structure is formed by a single-crystalline or polycrystalline film and the intrinsic semiconductor layer provided on the light travelling direction side is formed by an amorphous film, whereby long-wave light can be mainly absorbed by the first semiconductor layer provided on the photoreceiving side and short-wave light can be mainly absorbed by the intrinsic semiconductor layer. Thus, it is possible to efficiently absorb light of a wider wavelength region as compared with the prior art provided with both layers of amorphous films.

According to any of the fifteenth, seventeenth, nineteenth, twentieth and twenty-seventh to thirty-fourth aspects of the present invention, in particular, it is possible to extremely reduce defect density as well as the rate of annihilation of minority carriers resulting from recombination by preparing the surface layer from a single-crystalline film, thereby effectively extracting the minority carriers.

Further, it is possible to prevent the respective semiconductor layers from deterioration caused by time change, by crystallizing the semiconductor layers in the aforementioned manner.

Long-wave light which cannot be absorbed by the first semiconductor layer of a single-crystalline or polycrystalline film but passes through the same can be further absorbed by the second semiconductor layer according to any of the fifteenth, sixteenth and nineteenth to twenty-second aspects of the present invention, or by the second and third semiconductor layers according to any of the seventeenth, eighteenth and twenty-seventh to thirty-fourth aspects of the present invention, whereby absorption properties for a longer wavelength side can be improved. According to any of the seventeenth, eighteenth and twenty-seventh to thirty-fourth aspects of the present invention, in particular, it is possible to attain absorption properties for light of a wider wavelength region due to the employment of a tandem structure.

According to any of the fifteenth to eighteenth aspects of the present invention, the semiconductor layer provided on the photoreceiving side is so reduced in thickness that part of light as received, i.e., part of mainly long-wave light, is absorbed and thereafter the light can pass through the intrinsic semiconductor layer as much as possible, thereby improving absorption efficiency for light of a shorter wavelength region in the intrinsic semiconductor layer. Further, the intrinsic semiconductor layer formed by an amorphous layer originally has an excellent absorption coefficient which is not damaged even if this layer is reduced in thickness, whereby the overall solar cell can be easily reduced in thickness.

According to any of the fifteenth to thirty-fourth aspects of the present invention, crystallization can be carried out under low temperature environment and hence no heat resistance is required for the underlayer, whereby crystalline films can be formed on a low-priced substrate of glass or the like, for example. Further, the thickness of each semiconductor layer of a single-crystalline or polycrystalline film can be freely set absolutely similarly to formation of an amorphous film, whereby the thickness of this semiconductor layer can be extremely reduced as compared with the prior art which grows/forms each semiconductor film from a wafer of a single-crystalline or polycrystalline film. Thus, it is possible to minimize the thickness of the semiconductor layer within a range of sufficient light absorptivity for serving as a crystalline film, thereby reducing the overall solar cell in thickness. Thus, it is possible to extremely reduce the member cost while improving the characteristics by each crystallized semiconductor layer.

Accordingly, an object of the present invention is to obtain a solar cell having high conversion efficiency and small deterioration at a low cost.

According to a thirty-fifth aspect of the present invention, a semiconductor device which is a memory device capable of volatile or nonvolatile storage comprises a semiconductor substrate, a transistor part which is formed on a surface of the semiconductor substrate and provided with an internal wire on its upper surface portion, a dielectric film which is formed on an upper surface of the internal wire of the transistor part, and an upper electrode which is formed on an upper surface of the dielectric film, and the dielectric film is formed by a single-crystalline film.

According to a thirty-sixth aspect of the present invention, a semiconductor device which is a memory device capable of nonvolatile storage comprises a first conductivity type semiconductor substrate, second conductivity type first and second diffusion regions which are selectively formed on a surface of the semiconductor substrate, a first insulating film which is formed on a portion of the semiconductor substrate located between the first and second diffusion regions, a floating gate which is formed on the first insulating film, a second insulating film which is formed on the floating gate, and a control gate which is formed on the second insulating film, and the floating gate is formed by a single-crystalline film.

According to a thirty-seventh aspect of the present invention, a semiconductor device which is a memory device capable of nonvolatile storage comprises a first conductivity type semiconductor substrate, second conductivity type first and second diffusion regions which are selectively formed on a surface of the semiconductor substrate, a first insulating film which is formed on a portion of the semiconductor substrate located between the first and second diffusion regions, a floating gate which is formed on the first insulating film, a second insulating film which is formed on the floating gate, and a control gate which is formed on the second insulating film, and the second insulating film is formed by a single-crystalline film.

According to the thirty-fifth, thirty-sixth or thirty-seventh aspect of the present invention, the single-crystalline film is preferably formed by supplying a reaction gas under a low temperature below a crystallization temperature and simultaneously applying beams from directions which are perpendicular to densest crystal planes of a plurality of different directions.

According to the thirty-fifth, thirty-sixth or thirty-seventh aspect of the present invention, the single-crystalline film is preferably formed by applying beams from directions which are perpendicular to densest crystal planes of a plurality of different directions under a low temperature below a crystallization temperature of a previously formed amorphous or polycrystalline thin film.

According to a thirty-eighth aspect of the present invention, a semiconductor device which is a nonvolatile electrically writable/erasable memory device comprises a first substrate, a plurality of second substrates which are arranged in parallel above the first substrate, first and second diffusion regions which are selectively formed on upper layer portions of the second substrates, an active region which is formed between the first and second diffusion regions, a gate insulating film which is formed at least on an upper surface of the active region, and a gate electrode which is formed on an upper surface of the gate insulating film, and the gate insulating film is formed by a single-crystalline film consisting of a ferroelectric substance.

According to a thirty-ninth aspect of the present invention, a semiconductor device which is a nonvolatile electrically writable/erasable memory device comprises a first substrate, a plurality of second substrates which are arranged in parallel above the first substrate, first and second diffusion regions which are selectively formed on upper layer portions of the second substrates, an active region which is formed between the first and second diffusion regions, a gate insulating film which is formed at least on an upper surface of the active region, and a gate electrode which is formed on an upper surface of the gate insulating film, and the gate insulating film consists of a ferroelectric substance, while the first and second diffusion regions and the active region are formed by single-crystalline films.

According to the thirty-eighth or thirty-ninth aspect of the present invention, substrate electrodes are preferably formed on the second substrates, and the substrate electrodes are formed by single-crystalline films.

According to the thirty-eighth or thirty-ninth aspect of the present invention, clearances are preferably defined between the plurality of second substrates, insulating films are preferably formed in the clearances, and each single-crystalline film is preferably formed by applying beams from directions which are perpendicular to densest crystal planes of a plurality of different directions under a low temperature below a crystallization temperature of a previously formed amorphous or polycrystalline thin film.

According to the thirty-eighth or thirty-ninth aspect of the present invention, clearances are preferably defined between the plurality of second substrates, insulating films are preferably formed in the clearances, and each single-crystalline film is preferably formed by supplying a reaction gas under a low temperature below a crystallization temperature and simultaneously applying beams from directions which are perpendicular to densest crystal planes of a plurality of different directions.

According to a fortieth aspect of the present invention, a semiconductor device which is a nonvolatile electrically writable/erasable memory device comprising a plurality of memory cells comprises a semiconductor substrate, diffusion and active regions which are alternately formed above the semiconductor substrate, a gate insulating film which is formed at least on upper surfaces of the respective active regions, and a gate electrode which is formed on an upper surface of the gate insulating film, and the gate insulating film is formed by a single-crystalline film consisting of a ferroelectric substance.

According to a forty-first aspect of the present invention, a semiconductor device which is a nonvolatile electrically writable/erasable memory device comprising a plurality of memory cells comprises a semiconductor substrate, diffusion and active regions which are alternately formed above the semiconductor substrate, a gate insulating film which is formed at least on upper surfaces of the respective active regions, and a gate electrode which is formed on an upper surface of the gate insulating film, and the diffusion and active regions are formed by single-crystalline films.

According to any of the thirty-eighth to forty-first aspects of the present invention, each single-crystalline film is preferably formed by applying beams from directions which are perpendicular to densest crystal planes of a plurality of different directions under a low temperature below a crystallization temperature of a previously formed amorphous or polycrystalline thin film.

According to any of the thirty-eighth to forty-first aspects of the present invention, each single-crystalline film is preferably formed by supplying a reaction gas under a low temperature below a crystallization temperature and simultaneously applying beams from directions which are perpendicular to densest crystal planes of a plurality of different directions.

The present invention is also directed to a method of fabricating a semiconductor device. According to an forty-second aspect of the present invention, a method of fabricating a semiconductor device which is a memory device capable of volatile or nonvolatile storage comprises a step of forming a transistor part having an internal wire on its upper surface portion on a surface of a semiconductor substrate, a step of forming a dielectric film on an upper surface of the internal wire of the transistor part, and a step of forming an upper electrode on an upper surface of the dielectric film, and the step of forming the dielectric film includes a step of supplying a reaction gas under a low temperature below a crystallization temperature and simultaneously applying beams from directions which are perpendicular to densest crystal planes of a plurality of different directions thereby forming the dielectric film consisting of a single-crystalline film.

According to a forty-third aspect of the present invention, a method of fabricating a semiconductor device which is a memory device capable of volatile or nonvolatile storage comprises a step of forming a transistor part having an internal wire on its upper surface portion on a surface of a semiconductor substrate, a step of forming a dielectric film on an upper surface of the internal wire of the transistor part, and a step of forming an upper electrode on an upper surface of the dielectric film, and the step of forming the dielectric film includes a step of previously forming an amorphous or polycrystalline thin film and applying beams from directions which are perpendicular to densest crystal planes of a plurality of different directions under a low temperature below a crystallization temperature thereby forming the dielectric film consisting of a single-crystalline film.

According to a forty-fourth aspect of the present invention, a method of fabricating a semiconductor device which is a memory device capable of nonvolatile storage comprises a step of selectively forming first and second diffusion regions on a surface of a semiconductor substrate, a step of forming a first insulating film on a portion of the semiconductor substrate located between the first and second diffusion regions, a step of forming a floating gate on the first insulating film, a step of forming a second insulating film on the floating gate, and a step of forming a control gate on the second insulating film, and the step of forming the floating gate includes a step of supplying a reaction gas under a low temperature below a crystallization temperature and simultaneously applying beams from directions which are perpendicular to densest crystal planes of a plurality of different directions thereby forming the floating gate consisting of a single-crystalline film.

According to an forty-fifth aspect of the present invention, a method of fabricating a semiconductor device which is a memory device capable of nonvolatile storage comprises a step of selectively forming first and second diffusion regions on a surface of a semiconductor substrate, a step of forming a first insulating film on a portion of the semiconductor substrate located between the first and second diffusion regions, a step of forming a floating gate on the first insulating film, a step of forming a second insulating film on the floating gate, and a step of forming a control gate on the second insulating film, and the step of forming the floating gate includes a step of previously forming an amorphous or polycrystalline film and applying beams from directions which are perpendicular to densest crystal planes of a plurality of different directions under a low temperature below a crystallization temperature thereby forming the floating gate consisting of a single-crystalline film.

According to a forty-sixth aspect of the present invention, a method of fabricating a semiconductor device which is a memory device capable of nonvolatile storage comprises a step of selectively forming first and second diffusion regions on a surface of a semiconductor substrate, a step of forming a first insulating film on a portion of the semiconductor substrate located between the first and second diffusion regions, a step of forming a floating gate on the first insulating film, a step of forming a second insulating film on the floating gate, and a step of forming a control gate on the second insulating film, and the step of forming the second insulating film includes a step of supplying a reaction gas under a low temperature below a crystallization temperature and simultaneously applying beams from directions which are perpendicular to densest crystal planes of a plurality of different directions thereby forming the second insulating film consisting of a single-crystalline film.

According to a forty-seventh aspect of the present invention, a method of fabricating a semiconductor device which is a memory device capable of nonvolatile storage comprises a step of selectively forming first and second diffusion regions on a surface of a semiconductor substrate, a step of forming a first insulating film on a portion of the semiconductor substrate located between the first and second diffusion regions, a step of forming a floating gate on the first insulating film, a step of forming a second insulating film on the floating gate, and a step of forming a control gate on the second insulating film, and the step of forming the second insulating film includes a step of previously forming an amorphous or polycrystalline film and applying beams from directions which are perpendicular to densest crystal planes of a plurality of different directions under a low temperature below a crystallization temperature thereby forming the second insulating film consisting of a single-crystalline film.

According to a forty-eighth aspect of the present invention, a method of fabricating a semiconductor device which is a nonvolatile electrically writable/erasable memory device comprises a step of forming a plurality of second substrates, which are separated from each other through insulating films, in parallel above a first substrate, a step of forming first and second diffusion regions, which are separated from each other through active regions, on upper layer portions of the second substrates, a step of forming a gate insulating film over upper surfaces of a plurality of active regions, the first and second diffusion regions and the insulating films, and a step of forming a gate electrode on the gate insulating film, and the step of forming the gate insulating film includes a step of previously forming an amorphous or polycrystalline film and applying beams from directions which are perpendicular to densest crystal planes of a plurality of different directions of the amorphous or polycrystalline thin film under a low temperature below a crystallization temperature thereby forming the gate insulating film consisting of a single-crystalline film.

According to a forty-ninth aspect of the present invention, a method of fabricating a semiconductor device which is a nonvolatile electrically writable/erasable memory device comprises a step of forming a plurality of second substrates, which are separated from each other through insulating films, in parallel above a first substrate, a step of forming first and second diffusion regions, which are separated from each other through active regions, on upper layer portions of the second substrates, a step of forming a gate insulating film over upper surfaces of a plurality of active regions, the first and second diffusion regions and the insulating films, and a step of forming a gate electrode on the gate insulating film, and the step of forming the gate insulating film includes a step of supplying a reaction gas under a low temperature below a crystallization temperature and simultaneously applying beams from directions which are perpendicular to densest crystal planes of a plurality of different directions thereby forming the gate insulating film consisting of a single-crystalline film.

According to a fiftieth aspect of the present invention, a method of fabricating a semiconductor device which is a nonvolatile electrically writable/erasable memory device comprises a step of forming a plurality of second substrates, which are separated from each other through insulating films, in parallel above a first substrate, a step of forming first and second diffusion regions, which are separated from each other through active regions, on upper layer portions of the second substrates, a step of forming a gate insulating film over upper surfaces of a plurality of active regions, the first and second diffusion regions and the insulating films, and a step of forming a gate electrode on the gate insulating film, and the step of forming the first and second diffusion regions includes a step of previously forming amorphous or polycrystalline films and applying beams from directions which are perpendicular to densest crystal planes of plural different directions of the amorphous or polycrystalline films under a low temperature below a crystallization temperature thereby forming the active regions and the first and second diffusion regions consisting of single-crystalline films.

According to a fifty-first aspect of the present invention, a method of fabricating a semiconductor device which is a nonvolatile electrically writable/erasable memory device comprises a step of forming a plurality of second substrates, which are separated from each other through insulating films, in parallel above a first substrate, a step of forming first and second diffusion regions, which are separated from each other through active regions, on upper layer portions of the second substrates, a step of forming a gate insulating film over upper surfaces of a plurality of active regions, the first and second diffusion regions and the insulating films, and a step of forming a gate electrode on the gate insulating film, and the step of forming the first and second diffusion regions includes a step of supplying a reaction gas under a low temperature below a crystallization temperature and simultaneously applying beams from directions which are perpendicular to densest crystal planes of a plurality of different directions thereby forming the active regions and the first and second diffusion regions consisting of single-crystalline films.

According to the fiftieth or fifty-first aspect of the present invention, the step of forming the active regions and the first and second diffusion regions consisting of single-crystalline films preferably includes a step of forming substrate electrodes which are in contact with the second substrates, and the substrate electrodes are preferably single-crystallized simultaneously with single crystallization of the active regions and the first and second diffusion regions in the step of forming the substrate electrodes.

According to an fifty-second aspect of the present invention, a method of fabricating a semiconductor device which is a nonvolatile electrically writable/erasable memory device comprising a plurality of memory cells comprises a step of alternately forming a plurality of diffusion and active regions above a semiconductor substrate, a step of forming a gate insulating film over upper surfaces of the plurality of diffusion and active regions, and a step of forming a gate electrode on an upper surface of the gate insulating film, and the step of forming the gate insulating film includes a step of previously forming an amorphous or polycrystalline film and applying beams from directions which are perpendicular to densest crystal planes of a plurality of different directions of the amorphous or polycrystalline thin film under a low temperature below a crystallization temperature thereby forming the gate insulating film consisting of a single-crystalline film.

According to a fifty-third aspect of the present invention, a method of fabricating a semiconductor device which is a nonvolatile electrically writable/erasable memory device comprising a plurality of memory cells comprises a step of alternately forming a plurality of diffusion and active regions above a semiconductor substrate, a step of forming a gate insulating film over upper surfaces of the plurality of diffusion and active regions, and a step of forming a gate electrode on an upper surface of the gate insulating film, and the step of forming the gate insulating film includes a step of supplying a reaction gas under a low temperature below a crystallization temperature and simultaneously applying beams from directions which are perpendicular to densest crystal planes of a plurality of different directions thereby forming the gate insulating film consisting of a single-crystalline film.

According to a fifty-fourth aspect of the present invention, a method of fabricating a semiconductor device which is a nonvolatile electrically writable/erasable memory device comprising a plurality of memory cells comprises a step of alternately forming a plurality of diffusion and active regions above a semiconductor substrate, a step of forming a gate insulating film over upper surfaces of the plurality of diffusion and active regions, and a step of forming a gate electrode on an upper surface of the gate insulating film, and the step of alternately forming the diffusion and active regions includes a step of previously forming amorphous or polycrystalline films and applying beams from directions which are perpendicular to densest crystal planes of plural of different directions of the amorphous or polycrystalline films under a low temperature below a crystallization temperature thereby forming the diffusion and active regions consisting of single-crystalline films.

According to a fifty-fifth aspect of the present invention, a method of fabricating a semiconductor device which is a nonvolatile electrically writable/erasable memory device comprising a plurality of memory cells comprises a step of alternately forming a plurality of diffusion and active regions above a semiconductor substrate, a step of forming a gate insulating film over upper surfaces of the plurality of diffusion and active regions, and a step of forming a gate electrode on an upper surface of the gate insulating film, and the step of alternately forming the diffusion and active regions includes a step of supplying a reaction gas under a low temperature below a crystallization temperature and simultaneously applying beams from directions which are perpendicular to densest crystal planes of a plurality of different directions thereby forming the diffusion and active regions consisting of single-crystalline films.

According to the thirty-fifth, forty-second or forty-third aspect of the present invention, the dielectric film is formed by a single-crystalline film, whereby polarization field characteristics with respect to an external electric field are remarkably improved. Further, it is possible to maintain stability of the characteristics while attaining reduction in thickness.

According to the thirty-sixth, forty-fourth or forty-fifth aspect of the present invention, the floating gate is formed by a single-crystalline film, whereby a dense film having excellent crystallinity can be formed in formation of the second insulating film on the floating gate. Further, it is possible to prevent irregularization of the film surface by single-crystallizing the floating gate, thereby preventing reduction in withstand voltage of the interlayer film. Further, it is possible to improve electric properties of the memory device while attaining reduction in thickness.

According to the thirty-seventh, forty-sixth or forty-seventh aspect of the present invention, the second insulating film which is provided between the floating gate and the control gate is formed by a single-crystalline film of a high dielectric substance, whereby a large read current can be attained and data can be written in high efficiency even if an overlap area between the floating gate and the control gate is equalized to that of the channel region.

According to any of the thirty-fifth to forty-seventh aspects of the present invention, it is possible to easily form a single-crystalline film having a regulated crystal orientation with a freely set thickness on an upper surface of an underlayer, even if the underlayer has no single-crystalline structure.

According to the thirty-eighth, fortieth, forty-eighth, fifty-second or fifty-third aspect of the present invention, the gate insulating film of a ferroelectric substance is formed by a single-crystalline film, whereby polarization field characteristics with respect to an external electric field are remarkably improved in data rewriting or the like. Further, it is possible to maintain stability of the characteristics while attaining reduction in thickness. In addition, it is possible to minimize film fatigue of the gate insulating film since the crystalline structure is dense with a small amount of defects.

According to the thirty-ninth, forty-first, fiftieth, fifty-first, fifty-fourth or fifty-fifth aspect of the present invention, the active regions and the like are formed by single-crystalline films, whereby electron mobility is improved in the active regions to attain low resistance, thereby increasing the speed in write processing or the like. Further, it is possible to prevent occurrence of a leakage current in a gate-off state, due to a small amount of crystal defects in the diffusion and active regions. Thus, it is possible to increase a drain current ratio between gate-on and gate-off states, thereby remarkably improving electric properties of the semiconductor device.

According to the thirty-eight or thirty-ninth aspect of the present invention, it is possible to prevent deterioration with age by increasing denseness of crystals in the substrate electrode.

According to any of the thirty-eighth to fifty-fifth aspects of the present invention, no single-crystalline layer is required as an underlayer for serving as a seed crystal when the gate insulating film is formed by a single-crystalline film as in the thirty-eighth aspect or the diffusion and active regions are formed by single-crystalline films as in the thirty-ninth aspect, whereby it is possible to easily form a single-crystalline film having a regulated crystal orientation on any underlayer with a freely set thickness under a low temperature. After a plurality of second substrates which are isolated from each other through clearances and insulating films are grown/formed on the upper surface of the first substrate particularly as in the thirty-eighth or thirty-ninth aspect, it is possible to easily form single-crystalline films on upper layer portions or upper surfaces of the second substrates. Thus, it is possible to minimize clearances between the adjacent ones of the second substrates, thereby improving the degree of integration of the cell array.

Accordingly, an object of the present invention is to provide a semiconductor device which can increase remanence and maintain a high dielectric constant while maintaining a small cell size, and which can prevent a leakage current and improve durability, and a method of fabricating the same.

Another object of the present invention is to provide a semiconductor device which can read, write or erase data at a high speed without changing film thickness and cell size, and a method of fabricating the same.

Still another object of the present invention is to provide a semiconductor device which can attain improvement in crystallinity and densification of quality of respective layers and ensure withstands voltage by flattening film surfaces, and a method of fabricating the same.

A further object of the present invention is to provide an electrically writable/erasable semiconductor memory device which can implement a high degree of integration or mass storage by forming a 1-bit memory cell by only a single transistor part, and which can suppress fatigue of a gate oxide film.

A further object of the present invention is to provide an electrically writable/erasable semiconductor memory device which can increase remanence and maintain a high dielectric constant while maintaining a small cell size.

According to a fifty-sixth aspect of the present invention, a semiconductor device has a field-effect thin-film transistor on an upper surface of a substrate, and the field-effect thin-film transistor comprises a gate which is formed at least on a part of an upper side of the substrate, an insulating film which is formed on an upper surface (lower surface) of the gate, and a source and a drain which are selectively formed on an upper surface (lower surface) of the insulating film, while the gate, the source and the drain are formed by single-crystalline films.

Preferably, the semiconductor device further comprises a wiring film which is connected to at least any one of the gate, the source and the drain, and the wiring film is formed by a single-crystalline film.

According to a fifty-seventh aspect of the present invention, a semiconductor device has a field-effect thin-film transistor on an upper surface of a substrate, and the field-effect thin-film transistor comprises a gate which is formed at least on a part of an upper side of the substrate, a gate insulating film which is formed on an upper surface of the gate, and a source and a drain which are selectively formed on an upper surface of the gate insulating film respectively, while the gate insulating film is formed by a single-crystalline film.

According to a fifty-eighth aspect of the present invention, a semiconductor device has a field-effect thin-film transistor on an upper surface of a substrate, and the field-effect thin-film transistor comprises a gate which is formed at least on a part of an upper side of the substrate, a gate insulating film which is formed on an upper surface of the gate, a source and a drain which are formed on an upper surface of the gate insulating film to be separated from each other, and a channel which is interposed between the source and the drain, while the channel is formed by a single-crystalline film.

According to a fifty-ninth aspect of the present invention, a semiconductor device has a field-effect thin-film transistor and a condensed capacitance part which is arranged to be adjacent to the field-effect thin-film transistor on an upper surface of a substrate, and the field-effect thin-film transistor comprises a gate which is formed on a part of the upper surface of the substrate, a gate insulating film which is formed on an upper surface of the gate, and a source and a drain which are formed on an upper surface of the gate insulating film to be separated from each other, while the condensed capacitance part comprises a lower electrode which is formed on a part of the upper surface of the substrate, a dielectric film which is formed on an upper surface of the lower electrode, and an upper electrode which is formed on an upper surface of the dielectric film. The gate of the field-effect thin-film transistor and the lower electrode of the condensed capacitance part are formed by single-crystalline films.

Preferably, the dielectric film of the condensed capacitance part and the gate insulating film of the field-effect thin-film transistor are formed by single-crystalline films of high dielectric or ferroelectric substances.

According to any of the fifty-sixth to fifty-ninth aspects of the present invention, each single-crystalline film is preferably formed by supplying a reaction gas under a low temperature below a crystallization temperature and simultaneously applying beams from directions which are perpendicular to densest crystal planes of a plurality of different directions.

According to any of the fifty-sixth to fifty-ninth aspects of the present invention, each single-crystalline film is preferably formed by applying beams from directions which are perpendicular to densest crystal planes of a plurality of different directions under a low temperature below a crystallization temperature of a previously formed amorphous or polycrystalline thin film.

The present invention is also directed to a method of fabricating a semiconductor device. According to a sixtieth aspect of the present invention, a method of fabricating a semiconductor device having a field-effect thin-film transistor comprises a step of forming a gate at least on a part of an upper side of a substrate, a step of forming a gate insulating film on an upper surface of the gate, and a step of selectively forming a source and a drain on an upper surface of the gate insulating film, and the steps of forming the gate, the source and the drain include steps of supplying reaction gases under low temperatures below crystallization temperatures and simultaneously applying beams from directions which are perpendicular to densest crystal planes of plural different directions for forming the gate, the source and the drain consisting of single-crystalline films.

According to a sixty-first aspect of the present invention, a method of fabricating a semiconductor device having a field-effect thin-film transistor comprises a step of forming a gate at least on a part of an upper side of a substrate, a step of forming a gate insulating film on an upper surface (lower surface) of the gate, and[a step of selectively forming a source and a drain on an upper surface (lower surface) of the gate insulating film, and the steps of forming the gate, the source and the drain include steps of previously forming amorphous or polycrystalline thin films and applying beams from directions which are perpendicular to densest crystal planes of plural different directions under low temperatures below crystallization temperatures for forming the gate, the source and the drain consisting of single-crystalline films.

According to a sixty-second aspect of the present invention, a method of fabricating a semiconductor device having a field-effect thin-film transistor and a condensed capacitance part comprises a step of forming a lower electrode for condensed capacitance and a gate for the transistor on a surface of a substrate, a step of forming a dielectric film on an upper surface of the lower electrode for condensed capacitance, a step of selectively forming an upper electrode for condensed capacitance on an upper surface of the dielectric film, a step of forming a gate insulating film on an upper surface of the gate for the transistor, and a step of forming a source and a drain on an upper surface side of the gate insulating film, and the step of forming the dielectric film includes a step of supplying a reaction gas under a low temperature below a crystallization temperature and simultaneously applying beams from directions which are perpendicular to densest crystal planes of a plurality of different directions for forming the dielectric film consisting of a single-crystalline film.

According to a sixty-third aspect of the present invention, a method of fabricating a semiconductor device having a field-effect thin-film transistor and a condensed capacitance part comprises a step of forming a lower electrode for condensed capacitance and a gate for the transistor on a surface of a substrate, a step of forming a dielectric film on an upper surface of the lower electrode for condensed capacitance, a step of selectively forming an upper electrode for condensed capacitance on an upper surface of the dielectric film, a step of forming a gate insulating film on an upper surface of the gate for the transistor, and a step of forming a source and a drain on an upper surface side of the gate insulating film, and the steps of forming the dielectric film and the gate insulating film include steps of previously forming amorphous or polycrystalline thin films and applying beams from directions which are perpendicular to densest crystal planes of plural different directions under low temperatures below crystallization temperatures for forming the dielectric film and the gate insulating film consisting of single-crystalline films.

According to a sixty-fourth aspect of the present invention, a method of fabricating a semiconductor device having a field-effect thin-film transistor and a condensed capacitance part comprises a step of forming a lower electrode for condensed capacitance and a gate for the transistor on a surface of a substrate, a step of forming a dielectric film on an upper surface of the lower electrode for condensed capacitance, a step of selectively forming an upper electrode for condensed capacitance on an upper surface of the dielectric film, a step of forming a gate insulating film on an upper surface of the gate for the transistor, a step of forming a channel on an upper surface of the gate insulating film, and a step of forming a source and a drain on both sides of the channel, and the steps of forming the channel, the source and the drain include steps of supplying reaction gases under low temperatures below crystallization temperatures and simultaneously applying beams from directions which are perpendicular to densest crystal planes of plural different directions for forming the channel, the source and the drain consisting of single-crystalline films.

According to a sixty-fifth aspect of the present invention, a method of fabricating a semiconductor device having a field-effect thin-film transistor and a condensed capacitance part comprises a step of forming a lower electrode for condensed capacitance and a gate for the transistor on a surface of a substrate, a step of forming a dielectric film on an upper surface of the lower electrode for condensed capacitance, a step of selectively forming an upper electrode for condensed capacitance on an upper surface of the dielectric film, a step of forming a gate insulating film on an upper surface of the gate for the transistor, a step of forming a channel on an upper surface of the gate insulating film, and a step of forming a source and a drain on both sides of the channel, and the steps of forming the channel, the source and the drain include steps of previously forming amorphous or polycrystalline thin films and applying beams from directions which are perpendicular to densest crystal planes of plural different directions under low temperatures below crystallization temperatures for forming the channel, the source and the drain consisting of single-crystalline films.

According to the fifty-sixth, sixtieth or sixty-first aspect of the present invention, the gate, the source and the drain and the wiring film which is connected to at least any one of the same are formed by single-crystalline films. When these films are formed by silicon single-crystalline films and the gate insulating film is formed by a thermal oxide film of the single-crystalline silicon forming the gate, or the source and the drain, therefore, it is possible to attain thickness reduction while maintaining excellent insulativity for increasing an ON-state current of the transistor as compared with a case of forming the same by a thermal oxide film of a polycrystalline or amorphous film. Since the source and the drain are formed by single-crystalline films, further, it is possible to remarkably reduce a source-to-drain leakage current as compared with a case of forming the same by polycrystalline or amorphous films. Since the gate, the source, the drain and the wiring film are formed by single-crystalline films, in addition, insulativity is improved when interlayer insulating films between these layers are formed by thermal oxide films of these films as compared with a case of forming the same by thermal oxide films of polycrystalline or amorphous films. Therefore, a high-speed operation is enabled by increasing the ON-state current and reducing a time for charging condensed capacitance immediately after writing, while it is possible to reduce a standby current by reducing the OFF-state current.

According to the fifty-seventh aspect of the present invention, the gate insulating film is formed by a single-crystalline film, whereby it is possible to reduce its thickness while ensuring its withstand voltage. Thus, it is possible to remarkably reduce the formation area, thereby reducing the cell area of the overall field-effect thin-film transistor and improving its numerical aperture.

According to the fifty-eighth aspect of the present invention, the channel is formed by a single-crystalline film, whereby electron mobility in the channel is improved for attaining low resistance in an ON state of the transistor and high-speed processing of the semiconductor device is enabled. In an OFF state, on the other hand, crystal defects are remarkably reduced as compared with a polycrystalline or amorphous film, whereby occurrence of a leakage current can be prevented. Thus, it is possible to increase the ratio of a drain current in an ON state to that in an OFF state, thereby remarkably improving electrical properties.

According to any of the fifty-ninth, sixty-fourth and sixty-fifth aspects of the present invention, the gate of the field-effect thin-film transistor and the lower electrode of the condensed capacitance part are formed by single-crystalline films, whereby growth of hillocks, which are observed in polycrystalline or amorphous films, is hardly caused when Al is employed as the material, for example. Therefore, it is possible to remarkably reduce the thickness of the gate insulating film of the transistor which is formed on the gate and the lower electrode of the condensed capacitance part or the dielectric film of the condensed capacitance part as compared with the prior art, to increase the ON-state current of the transistor and to reduce the area of the condensed capacitance part, whereby high-speed processing as well as miniaturization are enabled.

According to any of the fifty-ninth, sixty-second and sixty-third aspects of the present invention, the dielectric film of the condensed capacitance part is formed by a single-crystalline film of a high dielectric or ferroelectric substance, whereby the dielectric film can be reduced in thickness and it is possible to remarkably reduce its formation area while stably ensuring sufficient capacitance. Thus, it is possible to reduce the cell area of the overall condensed capacitance part for improving its numerical aperture.

According to any of the fifty-sixth to sixty-fifth aspects of the present invention, it is possible to easily form a single-crystalline film having a regularized crystal orientation on an upper surface of each underlayer with setting of a free film thickness under a low temperature, even if the underlayer is not in a single-crystalline structure.

According to each of the fifty-sixth, sixtieth and sixty-first aspects of the present invention, the gate, the source and the drain and the wiring film which is connected to at least one of the same are formed by single-crystalline films, whereby high electron mobility is attained. Thus, it is possible to increase the ratio of a drain current in an ON state of the transistor to that in an OFF state as compared with a case of forming the same by polycrystalline or amorphous films. Therefore, a high-speed operation is enabled by increasing the ON-state current and reducing a time for charging condensed capacitance immediately after writing, while it is possible to reduce an OFF-state current for reducing a standby current.

According to the fifty-seventh aspect of the present invention, the gate insulating film is formed by a single-crystalline film, whereby it is possible to reduce its thickness while ensuring its withstand voltage, to remarkably reduce its formation area and to reduce the cell area of the overall field-effect thin-film transistor for improving its numerical aperture.

According to the fifty-eighth aspect of the present invention, the channel is formed by a single-crystalline film, whereby electron mobility in the channel is improved for attaining low resistance in an ON state of the transistor thereby enabling high-speed processing of the semiconductor device. In an OFF state, on the other hand, crystal defects are remarkably reduced as compared with a polycrystalline or amorphous film, whereby occurrence of a leakage current can be prevented. Thus, it is possible to increase the ratio of a drain current in an ON state to that in an OFF state, thereby remarkably improving electrical properties.

According to any of the fifty-ninth, sixty-fourth and sixty-fifth aspects of the present invention, the gate of the field-effect thin-film transistor and the lower electrode of the condensed capacitance part are formed by single-crystalline films, whereby it is possible to remarkably reduce the thicknesses of the dielectric film of the condensed capacitance part and the gate insulating film of the transistor formed thereon for increasing driving force of the condensed capacitance part and the transistor, whereby high-speed processing is enabled also upon miniaturization.

According to any of the fifty-ninth, sixty-second and sixty-third aspects of the present invention, the dielectric film of the condensed capacitance part is formed by a single-crystalline film of a high dielectric or ferroelectric substance, whereby it is possible to remarkably reduce its formation area while stably ensuring sufficient capacitance for implementing reduction in thickness of the dielectric film. Thus, it is possible to reduce the cell area of the overall condensed capacitance part for improving its numerical aperture.

According to any of the fifty-sixth to sixty-fifth aspects of the present invention, it is possible to easily form a single-crystalline film having a regularized crystal orientation on an upper surface of each underlayer with setting of a free film thickness under a low temperature, even if the underlayer is not in a single-crystalline structure. According to such a forming method, further, no influence is exerted by a step when the shape of the substrate is substantially at the same degree as that of an ordinary semiconductor device.

Accordingly, an object of the present invention is to provide a semiconductor device having a large ON-state current and a small OFF-state current and a method of fabricating the same.

Another object of the present invention is to provide a semiconductor device which can implement improvement in definition and a method of fabricating the same.

Still another object of the present invention is to provide a semiconductor device which can attain increase in operating speed and a method of fabricating the same.

A further object of the present invention is to provide a semiconductor device which can prevent occurrence of hillocks for omitting a step of forming $Al_2O_3$ layers and a method of fabricating the same.

According to a sixty-sixth aspect of the present invention, a liquid crystal display comprises an electrically insulating transparent substrate which is provided thereon with a pixel electrode of a liquid crystal element and a thin-film transistor for driving the liquid crystal element, and the transparent substrate is substantially made of a material having a withstand temperature of not more than 600° C., while an active layer of the thin-film transistor is substantially formed by a crystalline semiconductor thin film having carrier mobility exceeding 10 $cm^2/(V.sec.)$.

Preferably, a control electrode in the thin-film transistor is substantially formed by a crystalline semiconductor thin film.

Preferably, a driving circuit for driving the thin-film transistor is further formed on the transparent substrate.

The present invention is also directed to a method of fabricating a liquid crystal display. According to a sixty-seventh aspect of the present invention, the method of fabricating a liquid crystal display comprising an electrically insulating transparent substrate which is provided thereon with a pixel electrode of a liquid crystal element and a thin-film transistor, having an active layer substantially formed by a crystalline semiconductor thin film, for driving the liquid crystal element, comprises (a) a step of preparing an electrically insulating transparent substrate having a withstand temperature of not more than 600° C., (b) a step of forming an amorphous semiconductor thin film on the transparent substrate, (c) a step of irradiating a surface of the semiconductor thin film with a gas beam of low energy causing no sputtering of the semiconductor thin film from a prescribed direction during or after the step (b), thereby converting the semiconductor thin film to a crystalline semiconductor thin film, and (d) a step of introducing a prescribed impurity into the crystalline semiconductor thin film which is formed in the step (c), thereby forming the active layer.

Preferably, the prescribed direction in the step (c) is a plurality of directions which are perpendicular to a plurality of densest crystal planes having different directions in a single-crystalline body of the semiconductor thin film having a constant crystal orientation.

Preferably, the method of fabricating a liquid crystal display further comprises (e) a step of forming an insulating film on the crystalline semiconductor thin film which is formed in the step (c), (f) a step of regarding the semiconductor thin film as a first semiconductor thin film and forming an amorphous second semiconductor thin film on the insulating film, (g) a step of irradiating a surface of the second semiconductor thin film with a gas beam of low energy causing no sputtering of the second semiconductor thin film from a prescribed direction during or after the step (f), thereby converting the second semiconductor thin film to a crystalline semiconductor thin film, and (h) a step of selectively removing the second semiconductor thin film after the step (f), thereby molding the same into a shape of a control electrode of the thin-film transistor, and a prescribed impurity is introduced into the first semiconductor thin film through the control electrode serving as a screen in the step (d), thereby forming the active layer.

Preferably, the step (h) comprises (h–1) a step of forming a screen film on the second semiconductor layer by photolithography, and (h–2) a step of etching the second semiconductor layer thereby selectively forming the control electrode under the screen film, and the prescribed direction in the step (g) is a plurality of directions which are perpendicular to a plurality of densest crystal planes having different directions in a single-crystalline body of the semiconductor thin film having a constant crystal orientation.

Preferably, the method of fabricating a liquid crystal display further comprises (i) a step of forming a driving circuit for driving the thin-film transistor on the transparent substrate, and the step (i) comprises (i-1) a step of regarding the semiconductor thin film as a first semiconductor thin film and forming an amorphous second semiconductor thin film of the same material as the first semiconductor thin film on the transparent substrate simultaneously with the step (b), (i-2) a step of irradiating a surface of the second semiconductor thin film with a gas beam of low energy causing no sputtering of the second semiconductor thin film from the prescribed direction simultaneously with the step (c), thereby converting the second semiconductor thin film to a crystalline semiconductor thin film, and (i-3) a step of introducing a prescribed impurity into the crystalline semiconductor thin film which is formed in the step (i-2), thereby forming an active layer of a circuit element forming the driving circuit.

Preferably, the method of fabricating a liquid crystal display further comprises (j) a step of forming a driving circuit for driving the thin-film transistor on the transparent substrate, and the step (j) comprises (j-1) a step of forming an amorphous third semiconductor thin film of the same material as the first semiconductor thin film on the transparent substrate simultaneously with the step (b), (j-2) a step of irradiating a surface of the third semiconductor thin film with gas beams of low energy causing no sputtering of the third semiconductor thin film from the prescribed direction in the step (c) simultaneously with the step (c), thereby converting the third semiconductor thin film to a crystalline semiconductor thin film, (j-3) a step of regarding the insulating film as a first insulating film and forming a second insulating film of the same material as the first insulating film of the same material as the first insulating film on the crystalline semiconductor thin film simultaneously with the step (e), (j-4) a step of forming an amorphous fourth semiconductor thin film of the same material as the second semiconductor thin film on the second insulating film simultaneously with the step (f), (j-5) a step of irradiating a surface of the fourth semiconductor thin film with a gas beam of low energy causing no sputtering of the fourth semiconductor thin film from the prescribed direction in the step (g), thereby converting the fourth semiconductor thin film to a crystalline semiconductor thin film, (j-6) a step of selectively removing the fourth semiconductor thin film simultaneously with the step (h), thereby molding the same into the shape of a control electrode in the circuit element, and (j-7) a step of introducing a prescribed impurity into the third semiconductor thin film through the control electrode serving as a screen, thereby forming an active layer of a circuit element forming the driving circuit.

In the liquid crystal display according to the sixty-sixth aspect of the present invention, the transparent substrate is substantially made of a material having a withstand temperature of not more than 600° C., whereby the unit can be formed with a low-priced transparent substrate. In other words, it is possible to form the liquid crystal display at a low cost. Further, the active layer of the thin-film transistor is substantially formed by a crystalline semiconductor thin film having high carrier mobility, whereby the thin-film transistor has a large ON-state current. Thus, it is possible to display an image having high contrast with small flicker noise. Further, it is possible to refine the thin-film transistor due to the large ON-state current, whereby a high-definition image can be displayed.

According to the sixty-sixth aspect of the present invention, the control electrode is substantially formed by a crystalline thin film, whereby the active layer can be formed by a self-alignment technique. Thus, the thin-film transistor can be refined, whereby it is possible to display an image in higher definition.

According to the sixty-sixth aspect of the present invention, the driving circuit is formed on the same transparent substrate as that for the thin-film transistor and the pixel electrode of the liquid crystal element, whereby it is possible to display an image without setting a driving circuit in the exterior. In other words, it is possible to easily utilize the liquid crystal display at a low cost.

In the method of fabricating a liquid crystal display according to the sixty-seventh aspect of the present invention, the gas beam of low energy causing no sputtering of the target substance is applied from a prescribed direction after or while an amorphous semiconductor thin film is formed on the transparent substrate, leading to action of the so-called law of Bravais. In other words, the thin film as irradiated is converted to a crystal having such a crystal orientation that a plane perpendicular to the direction of irradiation defines the densest crystal plane. Thus, a crystalline semiconductor thin film forming an active layer of the thin-film transistor is formed on the transparent substrate. Due to irradiation with the gas beam, further, it is possible to form a crystalline active layer on the transparent substrate having a withstand temperature of not more than 600° C. Thus, it is possible to fabricate a liquid crystal display for displaying a high-quality image at a low cost according to this method.

According to the sixty-seventh aspect of the present invention, the gas beams are applied from a plurality of directions which are perpendicular to a plurality of densest crystal planes having different directions in a single-crystalline body having a constant crystal orientation, whereby the semiconductor thin film forming the active layer is set only in a single crystal orientation. Namely, a single-crystalline active layer having a regularized crystal orientation is formed on the transparent substrate. Thus, carrier mobility in the active layer is further improved as compared with a polycrystalline active layer. Further, it is possible to form a single-crystalline active layer on the transparent substrate having a withstand temperature of not more than 600° C., due to the irradiation with gas beams. According to this method, it is possible to fabricate a liquid crystal display for displaying an image of higher quality at a low cost. Further, it is also possible to fabricate a transmission type liquid crystal display since the active layer is formed as a thin film which is single-crystalline.

According to the sixty-seventh aspect of the present invention, the gas beam of low energy causing no sputtering is applied from a prescribed direction after or while an amorphous semiconductor thin film is formed on the insulating film. Therefore, the target thin film as irradiated is converted to a crystal having such a crystal orientation that planes perpendicular to the directions of irradiation define densest crystal planes. Thus, a crystalline semiconductor thin film forming a control electrode of the thin-film transistor is formed on the insulating film. Due to the irradiation with the gas beam, further, it is possible to form the crystalline control electrode without heating the transparent substrate having a withstand temperature of not more than 600° C. in excess of the withstand temperature. Further, the active layer is formed in a self-alignment manner by introduction of an impurity through the crystalline control electrode serving as a screen. Thus, it is possible to refine the thin-film transistor, whereby a liquid crystal display for displaying an image of higher definition can be fabricated at a low cost.

According to the sixty-seventh aspect of the present invention, the gas beams are applied from a plurality of directions which are perpendicular to a plurality of densest crystal planes having different directions in a single-crystalline body having a constant crystal orientation, whereby the semiconductor thin film formed on the insulating film is set only in a single crystal orientation. Namely, the second semiconductor thin film is formed as a single crystal having a regulated crystal orientation. Thus, it is possible to easily form a screen film on the second semiconductor thin film by photolithography, since no light is irregularly reflected from the, second semiconductor thin film. Further, etching of the semiconductor thin film can be easily controlled due to uniform progress of the etching. In addition, it is possible to easily form a uniform compound film with a metal having a high melting point, for example, on the second semiconductor thin film.

According to this method, fabrication steps are simplified and the liquid crystal display as fabricated is improved in reliability.

According to the sixty-seventh aspect of the present invention, it is possible to fabricate such a liquid crystal display that a driving circuit is formed on the same transparent substrate as that for the thin-film transistor and the pixel electrode of the liquid crystal element. Namely, it is possible to easily fabricate a liquid crystal display at a low cost. Further, efficiency of fabrication is improved since the active layer of the thin-film transistor and that of a circuit element forming the driving circuit are simultaneously formed and the control electrode of the thin-film transistor.

According to the sixty-seventh aspect of the present invention, it is possible to fabricate such a liquid crystal display that a driving circuit is formed on the same transparent substrate as that for the thin-film transistor and the pixel electrode of a liquid crystal element. Namely, it is possible to easily fabricate a liquid crystal display at a low cost. Further, efficiency of fabrication is improved since the active layer of the thin-film transistor and that of a circuit element forming the driving circuit are simultaneously formed while a control electrode of the thin-film transistor and that of the circuit element forming the driving circuit are also simultaneously formed.

In the liquid crystal display according to the sixty-sixth aspect of the present invention, the transparent substrate is substantially made of a material having a withstand temperature of not more than 600° C., whereby the display can be formed at a low cost. Further, the active layer of the thin-film transistor is substantially formed by a crystalline semiconductor thin film having high carrier mobility, whereby it is possible to display a high-definition image having high contrast with small flicker noise.

According to the sixty-sixth aspect of the present invention, the control electrode of the thin-film transistor is substantially formed by a crystalline semiconductor thin film, whereby the active layer can be formed by a self-alignment technique. Thus, the thin-film transistor can be refined, whereby it is possible to display an image of higher definition.

According to the sixty-sixth aspect of the present invention, the driving circuit is formed on the same transparent substrate as that for the thin-film transistor and the pixel electrode of the liquid crystal element, whereby it is possible to display an image without setting a driving circuit in the exterior. In other words, it is possible to easily utilize the liquid crystal display at a low cost.

In the method of fabricating a liquid crystal display according to the sixty-seventh aspect of the present invention, the gas beam of low energy causing no sputtering of the target substance is applied from a prescribed direction after or while an amorphous semiconductor thin film is formed on the transparent substrate, whereby it is possible to form a crystalline active layer forming an active layer of the thin-film transistor on the transparent substrate having a withstand temperature of not more than 600° C. Thus, it is possible to fabricate a liquid crystal display for displaying a high-quality image at a low cost.

According to the sixty-seventh aspect of the present invention, the gas beams are applied from a plurality of directions which are perpendicular to a plurality of densest crystal planes having different directions in a single-crystalline body having a constant crystal orientation, whereby a single-crystalline semiconductor thin film having a regularized crystal orientation for forming the active layer of the thin-film transistor can be formed on the transparent substrate having a withstand temperature of not more than 600° C. According to this method, it is possible to fabricate a liquid crystal display for displaying an image of higher quality at a low cost. Further, it is also possible to fabricate a transmission type liquid crystal display since the active layer is formed as a thin film which is single-crystalline.

According to the sixty-seventh aspect of the present invention, the gas beam of low energy causing no sputtering is applied from a prescribed direction after or while an amorphous semiconductor thin film is formed on the insulating film, whereby a crystalline semiconductor thin film forming a control electrode of the thin-film transistor can be formed on the insulating film without heating the transparent substrate having a withstand temperature of not more than 600° C. in excess of the withstand temperature. Further, an active layer is formed in a self-alignment manner by introduction of an impurity through the crystalline control electrode serving as a screen. Thus, it is possible to refine the thin-film transistor, whereby a liquid crystal display for displaying an image of higher definition can be fabricated at a low cost.

According to the sixty-seventh aspect of the present invention, the gas beams are applied from a plurality of directions which are perpendicular to a plurality of densest crystal planes having different directions in a single-crystalline body having a constant crystal orientation, whereby the second semiconductor thin film is formed as a single crystal having a regulated crystal orientation without heating the transparent substrate having a withstand temperature of not more than 600° C. in excess of the withstand temperature. Thus, it is possible to easily form a screen film on the second semiconductor thin film by photolithography. Further, etching of the semiconductor thin film can be easily controlled. In addition, it is possible to easily form a uniform compound film with a metal having a high melting point, for example, on the second semiconductor thin film. According to this method, fabrication steps are simplified and the liquid crystal display as fabricated is improved in reliability.

According to the sixty-seventh aspect of the present invention, it is possible to easily fabricate such a liquid crystal display that a driving circuit is formed on the same transparent substrate as that for the thin-film transistor and the pixel electrode of the liquid crystal element at a low cost. Further, efficiency of fabrication is improved since the active layer of the thin-film transistor and that of a circuit element forming the driving circuit are simultaneously formed.

According to the sixty-seventh aspect of the present invention, it is possible to easily fabricate such a liquid crystal display that a driving circuit is formed on the same transparent substrate as that for the thin-film transistor and the pixel electrode of the liquid crystal element, i.e., a liquid crystal display which can be easily utilized at a low cost. Further, efficiency of fabrication is further improved since the active layer of the thin-film transistor and that of the circuit element forming the driving circuit are simultaneously formed while a control electrode of the thin-film transistor and that of the circuit element forming the driving circuit are also simultaneously formed.

Accordingly, an object of the present invention is to provide a liquid crystal display which can be fabricated at a low cost for displaying an image of high quality, and a method of fabricating the same.

According to a sixty-eighth aspect of the present invention, an insulated gate semiconductor device comprises a semiconductor substrate, a source and a drain which are selectively formed on the semiconductor substrate, a channel which is formed between the source and the drain, a gate insulating film which is formed on an upper surface of the channel, and a gate which is formed on an upper surface of the gate insulating film, and the channel is formed by a single-crystalline film.

Preferably, the gate insulating film is prepared from a single-crystalline high dielectric film or a single-crystalline ferroelectric film.

Preferably, the single-crystalline film is formed by forming a single-crystalline thin film by supplying a reaction gas under a low temperature below a crystallization temperature and simultaneously applying beams from directions which are perpendicular to densest crystal planes of a single direction or a plurality of different directions and thereafter growing a thick single-crystalline film on the single-crystalline thin film serving as a seed crystal.

Preferably, the single-crystalline film is formed by repeating a step of supplying a reaction gas under a low temperature below a crystallization temperature and simultaneously applying beams from directions which are perpendicular to densest crystal planes of a single direction or a plurality of different directions thereby growing a thick single-crystalline film.

According to a sixty-ninth aspect of the present invention, an insulated gate semiconductor device comprises a semiconductor device, a source and a drain which are selectively formed on the semiconductor substrate, a gate insulating film which is formed on a portion of the semiconductor substrate between the source and the drain, and a gate which is formed on an upper surface of the gate insulating film, and the gate insulating film is formed by a single-crystalline film.

According to a seventieth aspect of the present invention, an insulated gate semiconductor device comprises a semiconductor substrate, a source and a drain which are selectively formed on the semiconductor substrate, a gate insulating film which is formed on a portion of the semiconductor substrate between the source and the drain, and a gate which is formed on an upper surface of the gate insulating film, and the source and the drain are formed by single-crystalline films.

According to a seventy-first aspect of the present invention, an insulated gate semiconductor device comprises a semiconductor substrate, a source and a drain which are selectively formed on the semiconductor substrate, a gate insulating film which is formed on a portion of the semiconductor substrate between the source and the drain, a gate which is formed on an upper surface of the gate insulating film, a first insulating film which is formed on an upper surface of the gate, an interconnection layer which is formed on an upper surface of each of the source and the drain or over an upper surface of the gate and a part of an upper surface of the first insulating film, a second insulating film which is formed on upper surfaces of the interconnection film and the first insulating film, and a flattening film for an etchback operation which is formed on an upper surface of the second insulating film, and a contact hole is formed through an upper surface of the flattening film and the second insulating film to reach the upper surface of the interconnection film, while the flattening film and the second insulating film are formed by single-crystalline films having substantially equal degrees of crystallinity.

According to a seventy-second aspect of the present invention, a bipolar semiconductor device comprises a semiconductor substrate, and a multilayer semiconductor layer which is formed on an upper surface of the semiconductor substrate and including a collector, a base and an emitter, and at least one of the collector, the base and the emitter is formed by a single-crystalline film.

According to the sixty-eighth, sixty-ninth, seventieth, seventy-first or seventy-second aspect of the present invention, the single-crystalline film is preferably formed by supplying a reaction gas under a low temperature below a crystalline temperature and simultaneously applying beams from directions which are perpendicular to densest crystal planes of a single direction or a plurality of different directions.

According to the sixty-eighth, sixty-ninth, seventieth, seventy-first or seventy-second aspect of the present invention, the single-crystalline film is preferably formed by applying beams from directions which are perpendicular to densest crystal planes of a single direction or a plurality of different directions under a low temperature below a crystallization temperature of a previously formed amorphous or polycrystalline thin film.

The present invention is also directed to a method of fabricating an insulated gate semiconductor device. According to a seventy-third aspect of the present invention, a method of fabricating an insulated gate semiconductor device comprises a step of forming a channel on an upper surface of a semiconductor substrate between regions for defining a source and a drain, a step of forming a gate insulating film on an upper surface of the channel, and a step of forming a gate on an upper surface of the gate insulating film, and the step of forming the channel includes a step of supplying a reaction gas under a low temperature below a crystallization temperature and simultaneously applying beams from directions which are perpendicular to densest crystal planes of a single direction or a plurality of different directions thereby forming the channel of a single-crystalline film.

According to a seventy-fourth aspect of the present invention, a method of fabricating an insulated gate semiconductor device comprises a step of forming a channel on an upper surface of a semiconductor substrate between regions for defining a source and a drain, a step of forming a gate insulating film on an upper surface of the channel, and a step of forming a gate on a upper surface of the gate insulating film, and the step of forming the channel includes a step of previously forming an amorphous or polycrystalline thin film and applying beams from directions which are perpendicular to densest crystal planes of a single direction or a plurality of different directions under a low temperature below a crystallization temperature thereby forming the channel of a single-crystalline film.

According to the seventy-third or seventy-fourth aspect of the present invention, the single-crystalline film is preferably formed to also include the regions for defining the source and the drain in the step of forming the channel, and an impurity is preferably introduced into the regions for defining the source and the drain through a mask of the gate after the step of forming the gate.

According to an seventy-fifth aspect of the present invention, a method of fabricating an insulated gate semiconductor device comprises a step of selectively forming a source and a drain on an upper surface of a semiconductor device for forming a channel between the source and the drain, a step of forming a gate insulating film on an upper surface of the channel, and a step of forming a gate on an upper surface of the gate insulating film, and the step of forming the gate insulating film includes a step of supplying a reaction gas under a low temperature below a crystallization temperature and simultaneously applying beams from directions which are perpendicular to densest crystal planes of a single direction or a plurality of different directions thereby forming the gate insulating film of a single-crystalline film.

According to a seventy-sixth aspect of the present invention, a method of fabricating an insulated gate semiconductor device comprises a step of selectively forming a source and a drain on an upper surface of a semiconductor device for forming a channel between the source and the drain, a step of forming a gate insulating film on an upper surface of the channel, and a step of forming a gate on an upper surface of the gate insulating film, and the step of forming the gate insulating film includes a step of previously forming an amorphous or polycrystalline thin film and applying beams from directions which are perpendicular to densest crystal planes of a single direction or a plurality of different directions under a low temperature below a crystallization temperature thereby forming the gate insulating film of a single-crystalline film.

According to a seventy-seventh aspect of the present invention, a method of fabricating an insulated gate semiconductor device comprises a step of forming a channel on an upper surface of a semiconductor substrate between regions for defining a source and a drain, a step of forming a gate insulating film on an upper surface of the channel, and a step of forming a gate on an upper surface of the gate insulating film, and the step of forming the channel includes a step of supplying a reaction gas under a low temperature below a crystallization temperature and simultaneously applying beams from directions which are perpendicular to densest crystal planes of a single direction or a plurality of different directions thereby forming the regions for defining the source and the drain of single-crystalline films.

According to an seventy-eighth aspect of the present invention, a method of fabricating an insulated gate semiconductor device comprises a step of forming a channel on an upper surface of a semiconductor substrate between regions for defining a source and a drain, a step of forming a gate insulating film on an upper surface of the channel, and a step of forming a gate on an upper surface of the gate insulating film, and the step of forming the channel includes a step of previously forming an amorphous or polycrystalline thin film and applying beams from directions which are perpendicular to densest crystal planes of a single direction or a plurality of different directions under a low temperature below a crystallization temperature thereby forming the regions for defining the source and the drain of single-crystalline films.

According to the seventy-seventh or seventy-eighth aspect of the present invention, the single-crystalline films are preferably formed to also include a region for defining the channel in the step of forming the channel, and an impurity is preferably introduced into the regions for defining the source and the drain through a mask of the gate after the step of forming the gate.

According to a seventy-ninth aspect of the present invention, a method of fabricating an insulated gate semiconductor device comprises a step of selectively forming a source and a drain on an upper surface of a semiconductor substrate, a step of forming a gate insulating film on a portion of the semiconductor substrate between the source and the drain, a step of forming a gate on an upper surface of the gate insulating film, a step of forming a first insulating film on an upper surface of the gate, a step of forming an interconnection film on an upper surface of each of the source and the drain or over an upper surface of the gate and a part of an upper surface of the first insulating film, a step of forming a second insulating film on upper surfaces of the interconnection film and the first insulating film, a step of forming a flattening film for an etchback operation on an upper surface of the second insulating film and a step of forming a contact hole through an upper surface of the flattening film and the second insulating film to reach the upper surface of the interconnection film, and each of the steps of forming the flattening film and the second insulating film includes a step of supplying a reaction gas under a low temperature below a crystallization temperature and simultaneously applying beams from directions which are perpendicular to densest planes of a single direction or a plurality of different directions for forming each of the flattening film and the second insulating film of single-crystalline films having substantially equal degrees of crystallinity.

According to an eightieth aspect of the present invention, a method of fabricating an insulated gate semiconductor device comprises a step of selectively forming a source and a drain on an upper surface of a semiconductor substrate, a step of forming a gate insulating film on a portion of the semiconductor substrate between the source and the drain, a step of forming a gate on an upper surface of the gate insulating film, a step of forming a first insulating film on an upper surface of the gate, a step of forming an interconnection film on an upper surface of each of the source and the drain or over an upper surface of the gate and a part of an upper surface of the first insulating film, a step of forming a second insulating film on upper surfaces of the interconnection film and the first insulating film, a step of forming a flattening film for an etchback operation on an upper surface of the second insulating film, and a step of forming a contact hole through an upper surface of the flattening film and the second insulating film to reach the upper surface of the interconnection film, and each of the steps of forming the flattening film and the second insulating film includes a step of previously forming an amorphous or polycrystalline thin film and applying beams from directions which are perpendicular to densest crystal planes of a single direction or a plurality of different directions under a low temperature below a crystallization temperature for forming each of the flattening film and the second insulating film of single-crystalline films having substantially equal degrees of crystallinity.

According to an eighty-first aspect of the present invention, a method of fabricating an insulated gate semiconductor device comprises a step of selectively forming a source and a drain on an upper surface of a semiconductor substrate for forming a channel between the source and the drain, a step of forming a gate insulating film on an upper surface of the channel, and a step of forming a gate on an upper surface of the gate insulating film, and the step of forming the gate insulating film includes a step of supplying a reaction gas under a low temperature below a crystallization temperature and simultaneously applying beams from directions which are perpendicular to densest crystal planes of a single direction or a plurality of different directions for forming a single-crystalline thin film, and thereafter growing a thick single-crystalline film on the single-crystalline thin film serving as a seed crystal thereby forming the gate insulating film.

According to an eighty-second aspect of the present invention, a method of fabricating an insulated gate semiconductor device comprises a step of selectively forming a source and a drain on an upper surface of a semiconductor substrate for forming a channel between the source and the drain, a step of forming a gate insulating film on an upper surface of the channel, and a step of forming a gate on an upper surface of the gate insulating film, and the step of forming the gate insulating film includes a step of growing a thick single-crystalline film by repeating a step of supplying a reaction gas under a low temperature below a crystallization temperature and simultaneously applying beams from directions which are perpendicular to densest crystal planes of a single direction or a plurality of different directions for forming a single-crystalline thin film thereby forming the gate insulating film.

According to an eighty-third aspect of the present invention, a method of fabricating a bipolar semiconductor device comprises a plurality of formation steps of forming respective formation layers of a collector, a base and an emitter in which impurities are introduced respectively on an upper surface of a semiconductor substrate respectively, and a plurality of activation steps of activating the formation layers after the respective formation steps, and one of the activation steps for activating at least one of the formation layers includes a step of applying beams from directions which are perpendicular to densest crystal planes of a single direction or a plurality of different directions under a low temperature allowing no impurity diffusion and supplying impacts to a number of particles in a target while simultaneously single-crystallizing the formation layer.

According to each of the sixty-eighth, seventy-third and seventy-fourth aspects of the present invention, the channel is formed by a single-crystalline film, whereby it is possible to improve electron mobility in the channel for reducing the o resistance value when the transistor is turned on, and an OFF-state current can be reduced by preventing occurrence of a leakage current by a regular crystal structure when the transistor is turned off.

According to each of the sixty-eighth, seventy-fifth and seventy-sixth aspects of the present invention, the gate insulating film is formed by a single-crystalline film, whereby it is possible to prevent occurrence of a leakage current and to remarkably improve the insulating film withstand voltage.

According to each of the seventieth, seventy-seventh and seventy-eighth aspects of the present invention, the source and the drain are formed by single-crystalline films, whereby it is possible to prevent occurrence of a leakage current caused by crystal defects and to reduce an OFF-state current of the transistor.

According to each of the seventy-first, seventy-ninth and eightieth aspects of the present invention, the flattening film for an etchback operation and the second insulating film serving as an underlayer thereof have substantially equal degrees of crystallinity and the overall surfaces of the flattening film and the second insulating film serving as its underlayer are etched in this state to flatten the flattening film for serving as an underlayer for the second interconnection layer and thereafter a contact hole is formed through the upper surface of the flattening film and the second insulating film to reach the upper surface of the interconnection film, whereby the flattening film and the second insulating film are at the same etching rates in formation of the contact hole to facilitate the etching operation.

According to each of the sixty-eighth, eighty-first and eighty-second aspects of the present invention, the gate insulating film is formed by a single-crystalline high dielectric film or a single-crystalline ferroelectric film, whereby the same can be formed in a relatively large thickness and is remarkably improved in insulating property.

According to each of the seventy-second and eighty-third aspects of the present invention, at least one layer of the collector, the base and the emitter is formed by a single-crystalline film, whereby it is possible to improve electron mobility and reduce the resistance when the transistor is turned on, while occurrence of a leakage current can be prevented to suppress current consumption by regulating the crystal structure when the transistor is turned off. Namely, it is possible to provide a high characteristic semiconductor device having a high ON-OFF ratio of a collector current.

According to each of the sixty-eighth to eighty-second aspects of the embodiment, it is possible to easily form a single-crystalline thin film having a regulated crystal orientation on an arbitrary underlayer under a low temperature.

According to each of the sixty-eighth, eighty-first and eighty-second aspects of the present invention, in particular, it is possible to form a homogeneous and stable single-crystalline film even if a constant thickness is required for the single-crystalline film.

According to the eighty-third aspect of the present invention, the formation layers can be activated with no high-temperature treatment and no impurity diffusion, whereby the thicknesses and activation characteristics of the respective formation layers can be accurately controlled to reduce characteristic dispersion of the semiconductor device. Further, at least one of the formation layers is so single-crystallized that electron mobility can be improved to reduce the resistance when the transistor is turned on while occurrence of a leakage current can be prevented to suppress current consumption by regulating the crystal structure when the transistor is turned off. Namely, it is possible to provide a high characteristic semiconductor device having a high ON-OFF ratio of a drain current.

According to each of the seventy-third, seventy-fourth, seventy-seventh and seventy-eighth aspects of the present invention, the regions for defining the source and the drain and the channel are simultaneously single-crystallized so that an impurity is introduced into the regions for defining the source and the drain through a mask of the gate, whereby it is possible to fabricate a semiconductor device having a single-crystalline structure in self alignment by bringing the residual portion into a channel.

According to each of the sixty-eighth, seventy-third and seventy-fourth aspects of the present invention, the channel is formed by a single-crystalline film, whereby it is possible to improve electron mobility in the channel to reduce the resistance value when the transistor is turned on, and an OFF-state current can be reduced by preventing occurrence of a leakage current by a regular crystal structure when the transistor is turned off.

According to each of the sixty-ninth, seventy-fifth and seventy-sixth aspects of the present invention, the gate insulating film is formed by a single-crystalline film, whereby it is possible to prevent occurrence of a leakage current and remarkably improve insulating the film withstand voltage.

According to each of the seventieth, seventy-seventh and seventy-eighth aspects of the present invention, the source and the drain are formed by single-crystalline films, whereby it is possible to reduce a leakage current which is caused by crystal defects.

According to each of the seventh-first, seventy-ninth and eightieth aspects of the present invention, the flattening film for an etchback operation and the second insulating film serving as an underlayer thereof have substantially equal degrees of crystallinity so that the etchback operation for flattening is carried out and a contact hole is formed through the upper surface of the flattening film and the second insulating film to reach the upper surface of the interconnection film in such a state, whereby the flattening film and the second insulating film are at the same etching rates in the etchback operation and formation of the contact hole to facilitate the etching operation.

According to each of the sixty-eighth, eighty-first and eighty-second aspects of the present invention, the gate insulating film is formed by a single-crystalline high dielectric film or a single-crystalline ferroelectric film, whereby the same can be increased in thickness as compared with a thermal oxide film of silicon or the like to be remarkably improved in insulating property.

According to each of the seventy-second and eighty-third aspects of the present invention, at least one layer of the collector, the base and the emitter is formed by a single-crystalline film, whereby it is possible to improve electron mobility and reduce the resistance when the transistor is turned on while occurrence of a leakage current can be prevented to suppress current consumption by regulating the crystal structure when the transistor is turned off. Namely, it is possible to provide a high characteristic semiconductor device having a high ON-OFF ratio of a collector current. Further, impurity activation can be carried out at a low temperature causing no impurity diffusion, whereby the thickness of the base or the emitter of the transistor or impurity concentration can be accurately controlled to reduce characteristic dispersion of the bipolar transistor.

According to each of the sixty-eighth to eighty-second aspects of the present invention, it is possible to easily form a single-crystalline thin film having a regulated crystal orientation on an arbitrary underlayer under a low temperature.

According to each of the sixty-eighth, eighty-first and eighty-second aspects of the present invention, in particular, it is possible to form a homogeneous and stable single-crystalline film even if a constant thickness is required for the single-crystalline film.

According to the eighty-third aspect of the present invention, the formation layers can be activated with no high-temperature treatment and no impurity diffusion, whereby the thicknesses and activation characteristics of the formation layers cart be accurately controlled to reduce characteristic dispersion of the semiconductor device. Further, at least one of the formation layers is so single-crystallized that electron mobility can be improved to reduce the resistance when the transistor is turned on while occurrence of a leakage current can be prevented to suppress current consumption by regulating the crystal structure when the transistor is turned off. Namely, it is possible to provide a high characteristic semiconductor device having a high ON-OFF ratio of a drain current.

According to each of the seventy-third, seventy-fourth, seventy-seventh and seventy-eighth aspects of the present invention, the regions for defining the source and the drain and the channel are simultaneously single-crystallized so that an impurity is introduced into the regions for defining the source and the drain through a mask of the gate, whereby it is possible to fabricate a semiconductor device having a single-crystalline structure in self alignment by bringing the residual portion into a channel.

Accordingly, an object of the present invention is to provide a semiconductor device which can simultaneously reduce the cost and improve transistor characteristics, and a method of fabricating the same.

Another object of the present invention is to provide a semiconductor device which can improve the quality of a gate oxide film while accurately controlling a threshold value at the same time, and a method of fabricating the same.

Still another object of the present invention is to provide a semiconductor device which can implement shallow junction through a treatment at a relatively low temperature of not more than 800° C. while recovering defects caused in a source and a drain and activating an impurity, and a method of fabricating the same.

A further object of the present invention is to provide a semiconductor device which can attain sufficient reliability with reduction of fabrication steps, and a method of fabricating the same.

A further object of the present invention is to provide a semiconductor device which can implement flattening with an easy etchback operation, and a method of fabricating the same.

A further object of the present invention is to provide a semiconductor device which can remarkably improve the insulation property of a gate insulating film through a simple fabricating operation, and a method of fabricating the same.

A further object of the present invention is to provide a semiconductor device which can implement a finer bipolar transistor of higher performance and smaller characteristic dispersion as compared with a conventional transistor at a temperature of not more than 800° C. causing no impurity diffusion, and a method of fabricating the same.

The step of crystallizing the prescribed material comprises: a step of depositing the prescribed material under a low temperature causing no crystallization of the prescribed material and simultaneously irradiating the prescribed material which is being deposited with a gas beam of low energy causing no sputtering of the prescribed material from one direction, thereby forming an axially oriented polycrystalline thin film; and a step of irradiating the axially oriented polycrystalline thin film with gas beams of low energy causing no sputtering of the prescribed material under a high temperature below a crystallization temperature of the prescribed material from different directions in the single-crystalline thin film to be formed which are perpendicular to the plurality, of the densest crystal planes, thereby converting the polycrystalline thin film into a single-crystalline thin film.

In this case, even if the beams from the plurality of the directions fail to uniformly irradiate the substrate, it is possible to form either at least a single-crystalline thin film or an axially oriented polycrystalline thin film of the prescribed material on every portion of the substrate partly because the substrate has a cubic structure and partly because of other reasons. Further, since there is irradiation of the beams at least from one direction, it is possible to cause crystallization in a considerably large region including crystallization in the horizontal direction.

Alternatively, the step of crystallizing the prescribed material involves formation of a single-crystalline thin film semiconductor layer on the substrate and requires to form an amorphous thin film or a polycrystalline thin film of the semiconductor layer on the substrate in advance. This step is characterized in that gas beams of low energy causing no sputtering of the semiconductor layer are irradiated at a high temperature below a crystallization temperature of the semiconductor layer upon the amorphous or the polycrystalline thin film from different directions in the single-crystalline thin film to be formed which are perpendicular to the plurality of the densest crystal planes.

In this case, even if the beams from the plurality of the directions fail to uniformly irradiate the substrate, it is possible to form either at least a single-crystalline thin film or an axially oriented polycrystalline thin film of the prescribed material on every portion of the substrate partly because the substrate has a cubic structure and partly because of other reasons. Further, since there is irradiation of the beams at least from one direction, it is possible to cause crystallization in a considerably large region including crystallization in the horizontal direction.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 31 is a front sectional view of the micromachine manufactured according to the fifth embodiment of the present invention;

FIG. 32 is a perspective view of the micromachine manufactured according to the fifth embodiment of the present invention;

FIG. 33 is a front sectional view showing a micromachine manufactured according to a sixth embodiment of the present invention;

FIG. 34 illustrates a step of manufacturing the micromachine according to the sixth embodiment of the present invention;

FIGS. 91A, 91B and 91C are a plan view, a side elevational view and a front elevational view of the reflector provided in the twelfth embodiment respectively;

FIGS. 112A, 112B and 112C are a plan view, a side elevational view and a front elevational view of the reflector provided in the fourteenth embodiment respectively;

FIG. 121 is a sectional view showing a step of manufacturing the solar cell according to the seventeenth embodiment of the present invention;

FIG. 122 is a sectional view showing a step of manufacturing the solar cell according to the seventeenth embodiment of the present invention;

FIG. 123 is a sectional view showing a step of manufacturing the solar cell according to the seventeenth embodiment of the present invention;

FIG. 124 is a sectional view showing a step of manufacturing the solar cell according to the seventeenth embodiment of the present invention;

FIG. 125 is a sectional view showing a step of manufacturing the solar cell according to the seventeenth embodiment of the present invention;

FIG. 126 is a sectional view showing a step of manufacturing the solar cell according to the seventeenth embodiment of the present invention;

FIG. 127 illustrates characteristics of materials for general solar cells;

FIGS. 128A to 128E illustrate steps of manufacturing a conventional single-crystalline Si solar cell according to Prior Art 4;

FIGS. 129A to 129C illustrate steps of manufacturing the conventional single-crystalline Si solar cell according to Prior Art 4;

FIGS. 130A to 130C illustrate steps of manufacturing modifications of conventional single-crystalline Si solar cells according to Prior Art 4;

FIG. 131 illustrates relation between light passage distances and light incidence ratios as to single-crystalline silicon absorbing sunlight;

FIG. 132 illustrates relation between substrate thicknesses and conversion efficiency levels as reached in various solar cells;

Figure 133:
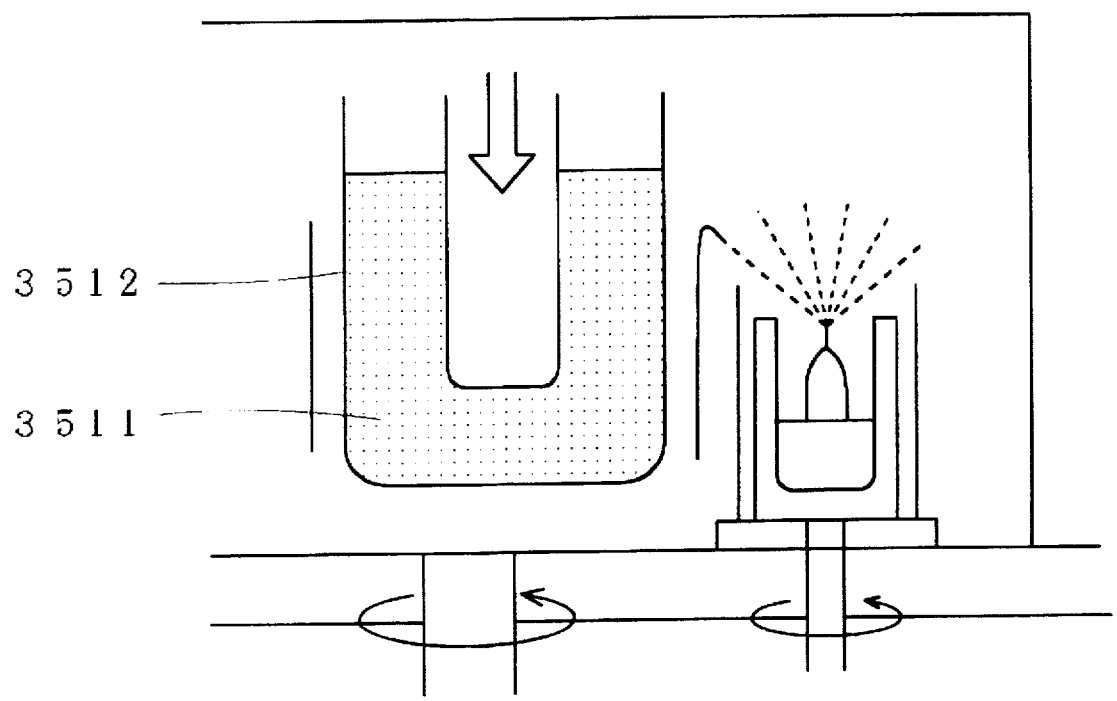
Figure 134:
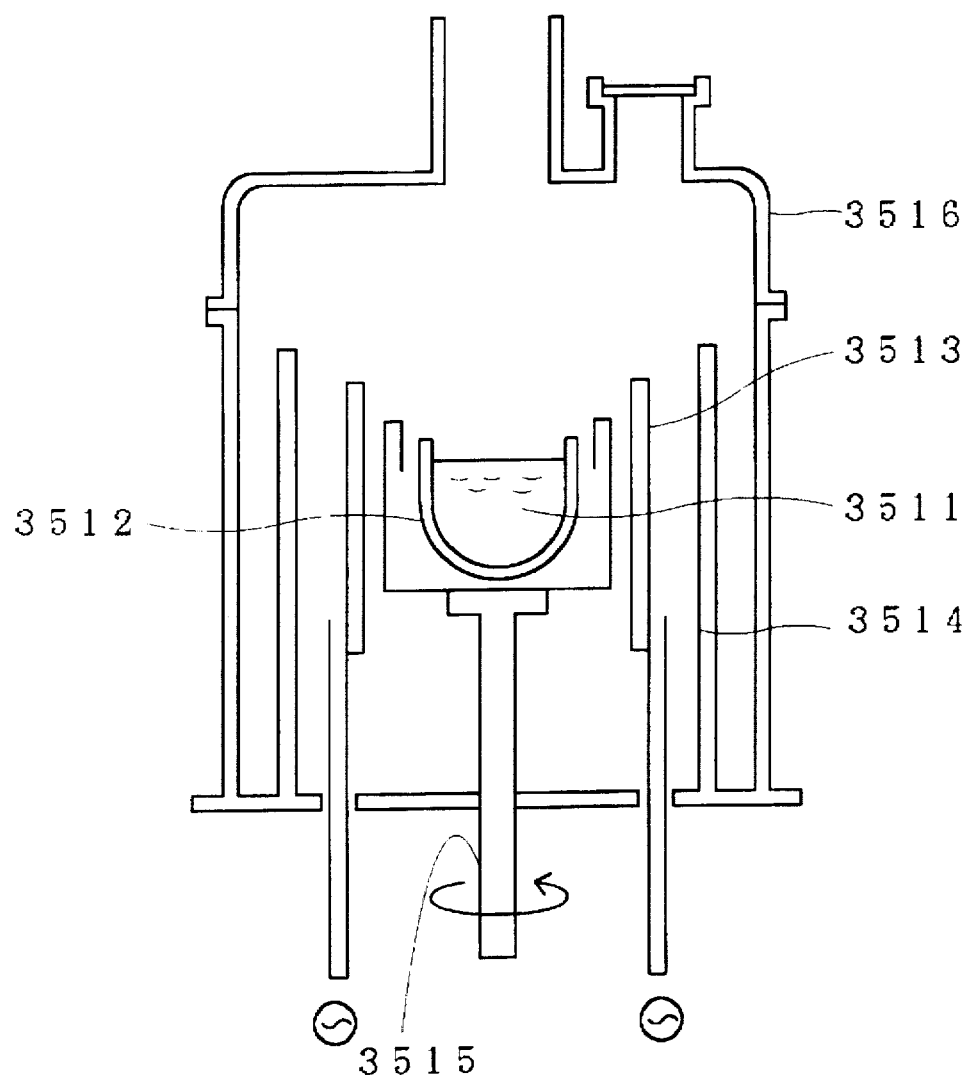
Figure 135:
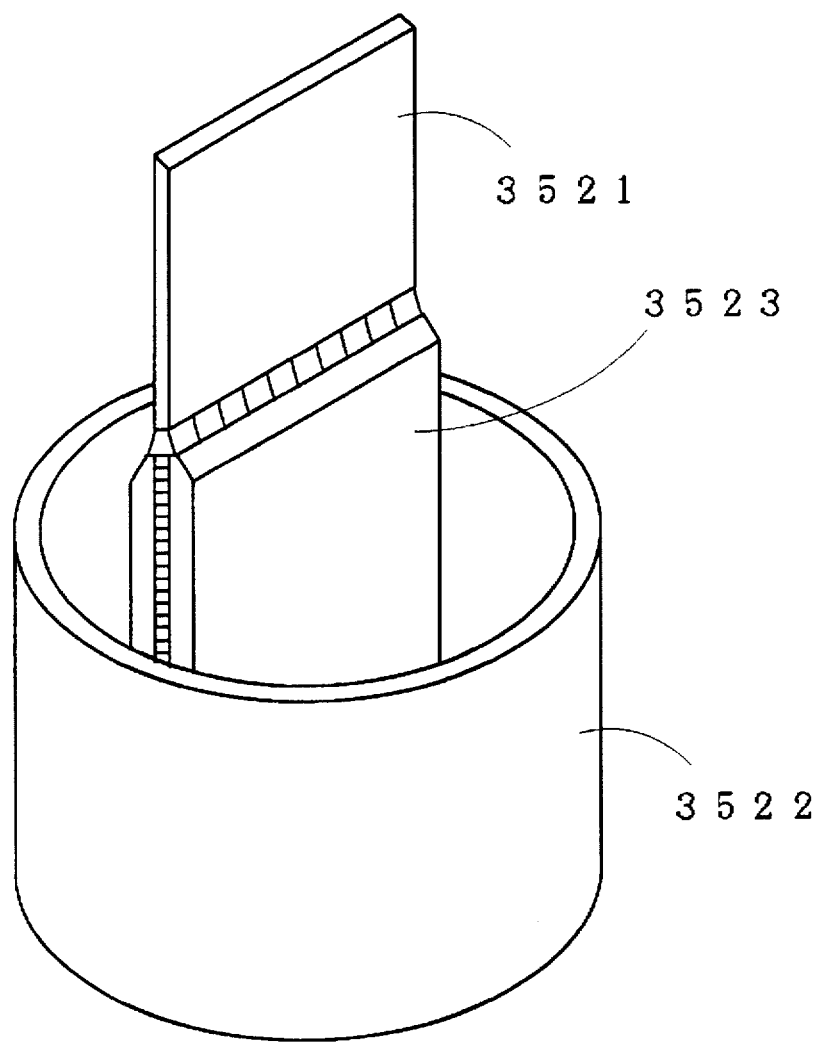
Figure 136:
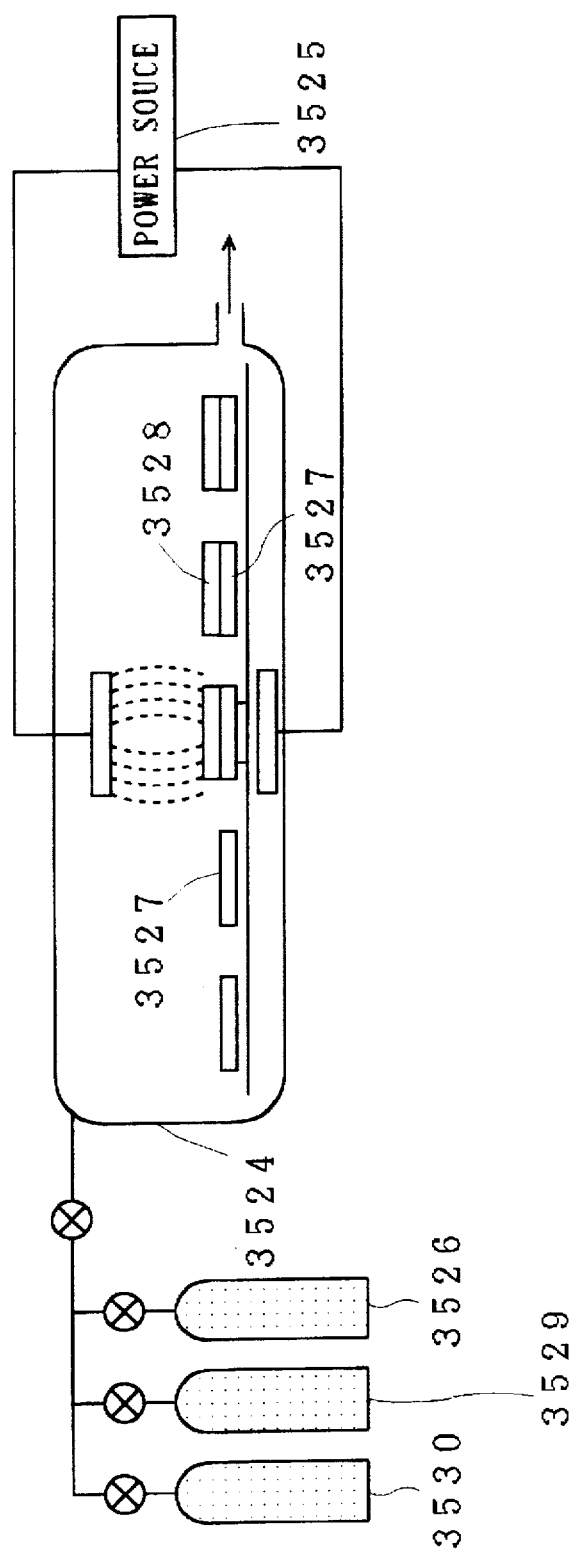
Figure 137:
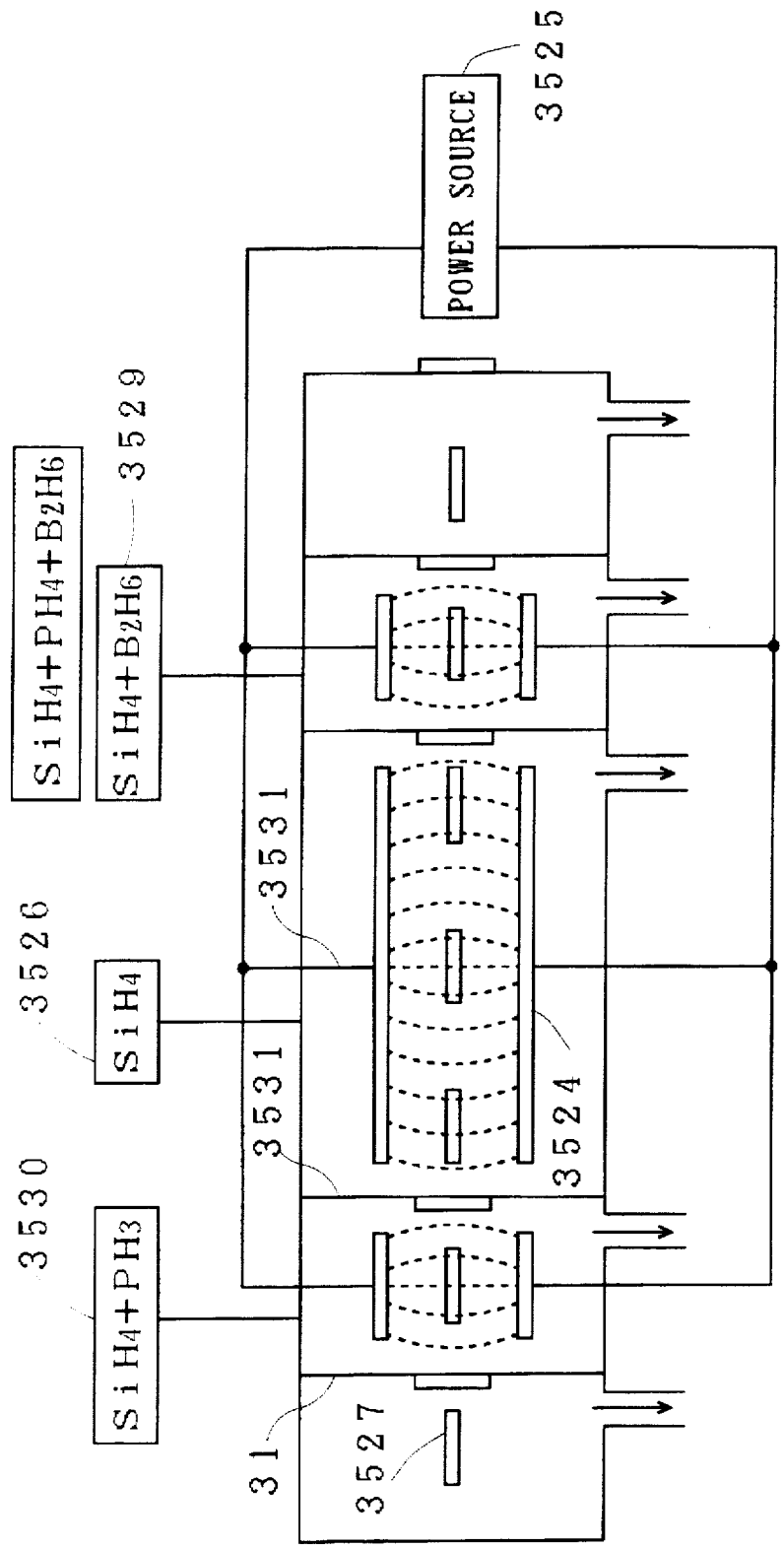
Figure 138:
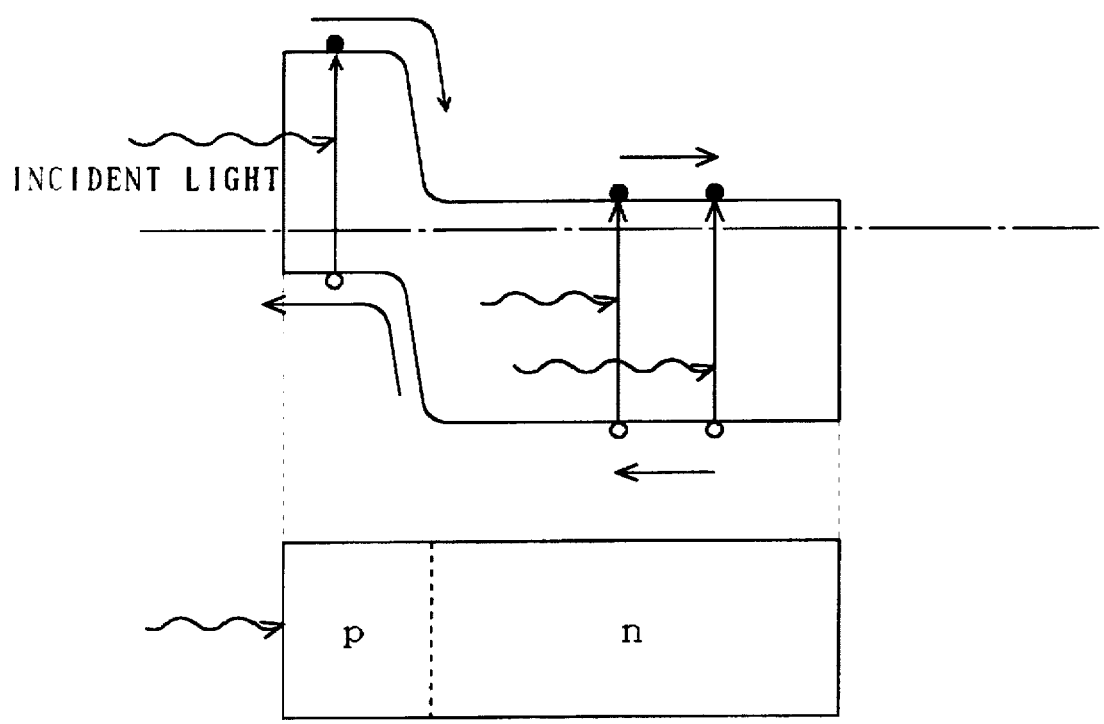
Figure 139:
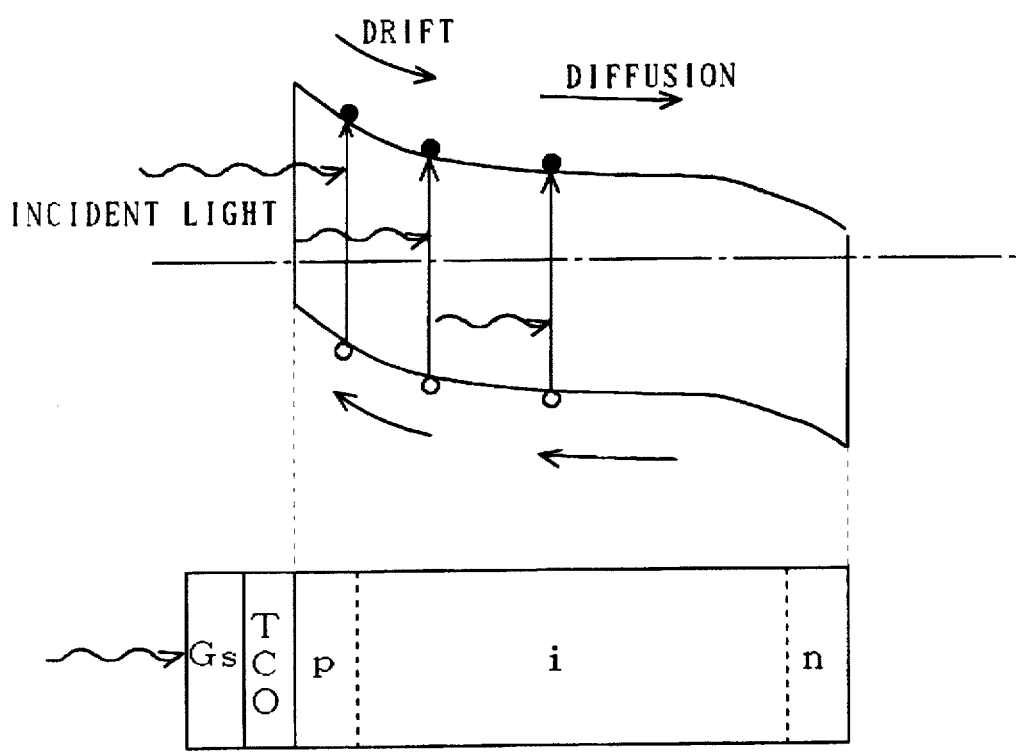
Figure 140:
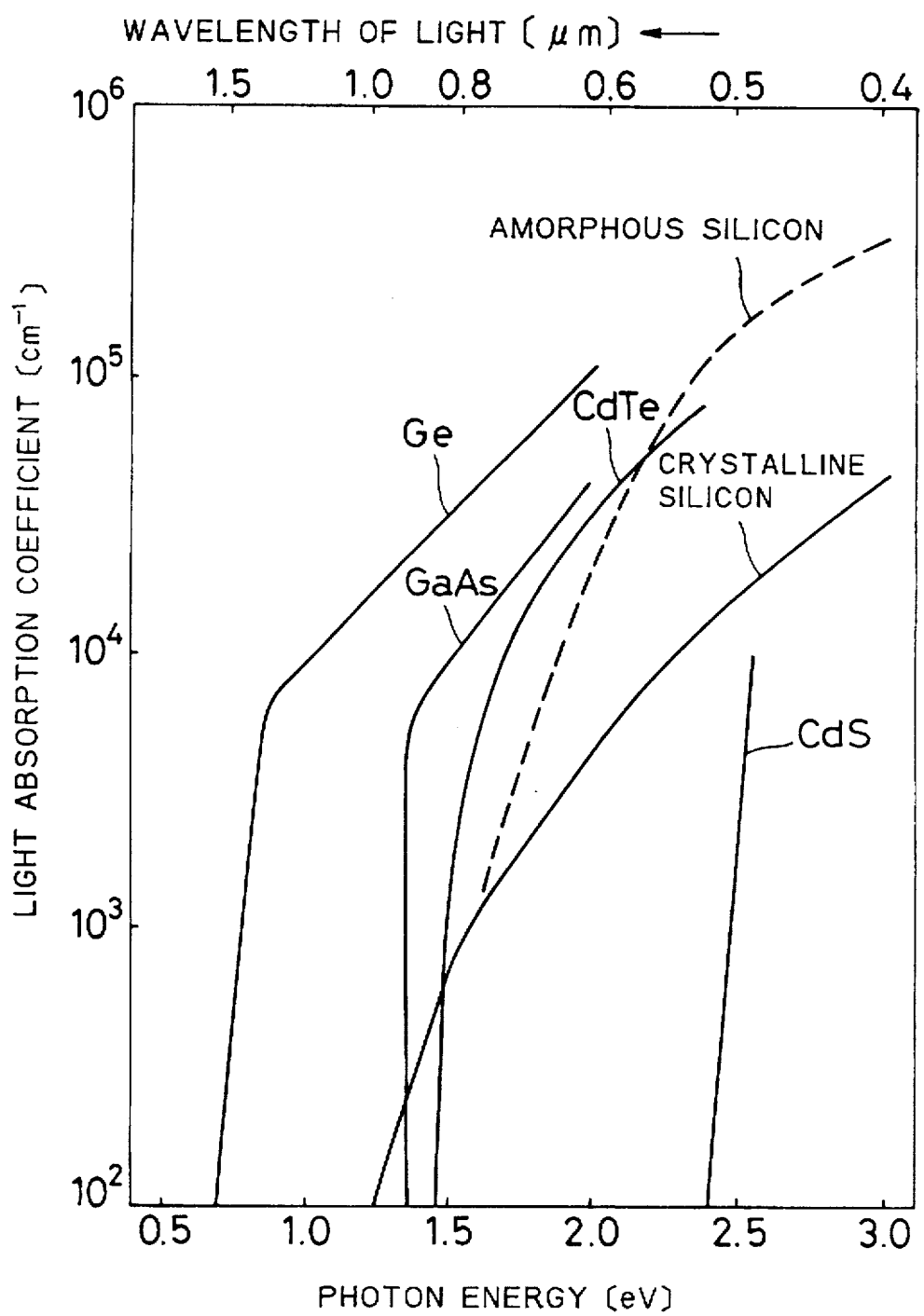
Figure 142:
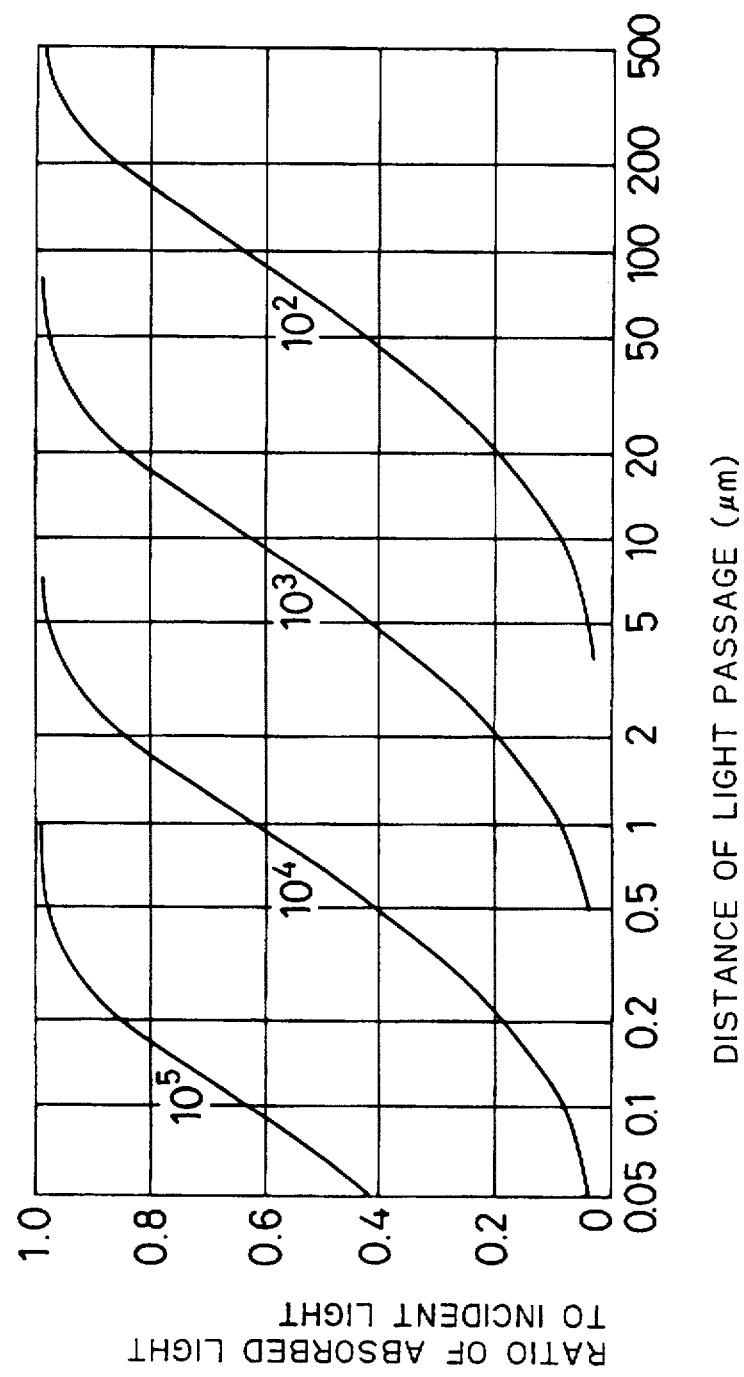
Figure 144:
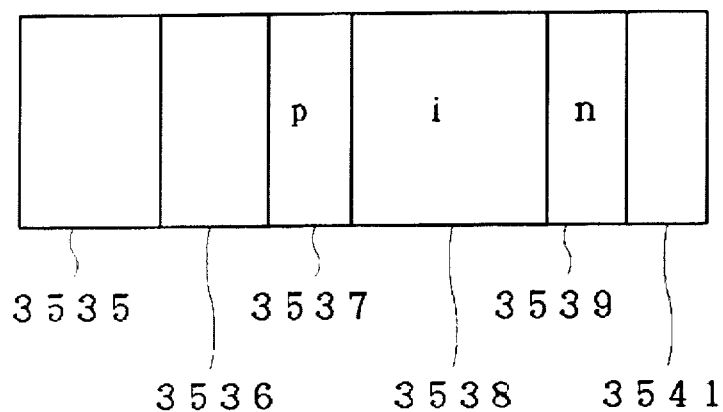
Figure 145:
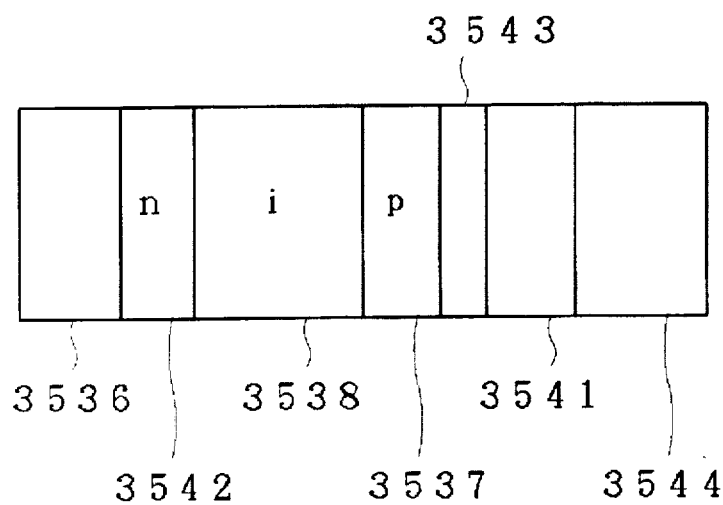
Figure 146:
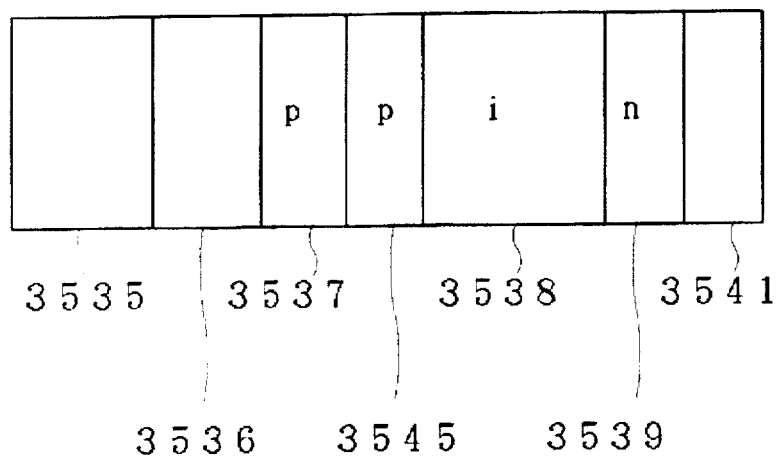
Figure 147:
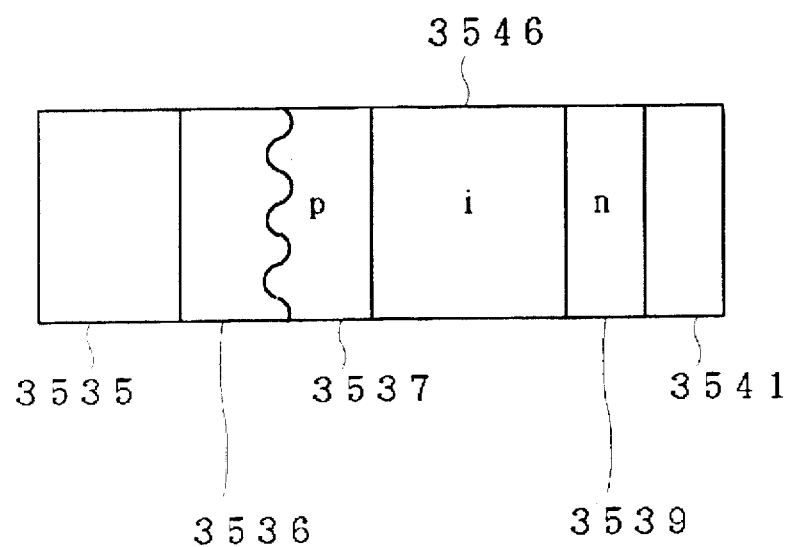
Figure 148:
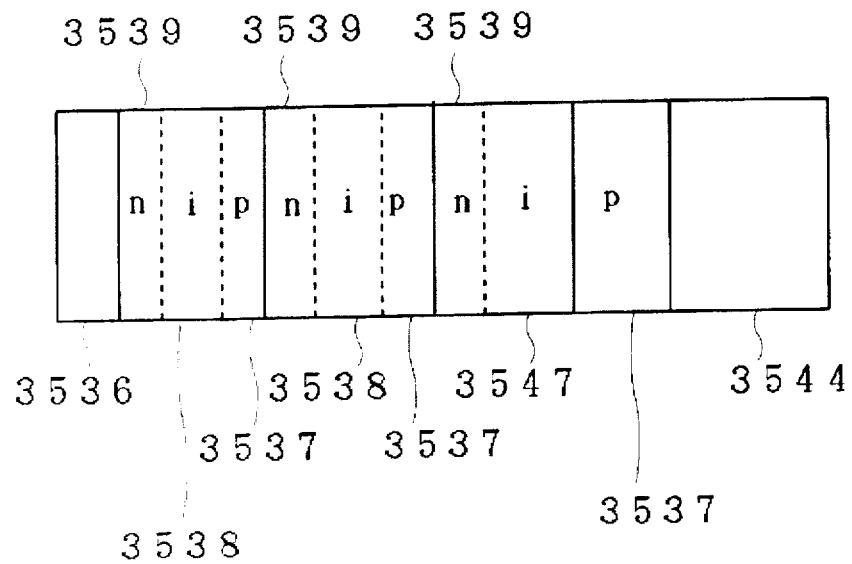
Figure 149:
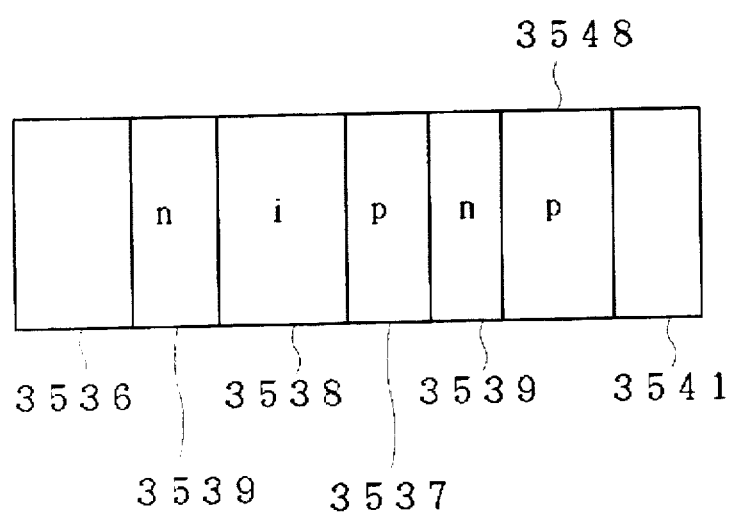
Figure 150:
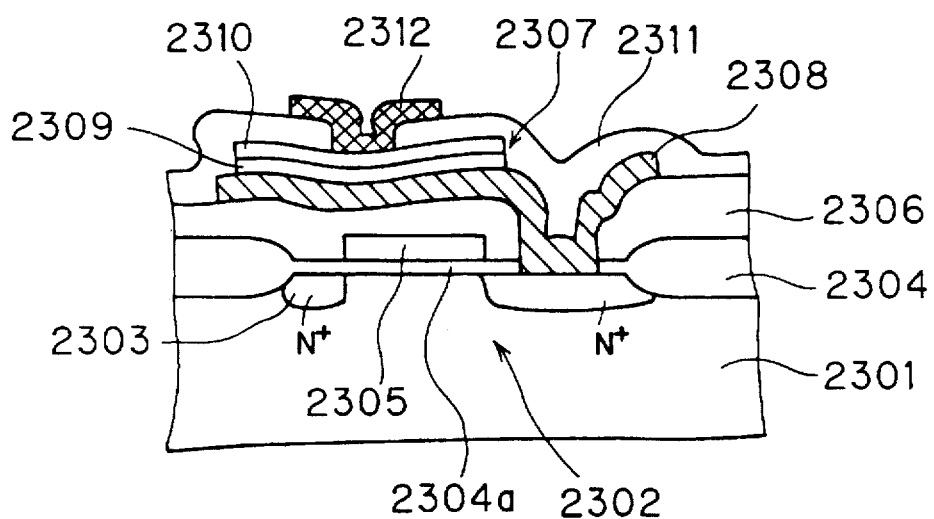
Figure 152:
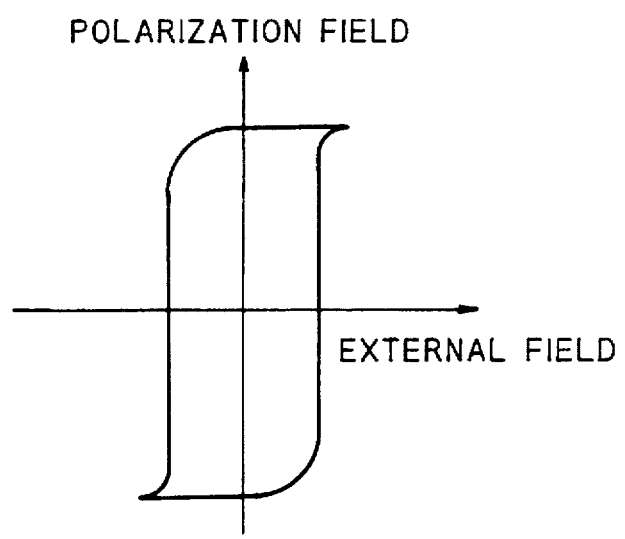
Figure 154:
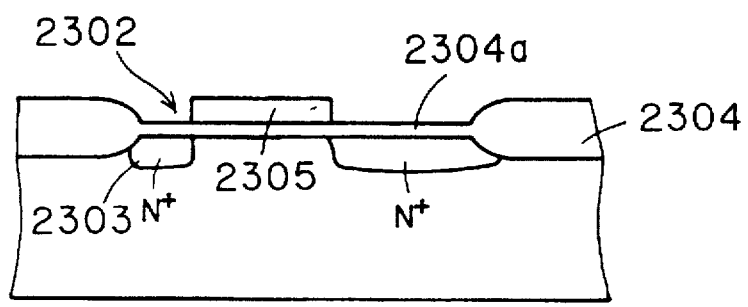
Figure 155:
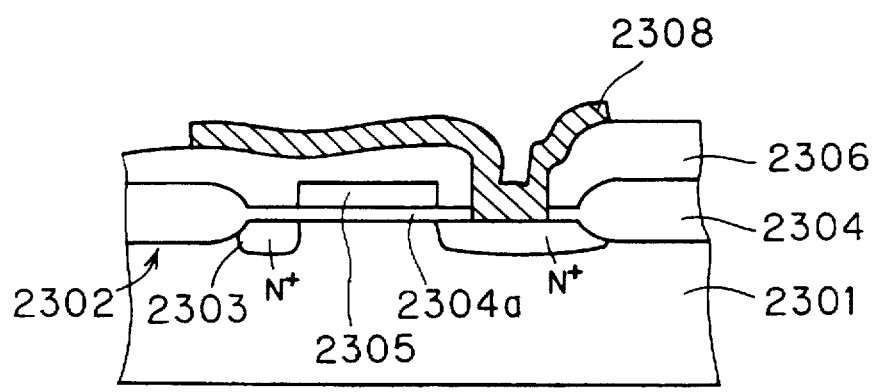
Figure 156:
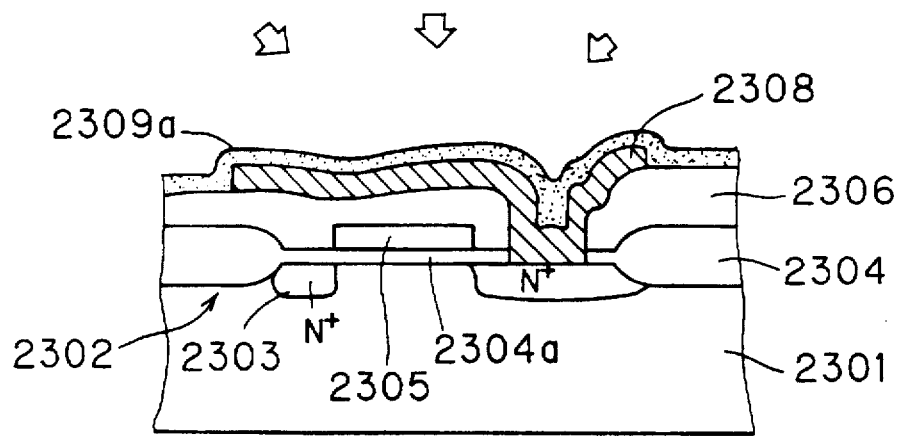
Figure 157:
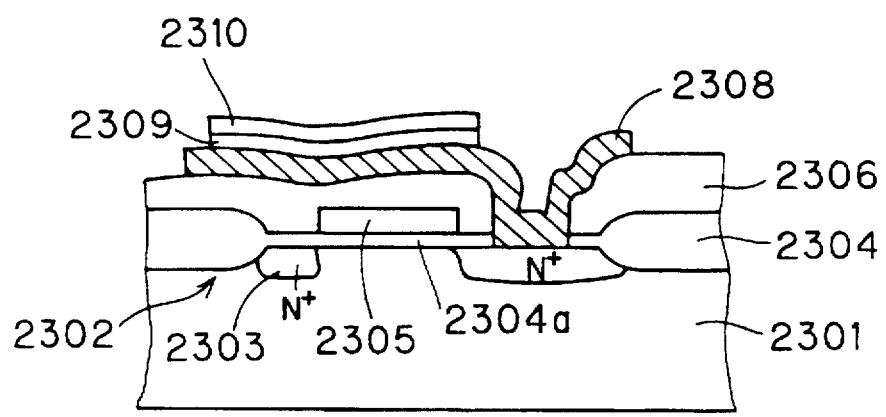
Figure 158:
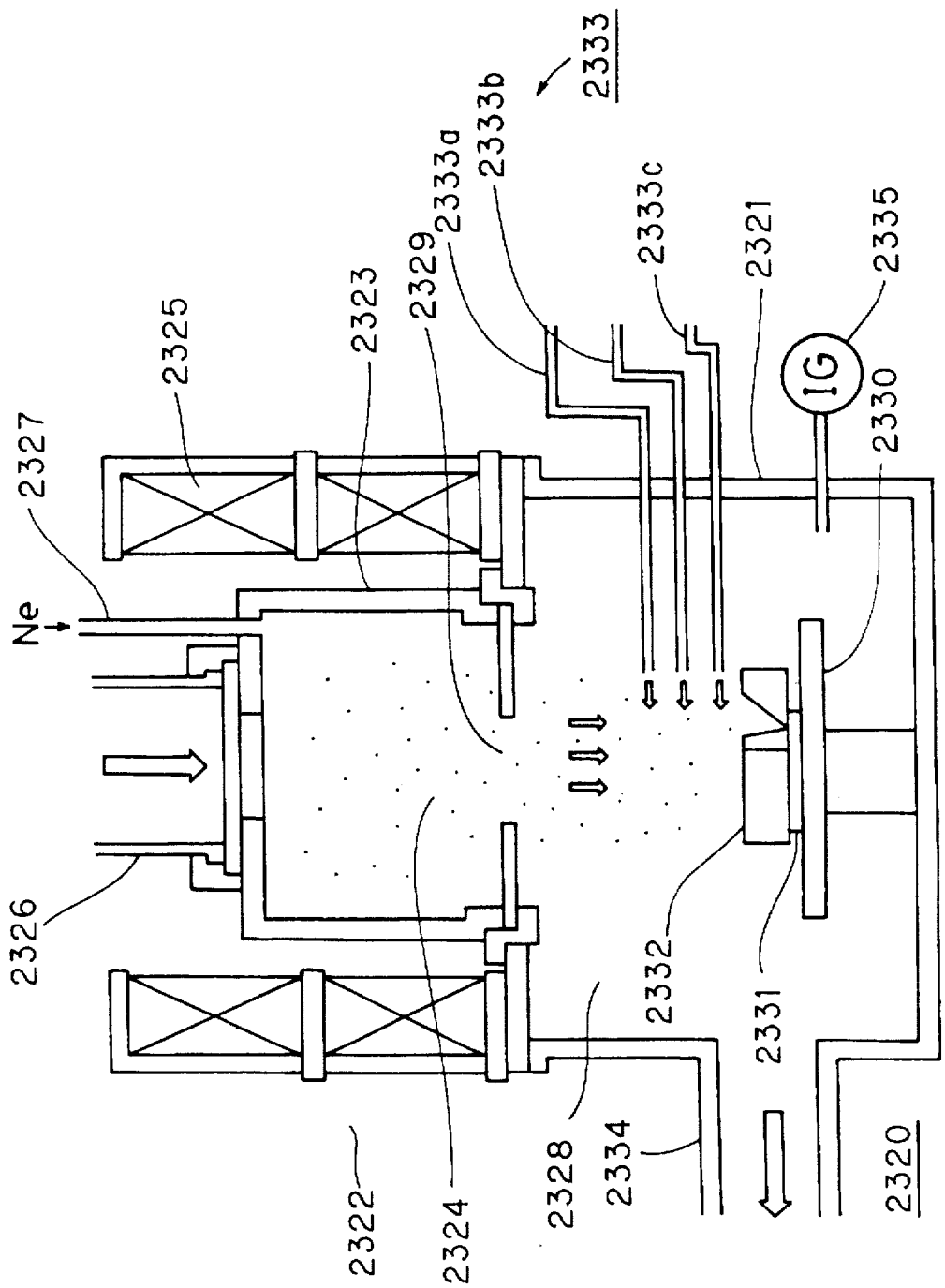
Figure 159:
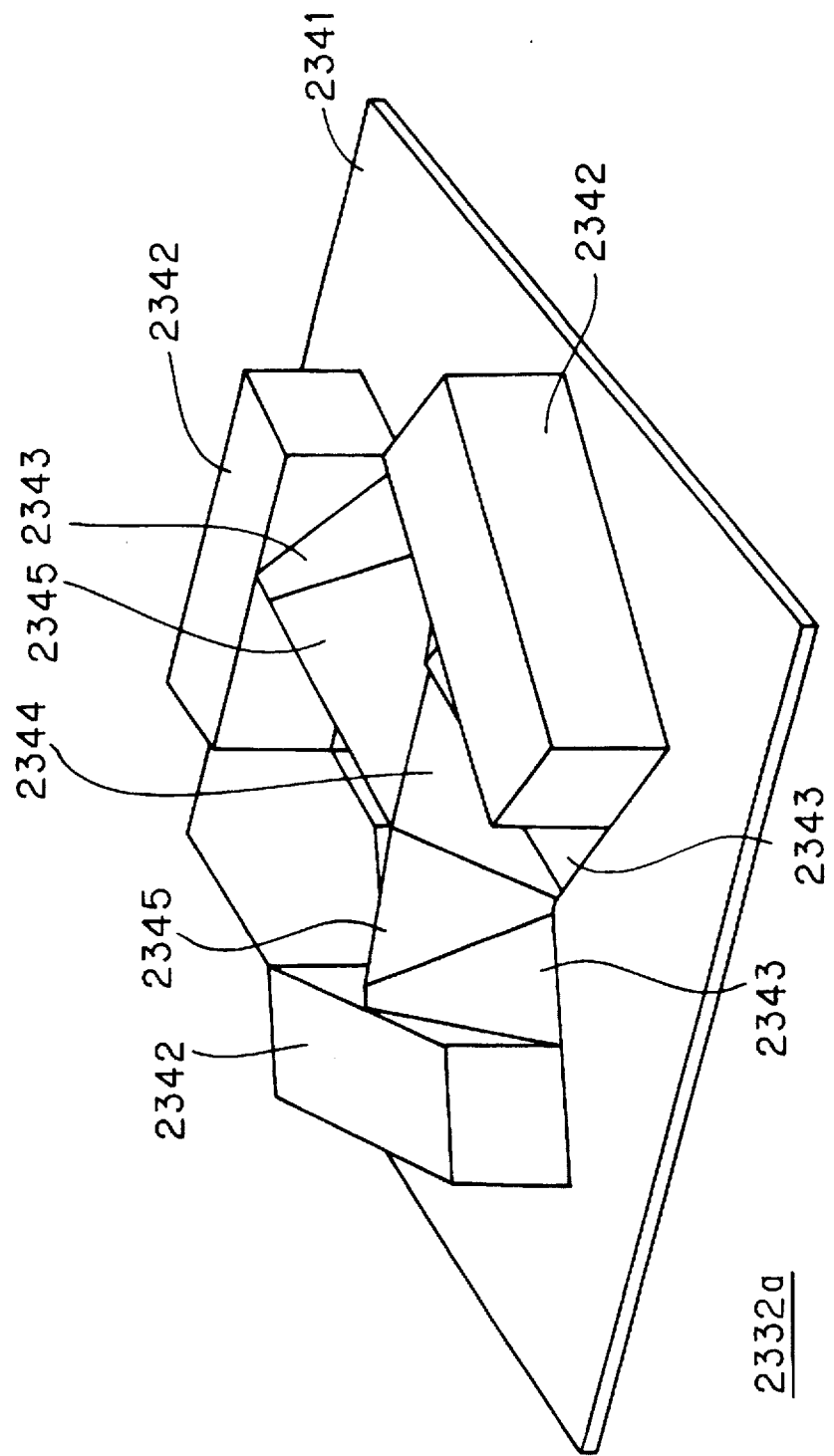
Figure 161:
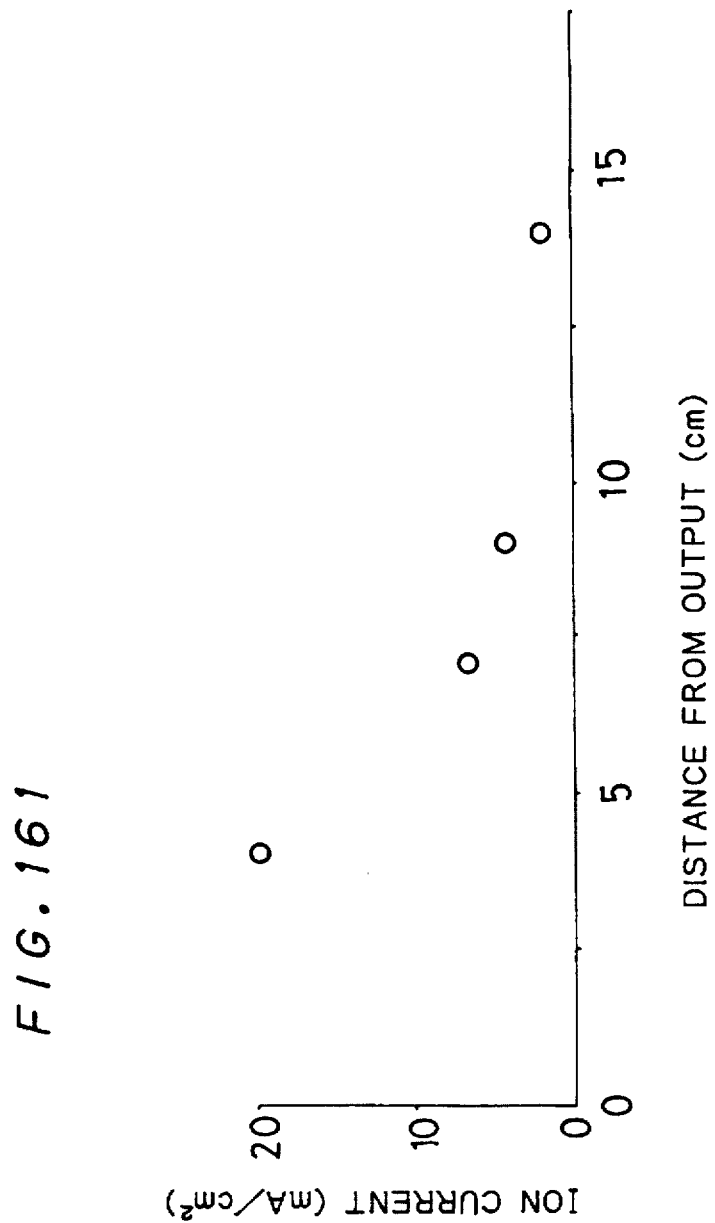
Figure 162:
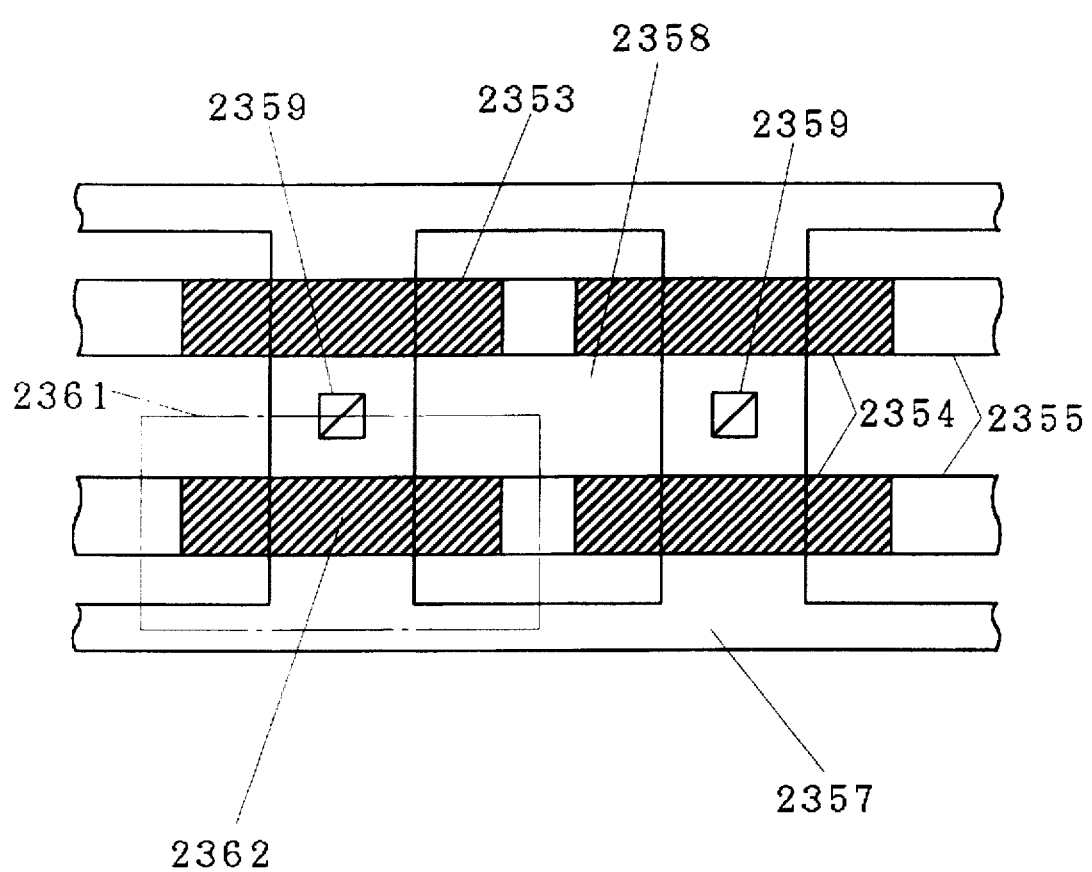
Figure 163:
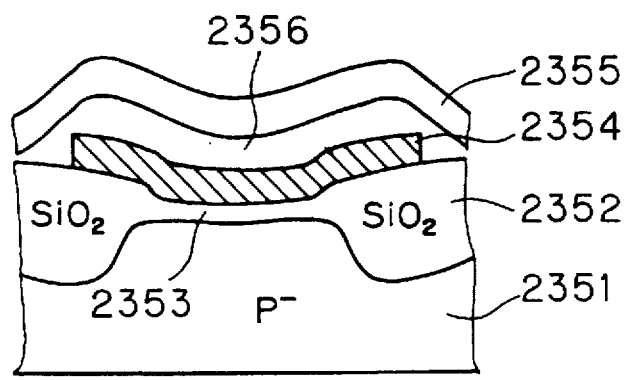
Figure 164:
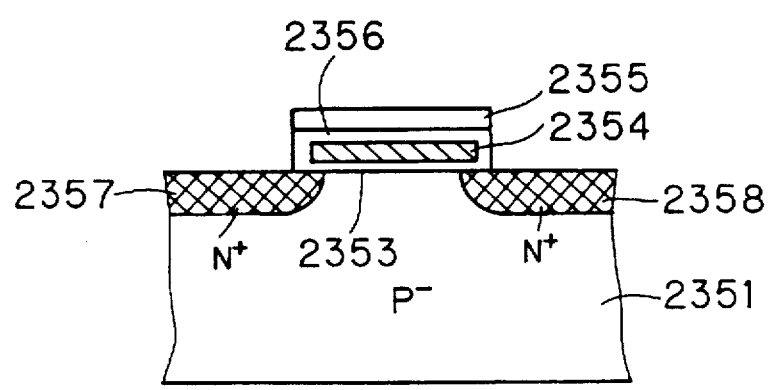
Figure 165:
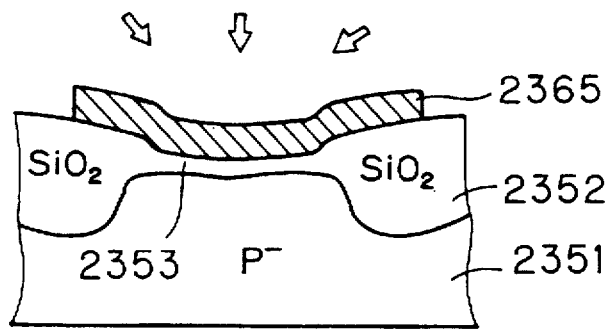
Figure 166:
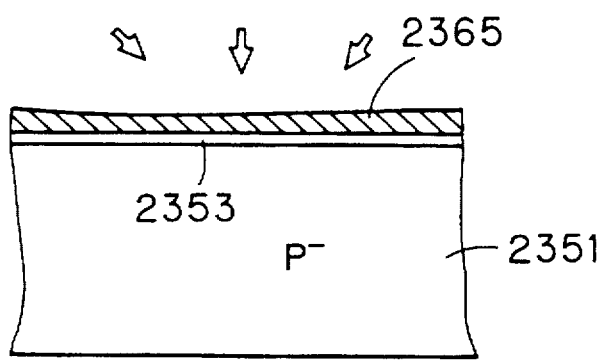
Figure 167:
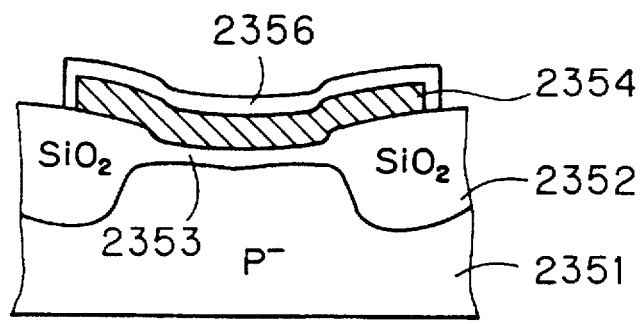
Figure 168:
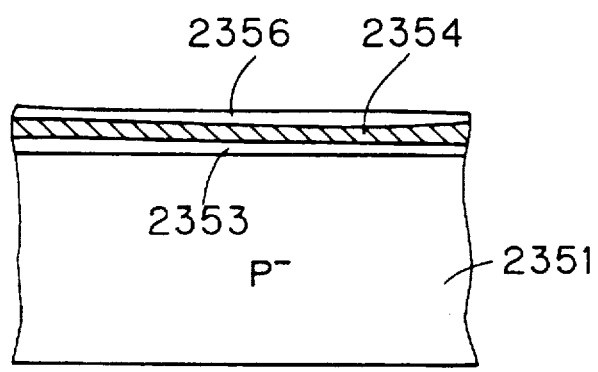
Figure 169:
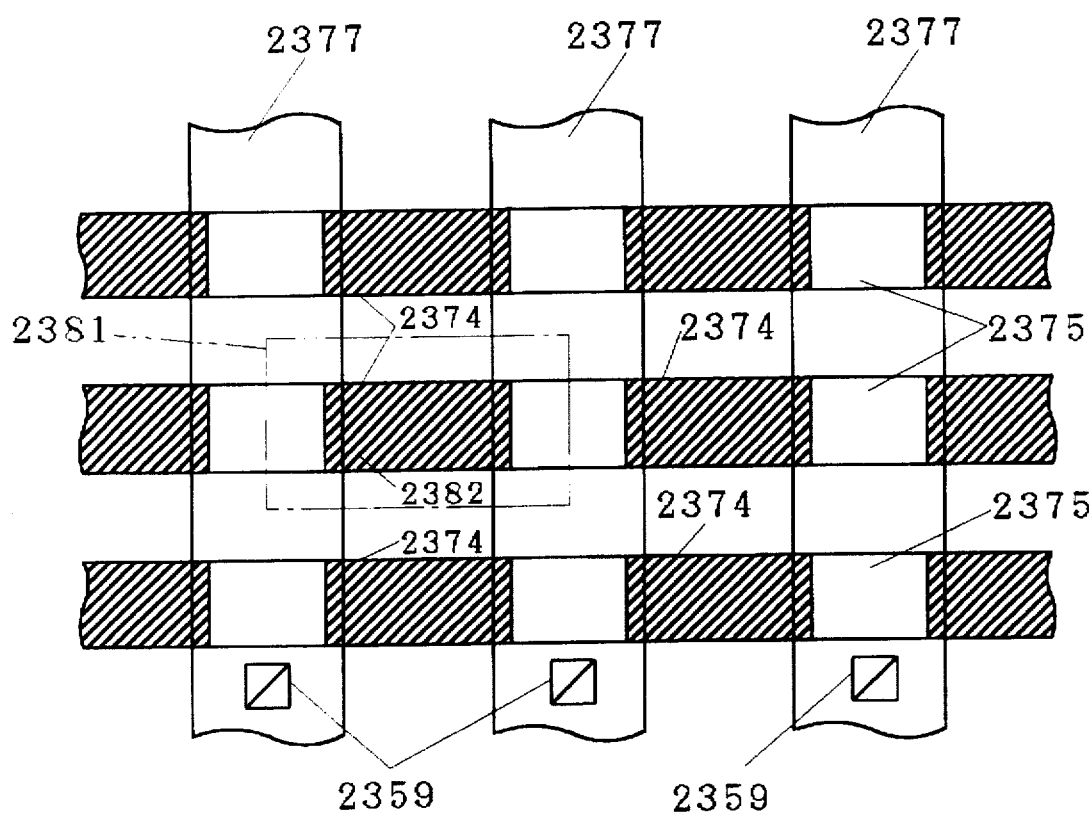
Figure 170:
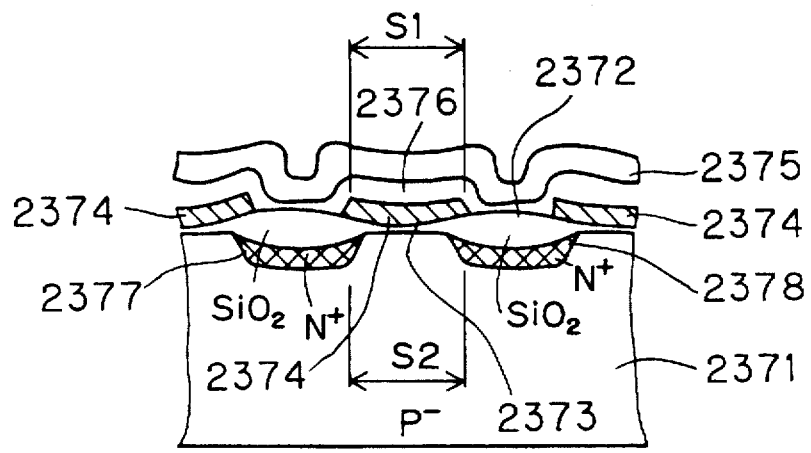
Figure 171:
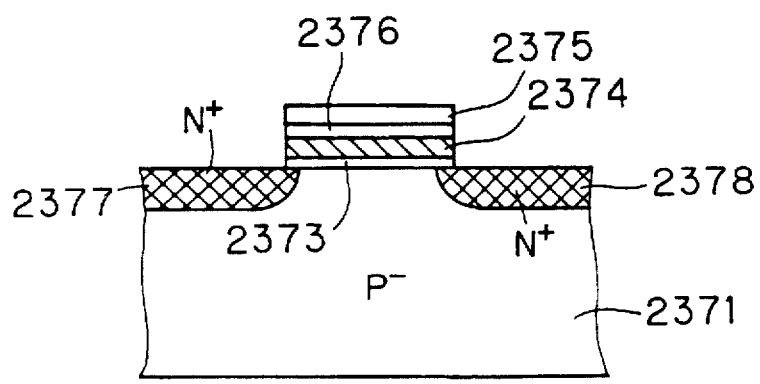
Figure 172:
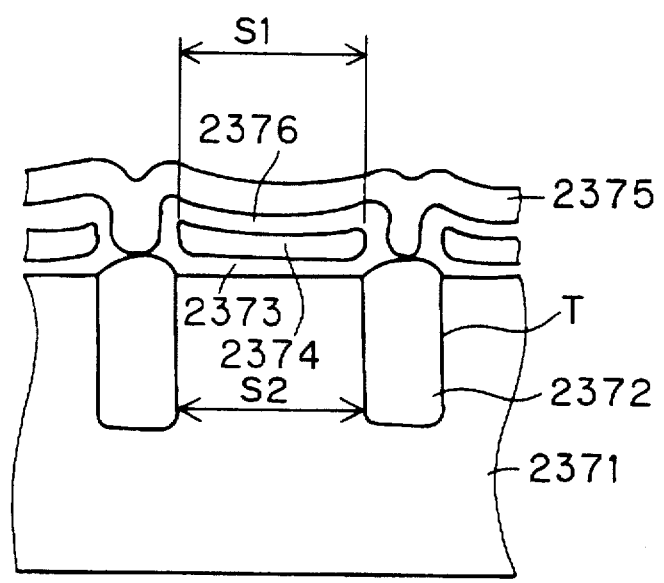
Figure 173:
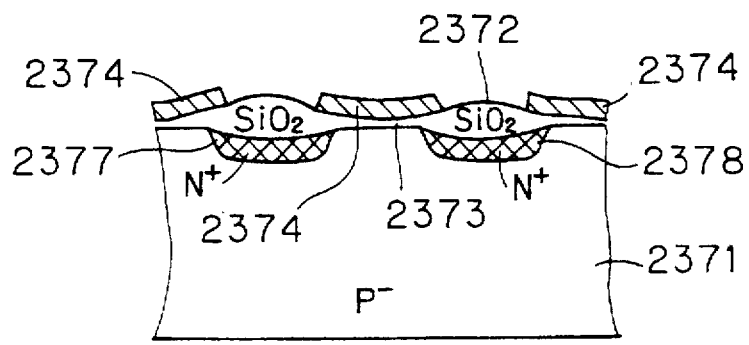
Figure 174:
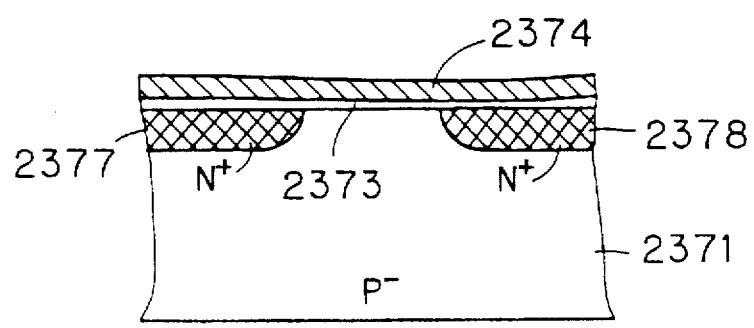
Figure 175:
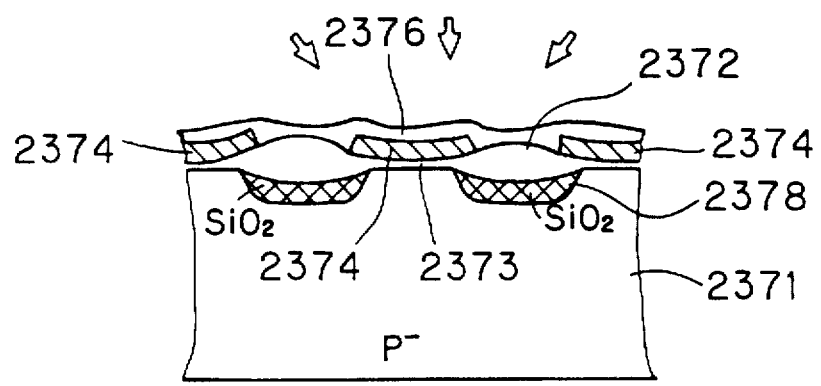
Figure 176:
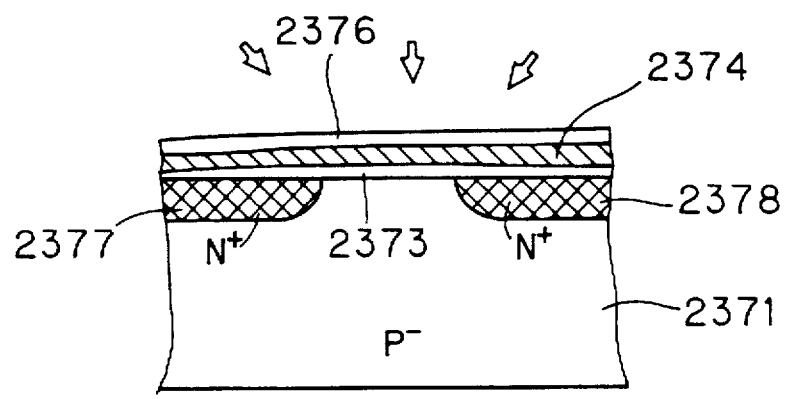
Figure 177:
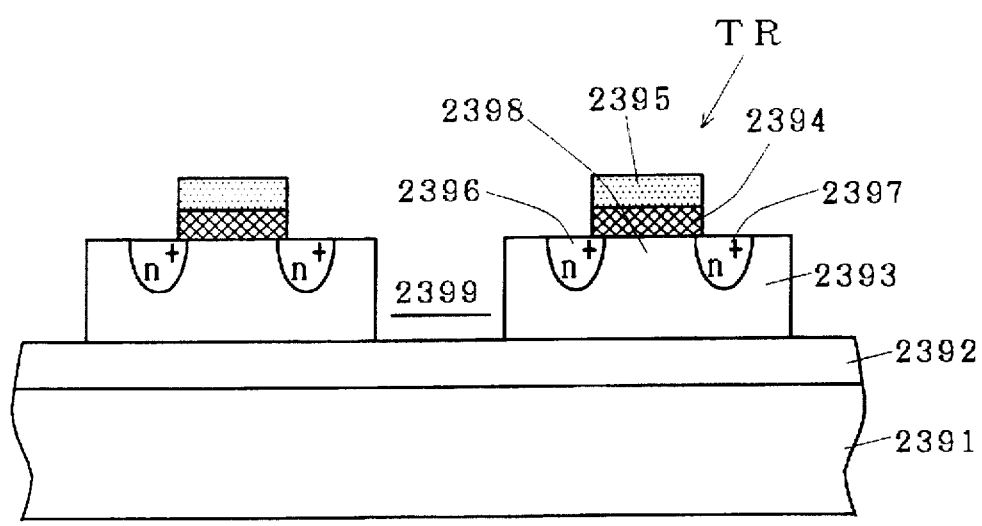
Figure 178:
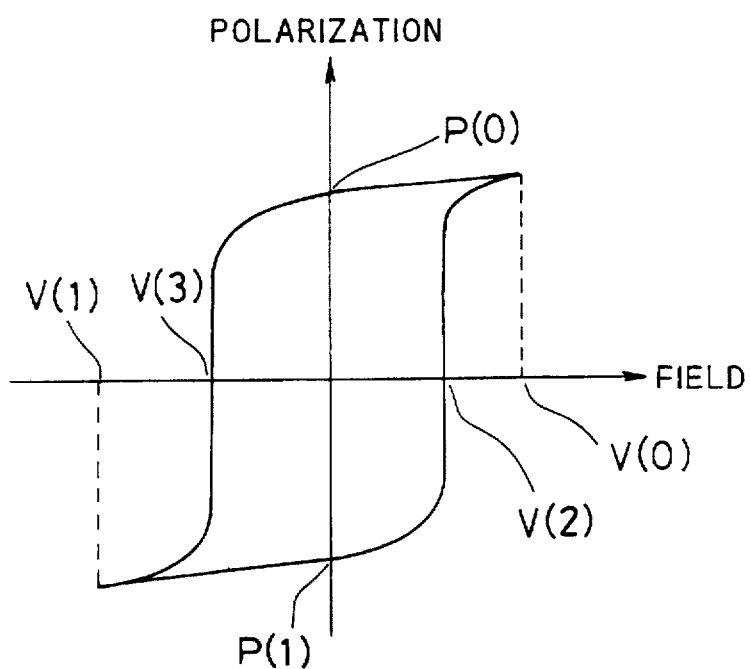
Figure 179:
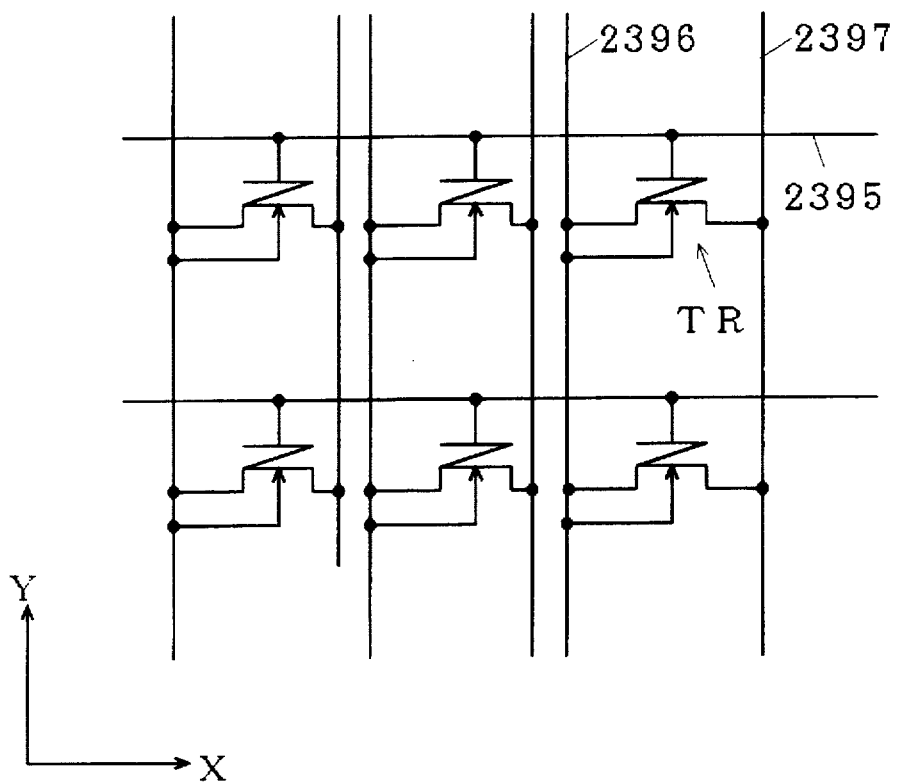
Figure 180:
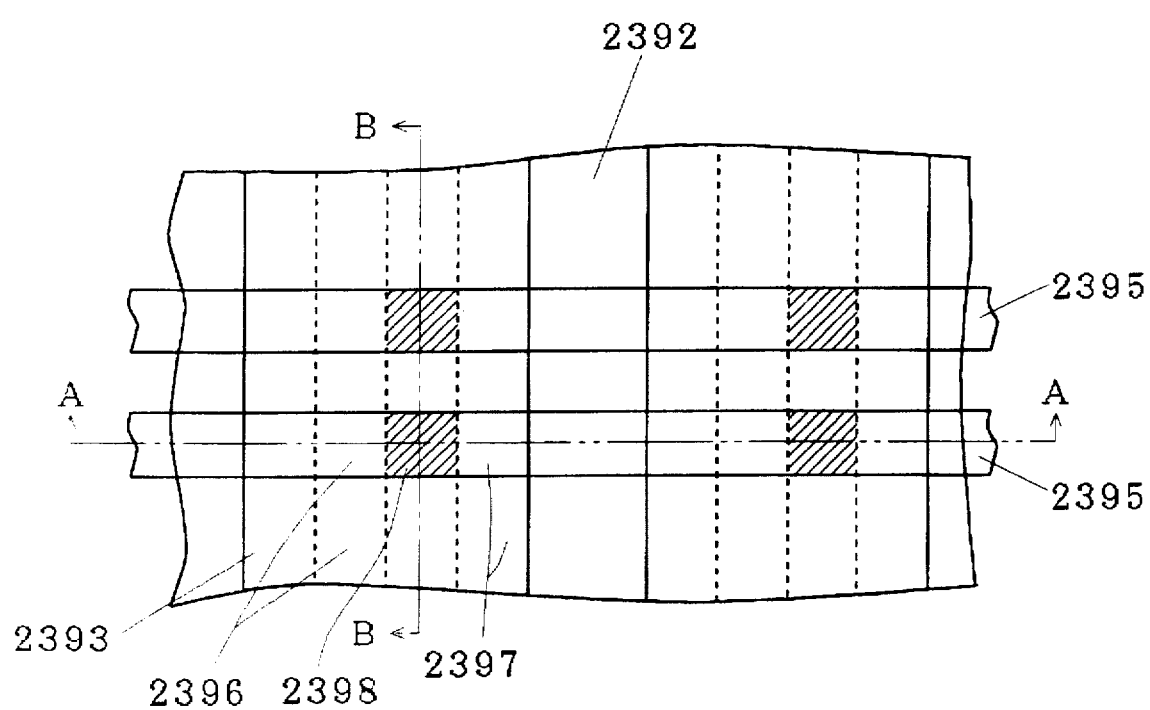
Figure 181:
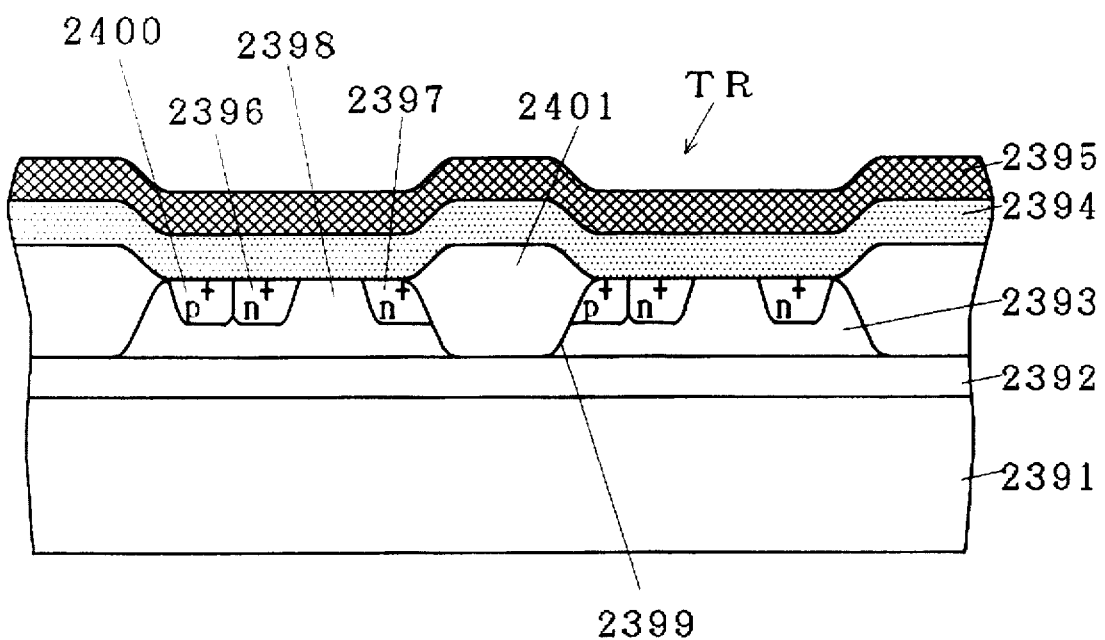
Figure 182:
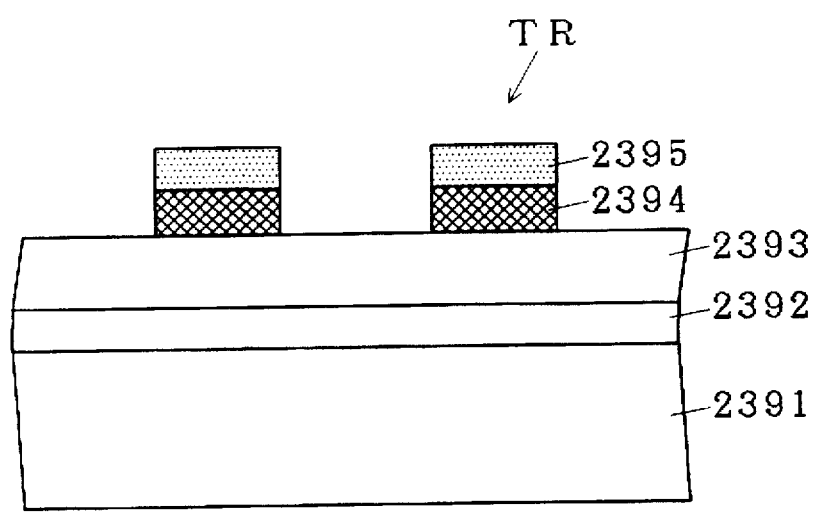
Figure 183:
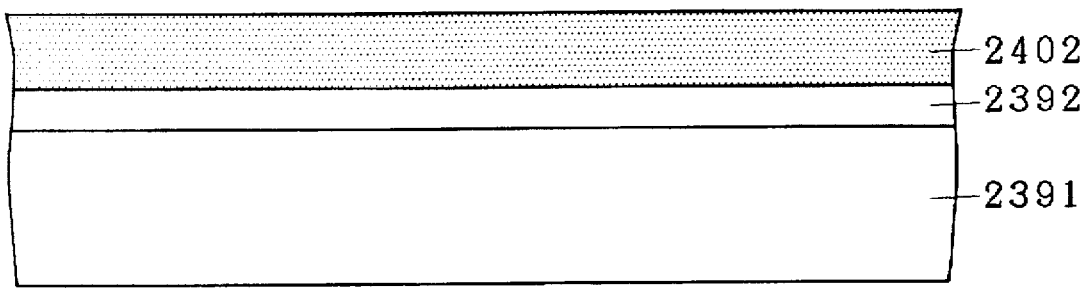
Figure 184:
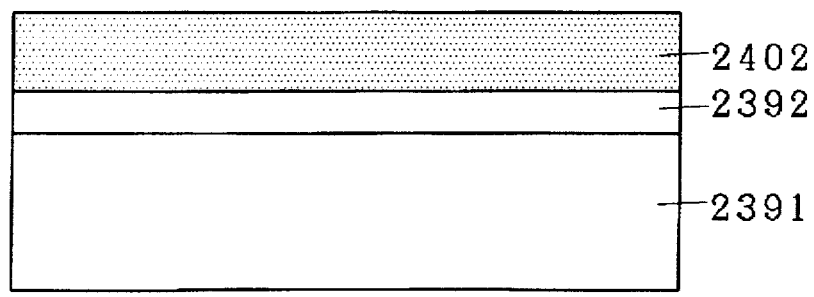
Figure 185:
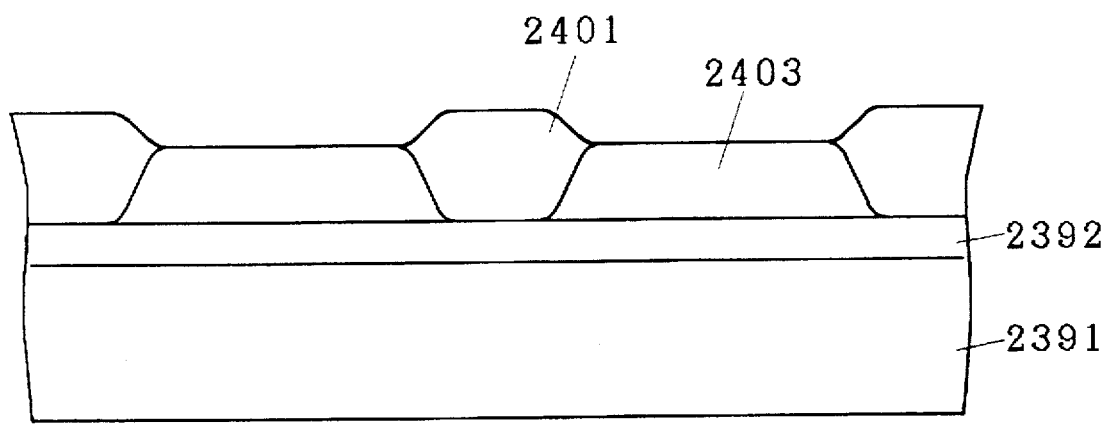
Figure 186:
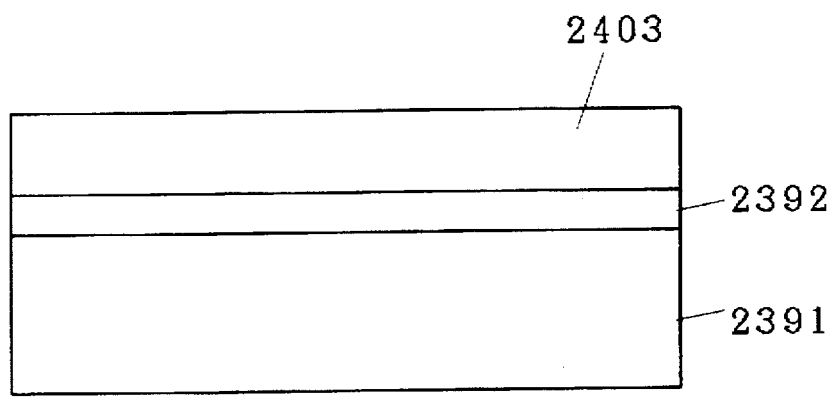
Figure 187:
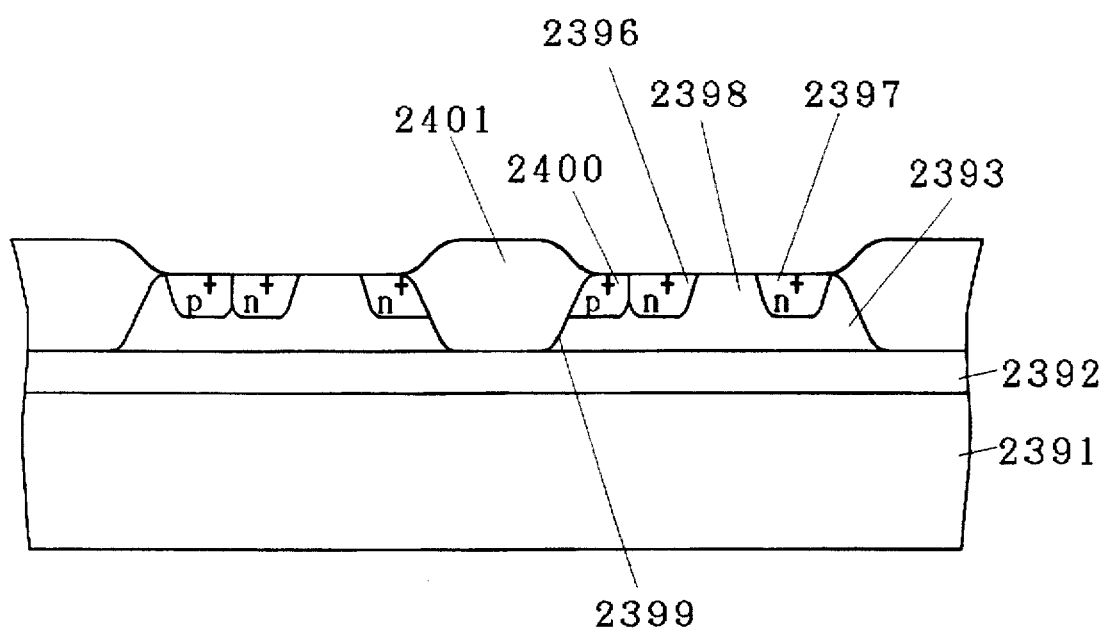
Figure 188:
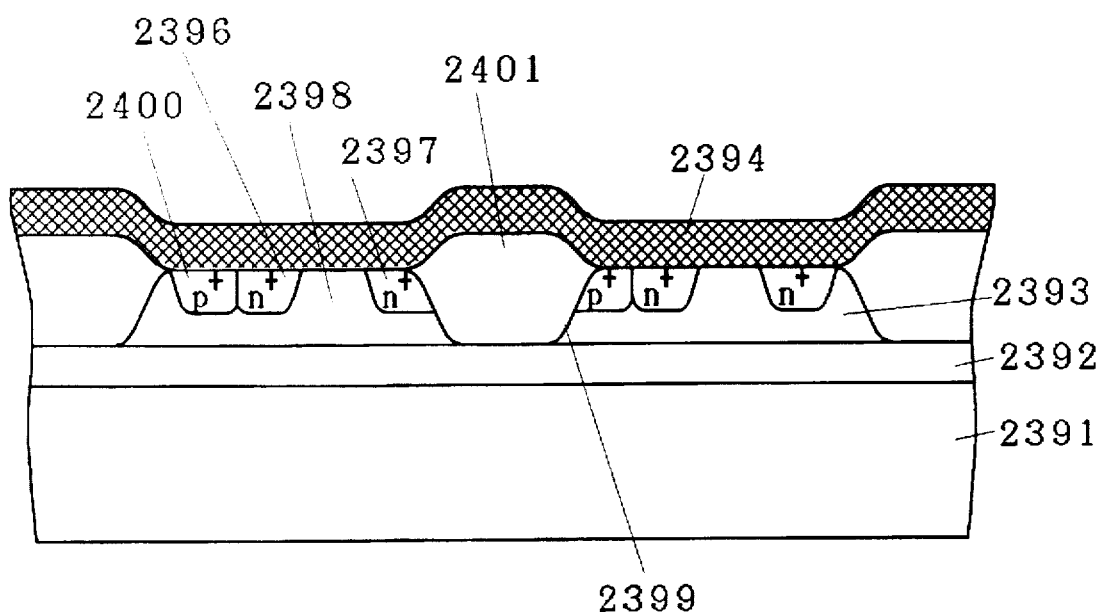
Figure 189:
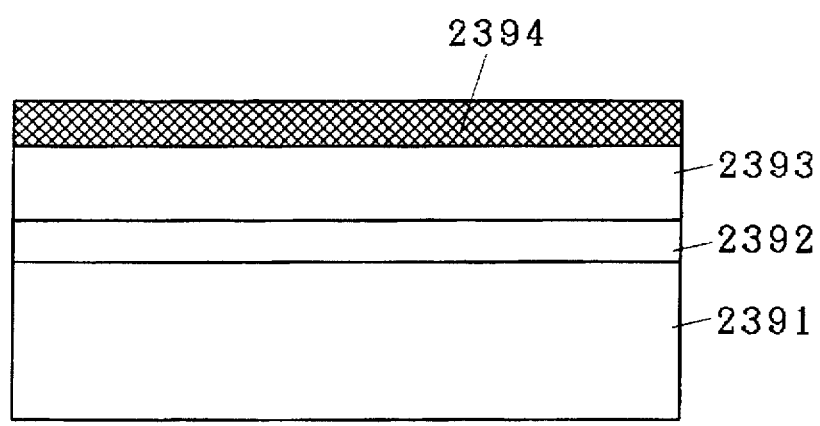
Figure 190:
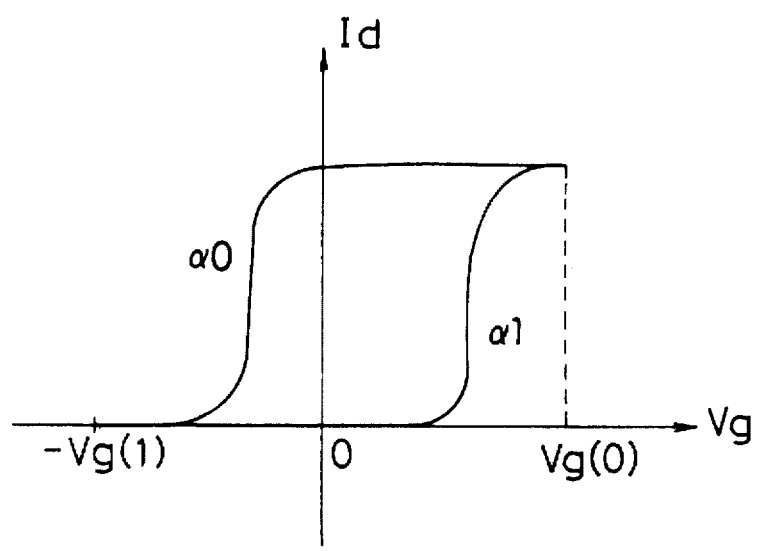
Figure 191:
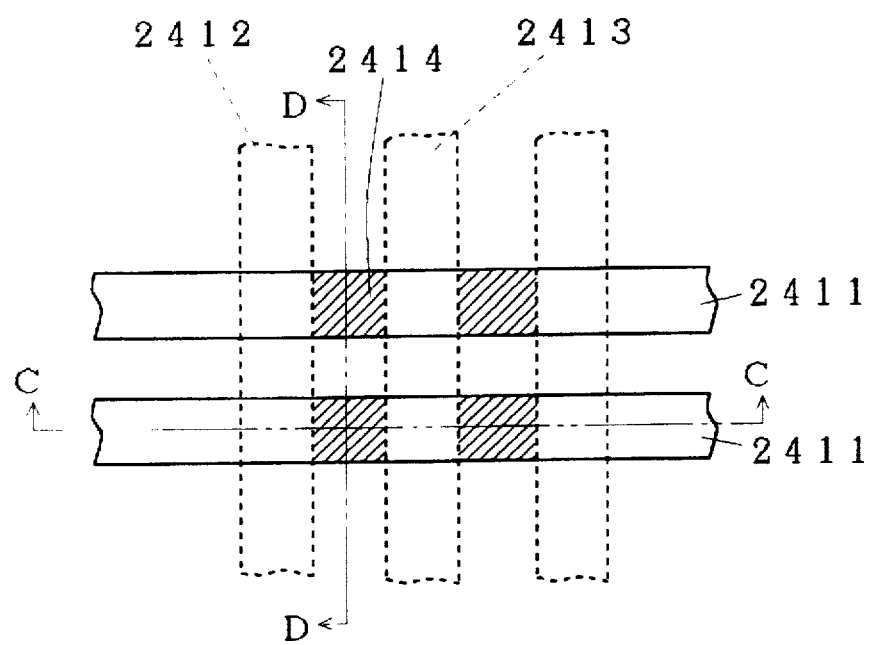
Figure 192:
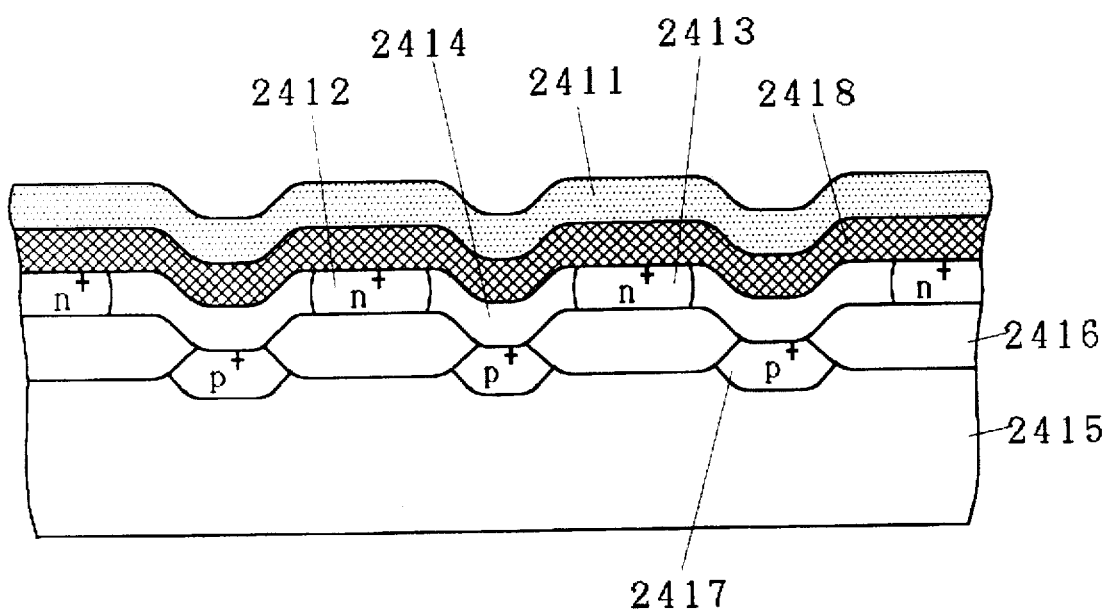
Figure 193:
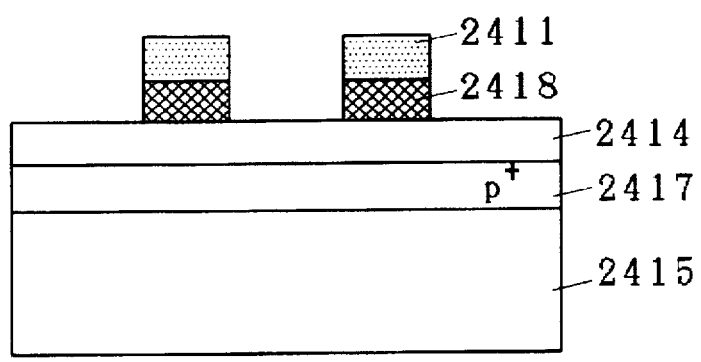
Figure 194:
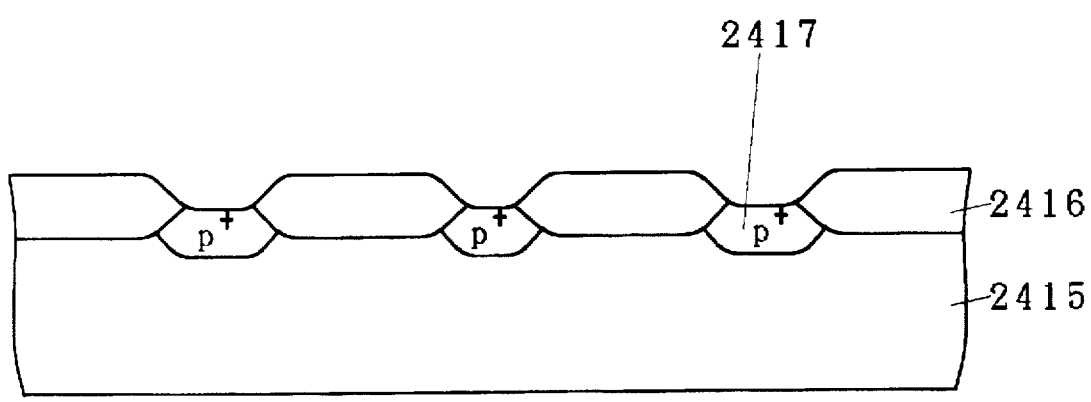
Figure 196:
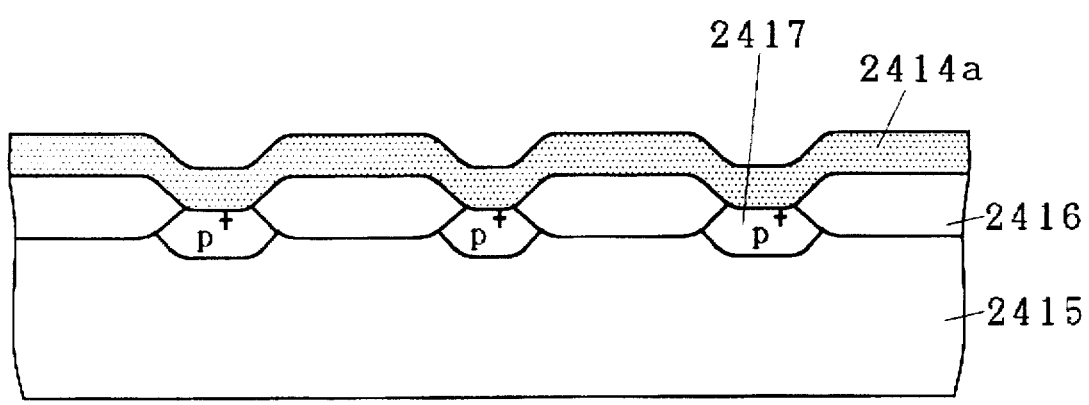
Figure 197:
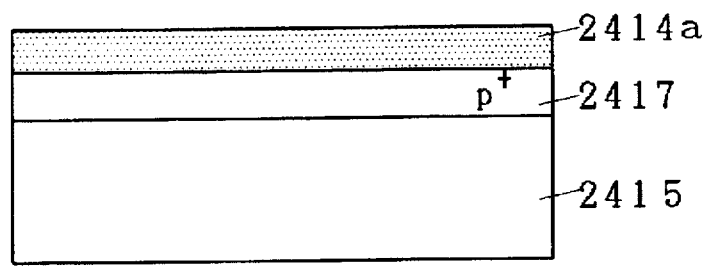
Figure 198:
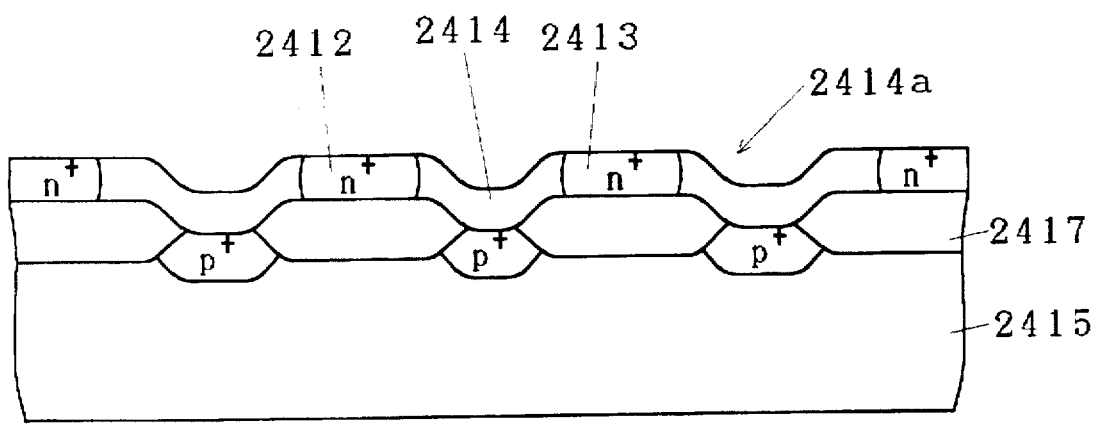
Figure 199:
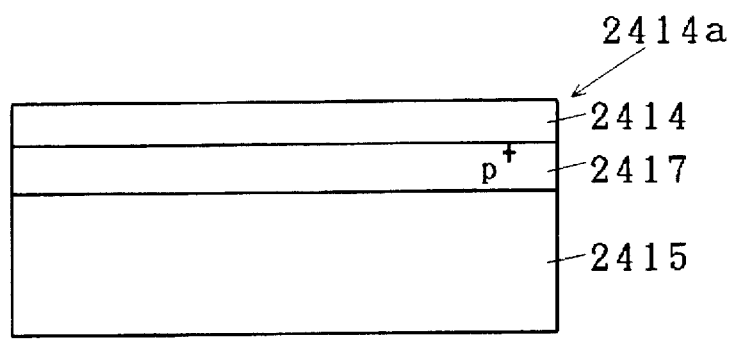
Figure 200:
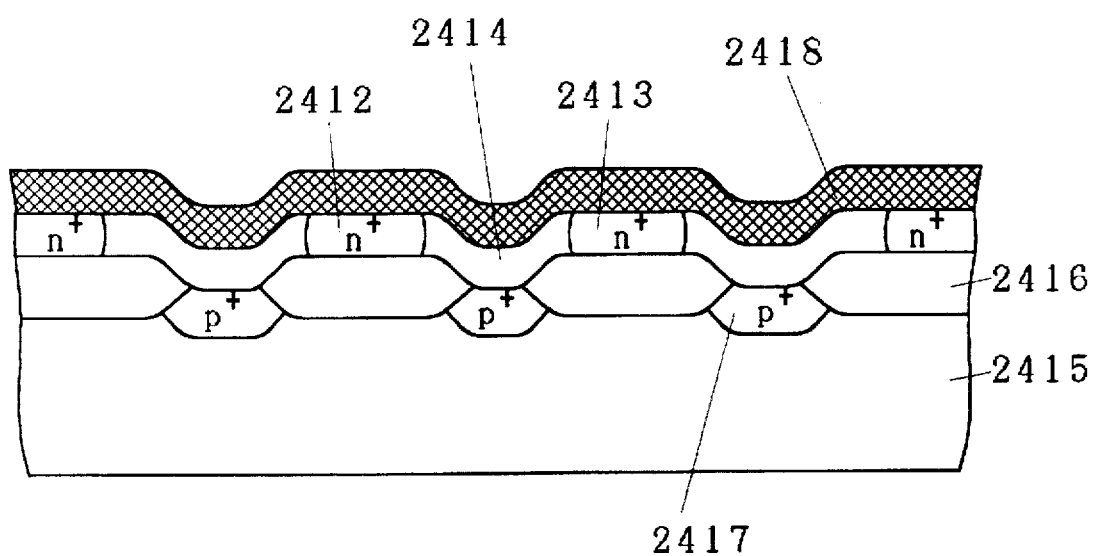
Figure 201:
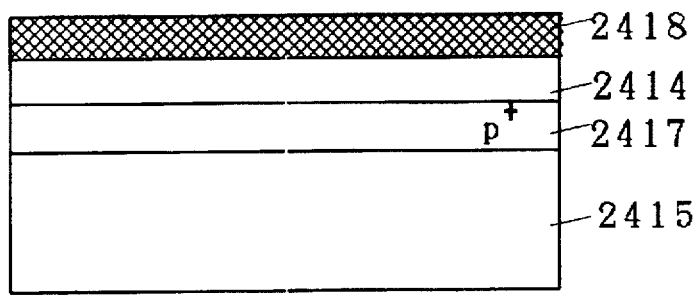
Figure 202:
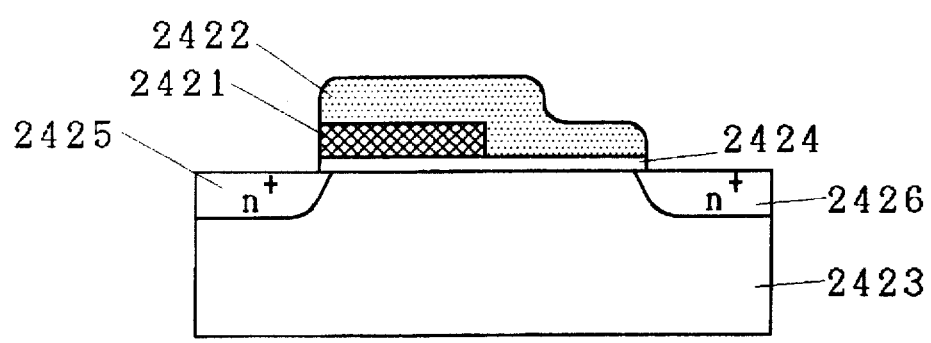
Figure 203:
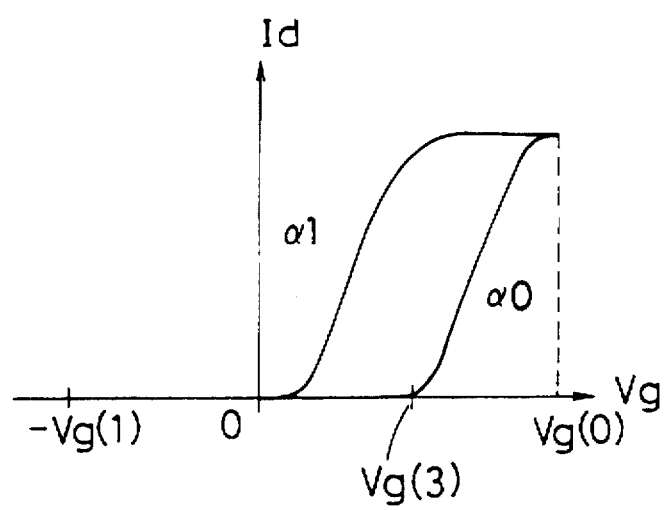
Figure 204:
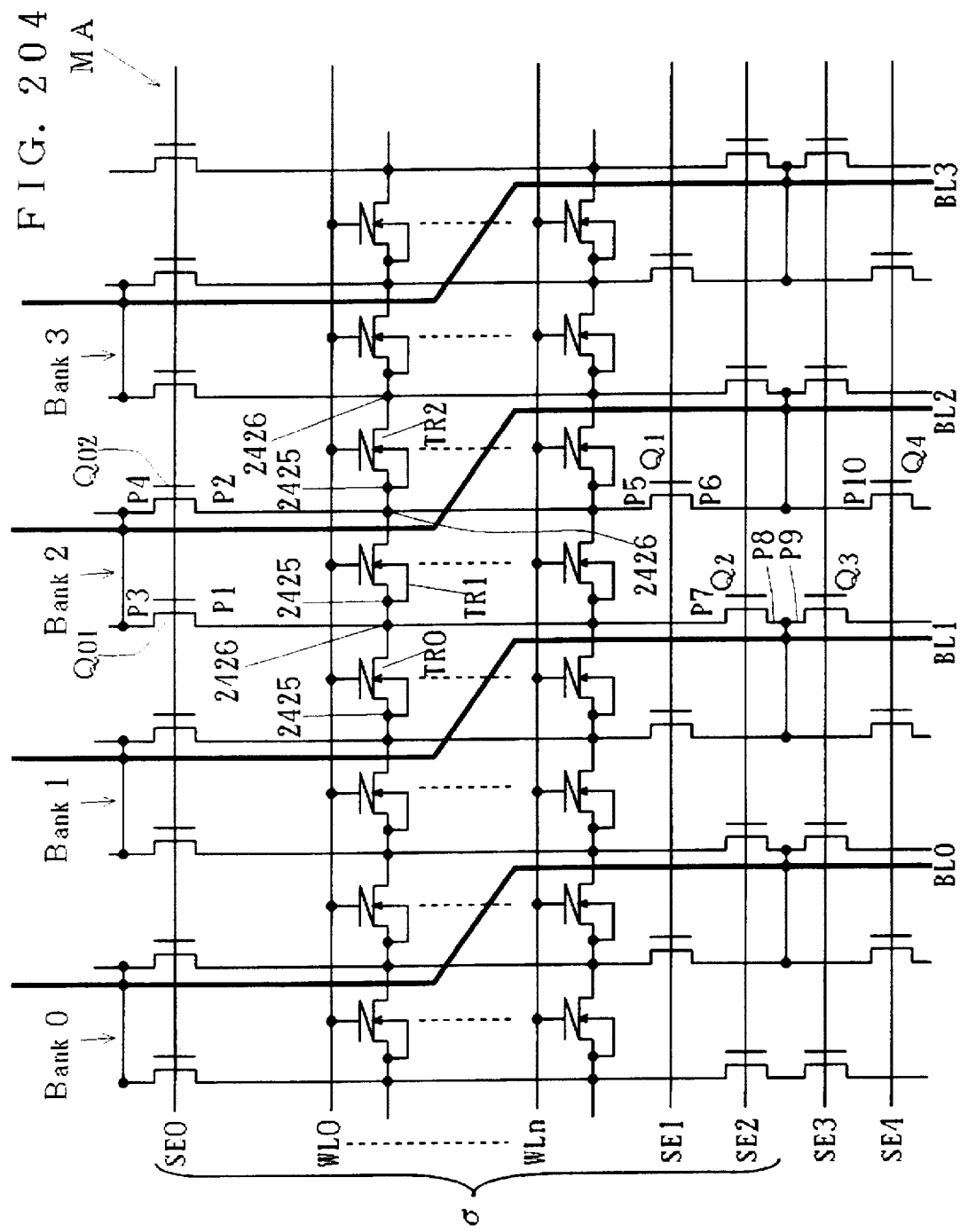
Figure 205:
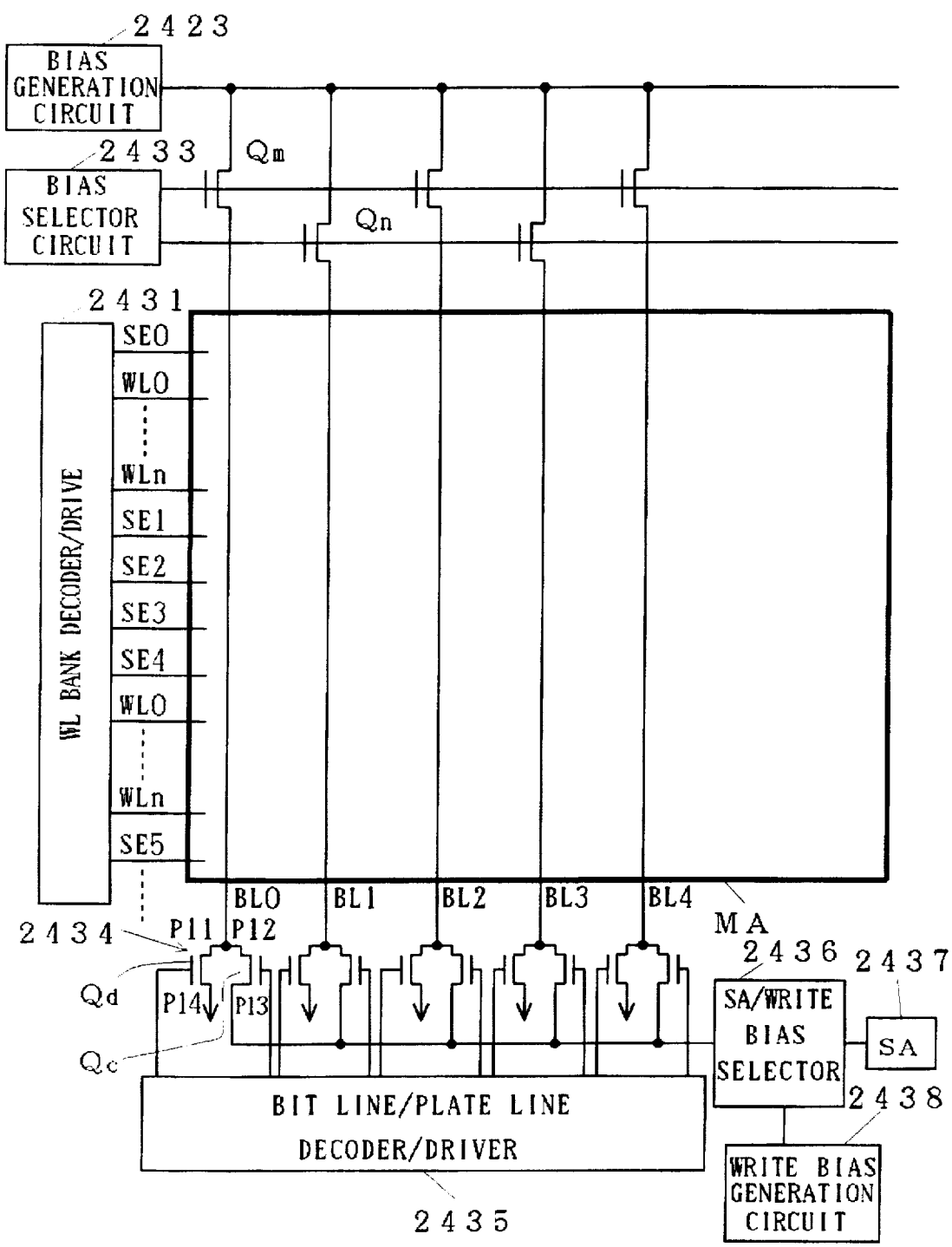
Figure 206:
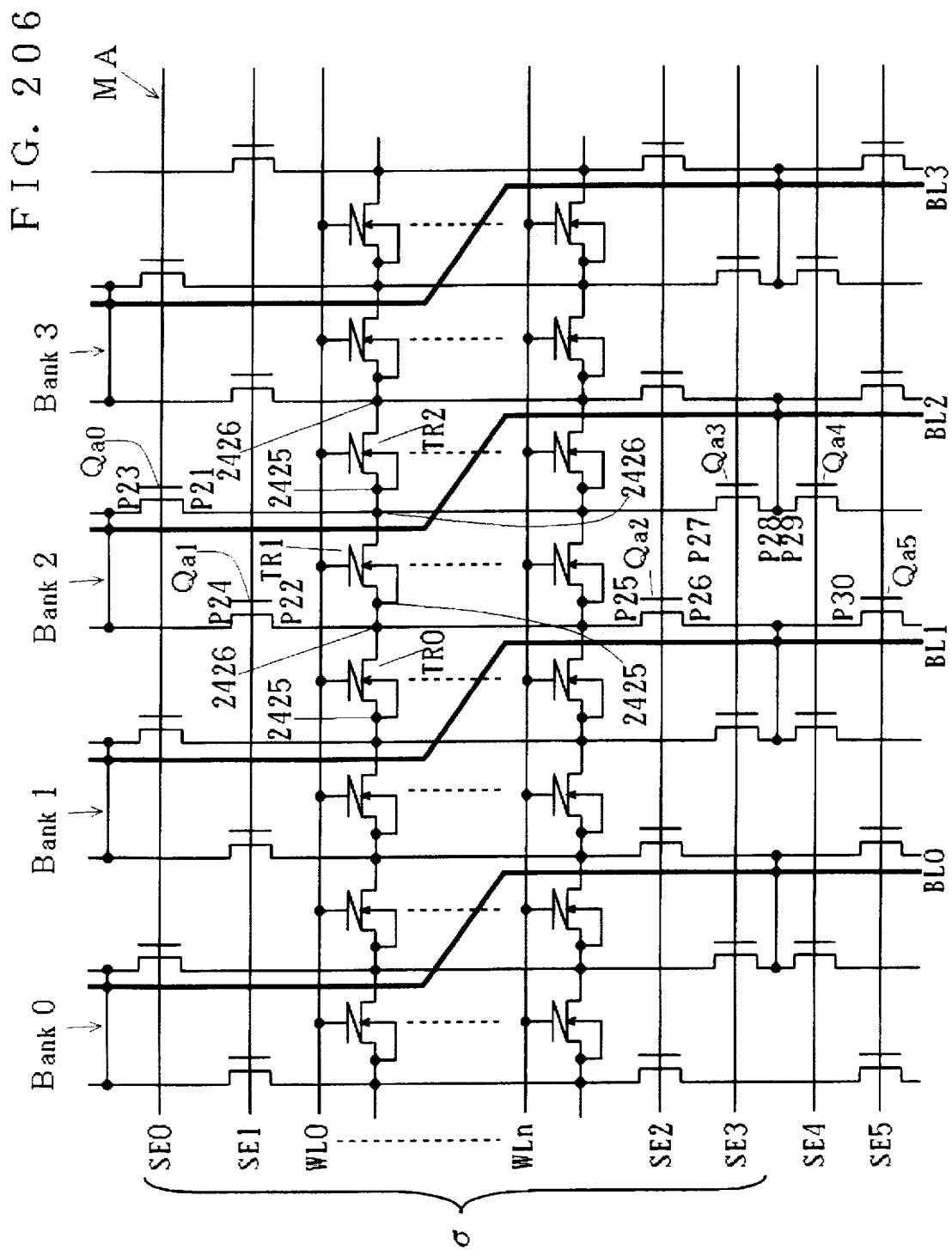
Figure 207:
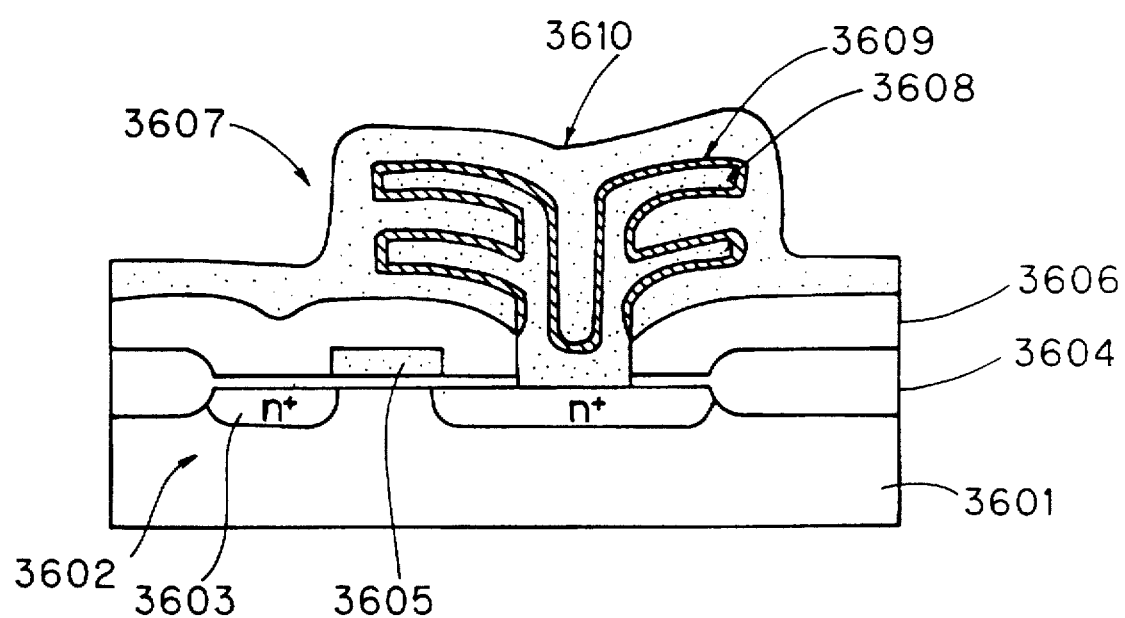
Figure 208:
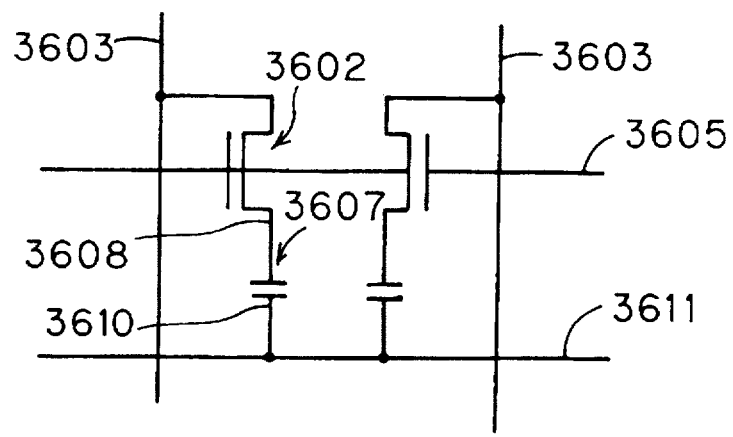
Figure 209:
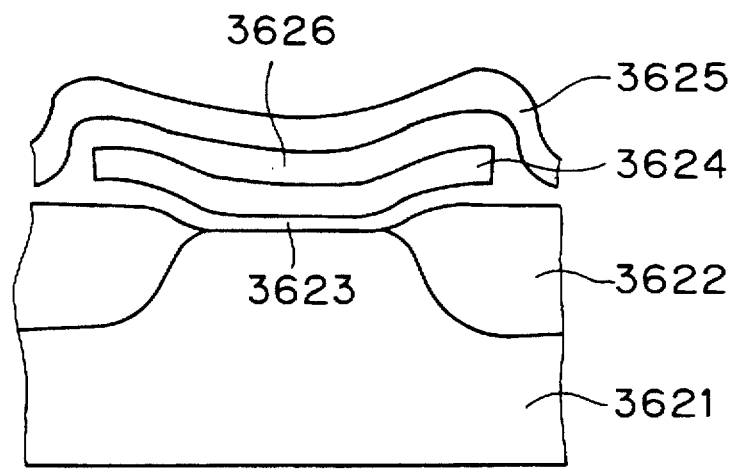
Figure 210:
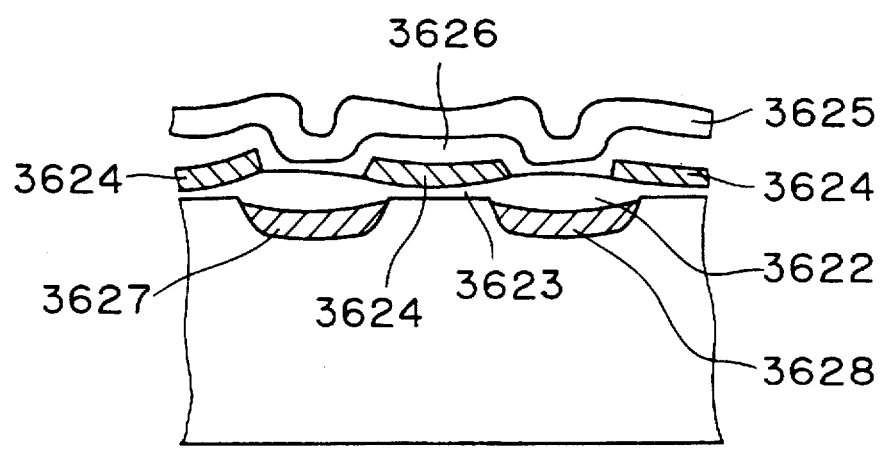
Figure 211:
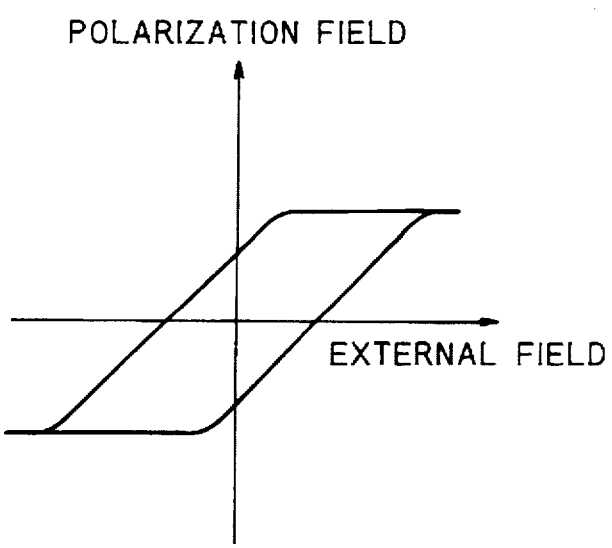
Figure 212:
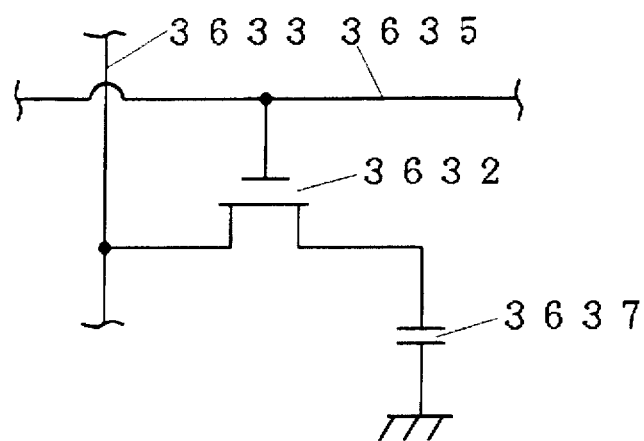
Figure 213:
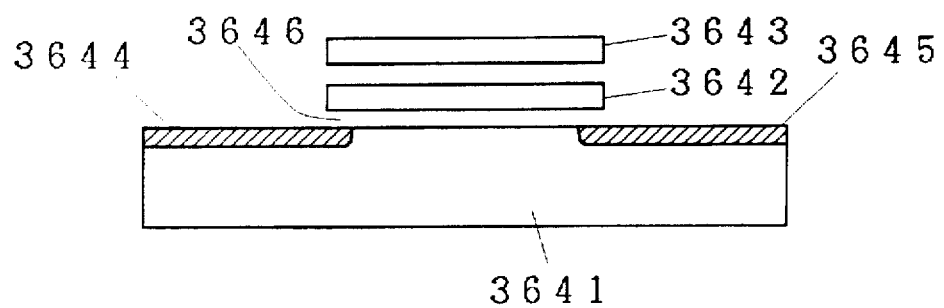
Figure 214:
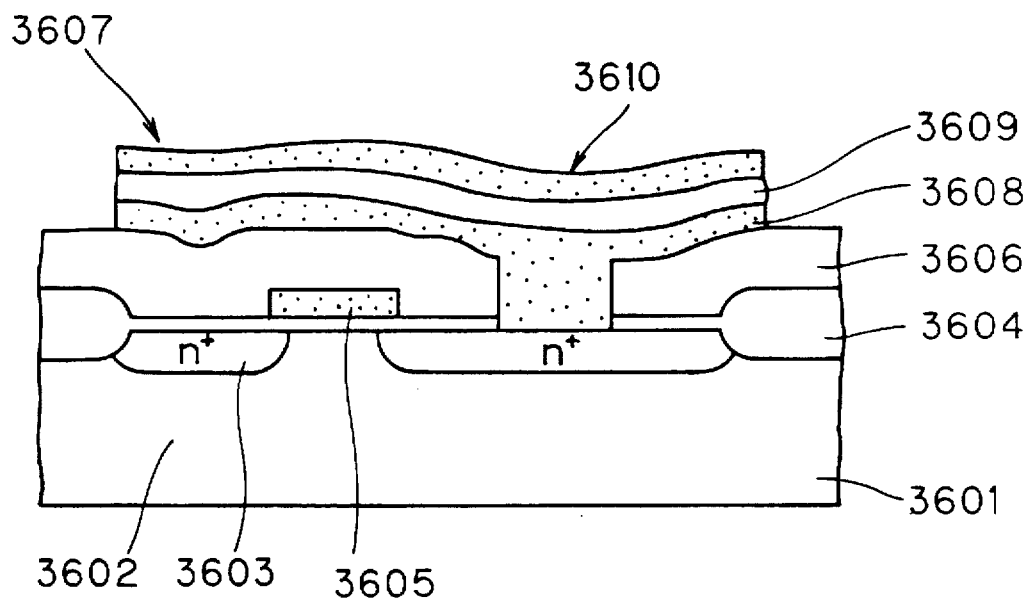
Figure 215:
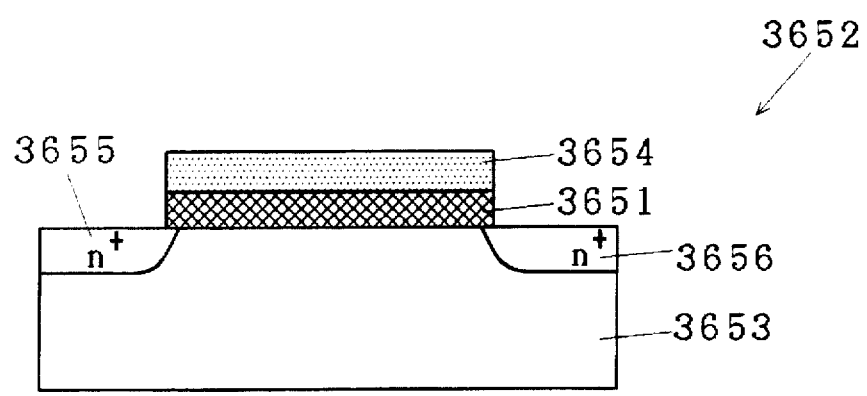
Figure 216:
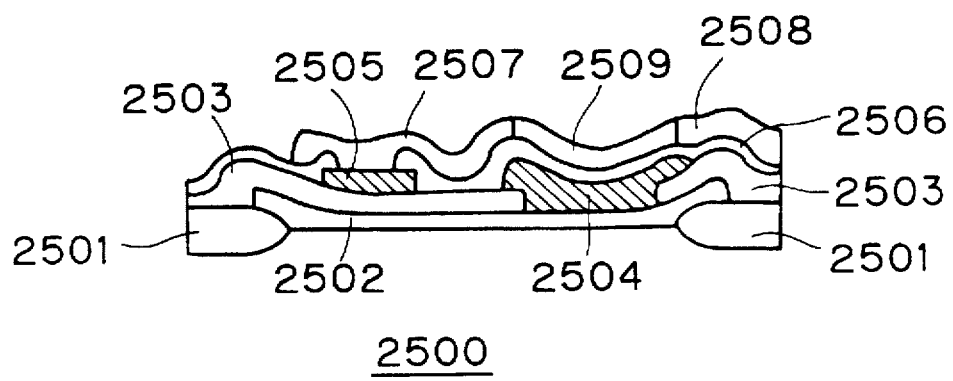
Figure 217:
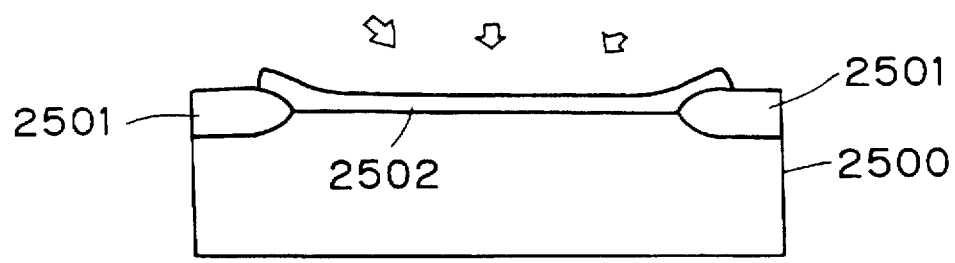
Figure 218:
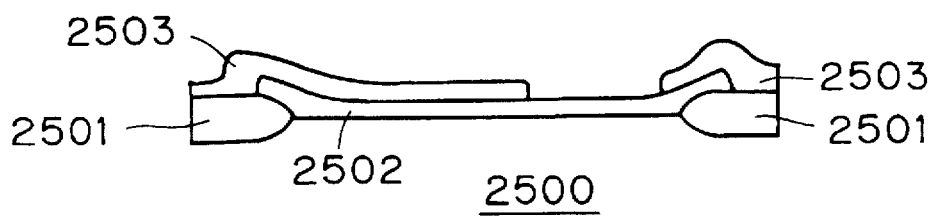
Figure 219:
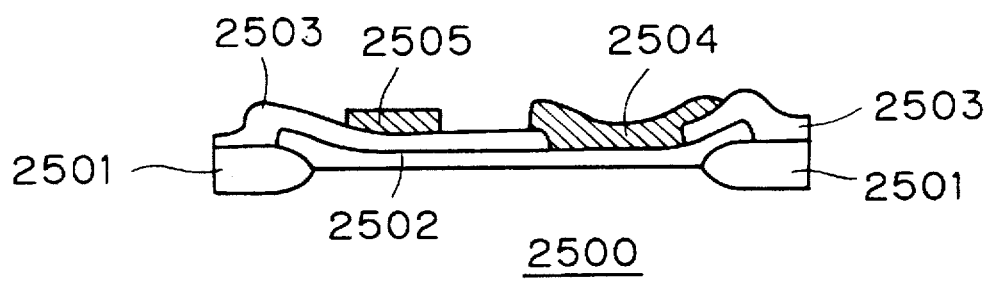
Figure 220:
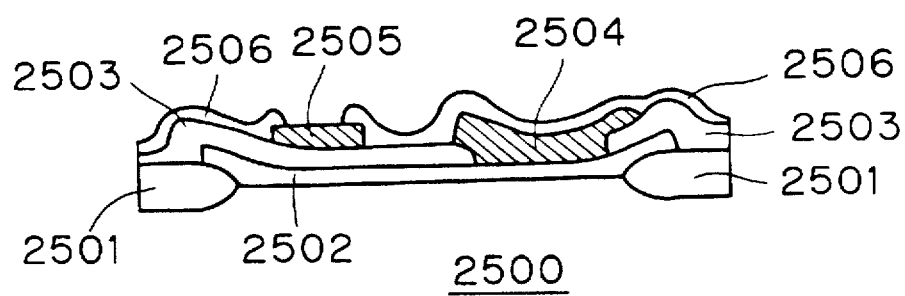
Figure 221:
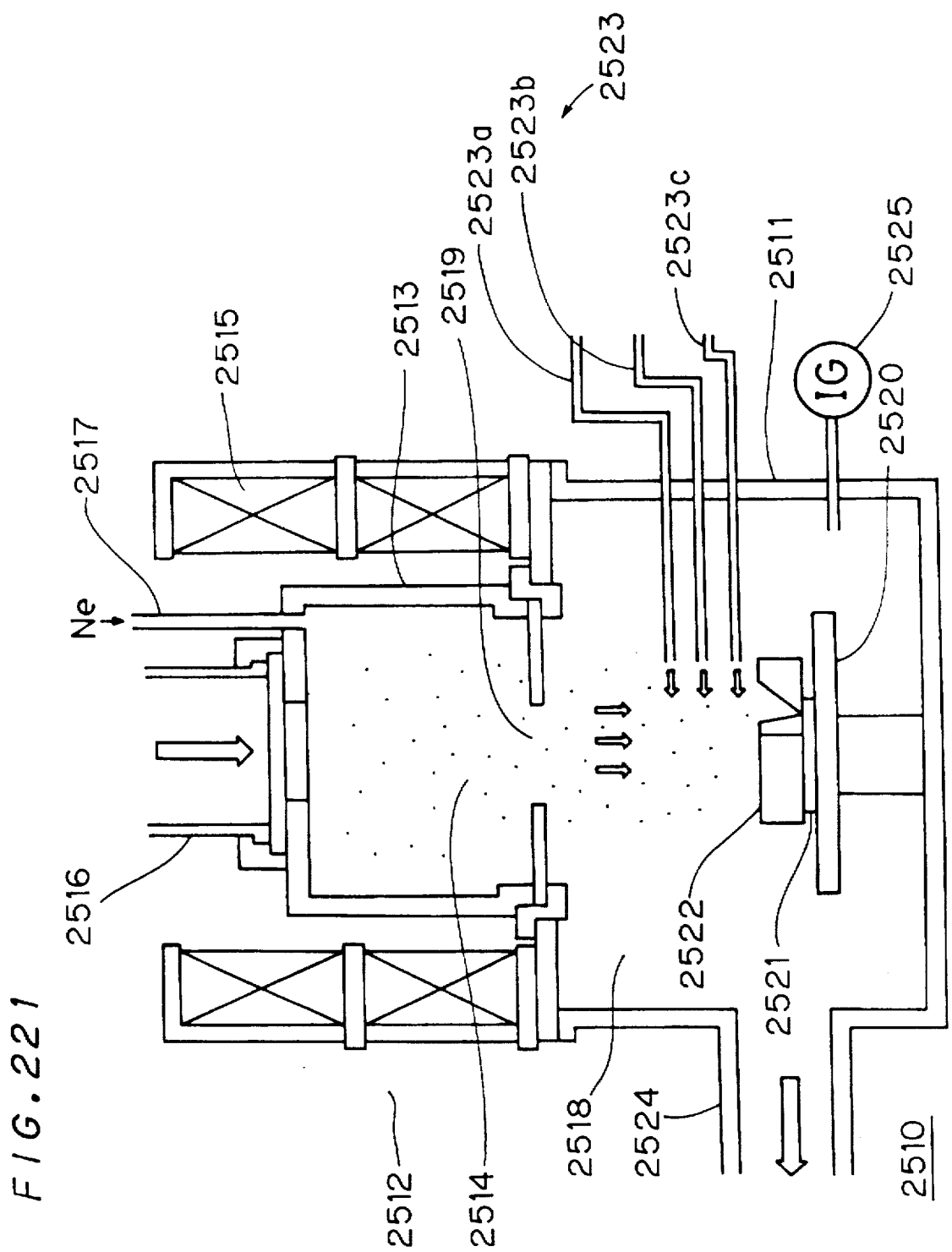
Figure 222:
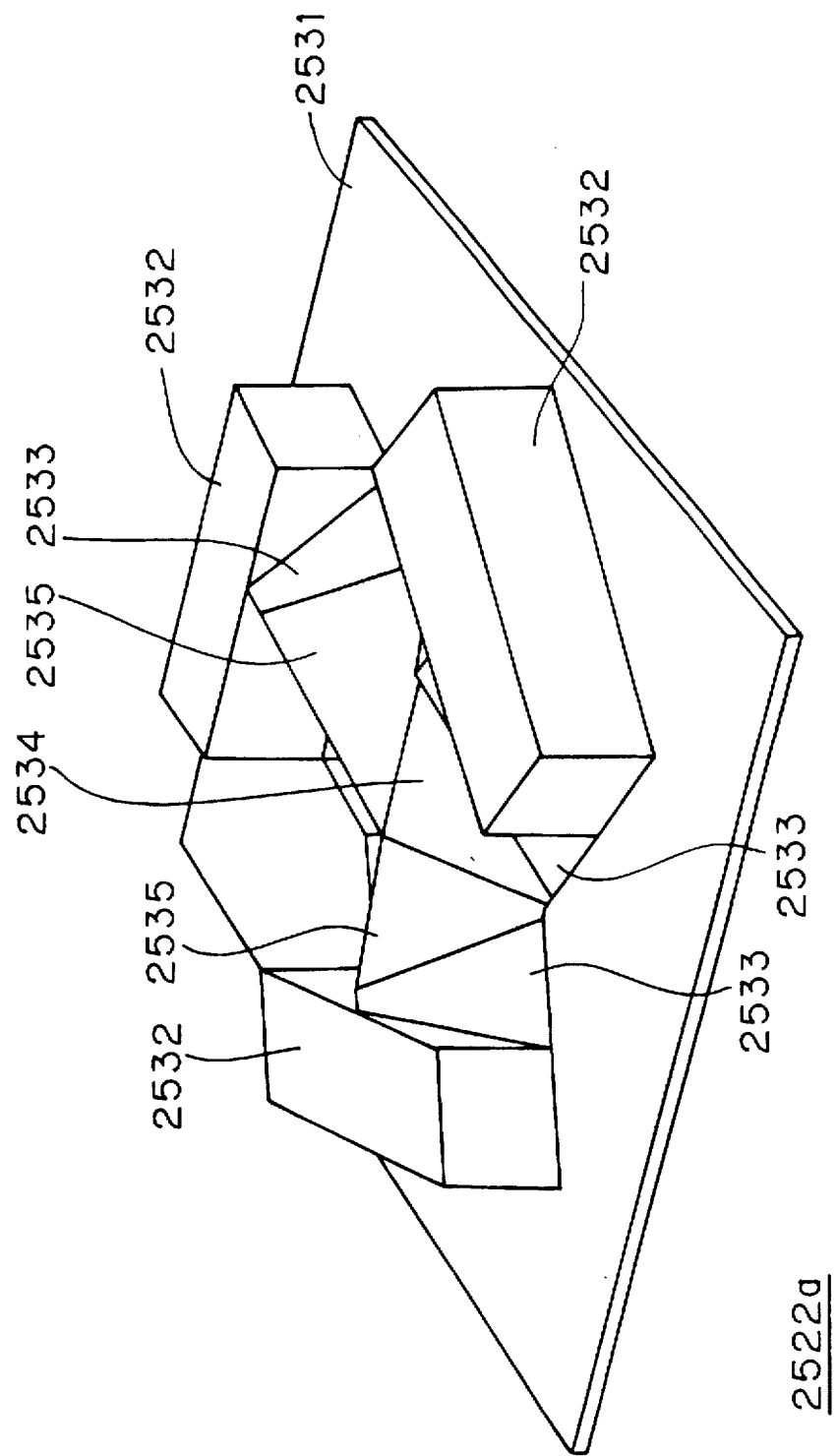
Figure 224:
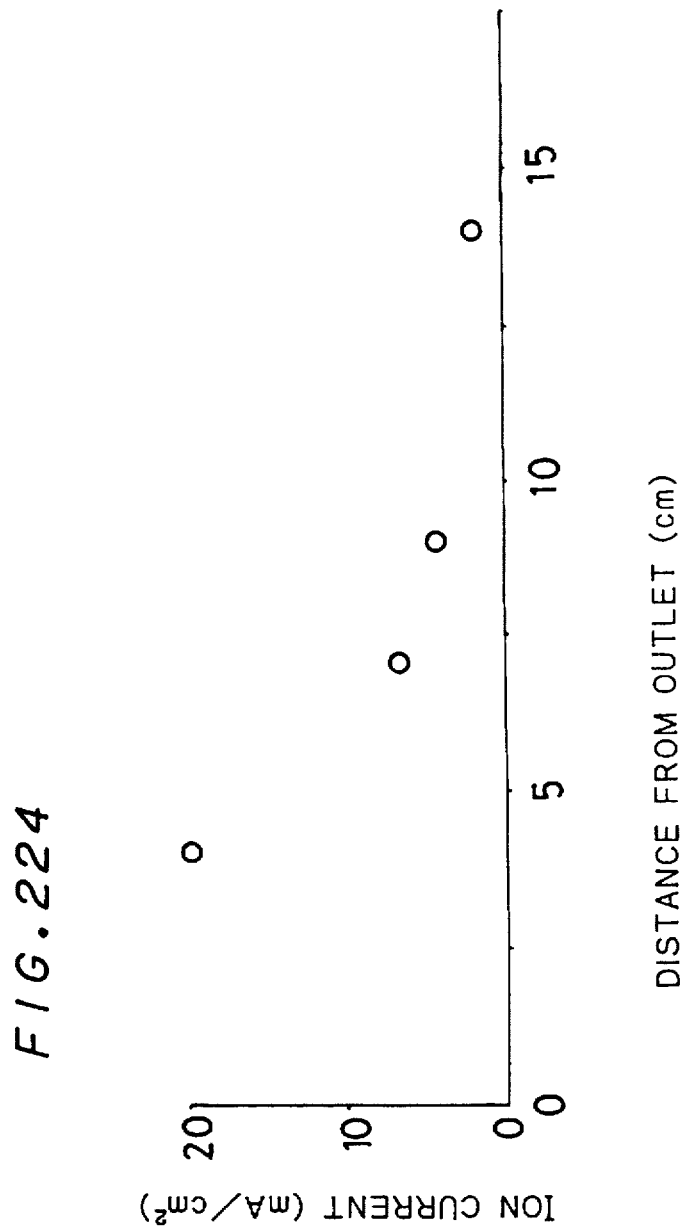
Figure 225:
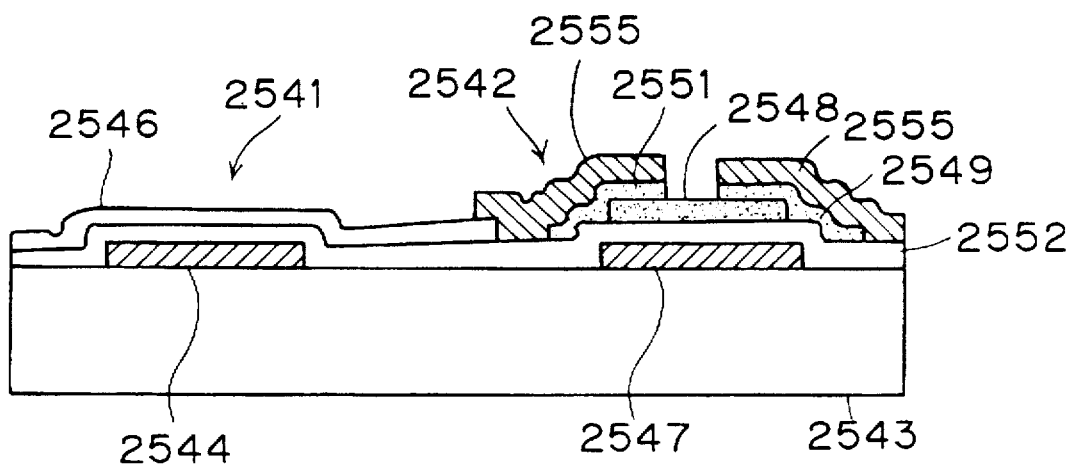
Figure 226:
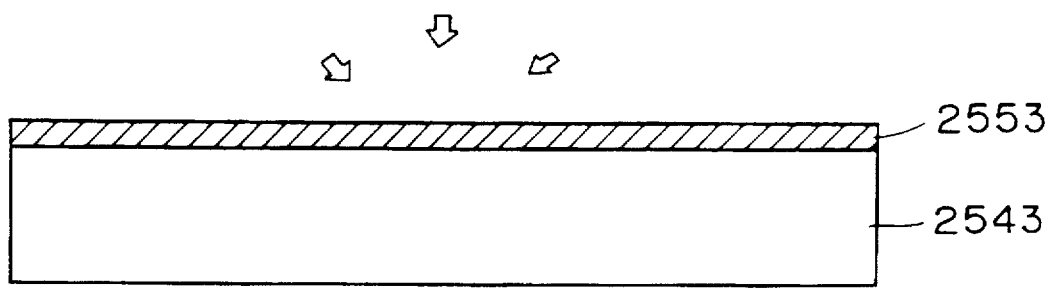
Figure 227:
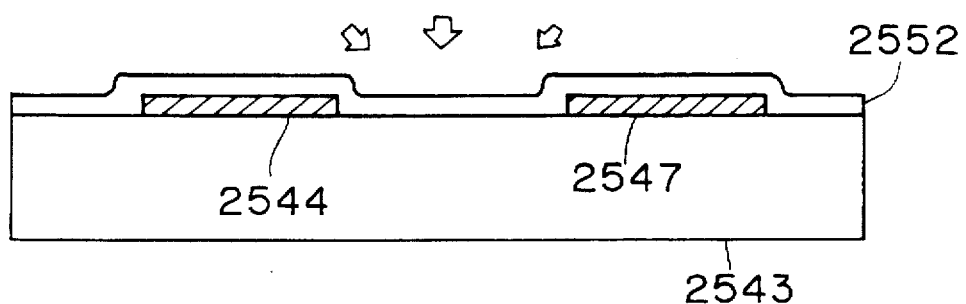
Figure 228:
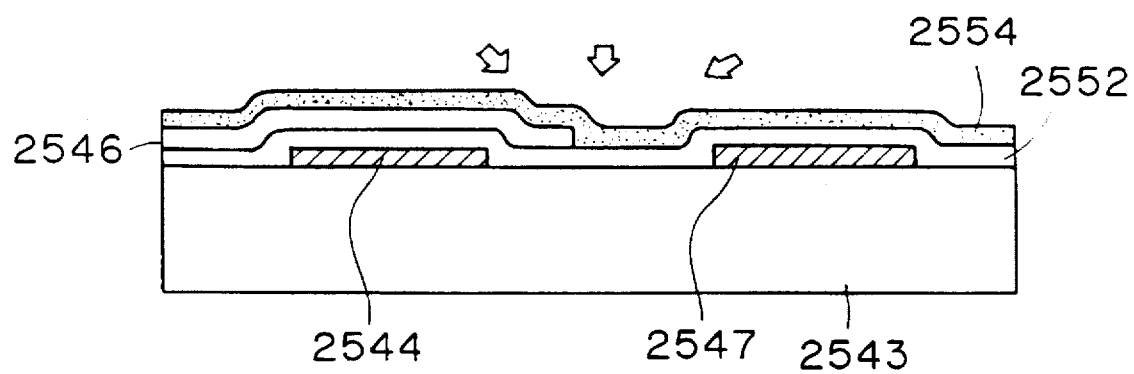
Figure 229:
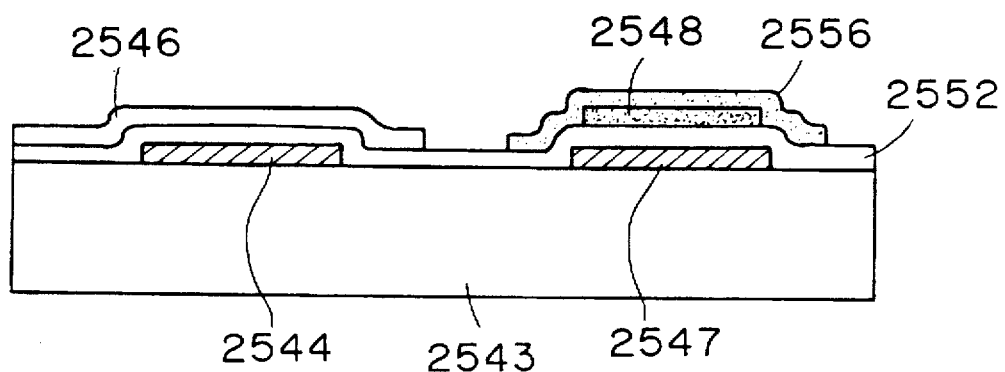
Figure 230:
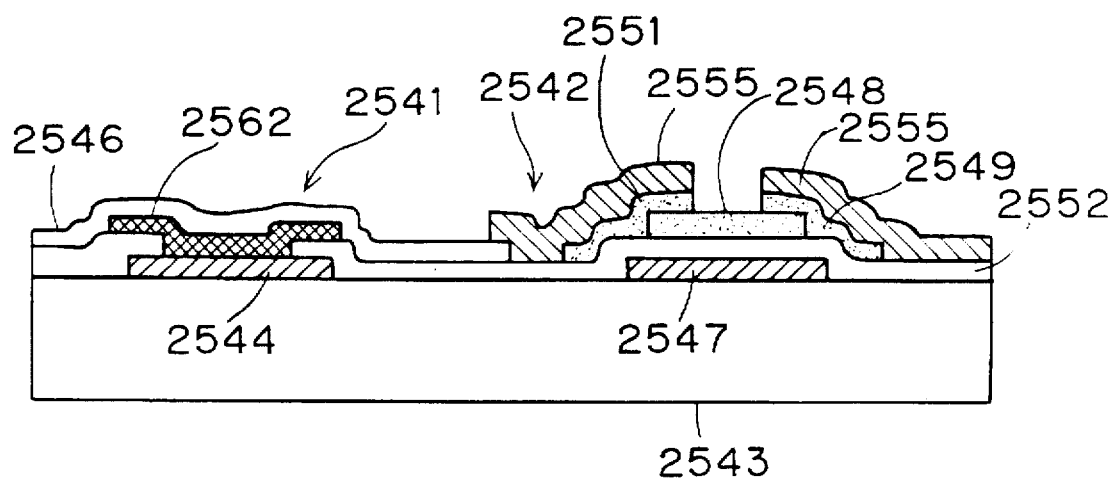
Figure 231:
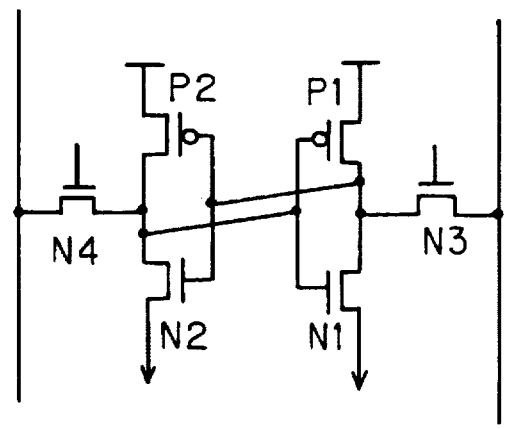
Figure 232:
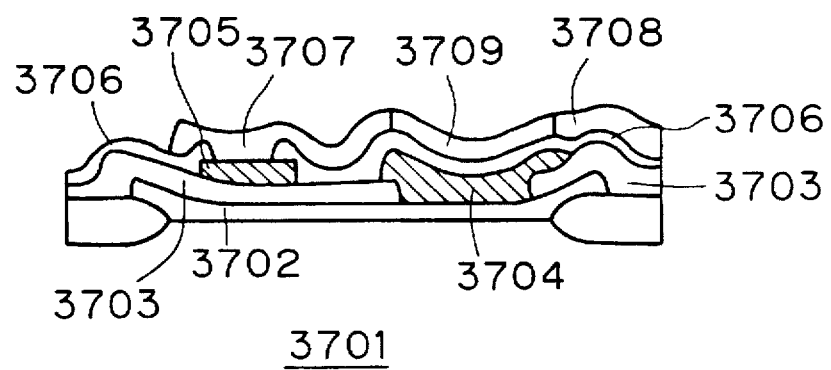
Figure 233:
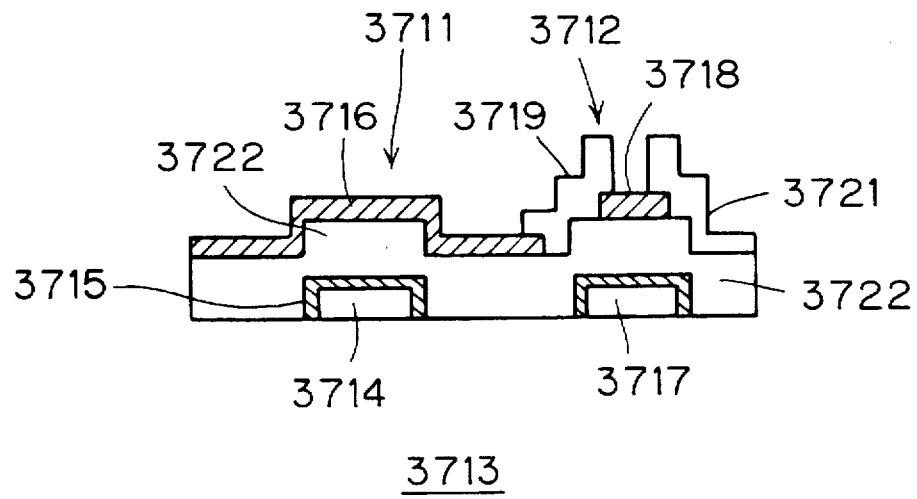
Figure 234:
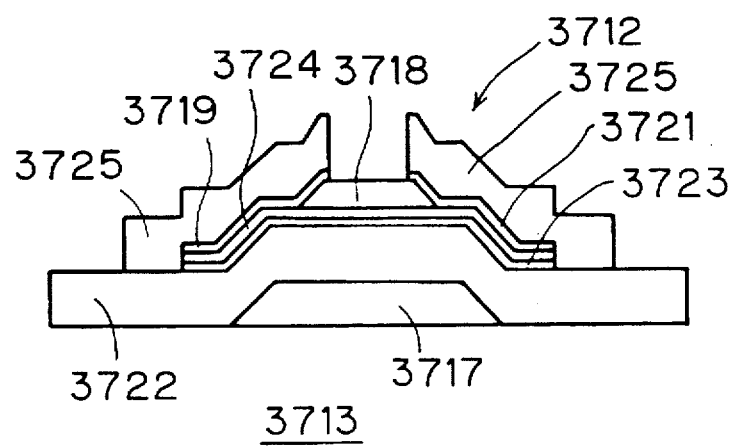
Figure 235:
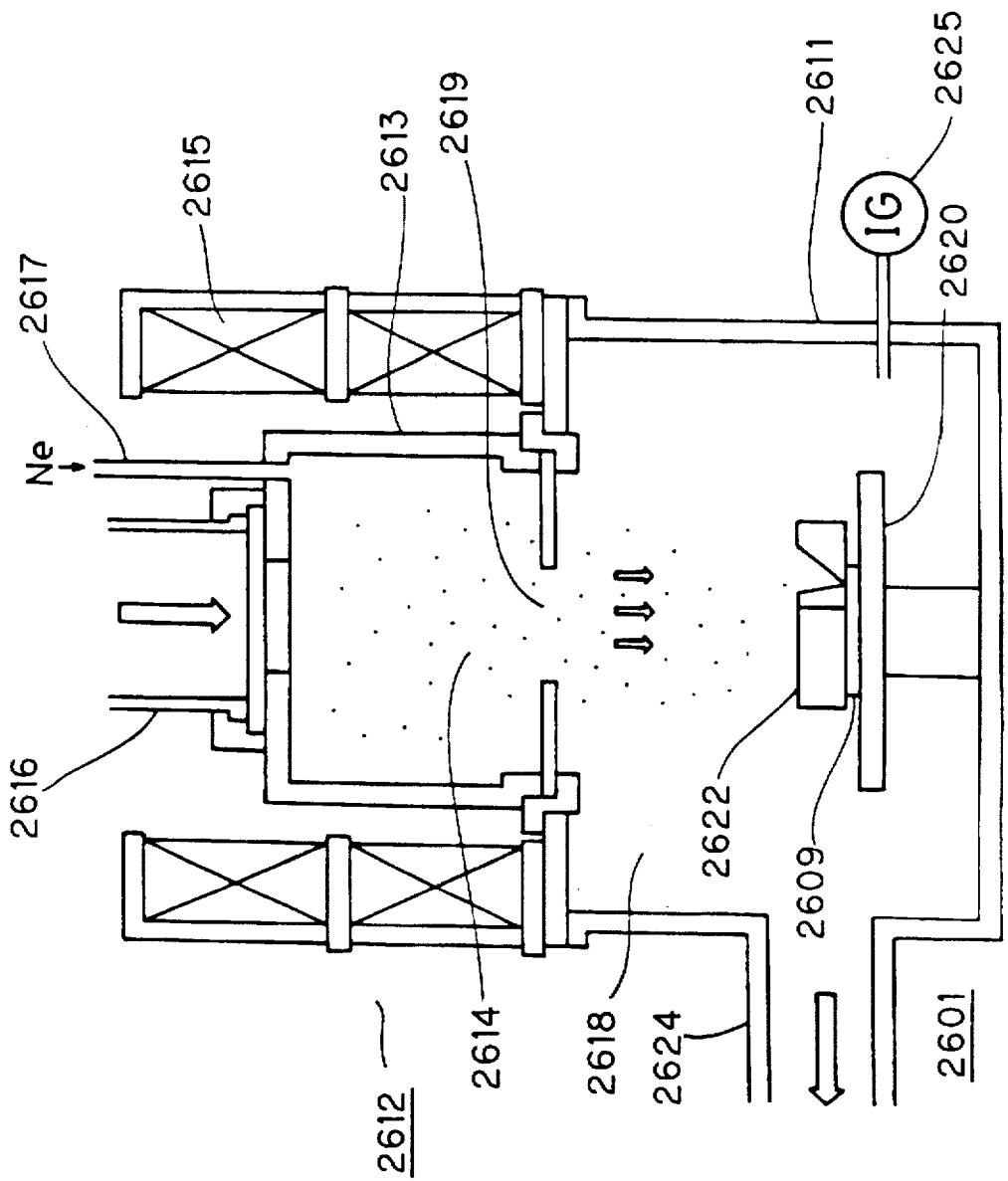
Figure 236:
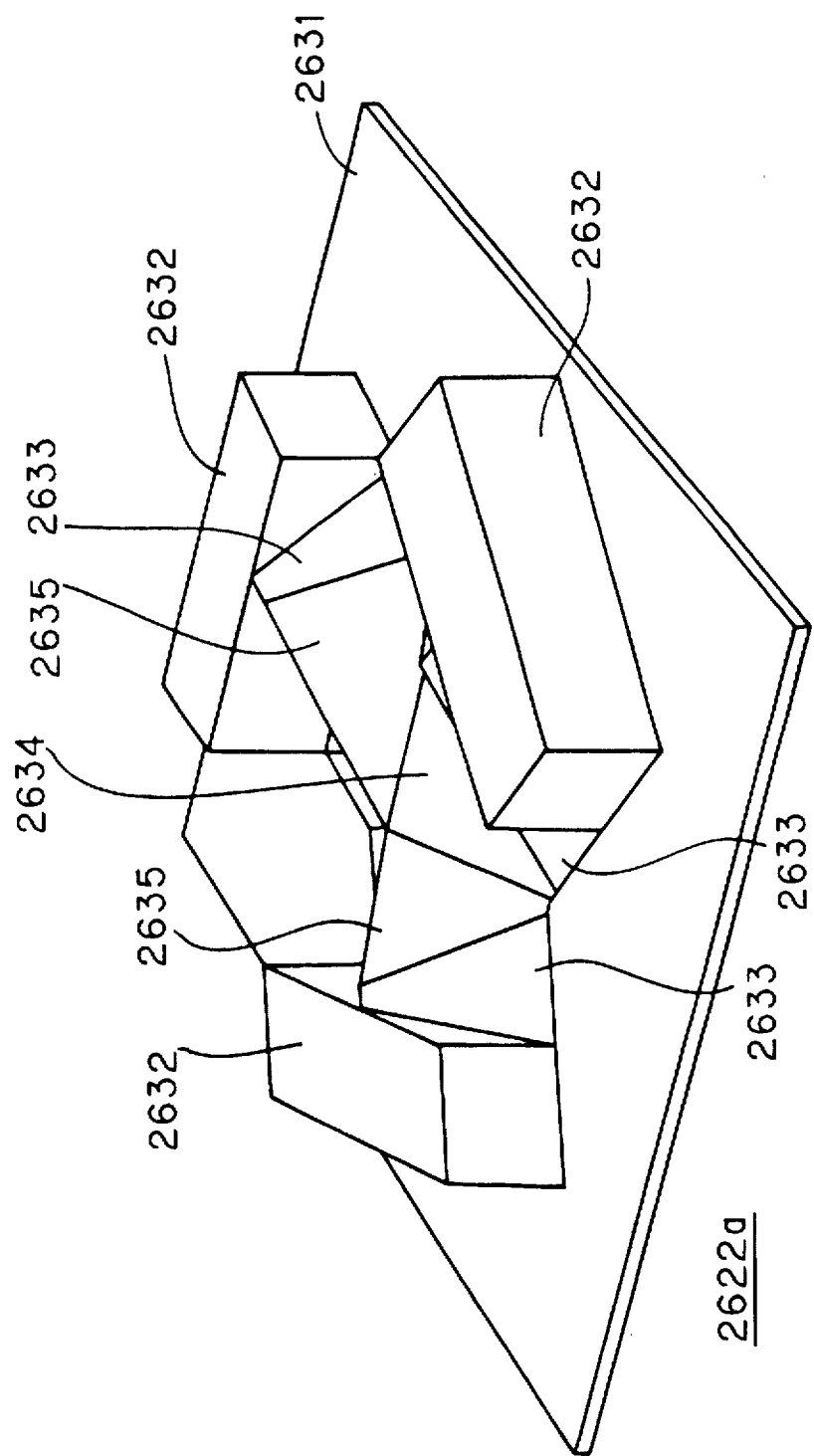
Figure 237:
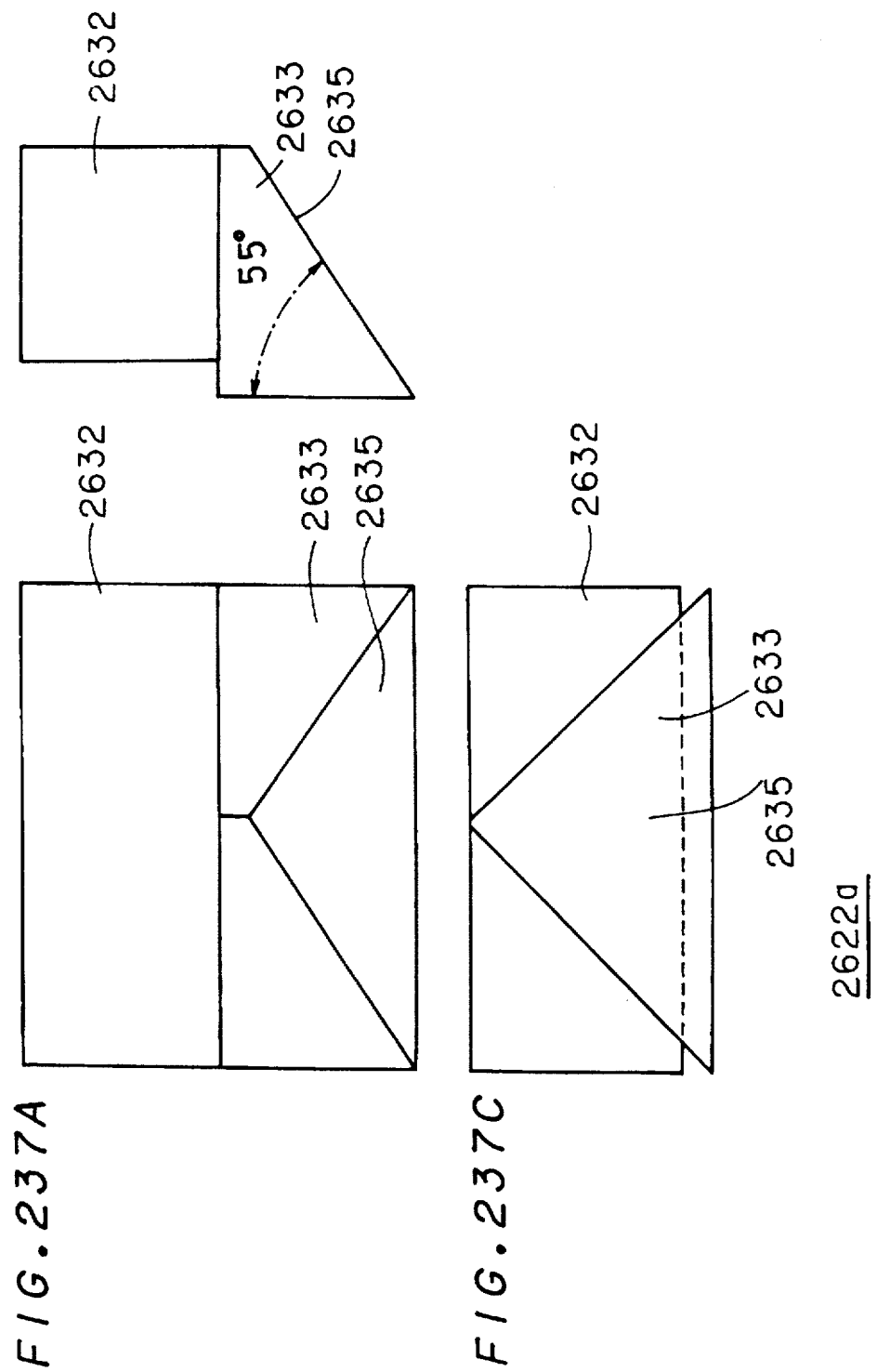
Figure 238:
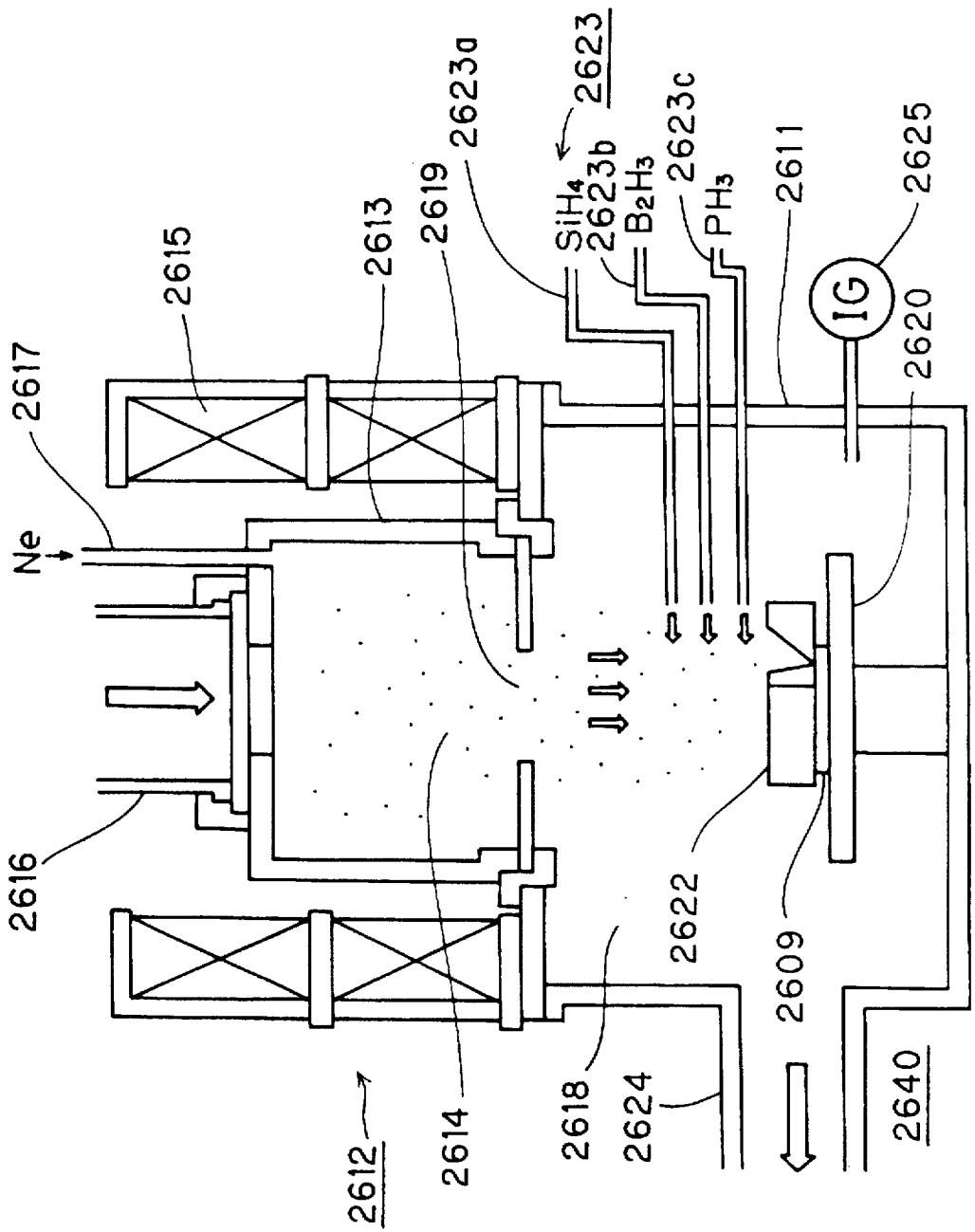
Figure 239:
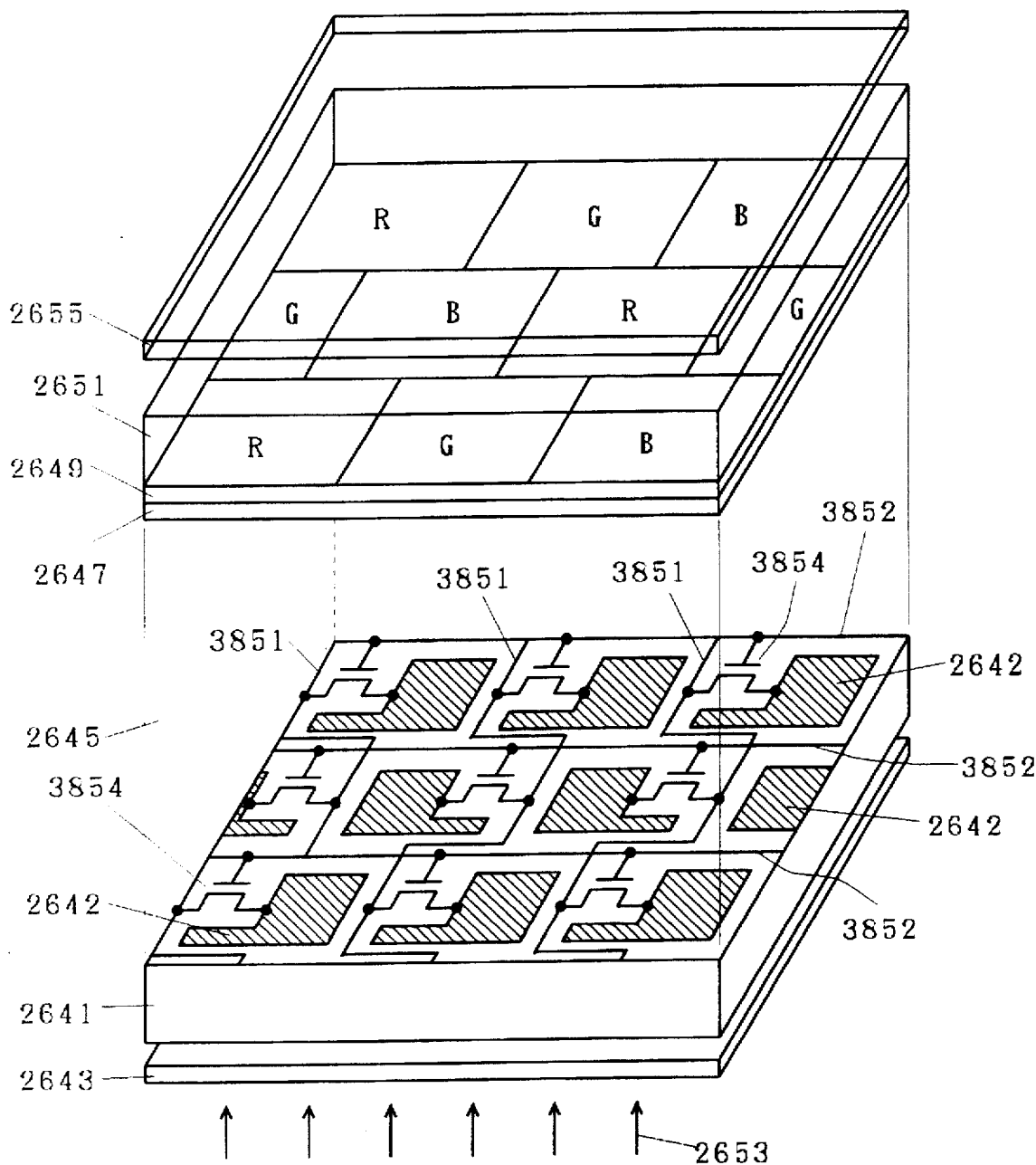
Figure 240:
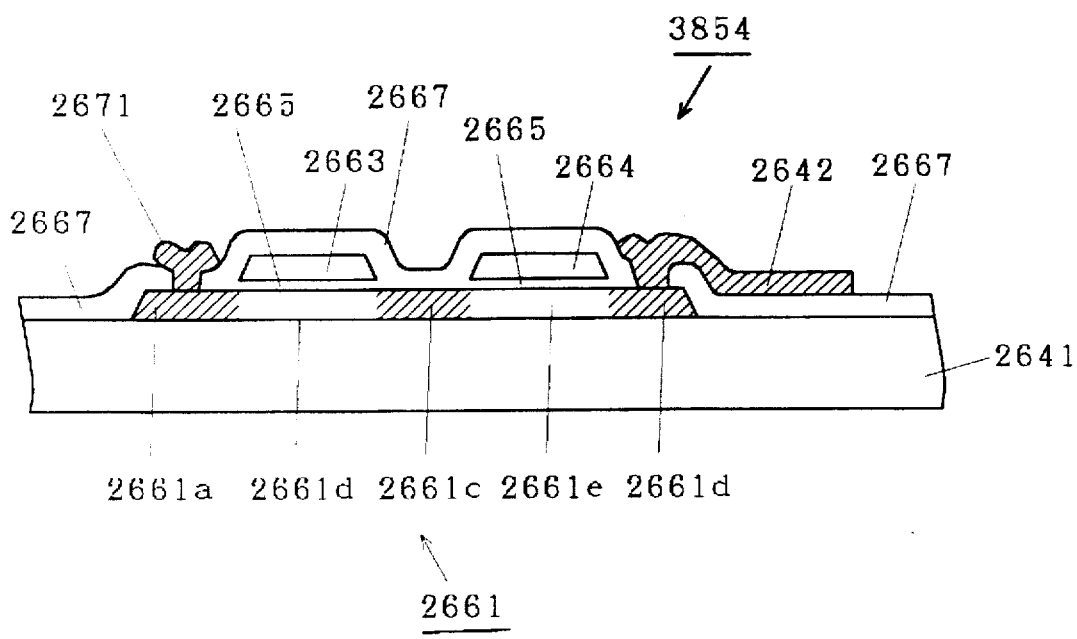
Figure 241:
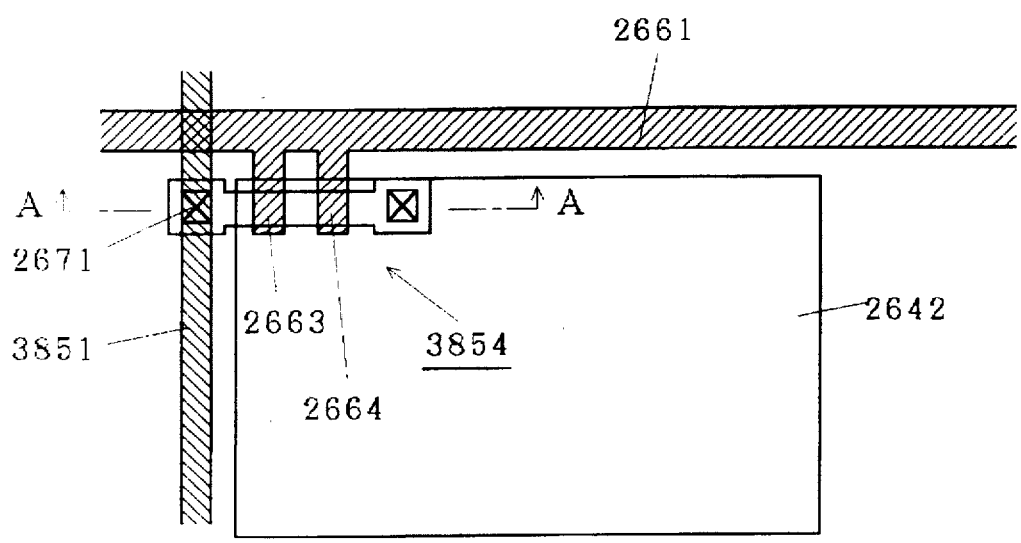
Figure 242:
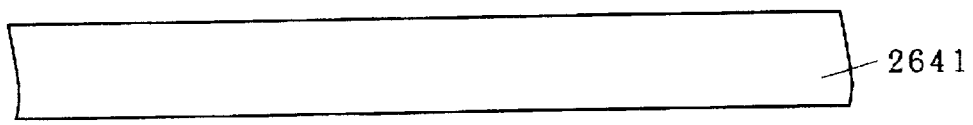
Figure 243:
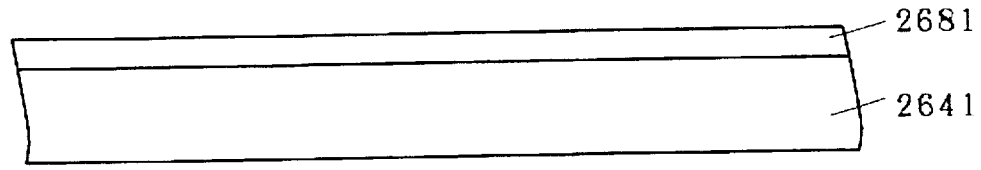
Figure 244:
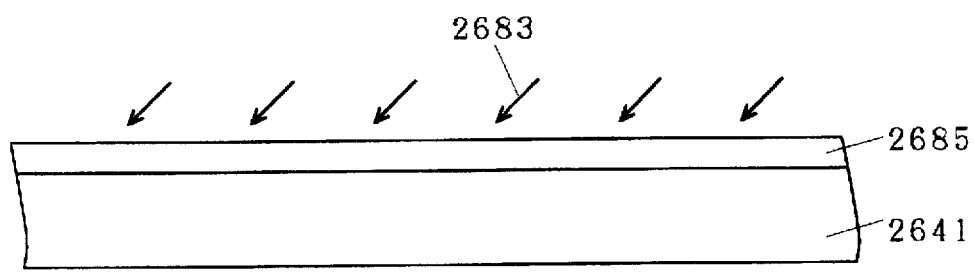
Figure 245:
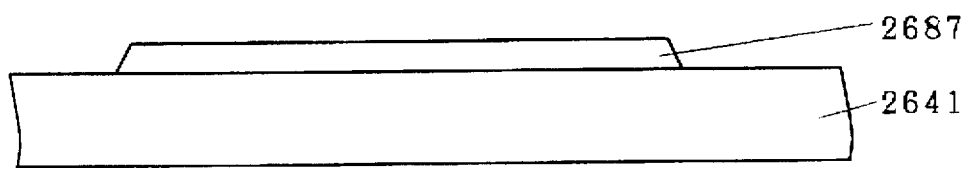
Figure 246:
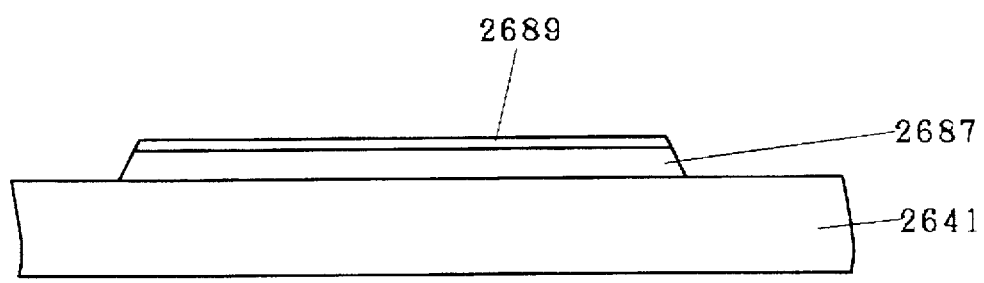
Figure 247:
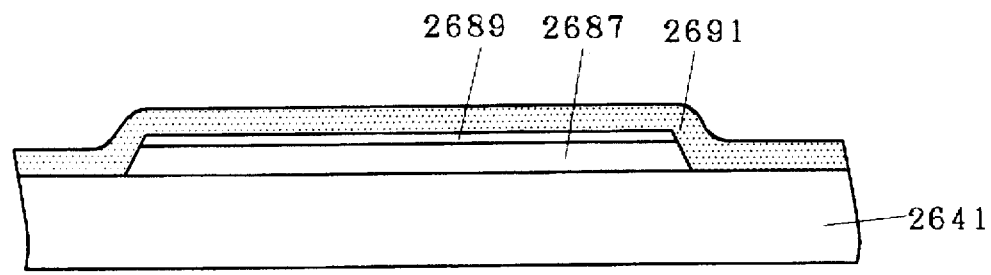
Figure 248:
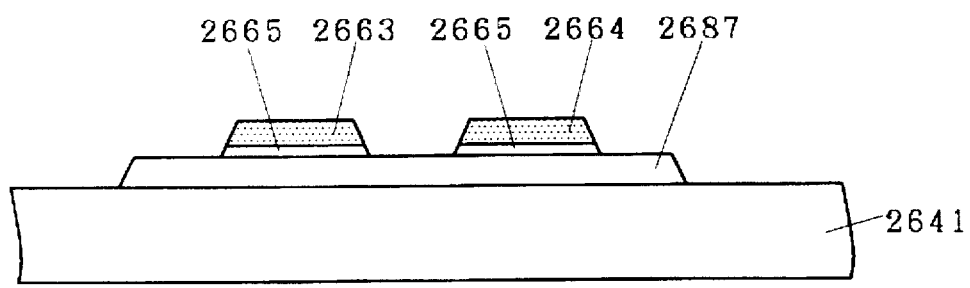
Figure 249:
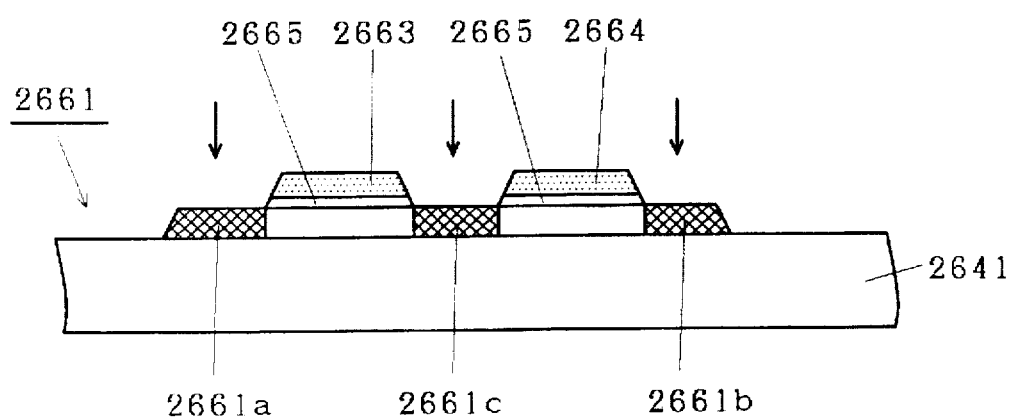
Figure 250:
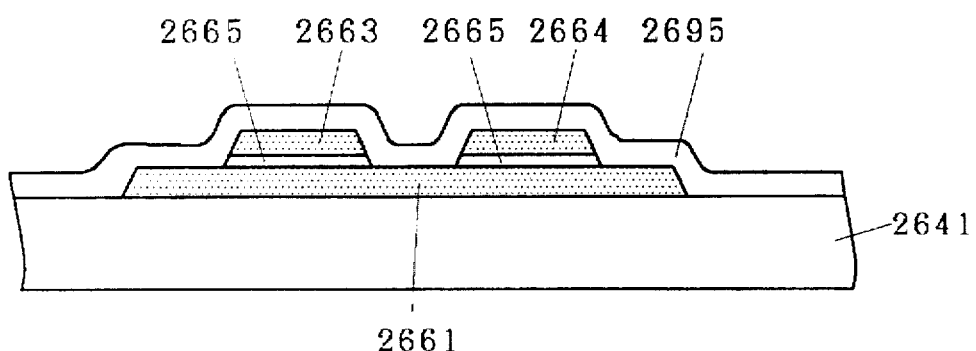
Figure 251:
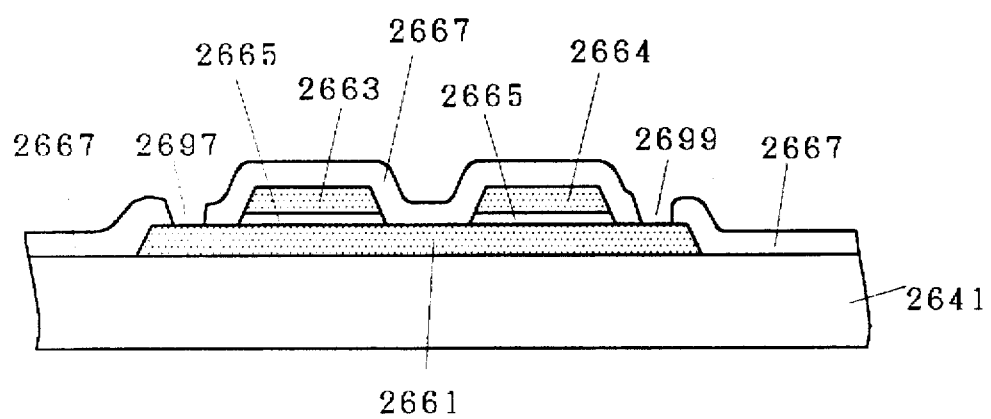
Figure 252:
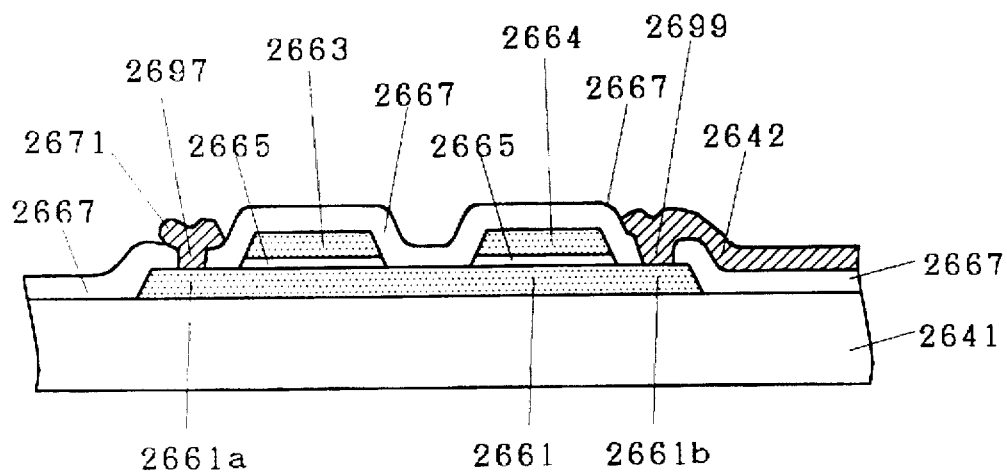
Figure 253:
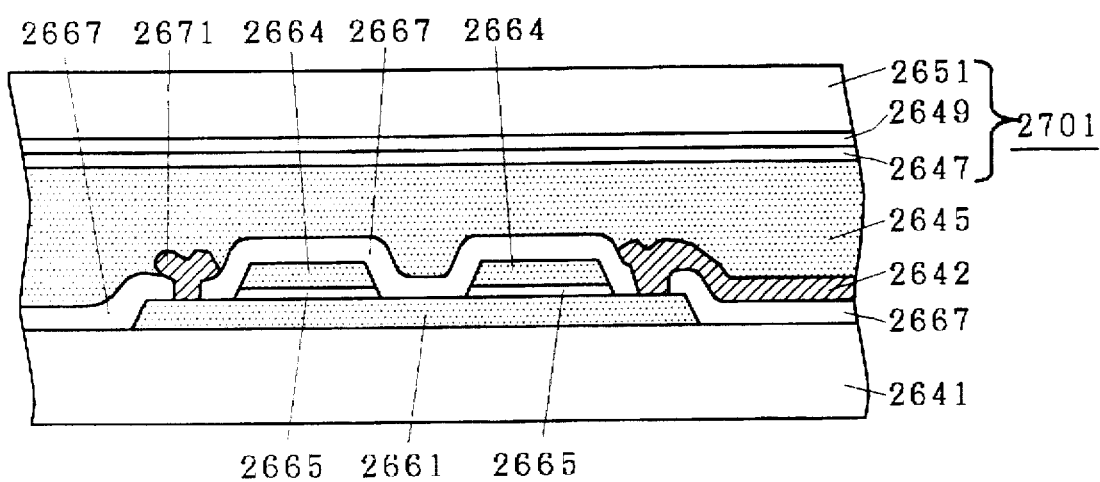
Figure 254:
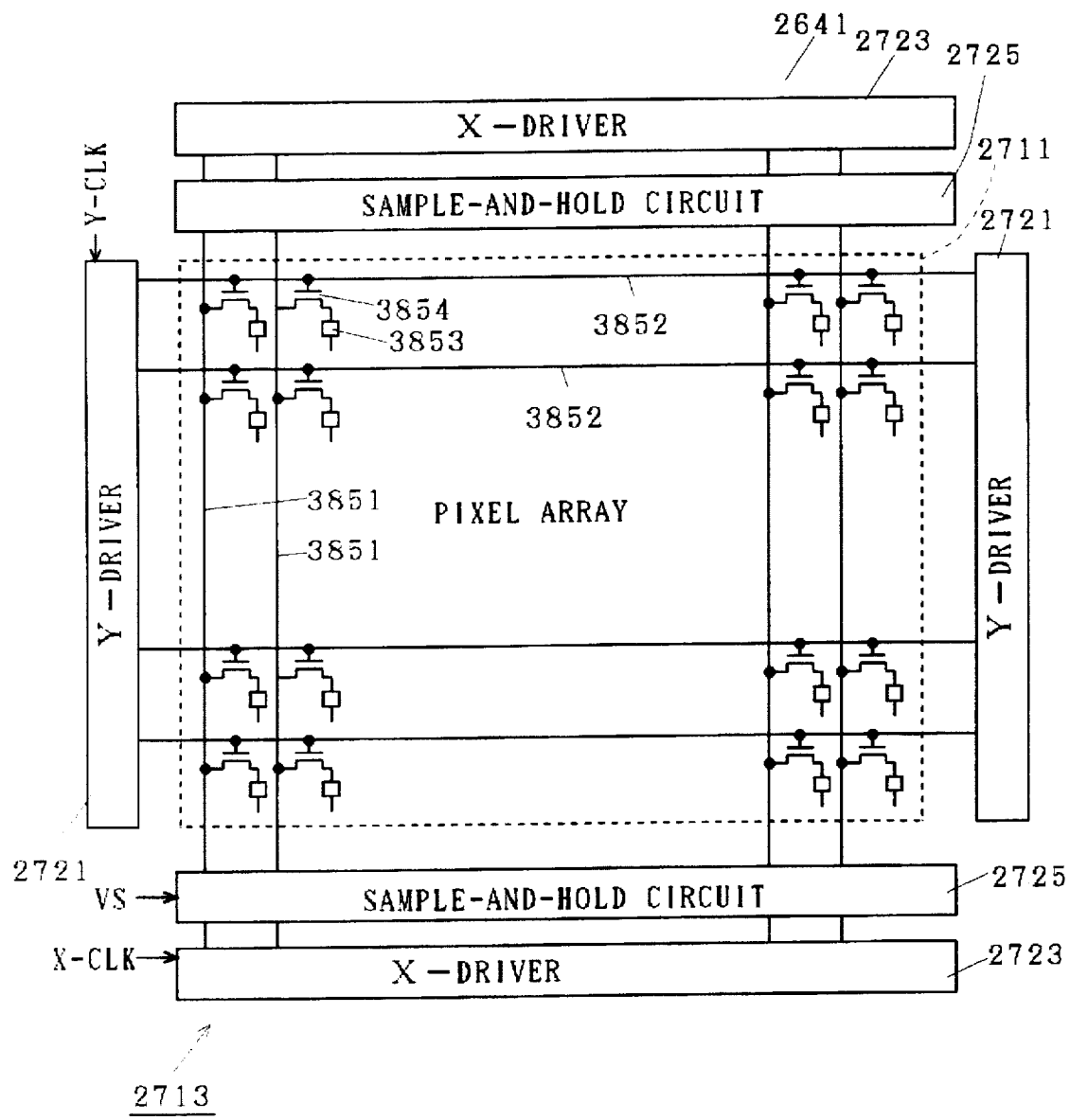
Figure 255:
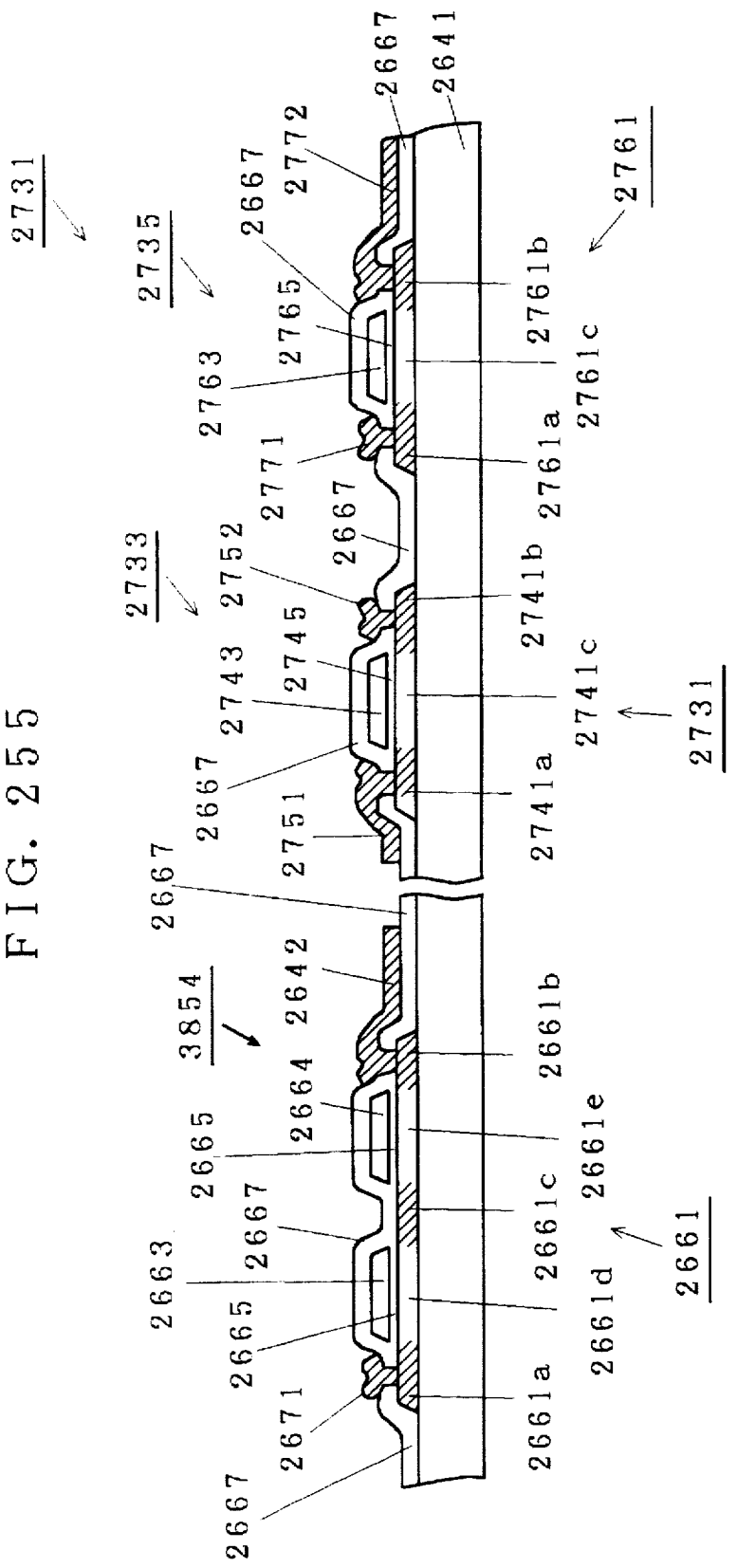
Figure 256:
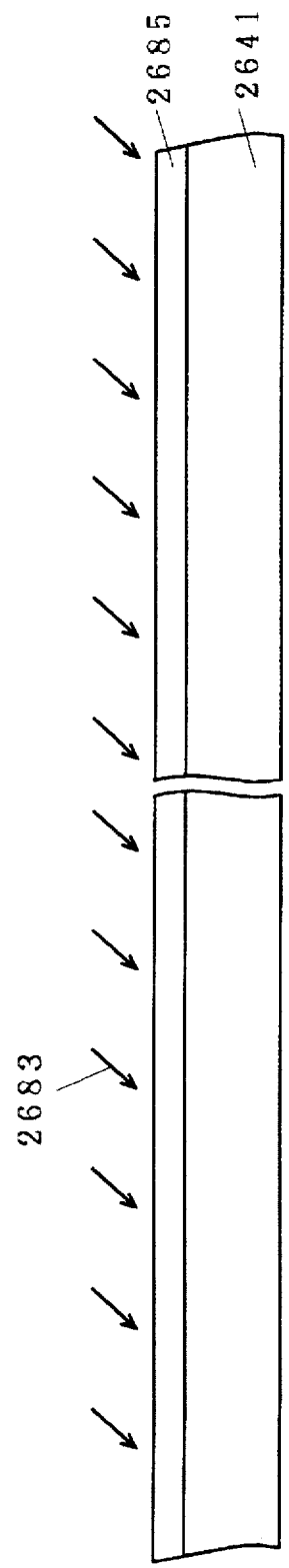
Figure 257:
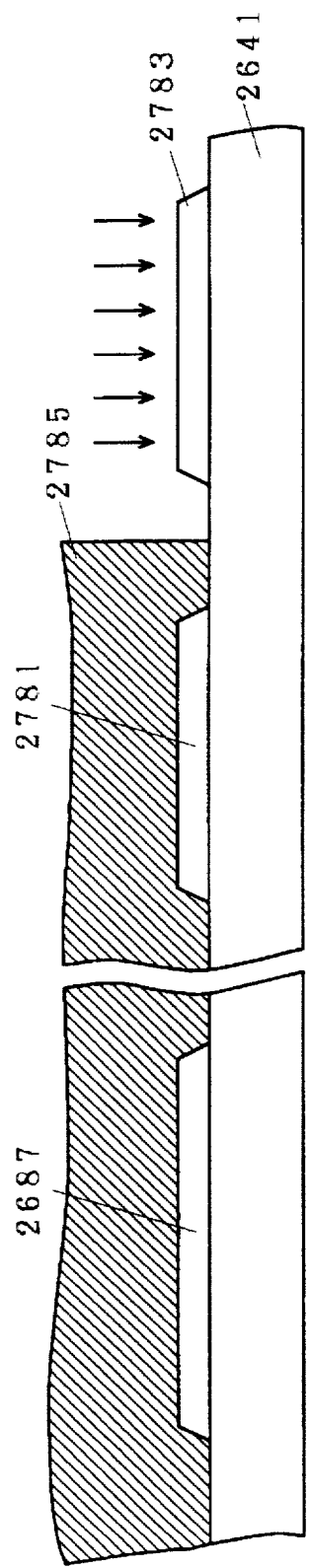
Figure 258:
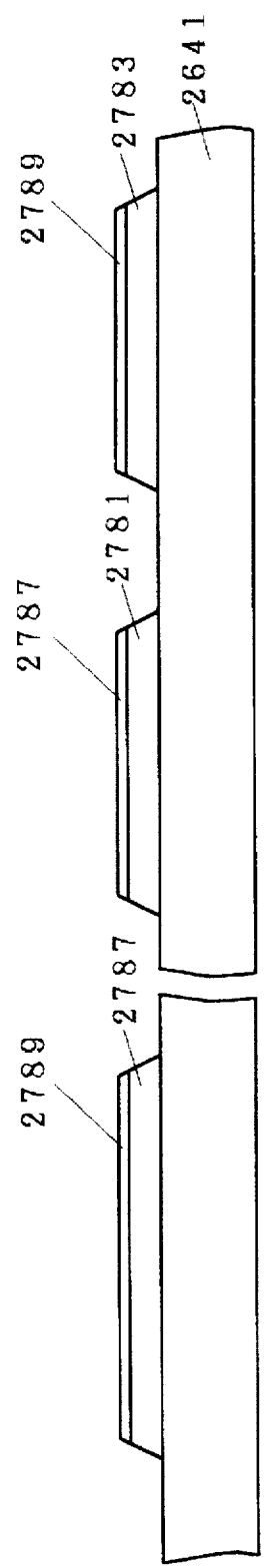
Figure 259:
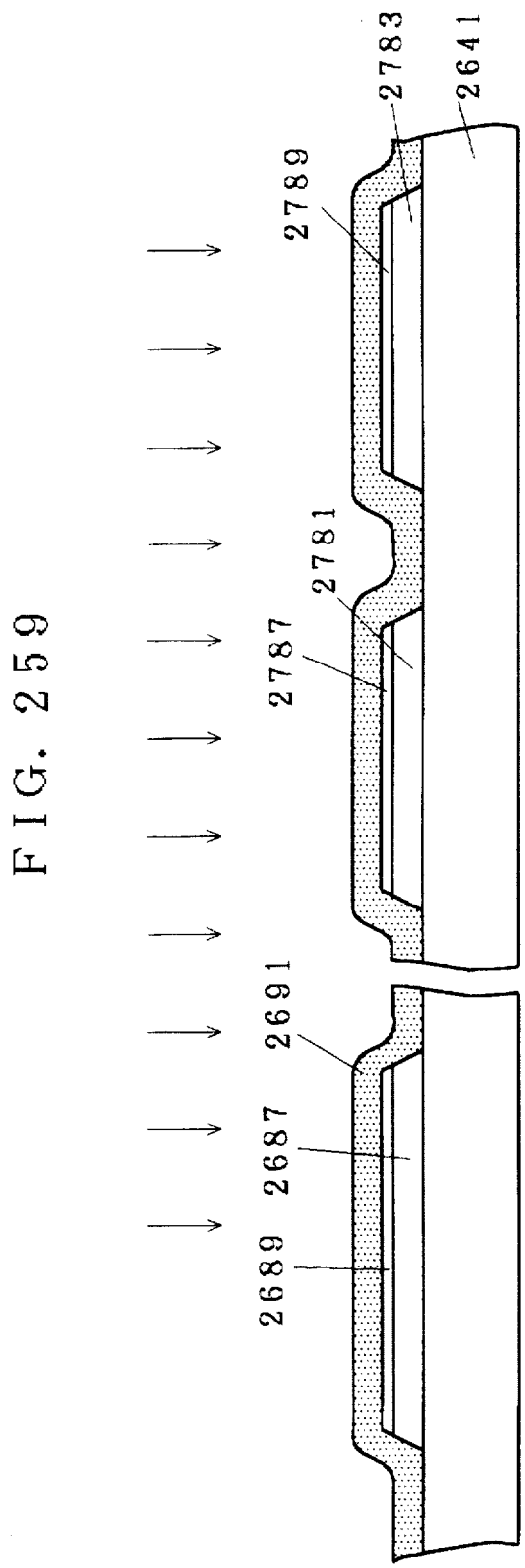
Figure 260:
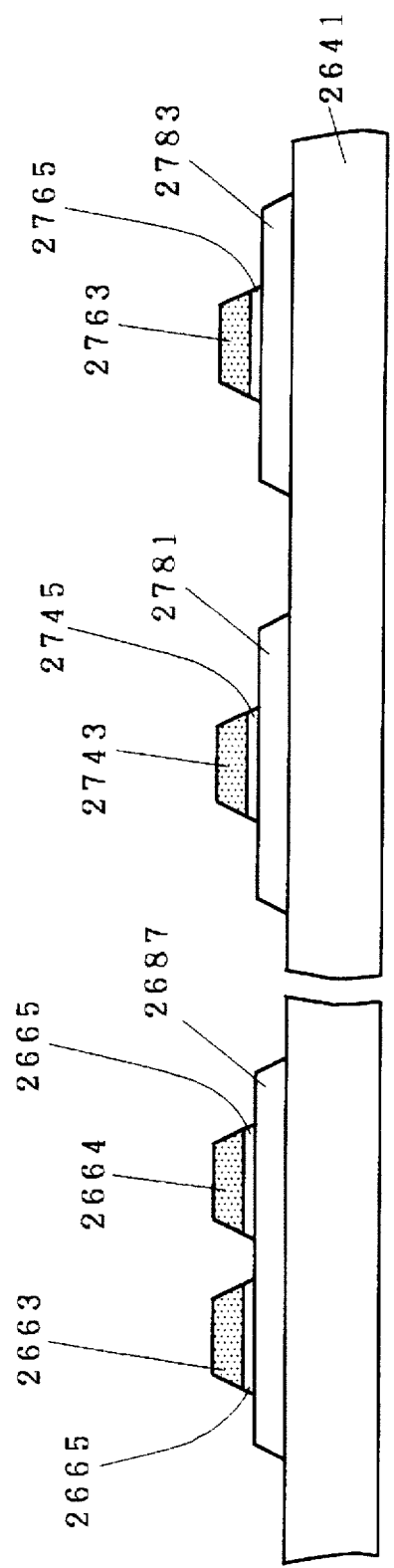
Figure 261:
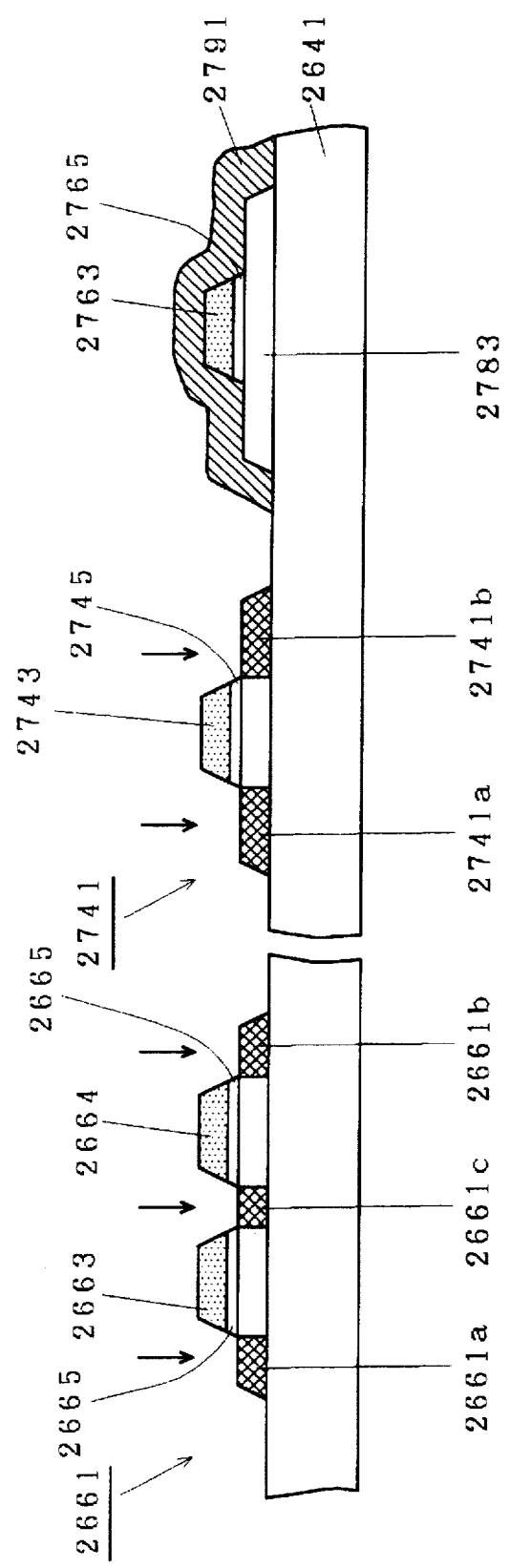
Figure 262:
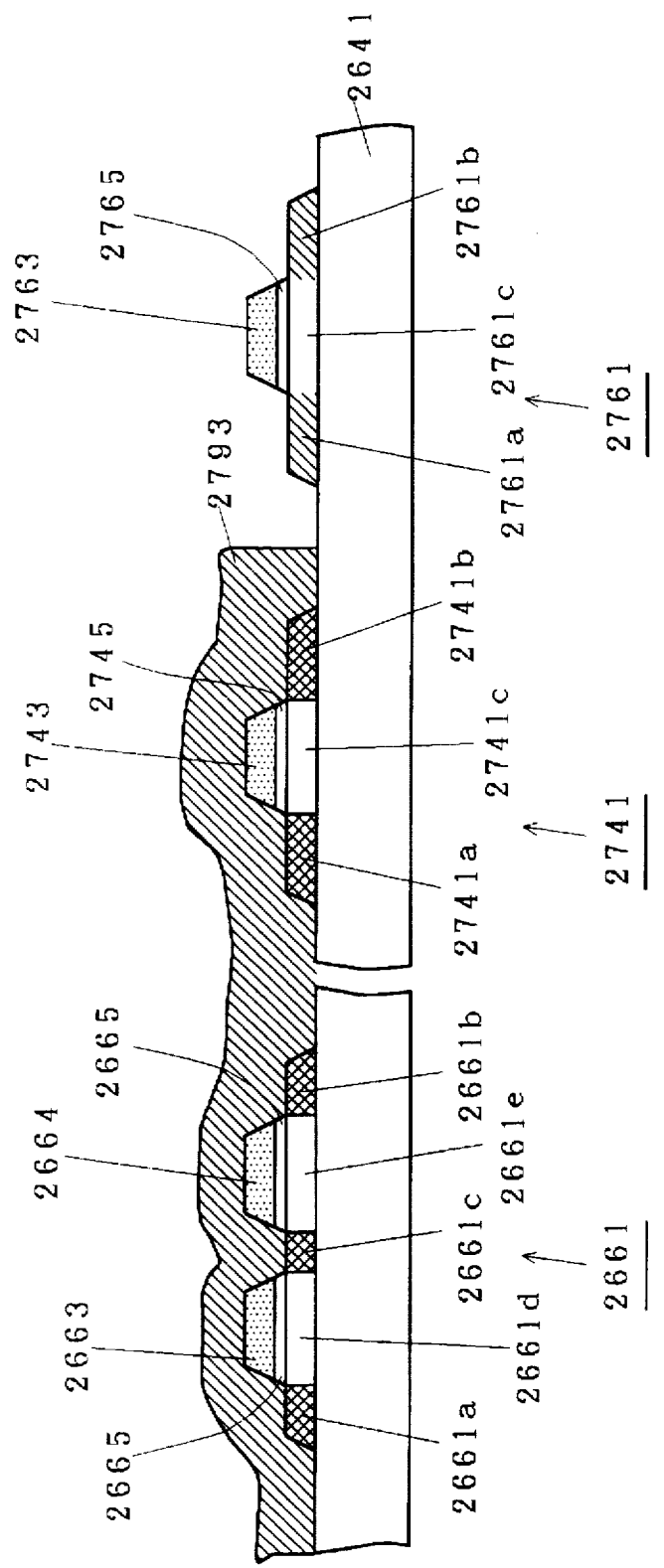
Figure 263:
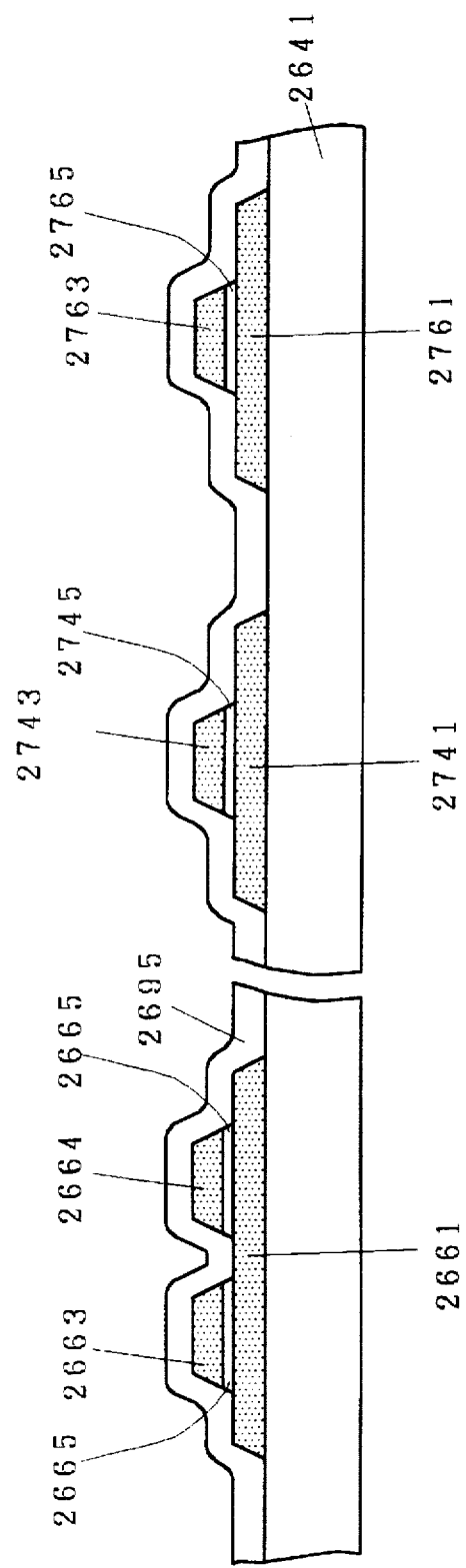
Figure 264:
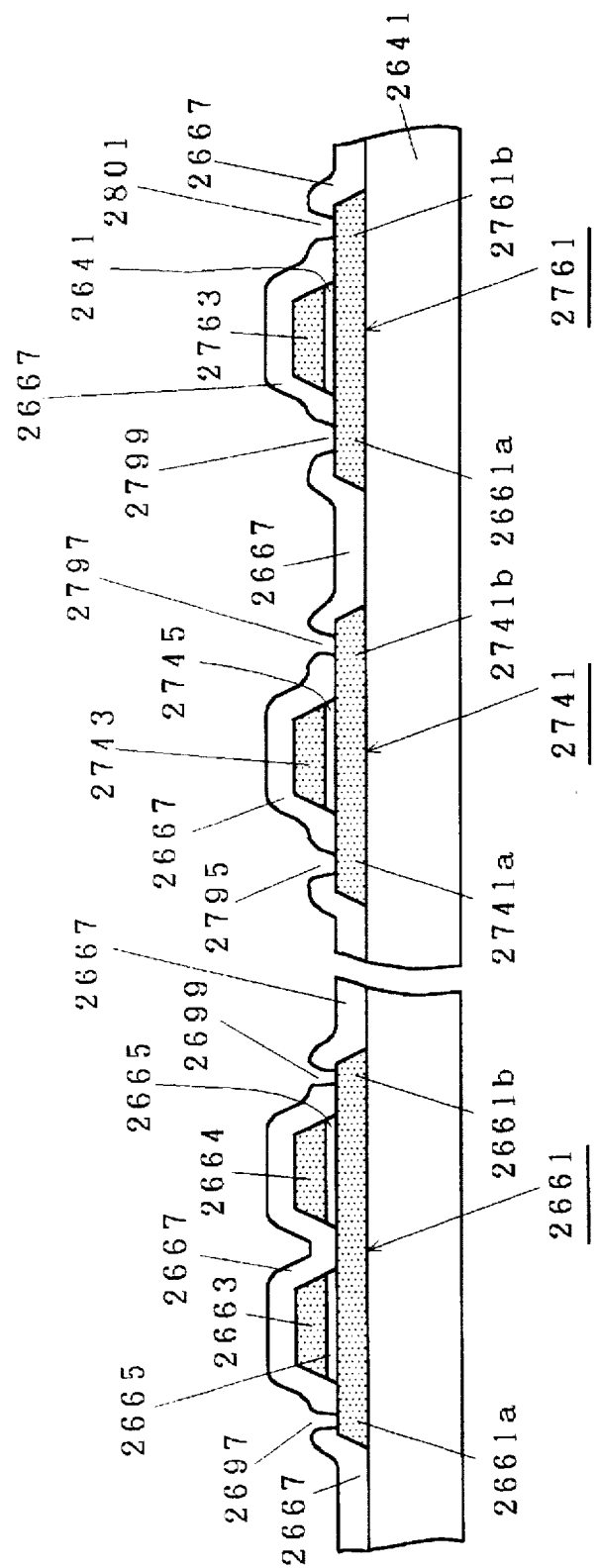
Figure 265:
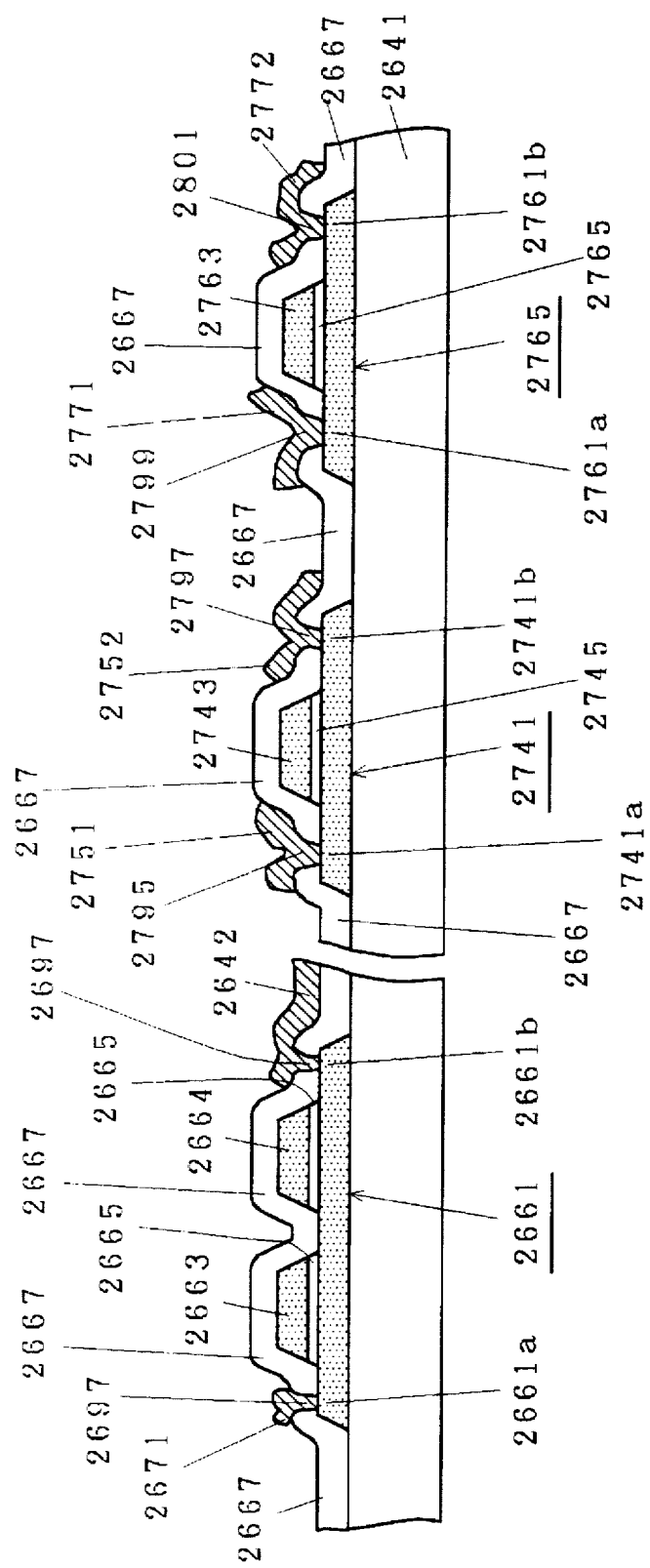
Figure 266:
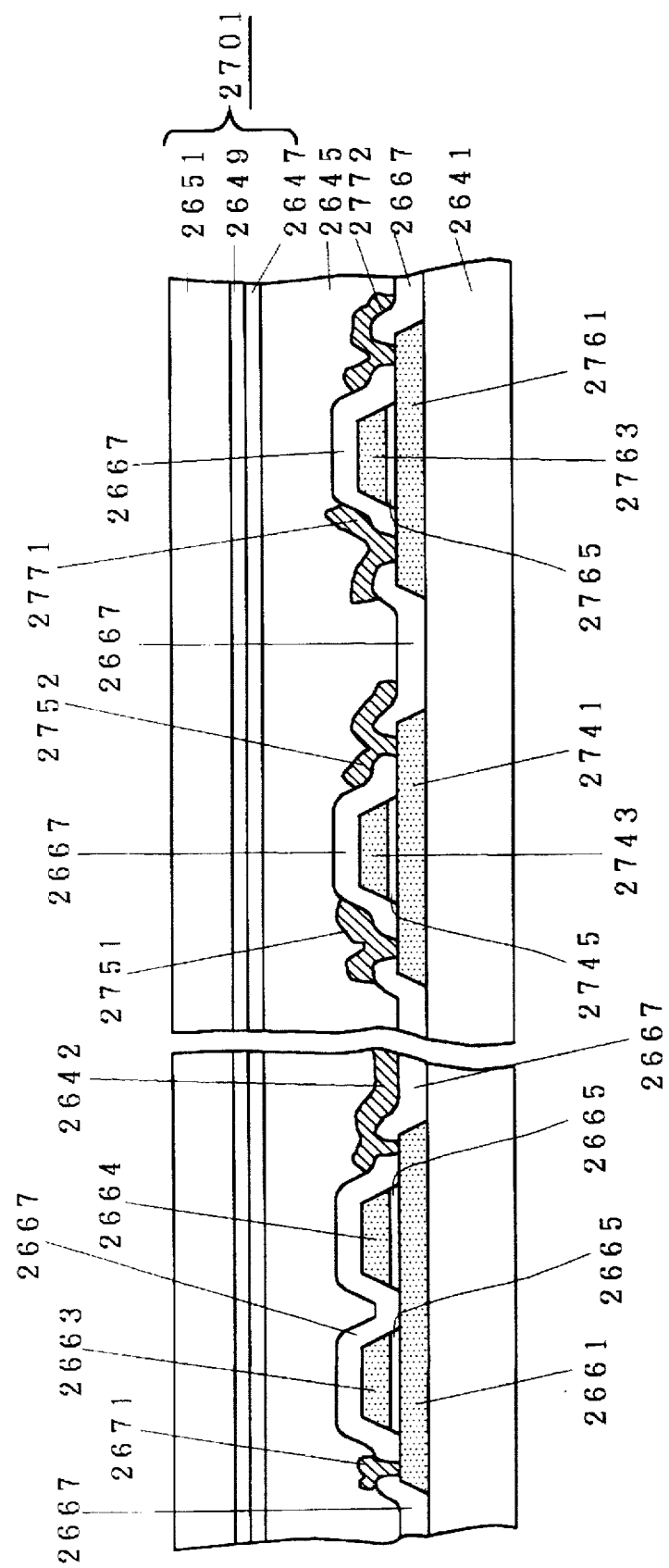
Figure 267:
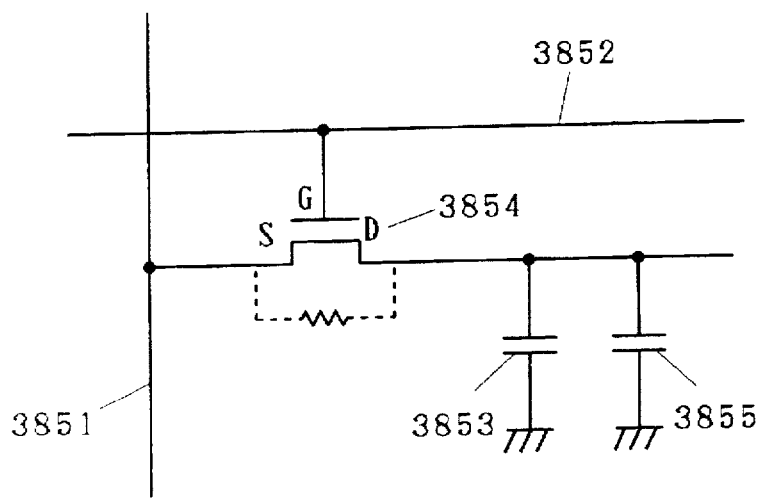
Figure 268:
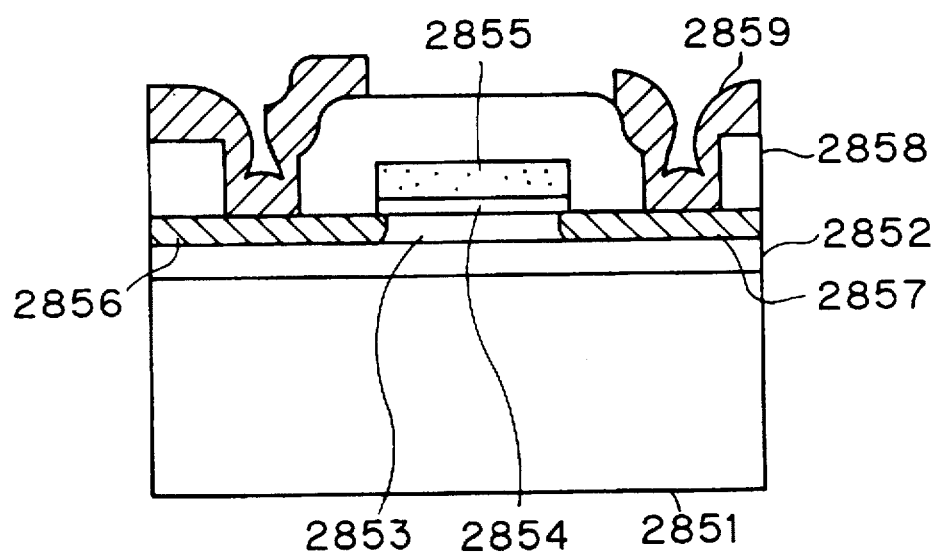
Figure 269:
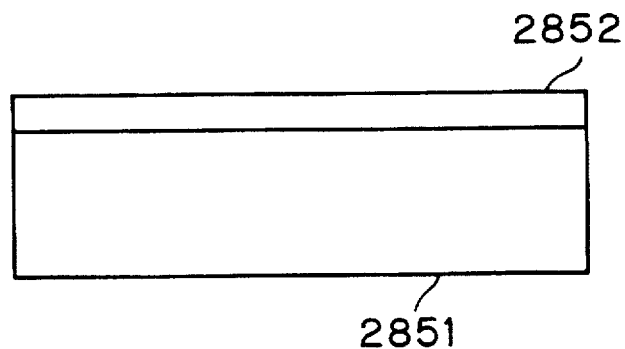
Figure 270:
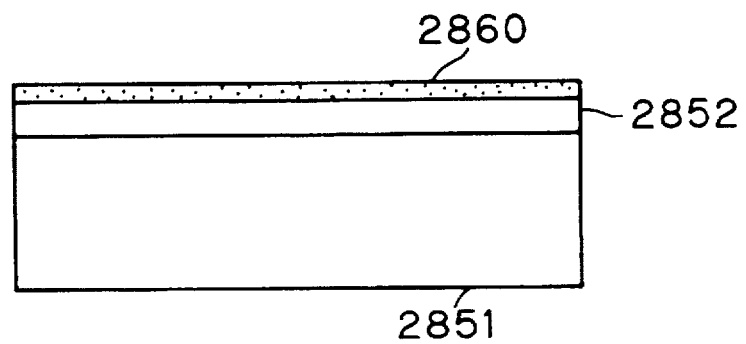
Figure 271:
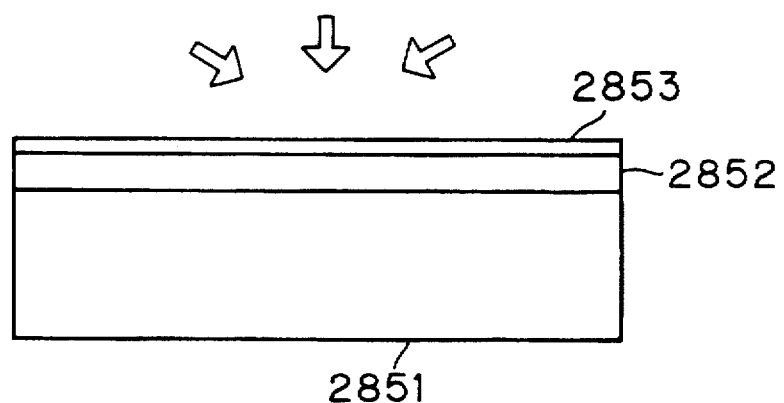
Figure 272:
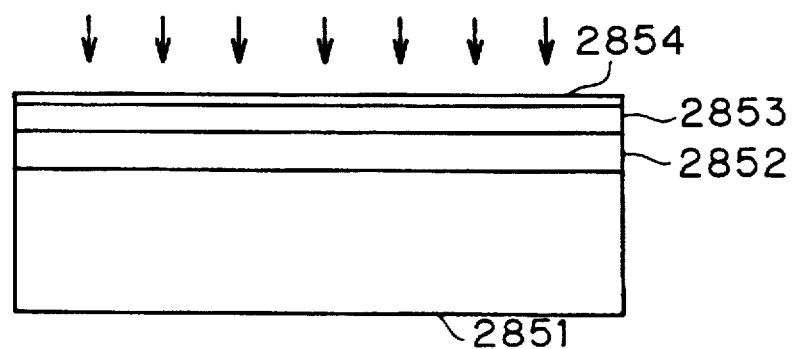
Figure 273:
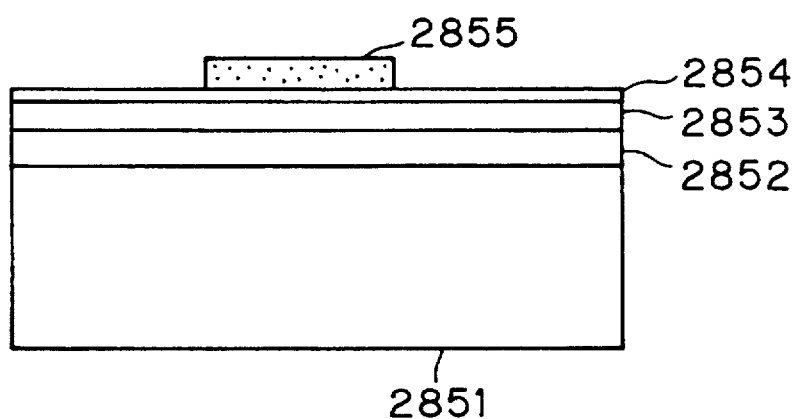
Figure 274:
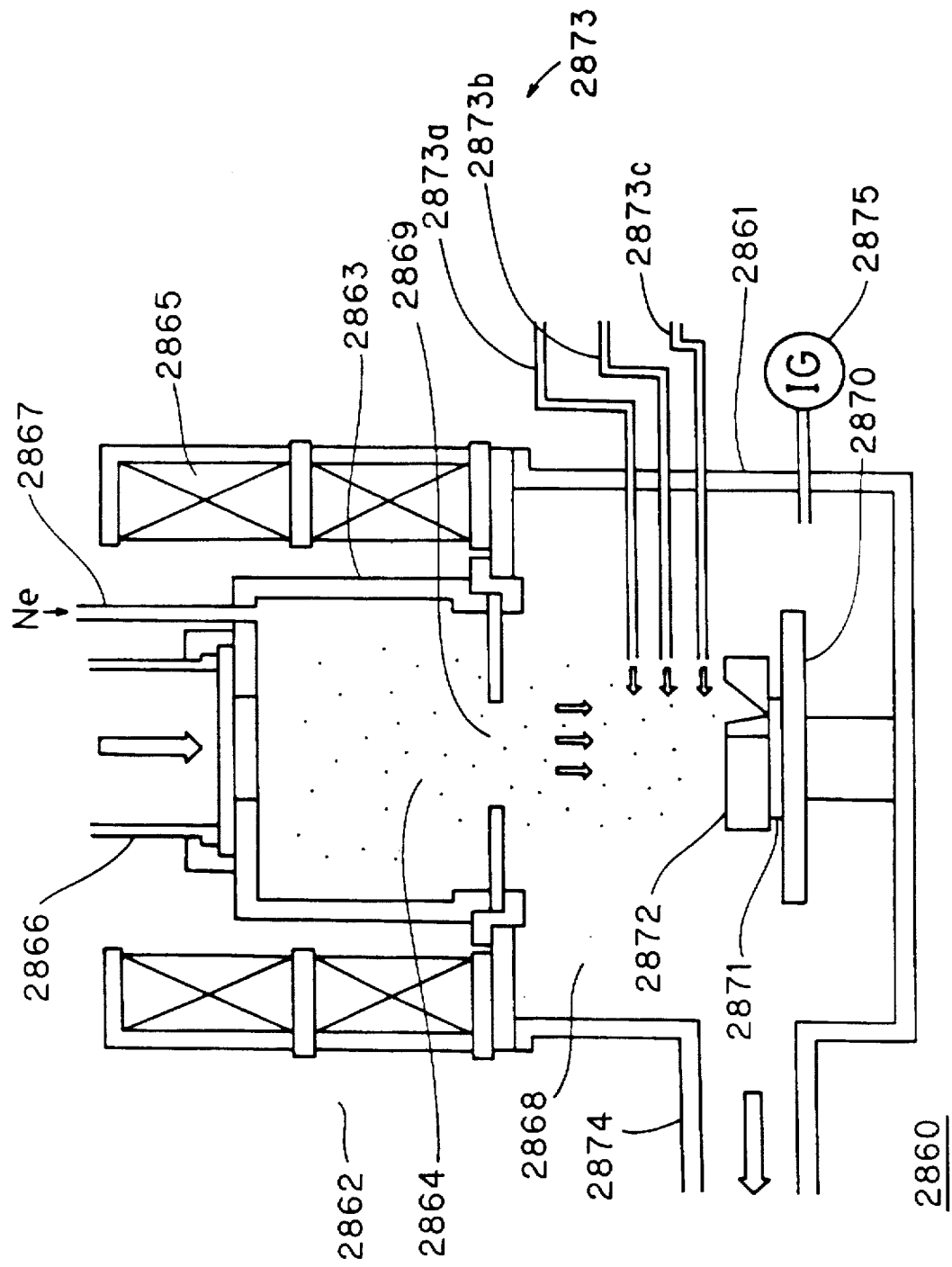
Figure 275:
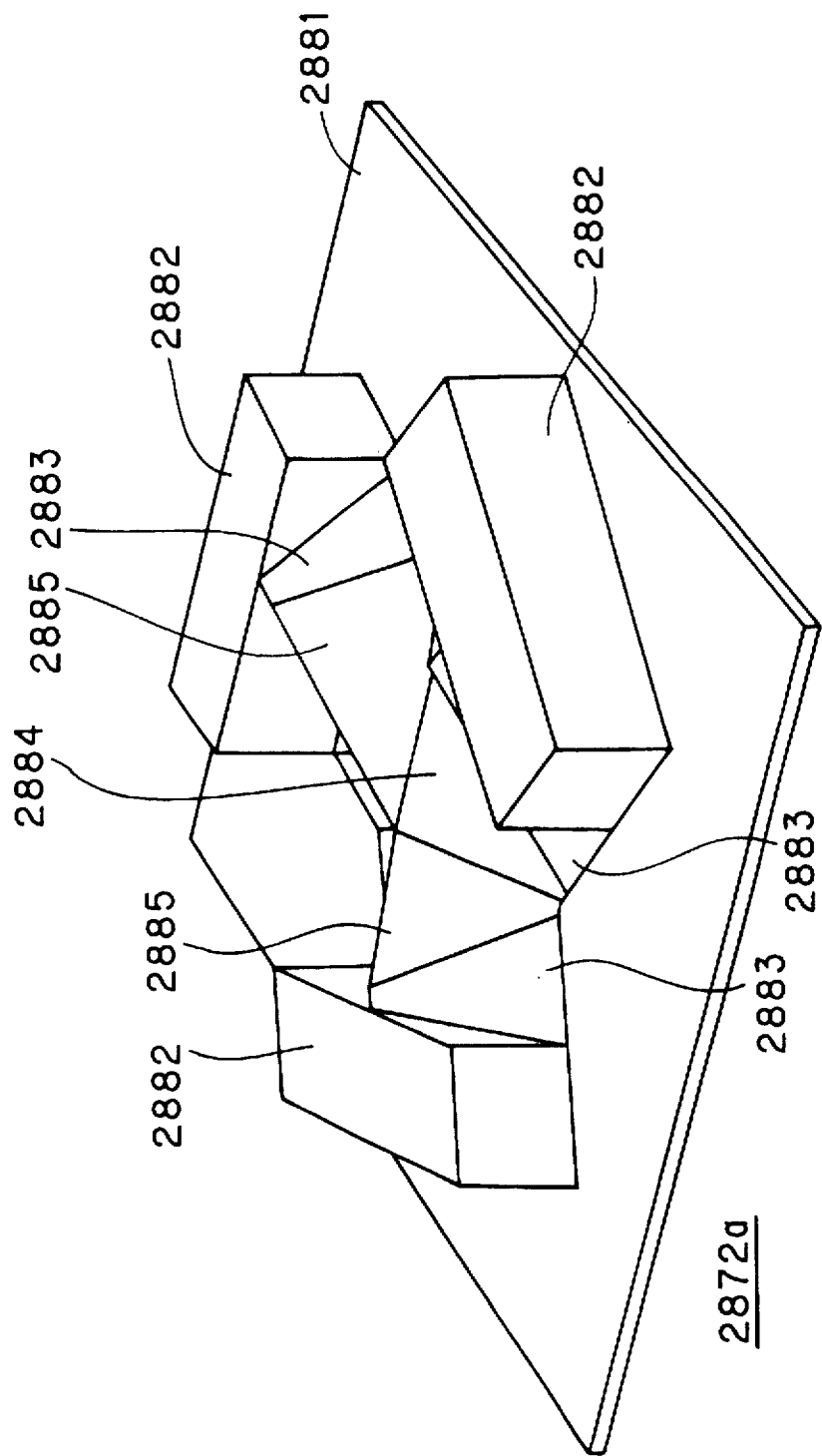
Figure 276B:
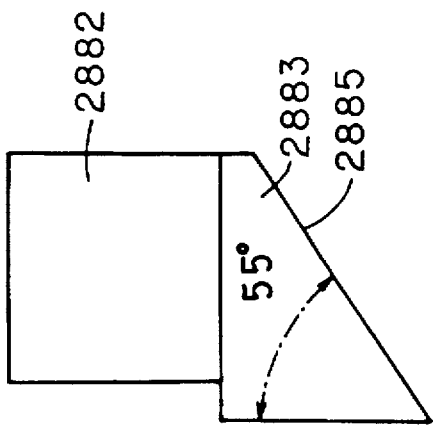
Figure 276A:
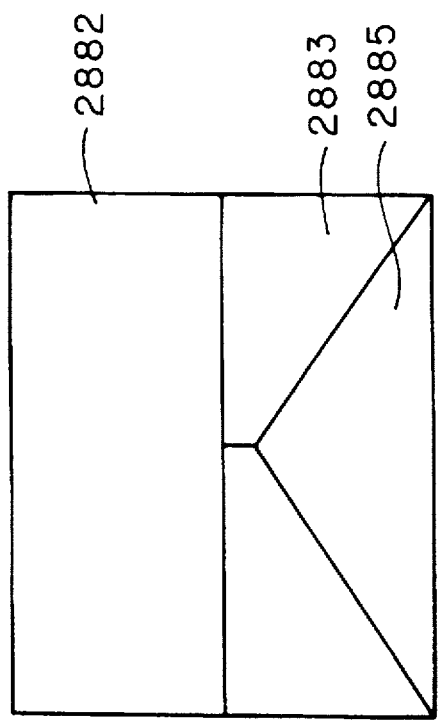
Figure 276C:
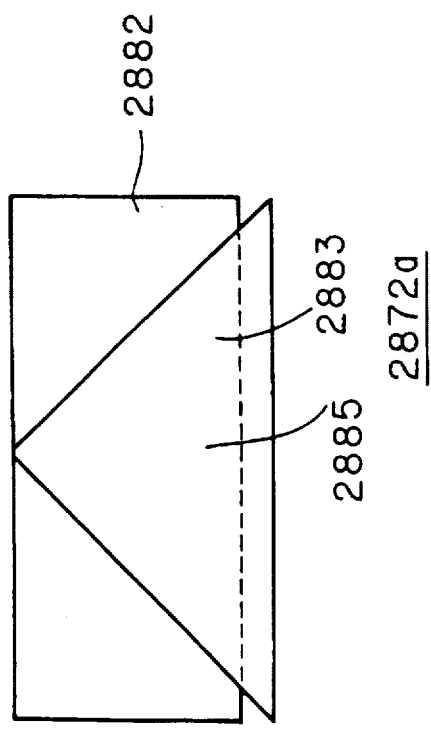
Figure 277:
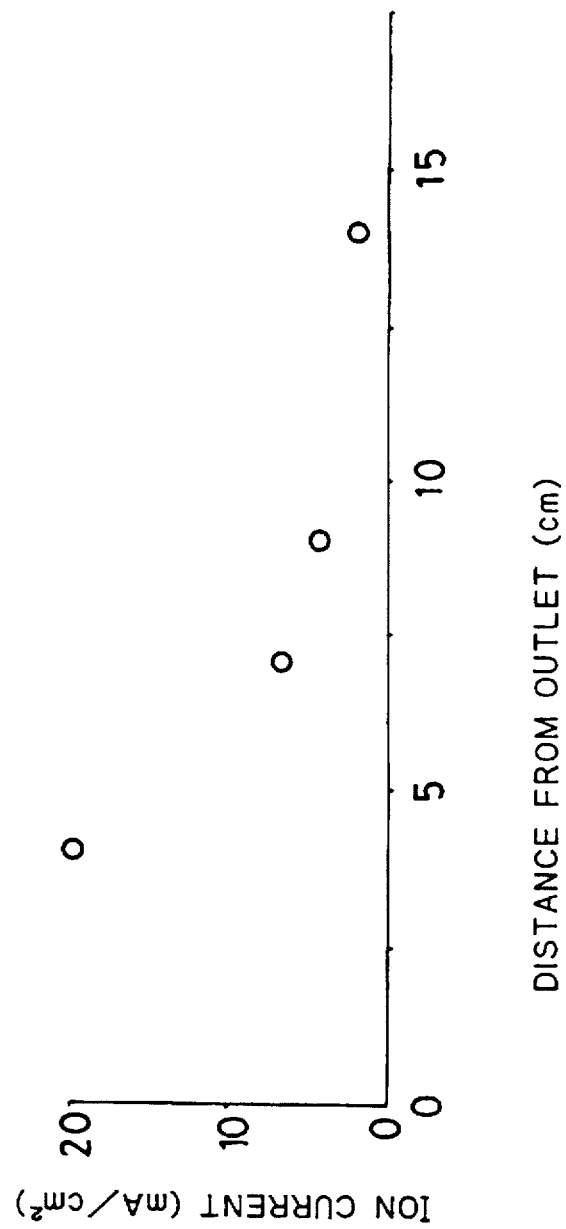
Figure 279:
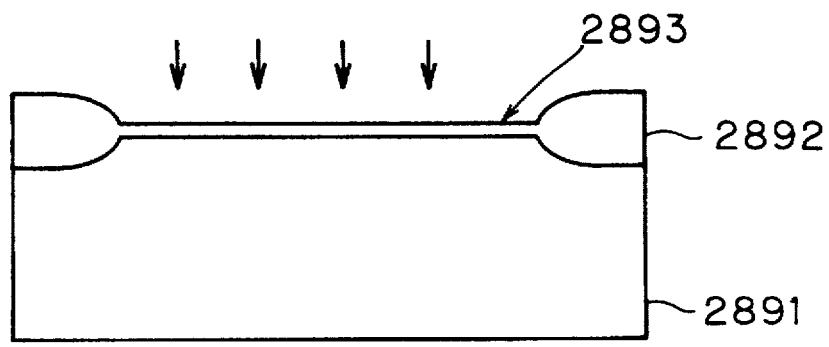
Figure 280:
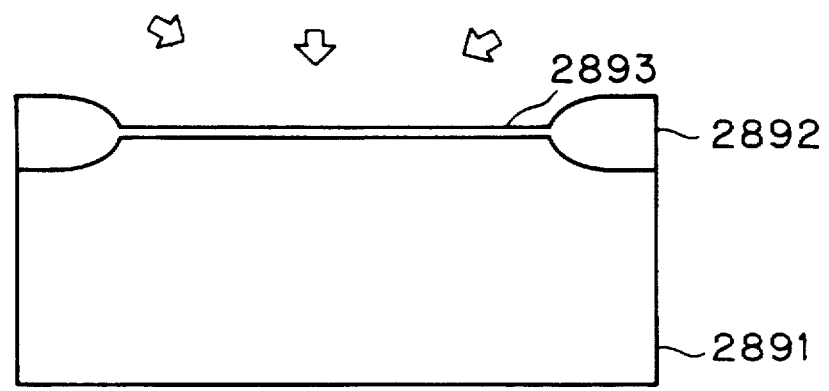
Figure 281:
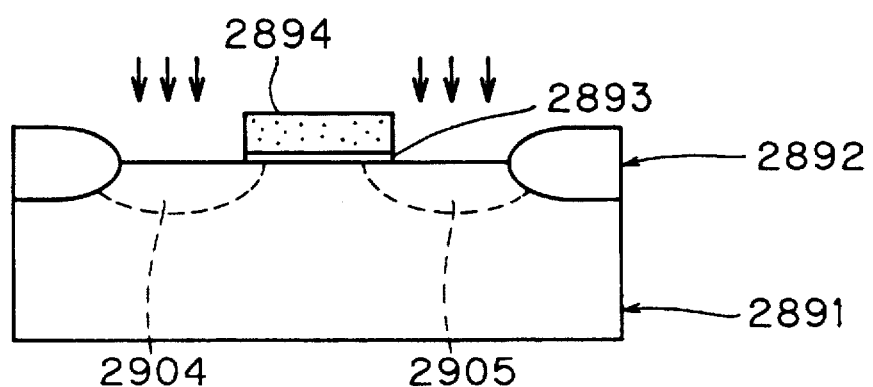
Figure 282:
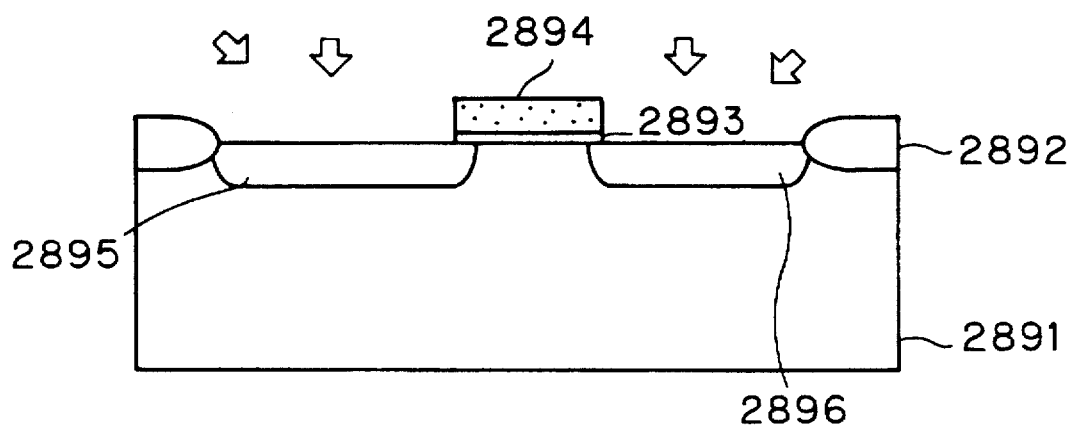
Figure 283:
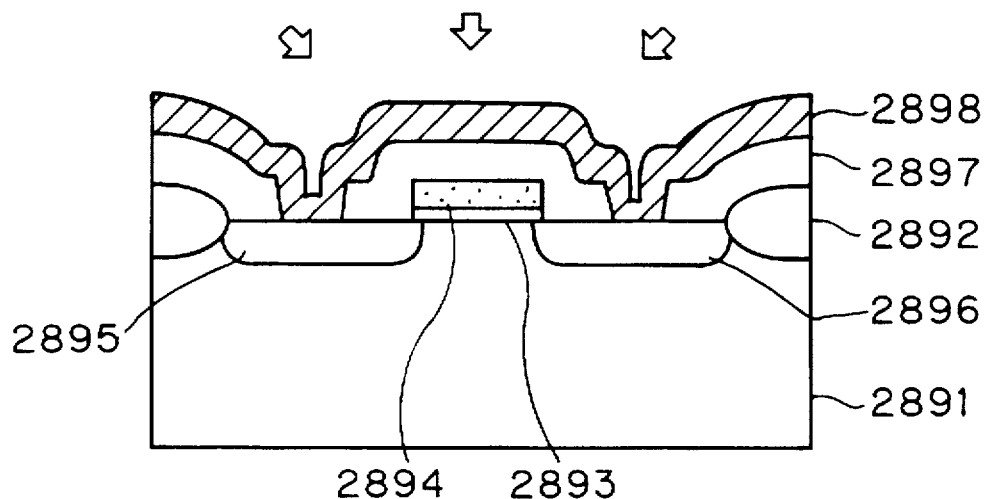
Figure 284:
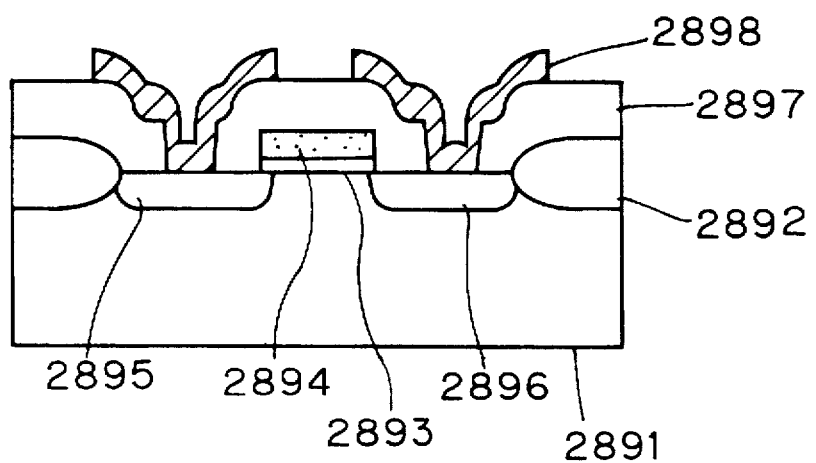
Figure 285:
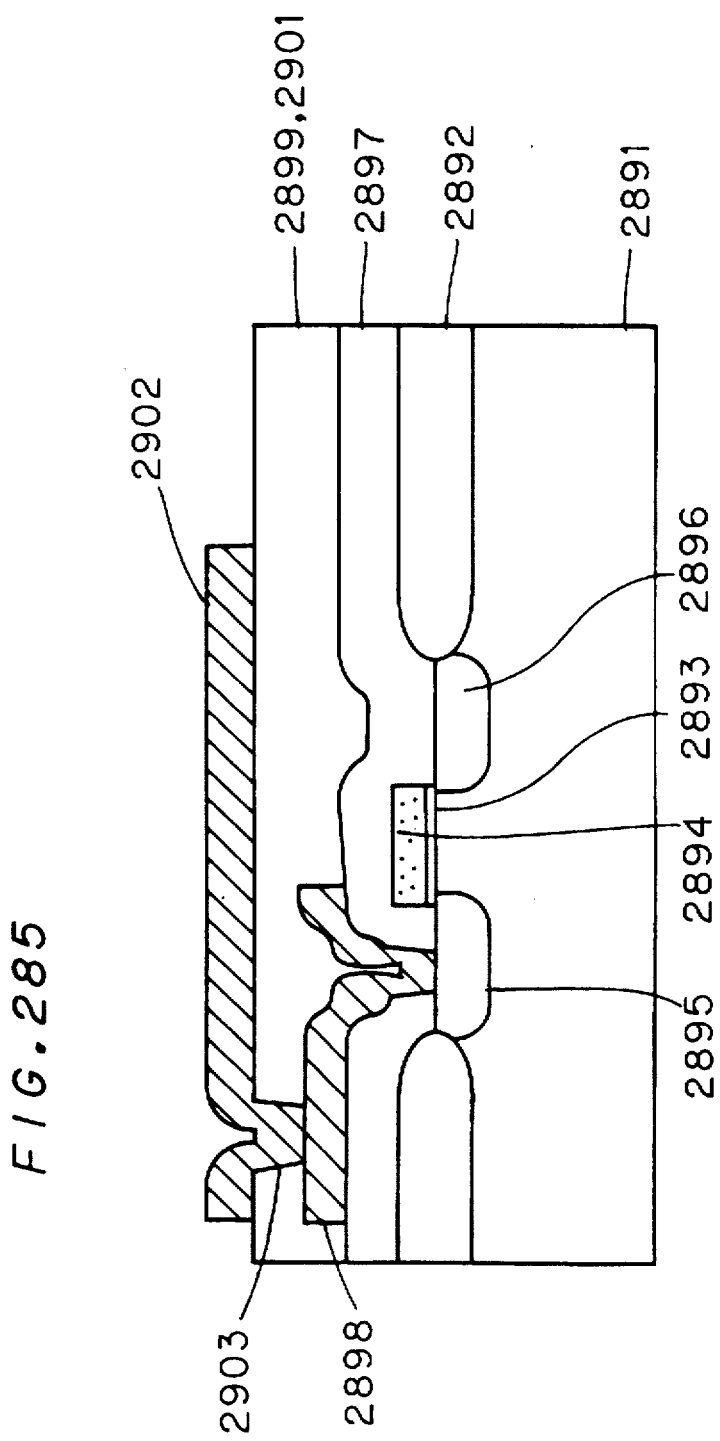
Figure 286:
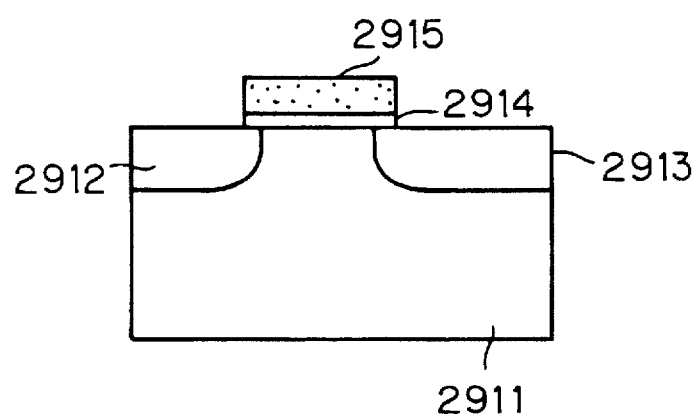
Figure 287:
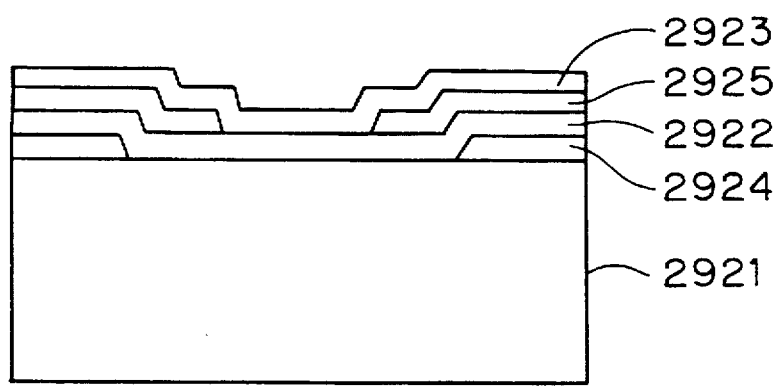
Figure 291:
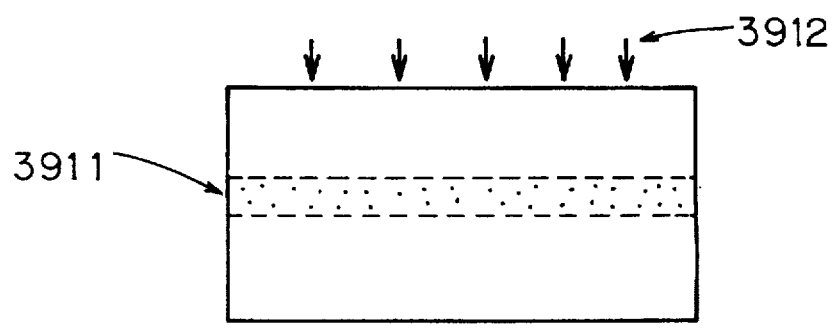
Figure 292:
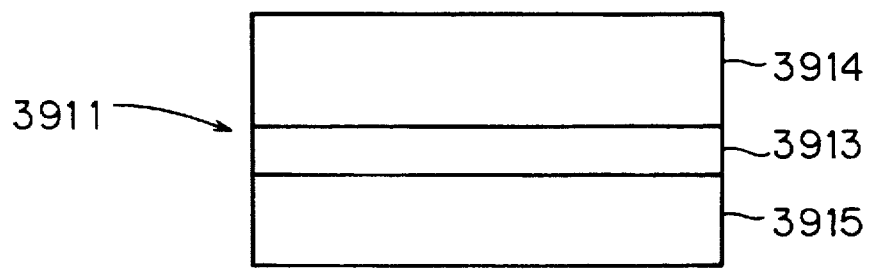
Figure 293:
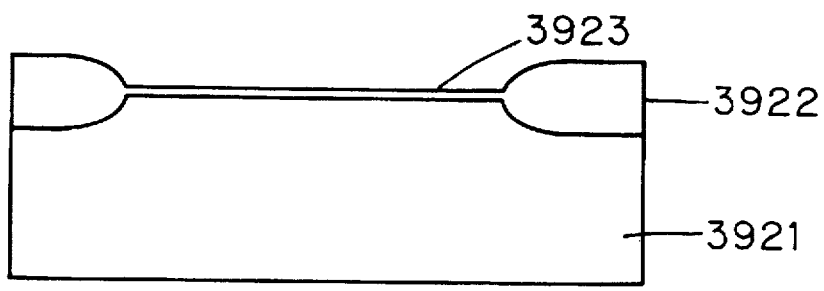
Figure 294:
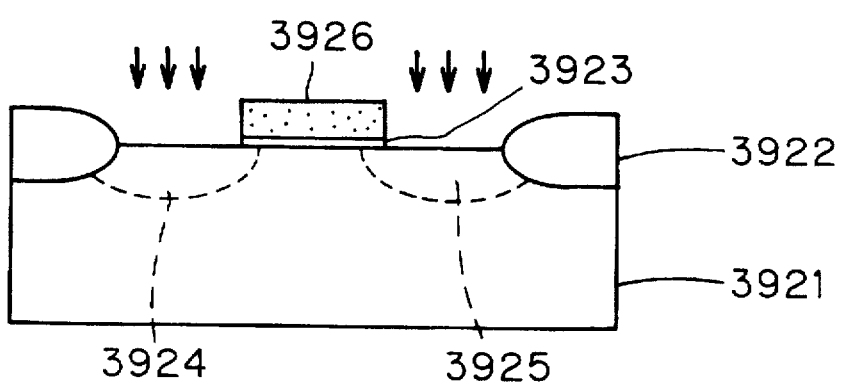
Figure 295:
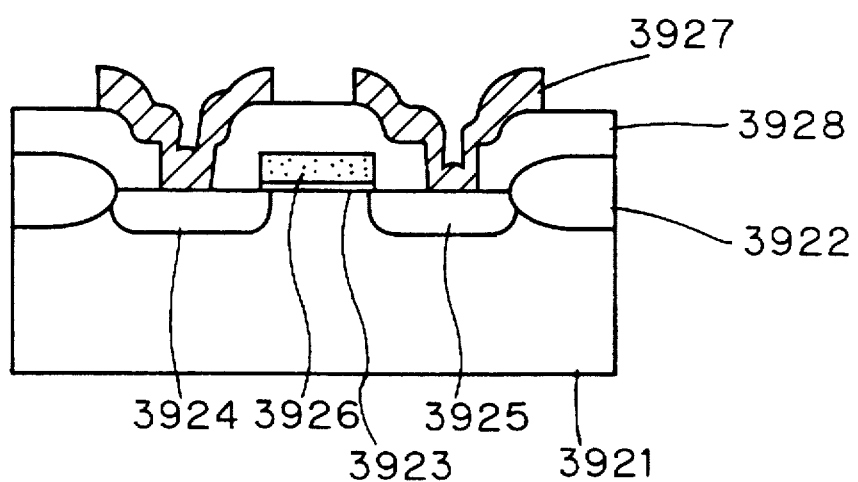
Figure 296:
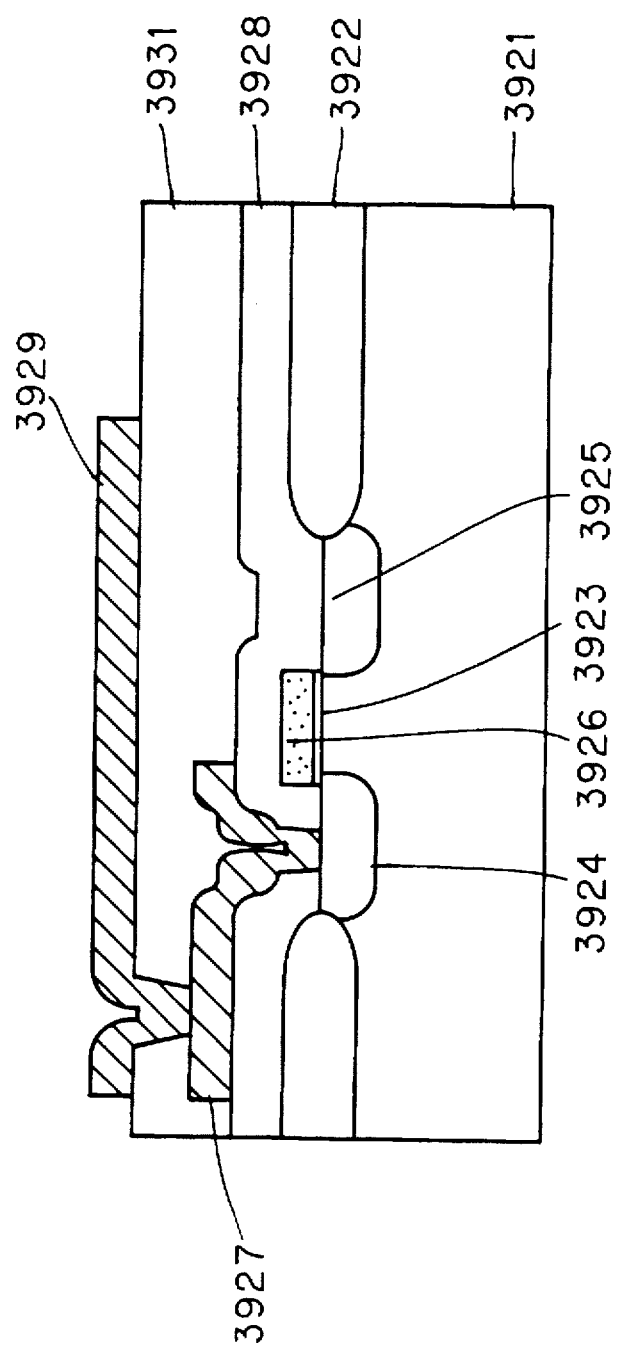
Figure 297:
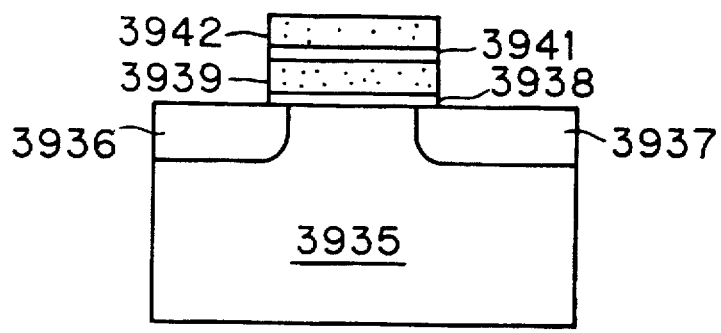
Figure 298:
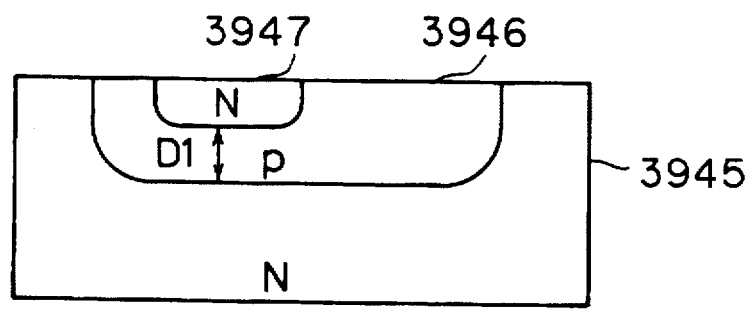
Figure 299:
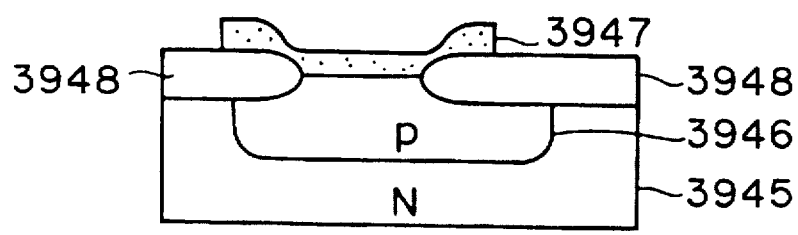

FIG. 133 illustrates a step of manufacturing a polycrystalline Si solar cell using a general cast method according to Prior Art 5;

FIG. 134 illustrates a step of manufacturing a newly proposed polycrystalline Si solar cell using a cast method according to Prior Art 7;

FIG. 135 illustrates a step of manufacturing a polycrystalline Si solar cell using a ribbon method according to Prior Art 6;

FIG. 136 illustrates a step of manufacturing an amorphous Si solar cell using a single-chamber reaction furnace method according to Prior Art 8;

FIG. 137 illustrates a step of manufacturing an amorphous Si solar cell using continuous separation plasma reaction according to Prior Art 9;

FIG. 138 illustrates an operation principle of a crystalline Si solar cell;

FIG. 139 illustrates an operation principle of an amorphous Si solar cell;

FIG. 140 illustrates comparison of light absorption coefficients of amorphous Si and crystalline silicon with respect to wavelengths of light;

FIG. 141 illustrates comparison of absorption coefficients of amorphous (a) Si:H, single-crystalline Si and solar radiation spectrum;

FIG. 142 illustrates absorption light ratios with respect to light passage distances with parameter of light absorption coefficients;

FIG. 143 illustrates physical constants of amorphous Si:H and single-crystalline Si;

FIG. 144 illustrates an exemplary conventional solar cell according to Prior Art 10;

FIG. 145 illustrates an exemplary conventional solar cell according to Prior Art 11;

FIG. 146 illustrates an exemplary conventional solar cell according to Prior Art 12;

FIG. 147 illustrates an exemplary conventional solar cell according to Prior Art 13;

FIG. 148 illustrates an exemplary conventional solar cell according to Prior Art 14;

FIG. 149 illustrates an exemplary conventional solar cell according to Prior Art 15;

FIG. 150 is a sectional view showing a semiconductor device according to a twenty-first embodiment of the present invention;

FIG. 151 is a perspective view showing a crystal structure of $BaTiO_3$ in the semiconductor device according to the twenty-first embodiment of the present invention;

FIG. 152 illustrates correspondence between an external electric field and a polarization electric field of a dielectric film in the semiconductor device according to the twenty-first embodiment of the present invention;

FIG. 153 is an internal circuit diagram showing the semiconductor device according to the twenty-first embodiment of the present invention;

FIG. 154 is a sectional view showing a step of fabricating the semiconductor device according to the twenty-first embodiment of the present invention;

FIG. 155 is a sectional view showing a step of fabricating the semiconductor device according to the twenty-first embodiment of the present invention;

FIG. 156 is a sectional view showing a step of fabricating the semiconductor device according to the twenty-first embodiment of the present invention;

FIG. 157 is a sectional view showing a step of fabricating the semiconductor device according to the twenty-first embodiment of the present invention;

FIG. 158 is a front sectional view showing the structure of an apparatus which is suitable for carrying out the fabrication method according to the twenty-first embodiment of the present invention;

FIG. 159 is a perspective view showing a reflector in the semiconductor device according to the twenty-first embodiment of the present invention;

FIGS. 160A, 160B and 160C are a plan view, a side elevational view and a front elevational view of the reflector in the semiconductor device according to the twenty-first embodiment of the present invention;

FIG. 161 is a graph showing characteristics of an ECR ion generator in the semiconductor device according to the twenty-first embodiment of the present invention;

FIG. 162 is a plan view showing a semiconductor device according to a twenty-second embodiment of the present invention;

FIG. 163 is a sectional view showing the semiconductor device according to the twenty-second embodiment of the present invention;

FIG. 164 is a sectional view showing the semiconductor device according to the twenty-second embodiment of the present invention;

FIG. 165 is a sectional view showing a step of fabricating the semiconductor device according to the twenty-second embodiment of the present invention;

FIG. 166 is a sectional view showing a step of fabricating the semiconductor device according to the twenty-second embodiment of the present invention;

FIG. 167 is a sectional view showing a step of fabricating the semiconductor device according to the twenty-second embodiment of the present invention;

FIG. 168 is a sectional view showing a step of fabricating the semiconductor device according to the twenty-second embodiment of the present invention;

FIG. 169 is a plan view showing a semiconductor device according to a twenty-third embodiment of the present invention;

FIG. 170 is a sectional view showing the semiconductor device according to the twenty-third embodiment of the present invention;

FIG. 171 is a sectional view showing the semiconductor device according to the twenty-third embodiment of the present invention;

FIG. 172 is a sectional view showing a semiconductor device according to a modification of the twenty-third embodiment of the present invention;

FIG. 173 is a sectional view showing a step of fabricating the semiconductor device according to the twenty-third embodiment of the present invention;

FIG. 174 is a sectional view showing a step of fabricating the semiconductor device according to the twenty-third embodiment of the present invention;

FIG. 175 is a sectional view showing a step of fabricating the semiconductor device according to the twenty-third embodiment of the present invention;

FIG. 176 is a sectional view showing a step of fabricating the semiconductor device according to the twenty-third embodiment of the present invention;

FIG. 177 is a sectional view showing a semiconductor device according to a twenty-fourth embodiment of the present invention;

FIG. 178 illustrates correspondence between an external electric field and a polarization electric field of a dielectric film in the semiconductor device according to the twenty-fourth embodiment of the present invention;

FIG. 179 is an internal circuit diagram showing the semiconductor device according to the twenty-fourth embodiment of the present invention;

FIG. 180 is a plan view showing the semiconductor device according to the twenty-fourth embodiment of the present invention;

FIG. 181 is a sectional view taken along the line A—A in FIG. 180;

FIG. 182 is a sectional view taken along the line B—B in FIG. 180;

FIG. 183 is a sectional view showing a step of fabricating the semiconductor device according to the twenty-fourth embodiment of the present invention along a first direction;

FIG. 184 is a sectional view showing a step of fabricating the semiconductor device according to the twenty-fourth embodiment of the present invention along a second direction;

FIG. 185 is a sectional view showing a step of fabricating the semiconductor device according to the twenty-fourth embodiment of the present invention along the first direction;

FIG. 186 is a sectional view showing a step of fabricating the semiconductor device according to the twenty-fourth embodiment of the present invention along the second direction;

FIG. 187 is a sectional view showing a step of fabricating the semiconductor device according to the twenty-fourth embodiment of the present invention along the first direction;

FIG. 188 is a sectional view showing a step of fabricating the semiconductor device according to the twenty-fourth embodiment of the present invention along the first direction;

FIG. 189 is a sectional view showing a step of fabricating the semiconductor device according to the twenty-fourth embodiment of the present invention along the second direction;

FIG. 190 illustrates voltage-to-current characteristics in the semiconductor device according to the twenty-fourth embodiment of the present invention;

FIG. 191 is a plan view showing a semiconductor device according to a twenty-fifth embodiment of the present invention;

FIG. 192 is a sectional view taken along the line C—C in FIG. 191;

FIG. 193 is a sectional view taken along the line D—D in FIG. 191;

FIG. 194 is a sectional view showing a step of fabricating the semiconductor device according to the twenty-fifth embodiment of the present invention along a first direction;

FIG. 195 is a sectional view showing a step of fabricating the semiconductor device according to the twenty-fifth embodiment of the present invention along a second direction:

FIG. 196 is a sectional view showing a step of fabricating the semiconductor device according to the twenty-fifth embodiment of the present invention along the first direction;

FIG. 197 is a sectional view showing a step of fabricating the semiconductor device according to the twenty-fifth embodiment of the present invention along the second direction;

FIG. 198 is a sectional view showing a step of fabricating the semiconductor device according to the twenty-fifth embodiment of the present invention along the first direction;

FIG. 199 is a sectional view showing a step of fabricating the semiconductor device according to the twenty-fifth embodiment of the present invention along the second direction;

FIG. 200 is a sectional view showing a step of fabricating the semiconductor device according to the twenty-fifth embodiment of the present invention along the first direction;

FIG. 201 is a sectional view showing a step of fabricating the semiconductor device according to the twenty-fifth embodiment of the present invention along the second direction;

FIG. 202 is a sectional view showing a semiconductor device according to a twenty-sixth embodiment of the present invention;

FIG. 203 illustrates gate voltage-to drain current characteristics of the semiconductor device according to the twenty-sixth embodiment of the present invention;

FIG. 204 is an internal circuit diagram showing the semiconductor device according to the twenty-sixth embodiment of the present invention;

FIG. 205 is an explanatory diagram showing peripheral circuits for the semiconductor device according to the twenty-sixth embodiment of the present invention;

FIG. 206 is an internal circuit diagram showing a semiconductor device according to a twenty-seventh embodiment of the present invention;

FIG. 207 is a sectional view showing a semiconductor device according to Prior Art 16;

FIG. 208 is an internal circuit diagram showing the semiconductor device according to Prior Art 16;

FIG. 209 is a sectional view showing a semiconductor device according to Prior Art 17;

FIG. 210 is a sectional view showing a semiconductor device according to Prior Art 18;

FIG. 211 illustrates correspondence between an external electric field and a polarization electric field of a dielectric film in the semiconductor device according to the Prior Art 16;

FIG. 212 is a circuit diagram showing a memory cell of a semiconductor device according to Prior Art 19;

FIG. 213 is a sectional view showing a memory cell of a semiconductor device according to Prior Art 20;

FIG. 214 is a sectional view showing a memory cell of a semiconductor device according to Prior Art 21;

FIG. 215 is a sectional view showing a memory cell of a semiconductor device according to Prior Art 22;

FIG. 216 is a sectional view showing a semiconductor device according to a twenty-eighth embodiment of the present invention;

FIG. 217 is a sectional view showing a step of fabricating the semiconductor device according to the twenty-eighth embodiment of the present invention;

FIG. 218 is a sectional view showing a step of fabricating the semiconductor device according to the twenty-eighth embodiment of the present invention;

FIG. 219 is a sectional view showing a step of fabricating the semiconductor device according to the twenty-eighth embodiment of the present invention;

FIG. 220 is a sectional view showing a step of fabricating the semiconductor device according to the twenty-eighth embodiment of the present invention;

FIG. 221 is a front sectional view showing a structure of an apparatus which is suitable for carrying out a method of fabricating the semiconductor device according to the twenty-eighth embodiment of the present invention;

FIG. 222 is a perspective view showing a reflector in the twenty-eighth embodiment of the present invention;

FIGS. 223A, 223B and 223C are a plan view, a side elevational view and a front elevational view of the reflector in the twenty-eighth embodiment of the present invention respectively;

FIG. 224 is a graph showing characteristics of an ECR ion generator in the twenty-eighth embodiment of the present invention;

FIG. 225 is a sectional view showing a semiconductor device according to a twenty-ninth embodiment of the present invention;

FIG. 226 is a sectional view showing a step of fabricating the semiconductor device according to the twenty-ninth embodiment of the present invention;

FIG. 227 is a sectional view showing a step of fabricating the semiconductor device according to the twenty-ninth embodiment of the present invention;

FIG. 228 is a sectional view showing a step of fabricating the semiconductor device according to the twenty-ninth embodiment of the present invention;

FIG. 229 is a sectional view showing a step of fabricating the semiconductor device according to the twenty-ninth embodiment of the present invention;

FIG. 230 is a sectional view showing a semiconductor device according to a thirtieth embodiment of the present invention;

FIG. 231 illustrates an SRAM of a general 6-transistor CMOS cell;

FIG. 232 is a sectional view showing a semiconductor device according to prior art 23;

FIG. 233 is a sectional view showing a semiconductor device according to prior art 24;

FIG. 234 is a partially enlarged sectional view showing the semiconductor device according to the prior art 24;

FIG. 235 is a front sectional view showing a single-crystalline thin film forming apparatus employed in a thirty-first embodiment of the present invention;

FIG. 236 is a perspective view showing an exemplary reflector employed in the embodiment of the present invention;

FIGS. 237A, 237B and 237C are a plan view, a side elevational view and a front elevational view of an exemplary reflector employed in the thirty-first embodiment of the present invention;

FIG. 238 is a front sectional view showing another single-crystalline thin film forming apparatus employed in the thirty-first embodiment of the present invention;

FIG. 239 is a perspective view showing a liquid crystal display according to a thirty-second embodiment of the present invention;

FIG. 240 is a partially fragmented front sectional view showing the liquid crystal display according to the thirty-second embodiment of the present invention;

FIG. 241 is a plan view showing the liquid crystal display according to the thirty-second embodiment of the present invention;

FIG. 242 illustrates a step in a method of fabricating the liquid crystal display according to the thirty-second embodiment of the present invention;

FIG. 243 illustrates a step in the method of fabricating the liquid crystal display according to the thirty-second embodiment of the present invention;

FIG. 244 illustrates a step in the method of fabricating the liquid crystal display according to the thirty-second embodiment of the present invention;

FIG. 245 illustrates a step in the method of fabricating the liquid crystal display according to the thirty-second embodiment of the present invention;

FIG. 246 illustrates a step in the method of fabricating the liquid crystal display according to the thirty-second embodiment of the present invention;

FIG. 247 illustrates a step in the method of fabricating the liquid crystal display according to the thirty-second embodiment of the present invention;

FIG. 248 illustrates a step in the method of fabricating the liquid crystal display according to the thirty-second embodiment of the present invention;

FIG. 249 illustrates a step in the method of fabricating the liquid crystal display according to the thirty-second embodiment of the present invention;

FIG. 250 illustrates a step in the method of fabricating the liquid crystal display according to the thirty-second embodiment of the present invention;

FIG. 251 illustrates a step in the method of fabricating the liquid crystal display according to the thirty-second embodiment of the present invention;

FIG. 252 illustrates a step in the method of fabricating the liquid crystal display according to the thirty-second embodiment of the present invention;

FIG. 253 illustrates a step in the method of fabricating the liquid crystal display according to the thirty-second embodiment of the present invention;

FIG. 254 is a plan view showing a liquid crystal display according to a thirty-third embodiment of the present invention;

FIG. 255 is a front sectional view showing the liquid crystal display according to the thirty-third embodiment of the present invention;

FIG. 256 illustrates a step in a method of fabricating the liquid crystal display according to the thirty-third embodiment of the present invention;

FIG. 257 illustrates a step in the method of fabricating the liquid crystal display according to the thirty-third embodiment of the present invention;

FIG. 258 illustrates a step in the method of fabricating the liquid crystal display according to the thirty-third embodiment of the present invention;

FIG. 259 illustrates a step in the method of fabricating the liquid crystal display according to the thirty-third embodiment of the present invention;

FIG. 260 illustrates a step in the method of fabricating the liquid crystal display according to the thirty-third embodiment of the present invention;

FIG. 261 illustrates a step in the method of fabricating the liquid crystal display according to the thirty-third embodiment of the present invention;

FIG. 262 illustrates a step in the method of fabricating the liquid crystal display according to the thirty-third embodiment of the present invention;

FIG. 263 illustrates a step in the method of fabricating the liquid crystal display according to the thirty-third embodiment of the present invention;

FIG. 264 illustrates a step in the method of fabricating the liquid crystal display according to the thirty-third embodiment of the present invention;

FIG. 265 illustrates a step in the method of fabricating the liquid crystal display according to the thirty-third embodiment of the present invention;

FIG. 266 illustrates a step in the method of fabricating the liquid crystal display according to the thirty-third embodiment of the present invention;

FIG. 267 is a circuit diagram showing a conventional liquid crystal display according to prior art 25;

FIG. 268 is a sectional view showing a semiconductor device according to a thirty-fourth embodiment of the present invention;

FIG. 269 is a sectional view showing a fabrication step for the semiconductor device according to the thirty-fourth embodiment of the present invention;

FIG. 270 is a sectional view showing a fabrication step for the semiconductor device according to the thirty-fourth embodiment of the present invention;

FIG. 271 is a sectional view showing a fabrication step for the semiconductor device according to the thirty-fourth embodiment of the present invention;

FIG. 272 is a sectional view showing a fabrication step for the semiconductor device according to the thirty-fourth embodiment of the present invention;

FIG. 273 is a sectional view showing a fabrication step for the semiconductor device according to the thirty-fourth embodiment of the present invention;

FIG. 274 is a front sectional view showing a structure of an apparatus which is suitable for carrying out a method according to the thirty-fourth embodiment of the present invention;

FIG. 275 is a perspective view showing an exemplary reflector provided in the thirty-fourth embodiment;

FIGS. 276A, 276B and 276C are a plan view, a side elevational view and a front elevational view of the reflector provided in the thirty-fourth embodiment respectively;

FIG. 277 is a graph showing characteristics of an ECR ion generator in the thirty-fourth embodiment of the present invention;

FIG. 278 is a sectional view showing a semiconductor device according to a thirty-fifth embodiment of the present invention;

FIG. 279 is a sectional view showing a fabrication step for the semiconductor device according to the thirty-fifth embodiment of the present invention;

FIG. 280 is a sectional view showing a fabrication step for the semiconductor device according to the thirty-fifth embodiment of the present invention;

FIG. 281 is a sectional view showing a fabrication step for the semiconductor device according to the thirty-fifth embodiment of the present invention; FIG. 282 is a sectional view showing a fabrication step for the semiconductor device according to the thirty-fifth embodiment of the present invention;

FIG. 283 is a sectional view showing a fabrication step for the semiconductor device according to the thirty-fifth embodiment of the present invention;

FIG. 284 is a sectional view showing a fabrication step for the semiconductor device according to the thirty-fifth embodiment of the present invention;

FIG. 285 is a sectional view showing a finished state of the semiconductor device according to the thirty-fifth embodiment of the present invention;

FIG. 286 is a sectional view showing a fabrication step for a semiconductor device according to a thirty-sixth embodiment of the present invention;

FIG. 287 is a sectional view showing a fabrication step for a semiconductor device according to a thirty-seventh embodiment of the present invention;

FIG. 288 is a sectional view showing a fabrication step for a semiconductor device according to Prior Art 26;

FIG. 289 is a sectional view showing a fabrication step for the semiconductor device according to Prior Art 26;

FIG. 290 is a sectional view showing a fabrication step for the semiconductor device according to Prior Art 26;

FIG. 291 is a sectional view showing a fabrication step for a semiconductor device according to Prior Art 27;

FIG. 292 is a sectional view showing a fabrication step for the semiconductor device according to Prior Art 27;

FIG. 293 Is a sectional view showing a fabrication step for a semiconductor device according to Prior Art 28;

FIG. 294 is a sectional view showing a fabrication step for the semiconductor device according to Prior Art 28;

FIG. 295 is a sectional view showing a fabrication step for the semiconductor device according to Prior Art 28;

FIG. 296 is a sectional view showing a finished state of the semiconductor device according to Prior Art 28;

FIG. 297 is a sectional view showing a semiconductor device according to Prior Art 29;

FIG. 298 is a sectional view showing a semiconductor device according to Prior Art 30; and FIG. 299 is a sectional view showing a semiconductor device according to a modification of Prior Art 30.

DESCRIPTION OF THE PREFERRED EMBODIMENTS (Basic Principle of Formation of Single-Crystalline Thin Film)

A basic principle for efficiently forming a single-crystalline thin film on a substrate is now described.

<Basic Structure of Apparatus 101>

Figure 1:
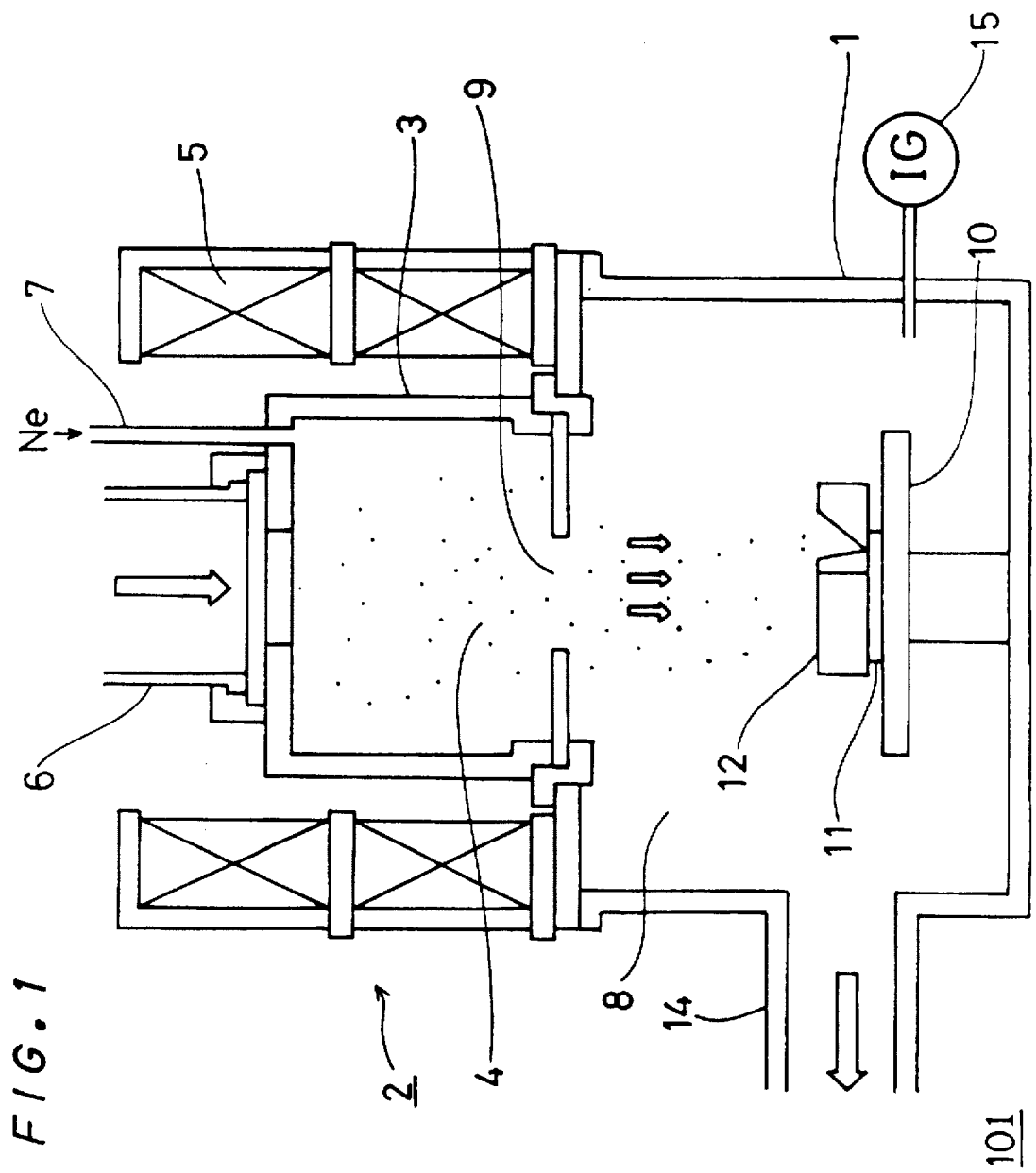
FIG. 1 is a front sectional view showing an exemplary basic structure of a single-crystalline thin film forming apparatus in the present invention.

FIG. 1 is a front sectional view showing an exemplary basic structure of an apparatus 101 for forming a single-crystalline thin film. This apparatus 101 converts a polycrystalline thin film, which is previously formed on a substrate 11, to a single-crystalline thin film, thereby forming a single-crystalline thin film on the substrate 11.

This apparatus 101 comprises a treatment vessel 1, and an electron cyclotron resonance (ECR) ion source 2 which is built in an upper portion of the treatment vessel 1. The ECR ion source 2 comprises a plasma container 3 which defines a plasma chamber 4 in its interior. A magnetic coil 5 is provided around the plasma container 3, to apply a dc high magnetic field to the plasma chamber 4. Further, a waveguide 6 and an inert gas inlet pipe 7 are provided on an upper surface of the plasma container 3 for introducing a microwave and an inert gas such as Ne gas into the plasma chamber 4 respectively.

The treatment vessel 1 defines an irradiation chamber 8 in its interior. The bottom portion of the plasma container 3 defines an outlet 9 for passing a plasma in its center. The irradiation chamber 8 and the plasma chamber 4 communicate with each other through the outlet 9. In the interior of the irradiation chamber 8, a sample holder 10 is arranged on a position immediately under the outlet 9. The substrate 11 is placed on the sample holder 10, while a reflector 12 is placed to be located above the substrate 11. The sample holder 10 comprises a heater (not shown), to heat the substrate 11 and hold the same at a proper high temperature level.

The irradiation chamber 8 communicates with an evacuation pipe 14. An end of the evacuation pipe 14 is coupled with a vacuum unit (not shown) to evacuate the irradiation chamber 8 through the evacuation pipe 14, thereby maintaining the irradiation chamber 8 at a prescribed degree of vacuum. A vacuum gauge 15 for displaying the degree of vacuum in the irradiation chamber 8 is provided in communication with the irradiation chamber 8.

<Structure of Reflector>

Figure 2:
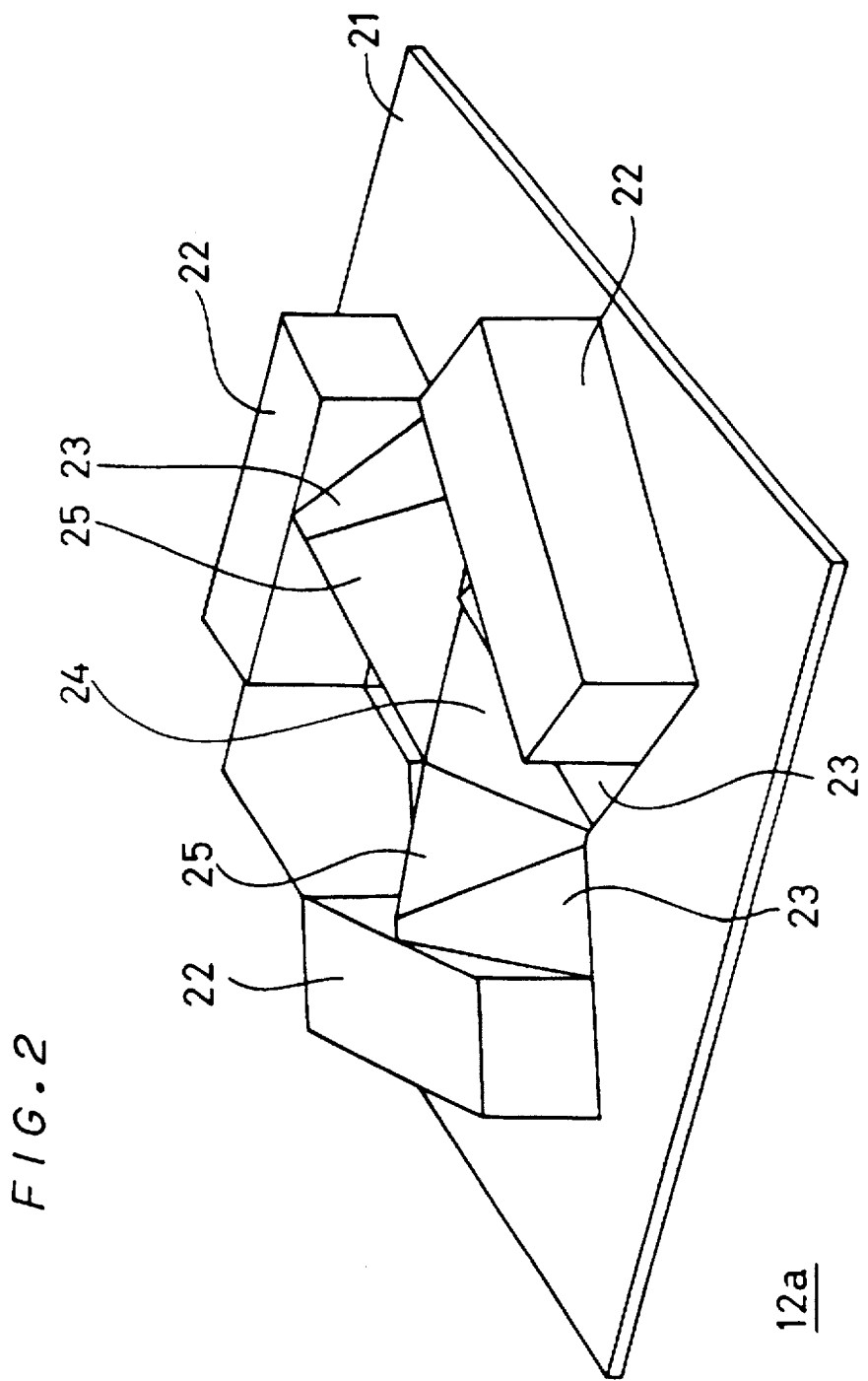
FIG. 2 is a perspective view showing an exemplary reflector which is employed for the single-crystalline thin film forming apparatus in the present invention.

FIG. 2 is a perspective view showing an exemplary reflector 12a. This reflector 12a is adapted to form a single crystal having a diamond structure, such as single-crystalline Si. The reflector 12a defines an opening on a central portion of a flat plate type base 21. Three blocks 22 in the form of rectangular parallelepipeds are fixedly provided around the opening, and reflecting blocks 23 are fixed to inner sides of the blocks 22 respectively. Consequently, an equilateral triangular opening 24 which is trimmed with the reflecting blocks 23 is defined at the central portion of the base 21. In the reflecting blocks 23, slopes 25 facing the opening 24 serve as reflecting surfaces for reflecting a gas beam. Therefore, the angles of inclination of the slopes 25 are set at proper levels in correspondence to the directions of crystal axes of the single crystal to be formed.

Figure 3B:
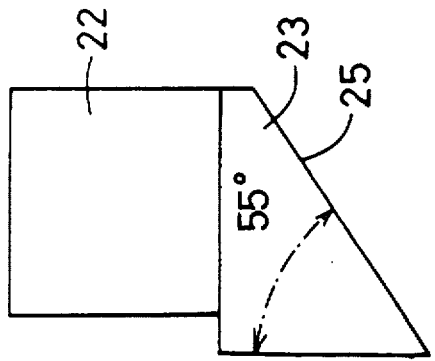
FIGS. 3A, 3B and 3C are a plan view, a side elevational view and a front elevational view of an exemplary reflector which is employed for the single-crystalline thin film forming apparatus in the present invention respectively.
Figure 3A:
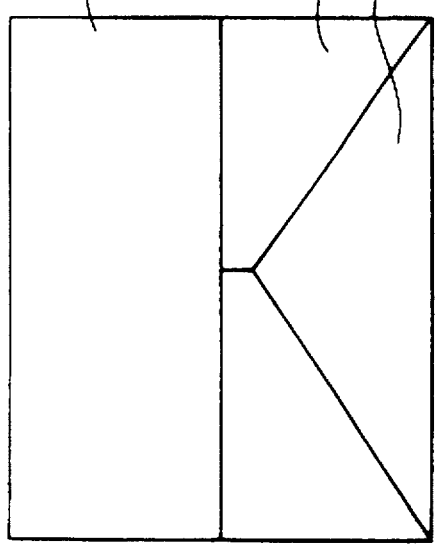
Figure 3C:
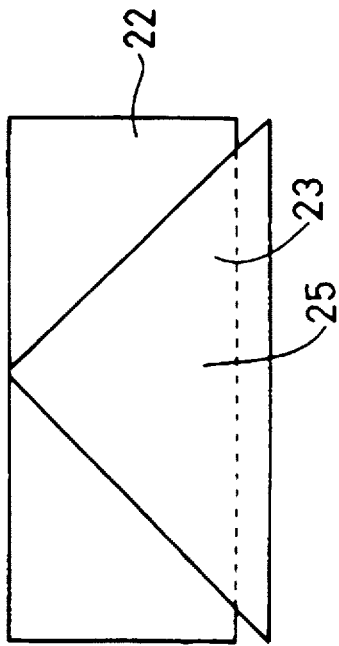

FIGS. 3A, 3B and 3C are a plan view, a side elevational view and a front elevational view of the reflector 12a which is formed by the blocks 22 and the reflecting blocks 23 respectively. As shown in FIG. 3B, the angle of inclination of each slope 25 is set at 55°.

<Operation of ECR Ion Source>

Referring again to FIG. 1, the operation of the ECR ion source 2 is now described. An inert gas such as Ne gas or Ar gas is introduced from the inert gas inlet pipe 7 into the plasma chamber 4, while a microwave is simultaneously introduced from the waveguide 6 into the plasma chamber 4. Further, a dc current is also simultaneously supplied to the magnetic coil 5, to form a dc magnetic field in the plasma chamber 4 and its periphery. The gas as supplied is maintained in a plasma state by actions of the microwave and the dc magnetic field. This plasma is formed by high-energy electrons which are in screw motion in the principle of cyclotron by the microwave and the dc magnetic field.

These electrons, which have diamagnetic properties, are moved to a weaker magnetic field side, to form an electron stream along a line of magnetic force. Consequently, positive ions also form an ion current along the line of magnetic force following the electron stream, in order to maintain electrical neutrality. In other words, the electron stream and the ion current are downwardly directed from the outlet 9 into the irradiation chamber 8. The ion current and the electron stream thus flowing in parallel with each other are recombined with each other after a lapse of a deionization time, to form a neutral atom current. Therefore, substantially only a neutral atom current is formed in a position downwardly separated from the outlet 9 beyond a prescribed distance.

Thus, the ECR ion source 2 for generating ions forms an ion current in parallel with the electron stream, whereby it is possible to easily obtain a neutral atom current having high density by employing the ECR ion source 2, with no employment of other means for neutralizing the ion current. Since the ion current is formed in parallel with the electron stream, further, it is possible to obtain an ion current which is close to a parallel current having a regulated direction of progress substantially with no divergence. Since the parallel ion current is converted to the neutral atom current, the atom current is also close to a parallel current having a regulated direction of progress. Therefore, no other means such as a collimator is required for correcting directivity.

<Operation of Apparatus 101>

Referring again to FIG. 1, the basic operation of the apparatus 101 is now described. It is assumed that the reflector 12 is implemented by the reflector 12a shown in FIGS. 2, 3A, 3B and 3C and the substrate 11 is prepared from polycrystalline $SiO_2$ (quartz), so that a single-crystalline Si thin film is formed on the quartz substrate 11. A polycrystalline Si thin film is previously formed on the quartz substrate 11 by a well-known method such as CVD (chemical vapor deposition).

First, a sample is mounted between the sample holder 10 and the reflector 12a (12). The heater provided in the sample holder 10 holds the sample, i.e., the quartz substrate 11 and the polycrystalline Si thin film, at a temperature of 550° C. This temperature is lower than the crystallization temperature of silicon, whereby single-crystalline Si will not be converted to polycrystalline Si. At the same time, the temperature is at such a high level that polycrystalline Si can be grown to single-crystalline Si if a seed crystal is present.

An inert gas which is introduced from the inert gas inlet pipe 7 is preferably prepared from Ne gas having a smaller atomic weight than Si atoms. Due to the action of the ECR ion source 2, an $Ne^+$ ion current and an electron stream are formed downwardly from the outlet 9. The distance between the outlet 9 and the reflector 12a (12) is preferably set at a sufficient level for substantially converting the $Ne^+$ ion current to a neutral Ne atom current. The reflector 12a (12) is set in a position receiving the downwardly directed Ne atom current.

A part of the downwardly directed Ne atom current is reflected by the three slopes 25 which are formed in the reflector 12a, to be applied to the polycrystalline Si thin film provided on the $SiO_2$ substrate 11 through the opening 24.

Another part of the Ne atom current is not incident upon the slopes 25 but directly incident upon the polycrystalline Si thin film through the opening 24. In other words, the polycrystalline Si thin film is irradiated with four Ne atom current components, i.e., a component straightly received from the outlet 9 and three components reflected by the three slopes 25. Since the angles of inclination of the slopes 25 are set at 55°, directions of incidence of the four Ne atom current components correspond to four directions which are perpendicular to four independent densest crystal planes of the Si single crystal to be formed, i.e., (111) planes.

The energy of the plasma which is formed by the ECR ion source 2 is so set that the Ne atoms reaching the $SiO_2$ substrate 11 are at energy levels which are lower than threshold energy (=27 eV) in sputtering of Si by irradiation with Ne atoms. Therefore, the law of Bravais acts on the polycrystalline Si thin film. Namely, the Si atoms in the vicinity of the surface of the polycrystalline Si thin film are so rearranged that planes which are perpendicular to the direction of incidence of the Ne atomic current as applied define densest crystal planes. Since the Ne atom current as applied has four components which are incident in directions corresponding to those perpendicular to four independent densest planes of the single-crystalline Si, the Si atoms are so rearranged that all planes perpendicular to the directions of incidence define the densest planes. Namely, the directions of rearrangement of the four independent (111) planes are controlled by four Ne atomic beams having directions of incidence which are independent of each other, whereby the crystal orientation is univocally decided. Thus, a layer in the vicinity of the surface of the polycrystalline Si thin film is converted to a single-crystalline Si layer having a regulated crystal orientation.

The temperature of the polycrystalline Si thin film is adjusted to 550° C., i.e., a level within a range suitable for growing a seed crystal, as hereinabove described. Therefore, the single-crystalline Si layer which is formed on the surface of the polycrystalline Si thin film serves as a seed crystal, to be grown toward a deep portion of the polycrystalline Si thin film. Then, the overall region of the polycrystalline Si thin film is converted to a single-crystalline Si layer. Thus, a single-crystalline Si layer having a regulated crystal orientation is formed on the quartz substrate 11.

The single-crystalline Si layer which is formed on the surface of the polycrystalline Si thin film by irradiation to serve as a seed crystal is integral with a layer of polycrystalline Si remaining in the deep portion, since the same is formed by conversion from the polycrystalline Si thin film. Namely, the layer of polycrystalline Si is completely in contact with the seed crystal. Therefore, vertical solid phase epitaxial growth progresses in an excellent state. Further, the seed crystal and the single-crystalline Si formed by solid phase epitaxial growth are made of the same material having the same crystal orientation, whereby it is not necessary to remove the seed crystal after formation of the single-crystalline Si thin film. Further, the single-crystalline Si thin film, which is formed by vertical solid phase epitaxial growth, can be efficiently obtained in a desired state in a shorter time as compared with the prior art 1 with lateral growth.

<Preferable Conditions>

An element forming the atomic beams which are applied to the polycrystalline Si thin film is preferably prepared from Ne which is lighter than Si atoms, as hereinabove described. This is because there is a high possibility that the relatively heavy Si atoms rearwardly scatter the relatively light Ne atoms when the Ne atoms are applied to the Si thin film, whereby the Ne atoms hardly penetrate into the Si thin film to remain therein. When the thin film as irradiated is formed not by a simple substance such as Si but a compound such as GaAs, for example, it is advisable to apply atoms which are lighter than an element having the maximum atomic weight. Further, beams of a compound such as those of $N_2$ may be applied in place of beams of simple atoms, for example. In this case, an element (for example, N atoms) forming the compound is preferably lighter than the element having the maximum atomic weight forming the thin film as irradiated.

Further, an inert element such as Ne is preferably selected as an element forming the as-applied atomic beams. This is because the inert element forms no compound with any element forming the thin film such as Si even if the same remains in the Si thin film, whereby the electronic/physical properties of the Si thin film are hardly influenced by this element and this element can be easily removed by increasing the temperature of the as-finished single-crystalline Si thin film to some extent.

The reflector 12 is preferably made of a metal. This is because $Ne^+$ ions are converted to neutral atoms when an $Ne^+$ ion current which is slightly mixed in the neutral Ne atom current is reflected by the conductive reflector 12, so that the substrate 11 is irradiated with the as-converted neutral Ne atom current. The neutral atom current is advantageously incident upon the substrate 11 as a flow having a regulated direction since its direction of progress hardly diverges dissimilarly to an ion current.

<Basic Structure and Basic Operation of Apparatus 100>

Figure 4:
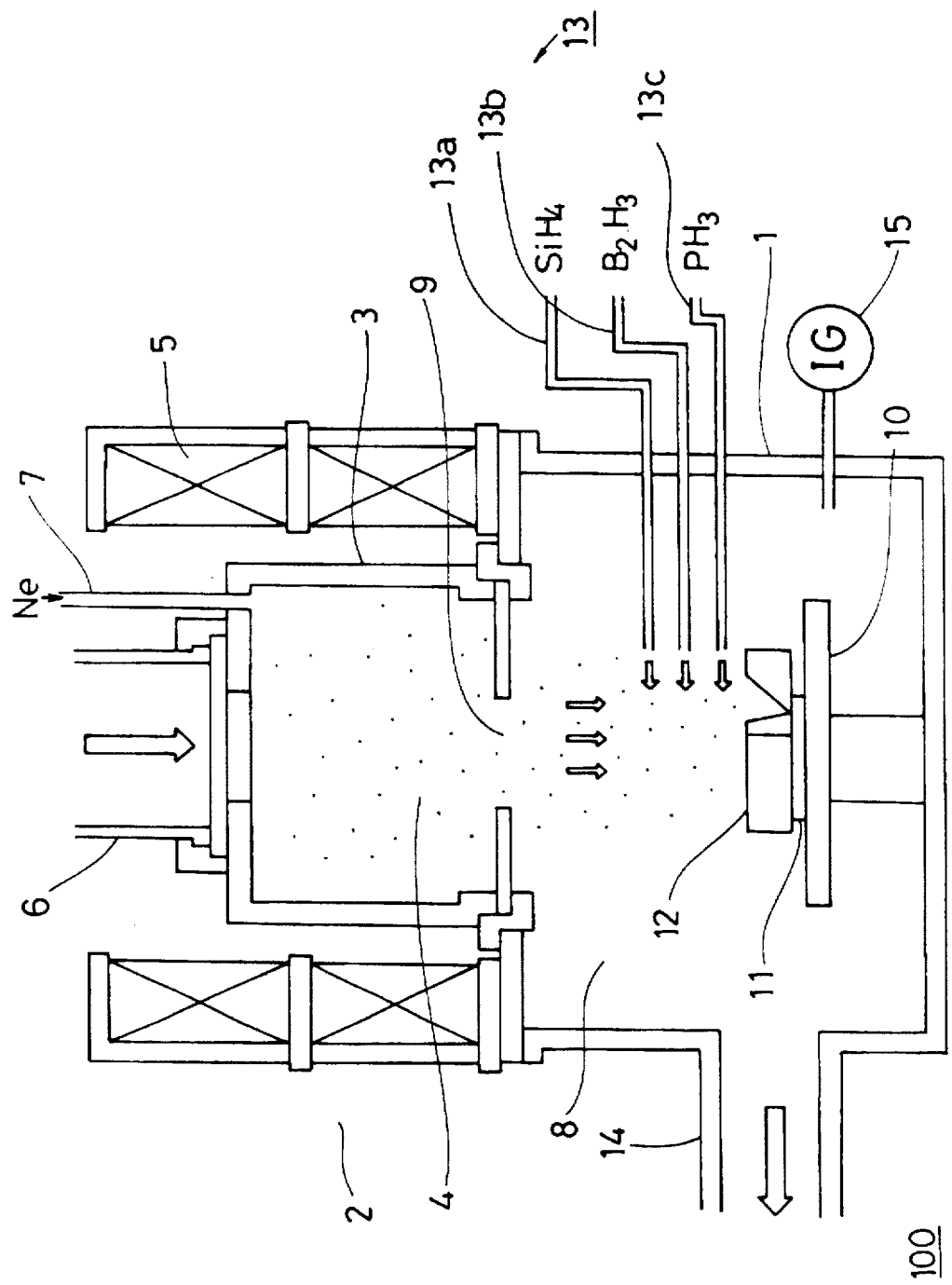
FIG. 4 is a front sectional view showing another exemplary basic structure of a single-crystalline thin film forming apparatus in the present invention.

FIG. 4 is a front sectional view showing the basic structure of another apparatus 100 for forming a single-crystalline thin film on a substrate 11. This apparatus 100 forms a polycrystalline thin film on the substrate 11 while simultaneously irradiating the same with beams, thereby sequentially converting the polycrystalline thin film as being grown to a single-crystalline thin film. In the apparatus 100, a reaction gas supply tube 13 communicates with an irradiation chamber 8. Through this reaction gas supply tube 13, a reaction gas is supplied to form a thin film of a prescribed material on the substrate 11 by plasma CVD. In the example shown in FIG. 4, three reaction gas supply tubes 13a, 13b and 13c are provided.

The apparatus 100 operates as follows: It is assumed that the reflector 12 is implemented by the reflector 12a shown in FIGS. 2, 3A, 3B and 3C and the substrate 11 is prepared from polycrystalline $SiO_2$ (quartz), so that a thin film of single-crystalline Si is formed on the quartz substrate 11. The reaction gas supply tubes 13a, 13b and 13c supply $SiH_4$ (silane) gas for supplying Si, which is a main material for the single-crystalline Si, and $B_2H_3$ (diborane) gas and $PH_3$ (phosphine) gas for doping the substrate 11 with p-type and n-type impurities respectively. Further, Ne gas is introduced from an inert gas inlet pipe 7 into a plasma chamber 4.

The silane gas which is supplied from the reaction gas supply tube 13a is dashed against the $SiO_2$ substrate 11 by an $Ne^+$ ion current or an Ne atom current which is formed by an ECR ion source 2. Consequently, a plasma CVD reaction progresses on the upper surface of the $SiO_2$ substrate 11, to grow a thin film formed by Si which is supplied by the silane gas, i.e., an Si thin film. On the other hand, the diborane gas or the phosphine gas is supplied with a properly adjusted flow rate, whereby a plasma CVD reaction caused by this gas also progresses to form the Si thin film containing B (boron) or P (phosphorus) in desired density.

The SiO$_2$ substrate 11 is not heated and hence maintained substantially at an ordinary temperature. Therefore, the Si thin film is grown substantially under the ordinary temperature. In other words, the Si thin film is formed at a temperature not more than a level facilitating crystallization by plasma CVD. Thus, the Si thin film is first formed as an amorphous Si film by plasma CVD.

The downwardly directed Ne atom current is separated into four components by action of the reflector 12a similarly to the case of the apparatus 101, to be incident upon the Si thin film being formed on the upper surface of the SiO$_2$ substrate 11. Directions of incidence of the four components of the Ne atom current correspond to four directions which are perpendicular to four independent densest crystal planes, i.e., (111) planes, of the Si single crystal to be formed. The energy of the plasma which is formed by the ECR ion source 2 is so set that incident energy levels of these four components are lower than the threshold energy (=27 eV) for Si. Therefore, the law of Bravais acts on the amorphous Si thin film as being grown. Namely, the Si atoms in the amorphous Si are rearranged so that planes which are perpendicular to the Ne atom current of four components applied to the amorphous Si define the densest crystal planes. Consequently, single-crystalline Si having a single crystal orientation is formed. In other words, the amorphous Si thin film being grown by plasma CVD is sequentially converted to a single-crystalline Si thin film having a regulated crystal orientation. The diborane gas or the phosphine gas is supplied by the reaction gas supply pipe 13b or 13c simultaneously with the silane gas, thereby forming a p-type or n-type single-crystalline Si thin film containing B or P. It is also possible to form an equiaxed n-type single-crystalline Si layer on a p-type single-crystalline Si layer, for example, by alternately supplying these reaction gases containing impurity elements.

As hereinabove described, the SiO$_2$ substrate 11 is not heated and the Si thin film is formed under a temperature which is lower than that facilitating crystallization by plasma CVD. This is because the crystal orientation is arbitrarily directed regardless of the directions of the Ne atom current components and cannot be controlled while a polycrystal is inevitably formed under a high temperature facilitating crystallization of Si by plasma CVD alone with no application of the Ne atom current components.

In the apparatus 100, conversion to a single crystal sequentially progresses at the same time in the process of growth of the Si thin film by plasma CVD. Thus, it is possible to form a single-crystalline Si thin film having a large thickness under a low temperature. Since a single-crystalline thin film can be formed under a low temperature, it is possible to further form a new single-crystalline thin film on a substrate which is already provided with a prescribed device without changing properties of the device, for example. Thus, it is possible to form a single-crystalline thin film not only on a substrate which serves only as a support member for a thin film but on a substrate of a device having a prescribed structure and functions in this apparatus 100.

<Other Examples of Single-Crystalline Thin Film Formation>

It is also possible to form a single-crystalline thin film having a crystal structure other than a diamond structure. In this case, still another reflector may be prepared to have a crystal structure which is suitable for the target crystal structure. Further, it is also possible to form a single-crystalline thin film having various crystal orientations in the same crystal structure. In this case, a reflector which is suitable for respective crystal orientations is prepared, as hereinafter described.

In each of the apparatuses 100 and 101, it is possible to form not only the aforementioned Si single-crystalline thin film but various types of single-crystalline thin films on substrates such as compound single-crystalline thin films of GaAs, GaN and the like and a single-crystalline thin film of an insulator such as SiO$_2$, for example. Further, it is possible to form single-crystalline thin films on substrates of various types of media such as SiO$_2$, glass, polycrystalline/amorphous/single-crystalline semiconductor, a metal and the like.

In order to form a single-crystalline thin film of GaN, for example, a polycrystalline GaN film may be first grown on an Si substrate by general CVD, and N$_2$ (nitrogen) gas or NH$_3$ (ammonia) gas containing N atoms may be introduced into the inert gas inlet pipe 7 through the apparatus 101, to irradiate the GaN thin film with a molecular flow of the gas or a dissociated N atom current, for example. The as-applied N atoms which may remain in the interior of GaN are assembled into the single crystal as an element forming GaN, and hence there is no possibility of exerting a bad influence on the properties of GaN.

In order to form a GaAs single-crystalline thin film, on the other hand, a

GaAs polycrystalline thin film may be first grown on an Si substrate or the like by general molecular beam epitaxy, so that conditions identical to those for forming an Si single-crystalline thin film are employed except that the substrate temperature is maintained at 500° C., the gas as applied is prepared from low-priced Ar gas and the reflector is prepared from a Ta plate with employment of the apparatus 101. A GaAs single-crystalline thin film can be obtained by this method. In order to form such a GaN or GaAs single-crystalline thin film, the apparatus 100 may alternatively be employed in place of the apparatus 101, to simultaneously carry out formation of a polycrystalline thin film and conversion to a single crystal by irradiation with gas beams, as a matter of course.

<Embodiments Regarding Micromachine and Method of Manufacturing the Same>

Description is now made on embodiments of methods of manufacturing micromachines comprising members having single-crystalline layers on the basis of the aforementioned method.

(B-1. First Embodiment)

<Structure and Operation of Machine>

Figure 5:
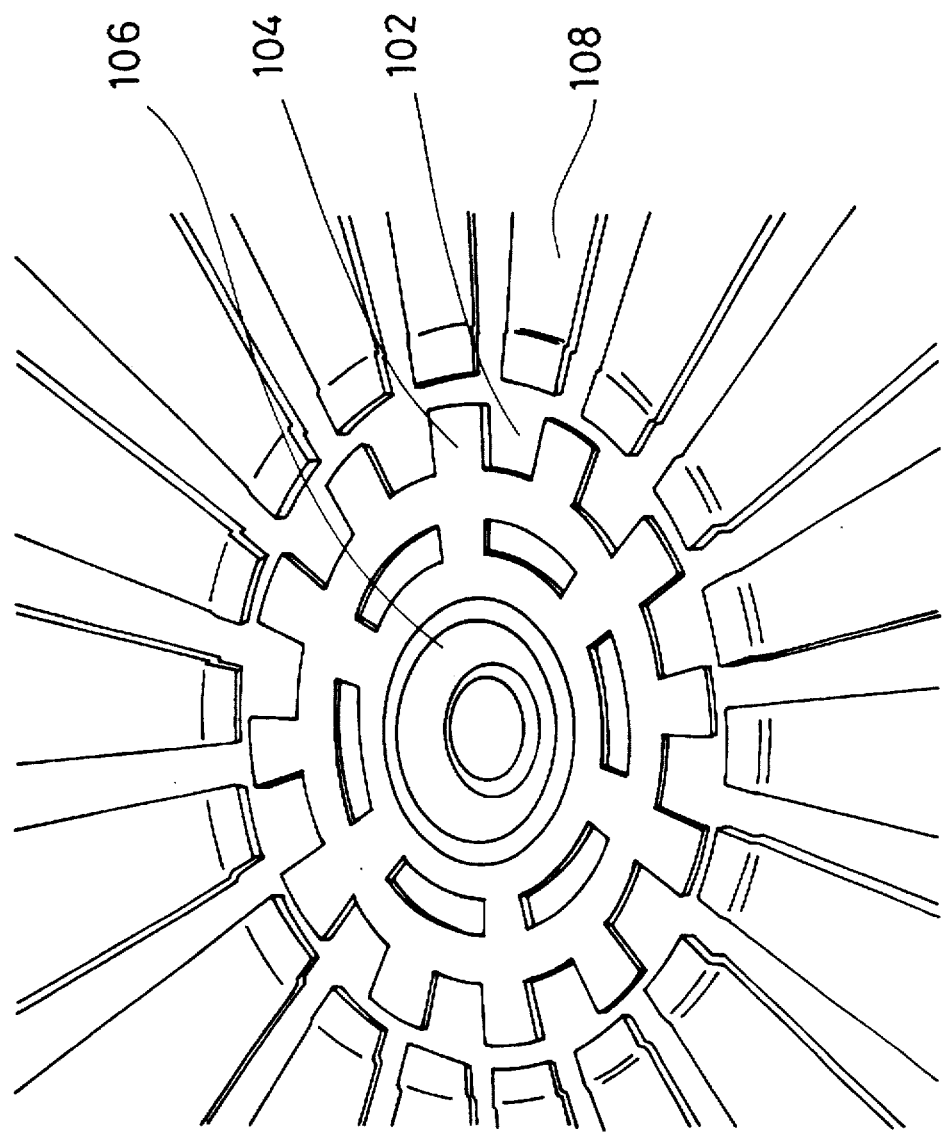
FIG. 5 is a perspective view showing a micromachine manufactured according to a first embodiment of the present invention.
Figure 6:
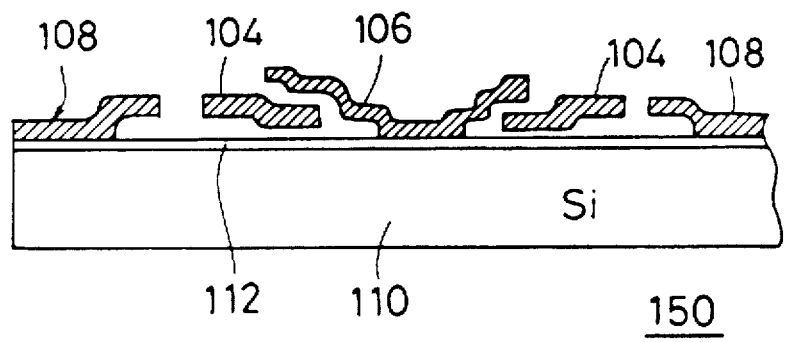
FIG. 6 is a front sectional view of the micromachine manufactured according to the first embodiment of the present invention.

FIGS. 5 and 6 are a perspective view and a front sectional view showing the structure of a micromachine 150 according to a first embodiment of the present invention respectively. This micromachine 150 is formed by improving the conventional electrostatic motor 3000. In this electrostatic motor 150, a nitride film (Si$_3$N$_4$ film) 112 is formed on a single-crystalline Si substrate 110, and a rotary shaft 106 and a stator 108 of single-crystalline Si are fixedly formed on the nitride film 112, while a ring-shaped rotator 104 of single-crystalline Si is stopped on the rotary shaft 106 with a clearance. Thus, the rotator 104 is rotatable about the rotary shaft 106.

The stator 108 is formed by a plurality of electrically isolated members which are radially arranged to enclose the rotator 104 with prescribed clearances. Alternating voltages which are out of phase with each other are independently applied to these members of the stator 108. Consequently, electrostatic attractive or repulsive force is formed across the stator 108 and the rotator 104, while a carrier of such force is successively moved between the respective members, thereby rotating the rotator 104.

This electrostatic motor 150 is hardly abraded since both of the rotator 104 and the rotary shaft 106 which are in sliding motion with each other are made of hard single-crystalline Si. Therefore, this electrostatic motor 150 can be used for a long time and practically applicable. Further, this electrostatic motor 150 is also suitable for use under corrosive environment, since single-crystalline Si is also excellent in corrosion resistance.

<Method of Manufacturing Machine>

Figure 7:
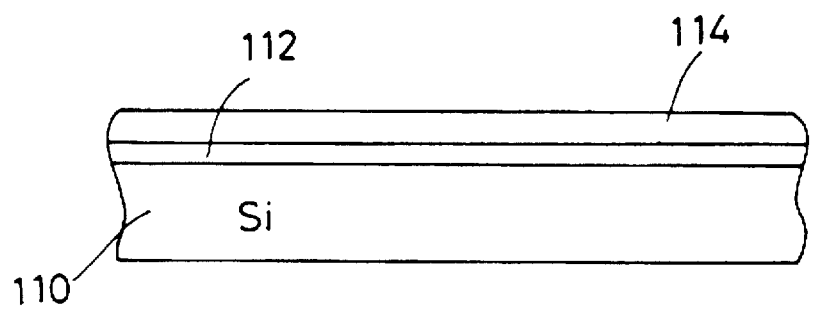
FIG. 7 illustrates a step of manufacturing the micromachine according to the first embodiment of the present invention.

FIGS. 7 to 15 illustrate steps of manufacturing the electrostatic motor 150. In order to manufacture the electrostatic motor 150, the nitride film 112 is first formed on the single-crystalline substrate 110 by CVD (chemical vapor deposition), whereafter an $SiO_2$ layer 114 is formed on the nitride film 112 also by CVD, as shown in FIG. 7.

Figure 8:
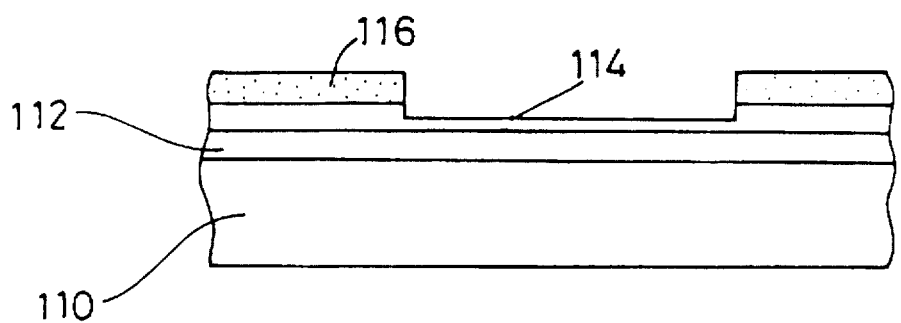
FIG. 8 illustrates a step of manufacturing the micromachine according to the first embodiment of the present invention.

Then, a photoresist film is formed on the $SiO_2$ layer 114 and selectively removed by photolithography, to form a masking member 116 having an opening, as shown in FIG. 8. Thereafter the masking member 116 is used as a shielding member to carry out etching, thereby selectively removing the $SiO_2$ layer 114 to a certain depth. The masking member 116 is removed after the etching. The as-formed $SiO_2$ layer 114 serves as a sacrifice layer in a later step.

Figure 9:
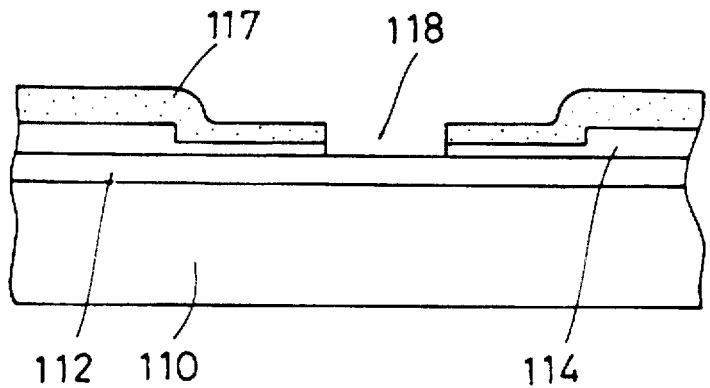
FIG. 9 illustrates a step of manufacturing the micromachine according to the first embodiment of the present invention.

Then, a new masking member 117 is formed on the upper surface and used as a shielding member to carry out etching, for selectively removing a central portion 118 of the $SiO_2$ layer 114 having a small thickness and exposing the nitride film 112, as shown in FIG. 9. Thereafter the masking member 117 is removed.

Figure 10:
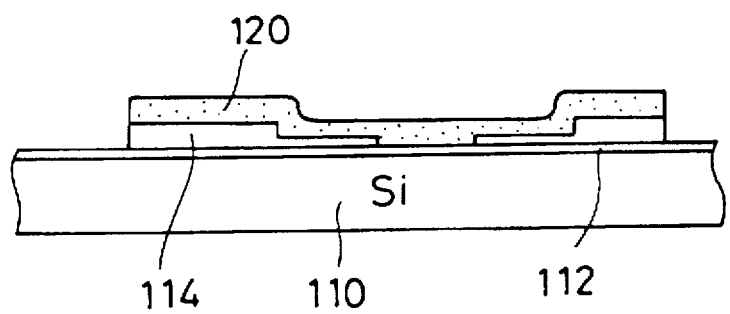
FIG. 10 illustrates a step of manufacturing the micromachine according to the first embodiment of the present invention.

Then, another new masking member 120 is formed on the upper surface and used as a shielding member to carry out etching, for selectively removing a peripheral portion of the $SiO_2$ layer 114 and exposing the nitride film 112 in this portion, as shown in FIG. 10. The masking member 120 is removed after the etching.

Figure 11:
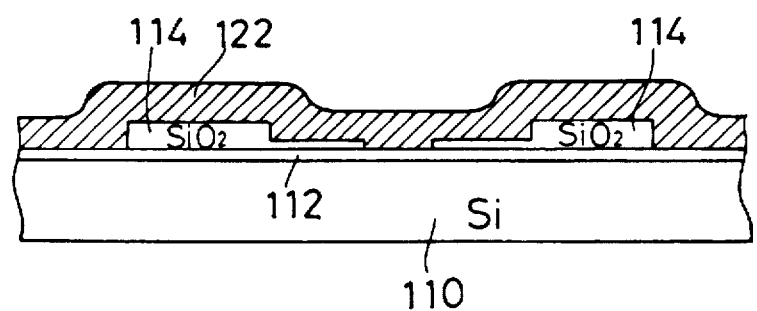
FIG. 11 illustrates a step of manufacturing the micromachine according to the first embodiment of the present invention.

Then, a polycrystalline Si (polysilicon) layer 122 is formed on the nitride film 112 and the $SiO_2$ layer 114 by CVD, as shown in FIG. 11. This polycrystalline Si layer 112 has a thickness of about 2.5 μm. Thereafter the apparatus 101 is employed to irradiate the polycrystalline Si layer 122 with an Ne atom current, thereby converting the polycrystalline Si layer 122 to a single-crystalline Si layer.

Figure 12:
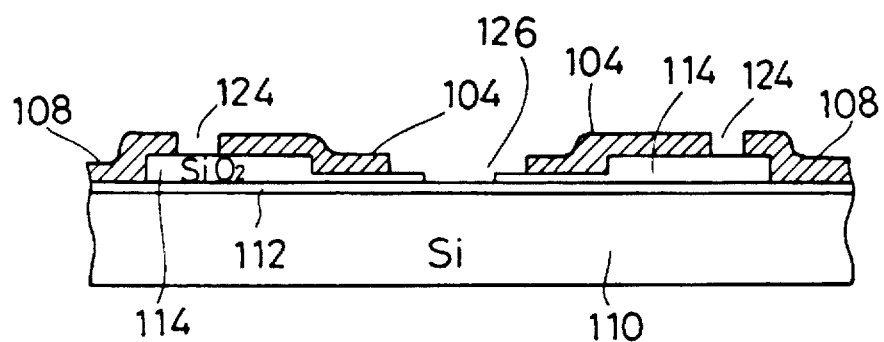
FIG. 12 illustrates a step of manufacturing the micromachine according to the first embodiment of the present invention.

Thereafter a prescribed masking member (not shown) is formed on the upper surface and used as a shielding member to carry out etching, for selectively removing the single-crystallized Si layer 122 and forming openings 124 and 126, as shown in FIG. 12. Through this step, the stator 108 and the rotator 104 are formed from the single-crystallized Si layer 122.

Figure 13:
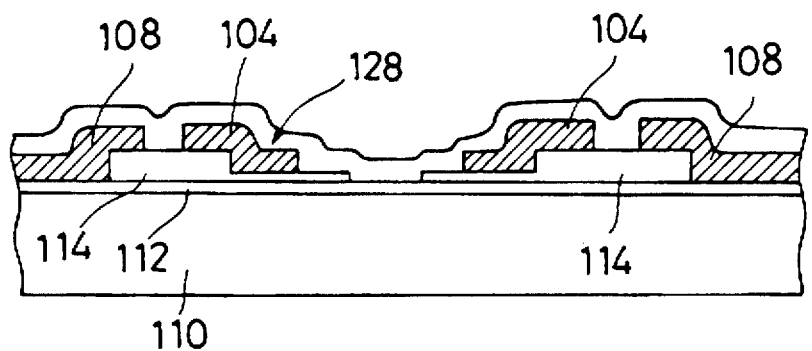
FIG. 13 illustrates a step of manufacturing the micromachine according to the first embodiment of the present invention.

Then, a new $SiO_2$ layer 128 is formed on the upper surface by CVD, as shown in FIG. 13.

Figure 14:
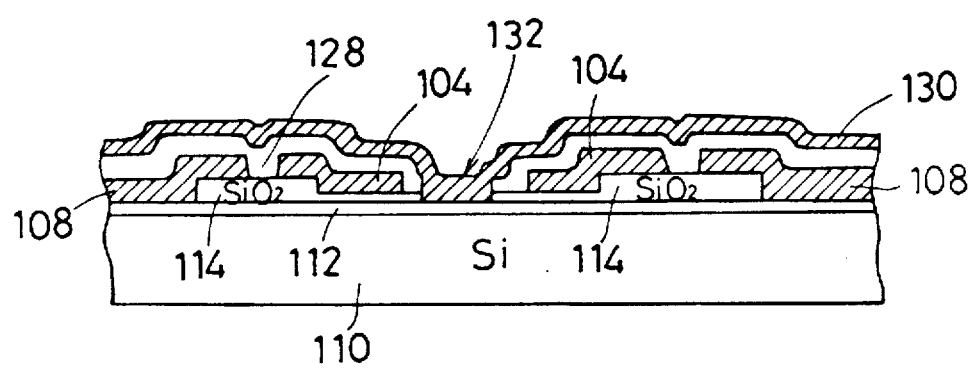
FIG. 14 illustrates a step of manufacturing the micromachine according to the first embodiment of the present invention.

Thereafter a region 132 of the $SiO_2$ layer 128 corresponding to a central portion of the opening 126 is selectively removed, whereafter a second polycrystalline Si layer 130 is formed by CVD, as shown in FIG. 14. The $SiO_2$ layer 128 serves as a second sacrifice layer. Thereafter application of an Ne atom current is executed by the apparatus 101, to convert the polycrystalline Si layer 130 to a single-crystalline Si layer.

Figure 15:
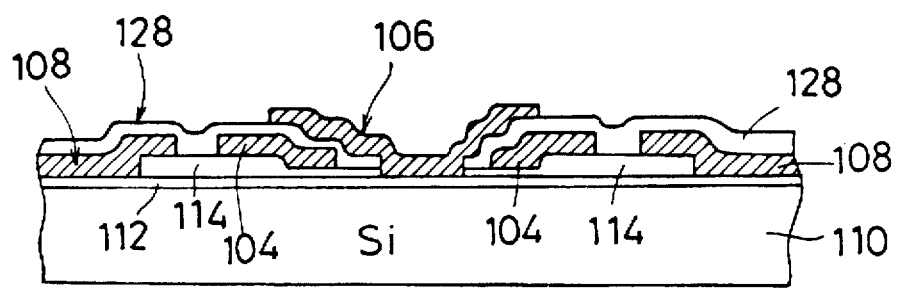
FIG. 15 illustrates a step of manufacturing the micromachine according to the first embodiment of the present invention.

Then, a masking member (not shown) having a prescribed masking pattern is used as a shielding member to carry out etching, for selectively removing the single-crystallized Si layer 130. Through this step, the rotary shaft 106 which is made of single-crystalline Si and fixedly connected to the nitride film 112 is finished, as shown in FIG. 15.

Finally, the two $SiO_2$ layers 114 and 128 serving as sacrifice layers are simultaneously removed by etching. Consequently, the electrostatic motor 150 shown in FIG. 6 is completed.

According to this method, a polycrystalline Si layer which is temporarily formed on a sacrifice layer of $SiO_2$ is converted to a single-crystalline Si layer by irradiation with an Ne atom current. Thus, it is possible to form a single-crystalline Si layer on the sacrifice layer. Therefore, it is possible to easily form complicated members of single-crystalline Si, particularly the rotator 104 and the rotary shaft 106 which are at least partially separated from the nitride film 112 serving as a base material, by single-crystalline Si without employing a junction technique.

In place of forming the polycrystalline Si layers 122 and 130 first and thereafter converting the same to single-crystalline Si layers, amorphous Si layers may be grown by the apparatus 100 with simultaneous irradiation with Ne atom currents, to form the single-crystalline Si layers 122 and 130. In either method, the single-crystalline Si layers are formed on sacrifice layers.

(Second Embodiment)

Figure 16:
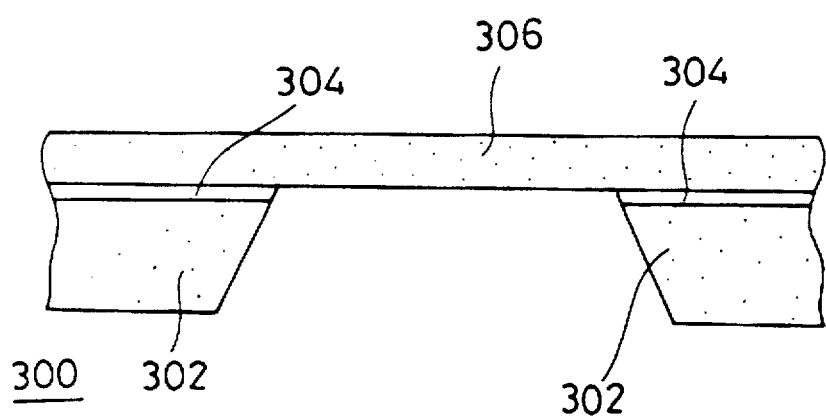
FIG. 16 is a front sectional view showing a micromachine manufactured according to a second embodiment of the present invention.

FIG. 16 is a front elevational view showing a principal part of a micromachine 300 according to a second embodiment of the present invention. This micromachine 300 has a diaphragm, and can be applied to a pressure sensor or the like, for example. In this micromachine 300, a single-crystalline Si thin film 306 is formed on an upper surface of a single-crystalline Si substrate 302 through an $SiO_2$ film 304. Central portions of the substrate 302 and the $SiO_2$ film 304 are selectively removed, whereby a central portion of the Si thin film 306 defines a diaphragm.

In this micromachine 300, it is possible to apply large elastic deformation to the diaphragm, which is made of single-crystalline Si. Further, this micromachine 300 is also excellent in corrosion resistance, whereby the same is also suitable for use under corrosive environment, such as a pressure sensor for measuring pressures of chemicals, for example. An insulator is interposed between the Si thin film 306 and the substrate 302, whereby the substrate 302 is electrically isolated from an electronic element such as a distortion gauge which is formed on the Si thin film 306. Thus, the electronic element is not inhibited from a normal operation.

Figure 17:
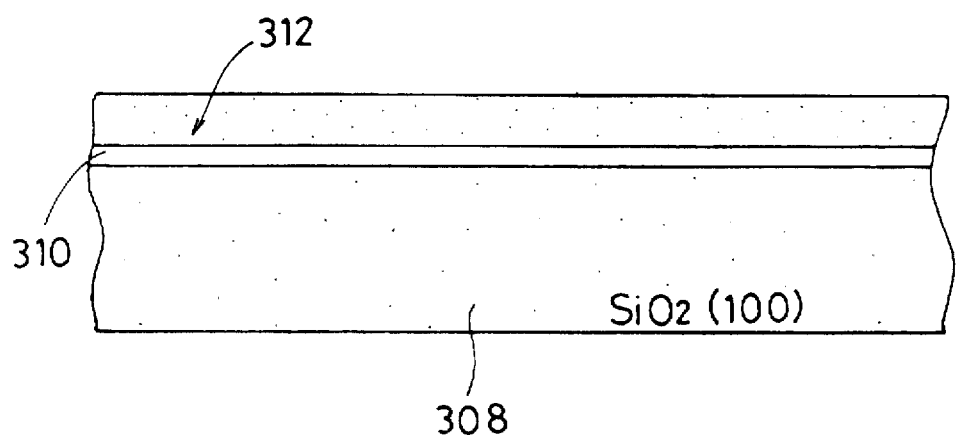
FIG. 17 illustrates a step of manufacturing the micromachine according to the second embodiment of the present invention.
Figure 18:
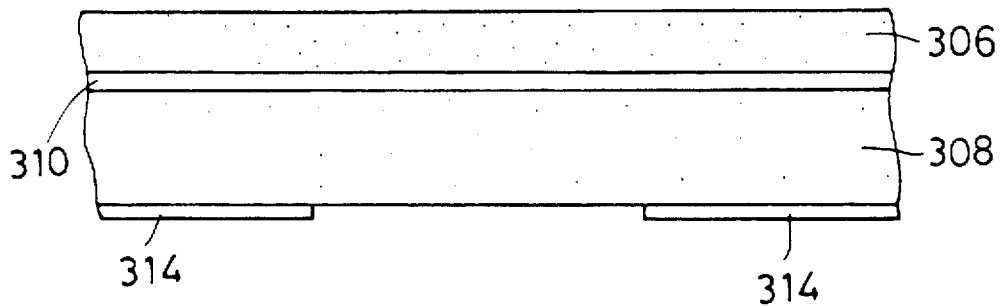
FIG. 18 illustrates a step of manufacturing the micromachine according to the second embodiment of the present invention.
Figure 19:
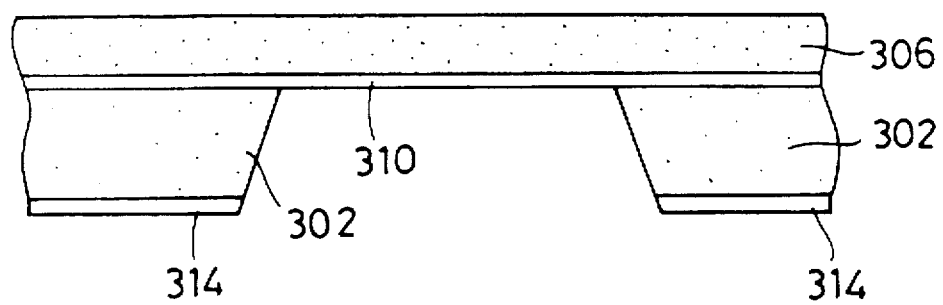
FIG. 19 illustrates a step of manufacturing the micromachine according to the second embodiment of the present invention.

FIGS. 17 to 19 illustrate steps of manufacturing the micromachine 300. In order to manufacture this micromachine 300, a single-crystalline Si substrate 308 is first prepared, as shown in FIG. 17. The (100) plane of this Si substrate 308 is along its upper surface. Then, an $SiO_2$ film 310 consisting of an insulator is formed on the upper surface of the Si substrate 308. Thereafter a polycrystalline Si thin film 312 is formed on the $SiO_2$ film 310 by CVD, and then converted to a single-crystalline Si thin film by the apparatus 100.

Then, a masking member 314 is selectively formed on a bottom surface of the Si substrate 308, as shown in FIG. 18. Thereafter the masking member 314 is used as a shielding member to carry out etching, for selectively removing a portion of the substrate 302 from the bottom surface, as shown in FIG. 19. At this time, an etchant is so employed that the etching hardly progresses with respect to the (111) plane of the Si substrate 308 and the $SiO_2$ film 310. Therefore, a V-shaped groove is defined on the bottom surface of the substrate 302. Since the SiO₂ film 310 serves as an etching stopper, the etching will not progress into the interior of the SiO₂ film 310 but stops on its bottom surface. Then, a portion of the SiO₂ film 310 which is exposed on the groove is etched through another etchant, to complete the micromachine 300 shown in FIG. 16.

The apparatus 101 may be employed in place of the apparatus 100, to form the single-crystalline Si thin film 306 by growing an amorphous Si thin film on the SiO₂ film 310 and irradiating the same with an Ne atom current. In the method according to this embodiment, the single-crystalline Si thin film 306 is formed on the SiO₂ layer 304 in situ with no employment of a junction technique, whereby it is possible to easily manufacture the micromachine 300 having a diaphragm which is made of single-crystalline Si.

(Third Embodiment)

Figure 20:
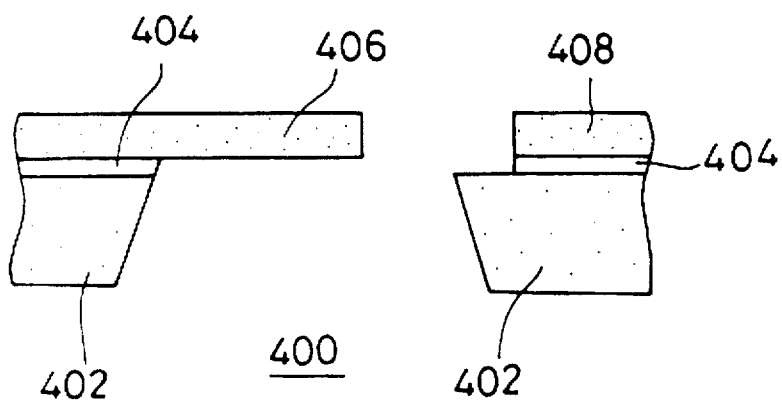
FIG. 20 is a front sectional view showing a micromachine manufactured according to a third embodiment of the present invention.

FIG. 20 is a front elevational view showing a principal part of a micromachine 400 according to a third embodiment of the present invention. This micromachine 400 has a cantilever, and can be applied to an acceleration sensor, for example. In this micromachine 400, single-crystalline Si thin films 406 and 408 are formed on an upper surface of a single-crystalline Si substrate 402 through an SiO₂ layer 404. Central portions of the substrate 402 and the SiO₂ layer 404 are selectively removed, while an end of the Si thin film 406 is not coupled to the substrate 402 but serves as a free end. Namely, the Si thin film 406 defines a cantilever.

The cantilever is made of single-crystalline Si in this micromachine 400, whereby it is possible to apply large elastic deformation to this cantilever. Further, it is possible to form a highly reliable acceleration sensor having uniform characteristics such as an elastic constant in the cantilever.

Figure 21:
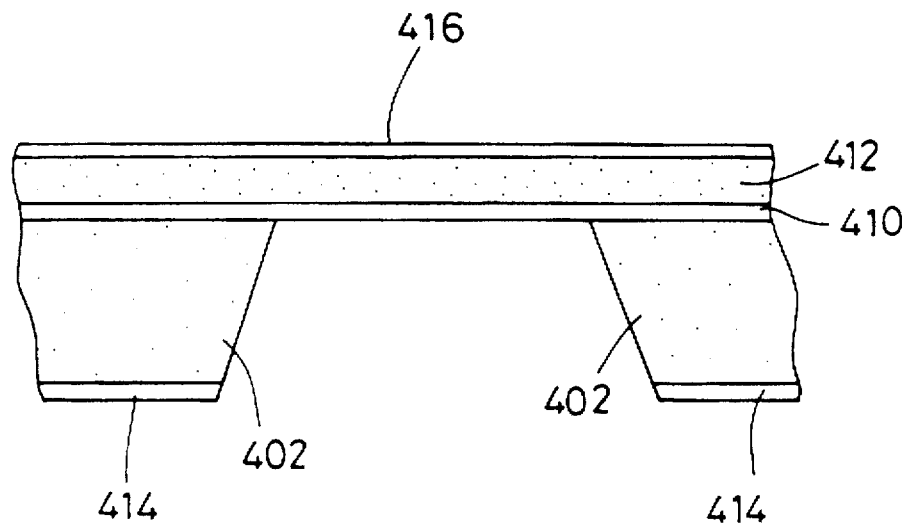
FIG. 21 illustrates a step of manufacturing the micromachine according to the third embodiment of the present invention.

In order to manufacture this micromachine 400, the steps in the method of manufacturing the micromachine 300 according to the second embodiment of the present invention shown in FIGS. 17 to 19 are carried out to form an intermediate body having the single-crystalline Si substrate 302 (402), the SiO₂ film 310 (410), the single-crystalline Si thin film 312 (412) and the masking member 314 (414). Thereafter a photoresist film 416 is formed on the single-crystalline Si thin film 412, as shown in FIG. 21.

Figure 22:
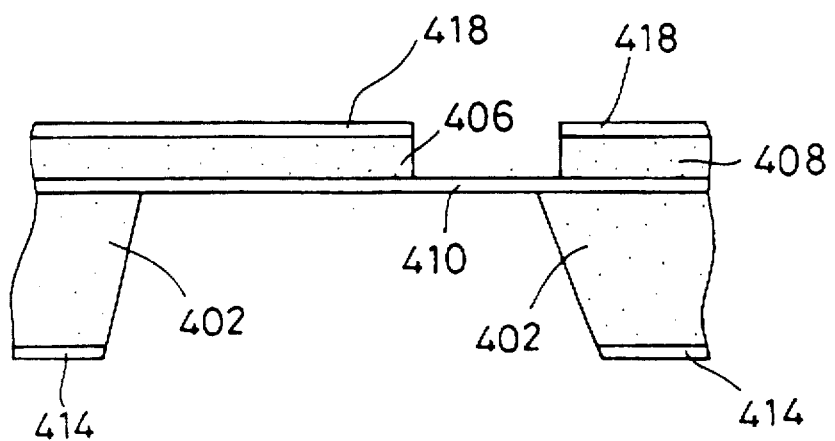
FIG. 22 illustrates a step of manufacturing the micromachine according to the third embodiment of the present invention.

Then, the photoresist film 416 is selectively removed, to form a masking member 418 having a prescribed masking pattern, as shown in FIG. 22. Then, this masking member 418 is used as a shielding member to carry out etching, for selectively removing the Si thin film 412. Thus, the Si thin films 406 and 408 which are separated from each other are formed from the Si thin film 412. Finally, an exposed portion of the SiO₂ film 410 is removed by etching, to complete the micromachine 400 having a cantilever shown in FIG. 20.

The apparatus 101 may be employed in place of the apparatus 100, to form the single-crystalline Si thin film 406 by growing an amorphous Si thin film on the SiO₂ film 410 and irradiating the same with an Ne atom current. In the method according to this embodiment, the single-crystalline Si thin film 406 is formed on the SiO₂ layer 404 in situ with no employment of a junction technique, whereby it is possible to easily manufacture the micromachine 400 having a cantilever which is made of single-crystalline Si.

(Fourth Embodiment)

Figure 23:
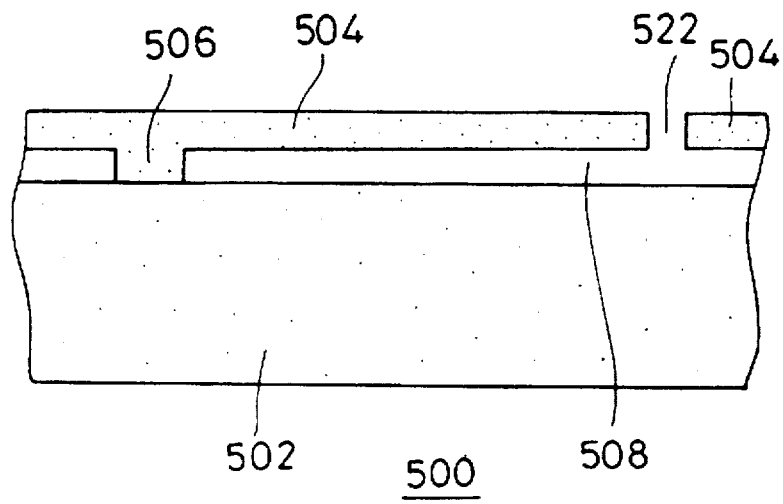
FIG. 23 is a front sectional view showing a micromachine manufactured according to a fourth embodiment of the present invention.

FIG. 23 is a front elevational view showing a principal part of a micromachine 500 according to a fourth embodiment of the present invention. This micromachine 500 is provided with a beam structure member having a part which is fixed to a base material and a remaining part which is upwardly raised from the base material. Namely, a beam member 504 is fixedly coupled onto a single-crystalline Si substrate 502 serving as a base material in a specific portion 506. The remaining part of the beam member 504 is separated from the surface of the substrate 502 with a constant clearance 508. This beam member 504 is also made of single-crystalline Si. Therefore, it is possible to apply large elastic deformation to the beam member 504. Further, the beam member 504 has uniform characteristics such as strength, whereby a highly reliable micromachine 500 can be formed.

Figure 24:
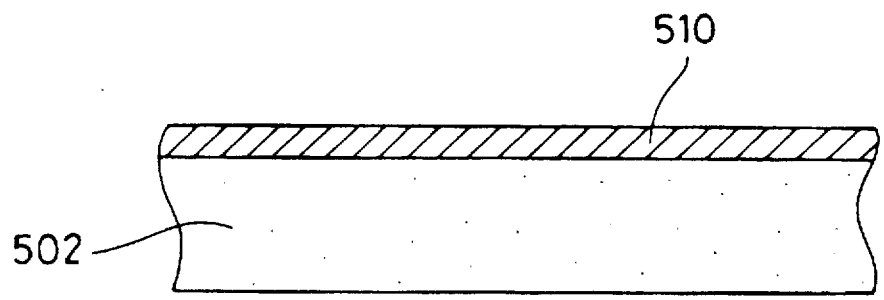
FIG. 24 illustrates a step of manufacturing the micromachine according to the fourth embodiment of the present invention.

FIGS. 24 to 28 illustrate steps of manufacturing the micromachine 500. In order to manufacture the micromachine 500, an SiO₂ layer 510 for serving as a sacrifice layer is first formed on the substrate 502, as shown in FIG. 24.

Figure 25:
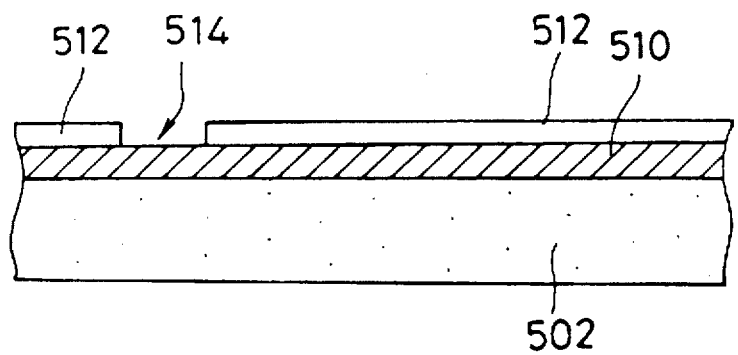
FIG. 25 illustrates a step of manufacturing the micromachine according to the fourth embodiment of the present invention.
Figure 26:
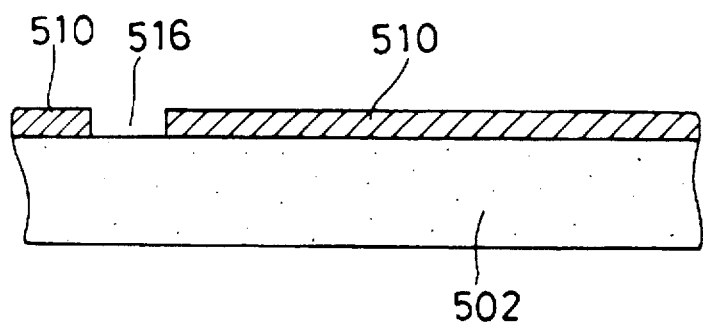
FIG. 26 illustrates a step of manufacturing the micromachine according to the fourth embodiment of the present invention.

Then, a masking member 512 having a prescribed masking pattern is formed on the SiO₂ layer 510, as shown in FIG. 25. The masking member 512 defines an opening 514. Thereafter the masking member 512 is used as a shielding member to carry out etching, for forming an opening 516 in the SiO₂ layer 510, as shown in FIG. 26. Consequently, an upper surface portion of the substrate 502 is exposed in this opening 516.

Figure 27:
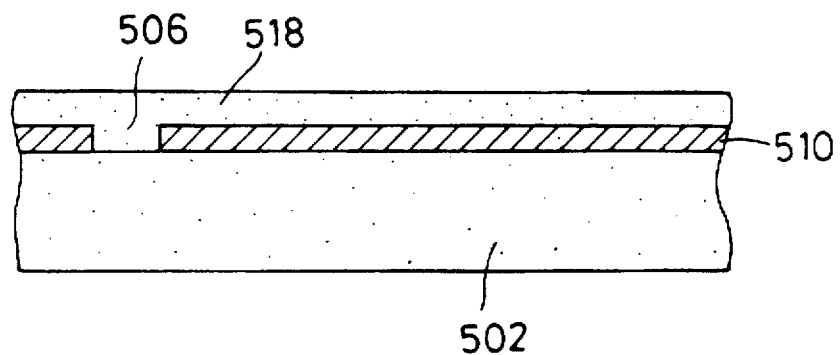
FIG. 27 illustrates a step of manufacturing the micromachine according to the fourth embodiment of the present invention.

Then, the apparatus 100 is employed to form an amorphous Si layer and apply Ne atoms along the overall surfaces of the substrate 502 and the SiO₂ layer 510, thereby forming a single-crystalline Si layer 518, as shown in FIG. 27.

Figure 28:
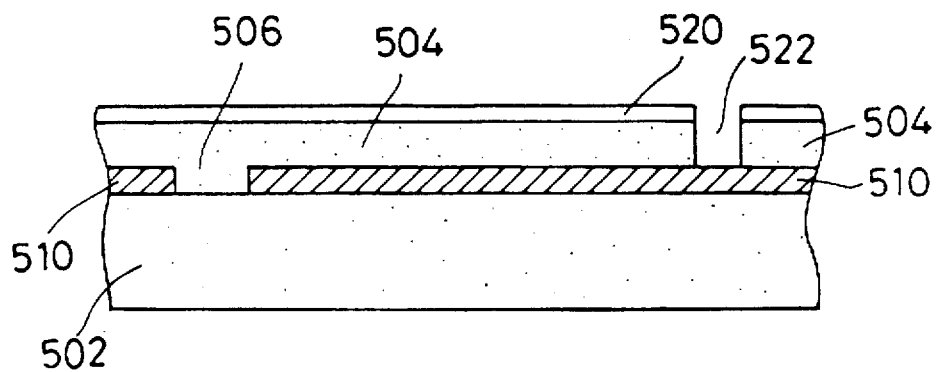
FIG. 28 illustrates a step of manufacturing the micromachine according to the fourth embodiment of the present invention.

Then, a masking member 520 having a prescribed masking pattern is formed on the single-crystalline Si layer 518, and used as a shielding member to carry out etching for selectively removing the Si layer 518, as shown in FIG. 28. Due to this treatment, the Si layer 518 is formed into the shape of the beam member 504. Finally, an etchant is infiltrated from a selectively removed portion 522 of the Si layer 518, to entirely remove the SiO₂ layer 510 serving as a sacrifice layer. Consequently, the micromachine 500 shown in FIG. 23 is completed.

In the method according to this embodiment, the single-crystalline Si layer 518 is formed on the single-crystalline Si substrate 502 in situ with no employment of a junction technique, whereby it is possible to easily manufacture the micromachine 500 having the beam member 504 which is made of single-crystalline Si.

(Fifth Embodiment)

<Linear Actuator>

Figure 29:
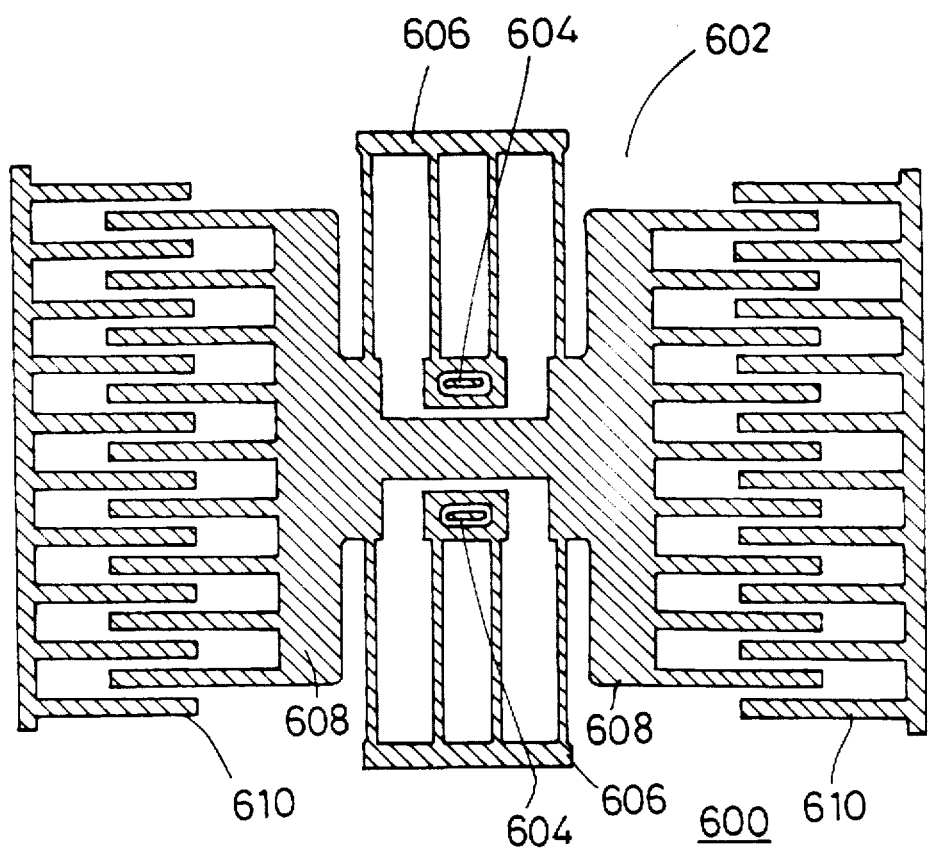
FIG. 29 is a plan view showing a micromachine manufactured according to a fifth embodiment of the present invention.

FIG. 29 is a plan view showing a micromachine 600 according to a fifth embodiment of the present invention. This micromachine 600 is formed by improving the conventional actuator 2030. In this actuator 600, fixed electrodes 610 and movable parts 606, both of which are made of single-crystalline Si, are formed on a single-crystalline Si substrate 602. This embodiment is different from the conventional actuator 2030 in a point that the fixed electrodes 610 and the movable pans 606 are made of single-crystalline Si.

The comb-shaped fixed electrodes 606 are fixed on the single-crystalline Si substrate 602 in base portions thereof, so that comb-shaped protrusions are upwardly raised from the single-crystalline Si substrate 602 with constant spaces. On the other hand, the movable parts 606 are fixed to the single-crystalline Si substrate 602 only in support portions 604, so that other portions are entirely upwardly raised from the single-crystalline Si substrate 602 with prescribed spaces. Namely, both of the movable parts 606 and the fixed electrodes 610 are examples of the beam member 504 in the micromachine 500 according to the fourth embodiment of the present invention. The movable parts 606 also have comb-shaped forward end portions 608, which are engaged with the fixed electrodes 610 with no contact.

When voltages are applied to the fixed electrodes 610, electrostatic attractive or repulsive force acts across the same and the forward end portions 608, whereby the forward end portions 608 are straightly displaced in a horizontal plane. Namely, this actuator 600 is a linear actuator. At this time, members coupling the forward end portions 608 and the support portions 604 are elastic members serving as sources of restoring force with respect to the displacement of the forward end portions 608, and elastically deformed following the displacement of the forward end portions 608. The elastically deformed movable parts 606 are made of single-crystalline Si dissimilarly to the conventional actuator 2030, whereby it is possible to apply large elastic deformation to the movable parts 606.

This actuator 600 is manufactured by steps which are similar to those for manufacturing the micromachine 500. Namely, the micromachine 600 is manufactured by utilization of sacrifice layers and formation of single-crystalline Si layers on the sacrifice layers. The members such as the movable parts 606 and the fixed electrodes 610 having complicated shapes which are made of single-crystalline Si are formed on the single-crystalline Si substrate 602 in situ with no employment of a junction technique, whereby it is possible to manufacture the actuator 600 which is easy to manufacture in high accuracy.

<Rotary Actuator>

Figure 30:
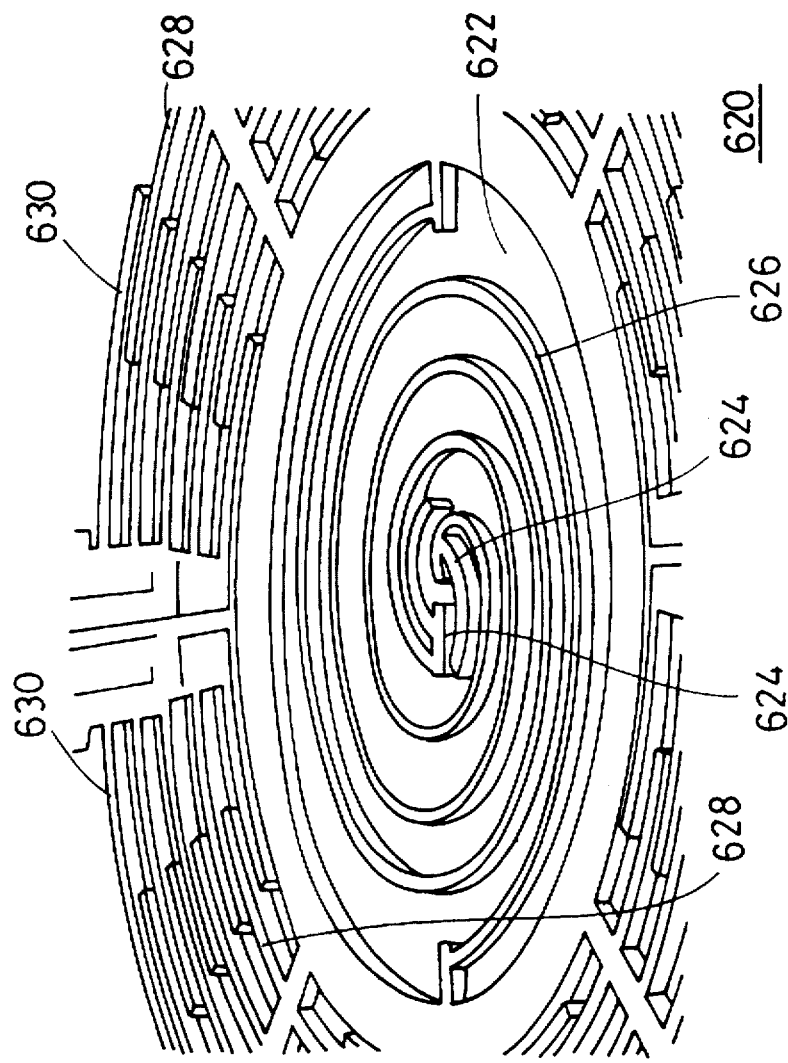
FIG. 30 is a perspective view of the micromachine manufactured according to the fifth embodiment of the present invention.

FIG. 30 is a perspective view showing another micromachine 620 according to the fifth embodiment of the present invention. This micromachine 620 serves as an actuator, whose movable parts 626 carry out rotary motion. In this actuator 620, fixed electrodes 630 and the movable parts 626, both of which are made of single-crystalline Si, are formed on a single-crystalline Si substrate 622.

The comb-shaped fixed electrodes 630 are fixed on the single-crystalline Si substrate 622 in base portions thereof, so that comb-shaped protrusions are upwardly raised from the single-crystalline Si substrate 622 with constant spaces. On the other hand, the movable parts 626 are fixed to the single-crystalline Si substrate 622 only in support portions 624, so that other portions are entirely upwardly raised from the single-crystalline Si substrate 622 with prescribed spaces. Namely, both of the movable parts 626 and the fixed electrodes 630 are examples of the beam member 504 in the micromachine 500 according to the fourth embodiment of the present invention, similarly to the actuator 600. The movable parts 626 also have comb-shaped forward end portions 628, which are engaged with the fixed electrodes 630 with no contact. These comb-shaped protrusions protrude in directions along the circumference, dissimilarly to the actuator 600.

When voltages are applied to the fixed electrodes 630, electrostatic attractive or repulsive force acts across the same and the forward end portions 628, whereby the forward end portions 628 are straightly displaced in the direction along the circumference. At this time, members coupling the forward end portions 628 and the support portions 624 are elastic members serving as sources of restoring force with respect to the displacement of the forward end portions 628, and elastically deformed following the displacement of the forward end portions 628. The elastically deformed movable parts 626 are made of single-crystalline Si, whereby it is possible to apply large elastic deformation to the movable parts 626.

This actuator 620 is manufactured by steps which are similar to those for manufacturing the micromachine 500, similarly to the actuator 600. Namely, the actuator 620 is manufactured by utilization of sacrifice layers and formation of single-crystalline Si layers on the sacrifice layers. The members such as the movable parts 626 and the fixed electrodes 630 having complicated shapes which are made of single-crystalline Si are formed on the single-crystalline Si substrate 622 in situ with no employment of a junction technique, whereby it is possible to manufacture the actuator 620 which is easy to manufacture in high accuracy.

<Relay>

FIGS. 31 and 32 are a front sectional view and a perspective view showing still another micromachine 640 according to the fifth embodiment of the present invention respectively. This micromachine 640 is a two-contact type relay, whose movable part 644 is inclined by action of electrostatic attractive or repulsive force to open/close contacts. In this relay 640, a pair of driving electrodes 648a and 648b and two pairs of contact electrodes 650a and 650b are formed on an upper surface of a glass substrate 642. These electrodes are formed by vapor-depositing thin films of Au (gold) and selectively removing the same. The movable part 644 for opening/closing the contacts is made of single-crystalline Si and fixedly coupled to the upper surface of the glass substrate 642 in its central portion 646, while the remaining portion is upwardly raised from the upper surface of the glass substrate 642. Namely, the movable part 644 serves as an example of the beam member 504 in the micromachine 500 according to the fourth embodiment of the present invention.

When voltages are applied to the driving electrodes 648a and 648b, the movable part 644 is so elastically deformed as to close either pair of the contact electrodes 650a and 650b while opening the other pair. Since the movable part 644 is made of single-crystalline Si, it is possible to apply large elastic deformation thereto. Thus, contact spaces in opening can be set at large levels, whereby it is possible to form a highly reliable relay having a high withstand voltage.

In order to form the movable part 644 on the glass substrate 642, a step which is similar to that for forming the beam member 504 in the micromachine 500 may be carried out. Namely, the movable part 644 is formed by utilization of a sacrifice layer and formation of a single-crystalline Si layer on the sacrifice layer. According to this method, further, a technique of forming a single-crystalline Si layer by application of an atom current is so employed that it is possible to form a single-crystalline Si layer on the amorphous glass substrate 642, being made of a material which is different from Si, with no employment of a junction technique. Thus, it is possible to manufacture the relay 460 which is easy to manufacture in high accuracy.

(Sixth Embodiment)

<Hollow Vessel>

FIG. 33 is a front sectional view showing a micromachine 700 according to a sixth embodiment of the present invention. This micromachine 700 is a hollow vessel which defines a cavity 706 in its interior. This hollow vessel 700 is formed by a substrate 702 which defines a groove in its upper surface, and an upper cover 704 which defines a groove in its lower surface. Both of the substrate 702 and the upper cover 704 are made of single-crystalline Si. Therefore, this hollow vessel 700 is excellent in strength and corrosion resistance, and suitable for a passage or a valve for a corrosive fluid.

FIGS. 34 to 37 illustrate steps of manufacturing the hollow vessel 700. In order to manufacture the hollow vessel 700, the upper surface of the single-crystalline Si substrate 702 is first selectively removed to form a groove 708, as shown in FIG. 34. This single-crystalline Si substrate 702 is so crystal-oriented that its (100) plane is along its upper surface, and anisotropic etching of preferentially etching the (100) plane is employed for forming the groove 708.

Figure 35:
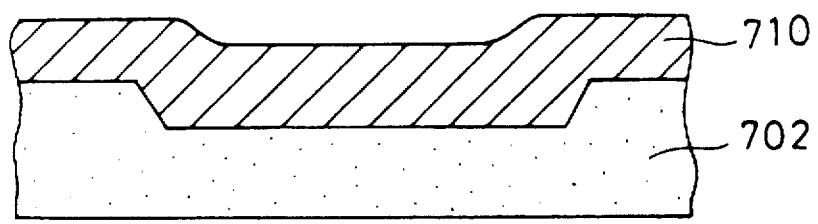
FIG. 35 illustrates a step of manufacturing the micromachine according to the sixth embodiment of the present invention.
Figure 36:
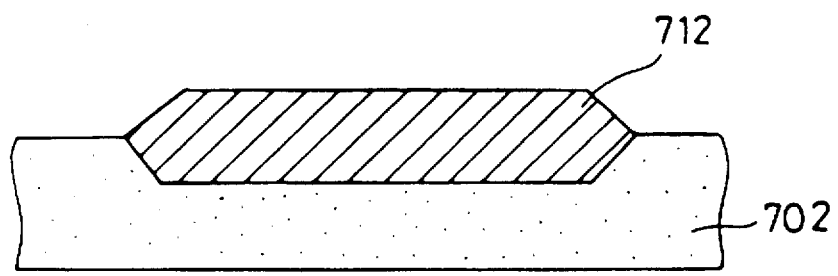
FIG. 36 illustrates a step of manufacturing the micromachine according to the sixth embodiment of the present invention.

Then, an $SiO_2$ film 710 is formed along the overall upper surface of the substrate 702, as shown in FIG. 35. Thereafter the $SiO_2$ layer 710 is selectively removed, to form a sacrifice layer 712 of $SiO_2$, as shown in FIG. 36.

Figure 37:
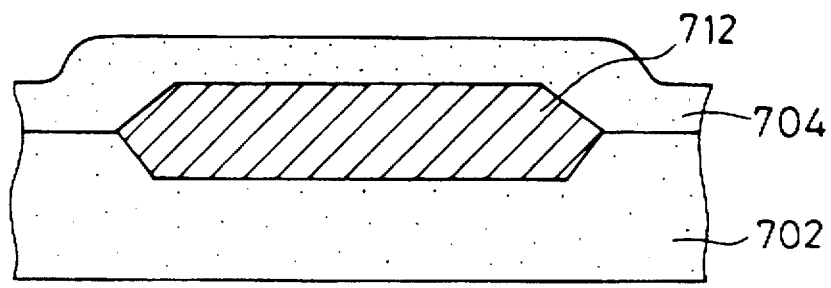
FIG. 37 illustrates a step of manufacturing the micromachine according to the sixth embodiment of the present invention.

Then, the apparatus 100 is employed to form an amorphous Si layer on the upper surfaces of the sacrifice layer 712 and the substrate 702 while irradiating the same with an Ne atom current, thereby forming the upper cover 704 of single-crystalline Si, as shown in FIG. 37. Finally, etching is carried out to entirely remove the sacrifice layer 712. Consequently, the hollow vessel 700 shown in FIG. 33 is completed.

In the method according to this embodiment, the upper cover 704 of single-crystalline Si is formed on the single-crystalline Si substrate 702 in situ with no employment of a junction technique, whereby it is possible to manufacture the hollow vessel 700 which is easy to manufacture and in high dimensional accuracy.

<Hollow Vessel Storing Member>

Figure 38:
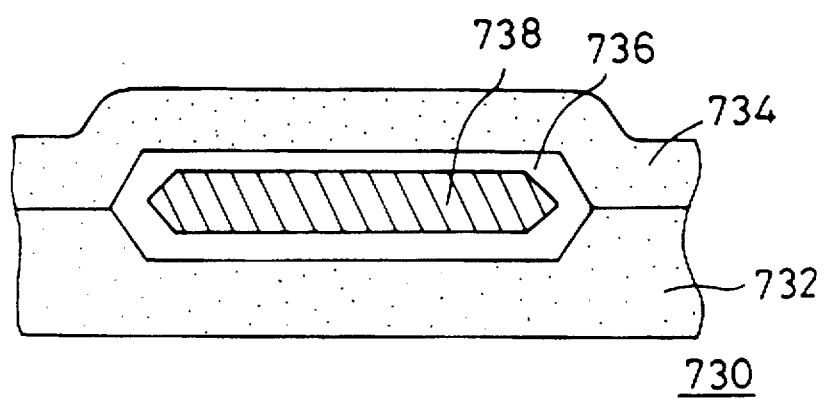
FIG. 38 is a front sectional view showing another micromachine manufactured according to the sixth embodiment of the present invention.

FIG. 38 is a front sectional view showing another micromachine 730 according to the sixth embodiment of the present invention. This micromachine 730 is a hollow vessel defining a cavity 736 in its interior, and a plate-type member 738 is inserted in the cavity 736 which is defined by a substrate 732 and an upper cover 734. Except such insertion of the member 738, this hollow vessel 730 has a structure which is similar to that of the aforementioned hollow vessel 700. The hollow vessel 730 as well as the member 738 are made of single-crystalline Si. Therefore, this hollow vessel 730 is so excellent in strength and corrosion resistance that the same is suitable for a valve for a corrosive fluid or the like. Further, the hollow vessel 730 is also excellent in elastic limit in addition to strength, whereby the same is also suitable for use as a pressure sensor which employs the member 738 as a vibrator.

Figure 39:
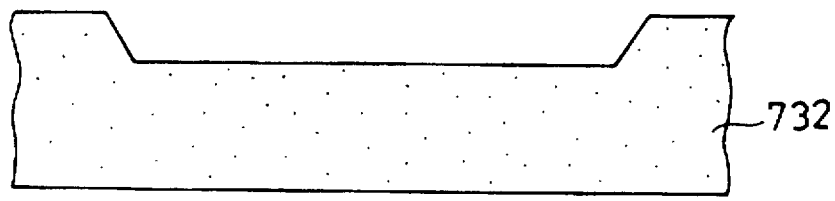
FIG. 39 illustrates a step of manufacturing the micromachine according to the sixth embodiment of the present invention.

FIGS. 39 to 45 illustrate steps of manufacturing this hollow vessel 730. In order to manufacture the hollow vessel 730, the upper surface of the single-crystalline Si substrate 732 is first selectively removed to form a groove, as shown in FIG. 39. This single-crystalline Si substrate 732 is so crystal-oriented that its (100) plane is along its upper surface, and anisotropic etching of preferentially etching the (100) plane is employed for forming the groove.

Figure 40:
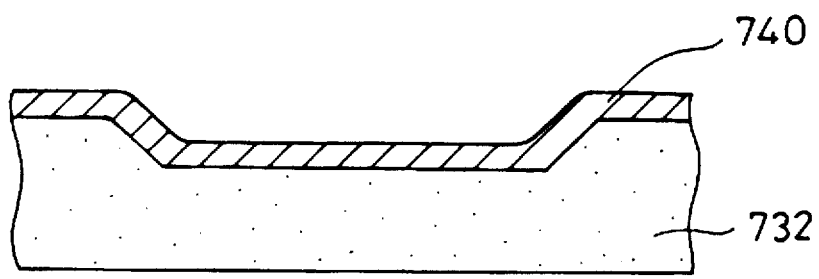
FIG. 40 illustrates a step of manufacturing the micromachine according to the sixth embodiment of the present invention.
Figure 41:
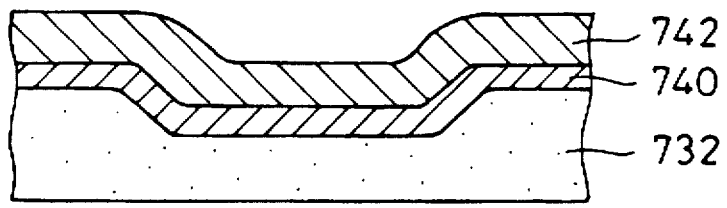
FIG. 41 illustrates a step of manufacturing the micromachine according to the sixth embodiment of the present invention.
Figure 42:
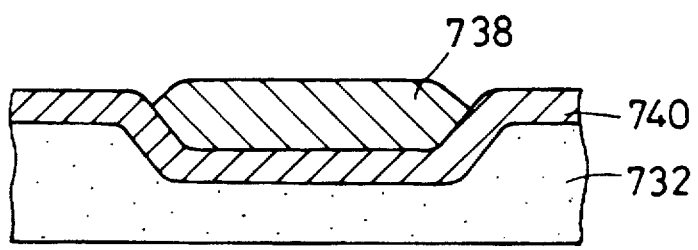
FIG. 42 illustrates a step of manufacturing the micromachine according to the sixth embodiment of the present invention.

Then, an $SiO_2$ film 740 for serving as a sacrifice layer is formed along the overall upper surface of the substrate 732, as shown in FIG. 40. Thereafter a polycrystalline Si layer 742 is formed on the $SiO_2$ layer 740, and the apparatus 100 is employed to irradiate this Si layer 742 with an Ne atom current, thereby converting the Si layer 742 to a single-crystalline Si layer, as shown in FIG. 41. Then, a masking member (not shown) is employed as a shielding member to carry out etching, for selectively removing the Si layer 742 and forming the plate-type member 738 (FIG. 42).

Figure 43:
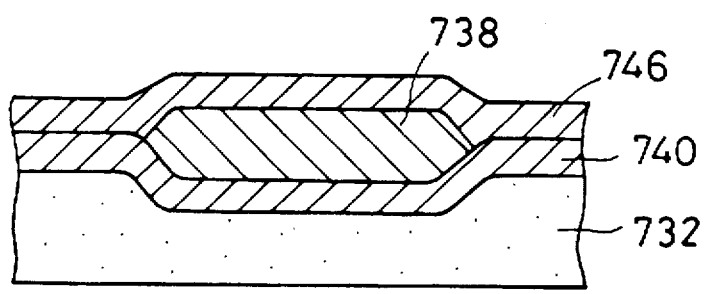
FIG. 43 illustrates a step of manufacturing the micromachine according to the sixth embodiment of the present invention.
Figure 44:
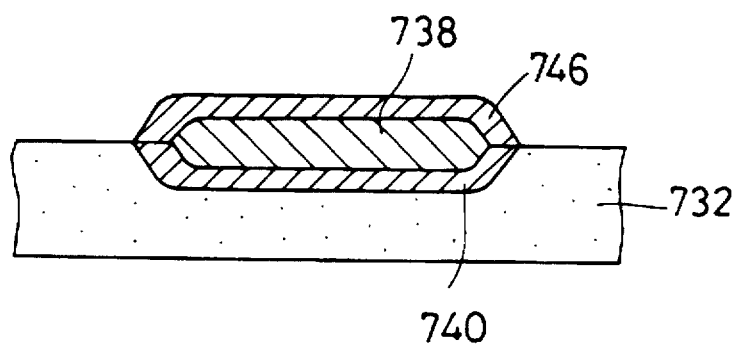
FIG. 44 illustrates a step of manufacturing the micromachine according to the sixth embodiment of the present invention.

Then, another $SiO_2$ layer 746 for serving as another sacrifice layer is newly formed on the upper surfaces of the $SiO_2$ layer 740 and the member 738, as shown in FIG. 43. Thereafter the two $SiO_2$ layers 740 and 746 are selectively removed, as shown in FIG. 44.

Figure 45:
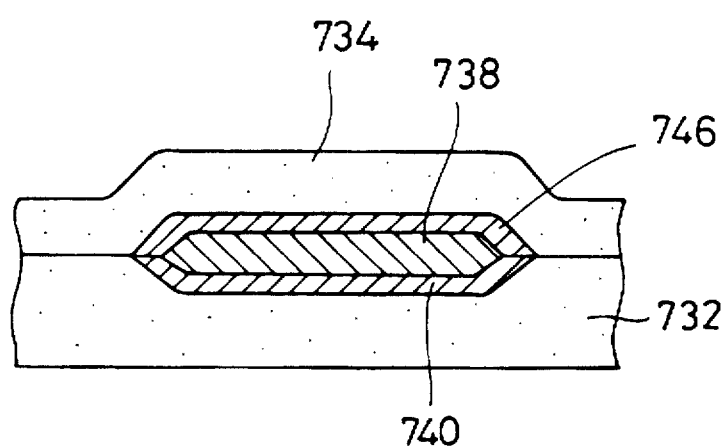
FIG. 45 illustrates a step of manufacturing the micromachine according to the sixth embodiment of the present invention.

Then, the apparatus 100 is employed to grow an amorphous Si layer on the substrate 732 and the $SiO_2$ layer 746 while irradiating the same with an Ne atom current, thereby forming the upper cover 734 of single-crystalline Si, as shown in FIG. 45. Finally, etching is carried out to entirely remove the two $SiO_2$ layers 740 and 746. Consequently, the hollow vessel 730 shown in FIG. 38 is completed.

In the method according to this embodiment, other members are formed on the single-crystalline Si substrate 732 in situ without employing a method of previously independently manufacturing the substrate 732, the upper cover 734 and the member 738, which are three members made of single-crystalline Si. Therefore, it is possible to manufacture the hollow vessel 730 which is easy to manufacture and in high dimensional accuracy.

<Pump>

Figure 46:
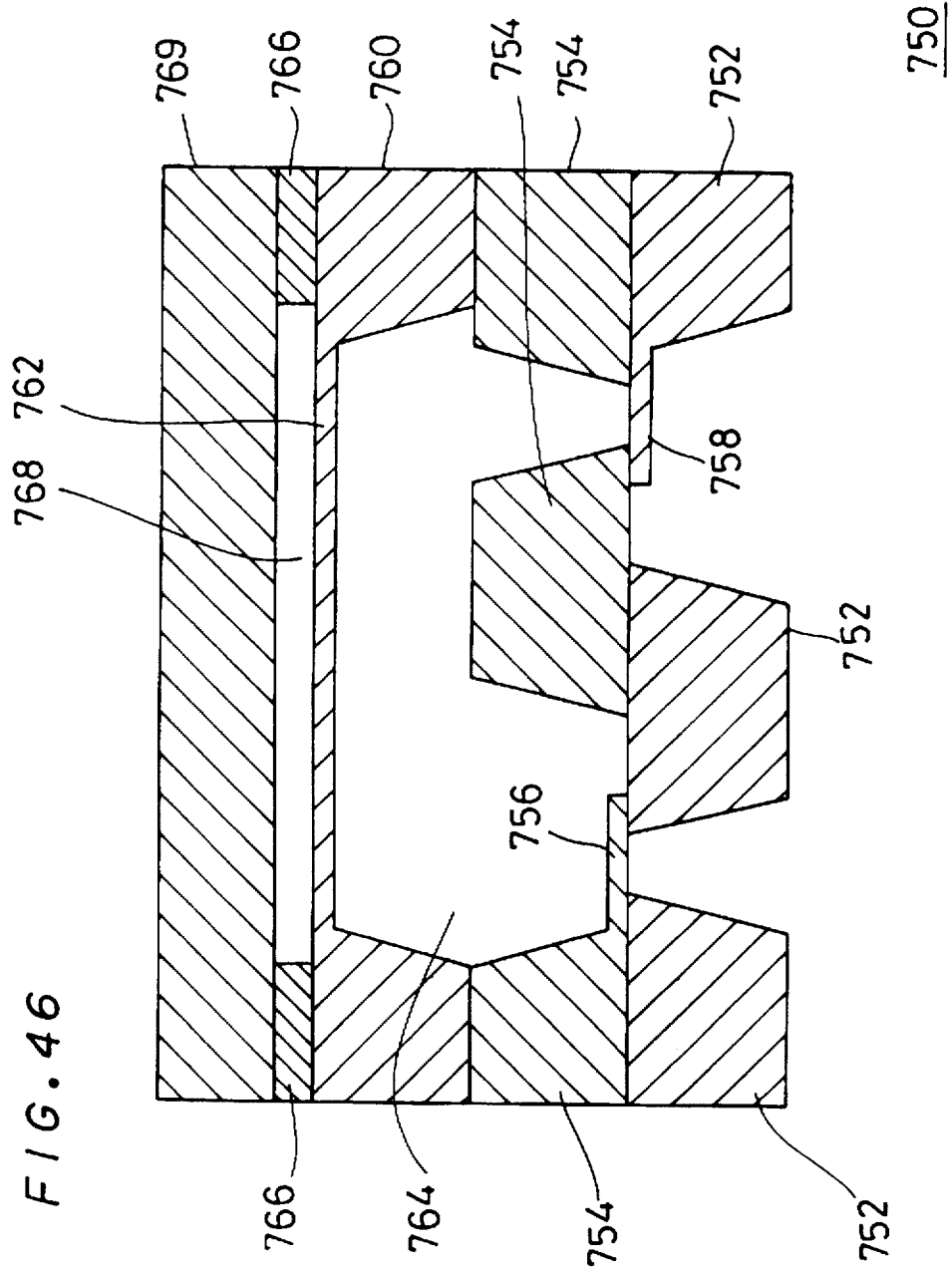
FIG. 46 is a front sectional view showing still another micromachine manufactured according to the sixth embodiment of the present invention.

FIG. 46 is a front sectional view showing still another micromachine 750 according to the sixth embodiment of the present invention. This micromachine 750 serves as a pump for pressure-feeding a fluid. This pump 750 comprises a single-crystalline Si substrate 752 which is provided with two V-shaped grooves serving as a fluid inlet and a fluid outlet, a hollow vessel which is formed by two body members 754 and 760 of single-crystalline Si to define a cavity 764 in its interior, and an electrode member 769 of single-crystalline Si which is coupled to the member 760 through a spacer 766 of glass, being an insulator. A clearance 768 is defined between the member 760 and the electrode member 769. The substrate 752 and the body member 754 have an exhaust valve 758 and an inlet valve 756 respectively. Further, a diaphragm 762 is formed on an upper surface of the body member 760.

This pump 750 operates as follows: Following application of an alternating voltage to the electrode member 769, the diaphragm 762 vibrates by action of electrostatic attractive or repulsive force. Consequently, the volume of the cavity 764 is so fluctuated that the fluid is introduced from the inlet and discharged from the outlet. In this pump 750, all members which are in contact with the fluid are made of single-crystalline Si. Therefore, this pump 750 is suitable for pressure-feeding a corrosive fluid. Further, the diaphragm 762 repeating elastic deformation and the two valves 756 and 758 are made of single-crystalline Si so that these members can be largely elastically deformed, whereby a miniature pump having a large amount of discharge is implemented.

Figure 47:
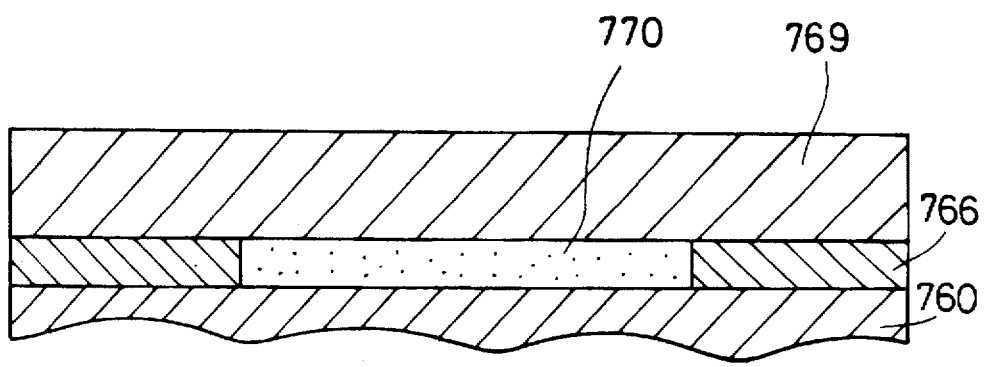
FIG. 47 illustrates a step of manufacturing the micromachine according to the sixth embodiment of the present invention.

In order to form the body member 754 on the substrate 752 having V-shaped grooves, a method according to an eleventh embodiment as described later may be employed. In order to form the cavity 764 between the two body members 754 and 760, further, the method of manufacturing the hollow vessel 700 may be employed. In order to form the electrode member 769 on the body member 760 through the glass spacer 766, the following steps may be carried out: A glass film or an $Si_3N_4$ film is formed on an upper surface of the body member 760, and this glass or $Si_3N_4$ film is thereafter selectively removed to form the spacer 766, as shown in FIG. 47. Then, the clearance 768 is filled up with a sacrifice layer 770 of $SiO_2$. Thereafter a polycrystalline Si layer is formed on the sacrifice layer and the spacer 766 by CVD, and this polycrystalline Si layer is thereafter converted to single-crystalline Si by the apparatus 101, thereby forming the electrode member 769. The pump 750 shown in FIG. 46 is completed by the aforementioned steps.

According to this method, the pump 750 is manufactured by successively stacking a number of members of single-crystalline Si having complicated shapes on the single-crystalline Si substrate 752, without employing a method of previously manufacturing the members independently of each other and combining the same by a junction technique. Therefore, it is possible to manufacture the pump 750 which is easy to manufacture in high dimensional accuracy.

(Seventh Embodiment)

<Pressure Sensor>

Figure 48:
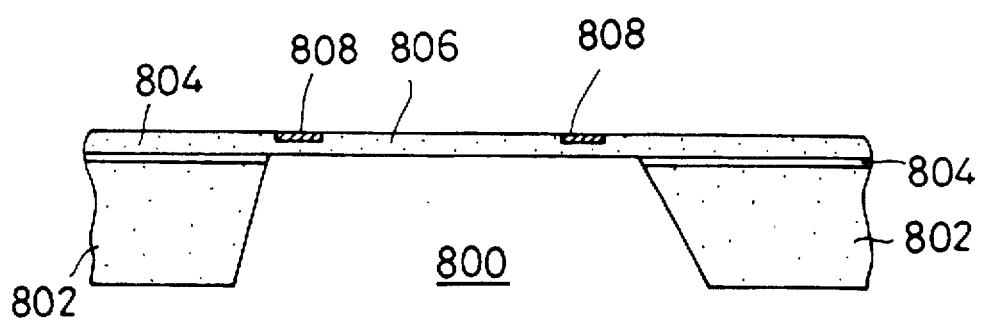
FIG. 48 is a front sectional view showing a micromachine manufactured according to a seventh embodiment of the present invention.

FIG. 48 is a front sectional view showing a micromachine 800 according to a seventh embodiment of the present invention. This micromachine 800 is a pressure sensor, which has a structure formed by incorporating a distortion sensor 808 in the aforementioned micromachine 300. In this pressure sensor 800, a single-crystalline Si thin film 806 is formed on an upper surface of a single-crystalline Si substrate 802 through an $SiO_2$ film 804. Central portions of the substrate 802 and the $SiO_2$ film 804 are selectively removed, so that the central portion of the Si thin film 806 defines a diaphragm. The diaphragm is elastically deformed upon application of a pressure to be measured. The distortion gauge 808 is formed in a portion having the maximum amount of distortion following the elastic deformation. The pressure is measured through an amount of change in electric resistance in the distortion gauge 808. Since an insulator is interposed between the Si thin film 806 and the substrate 802, the distortion gauge 808 is electrically isolated from the substrate 802. Therefore, a normal operation of an electronic component is not inhibited.

Figure 49:
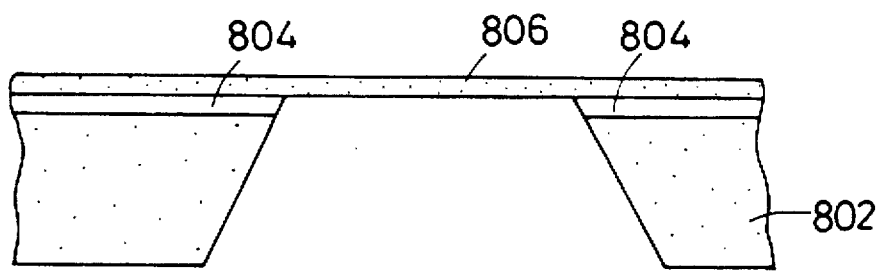
FIG. 49 illustrates a step of manufacturing the micromachine according to the seventh embodiment of the present invention.
Figure 50:
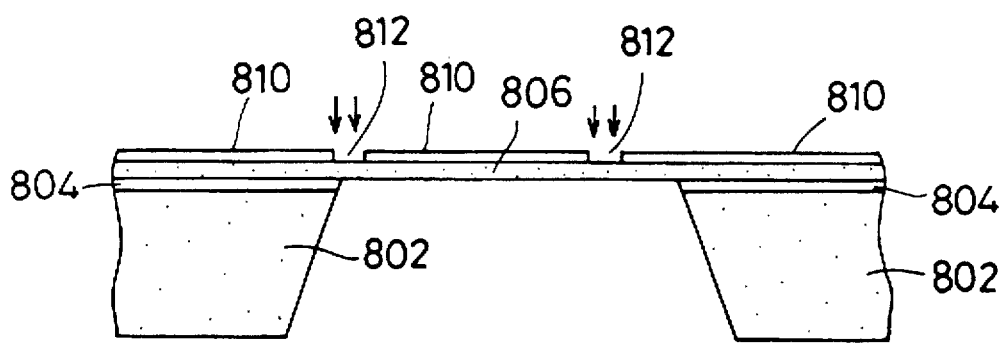
FIG. 50 illustrates a step of manufacturing the micromachine according to the seventh embodiment of the present invention.

In order to manufacture this pressure sensor 800, the steps shown in FIGS. 17 to 19 are first carried out, to prepare a structural member shown in FIG. 49. Then, a masking member 810 is formed on an upper surface of the Si thin film 806, as shown in FIG. 50. Selective etching is carried out to provide an opening 812 in a prescribed portion of the masking member 810. Thereafter this masking member 810 is used as a shielding member, to selectively implant p-type impurity ions, for example, into a portion on the upper surface of the Si thin film 806 corresponding to the opening 812. Consequently, a p-type Si region for serving as the distortion gauge 808 is defined in the Si thin film 806. According to this method, the single-crystalline Si thin film 806 is formed on the $SiO_2$ layer 804 in situ with no employment of a junction technique, whereby it is possible to easily manufacture the pressure sensor 800 having a diaphragm which is made of single-crystalline Si.

<Pressure Sensor Provided with Signal Processing Circuit>

Figure 51:
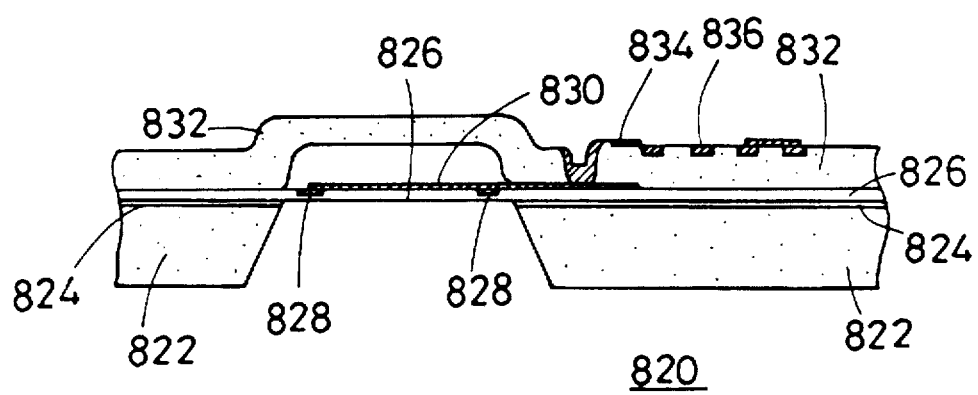
FIG. 51 is a front sectional view showing another micromachine manufactured according to the seventh embodiment of the present invention.

FIG. 51 is a front sectional view showing another exemplary pressure sensor 820. This pressure sensor 820 is characteristically different from the pressure sensor 800 in a point that a protective layer 832 of single-crystalline Si is provided and an electronic circuit for processing signals is incorporated in this protective layer 832. A single-crystalline Si substrate 822, an $SiO_2$ film 824, a single-crystalline Si thin film 826 and a distortion gauge 828 have structures which are similar to those of corresponding members in the pressure sensor 800. The protective layer 832 defines a cavity above a diaphragm, to enable deformation of the diaphragm. An electronic circuit 836 is formed on an upper surface of the protective layer 832 by selective introduction of an impurity, and this electronic circuit 836 is connected to the distortion gauge 828 through interconnection layers 830 and 834. This pressure sensor 820 is easy to handle since it is not necessary to separately provide a signal processing circuit in the exterior of this sensor 820, due to the signal processing circuit incorporated therein.

It is possible to form the protective layer 832 on the Si thin film 826 which is already provided with the distortion gauge 828 and the interconnection layer 830, by carrying out steps which are similar to those for manufacturing the hollow vessel 700 (FIG. 33). An opening is provided in a prescribed portion of the protective layer 832 and selectively filled up with an interconnection material, whereby the interconnection layer 830 which is provided on the Si thin film 826 is electrically connected with the electronic circuit 836 which is provided on the protective layer 832.

According to this method, the Si thin film 826 and the protective layer 832 of single-crystalline Si are formed on the $SiO_2$ layer 804 in situ with no employment of a junction technique, whereby it is possible to easily manufacture the pressure sensor 820 in high dimensional accuracy.

(Eighth Embodiment)

Figure 52:
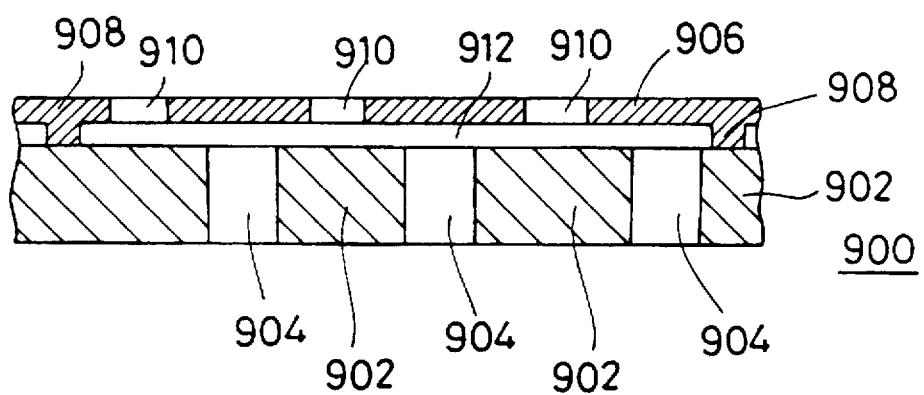
FIG. 52 is a front sectional view showing a micromachine manufactured according to an eighth embodiment of the present invention.

FIG. 52 is a front sectional view showing a micromachine 900 according to an eighth embodiment of the present invention. This micromachine 900 is a fluid filter. In this fluid filter 900, a plate-type member 906 of single-crystalline Si defining fine through holes 910 is fixedly supported on a single-crystalline Si substrate 902 defining through holes 904, in a specific portion 908. The through holes 910 and 904 communicate with each other through a clearance 912 which is defined between the plate-type member 906 and the substrate 902.

A fluid penetrates the through holes 904 from below the substrate 902, and passes through the clearance 912 and the through holes 910 upwardly beyond the plate-type member 906. Due to small dimensions of the through holes 910, particles having large grain sizes are inhibited by the plate-type member 906 from passage. This fluid filter 900 has excellent corrosion resistance, since the respective members are made of single-crystalline Si. Therefore, the filter 900 is suitable for filtering a corrosive gas or liquid.

Figure 53:
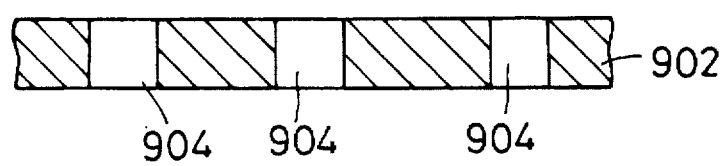
FIG. 53 illustrates a step of manufacturing the micromachine according to the eighth embodiment of the present invention.

FIGS. 53 to 57 illustrate steps of manufacturing the fluid filter 900. In order to manufacture the fluid filter 900, selective etching employing a masking member is first carried out on the single-crystalline Si substrate 902, to define the through holes 904, as shown in FIG. 53.

Figure 54:
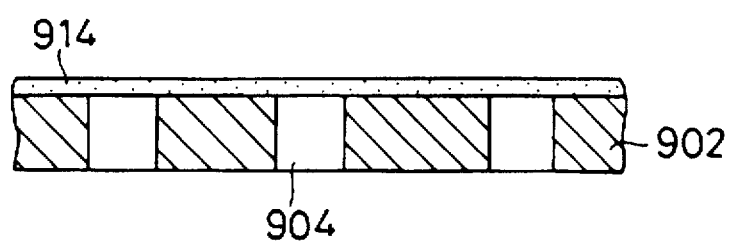
FIG. 54 illustrates a step of manufacturing the micromachine according to the eighth embodiment of the present invention.
Figure 55:
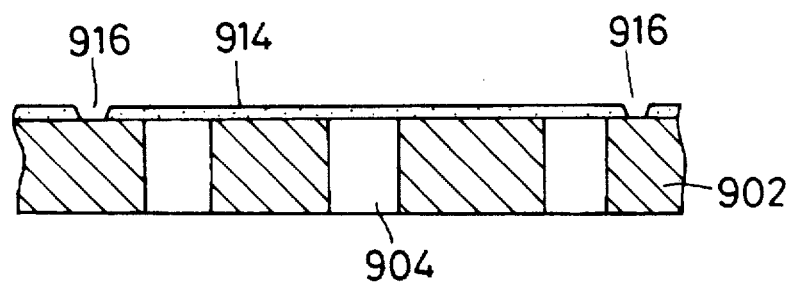
FIG. 55 illustrates a step of manufacturing the micromachine according to the eighth embodiment of the present invention.

Then, an $SiO_2$ layer 914 for serving as a sacrifice layer is formed on the single-crystalline Si substrate 902 by CVD, as shown in FIG. 54. Thereafter selective etching employing a masking member is carried out to form the openings 916 in the $SiO_2$ layer 914, as shown in FIG. 55.

Figure 56:
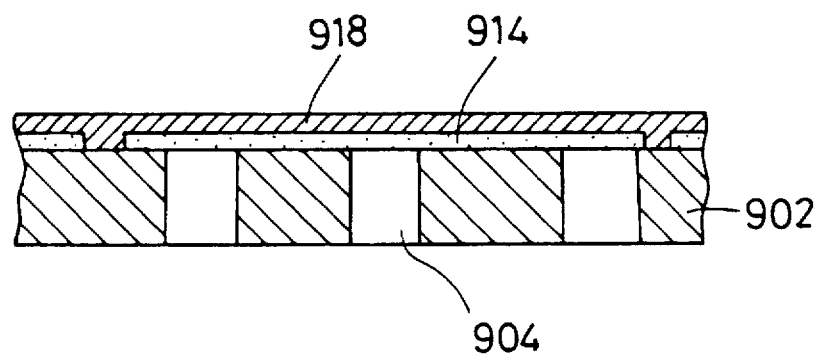
FIG. 56 illustrates a step of manufacturing the micromachine according to the eighth embodiment of the present invention.
Figure 57:
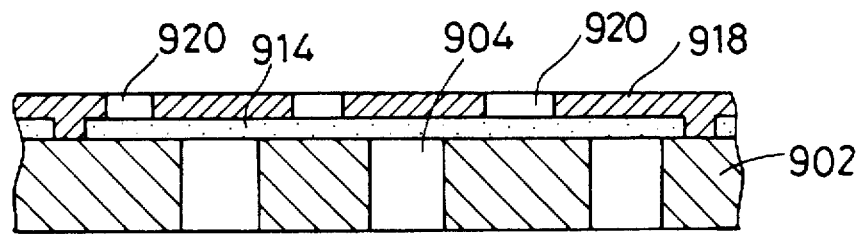
FIG. 57 illustrates a step of manufacturing the micromachine according to the eighth embodiment of the present invention.

Then, the apparatus 100 is employed to form a single-crystalline Si layer 918 on the single-crystalline Si substrate and the $SiO_2$ layer 914, as shown in FIG. 56. Then, selective etching employing a masking member is carried out, to define fine through holes 920 in the Si layer 918. Finally, the $SiO_2$ layer 914 is entirely removed by etching, to complete the fluid filter 900 shown in FIG. 52.

According to this method, the plate-type member 906 of single-crystalline Si is formed on the single-crystalline Si substrate 902 in situ with no employment of a junction technique, whereby it is possible to easily manufacture the fluid filter 900 in high dimensional accuracy.

(Ninth Embodiment)

Figure 58:
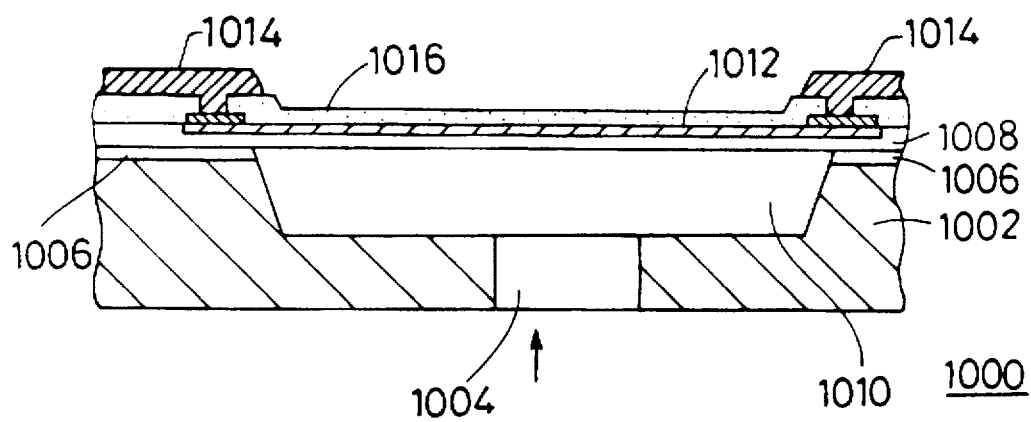
FIG. 58 is a front sectional view showing a micromachine manufactured according to a ninth embodiment of the present invention.

FIG. 58 is a front sectional view showing a micromachine 1000 according to a ninth embodiment of the present invention. This micromachine 1000 is a pressure sensor. In this pressure sensor 1000, a single-crystalline Si thin film 1008 is formed on an upper surface of a single-crystalline Si substrate 1002 through an $SiO_2$ film 1006. Central portions of the substrate 1002 and the $SiO_2$ film 1006 are selectively removed, whereby the central portion of the Si thin film 1008 defines a diaphragm. A piezoresistance element 1012 serving as a distortion gauge is formed on an upper surface of the Si thin film 1008. A lead wire 1014 is connected to this piezoresistance element 1012. Upper surfaces of the Si thin film 1008 and the piezoresistance element 1012 are covered with a protective film 1016 of SiO$_2$. A through hole 1004 communicates with a groove 1010 which is upwardly opened in a V-shaped manner. This pressure sensor 1000 is different from the pressure sensor 800 (FIG. 48) in a point that the groove 1010 which is provided immediately under the diaphragm is upwardly opened in a V-shaped manner.

When a fluid having a pressure penetrates the groove 1010 through the through hole 1004 to apply the pressure to the diaphragm, the diaphragm is elastically deformed. The pressure is measured by detecting the amount of this deformation by the piezoresistance element 1012.

Also in this pressure sensor 1000, all members which are in contact with the fluid are made of single-crystalline Si similarly to the pressure sensor 800, whereby the sensor 1000 is suitable for measuring the pressure of a corrosive fluid. Further, the diaphragm is also made of single-crystalline Si, whereby it is possible to apply large elastic deformation to the diaphragm. Further, the piezoresistance element 1012 is electrically isolated from the substrate 1002 since an insulator is interposed between the Si thin film 1008 and the substrate 1002. Therefore, the piezoresistance element 1012 is not inhibited from a normal operation.

Figure 59:
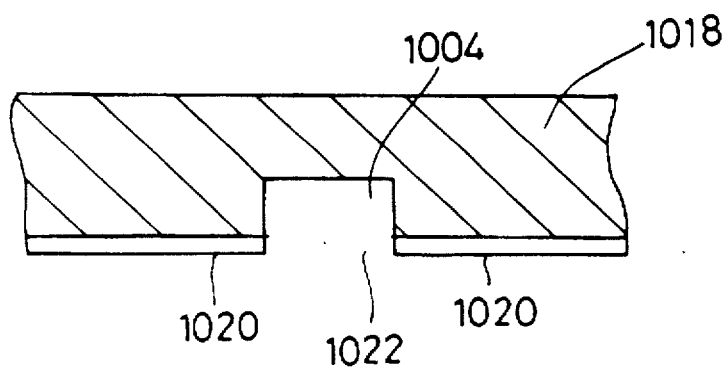
FIG. 59 illustrates a step of manufacturing the micromachine according to the ninth embodiment of the present invention.

FIGS. 59 to 66 illustrate steps of manufacturing the pressure sensor 1000. In order to manufacture this pressure sensor 1000, a masking member 1012 having an opening 1022 in a prescribed portion is first formed on a lower surface of a single-crystalline Si substrate 1018, as shown in FIG. 59. The masking member 1020 is employed as a shielding member to carry out etching, thereby forming a groove 1004 in the bottom surface of the substrate 1018.

Figure 60:
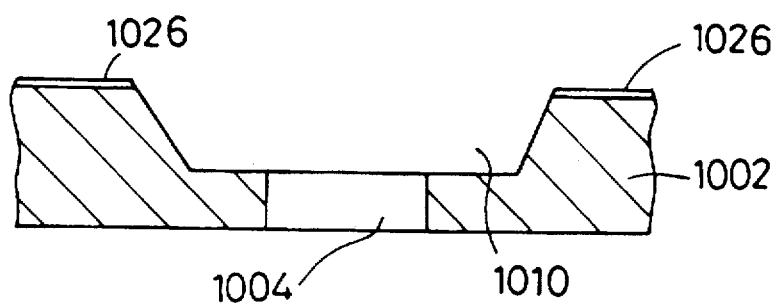
FIG. 60 illustrates a step of manufacturing the micromachine according to the ninth embodiment of the present invention.

Then, a masking member 1026 having an opening in a prescribed portion is formed on an upper surface of the single-crystalline Si substrate 1018, as shown in FIG. 60. This masking member 1026 is used as a shielding member to carry out anisotropic etching, for forming the groove 1010 in the upper surface of the substrate 1018. Consequently, the substrate 1002 is formed and the groove 1004 communicates with the groove 1010, to define a through hole passing through the bottom portion of the substrate 1002.

Figure 61:
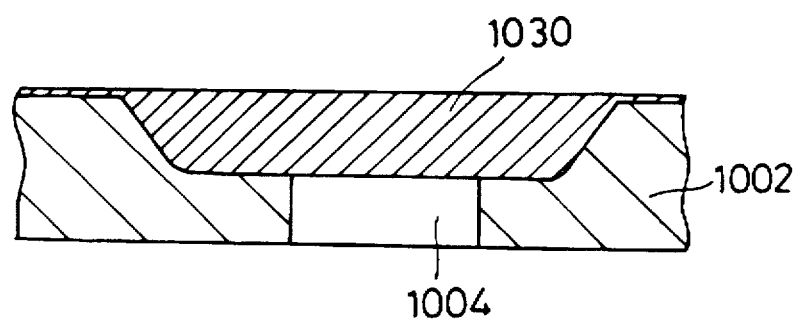
FIG. 61 illustrates a step of manufacturing the micromachine according to the ninth embodiment of the present invention.
Figure 62:
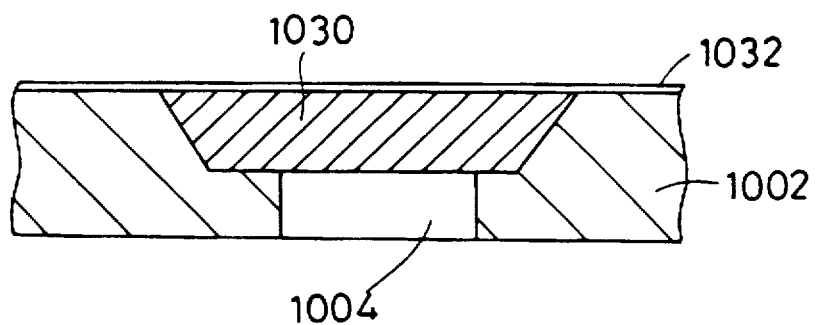
FIG. 62 illustrates a step of manufacturing the micromachine according to the ninth embodiment of the present invention.

Then, the groove 1010 is filled up with a sacrifice layer 1030 of SiO$_2$ or Si$_3$N$_4$ (silicon nitride), as shown in FIG. 61. Thereafter an upper surface portion of the sacrifice layer 1030 is so removed that an upper surface portion of the substrate 1002 which is adjacent to the groove 1010 is exposed, and an insulating film 1032 of SiO$_2$ is thereafter formed on the upper surfaces of the substrate 1002 and the sacrifice layer 1030 as shown in FIG. 62.

Figure 63:
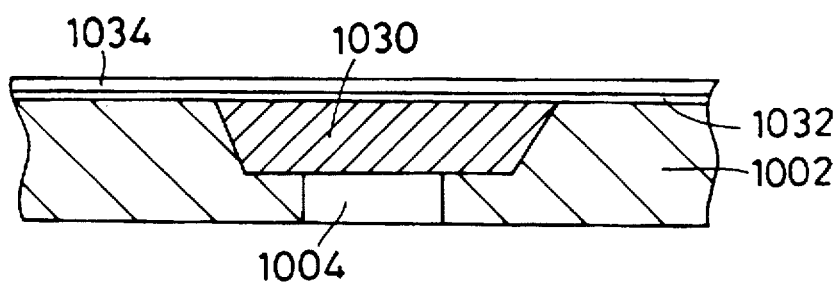
FIG. 63 illustrates a step of manufacturing the micromachine according to the ninth embodiment of the present invention.
Figure 64:
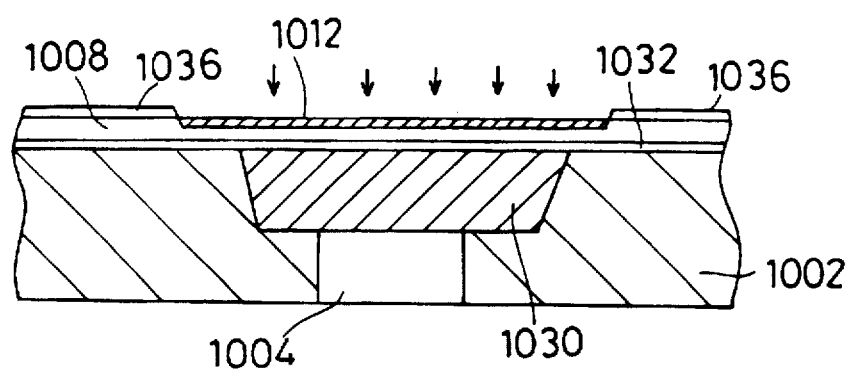
FIG. 64 illustrates a step of manufacturing the micromachine according to the ninth embodiment of the present invention.
Figure 65:
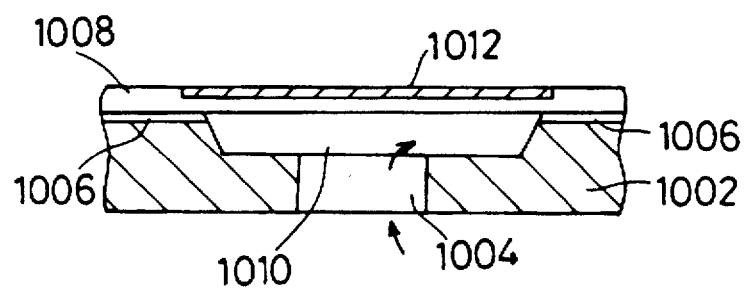
FIG. 65 illustrates a step of manufacturing the micromachine according to the ninth embodiment of the present invention.
Figure 66:
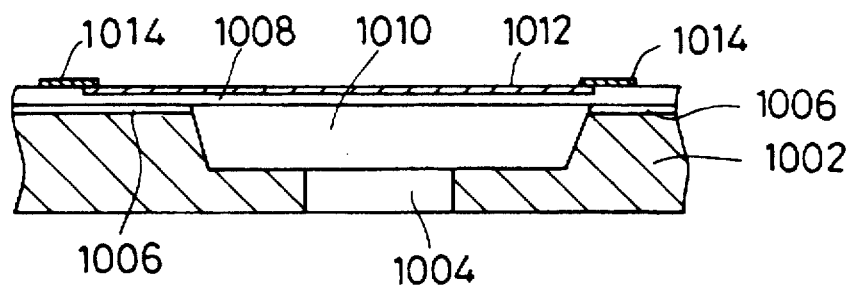
FIG. 66 illustrates a step of manufacturing the micromachine according to the ninth embodiment of the present invention.

Then, a polycrystalline Si thin film 1034 is formed on the insulating film 1032 by CVD, as shown in FIG. 63. Thereafter the apparatus 101 is employed to single-crystallize the Si thin film 1034, as shown in FIG. 64. Thereafter a masking member 1036 which is formed on the upper surface of the single-crystalline Si thin film 1034 is used as a shielding member to implant impurity ions, thereby selectively forming the piezoresistance element 1012 in the Si thin film 1034. Then, the sacrifice layer 1030 is entirely removed by etching, as shown in FIG. 65. At this time, the through hole 1004 serves as a path for introducing an etchant and removing the as-etched sacrifice layer 1030. Then, aluminum is vapor-deposited on an upper surface of the Si thin film 1034, and this aluminum layer is selectively etched through a masking member to form electrodes 1014 of aluminum which are connected with the piezoresistance element 1012.

Lead wires are connected to these aluminum electrodes 1014 and a protective film of SiO$_2$ is applied to the upper surface, to complete the pressure sensor 1000 shown in FIG. 58.

Also according to this method, the single-crystalline Si thin film 1008 is formed on the single-crystalline Si substrate 1002 in situ with no employment of a junction technique, whereby it is possible to easily manufacture the pressure sensor 1000 in high dimensional accuracy.

(Tenth Embodiment)

<Utilization of Single-Crystalline Layer as Etching Stopper>

Figure 67:
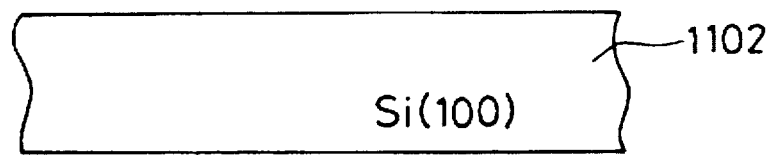
FIG. 67 illustrates a step of manufacturing a micromachine according

FIGS. 67 to 72 show steps of manufacturing a micromachine according to a tenth embodiment of the present invention. According to this method, a single-crystalline Si substrate 1102 is first prepared, as shown in FIG. 67. This substrate 1102 is so crystal-oriented that its (100) plane is along its upper surface.

Figure 68:
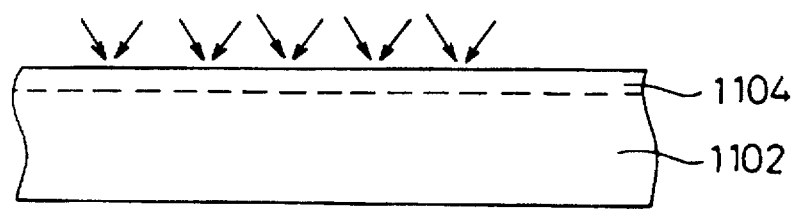
FIG. 68 illustrates a step of manufacturing the micromachine according to the tenth embodiment of the present invention.
Figure 69:
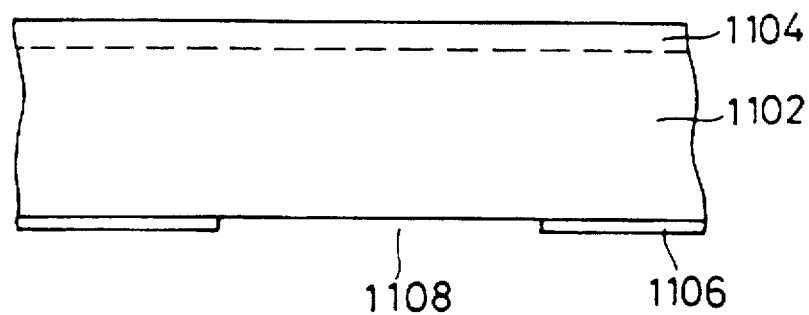
FIG. 69 illustrates a step of manufacturing the micromachine according to the tenth embodiment of the present invention.

Then, the apparatus 101 is employed to irradiate an upper surface of the substrate 1102 with an Ne atom current, so that an uppermost layer 1104 of the substrate 1102 is converted to a single-crystalline Si layer so that its (111) plane is along its upper surface, as shown in FIG. 68. Thereafter a masking member 1106 having an opening 1108 is formed on a bottom surface of the substrate 1102, as shown in FIG. 69.

Figure 70:
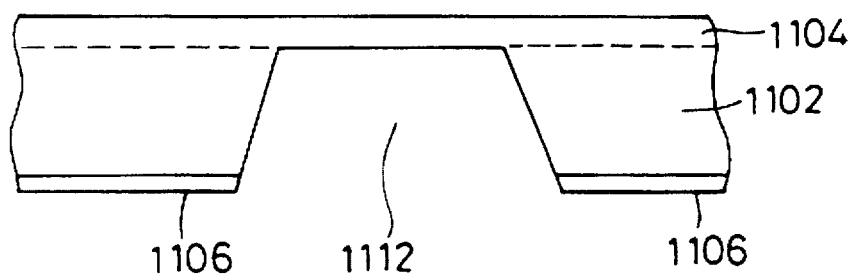
FIG. 70 illustrates a step of manufacturing the micromachine according to the tenth embodiment of the present invention.

Then, the masking member 1106 is employed as a shielding member to carry out anisotropic etching of preferentially etching the (100) plane from the bottom surface of the substrate 1102, as shown in FIG. 70. At this time, the uppermost layer 1104 serves as an etching stopper. Consequently, a downwardly opened V-shaped groove 1112 is defined. The uppermost layer 1104 is left on the groove 1112, to serve as a diaphragm.

Figure 71:
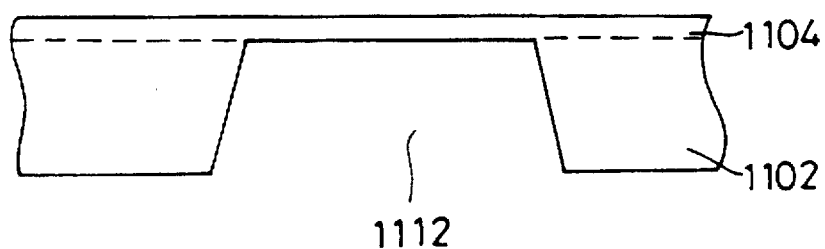
FIG. 71 illustrates a step of manufacturing the micromachine according to the tenth embodiment of the present invention.

Finally, the masking member 1102 is removed to complete a micromachine having the diaphragm of single-crystalline Si which is directly coupled to the single-crystalline Si substrate 1102, as shown in FIG. 71. According to this method, it is possible to manufacture a micromachine of single-crystalline Si having a complicated structure with no employment of a junction technique.

Figure 72:
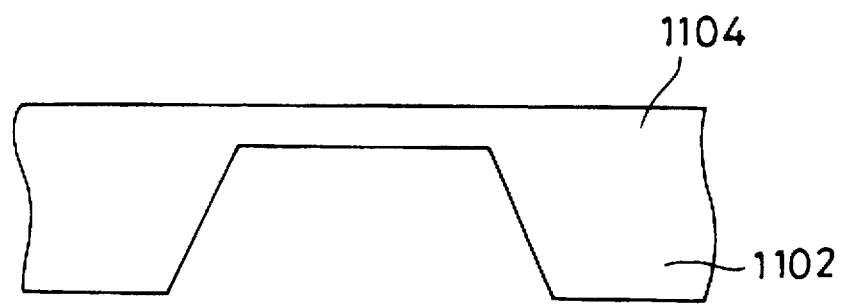
FIG. 72 illustrates a step of manufacturing the micromachine according to the tenth embodiment of the present invention.

The apparatus 101 may be again employed to irradiate the upper surface of the uppermost layer 1104 with an Ne atom current from a direction which is different from that in the step shown in FIG. 68, to return the crystal orientation of the uppermost layer 1104 to the original one so that the (100) plane is along the upper surface, as shown in FIG. 72. Thus, the overall micromachine having a complicated structure is made of single-crystalline Si having a constant orientation. Thus, a micromachine which is excellent in uniformity of characteristics of respective parts is implemented.

<Application>

Figure 82:
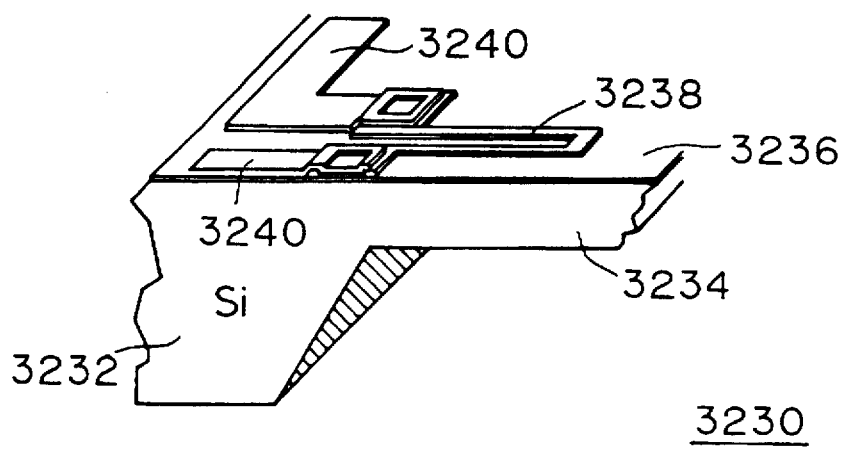
FIG. 82 is a perspective view showing a conventional micromachine.
Figure 83:
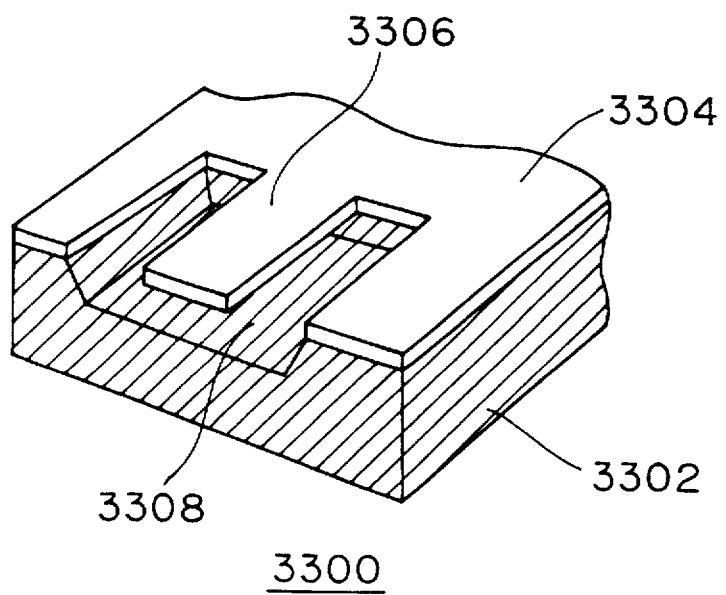
FIG. 83 is a perspective view showing a conventional micromachine according to prior art 1.

According to the aforementioned method of employing a single-crystalline layer having a specific crystal orientation as an etching stopper, it is possible to integrally form the diaphragm 3234 with the substrate 3232 without employing junction while easily adjusting the diaphragm 3234 in a constant thickness in the conventional pressure sensor 3230 (FIG. 82), for example. In the conventional acceleration sensor 3300 (FIG. 83), on the other hand, it is possible to form the cantilever 3306 by the same material as that for the substrate 3302 with no employment of a junction technique.

In the pressure sensor 3230 (FIG. 82), further, it is possible to form the piezoresistance element 3238 on the insulating film 3236 by forming a single-crystalline Si thin film on the insulating film 3236 through the apparatus 101 or the like, thereafter selectively introducing a p-type impurity and further selectively removing another region of the single-crystalline Si thin film in which no p-type impurity is introduced. At this time, no junction technique is required in the process of manufacturing the pressure sensor 3230.

In this pressure sensor 3230, the piezoresistance element 3238 is formed on the insulating film 3236 in an independent state with no other Si layer, whereby a current flowing in the piezoresistance element 3238 leaks neither to the diaphragm 3234 nor other region above the insulating film 3236. Thus, the operation of the piezoresistance element 3238 is advantageously further reliably guaranteed.

(Eleventh Embodiment)

Figure 73:
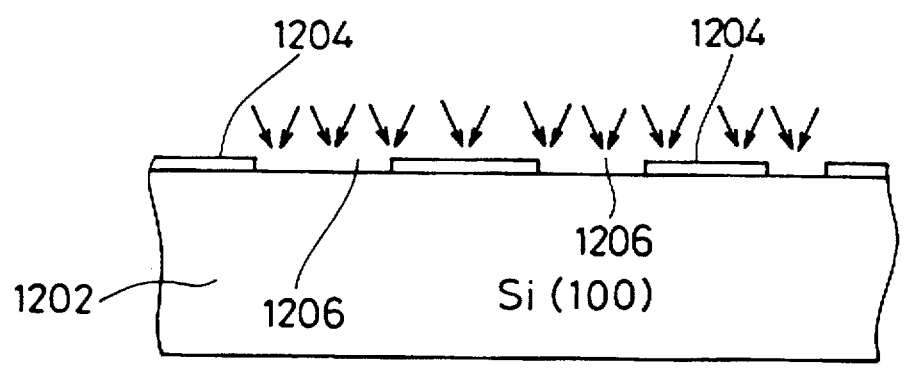
FIG. 73 illustrates a step of manufacturing a micromachine according to an eleventh embodiment of the present invention.
Figure 74:
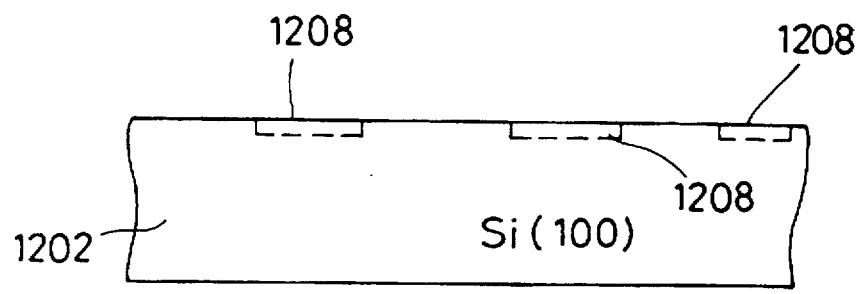
FIG. 74 illustrates a step of manufacturing the micromachine according to the eleventh embodiment of the present invention.

FIGS. 73 to 76 illustrate steps of manufacturing a micromachine according to an eleventh embodiment of the present invention. According to this method, a masking member 1204 having openings 1206 is first formed on an upper surface of a single-crystalline Si substrate 1202, and selective application of an atom current with a shielding member of the masking member 1204 is thereafter executed by the apparatus 101, as shown in FIG. 73. This substrate 1202 is so crystal-oriented that its (100) plane is along its upper surface. Due to the application, crystal orientations of uppermost layer portions 1208 of the substrate 1202 corresponding to the openings 1206 are converted to those having (111) planes on upper surfaces, as shown in FIG. 74.

Figure 75:
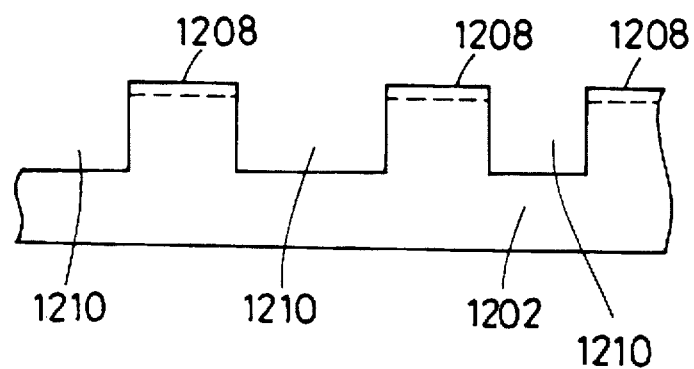
FIG. 75 illustrates a step of manufacturing the micromachine according to the eleventh embodiment of the present invention.

Then, etching is carried out from an upper surface of the substrate 1202, as shown in FIG. 75. At this time, the uppermost layer portions 1208 having different crystal orientations serve as etching masks, so that portions excluding the uppermost layer portions 1208 are selectively removed to define grooves 1210. According to this method, it is possible to easily manufacture a micromachine of single-crystalline Si having a complicated structure.

Figure 76:
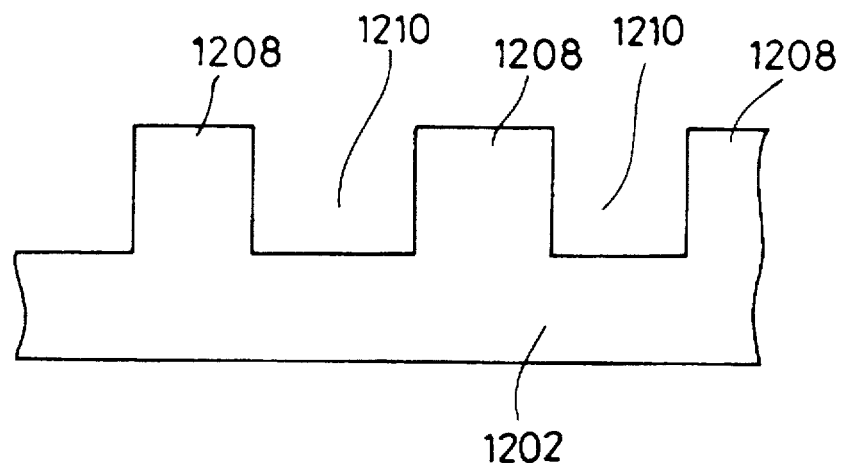
FIG. 76 illustrates a step of manufacturing the micromachine according to the eleventh embodiment of the present invention.
Figure 77:
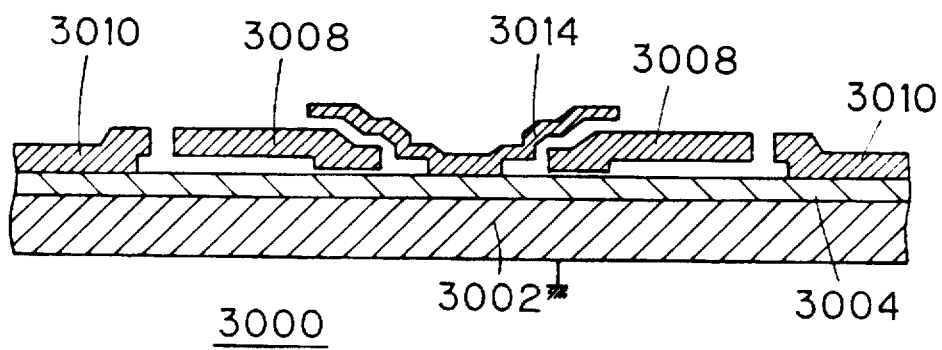
FIG. 77 is a front sectional view showing a conventional micromachine according to prior art 1.
Figure 78:
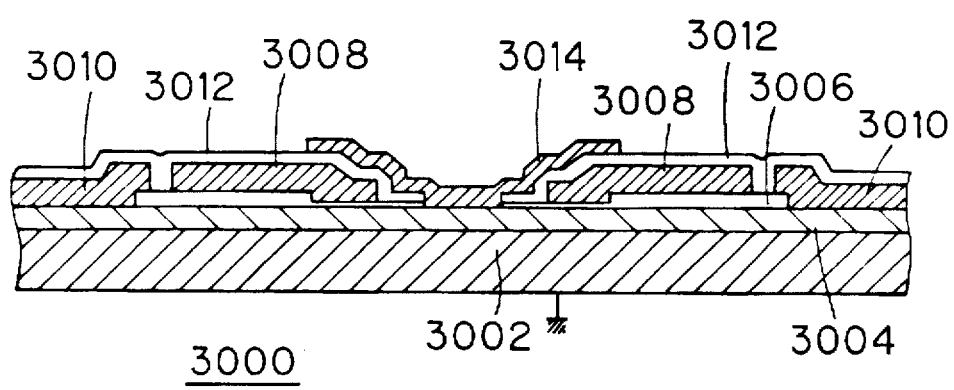
FIG. 78 illustrates a step of manufacturing the conventional micromachine according to prior art 1.
Figure 79:
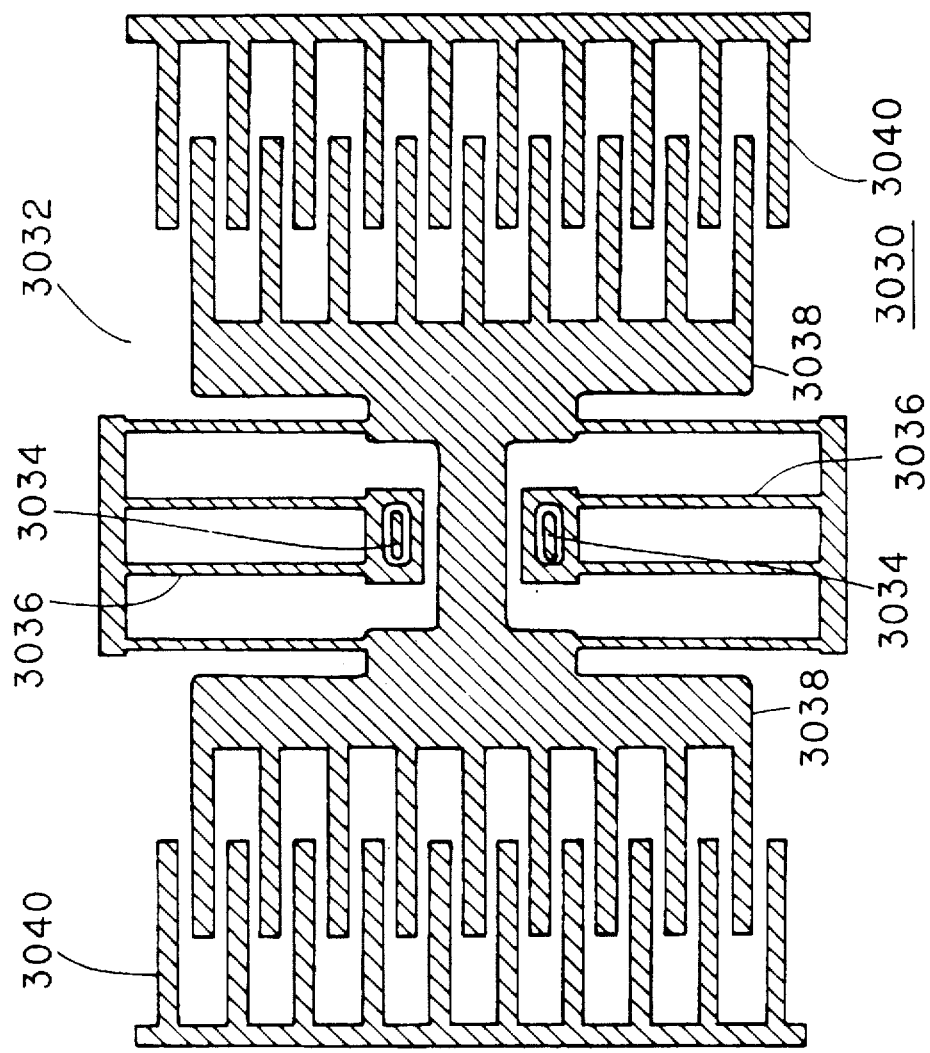
FIG. 79 is a plan view showing a conventional micromachine according to prior art 1.
Figure 80:
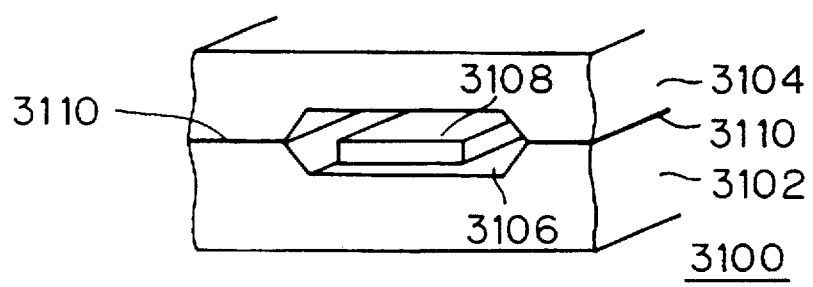
FIG. 80 is a perspective view showing a conventional micromachine according to prior art 1.
Figure 81:
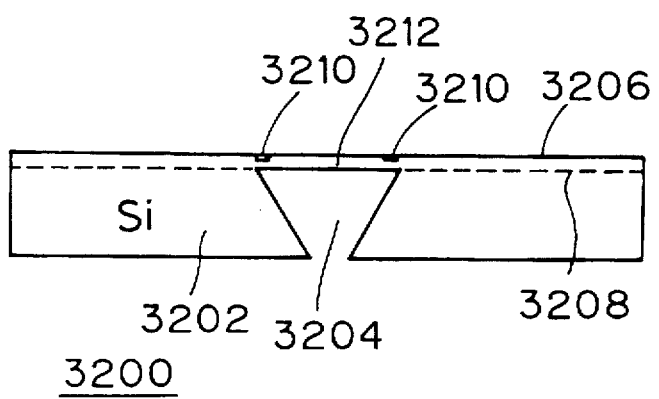
FIG. 81 is a front sectional view showing a conventional micromachine according to prior art 1.

As shown in FIG. 76, the apparatus 101 may be again employed to irradiate the upper surfaces of the uppermost layer portions 1208 with Ne atom currents from directions which are different from those in the step shown in FIG. 73, thereby returning the crystal orientations of the uppermost layer portions 1208 so that the (100) planes are along the upper surfaces. Thus, the overall micromachine having a complicated structure is made of single-crystalline Si having a constant orientation. Thus, a micromachine which is excellent in uniformity of characteristics of respective parts is implemented.

(Twelfth Embodiment)

<Structure>

Figure 84:
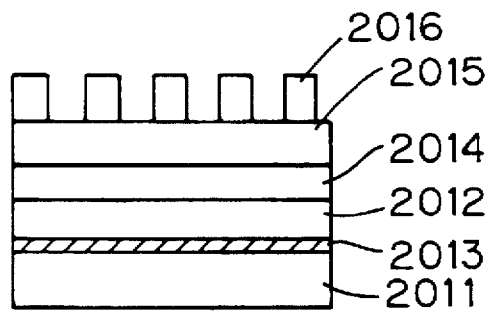
FIG. 84 is a sectional view showing a solar cell according to a twelfth embodiment of the present invention.

FIG. 84 is a sectional view showing a solar cell employing group III-V compound semiconductors according to a twelfth embodiment of the present invention. Referring to FIG. 84, numeral 2011 denotes a substrate of glass or SiO₂/Si, numeral 2012 denotes an n-type (first conductivity type) first semiconductor film of a group III-V material such as GaAs, being from the material for the substrate 2011, which is formed on an upper surface of the substrate 2011, numeral 2013 denotes a first electrode (back-side electrode) which is connected to a back surface of the first semiconductor film 2012, numeral 2014 denotes a second semiconductor film of p-type (second conductivity type) GaAs or the like which is formed on an upper surface of the first semiconductor film 2012, numeral 2015 denotes a p-type AlGaAs film for surface electric field formation for preventing carriers which are generated by light from recombination, and numeral 2016 denotes second electrodes (front-side electrodes). The first semiconductor film 2012, the second semiconductor film 2014 and the p-type AlGaAs film 2015 are formed by single-crystalline films respectively. Since the semiconductor films 2012, 2014 and 2015 are formed by single-crystalline films respectively, it is possible to remarkably improve electron mobility upon entrance of light, thereby improving electrical properties.

The number of photons which can be absorbed in a semiconductor material is generally reduced as the forbidden bandwidth is increased, while the ratio of an energy component which can be extracted to the exterior from energy of the as-absorbed photons is increased in proportion to the forbidden bandwidth. Thus, it is understood that correlation is caused between conversion efficiency and the forbidden bandwidth when the number of photons which can be absorbed is multiplied by the ratio of the energy component of the photons which can be extracted to the exterior. It is known that the forbidden bandwidth of a group II-VI compound such as CdS or CdTe or a group III-V compound such as GaAs exhibits the highest conversion efficiency in such correlation. In consideration of this, group III-V1 compounds are employed as materials for the semiconductor films 2012, 2014 and 2015 according to this embodiment, whereby the absorption coefficient and wavelength characteristics on absorption ends are remarkably improved.

<Manufacturing Method>

Figure 85:
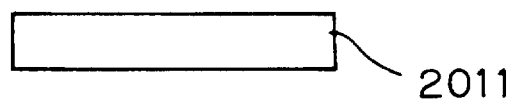
FIG. 85 is a sectional view showing a step of manufacturing the solar cell according to the twelfth embodiment of the present invention.
Figure 86:
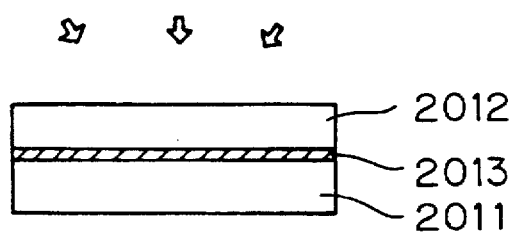
FIG. 86 is a sectional view showing a step of manufacturing the solar cell according to the twelfth embodiment of the present invention.

The solar cell having the aforementioned structure is manufactured as follows: First, the first electrode 2013 is formed by vapor deposition or the like on the upper surface of the substrate 2011 shown in FIG. 85 by Ag or the like, and thereafter the n-type first semiconductor film 2012 is formed in an amorphous or polycrystalline state on the upper surface of the first electrode 2013 by CVD or the like, as shown in FIG. 86. At the same time, the first semiconductor film 2012 is single-crystallized by radical beam irradiation, as described later.

Figure 87:
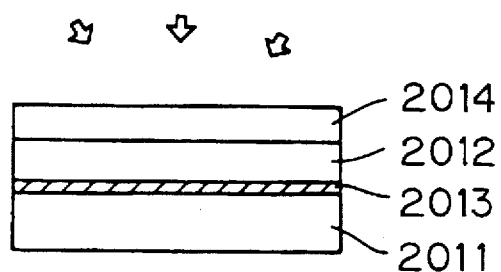
FIG. 87 is a sectional view showing a step of manufacturing the solar cell according to the twelfth embodiment of the present invention.
Figure 88:
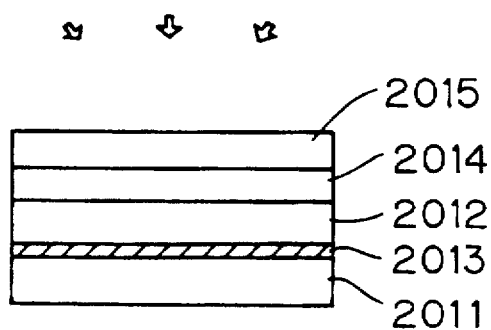
FIG. 88 is a sectional view showing a step of manufacturing the solar cell according to the twelfth embodiment of the present invention.

Then, the p-type second semiconductor film 2014 is formed on the upper surface of the first semiconductor film 2012 in an amorphous or polycrystalline state by CVD or the like, as shown in FIG. 87. At the same time, the second semiconductor film 2014 is single-crystallized by radical beam irradiation, as described later. Then, the p-type AlGaAs film 2015 is formed on the upper surface of the second semiconductor film 2014 in an amorphous or polycrystalline state by CVD or the like, as shown in FIG. 88. At the same time, the p-type AlGaAs film 2015 is single-crystallized by radical beam irradiation, as described later. Thereafter the second electrodes 2016 are selectively formed on the upper surface of the p-type AlGaAs film 2015 by vapor deposition or sputtering with Ag or the like, to complete the solar cell as shown in FIG. 84.

<Single-Crystalline Film Forming Method>

A single-crystalline film forming method (radical beam irradiation) for forming each of the films 2012, 2014 and 2015 in a polycrystalline or amorphous state and simultaneously single-crystallizing the same is now described in detail.

<Overall Structure of Single-Crystalline Film Forming Apparatus>

Figure 89:
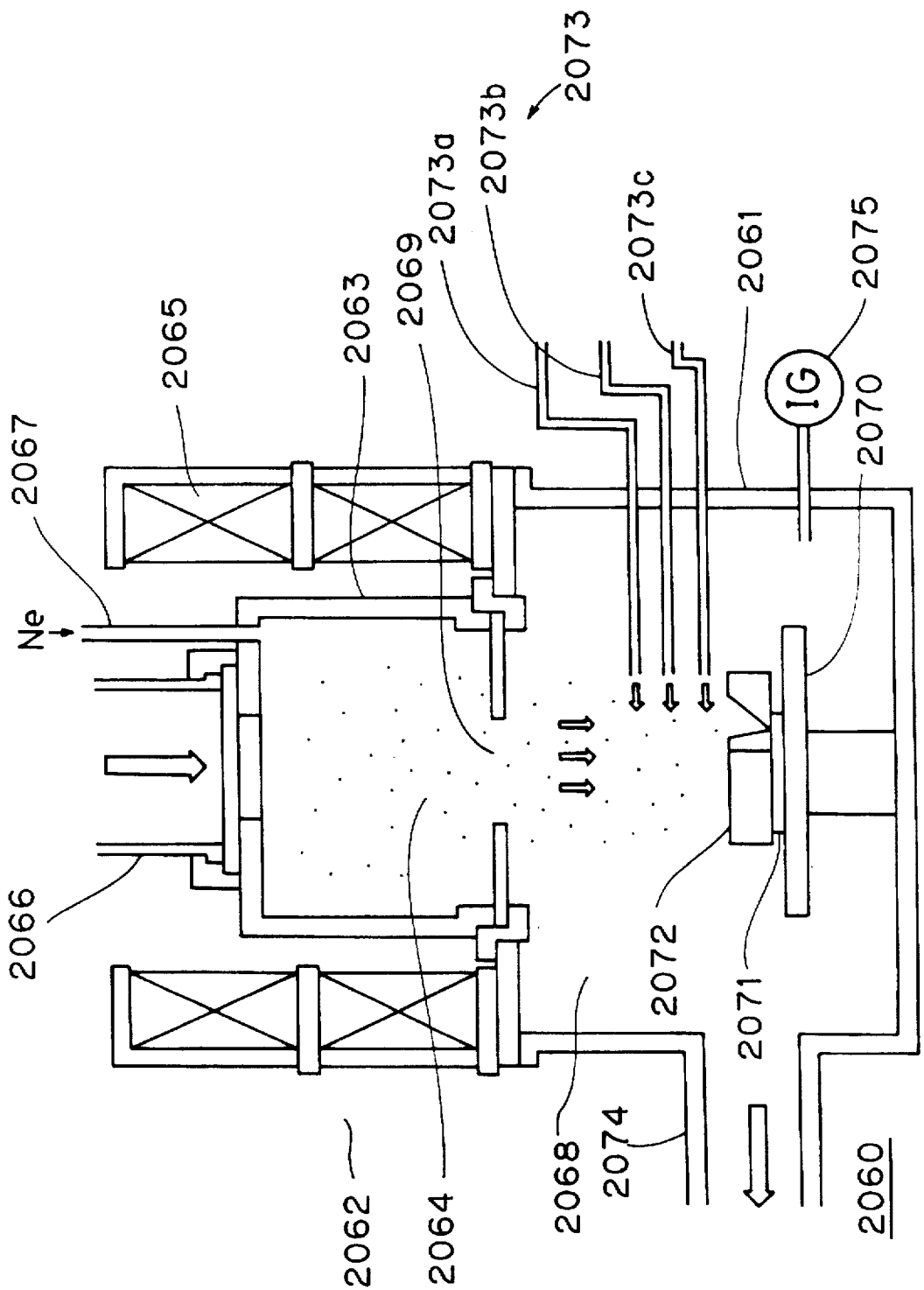
FIG. 89 is a front sectional view showing the structure of an apparatus which is suitable for carrying out the method according to the twelfth embodiment of the present invention.

FIG. 89 is a front sectional view showing a structure of an exemplary single-crystalline thin film forming apparatus 2060 for effectively implementing a method of forming each single-crystalline thin film according to this embodiment of the present invention. This apparatus 2060 comprises a reaction vessel 2061, and an electron cyclotron resonance (ECR) ion generator 2062 which is built in an upper portion of the reaction vessel 2061. The ECR ion generator 2062 comprises a plasma container 2063 which defines a plasma chamber 2064 in its interior. A magnetic coil 2065 is provided around the plasma container 2063, to apply a dc high magnetic field to the plasma chamber 2064. Further, a waveguide 2066 and an inert gas inlet pipe 2067 are provided on an upper surface of the plasma container 2063 for introducing a microwave and an inert gas such as neon (Ne) or oxygen (O) into the plasma chamber 2064 respectively.

The reaction vessel 2061 defines a reaction chamber 2068 in its interior. The bottom portion of the plasma container 2063 defines an outlet 2069 for passing a plasma in its center. The reaction chamber 2068 and the plasma chamber 2064 communicate with each other through the outlet 2069. In the interior of the reaction chamber 2068, a sample holder 2070 is arranged on a position immediately under the outlet 2069. A sample 2071 for forming a solar cell is placed on the sample holder 2070, while a reflector 2072 is placed to be located above the sample 2071. Desired single-crystalline films are formed on the sample 2071. The reflector 2072 is preferably made of a metal. The sample holder 2070 is coupled to a rotation driving mechanism (not shown), to be rotatable in a horizontal plane. Further, the sample stand 2070 can horizontally move the sample 2071 while fixing the reflector 2072.

The reaction chamber 2068 communicates with reaction gas supply pipes 2073. Reaction gases are supplied through the reaction gas supply pipes 2073, for forming films of prescribed materials on the sample 2071 by plasma CVD. The example shown in FIG. 89 is provided with three reaction gas supply pipes 2073a, 2073b and 2073c. The reaction chamber 2068 further communicates with an evacuation pipe 2074. An end of the evacuation pipe 2074 is coupled with a vacuum unit (not shown) to evacuate the reaction chamber 2068 through the evacuation pipe 2074, thereby maintaining the reaction chamber 2068 at a prescribed degree of vacuum. A vacuum gauge 2075 for displaying the degree of vacuum in the reaction chamber 2068 is provided in communication with the reaction chamber 2068.

<Structure of Reflector>

Figure 90:
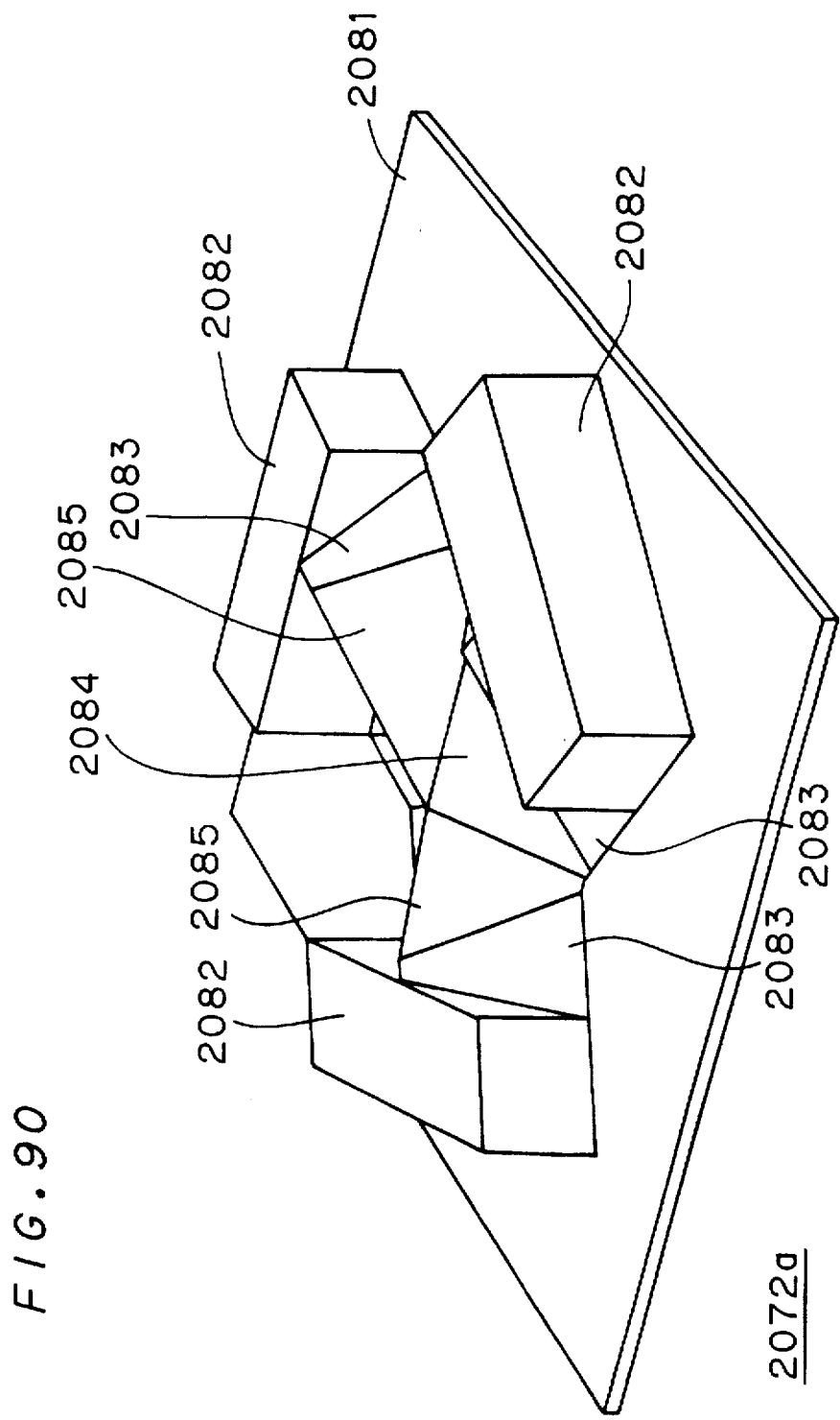
FIG. 90 is a perspective view showing an exemplary reflector in the twelfth embodiment of the present invention.

FIG. 90 is a perspective view showing an exemplary reflector 2072a. This reflector 2072a is adapted to form a single crystal having a diamond structure. The reflector 2072a defines an opening on a central portion of a flat plate type base 2081. Three blocks 2082 in the form of rectangular parallelopipeds are fixedly provided around the opening, and reflecting blocks 2083 are fixed to inner sides of the blocks 2082 respectively. Consequently, an equilateral triangular opening 2084 which is trimmed with the reflecting blocks 2083 is defined at the central portion of the base 2081. In the reflecting blocks 2083, slopes 2085 facing the opening 2084 serve as reflecting surfaces for reflecting a gas beam. Therefore, the angles of inclination of the slopes 2085 are set at proper levels in correspondence to the directions of crystal axes of the single crystal to be formed.

FIGS. 91A, 91B and 91C are a plan view, a side elevational view and a front elevational view of the reflector 2072a which is formed by the blocks 2082 and the reflecting blocks 2083 respectively. As shown in FIG. 91B, the angle of inclination of each slope 2085 is set at 55°. The reflector 2072a is in a structure not fixing the sample 2071, whereby the sample 2071 can be relatively horizontally moved with respect to the reflector 2072a. Therefore, it is possible to form single-crystalline films on the sample 2071 having a large area by horizontally moving the sample 2071 while fixing the reflector 2072a on the sample holder 2070.

<Operation of ECR Ion Generator>

Referring again to FIG. 89, the operation of the ECR ion generator 2062 is now described. An inert gas such as Ne, O or Ar is introduced from the inert gas inlet pipe 2067 into the plasma chamber 2064, while a microwave is simultaneously introduced from the waveguide 2066 into the plasma chamber 2064. Further, a dc current is also simultaneously supplied to the magnetic coil 2065, to form a dc magnetic field in the plasma chamber 2064 and its periphery. The gas as supplied is maintained in a plasma state by actions of the microwave and the dc magnetic field. This plasma is formed by high-energy electrons which are in screw motion in the principle of cyclotron by the microwave and the dc magnetic field.

These electrons, which have diamagnetic properties, are moved to a weaker magnetic field side, to form an electron stream along a line of magnetic force. Consequently, positive ions also form an ion current along the line of magnetic force following the electron stream, in order to maintain electrical neutrality. In other words, the electron stream and the ion current are downwardly directed from the outlet 2069 into the reaction chamber 2068. The ion current and the electron stream thus flowing in parallel with each other are recombined with each other after a lapse of a deionization time, to form a neutral atom current. Therefore, substantially only a neutral atom current is formed in a position downwardly separated from the outlet 2069 beyond a prescribed distance.

Figure 92:
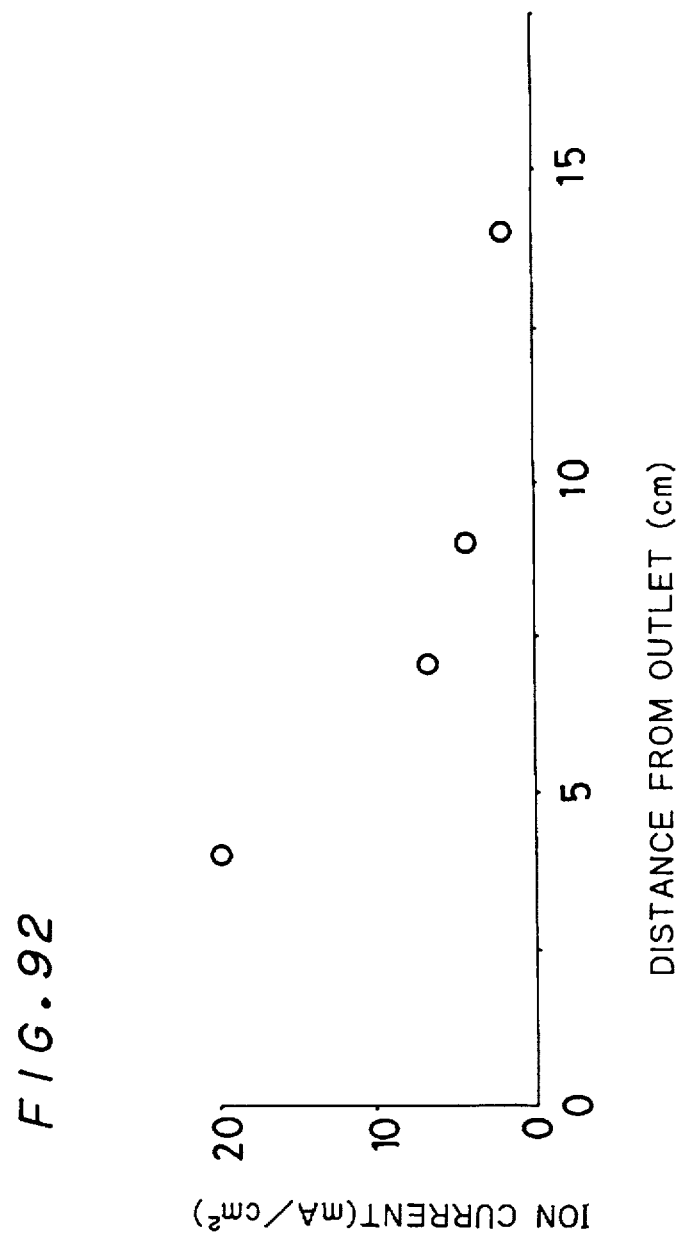
FIG. 92 is a graph showing characteristics of an ECR ion generator in the twelfth embodiment of the present invention.

FIG. 92 is a graph showing the result of relation between ion current density and the distance from the outlet 2069 actually measured when $Ar^+$ ions of 10 eV were discharged from the outlet 2069 by the ECR ion generator 2062. It is understood from this graph that the ion current density is abruptly reduced at a distance of about 4 to 5 cm from the outlet 2069, and attenuated to a level of $\frac{1}{10}$ to $\frac{1}{12}$ at a position of 14 cm. The neutral atom current is increased by such attenuation of the ion current, whereby substantially only a neutral atom current downwardly flows in a position downwardly separated from the outlet 2069 in excess of 14 cm.

Thus, the ECR ion generator 2062 for generating ions forms an ion current in parallel with the electron stream, whereby it is possible to easily obtain a neutral atom current having high density by employing the ECR ion generator 2062, with no employment of other means for neutralizing the ion current. Since the ion current is formed in parallel with the electron stream, further, it is possible to obtain an ion current which is close to a parallel current having a regulated direction of progress substantially with no divergence. Since the parallel ion current is converted to the neutral atom current, the atom current is also close to a parallel current having a regulated direction of progress.

<Operation of Single-Crystalline Film Forming Apparatus>

Referring again to FIG. 89, the operation of the ECR ion generator 2062 for forming the first semiconductor film 2012, the second semiconductor film 2014 or the AlGaAs film 2015 is now described. The reflector 2072 is prepared from the reflector 2072a shown in FIGS. 90, 91A, 91B and 91C. First, reaction gases are supplied to an upper surface of each underlayer from the reaction gas supply pipes 2073a, 2073b and 2073c respectively. In more concrete terms, a vapor-phase compound (5 sccm [$1\times10^{-5}$ to $4\times10^{-5}$ mol/min.]) such as triethylgallium (TEG) or trimethylgallium (TMG) maintained at −12 to 10° C. with employment of Ar as a carrier gas is supplied from the reaction gas supply pipe 2073a, $AsH_3$ (10 sccm [$4\times10^{-4}$ mol/min.]) diluted to 10% with Ar is supplied from the reaction gas supply pipe 2073b and $H_2Te$ (5 sccm [$1\times10^{-5}$ to $2.4\times10^{-5}$ mol/min.]) diluted to 10% with Ar is supplied from the reaction gas supply pipe 2073c respectively in formation of the first semiconductor (n-type GaAs) film 2012. In formation of the second semiconductor (p-type GaAs) film 2014, on the other hand, the reaction gas supply pipe 2073c supplies $Zn(CH_3)_2$, in place of $H_2Te$. In formation of the AlGaAs film 2015, Al is mixed. At this time, the degree of vacuum in the apparatus 2060 is so set that the back pressure is not more than $10^{-7}$ Torr and the operating pressure is $1\times10^{-4}$ to $4\times10^{-4}$ Torr, while microwave power and the growth rate are set at 2.34 GHz/300 W and 0.1 to 0.3 μm /hr respectively. In order to attain a p-type crystal, DMZ (dimethyl zinc) is supplied at 5 sccm [$1\times10^{-5}$ to $2.4\times10^{-5}$ mol/min.]. In formation of each thin film, an n-type or p-type inert gas such as Ne atoms or Ar atoms having relatively small atomic weights is simultaneously introduced from the inert gas inlet pipe 2067. When Ar atoms are employed, for example, the same are preferably introduced at 15 sccm [$7\times10^{-4}$ mol/min.].

Due to the action of the ECR ion generator 2062, a plus ion current and an electron stream are formed downwardly from the outlet 2069. The distance between the outlet 2069 and the reflector 2072a (2072) is preferably set at a sufficient level for substantially converting the plus ion current to a neutral atom current. The reflector 2072a (2072) is set in a position receiving the downwardly directed Ne atom current. The reaction gas which is supplied from the reaction gas supply pipe 2073a is dashed against the sample 2071 by the plus ion current or the atom current. Consequently, a plasma CVD reaction progresses on the upper surface of the sample 2071, to grow an amorphous or polycrystalline thin film.

At this time, the sample 2071 is not heated but maintained substantially at an ordinary temperature, whereby the amorphous or polycrystalline thin film is grown substantially under the ordinary temperature. In other words, the amorphous or polycrystalline thin film is formed at a temperature not more than a level facilitating crystallization by plasma CVD.

A part of the downwardly directed atom current of Ne or the like is reflected by the three slopes 2085 which are formed in the reflector 2072a, to be incident upon the upper surface of the sample 2071 through the opening 2084. Another part of the atom current is not incident upon the slopes 2085 but directly incident upon the upper surface of the sample 2071 through the opening 2084. In other words, the amorphous or polycrystalline thin film being formed on the upper surface of the sample 2071 is irradiated with four atom current components, i.e., a component straightly received from the outlet 2069 and three components reflected by the three slopes 2085. Since the angles of inclination of the slopes 2085 are set at 55°, directions of incidence of the four atom current components correspond to four directions which are perpendicular to four independent densest crystal planes of the single crystal to be formed, i.e., (111) planes.

The energy of the plasma which is formed by the ECR ion generator 2062 is so set that the atoms reaching the sample 2071 are at energy levels causing no sputtering in the amorphous or polycrystalline thin film, i.e., levels lower than a value which is known as the threshold energy level in sputtering of GaAs by irradiation with atoms. Therefore, the so-called law of Bravais acts on the as-grown amorphous or polycrystalline thin film. Namely, molecules in the amorphous or polycrystalline thin film are rearranged so that planes which are perpendicular to the atom current components applied to the amorphous or polycrystalline thin film define densest crystal planes. Since the atom current as applied has four components which are incident in directions corresponding to those perpendicular to densest planes of a single-crystalline film having a single crystal orientation, the molecules are so rearranged that all planes perpendicular to the directions of incidence of the respective components define the densest planes. The directions of the (111) planes are controlled by the plurality of atom current components having directions of incidence which are independent of each other, whereby a single-crystalline film having a single crystal orientation is formed by such rearrangement of the molecules. In other words, the amorphous or polycrystalline thin film being grown by plasma CVD is sequentially converted to a single-crystalline film having a regulated crystal orientation.

As hereinabove described, the sample 2071 is not heated and the single-crystalline film is formed under a temperature which is lower than that facilitating crystallization by plasma CVD. This is because the crystal orientation is arbitrarily directed regardless of the directions of the atom current components and cannot be controlled while a polycrystal is inevitably formed under a high temperature facilitating crystallization of molecules by plasma CVD alone with no application of the atom current.

As hereinabove described, relatively light Ne is preferably selected as an element forming the atom current which is applied to the single-crystalline film. This is because Ne atoms hardly penetrate into the single-crystalline film to remain in the same since there is a high probability that relatively heavy molecules rearwardly scatter the relatively light Ne atoms when the single-crystalline film is irradiated with the atom current. Further, the element for forming the atom current as applied is prepared from an inactive element since the inactive element forms no compound with either original molecules or as-doped impurities even if the same remains in the single-crystalline film and hardly exerts an influence on electronic/physical properties of the single-crystalline film, while the same can be easily removed to the exterior when the as-formed single-crystalline film is increased in temperature to some extent.

As hereinabove described, the reflector 2072 is preferably made of a metal, since $Ne^+$ ions are converted to neutral atoms when an $Ne^+$ ion current which is slightly mixed in the neutral atom current is reflected by the conductive reflector 2072, so that the sample 2071 is irradiated with the as-converted neutral atom current. The neutral atom current is advantageously incident upon the sample 2071 as a flow having a regulated direction since its direction of progress hardly diverges dissimilarly to an ion current.

In the apparatus 2060, conversion to a single crystal sequentially progresses at the same time in the process of growth of the amorphous or polycrystalline thin film by plasma CVD. Thus, it is possible to form a single-crystalline film having a large thickness under a low temperature. Since a single-crystalline film can be formed under a low temperature, it is possible to further form a new single-crystalline film on a sample which is already provided with a prescribed device without changing properties of the device, for example.

While the aforementioned method utilizes CVD, a gel solution of a mixture of an organic compound of the component elements may be applied by a spinner, fired and irradiated with radical beams similarly to the above, when the film is prepared by a sol-gel method.

While the amorphous thin film is formed once and simultaneously single-crystallized in the aforementioned embodiment, it is possible to obtain a stable single-crystalline film having high homogeneity even if the thickness is increased, by forming a single-crystalline thin film by the aforementioned method and growing a single-crystalline film on the upper suffice of the single-crystalline thin film serving as a seed crystal, or repeating the aforementioned method a plurality of times, when a constant thickness is required for the single-crystalline film.

Thus, it is possible to grow the semiconductor films 2012, 2014 and 2015 of arbitrary materials and single-crystallize the same whatever material is employed for the substrate 2011, whereby it is possible to employ group III-V compounds as the materials for improving the absorption coefficient and wavelength characteristics on absorption ends. Further, the degree of freedom in design is increased such that the first semiconductor film 2012 as a single-crystalline film can be easily formed on the first electrode 2013 which is prepared from a metal material as shown in FIG. 84, and the design can be easily changed. According to this embodiment, the single-crystalline semiconductor films 2012, 2014 and 2015 can be formed on the upper surface of the substrate 2011 by CVD, whereby it is not necessarily required to manufacture the solar cell through a wafer but the semiconductor films 2012, 2014 and 2015 can be formed as thin as possible using an arbitrary low-priced substrate, thereby reducing the manufacturing cost. In more concrete terms, a semiconductor film generally contributing as a solar cell is sufficiently reduced in thickness to several 10 μm, and hence it is possible to reduce the inventive solar cell to such a minimum necessary thickness.

According to the radical beam irradiation, further, the semiconductor films 2012, 2014 and 2015 can be consistently single-crystallized under low temperature environment as in this embodiment, whereby no heat resistance is required for the substrate 2011 but the member cost for the overall solar cell can be reduced by employing the low-priced substrate 2011.

(Thirteenth Embodiment)
<Structure>

Figure 93:
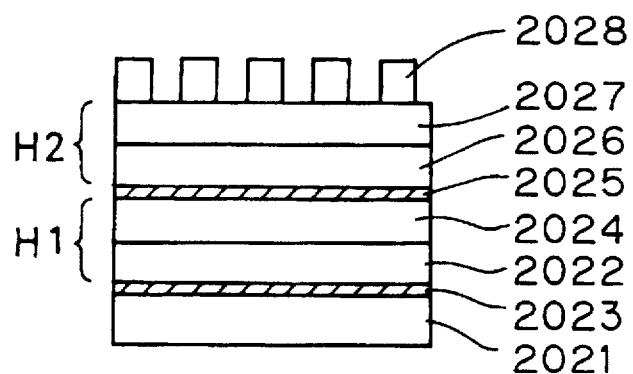
FIG. 93 is a sectional view showing a solar cell according to a thirteenth embodiment of the present invention.

FIG. 93 is a sectional view showing a solar cell of a tandem structure employing group II-VI compound semiconductors according to a thirteenth embodiment of the present invention. Referring to FIG. 93, numeral 2021 denotes a substrate of glass or $SiO_2$/Si, numeral 2022 denotes an n-type (first conductivity type) first semiconductor film of a group II-VI material such as CdTe, being different from the material for the substrate 2021, which is formed on an upper surface of the substrate 2021, numeral 2023 denotes a first electrode (back-side electrode) which is connected to a back surface of the first semiconductor film 2022, numeral 2024 denotes a second semiconductor film of p-type (second conductivity type) CdTe which is formed on an upper surface of the first semiconductor film 2022, symbol H1 denotes a first heterojunction part which is formed by the first and second semiconductor films 2022 and 2024, numeral 2025 denotes an interlayer conductor, numeral 2026 denotes an n-type (first conductivity type) third semiconductor film which is made of a material such as CdS, numeral 2027 denotes a p-type (second conductivity type) fourth semiconductor film which is made of a material such as CdS, symbol H2 denotes a second heterojunction part which is formed by the third and fourth semiconductor films 2026 and 2027, and numeral 2028 denotes second electrodes (front-side electrodes).

The interlayer conductor 2025 is prepared from a heavy metal such as tungsten having an ohmic junction property in the interface between the heterojunction parts H1 and H2, i.e., between the second and third semiconductor films 2024 and 2026. This interlayer conductor 2025 is formed in a small thickness to be capable of transmitting light, in order to introduce light passing through the second heterojunction part H2 into the first heterojunction part H1 as much as possible. In more concrete terms, the interlayer conductor 2025 is preferably set at a thickness of not more than about 300 Å.

In this case, electromotive force may be damaged since reverse p-n junctions are formed in the interface between the heterojunction parts H1 and H2. In order to cope with this, the second semiconductor film 2024 which is arranged on one side of the interlayer conductor 2025 is made different in crystal orientation from the third semiconductor film 2026 which is formed on another side. Thus, a grain boundary is formed in the interface due to the difference in crystal orientation between the semiconductor films 2024 and 2026, whereby electrons are easily moved in this portion to attain a low-resistance ohmic junction as the result.

The first, second, third and fourth semiconductor films 2022, 2024, 2026 and 2027 are formed by single-crystalline films respectively.

Thus, according to this embodiment, light of a wide range can be absorbed due to the employment of the tandem structure, while it is possible to remarkably improve electron mobility upon entrance of light since the semiconductor films 2022, 2024, 2026 and 2027 are formed by single-crystalline films respectively, thereby improving electrical properties. Namely, it is possible to simultaneously satisfy light absorptivity and electrical efficiency.

The number of photons which can be absorbed in a semiconductor material is generally reduced as the forbidden bandwidth is increased, while the ratio of an energy component which can be extracted to the exterior from energy of the as-absorbed photons is increased in proportion to the forbidden bandwidth. Thus, it is understood that correlation is caused between conversion efficiency and the forbidden bandwidth when the number of photons which can be absorbed is multiplied by the ratio of the energy component of the photons which can be extracted to the exterior. It is known that the forbidden bandwidth of a group II-VI compound such as CdS or CdTe or a group III-V compound such as GaAs exhibits the highest conversion efficiency in such correlation. In consideration of this, the materials for the semiconductor films 2022, 2024, 2026 and 2027 are prepared from group II-VI compounds according to this embodiment, whereby the absorption coefficient and the wavelength characteristics at absorption ends are remarkably improved.

<Manufacturing Method>

Figure 94:
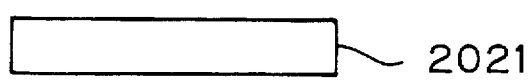
FIG. 94 is a sectional view showing a step of manufacturing the solar cell according to the thirteenth embodiment of the present invention.
Figure 95:
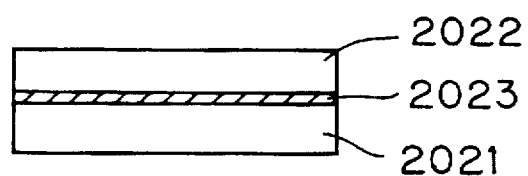
FIG. 95 is a sectional view showing a step of manufacturing the solar cell according to the thirteenth embodiment of the present invention.

The solar cell having the aforementioned structure is manufactured as follows: First, the first electrode 2023 is formed on the upper surface of the substrate 2021 shown in FIG. 94 by vapor deposition or the like with Ag or the like, and then the n-type first semiconductor film 2022 is formed on the upper surface of the first electrode 2023 in an amorphous or polycrystalline state by radical beam irradiation (plasma CVD) similarly to that described in relation to the twelfth embodiment, as shown in FIG. 95. In this embodiment, however, a gaseous compound such as $Cd(CH_3)_2$, $TeH_2$ gas and a gaseous compound of halogen are supplied from the reaction gas supply pipes 2073a, 2073b and 2073c shown in FIG. 89 respectively, to form a thin film. Then, the first semiconductor film 2022 is single-crystallized by radical beam irradiation which is similar to that described in relation to the twelfth embodiment.

Figure 96:
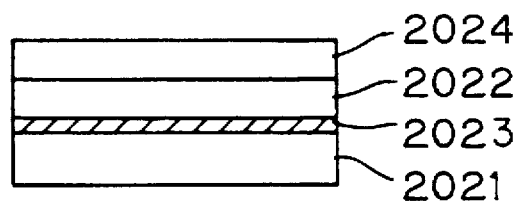
FIG. 96 is a sectional view showing a step of manufacturing the solar cell according to the thirteenth embodiment of the present invention.
Figure 97:
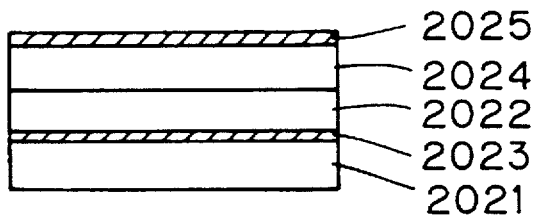
FIG. 97 is a sectional view showing a step of manufacturing the solar cell according to the thirteenth embodiment of the present invention.

Then, the p-type second semiconductor film 2024 is formed on the upper surface of the first semiconductor film 2022 in an amorphous or polycrystalline state by CVD or the like, as shown in FIG. 96. At this time, a gaseous compound such as $Cd(CH_3)_2$, $TeH_2$ gas and a group I gaseous compound are supplied from the reaction gas supply pipes 2073a, 2073b and 2073c shown in FIG. 89 respectively, to form a thin film. At the same time, the second semiconductor film 2024 is single-crystallized by radical beam irradiation which is similar to that described in relation to the twelfth embodiment, to form the first heterojunction part H1 shown in FIG. 96. Then, the interlayer conductor 2025 of tungsten is formed on the upper surface of the second semiconductor film 2024 by vapor deposition or sputtering, as shown in FIG. 97.

Figure 98:
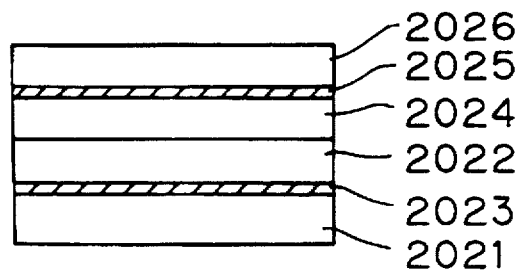
FIG. 98 is a sectional view showing a step of manufacturing the solar cell according to the thirteenth embodiment of the present invention.
Figure 99:
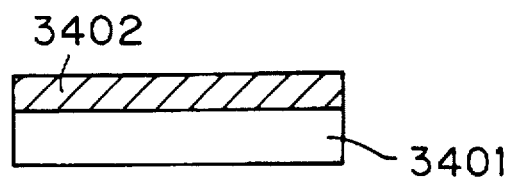
FIG. 99 is a sectional view showing a step of manufacturing a solar cell according to Prior Art 2.
Figure 100:
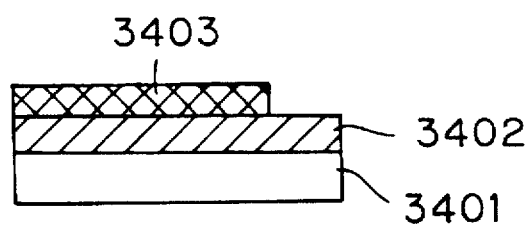
FIG. 100 is a sectional view showing a step of manufacturing the solar cell according to Prior Art 2.
Figure 101:
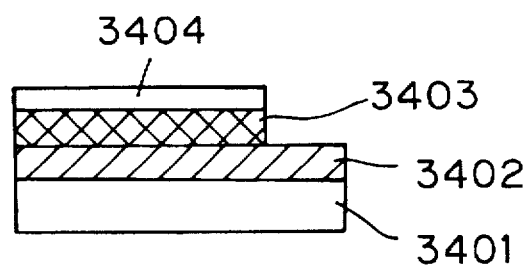
FIG. 101 is a sectional view showing a step of manufacturing the solar cell according to Prior Art 2.
Figure 102:
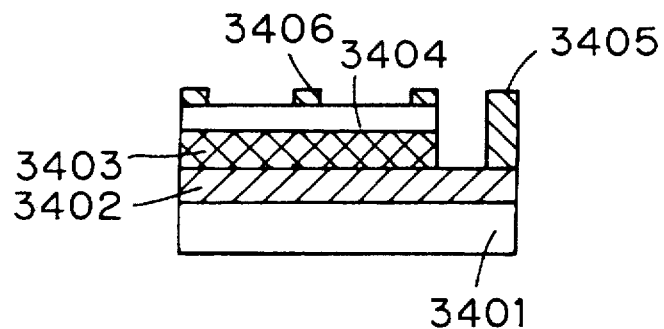
FIG. 102 is a sectional view showing the solar cell according to Prior Art 2.
Figure 103A:
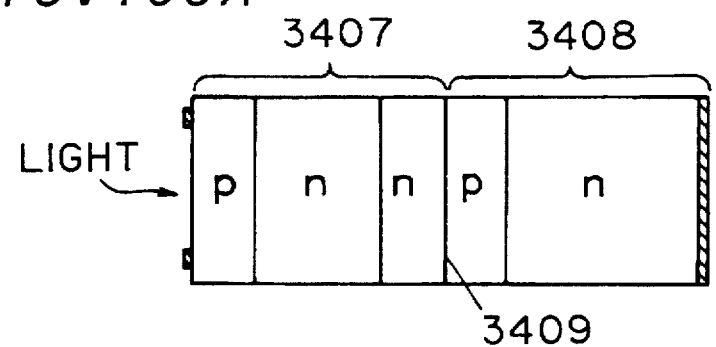
FIGS. 103A and 103B illustrate a solar cell according to Prior Art 3 and its characteristics.
Figure 103B:
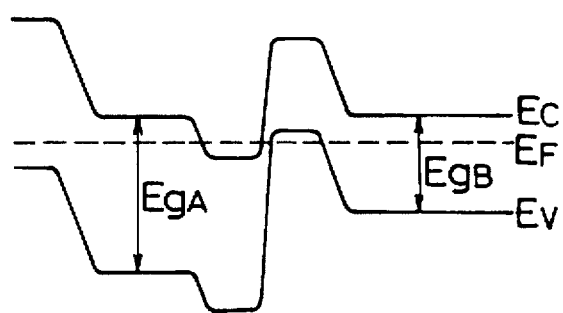

Then, the n-type third semiconductor film 2026 is formed on the upper surface of the interlayer conductor 2025 in an amorphous or polycrystalline state by radical beam irradiation (plasma CVD) which is similar to that described in relation to the twelfth embodiment, as shown in FIG. 98. In this embodiment, however, a gaseous compound such as $Cd(CH_3)_2$, $TeH_2$ gas and a gaseous compound of halogen are supplied from the reaction gas supply pipes 2073a, 2073b and 2073c shown in FIG. 89 respectively, to form a thin film. Then, the third semiconductor film 2026 is single-crystallized by radical beam irradiation which is similar to that described in relation to the twelfth embodiment.

Then, the p-type fourth semiconductor film 2027 is formed on the upper surface of the third semiconductor film 2026 in an amorphous or polycrystalline state by CVD or the like. At this time, a gaseous compound such as $Cd(CH_3)_2$, $SF_6$ and $AgR\{P(C_2H_5)_3\}$ are supplied from the reaction gas supply pipes 2073a, 2073b and 2073c shown in FIG. 89 respectively, to form a thin film. At the same time, the fourth semiconductor film 2027 is single-crystallized by radical beam irradiation which is similar to that described in relation to the twelfth embodiment, and the second electrodes 2028 are selectively formed on the upper surface of the fourth semiconductor film 2027 by vapor evaporation or sputtering with Ag or the like, to complete the solar cell shown in FIG. 93.

Thus, it is possible to grow the semiconductor films 2022, 2024, 2026 and 2027 of arbitrary materials and single-crystallize the same whatever material is employed for the substrate 2021, whereby it is possible to employ group II–VI compounds as the materials for improving the absorption coefficient and wavelength characteristics on absorption ends.

(Fourteenth Embodiment)
<Structure>

Figure 104:
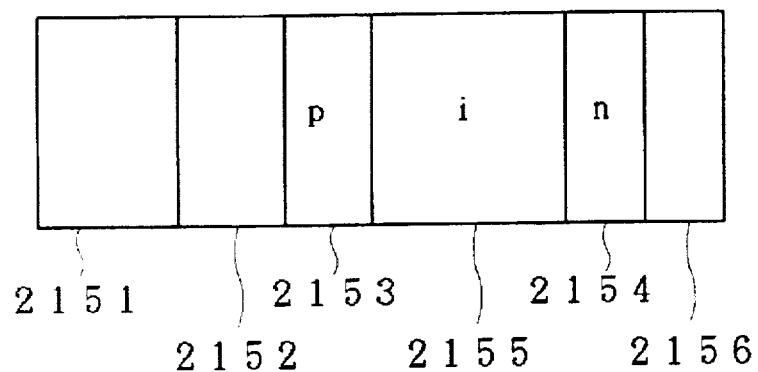
FIG. 104 is a sectional view showing a solar cell according to a fourteenth embodiment of the present invention.

FIG. 104 is a sectional view showing a solar cell of a p-i-n structure according to a fourteenth embodiment of the present invention. Referring to FIG. 104, numeral 2151 denotes a transparent substrate of glass which is arranged on a photoreceiving side (front side), numeral 2152 denotes a transparent conductive oxide (TCO) film which is formed on a light travelling direction side (back side) of the transparent substrate 2151 for serving as an electrode, numeral 2153 denotes a first semiconductor layer of p-type (first conductivity type) Si which is formed on a light travelling direction side of the transparent conductive oxide film 2152, numeral 2154 denotes a second semiconductor layer of n-type (second conductivity type) Si which is arranged on a light travelling direction side beyond the first semiconductor layer 2153, numeral 2155 denotes an intrinsic semiconductor layer which is interposed between the first and second semiconductor layers 2153 and 2154, and numeral 2156 denotes a back electrode of aluminum or the like which is formed on a light travelling direction side of the second semiconductor layer 2154. The first semiconductor layer 2153 is formed by a single-crystalline film, while the intrinsic semiconductor layer 2155 and the second semiconductor layer 2154 are formed by amorphous films respectively.

Figure 132:
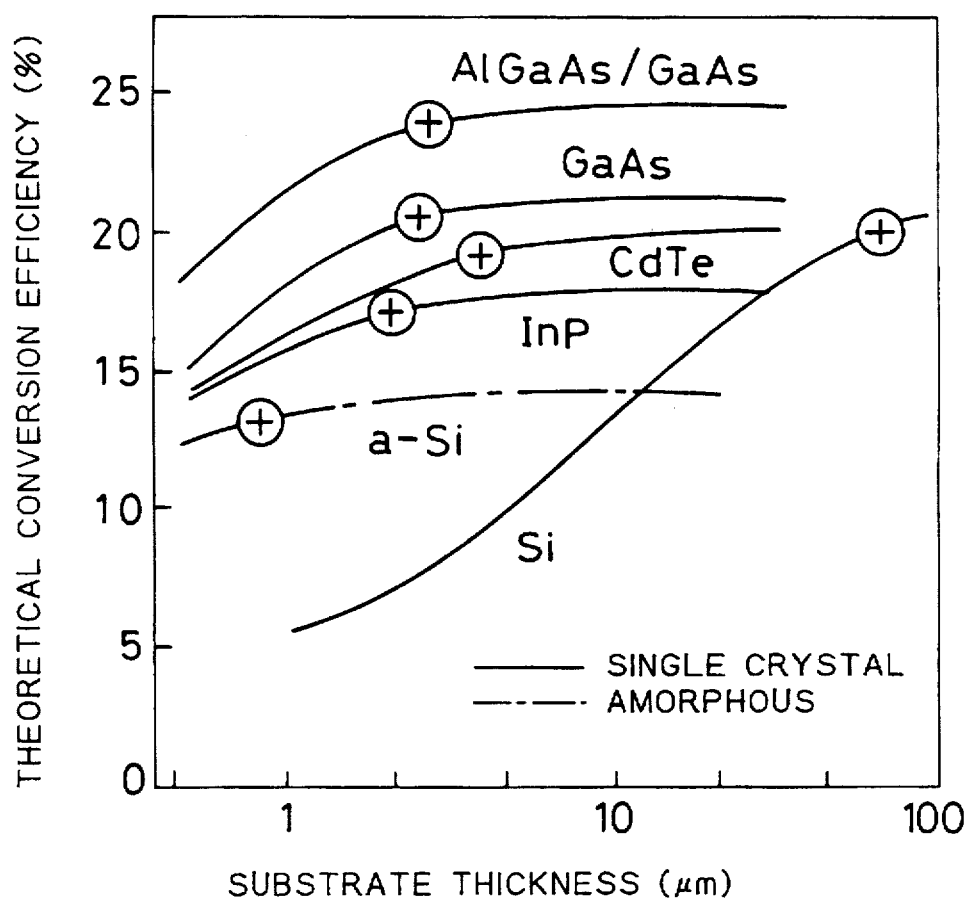

The first semiconductor layer 2153 which is formed by a single-crystalline film can mainly absorb long-wave light to some extent, while it is preferable to minimize the first semiconductor layer 2153 in thickness, in order to reduce the cost by minimizing the thickness of the overall solar cell and the Si materials therefor. Particularly in a case of a solar cell having shorter wavelength characteristics, it is preferable to reduce the cost even at the sacrifice of longer wavelength characteristics. In order to introduce short-wave light, which cannot be absorbed by the first semiconductor layer 2153, into the intrinsic semiconductor layer 2155 and the second semiconductor layer 2154 provided on the travelling direction side as much as possible, further, it is preferable to minimize the thickness of the first semiconductor layer 2153. To this end, the first semiconductor layer 2153 is made smaller in thickness than the intrinsic semiconductor layer 2155. In more concrete terms, the intrinsic semiconductor layer 2155 is formed to be about 5000 to 10000 Å, while the first semiconductor layer 2153 is formed to be about 150 to 1000 Å. Further, the second semiconductor layer 2154 and the back electrode 2156 are set at thicknesses of about 500 to 1000 Å and about 10000 Å respectively. The thickness of the intrinsic semiconductor layer 2155 is decided in consideration of the conversion efficiency optimum point shown in FIG. 132.

<Photoreceiving Operation>

When the solar cell having the aforementioned structure receives sunlight or the like, the light enters the first semiconductor layer 2153 through the transparent substrate 2151 and the transparent conductive oxide film 2152, and then enters the intrinsic semiconductor layer 2155 and the second semiconductor layer 2154. The respective semiconductor layers 2153, 2155 and 2154 absorb the light, whereby electrons and holes are generated by photons having light energy. The electrons and holes are separated into n-type and p-type regions, so that the holes and the electrons are excessive in the p-type and n-type regions respectively to charge in positive and negative states. When an external load is connected in this state, it is possible to drive this load by extracting electrical energy. The solar cell according to this embodiment employs the p-i-n structure, whereby it is possible to generate most parts of the electrons and holes by light in the intrinsic semiconductor layer 2155 and parts of the semiconductor layers 2153 and 2154 which are adjacent to the intrinsic semiconductor layer 2155, i.e., depletion regions having internal electric fields, thereby immediately extracting the same as a photogenerated current as compared with a general p-n junction solar cell. Namely, it is possible to advantageously omit a process of movement of minority carriers to a p-n boundary by diffusion which is required in the general p-n junction solar cell.

Since the first semiconductor layer 2153 which is arranged on the photoreceiving side is formed by an Si single-crystalline film, an absorption coefficient on a longer wavelength side of at least 0.7 μm is increased to improve electromotive force characteristics for a longer wavelength side on the photoreceiving side.

The first semiconductor layer 2153 is set at a small thickness of about 150 to 1000 Å, whereby it is possible to reduce absorption of light on a shorter wavelength side in particular, as compared with that of the prior art having a thickness of at least 200 μm, for example. Further, it is possible to introduce light which cannot be absorbed by the first semiconductor layer 2153, i.e., light mainly consisting of a short-wave component of less than 0.7 μm, into the intrinsic semiconductor layer 2155 and the second semiconductor layer 2154 provided on the travelling direction side as much as possible. Namely, most of such short-wave light is absorbed in the intrinsic semiconductor layer 2155 and the second semiconductor layer 2154 of Si amorphous films which are arranged on the light travelling direction side with high absorption coefficients as shown in FIG. 141, and excited to generate power.

Since the first semiconductor layer 2153 is formed by an Si single-crystalline film, it is possible to reduce crystal defect density on the surface layer to about $10^3$ to $10^5/cm^2$, thereby reducing annihilation of minority carriers caused by recombination. Thus, it is possible to effectively extract the minority carriers which are generated by absorption of light in the surface layer.

<Manufacturing Method>

Figure 105:
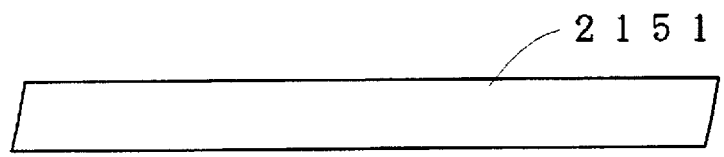
FIG. 105 is a sectional view showing a step of manufacturing the solar cell according to the fourteenth embodiment of the present invention.
Figure 106:
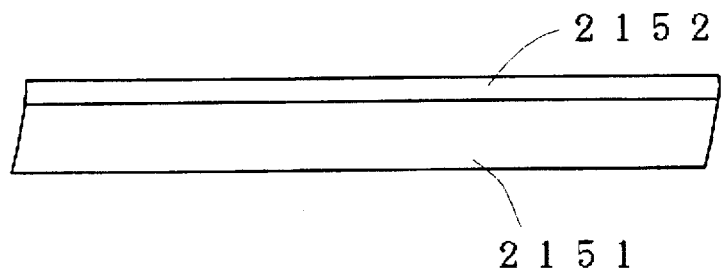
FIG. 106 is a sectional view showing a step of manufacturing the solar cell according to the fourteenth embodiment of the present invention.
Figure 107:
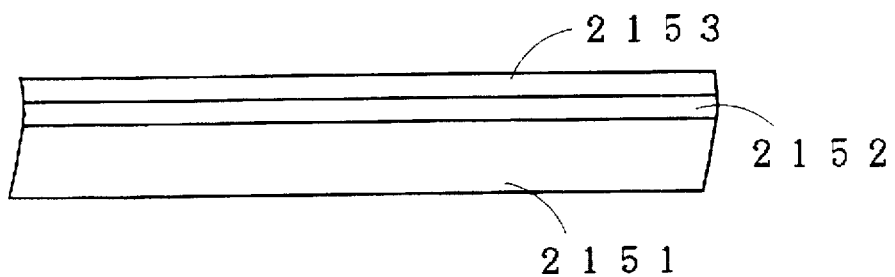
FIG. 107 is a sectional view showing a step of manufacturing the solar cell according to the fourteenth embodiment of the present invention.
Figure 108:
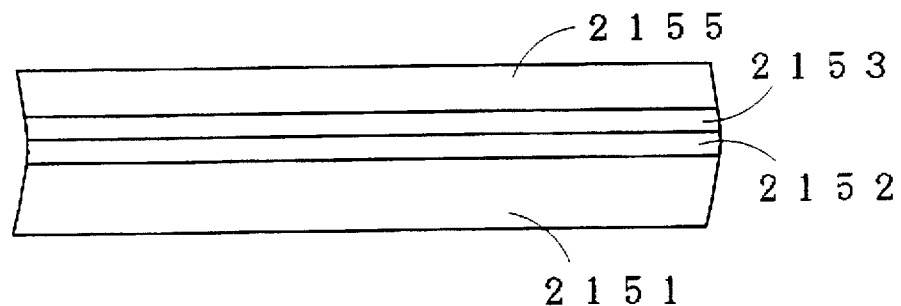
FIG. 108 is a sectional view showing a step of manufacturing the solar cell according to the fourteenth embodiment of the present invention.
Figure 109:
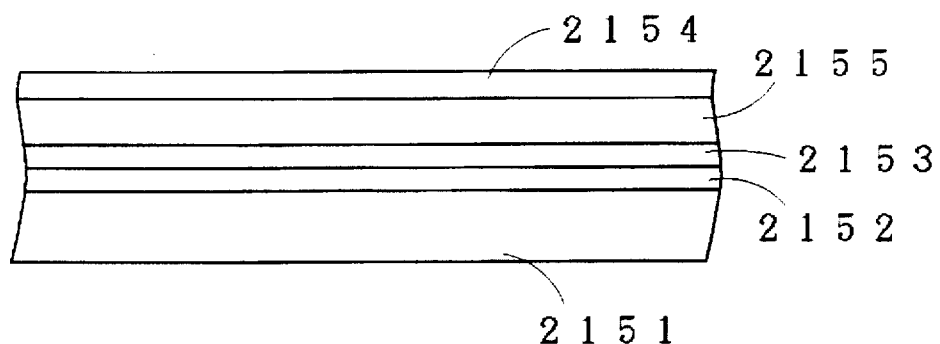
FIG. 109 is a sectional view showing a step of manufacturing the solar cell according to the fourteenth embodiment of the present invention.

The solar cell having the aforementioned structure is manufactured as follows: First, the transparent substrate 2151 of glass shown in FIG. 105 is washed and thereafter the transparent conductive oxide film 2152 is formed on the upper surface of the transparent substrate 2151 by vapor deposition or thermal CVD, with tin oxide ($SnO_2$) and indium tin oxide (ITO), as shown in FIG. 106. Then, a p-type amorphous silicon film is deposited under temperature environment of about 300° C. by plasma CVD employing $SiH_4$ and $B_2H_6$ while neutral atoms of Ne or the like are beam-applied by radical beam irradiation as described later under such temperature environment that the substrate temperature reaches about 300° to 490° C., for single-crystallizing the p-type amorphous silicon film and forming the first semiconductor layer 2153, as shown in FIG. 107. At this time, the thickness of the p-type amorphous silicon film is set at about 150 to 1000 Å. Then, an intrinsic amorphous silicon film is deposited under temperature environment of about 300° C. by plasma CVD employing $SiH_4$, to form the intrinsic semiconductor layer 2155, as shown in FIG. 108. Further, a p-type amorphous silicon film is deposited under temperature environment of about 300° C. by plasma CVD employing $SiH_4$ and $PH_3$, to form the second semiconductor layer 2154, as shown in FIG. 109. Thereafter the back electrode 2156 is formed by vapor deposition with aluminum or the like, to complete the solar cell shown in FIG. 104.

A single-crystalline film forming method (radical beam irradiation) for forming an amorphous film and simultaneously single-crystallizing the same is now described in detail.

<Overall Structure of Crystalline Film Forming Apparatus>

Figure 110:
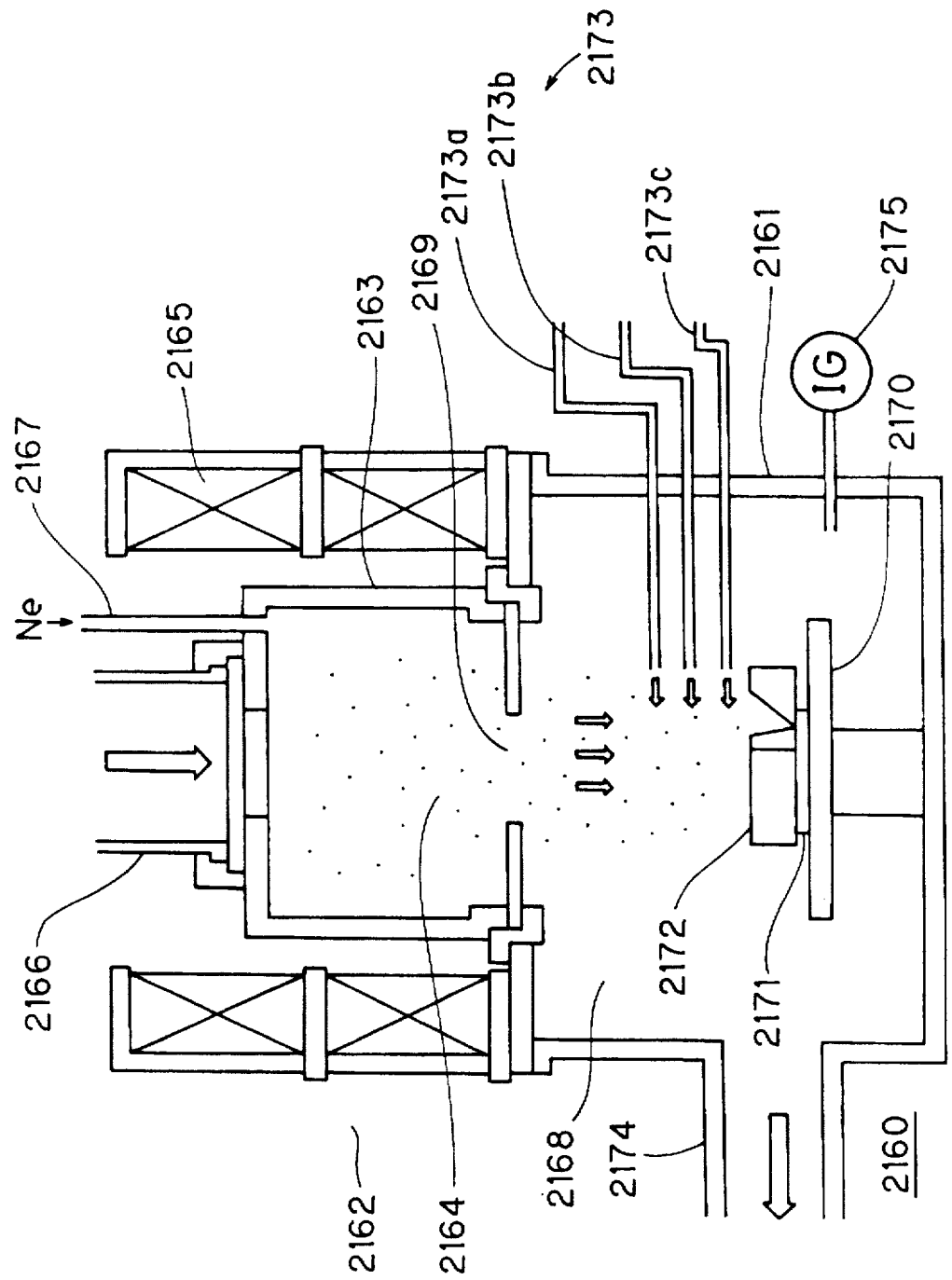
FIG. 110 is a front sectional view showing the structure of an apparatus which is suitable for carrying out the method according to the fourteenth embodiment of the present invention.

FIG. 110 is a front sectional view showing a structure of an exemplary single-crystalline thin film forming apparatus 2160 for effectively implementing a method of forming a single-crystalline thin film according to the embodiment of the present invention. This apparatus 2160 comprises a reaction vessel 2161, and an electron cyclotron resonance (ECR) ion generator 2162 which is built in an upper portion of the reaction vessel 2161. The ECR ion generator 2162 comprises a plasma container 2163 which defines a plasma chamber 2164 in its interior. A magnetic coil 2165 is provided around the plasma container 2163, to apply a dc high magnetic field to the plasma chamber 2164. Further, a waveguide 2166 and an inert gas inlet pipe 2167 are provided on an upper surface of the plasma container 2163 for introducing a microwave and an inert gas such as neon (Ne) or oxygen (O) into the plasma chamber 2164 respectively.

The reaction vessel 2161 defines a reaction chamber 2168 in its interior. The bottom portion of the plasma container 2163 defines an outlet 2169 for passing a plasma in its center. The reaction chamber 2168 and the plasma chamber 2164 communicate with each other through the outlet 2169. In the interior of the reaction chamber 2168, a sample holder 2170 is arranged on a position immediately under the outlet 2169. A sample 2171 (the transparent substrate 2151 in the fourteenth embodiment) is placed on the sample holder 2170, while a reflector 2172 is placed to be located above the sample 2171. A desired single-crystalline film (the first semiconductor layer 2153 in the fourteenth embodiment) is formed on the sample 2171. The reflector 2172 is preferably made of a metal. The sample holder 2170 is coupled to a rotation driving mechanism (not shown), to be rotatable in a horizontal plane. Further, the sample stand 2170 can horizontally move the sample 2171 while fixing the reflector 2172.

The reaction chamber 2168 communicates with reaction gas supply pipes 2173. Reaction gases are supplied through the reaction gas supply pipes 2173, for forming a film of a prescribed material on the sample 2171 by plasma CVD. The example shown in FIG. 110 is provided with three reaction gas supply pipes 2173a, 2173b and 2173c. The reaction chamber 2168 further communicates with an evacuation pipe 2174. An end of the evacuation pipe 2174 is coupled with a vacuum unit (not shown) to evacuate the reaction chamber 2168 through the evacuation pipe 2174, thereby maintaining the reaction chamber 2168 at a prescribed degree of vacuum. A vacuum gauge 2175 for displaying the degree of vacuum in the reaction chamber 2168 is provided in communication with the reaction chamber 2168.

<Structure of Reflector>

Figure 111:
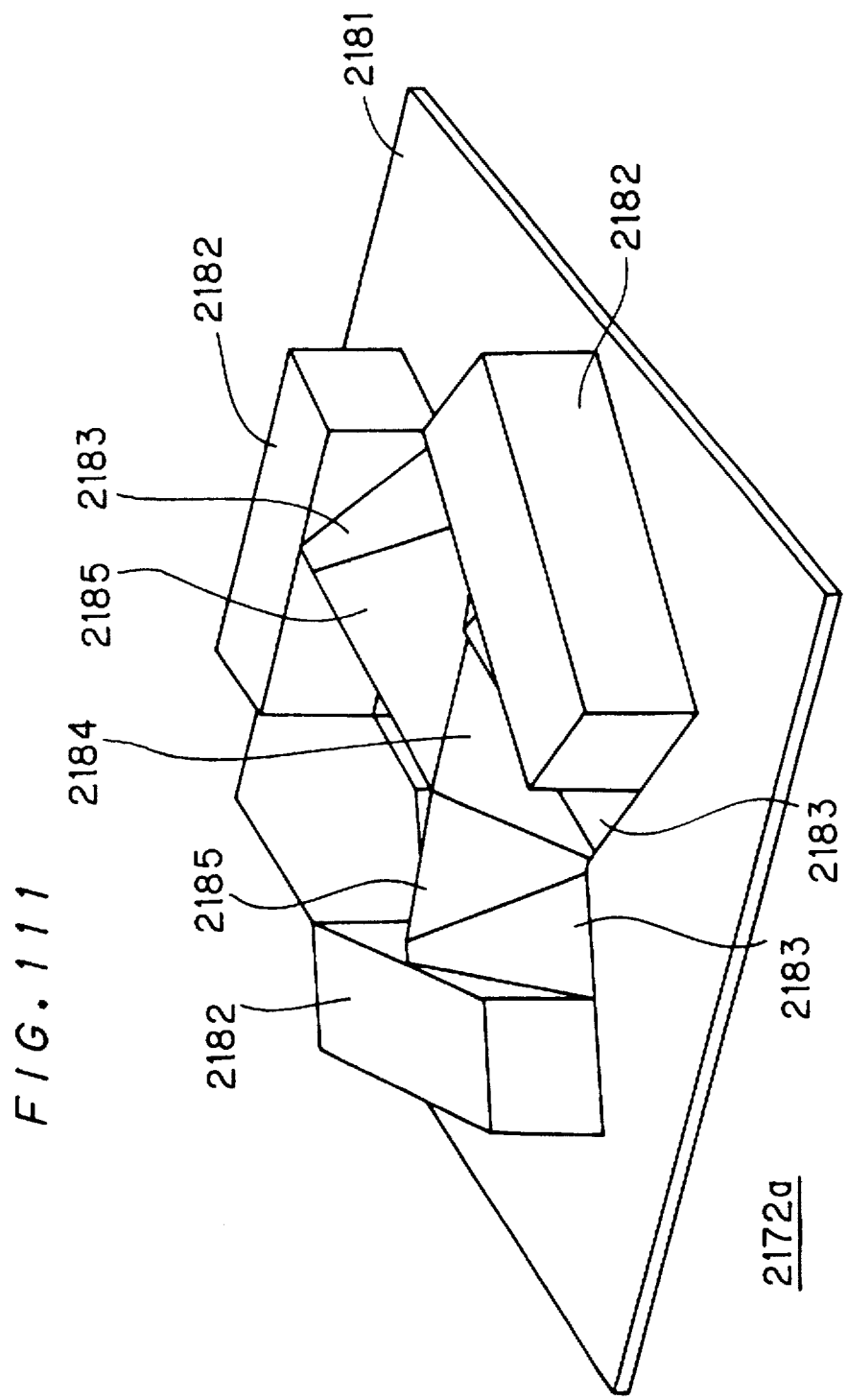
FIG. 111 is a perspective view showing an exemplary reflector in the fourteenth embodiment of the present invention.

FIG. 111 is a perspective view showing an exemplary reflector 2172a. This reflector 2172a is adapted to form a single crystal having a diamond structure. The reflector 2172a defines an opening on a central portion of a flat plate type base 2181. Three blocks 2182 in the form of rectangular parallelopipeds are fixedly provided around the opening, and reflecting blocks 2183 are fixed to inner sides of the blocks 2182 respectively. Consequently, an equilateral triangular opening 2184 which is trimmed with the reflecting blocks 2183 is defined at the central portion of the base 2181. In the reflecting blocks 2183, slopes 2185 facing the opening 2184 serve as reflecting surfaces for reflecting a gas beam. Therefore, the angles of inclination of the slopes 2185 are set at proper levels in correspondence to the directions of crystal axes of the single crystal to be formed.

FIGS. 112A, 112B and 112C are a plan view, a side elevational view and a front elevational view of the reflector 2172a which is formed by the blocks 2182 and the reflecting blocks 2183 respectively. As shown in FIG. 112(b), the angle of inclination of each slope 2185 is set at 55°. The reflector 2172a is in a structure not fixing the sample 2171, whereby the sample 2171 can be relatively horizontally moved with respect to the reflector 2172a. Therefore, it is possible to form a single-crystalline film on the sample 2171 having a large area by horizontally moving the sample 2171 while fixing the reflector 2172a on the sample holder 2170.

<Operation of ECR Ion Generator>

Referring again to FIG. 110, the operation of the ECR ion generator 2162 is now described. An inert gas such as Ne, O or Ar is introduced from the inert gas inlet pipe 2167 into the plasma chamber 2164, while a microwave is simultaneously introduced from the waveguide 2166 into the plasma chamber 2164. Further, a dc current is also simultaneously supplied to the magnetic coil 2165, to form a dc magnetic field in the plasma chamber 2164 and its periphery. The gas as supplied is maintained in a plasma state by actions of the microwave and the dc magnetic field. This plasma is formed by high-energy electrons which are in screw motion in the principle of cyclotron by the microwave and the dc magnetic field.

These electrons, which have diamagnetic properties, are moved to a weaker magnetic field side, to form an electron stream along a line of magnetic force. Consequently, positive ions also form an ion current along the line of magnetic force following the electron stream, in order to maintain electrical neutrality. In other words, the electron stream and the ion current are downwardly directed from the outlet 2169 into the reaction chamber 2168. The ion current and the electron stream thus flowing in parallel with each other are recombined with each other after a lapse of a deionization time, to form a neutral atom current. Therefore, substantially only a neutral atom current is formed in a position downwardly separated from the outlet 2169 beyond a prescribed distance.

Figure 113:
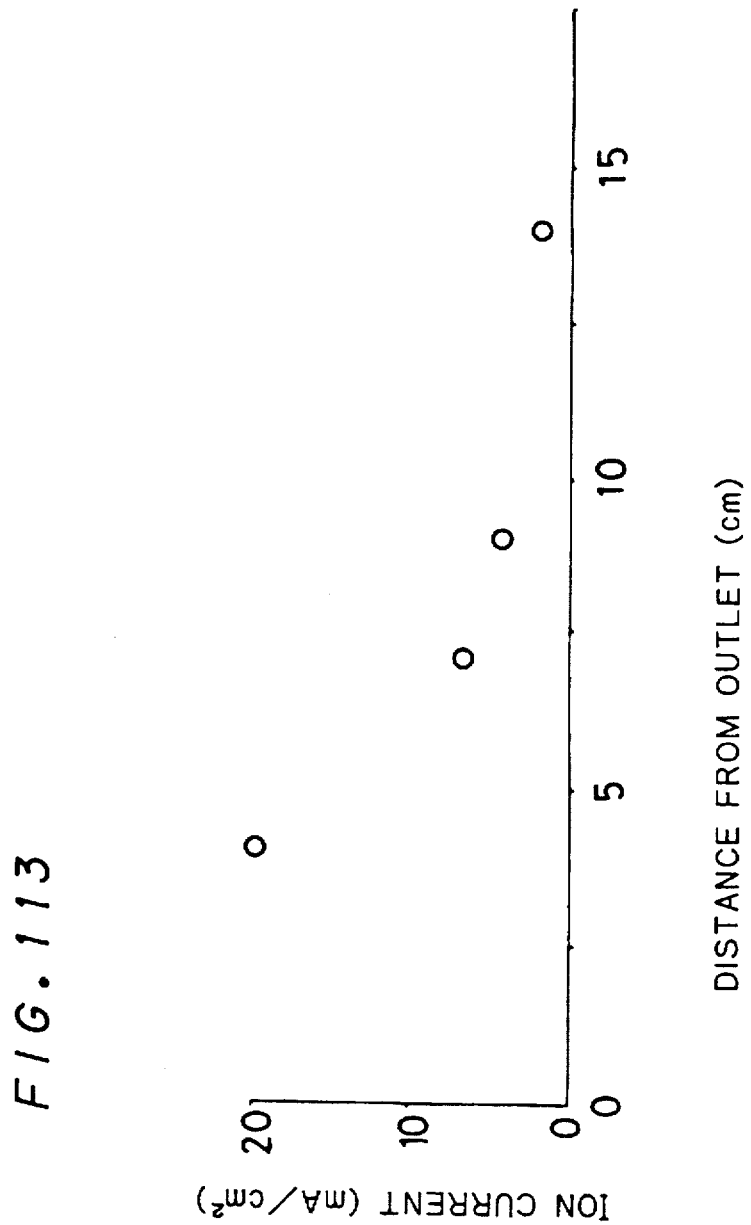
FIG. 113 is a graph showing characteristics of an ECR ion generator in the fourteenth embodiment of the present invention.

FIG. 113 is a graph showing the result of relation between ion current density and the distance from the outlet 2169 actually measured when $Ar^+$ ions of 10 eV were discharged from the outlet 2169 by the ECR ion generator 2162. It is understood from this graph that the ion current density is abruptly reduced at a distance of about 4 to 5 cm from the outlet 2169, and attenuated to a level of $1/10$ to $1/12$ at a position of 14 cm. The neutral atom current is increased by such attenuation of the ion current, whereby substantially only a neutral atom current downwardly flows in a position downwardly separated from the outlet 2169 in excess of 14 cm.

Thus, the ECR ion generator 2162 for generating ions forms an ion current in parallel with the electron stream, whereby it is possible to easily obtain a neutral atom current having high density by employing the ECR ion generator 2162, with no employment of other means for neutralizing the ion current. Since the ion current is formed in parallel with the electron stream, further, it is possible to obtain an ion current which is close to a parallel current having a regulated direction of progress substantially with no divergence. Since the parallel ion current is converted to the neutral atom current, the atom current is also close to a parallel current having a regulated direction of progress.

<Operation of Crystalline Film Forming Apparatus>

Referring again to FIG. 110, the operation of the ECR ion generator 2162 for forming the first semiconductor layer 2153 is now described. The reflector 2172 is prepared from the reflector 2172a shown in FIGS. 111, 112A, 112B and 112C. First, reaction gases are supplied to an upper surface of the transparent substrate 2151 of glass serving as an underlayer from the reaction gas supply pipes 2173a, 2173b and 2173c respectively. In more concrete terms, $SiH_4$ is supplied from the reaction gas supply pipe 2173a and $B_2H_6$ is supplied from the reaction gas supply pipe 2173b, for example, under temperature environment of about 300° C. in formation of a p-type semiconductor layer (the first semiconductor layer 2153 in the fourteenth embodiment). In formation of an n-type second semiconductor, on the other hand, the reaction gas supply pipe 2173a may supply $SiH_4$ and the reaction gas supply pipe 2173b may supply $PH_3$, for example, under temperature environment of about 300° C. At this time, the degree of vacuum in the apparatus 2160 is so set that the back pressure is not more than $10^{-7}$ Torr and the operating pressure is $1 \times 10^{-4}$ to $4 \times 10^{-4}$ Torr, while microwave power and the growth rate are set at 2.34 GHz/300 W and 0.1 to 0.3 μm/hr respectively. In formation of the thin film, an n-type or p-type inert gas such as Ne atoms or Ar atoms having relatively small atomic weights is simultaneously introduced from the inert gas inlet pipe 2167. When Ar atoms are employed, for example, the same are preferably introduced at 15 sccm [$7 \times 10^{-4}$ mol/min.].

Due to the action of the ECR ion generator 2162, a plus ion current and an electron stream are formed downwardly from the outlet 2169. The distance between the outlet 2169 and the reflector 2172a (2172) is preferably set at a sufficient level for substantially converting the plus ion current to a neutral atom current. The reflector 2172a (2172) is set in a position receiving the downwardly directed Ne atom current. The reaction gas which is supplied from the reaction gas supply pipe 2173a is dashed against the sample 2171 by the plus ion current or the atom current. Consequently, a plasma CVD reaction progresses on the upper surface of the sample 2171, to grow an amorphous thin film.

At this time, the sample 2171 is not heated but maintained substantially at an ordinary temperature, whereby the amorphous thin film is grown substantially under the ordinary temperature. In other words, the amorphous thin film is formed at a temperature not more than a level facilitating crystallization by plasma CVD.

A part of the downwardly directed atom current of Ne or the like is reflected by the three slopes 2185 which are formed in the reflector 2172a, to be incident upon the upper surface of the sample 2171 through the opening 2184. Another part of the atom current is not incident upon the slopes 2185 but directly incident upon the upper surface of the sample 2171 through the opening 2184. In other words, the amorphous thin film being formed on the upper surface of the sample 2171 is irradiated with four atom current components, i.e., a component straightly received from the outlet 2169 and three components reflected by the three slopes 2185. Since the angles of inclination of the slopes 2185 are set at 55°, directions of incidence of the four atom current components correspond to four directions which are perpendicular to four independent densest crystal planes of the single crystal to be formed, i.e., (111) planes.

The energy of the plasma which is formed by the ECR ion generator 2162 is so set that the atoms reaching the sample 2171 are at energy levels causing no sputtering in the amorphous thin film, i.e., levels lower than a value which is known as the threshold energy level in sputtering of Si by irradiation with atoms. Therefore, the so-called law of Bravais acts on the as-grown amorphous thin film. Namely, molecules in the amorphous thin film are rearranged so that planes which are perpendicular to the atom current components applied to the amorphous thin film define densest crystal planes. Since the atom current as applied has four components which are incident in directions corresponding to those perpendicular to densest planes of a single-crystalline film having a single crystal orientation, the molecules are so rearranged that all planes perpendicular to the directions of incidence of the respective components define the densest planes. The directions of the (111) planes are controlled by the plurality of atom current components having directions of incidence which are independent of each other, whereby a single-crystalline film having a single crystal orientation is formed by such rearrangement of the molecules. In other words, the amorphous thin film being grown by plasma CVD is sequentially converted to a single-crystalline film having a regulated crystal orientation.

As hereinabove described, the sample 2171 is not heated and the single-crystalline film is formed under a temperature which is lower than that facilitating crystallization by plasma CVD. This is because the crystal orientation is arbitrarily directed regardless of the directions of the atom current components and cannot be controlled while a polycrystal is inevitably formed under a high temperature facilitating crystallization of molecules by plasma CVD alone with no application of the atom current.

As hereinabove described, relatively light Ne is preferably selected as an element forming the atom current which is applied to the single-crystalline film. This is because Ne atoms hardly penetrate into the single-crystalline film to remain in the same since there is a high probability that relatively heavy molecules rearwardly scatter the relatively light Ne atoms when the single-crystalline film is irradiated with the atom current. Further, the element for forming the atom current as applied is prepared from an inactive element since the inactive element forms no compound with either original molecules or as-doped impurities even if the same remains in the single-crystalline film and hardly exerts an influence on electronic/physical properties of the single-crystalline film, while the same can be easily removed to the exterior when the as-formed single-crystalline film is increased in temperature to some extent.

As hereinabove described, the reflector 2172 is preferably made of a metal, since $Ne^+$ ions are converted to neutral atoms when an $Ne^+$ ion current which is slightly mixed in the neutral atom current is reflected by the conductive reflector 2172, so that the sample 2171 is irradiated with the as-converted neutral atom current. The neutral atom current is advantageously incident upon the sample 2171 as a flow having a regulated direction since its direction of progress hardly diverges dissimilarly to an ion current.

In the apparatus 2160, conversion to a single crystal sequentially progresses at the same time in the process of growth of the amorphous thin film by plasma CVD. Thus, it is possible to form a single-crystalline film having a large thickness under a low temperature. Since a single-crystalline film can be formed under a low temperature, it is possible to further form a single-crystalline film on a sample which is already provided with a prescribed device without changing properties of the device, for example.

While the aforementioned method utilizes CVD, a gel solution of a mixture of an organic compound of the component elements may be applied by a spinner, fired and irradiated with radical beams similarly to the above, when the film is prepared by a sol-gel method.

While the first semiconductor layer 2153 may simply be single-crystallized by single radical beam irradiation since the same is preferably formed in a small thickness of about 150 to 1000 Å according to this embodiment, it is possible to obtain a stable single-crystalline film having high homogeneity even if the thickness is increased, by repeating the aforementioned radical beam irradiation a plurality of times, when a constant thickness is required for the single-crystalline film.

Thus, it is possible to form the first semiconductor layer 2153 of a single-crystalline film in an arbitrary thickness whatever material is employed for the transparent substrate 2151 of glass serving as an underlayer, whereby it is not necessary to obtain a single-crystalline film through a wafer obtained by cutting an ingot. Therefore, it is possible to form the first semiconductor layer 2153 in the minimum thickness on the low-priced transparent substrate 2151 of glass serving as an underlayer, thereby reducing the manufacturing cost. Further, it is possible to introduce most of particularly short-wave light into the intrinsic semiconductor layer 2155 and the second semiconductor layer 2154 due to the reduction in thickness so that part of wave light can be absorbed on the photoreceiving side by the single-crystalline film while short-wave light can be absorbed by the amorphous films on the light travelling direction side, thereby implementing efficient light absorption corresponding to respective absorption characteristics.

According to the radical beam irradiation, further, the single-crystalline film can be consistently formed under low temperature environment as in this embodiment, whereby no heat resistance is required for the transparent substrate 2151 but the member cost for the overall solar cell can be reduced by employing the low-priced transparent substrate 2151 of glass.

(Fifteenth Embodiment)

A solar cell according to a fifteenth embodiment of the present invention has a p-i-n structure similarly to the fourteenth embodiment shown in FIG. 104, while the former is different from the latter in a point that an n-type (second conductivity type) second semiconductor 2154 which is arranged on a light travelling direction side (back side) is also formed by a single-crystalline film in addition to a first semiconductor layer 2153 provided on a photoreceiving side. The second semiconductor layer 2154 is formed by depositing an n-type amorphous silicon film under temperature environment of about 300° C. by plasma CVD employing $SiH_4$ and $PH_3$ and simultaneously beam-applying neutral atoms of Ne or the like by radical beam irradiation which is similar to that described in relation to the fourteenth embodiment, for single-crystallizing the n-type amorphous silicon film. At this time, the thickness of the n-type amorphous silicon film is set at about 500 to 1000 Å. Other structure is similar to that of the fourteenth embodiment, and hence redundant description is omitted.

According to this embodiment, the absorption coefficient is not more than $10^3$ $cm^{-1}$ as shown in FIG. 141 even after long-wave light of at least 0.7 μm is mainly absorbed by the first semiconductor layer 2153 of a single-crystalline film, and the long-wave light cannot be completely absorbed. According to this embodiment, however, the long-wave light can be further absorbed by the second semiconductor layer 2154 of a single-crystalline film after short-wave light of less than 0.7 μm is absorbed by an intrinsic semiconductor layer 2155 of an amorphous film, whereby light absorption characteristics can be improved over a wide wavelength region. Other functions and effects of this embodiment are similar to those of the fourteenth embodiment.

(Sixteenth Embodiment)

<Structure>

Figure 114:
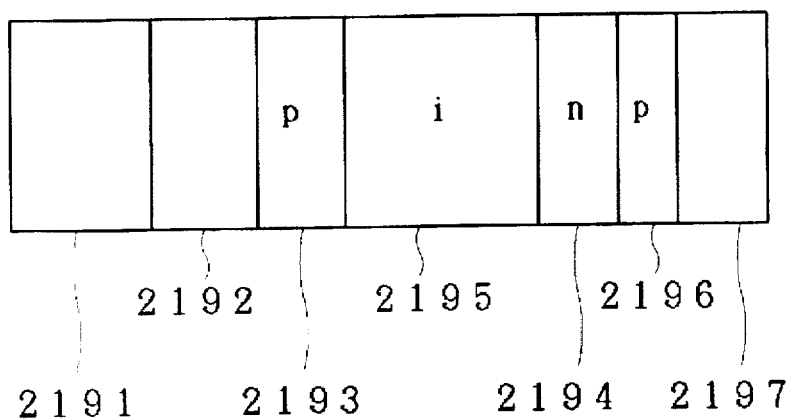
FIG. 114 is a sectional view showing a solar cell according to a sixteenth embodiment of the present invention.

As shown in FIG. 114, a solar cell according to a sixteenth embodiment of the present invention is of a p-i-n structure having an intrinsic semiconductor layer and of a tandem (stack system) structure. Referring to FIG. 114, numeral 2191 denotes a transparent substrate of glass which is arranged on a photoreceiving side, numeral 2192 denotes a transparent conductive oxide (TCO) film which is formed on a light travelling direction side of the transparent substrate 2191 for serving as an electrode, numeral 2193 denotes a first semiconductor layer of p-type (first conductivity type) Si which is formed on a light travelling direction side of the transparent conductive oxide film 2192, numeral 2194 denotes a second semiconductor layer of n-type (second conductivity type) Si which is arranged on a light travelling direction side beyond the first semiconductor layer 2193, numeral 2195 denotes an intrinsic semiconductor layer which is interposed between the first and second semiconductor layers 2193 and 2194, numeral 2196 denotes a p-type (first conductivity type) third semiconductor layer which is formed on a light travelling direction side of the intrinsic semiconductor layer 2195, and numeral 2197 denotes a back electrode of aluminum or the like which is formed on a light travelling direction side of the second semiconductor layer 2194. The first, second and third semiconductor layers 2193, 2194 and 2195 are formed by single-crystalline films, while the intrinsic semiconductor layer 2195 is formed by an amorphous layer respectively. The third semiconductor layer 2196 may be prepared from p-type single-crystalline Si similarly to the first semiconductor layer 2193, or a material having sensitivity on a longer wavelength side as compared with the p-type single-crystalline Si, such as SiGe, GaAs or CdTe, for example. The second and third semiconductor layers 2194 and 2196 may have thicknesses capable of attaining constant light absorption, such that these semiconductor layers 2194 and 2196 are set at about 2170 to 80 μm in total thickness.

According to this embodiment, the absorption coefficient is not more than $10^3$ cm$^{-1}$ as shown in FIG. 141 even after long-wave light is absorbed by the first semiconductor layer 2193 of a single-crystalline film, and the long-wave light cannot be completely absorbed. According to this embodiment, however, the long-wave light can be further absorbed by the second and third semiconductor layers 2194 and 2196 of single-crystalline films after short-wave light is absorbed by the intrinsic semiconductor layer 2195 of an amorphous film, whereby light absorption characteristics can be improved over a wide wavelength region.

<Manufacturing Method>

Figure 115:
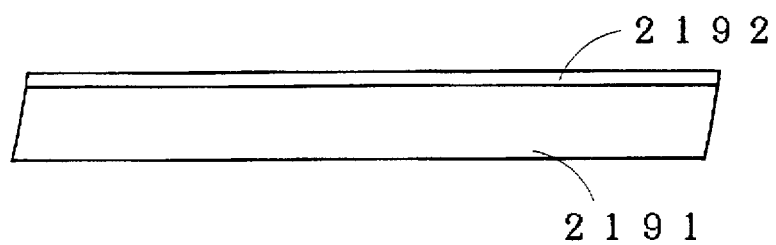
FIG. 115 is a sectional view showing a step of manufacturing the solar cell according to the sixteenth embodiment of the present invention.
Figure 116:
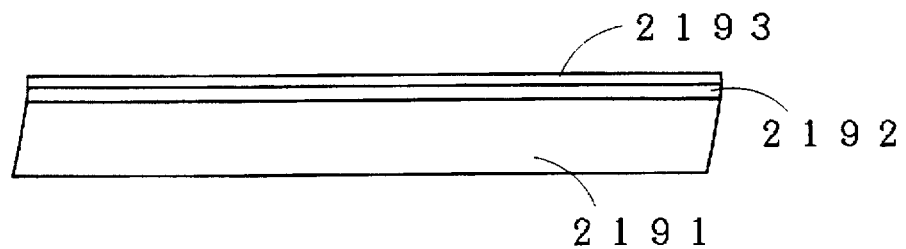
FIG. 116 is a sectional view showing a step of manufacturing the solar cell according to the sixteenth embodiment of the present invention.
Figure 117:
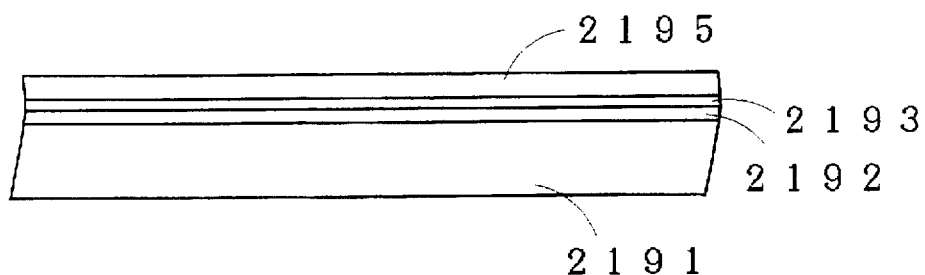
FIG. 117 is a sectional view showing a step of manufacturing the solar cell according to the sixteenth embodiment of the present invention.
Figure 118:
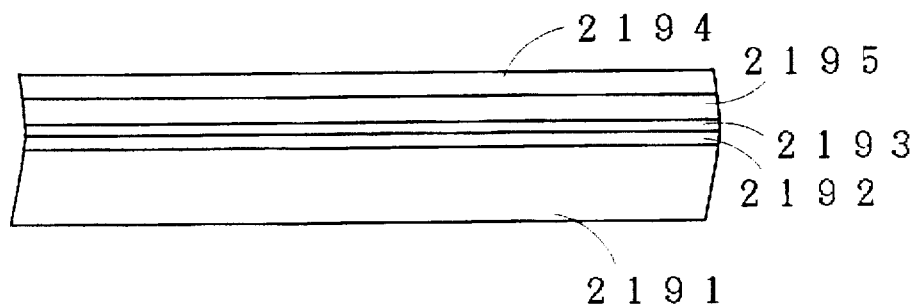
FIG. 118 is a sectional view showing a step of manufacturing the solar cell according to the sixteenth embodiment of the present invention.
Figure 119:
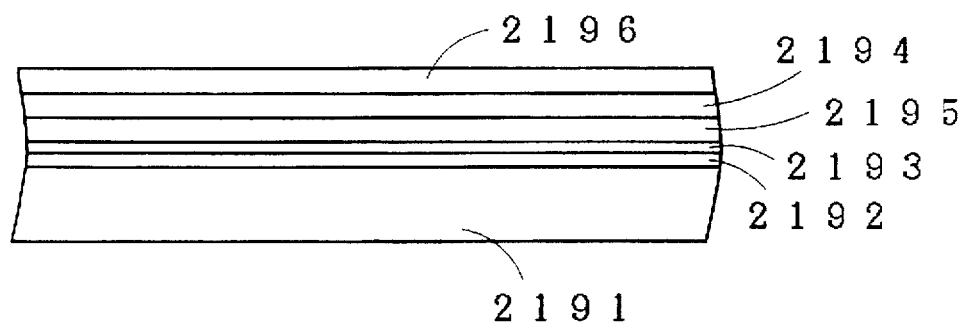
FIG. 119 is a sectional view showing a step of manufacturing the solar cell according to the sixteenth embodiment of the present invention.

The solar cell having the aforementioned structure is manufactured as follows: First, the transparent substrate 2191 of glass is washed, and thereafter the transparent conductive oxide film 2192 is formed on the upper surface of the transparent substrate 2191 by vapor deposition or thermal CVD with tin oxide (SnO$_2$) and indium tin oxide (ITO), as shown in FIG. 115. Then, a p-type amorphous silicon film is deposited under temperature environment of about 300° C. by plasma CVD employing SiH$_4$ and B$_2$H$_6$, while neutral atoms of Ne or the like are simultaneously beam-applied by radical beam irradiation which is described in relation to the fourteenth embodiment under such temperature environment that the substrate temperature reaches about 300° to 490° C. for single-crystallizing the p-type amorphous silicon film and forming the first semiconductor layer 2193, as shown in FIG. 116. At this time, the p-type amorphous silicon film is set at a thickness of about 150 to 1000 Å. Then, an intrinsic amorphous silicon film is deposited under temperature environment of about 300° C. by plasma CVD employing SiH$_4$, to form the intrinsic semiconductor layer 2195, as shown in FIG. 117. Further, an n-type amorphous silicon film is deposited under temperature environment of about 300° C. by plasma CVD employing SiH$_4$ and PH$_3$ while neutral atoms of Ne or the like are simultaneously beam-applied under such temperature environment that the substrate temperature reaches about 300° to 490° C. by the radical beam irradiation described in relation to the fourteenth embodiment for single-crystallizing the p-type amorphous silicon film and forming the second semiconductor layer 2194, as shown in FIG. 118. Then, an n-type amorphous film is deposited under temperature environment of about 300° C. by plasma CVD employing a p-type material such as Si, SiGe, GaAs or CdTe while neutral atoms of Ne or the like are simultaneously beam-applied under such temperature environment that the substrate temperature reaches about 300° to 490° C. by the radical beam irradiation described in relation to the fourteenth embodiment for single-crystallizing the amorphous film and forming the third semiconductor layer 2196 for serving as a p-type single-crystalline film, as shown in FIG. 119. Thereafter the back electrode 2197 is formed by vapor deposition with aluminum or the like, to complete the solar cell shown in FIG. 114. Functions and effects which are similar to those of the fourteenth or fifteenth embodiment can be obtained also according to this embodiment.

(Seventeenth Embodiment)
<Structure>

Figure 120:
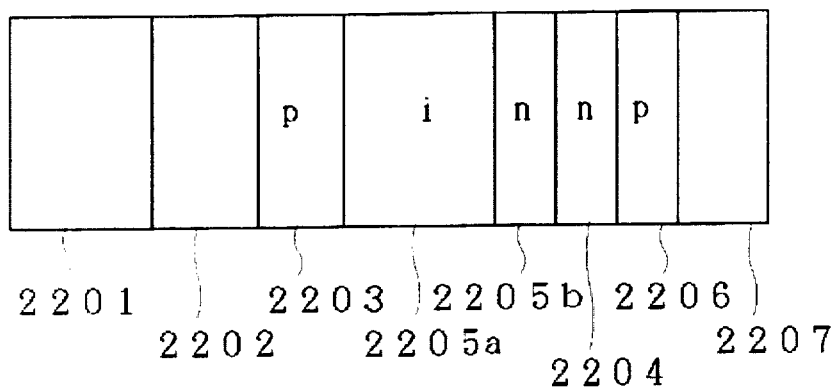
FIG. 120 is a sectional view showing a solar cell according to a seventeenth embodiment of the present invention.
Figure 121:
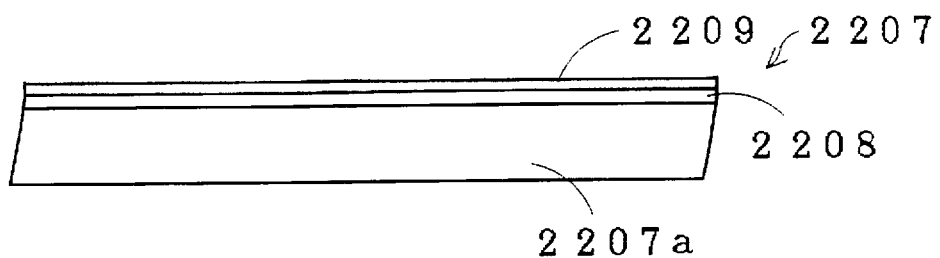

A solar cell according to a seventeenth embodiment of the present invention is of a p-i-n structure having an intrinsic semiconductor layer and of a tandem (stack system) structure, as shown in FIG. 120. Referring to FIG. 120, numeral 2201 denotes a transparent substrate of glass which is arranged on a photoreceiving side, numeral 2202 denotes a transparent conductive oxide (TCO) film which is formed on a light travelling direction side of the transparent substrate 2201 for serving as an electrode, numeral 2203 denotes a first semiconductor layer of p-type (first conductivity type) Si which is formed on a light travelling direction side of the transparent conductive oxide film 2202, numeral 2204 denotes a second semiconductor layer of n-type (second conductivity type) Si which is arranged on a light travelling direction side beyond the first semiconductor layer 2203, numerals 2205a and 2205b denote an intrinsic semiconductor layer and an n-type Si layer which are interposed between the first and second semiconductor layers 2203 and 2204 respectively, numeral 2206 denotes a p-type (first conductivity type) third semiconductor layer which is formed on a light travelling direction side beyond the n-type Si film 2205b, and numeral 2207 denotes a semi-texture structure (SuS) layer which is formed on a light travelling direction side of the second semiconductor layer 2204. The first, second and third semiconductor layers 2203, 2204 and 2206 are formed by single-crystalline films respectively, while the intrinsic semiconductor layer 2205a and the n-type Si layer 2205b are formed by amorphous films respectively. The third semiconductor layer 2206 may be made of p-type single-crystalline Si similarly to the first semiconductor layer 2203, or a material having sensitivity to a longer wavelength side as compared with the p-type single-crystalline Si, such as SiGe, GaAs or CdTe, for example. As to the semi-texture structure (SuS) layer 2207, an Ag film 2208 and a TiO$_2$ film 2209 may be successively bonded to a surface on a side of a substrate layer 2207a defining a boundary between the same and the third semiconductor layer 2206, as shown in FIG. 121.

<Manufacturing Method>

Figure 122:
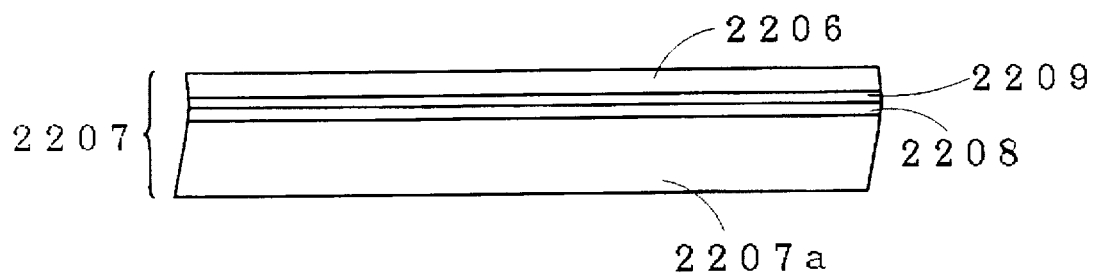
Figure 123:
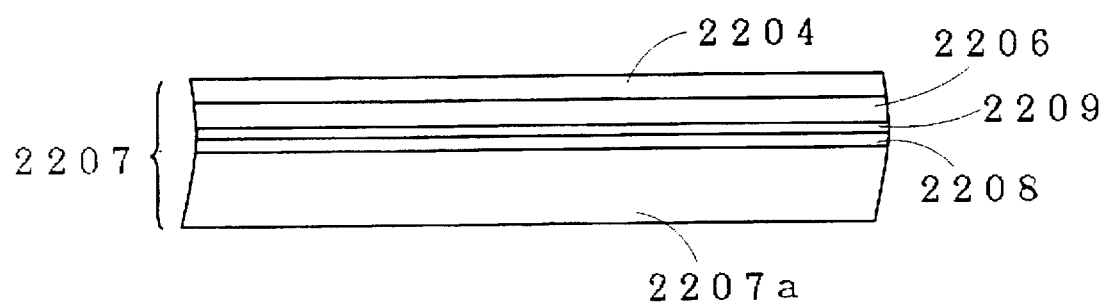
Figure 124:
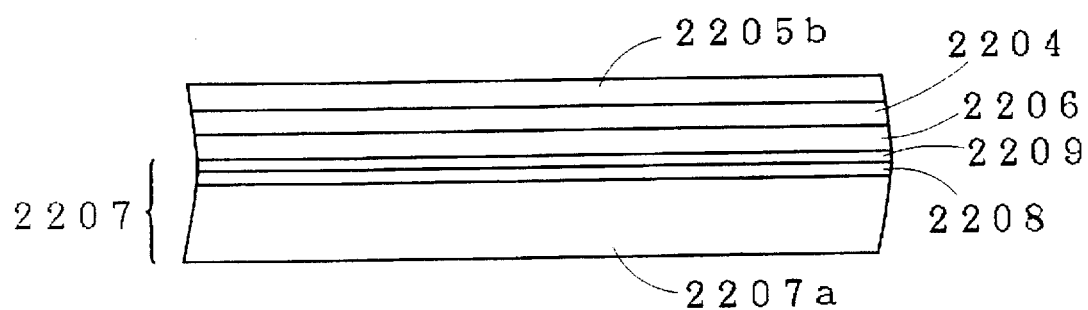
Figure 125:
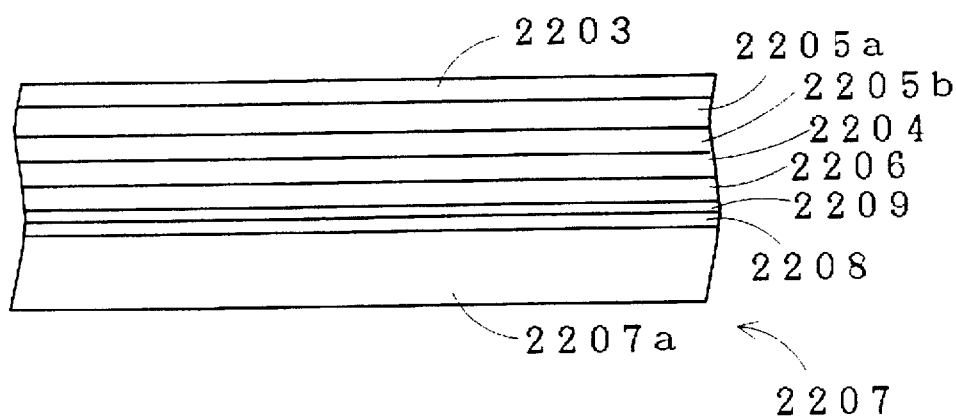
Figure 126:
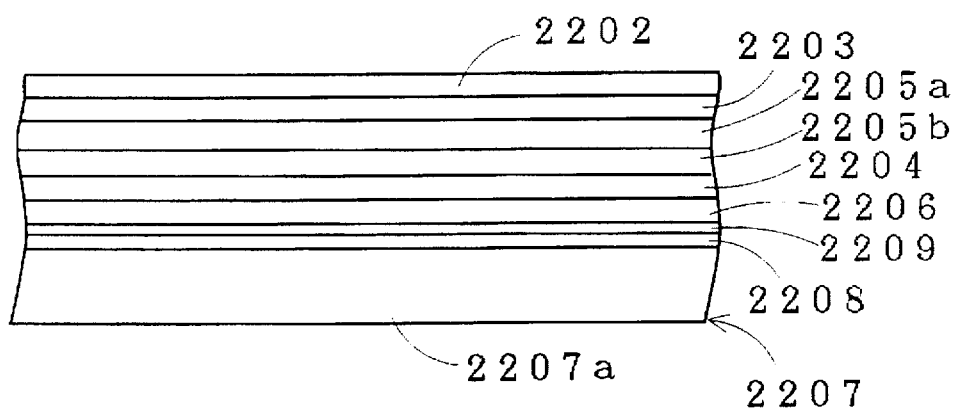
Figure 127:
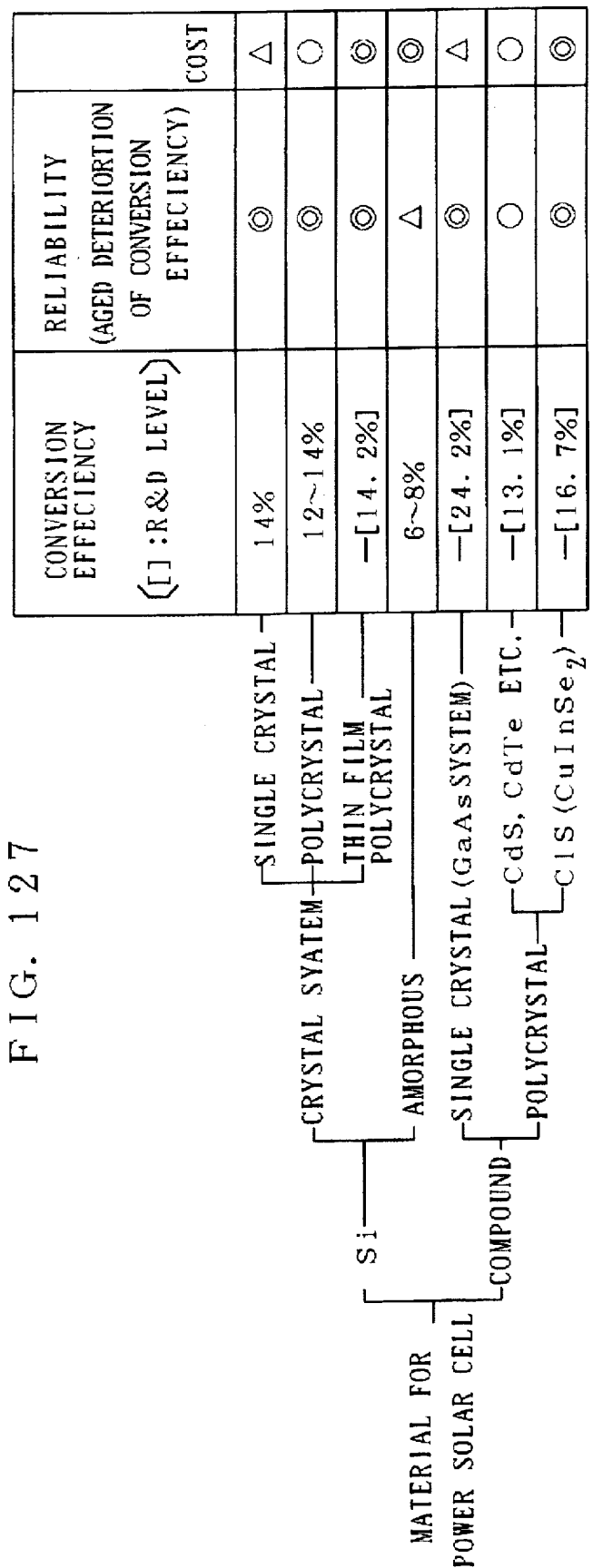
Figure 129A:
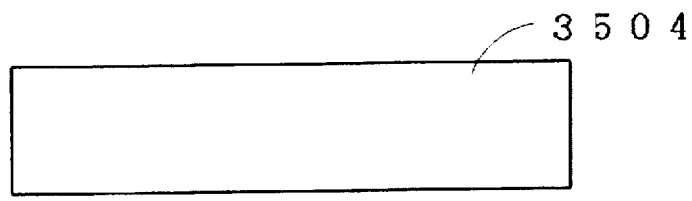
Figure 129B:
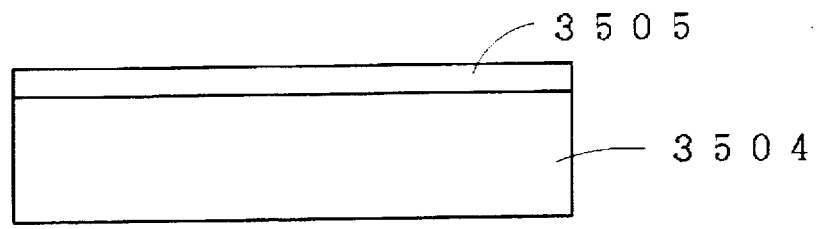
Figure 129C:
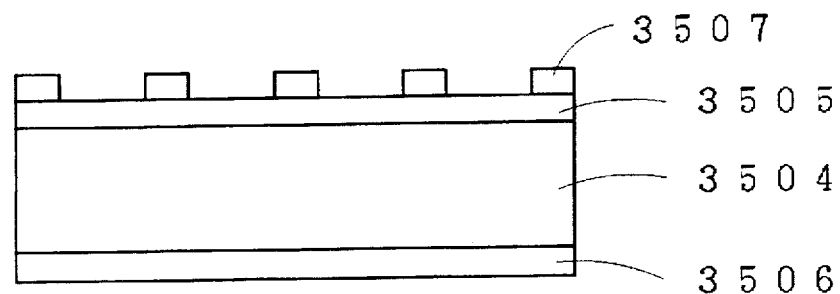
Figure 130A:
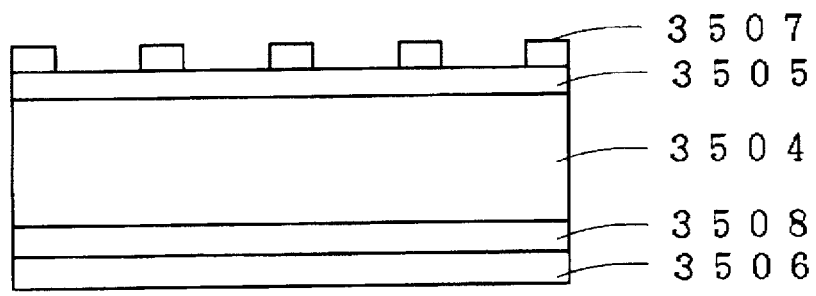
Figure 130B:
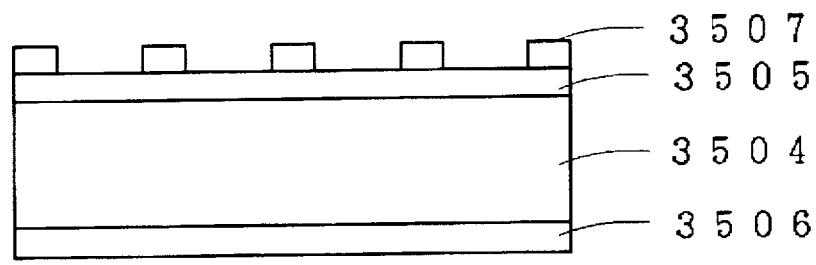
Figure 130C:
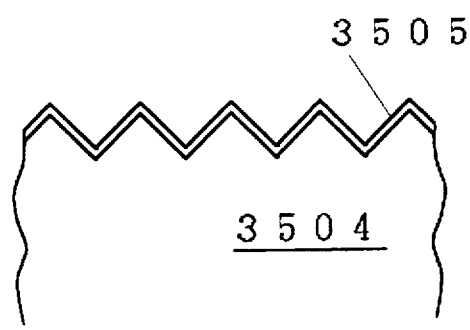
Figure 131:
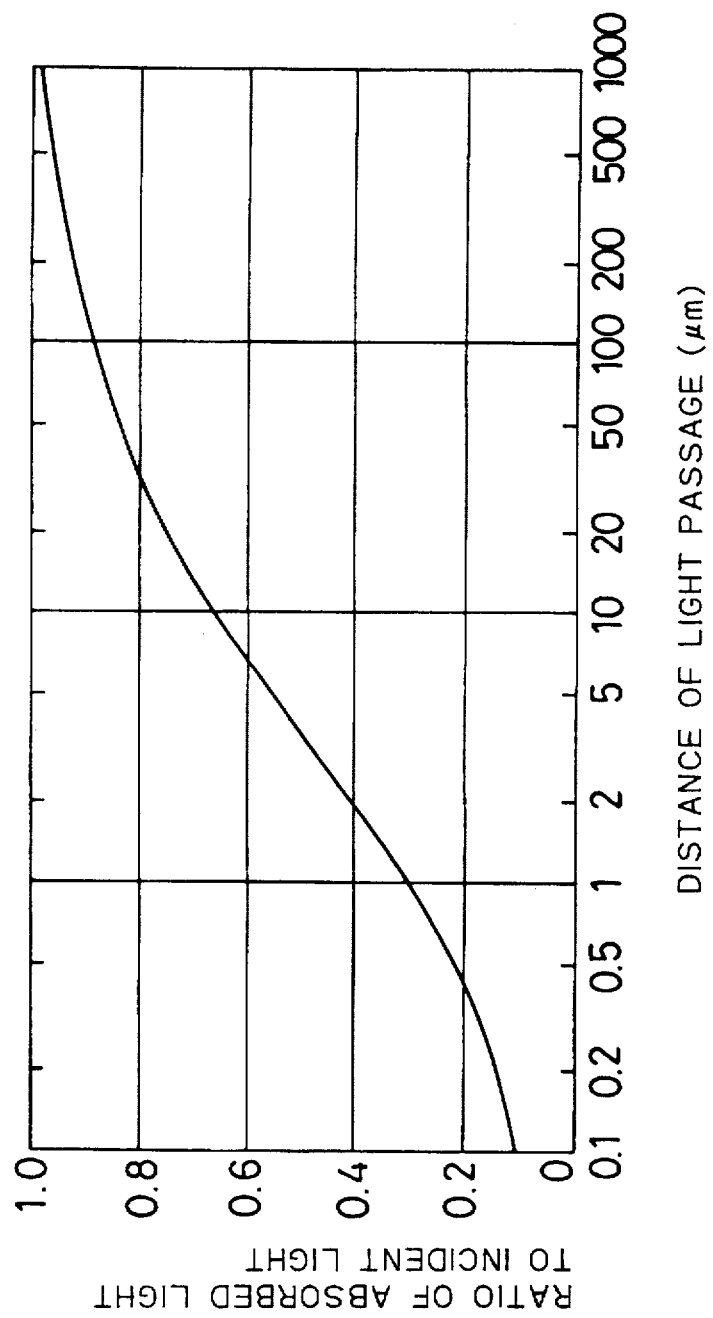

The solar cell having the aforementioned structure is manufactured as follows: First, the Ag film 2208 and the TiO$_2$ film 2209 are bonded onto the upper surface of the substrate layer 2207a for defining the semi-texture structure (SuS) layer 2207 by vapor deposition or the like as shown in FIG. 121, these films are washed and thereafter an n-type amorphous film is deposited under temperature environment of about 300° C. by plasma CVD employing a p-type material such as Si, SiGe, GaAs or CdTe while neutral atoms of Ne or the like are beam-applied under such temperature environment that the substrate temperature reaches about 300° to 490° C. by the radical beam irradiation described in relation to the fourteenth embodiment for single-crystallizing the film and forming the third semiconductor layer 2206 as a p-type single-crystalline film, as shown in FIG. 122. The third semiconductor layer 2206 is single-crystallized with film growth with mixture of $SiH_4$ and $B_2H_6$, in order to form a single-crystalline Si film, for example. Then, an n-type amorphous silicon film is deposited under temperature environment of about 300° C. by plasma CVD employing $SiH_4$ and $PH_3$ and neutral atoms of Ne or the like are simultaneously beam-applied under such temperature environment that the substrate temperature reaches about 300° to 490° C. by the radical beam irradiation described with reference to the fourteenth embodiment, for single-crystallizing the p-type amorphous silicon film and forming the second semiconductor layer 2204, as shown in FIG. 123. Then, the n-type Si film 2205b as an amorphous film is grown/formed as shown in FIG. 124. The intrinsic semiconductor layer 2205a as an amorphous film is grown/formed and thereafter a p-type amorphous silicon film is deposited under temperature environment of about 300° C. by plasma CVD while neutral atoms of Ne or the like are simultaneously beam-applied under such temperature environment that the substrate temperature reaches about 300° to 490° C. by the radical beam irradiation described with reference to the fourteenth embodiment, for single-crystallizing the p-type amorphous silicon film and forming the first semiconductor layer 2203, as shown in FIG. 125. The transparent conductive oxide film 2202 shown in FIG. 126 is formed on the upper surface of the first semiconductor layer 2203 by vapor deposition or thermal CVD with tin oxide ($SnO_2$) and indium tin oxide (ITO). Further, the transparent substrate 2201 of glass is mounted to complete the solar cell shown in FIG. 120. It is possible to attain functions and effects which are similar to those of the sixteenth embodiment also by this embodiment.

(Eighteenth Embodiment)

A solar cell according to an eighteenth embodiment of the present invention is of a p-i-n structure similarly to the fifteenth embodiment, while the former is different from the latter in a point that a p-type first semiconductor layer 2153 which is arranged on a photoreceiving side and an n-type second semiconductor layer 2154 which is arranged on a light travelling direction side are formed by polycrystalline films. Each of the first and second semiconductor layers 2153 and 2154 is formed by depositing an n-type silicon film under a temperature environment of about 300° C. by plasma CVD while simultaneously beam-applying neutral atoms of Ne or the like in such temperature environment that the substrate temperature reaches about 300° to 490° C. by the crystalline film forming apparatus (see FIG. 110) described in relation to the fourteenth embodiment for carrying out crystallization. While the beams are applied from directions which are perpendicular to densest planes of a plurality of different directions for forming a single-crystalline film in the fourteenth embodiment, a beam is applied from one direction which is perpendicular to a densest crystal plane for forming a polycrystalline film according to this embodiment. This embodiment also has electric characteristics which are approximate to those of the fifteenth embodiment, since the first and second semiconductor layers 2153 and 2154 are crystallized.

<Method of Forming Polycrystalline Film>

Description is now made on a method of forming a polycrystalline Si thin film on an amorphous Si thin film by applying a gas beam from only one direction. In order to carry out this method, an atom current may be applied onto the sample 2171 from one direction in such a state that the reflector 2172 is removed from the crystalline film forming apparatus shown in FIG. 110. When the crystalline film forming apparatus shown in FIG. 110 is employed, CVD is carried out at a temperature which is sufficiently lower than the crystallization temperature of Si, e.g., under an ordinary temperature, for forming an amorphous Si thin film on the sample 2171. At the same time, an Ne atom current is applied from one direction with the crystal film forming apparatus from which the reflector 2172 is removed. It is possible to apply the Ne atom current from a direction which is perpendicular to the sample 2171 by placing the sample 2171 on the sample holder 2170 in a horizontal state, for example. A portion which is close to an upper surface of the amorphous Si thin film provided on the sample 2171 is converted to a polycrystalline layer by such application of the Ne atom current. Namely, the law of Bravais acts on the amorphous Si thin film by the irradiation with the Ne atom current, thereby forming a polycrystalline layer in which crystal grains are so aggregated that one densest plane is oriented in a direction perpendicular to the direction of incidence of the Ne atom current and directions of other densest planes are arbitrary.

The temperature of the amorphous Si thin film is adjusted at 550° C., for example, i.e., in a range suitable for growing a seed crystal, by the action of the heater provided in the sample holder 2170. Therefore, the polycrystalline Si layer which is formed on the surface of the amorphous Si thin film serves as a seed crystal, whereby the polycrystalline Si layer is grown toward a deep portion of the amorphous Si thin film. Then, the overall region of the amorphous Si thin film is converted to a polycrystalline Si layer. Thus, a polycrystalline Si layer is formed on the sample 2171.

When the crystalline film forming apparatus is employed, a reaction gas is supplied onto the sample 2171 which is placed on the sample holder 2170 with no heating of the sample 2171 to grow an amorphous Si thin film while an Ne atom current is simultaneously applied from one direction with no employment of the reflector 2172. Consequently, the amorphous Si thin film being grown is sequentially converted to a polycrystalline Si thin film by the action of the law of Bravais. In this polycrystalline thin film, crystal grains are so aggregated that one densest plane is oriented in a direction perpendicular to the direction of incidence of the Ne atom current and directions of other densest planes are arbitrary.

Thus, the sample 2171 is not heated to a temperature exceeding 550° C., which is necessary for growing a seed crystal of Si also in manufacturing of a polycrystalline Si thin film, similarly to the case of manufacturing a single-crystalline Si thin film. In the method of employing the crystalline film forming apparatus, further, the sample 2171 is not heated but maintained substantially at an ordinary temperature. Namely, the method employing application of an atom current has such an advantage that a polycrystalline thin film can be formed under a low temperature. This enables employment of a low-priced glass substrate having a low withstand temperature for the sample 2171, for example.

(Nineteenth Embodiment)

A solar cell according to a nineteenth embodiment of the present invention is of a p-i-n structure having an intrinsic semiconductor layer, and of a tandem (stack system) structure, similarly to the sixteenth embodiment shown in FIG. 114, while the former is different from the latter in a point that first, second and third semiconductor layers 2193, 2194 and 2196 are formed by polycrystalline films respectively. Each of the first, second and third semiconductor layers 2193, 2194 and 2196 is formed by beam-applying neutral atoms of Ne or the like by the method of forming a polycrystalline film described in relation to the eighteenth embodiment after formation of an amorphous film. Other structure is similar to that of the sixteenth embodiment, and hence redundant description is omitted. Also according to this embodiment, it is possible to absorb long-wave light and short-wave light by the first semiconductor layer 2193 of a polycrystalline film and an intrinsic semiconductor layer 2195 of an amorphous film respectively and to thereafter further absorb the long-wave light by the second and third semiconductor layers 2194 and 2196 respectively, thereby improving light absorption characteristics over a wide wavelength region.

(Twentieth Embodiment)

A solar cell according to a twentieth embodiment of the present invention is of a p-i-n structure having an intrinsic semiconductor layer, and of a tandem (stack system) structure, similarly to the seventeenth embodiment shown in FIG. 120, while the former is different from the latter in a point that first, second and third semiconductor layers 2203, 2204 and 2206 are formed by polycrystalline films respectively. Each of the first, second and third semiconductor layers 2203, 2204 and 2206 is formed by beam-applying neutral atoms of Ne or the like by the method of forming a polycrystalline film described in relation to the eighteenth embodiment after formation of an amorphous film. Other structure is similar to that of the seventeenth embodiment, and hence redundant description is omitted. Also according to this embodiment, it is possible to attain functions and effects which are similar to those of the nineteenth embodiment.

(Twenty-first Embodiment)

<Structure>

FIG. 150 is a sectional view showing a semiconductor device, serving as a memory device, according to a twenty-first embodiment of the present invention. Referring to FIG. 150, numeral 2301 denotes a p-type Si semiconductor substrate, numeral 2302 denotes a transistor part, numeral 2303 denotes an n-type bit line, numeral 2304 denotes a LOCOS oxide film, numeral 2304a denotes a gate oxide film, numeral 2305 denotes a polycrystalline (polysilicon/polycide) word line, numeral 2306 denotes a first insulating film, numeral 2307 denotes a capacitance part (data holding part), numeral 2308 denotes a first wire (internal wire) connecting the transistor part 2302 with the capacitance part 2307, numeral 2309 denotes a dielectric film, numeral 2310 denotes an upper electrode of the capacitance part 2307, numeral 2311 denotes a second insulating film, and numeral 2312 denotes a second wire (plate). The dielectric film 2309, which is a film of a ferroelectric substance having a high dielectric constant (high dielectric/ferroelectric film), is brought into a single-crystalline film structure by radical beam irradiation as hereinafter described. FIG. 151 illustrates a crystal structure of the dielectric film 2309. The term "high dielectric film" indicates a dielectric film having a high dielectric constant, and the term "ferroelectric film" indicates a dielectric film having strong polarization field characteristics. FIG. 151 shows an exemplary crystal structure of barium titanate ($BaTiO_3$) for illustrating the principle. Referring to FIG. 151, Ti atoms (while circles), a Ba atom (hatched circle) and oxygen atoms (black circles) are located on four corners of each unit lattice, in a center of the cubic lattice and centers of respective surfaces of the cubic lattice respectively. Each oxygen atom is stabilized in a position slightly deviating from each flat plane provided with the four titanium atoms. The upper lattice plane has a minus or plus electric charge depending on whether each oxygen atom is upwardly or downwardly beyond the flat plane.

In concrete terms, the material for the dielectric film 2309 is prepared from PZT, BST, PLZT or the like when ferroelectric characteristics are particularly regarded as important and the semiconductor device is employed as a nonvolatile memory device. When a high dielectric film of BST or PLZT is employed, the semiconductor device can be used as an ordinary DRAM. It is possible to attain a high dielectric/ferroelectric substance by controlling the composition ratio of $BaTiO_3$ when BST is employed, or by controlling the amount of La when PLZT is employed, in particular.

Such a single-crystallized dielectric film 2309 has external field/polarization field characteristics shown in FIG. 152. Namely, this film has PE hysteresis characteristics with small distortion, whereby it is possible to suppress dispersion in charge quantity caused by the dielectric constant and polarization. Therefore, it is possible to form a 1-bit memory cell by a single transistor and a single capacitor in the same structure ad an ordinary DRAM, as shown in FIG. 153.

According to this embodiment, the single-crystallized high dielectric/ferroelectric film is stabilized in characteristics even if the same is minimized in thickness, whereby it is possible to reduce the thickness and the area of the capacitance part 2307, to cope with refinement of the device. Further, insulativity is also improved to reduce a leakage current due to single crystallization of the dielectric film 2309.

When a high dielectric film is employed as a capacitor material for an ordinary DRAM, the dielectric constant is improved by at least two digits as compared with oxide and nitride films ($SiO_2$ and Si—N), whereby sufficient capacitance can be ensured by the flat capacitor shown in FIG. 150, dissimilarly to the complicated capacitor provided in Prior Art 16 shown in FIG. 207.

<Fabrication Method>

The semiconductor device having the aforementioned structure is fabricated as follows: First, the LOCOS oxide film 2304 is formed on an upper surface of the p-type Si semiconductor substrate 2301, thereafter the gate oxide film 2304a is formed by thermal oxidation, and thereafter a polysilicon layer for defining the word line 2305 is formed by CVD or the like and patterned. Thereafter an n-type diffusion layer for defining the n-type bit line 2303 is formed by ion implantation or the like, as shown in FIG. 154.

Thereafter the first insulating film 2306 is formed by CVD or the like, a contact hole is formed in a portion of the first insulating film 2306 located immediately above one of source/drain regions, and the first wire 2308 is deposited/patterned through an aluminum material such as Al—Si, Al—Si—Cu or the like, or a high melting point metal material such as Ti, W, Ti—Si, W—Si or the like, as shown in FIG. 155.

Then, a polycrystalline or amorphous thin film 2309a of a high dielectric/ferroelectric film is deposited by CVD or a sol-gel method as shown in FIG. 156, and thereafter single-crystallized by radical beam irradiation as described later to form the dielectric film 2309.

The upper electrode 2310 is deposited on the overall upper surface of the dielectric film 2309 by polysilicon, a high melting point metal material or an aluminum material, and thereafter the upper electrode 2310 and the dielectric film 2309 are simultaneously patterned to form the capacitance part 2307 for holding data of the memory device, as shown in FIG. 157.

Thereafter the second insulating film 2311 and the second wire (plate) 2312 of Al—Si, Al—Si—Cu or the like are formed to complete the semiconductor device shown in FIG. 150.

<Single-Crystalline Film Forming Method>

In relation to the aforementioned fabrication method, description is now made in detail on a single-crystalline film forming method (radical beam irradiation) of forming an amorphous thin film by CVD or a sol-gel method and thereafter single-crystallizing the same, for example.

<Overall Structure of Single-Crystalline Film Forming Apparatus>

FIG. 158 is a front sectional view showing a structure of an exemplary single-crystalline thin film forming apparatus 2320 for effectively implementing the aforementioned single-crystalline thin film forming method. This apparatus 2320 comprises a reaction vessel 2321, and an electron cyclotron resonance (ECR) ion generator 2322 which is built in an upper portion of the reaction vessel 2321. The ECR ion generator 2322 comprises a plasma container 2323 which defines a plasma chamber 2324 in its interior. A magnetic coil 2325 is provided around the plasma container 2323, to apply a dc high magnetic field to the plasma chamber 2324. Further, a waveguide 2326 and an inert gas inlet pipe 2327 are provided on an upper surface of the plasma container 2323 for introducing a microwave and an inert gas such as neon (Ne), oxygen (O), helium (He) or argon (Ar) into the plasma chamber 2324 respectively.

The reaction vessel 2321 defines a reaction chamber 2328 in its interior. The bottom portion of the plasma container 2323 defines an outlet 2329 for passing a plasma in its center. The reaction chamber 2328 and the plasma chamber 2324 communicate with each other through the outlet 2329. In the interior of the reaction chamber 2328, a sample holder 2330 is arranged on a position immediately under the outlet 2329. A sample 2331 for stacking a single-crystalline film is placed on the sample holder 2330 as shown in FIG. 158, while a reflector 2332 is placed to be located above the sample 2331. The reflector 2332 is preferably made of a metal. The sample holder 2330 is coupled to a rotation driving mechanism (not shown), to be rotatable in a horizontal plane. Further, the sample holder 2330 can horizontally move the sample 2331 while fixing the reflector 2332.

The reaction chamber 2328 communicates with reaction gas supply pipes 2333. Reaction gases are supplied through the reaction gas supply pipes 2333, for forming a film of a prescribed material on the sample 2331 by plasma CVD. The example shown in FIG. 158 is provided with three reaction gas supply pipes 2333a, 2333b and 2333c. The reaction chamber 2328 further communicates with an evacuation pipe 2334. An end of the evacuation pipe 2334 is coupled with a vacuum unit (not shown) to evacuate the reaction chamber 2328 through the evacuation pipe 2334, thereby maintaining the reaction chamber 2328 at a prescribed degree of vacuum. A vacuum gauge 2335 for displaying the degree of vacuum in the reaction chamber 2328 is provided in communication with the reaction chamber 2328.

<Structure of Reflector>

FIG. 159 is a perspective view showing an exemplary reflector 2332a. This reflector 2332a is adapted to form a single-crystalline film having a diamond structure. The reflector 2332a defines an opening on a central portion of a flat plate type base 2341. Three blocks 2342 in the form of rectangular parallelepipeds are fixedly provided around the opening, and reflecting blocks 2343 are fixed to inner sides of the blocks 2342 respectively. Consequently, an equilateral triangular opening 2344 which is trimmed with the reflecting blocks 2343 is defined at the central portion of the base 2341. In the reflecting blocks 2343, slopes 2345 facing the opening 2344 serve as reflecting surfaces for reflecting a gas beam. Therefore, the angles of inclination of the slopes 2345 are set at proper levels in correspondence to the directions of crystal axes of the single crystal to be formed.

FIGS. 160A, 160B and 160C are a plan view, a side elevational view and a front elevational view of the reflector 2332a which is formed by the blocks 2342 and the reflecting blocks 2343 respectively. As shown in FIG. 160B, the angle of inclination of each slope 2345 is set at such an angle that atom beams of four directions are adjacent to each other at 35°. The reflector 2332a is in a structure not fixing the sample 2331, whereby the sample 2331 can be relatively horizontally moved with respect to the reflector 2332a. Therefore, it is possible to form a single-crystalline film on the sample 2331 having a large area by horizontally moving the sample 2331 while fixing the reflector 2332a on the sample holder 2330.

<Operation of ECR Ion Generator>

Referring again to FIG. 158, the operation of the ECR ion generator 2322 is now described. An inert gas such as Ne, O, He or Ar is introduced from the inert gas inlet pipe 2327 into the plasma chamber 2324, while a microwave is simultaneously introduced from the waveguide 2326 into the plasma chamber 2324. Atoms which are not heavier than those of the previously formed amorphous thin film are selected to be employed as the inert gas. Further, a dc current is also simultaneously supplied to the magnetic coil 2325, to form a dc magnetic field in the plasma chamber 2324 and its periphery. The gas as supplied is maintained in a plasma state by actions of the microwave and the dc magnetic field. This plasma is formed by high-energy electrons which are in screw motion in the principle of cyclotron by the microwave and the dc magnetic field.

These electrons, which have diamagnetic properties, are moved to a weaker magnetic field side, to form an electron stream along a line of magnetic force. Consequently, positive ions also form an ion current along the line of magnetic force following the electron stream, in order to maintain electrical neutrality. In other words, the electron stream and the ion current are downwardly directed from the outlet 2329 into the reaction chamber 2328. The ion current and the electron stream thus flowing in parallel with each other are recombined with each other after a lapse of a deionization time, to form a neutral atom current. Therefore, substantially only a neutral atom current is formed in a position downwardly separated from the outlet 2329 beyond a prescribed distance.

FIG. 161 is a graph showing the result of relation between ion current density and the distance from the outlet 2329 actually measured when $Ar^+$ ions of 10 eV were discharged from the outlet 2329 by the ECR ion generator 2322. It is understood from this graph that the ion current density is abruptly reduced at a distance of about 4 to 5 cm from the outlet 2329, and attenuated to a level of $\frac{1}{10}$ to $\frac{1}{12}$ at a position of 14 cm. The neutral atom current is increased by such attenuation of the ion current, whereby substantially only a neutral atom current downwardly flows in a position downwardly separated from the outlet 2329 in excess of 14 cm.

Thus, the ECR ion generator 2322 for generating ions forms an ion current in parallel with the electron stream, whereby it is possible to easily obtain a neutral atom current having high density by employing the ECR ion generator 2322, with no employment of other means for neutralizing the ion current. Since the ion current is formed in parallel with the electron stream, further, it is possible to obtain an ion current which is close to a parallel current having a regulated direction of progress substantially with no divergence. Since the parallel ion current is converted to the neutral atom current, the atom current is also close to a parallel current having a regulated direction of progress.

<Operation of Single-Crystalline Film Forming Apparatus>

Referring again to FIG. 158, the operation of the apparatus 2320 is described. The reflector 2332 is prepared from the reflector 2332a shown in FIGS. 159, 160A, 160B and 160C, to form an amorphous thin film on the upper surface of the sample 2331 and thereafter single-crystallize the same, for example. Reaction gases are supplied from the reaction gas supply pipes 2333a, 2333b and 2333c respectively. At this time, the inert gas inlet pipe 2327 introduces inert gas of atoms having smaller atomic weights as compared with those forming the amorphous thin film.

Due to the action of the ECR ion generator 2322, a plus ion current and an electron stream are formed downwardly from the outlet 2329. The distance between the outlet 2329 and the reflector 2332a (2332) is preferably set at a sufficient level for substantially converting the plus ion current to a neutral atom current. The reflector 2332a (2332) is set in a position receiving the downwardly directed Ne atom current. The reaction gas which is supplied from the reaction gas supply pipe 2333a is dashed against the sample 2331 by the plus ion current or the atom current. Consequently, a plasma CVD reaction progresses on the upper surface of the sample 2331, to grow an amorphous thin film.

At this time, the sample 2331 is not heated but maintained substantially at an ordinary temperature, whereby the amorphous thin film is grown substantially under the ordinary temperature. In other words, the amorphous thin film is formed at a temperature not more than a level facilitating crystallization by plasma CVD.

A part of the downwardly directed atom current of Ne or the like is reflected by the three slopes 2345 which are formed in the reflector 2332a, to be incident upon the upper surface of the sample 2331 through the opening 2344. Another part of the atom current is not incident upon the slopes 2345 but directly incident upon the upper surface of the sample 2331 through the opening 2344. In other words, the amorphous thin film being formed on the upper surface of the sample 2331 is irradiated with four atom current components, i.e., a component straightly received from the outlet 2329 and three components reflected by the three slopes 2345. Since the angles of inclination of the slopes 2345 are set at prescribed angles, directions of incidence of the four atom current components are adjacent to each other at angles of incidence of 35°, to correspond to four directions which are perpendicular to four independent densest crystal planes of the single crystal to be formed, i.e., (111) planes. Crystal directions appearing on the film surface can be freely changed by varying the directions of irradiation and the angles of incidence.

The energy of the plasma which is formed by the ECR ion generator 2322 is so set that the atoms reaching the sample 2331 are at energy levels causing no sputtering in the amorphous thin film, i.e., levels lower than a value (=27 eV) which is known as the threshold energy level in sputtering of Si, for example, by irradiation with atoms. Therefore, the so-called law of Bravais acts on the as-grown amorphous thin film. Namely, molecules in the amorphous thin film are rearranged so that planes which are perpendicular to the atom current components applied to the amorphous thin film define densest crystal planes. Since the atom current as applied has four components which are incident in directions corresponding to those perpendicular to densest planes of a single-crystalline film having a single crystal orientation, the molecules are so rearranged that all planes perpendicular to the directions of incidence of the respective components define the densest planes. The directions of the (111) planes are controlled by the plurality of atom current components having directions of incidence which are independent of each other, whereby a single-crystalline film having a single crystal orientation is formed by such rearrangement of the molecules. In other words, the amorphous thin film being grown by plasma CVD is sequentially converted to a single-crystalline film having a regulated crystal orientation.

As hereinabove described, the sample 2331 is not heated and the single-crystalline film is formed under a temperature which is lower than that facilitating crystallization by plasma CVD. This is because the crystal orientation is arbitrarily directed regardless of the directions of the atom current components and cannot be controlled while a polycrystal is inevitably formed under a high temperature facilitating crystallization of molecules by plasma CVD alone with no application of the atom current.

As hereinabove described, atoms which are relatively lighter than the atoms (Si) forming the amorphous thin film provided on the irradiated sample 2331, such as those of Ne, for example, are selected as an element forming the atom current which is applied to the single-crystalline film. This is because Ne atoms hardly penetrate into the single-crystalline film to remain in the same since there is a high probability that relatively heavy molecules rearwardly scatter the relatively light Ne atoms when the single-crystalline film is irradiated with the atom current. Further, the element for forming the atom current as applied is prepared from an inactive element since the inactive element forms no compound with either original molecules or as-doped impurities even if the same remains in the single-crystalline film and hardly exerts an influence on electronic/physical properties of the single-crystalline film, while the same can be easily removed to the exterior when the as-formed single-crystalline film is increased in temperature to some extent.

As hereinabove described, the reflector 2332 is preferably made of a metal, since $Ne^+$ ions are converted to neutral atoms when an $Ne^+$ ion current which is slightly mixed in the neutral atom current is reflected by the conductive reflector 2332, so that the sample 2331 is irradiated with the as-converted neutral atom current. The neutral atom current is advantageously incident upon the sample 2331 as a flow having a regulated direction since its direction of progress hardly diverges dissimilarly to an ion current.

In the apparatus 2320, conversion to a single crystal sequentially progresses immediately after growth of the amorphous thin film by plasma CVD. Thus, it is possible to form a single-crystalline film on a film of any structure under a low temperature. Since a single-crystalline film can be formed under a low temperature, it is possible to further form a single-crystalline film on a sample which is already provided with a prescribed device without changing properties of the device, for example.

Thus, a single crystal having a desired crystal orientation can be obtained with no regard to the material for the electrode or crystallinity according to this embodiment, whereby it is not necessary to form upper and lower electrodes of multilayer metal materials such as Pt layers for improving crystallinity of the high dielectric/ferroelectric film dissimilarly to the prior art. Thus, it is possible to reduce the cost by reducing the number of materials while omitting steps of forming such materials.

While the aforementioned method utilizes CVD, a gel solution of a mixture of an organic compound of the component elements may be applied by a spinner, fired and irradiated with radical beams similarly to the above, when the film is prepared by a sol-gel method.

While the dielectric film 2309 may simply be single-crystallized after formation of a single amorphous thin film since the same is preferably minimized in thickness according to this embodiment, it is possible to obtain a stable single-crystalline film having high homogeneity even if the thickness is increased, by forming a single-crystalline thin film by the aforementioned method and thereafter growing a single-crystalline film on an upper surface of the thin film serving as a seed crystal or repeating the aforementioned method, when a constant thickness is required for the single-crystalline film.

(Twenty-Second Embodiment)
<Structure>

FIGS. 162, 163 and 164 show a semiconductor device according to a twenty-second embodiment of the present invention, which is a nonvolatile memory device (EPROM/flash EPROM). Referring to FIGS. 162 to 164, numeral 2351 denotes a p-type Si semiconductor substrate, numeral 2352 denotes a LOCOS oxide ($SiO_2$) layer, numeral 2353 denotes a gate insulating film (first insulating film), numeral 2354 denotes a floating gate, numeral 2355 denotes a control gate, numeral 2356 denotes an interlayer insulating film (second insulating film) which is interposed between the gates 2354 and 2355, numerals 2357 and 2358 denote a source (first diffusion region) and a drain (second diffusion region) respectively, numeral 2359 denotes a contact hole for connection with an electrode, numeral 2361 denotes a memory cell region defining an element unit, and numeral 2362 denotes a channel region. The floating gate 2354 is prepared from single-crystalline silicon, in place of a conventional polysilicon material.

<Fabrication Method>

The semiconductor device having the aforementioned structure is fabricated as follows: First, the LOCOS oxide layer 2352 is formed on an upper surface of the p-type Si semiconductor substrate 2351, thereafter the gate insulating film 2353 is formed in a region for forming a transistor by thermal oxidation, and thereafter a polysilicon layer 2365 for defining the floating gate 2354 later is deposited/patterned as shown in FIGS. 165 and 166. Thereafter He or the like is applied by radical beam irradiation similarly to the twenty-first embodiment to single-crystallize the polysilicon layer 2365, thereby forming the floating gate 2354 of single-crystalline silicon.

Then, the floating gate 2354 is thermally oxidized and an ONO film is deposited on its upper surface to form the interlayer insulating film 2356, as shown in FIGS. 167 and 168. At this time, a dense film having excellent crystallinity can be formed as the interlayer insulating film 2356 since the floating gate 2354 serving as an underlayer is single-crystalline. Further, it is possible to suppress growth of projections caused by irregularity on the surface of the floating gate 2354, thereby preventing reduction in withstand voltage of the interlayer insulating film 2356.

Thereafter a polysilicon layer for defining the control gate 2355 is deposited by CVD or the like, and thereafter the control gate 2355, the interlayer insulating film 2356 and the floating gate 2354 are simultaneously patterned to form a periphery of the channel region 2362. Thereafter the source 2357 and the drain 2358 are formed as shown in FIGS. 163 and 164 and thereafter the contact hole 2359 is formed to complete the semiconductor device through a metal wire (not shown).

The interlayer insulating film 2356 of the semiconductor device which is fabricated in the aforementioned manner is formed as a dense film having excellent crystallinity while growth of projections can be suppressed in formation of the interlayer insulating film 2356 by preventing irregularity on the surface of the floating gate 2354, whereby it is possible to reliably prevent reduction in withstand voltage of the interlayer insulating film 2356. Thus, it is possible to minimize the thickness of the interlayer insulating film 2356 while stably maintaining the breakdown voltage at about 30 to 40 V, whereby a coupling coefficient (GCR) between the gates 2354 and 2355 can be set at a high level and a speed required for reading, writing or erasing data can be remarkably increased to provide a semiconductor device which is capable of high-speed processing.

While a polycrystalline silicon film for defining the floating gate 2354 is patterned and thereafter single-crystallized by radical beam irradiation in the aforementioned fabrication method, a polycrystalline silicon film which is formed on the overall surface may alternatively be single-crystallized by radical beam irradiation to be thereafter patterned, or a silicon film for defining the floating gate 2354 may be deposited to be simultaneously irradiated with a radical beam for forming the single-crystalline floating gate 2354.

While the description of the aforementioned embodiment has been mainly made on a semiconductor device which is similar in structure to Prior Art 17 shown in FIG. 209, this embodiment may be mainly applied to a semiconductor device which is similar in structure to Prior Art 18 shown in FIG. 210.

(Twenty-Third Embodiment)
<Structure>

A semiconductor device according to a twenty-third embodiment of the present invention serves as a nonvolatile memory device (EPROM/flash EPROM), which is different from the semiconductor device according to the twenty-second embodiment in a point that a single-crystalline film of a high dielectric substance such as BST or PLZT is employed as an interlayer insulating film provided between a floating gate and a control gate in place of the ONO film employed in Prior Art 16, 17 or 18 or the twenty-second embodiment. Referring to FIGS. 169 to 170, numeral 2371 denotes a p-type Si semiconductor substrate, numeral 2372 denotes a LOCOS oxide ($SiO_2$) layer, numeral 2373 denotes a gate insulating film (first insulating film), numeral 2374 denotes a floating gate, numeral 2375 denotes a control gate, numeral 2376 denotes an interlayer insulating film (second insulating film) which is interposed between the gates 2374 and 2375, numerals 2377 and 2378 denote a source (first diffusion region) and a drain (second diffusion region) respectively, numeral 2379 denotes a contact hole for connection with an electrode, numeral 2381 denotes a memory cell region defining an element unit, and numeral 2382 denotes a channel region. The floating gate 2374 is prepared from polysilicon, similarly to Prior Art 16, 17 or 18.

A substance employed for the interlayer insulating film 2376 is not ferroelectric but highly dielectric, as described above. When BST is employed, for example, the amount of $BaTiO_3$ is so reduced that the composition ratio of $BaTiO_3$ to $SrTiO_3$ is smaller than 7:3, so that this material is highly dielectric with no spontaneous polarization. On the other hand, PLZT, which is prepared by adding La to PZT consisting of mixed crystals of $PbZrO_3$ and $PbTiO_3$, becomes highly dielectric when the amount of La is about 9%. This material has a dielectric constant of about 300, which is improved by about 40 times as compared with ONO whose dielectric constant is about 8. Since the dielectric constant of the interlayer insulating film 2376 is higher by about 80 times than that of the gate oxide film 2373, the area S1 of the floating gate 2374 can be substantially equalized to the area S2 of the channel region 2382 with no problem. Thus, it is possible to reduce the cell area. When the cell is isolated from adjacent ones by trenches T as shown in FIG. 172, it is possible to further reduce the cell area, while the area S1 of the floating gate 2374 must be substantially identical to the area S2 of the channel region 2382 in design in this case. According to this embodiment, the dielectric constant of the interlayer insulating film 2376 can be made higher than that of the gate oxide film 2373 as described above, whereby a coupling coefficient can be set at a high level of about 0.96 as described below to be remarkably improved as compared with the coupling coefficient of about 0.4 in Prior Art 17 or 18 even if the area S1 of the floating gate 2374 is substantially equalized to the area S2 of the channel region 2382. While the floating gate 2374 is inevitably equalized in size to the channel region 2382 when the source 2377 and the drain 2378 are formed not by embedding/diffusion but by $N^{30}$ injection in self alignment through the floating gate 2374 serving as a mask, the coupling coefficient can be remarkably improved also in this case, similarly to the above.

With reference to the interlayer insulating film 2376 of BST, the degree of improvement of the coupling coefficient is obtained through mathematical expressions. Assuming that the area S1 of the floating gate 2374 is substantially identical to the area S2 of the channel region 2382, the gate oxide film 2373 has a thickness $C_1$ of 20 nm and the interlayer insulating film 2376 of BST has a thickness $C_2$ of 60 nm while $SiO_2$, ONO and BST have dielectric constants $\epsilon$ of 3.9, 7.8 and 300 respectively, $C_2/C_1=25$ in this embodiment. Hence, the coupling coefficient $(GCR)=C_2/(C_1+C_2)=25/(25+1)=0.96$. In Prior Art 17 or 18 employing the interlayer insulating film of ONO, $C_2/C_1=2/3$ and hence the coupling coefficient $(GCR)=C_2/(C_1+C_2)=2/(3+2)=0.4$. Thus, it is understood possible to improve the coupling coefficient according to this embodiment to about twice as compared with Prior Art 17 or 18.

Thus, according to this embodiment, it is possible to remarkably increase the speed required for reading, writing or erasing data even if the area S1 of the floating gate 2374 is substantially equalized to the area S2 of the channel region 2382 for reducing the memory cell area, thereby providing a semiconductor device which is capable of high-speed processing.

<Fabrication Method>

The semiconductor device having the aforementioned structure is fabricated as follows: First, the LOCOS oxide layer 2372 is formed on an upper surface of the p-type Si semiconductor substrate 2371, thereafter the gate insulating film 2373 is formed in a region for defining a transistor by thermal oxidation, a polysilicon layer for defining the floating gate 2374 is deposited by CVD or the like, and portions for defining the source 2377 and the drain 2378 of the transistor are patterned to etch the polysilicon layer. Thereafter $N^+$ diffusion layers for defining the source 2377 and the drain 2378 are formed by ion implantation, as shown in FIGS. 173 and 174.

Then, an amorphous thin film of a high dielectric substance is formed by CVD or spinner application and thereafter irradiated with He or the like by radical beam irradiation similarly to the twenty-first embodiment, and the high dielectric amorphous thin film is single-crystallized to form the interlayer insulating film 2376, as shown in FIGS. 175 and 176.

Then, a polysilicon layer for defining the control gate 2375 is deposited by CVD or the like, and thereafter the control gate 2375, the interlayer insulating film 2376 and the floating gate 2374 are patterned to form a periphery of the channel region 2382. Thereafter the contact hole 2379 is formed as shown in FIG. 170, and thereafter the semiconductor device is completed through a metal wire (not shown).

Thus, the interlayer insulating film 2376 of BST or PLZT can be single-crystallized by radical beam irradiation, whereby it is possible to easily obtain a single-crystalline film of about 60 nm through a low-temperature process. Thus, it is possible to easily implement application to an interlayer insulating film of an EPROM or the like although only a polycrystalline thin film of PZT having a thickness of 300 nm can be formed in general even if the film is held by multilayer metals including Pt for improving crystallinity and hence application to an interlayer insulating film for an EPROM or the like is impossible in the prior art.

While the interlayer insulating film 2376 is single-crystallized and the polysilicon layer for defining the control gate 2375 is deposited so that thereafter the control gate 2375, the interlayer insulating film 2376 and the floating gate 2374 are simultaneously patterned in the aforementioned fabrication method, a high dielectric amorphous thin film may alternatively be deposited in continuation to the polysilicon layer for defining the floating gate 2374 so that the polysilicon layer and the high dielectric amorphous thin film are simultaneously etched and thereafter the control gate 2375 is deposited to implement the structure shown in FIG. 170.

While the description of the aforementioned embodiment has been mainly made on a semiconductor device which is similar in structure to Prior Art 18 shown in FIG. 210, this embodiment may be mainly applied to a semiconductor device which is similar in structure to Prior Art 17 shown in FIG. 209.

(Twenty-Fourth Embodiment)
<Structure>

FIG. 177 is a sectional view showing a memory cell of a semiconductor device according to a twenty-fourth embodiment of the present invention, which is an MFSFET having memory cells formed by thin film transistors (TFT) provided with gate insulating films of ferroelectric substances. Referring to FIG. 177, $p^-$-type Si substrates 2393 which are isolated every pair memory cells adjacent along a word line direction are formed on an Si substrate 2391 and a silicon oxide film 2392, to reliably electrically insulate transistor memory cells from each other. Each transistor consisting of each $p^-$-type Si substrate 2393, an $n^+$-type source 2396, an $n^+$-type drain 2397, an active region 2398, a gate insulating film 2394 and a gate electrode 2395 is formed by a thin film transistor (TFT). Such thin film transistors are so stacked on the Si substrate 2391 and the silicon oxide film 2392 that adjacent ones of the $p^-$-type Si substrates 2393 can be electrically isolated from each other in fine sizes. Thus, a certain $p^-$-type Si substrate 2393 can be easily isolated from other TFTs, i.e., other memory cells in a fine size, thereby implementing a practical memory cell size in consideration of the degree of integration.

The gate electrode 2395 has a polycrystalline structure of polysilicon or polycide, while the gate insulating film 2394 is formed by a dielectric film (ferroelectric film) having high polarization field characteristics. The gate insulating film 2394, the $n^+$-type source 2396, the $n^+$-type drain 2397 and the active region 2398 have single-crystalline structures, in place of conventional amorphous structures.

The single-crystalline structures are similar to that in the twenty-first embodiment shown in FIG. 151. Therefore, when a ferroelectric film is brought into a single-crystalline structure as in the gate insulating film 2394, for example, remanence of the ferroelectric film is generated. Therefore, it is necessary for the ferroelectric film to implement the crystal structure shown in FIG. 151. This ferroelectric film is prepared from PZT, BST or PLZT in practice. Such a single-crystallized ferroelectric film has external field/polarization field characteristics shown in FIG. 178. Namely, this film has PE hysteresis characteristics with a small amount of distortion, whereby it is possible to suppress dispersion in charge quantity caused by the dielectric constant and polarization. Further, insulativity is improved and the leakage current is reduced due to single crystallization of the gate insulating film 2394. Thus, a constant withstand voltage can be ensured even if the thickness of the gate insulating film 2394 is reduced. Thus, withstand voltage characteristics may not be deteriorated even if each memory cell is reduced in area, whereby a practical degree of integration can be implemented when a plurality of cells are arranged in parallel with each other. Further, it is possible to reduce film fatigue of the ferroelectric film, i.e., a wear-out phenomenon of gradually reducing remanence, by single-crystallizing the gate insulating film 2394.

Since the active region 2398 etc. are formed by single-crystalline films, electron mobility is increased in the active region 2398 in a gate-on state to attain low resistance, whereby the processing speed for writing or the like can be increased. Further, it is possible to reduce crystal defects and prevent generation of a leakage current in a gate-off state by forming the respective diffusion regions and the active region by single-crystalline films. Thus, a drain current ratio between gate-on and gate-off states can be increased thereby remarkably improving electrical properties of the semiconductor device. Further, it is possible to prevent deterioration with age by improving denseness of crystals forming a substrate electrode.

FIG. 179 is a circuit diagram showing a memory cell array of the MFSFET according to this embodiment. As shown in FIG. 179, a plurality of memory cells TR are two-dimensionally arranged in the form of a matrix. The respective memory cells are connected with each other by three types of strip electrodes of the gate electrode (word line) 2395, the $n^+$-type source (plate line) 2396 and the $n^+$-type drain (bit line) 2397, while the word line 2395 forming the aforementioned gate electrode defines a common electrode which is common along a direction X in FIG. 179 and the $n^+$-type source 2396 forming the aforementioned plate line and the $n^+$-type drain 2397 forming the aforementioned bit line are common electrodes which are common along a direction Y. Namely, the bit line 2397 and the plate line 2396 are formed in a direction perpendicular to the word line 2395, and substrates of only a column of memory cells TR which are arranged along the plate line 2396 are connected to the plate line 2396. It is necessary to control potentials of the gate electrode (word line) 2395, the $n^+$-type source (plate line) 2396 and the $n^+$-type drain (bit line) 2397 independently of adjacent gate electrodes (word lines) 2395, adjacent $n^+$-type sources (plate lines) 2396 and adjacent $n^+$-type drains (bit lines) 2397 respectively.

FIG. 180 illustrates a layout of an actual memory cell array. FIGS. 181 and 182 are sectional views taken along the lines A—A and B—B in FIG. 180 respectively. Referring to FIG. 181, numeral 2400 denotes a substrate electrode of each $p^-$-type Si substrate 2393, and numeral 2401 denotes an insulating film. According to this embodiment, the insulating film 2401 of $SiO_2$, for example, is embedded/formed in a clearance 2399 which is defined between the $n^+$-type source 2396 and the $n^+$-type drain 2397 and between the $p^-$-type Si substrates 2393 of each pair of memory cells which are adjacent along the direction A—A as shown in FIG. 181, to electrically isolate the memory cells from each other, so that potentials can be independently set therein. However, the gate electrode 2395 is integrally and continuously formed as a word line for the memory cells which are adjacent to each other along one direction (A—A in FIG. 180) as shown in FIG. 181, while the gate insulating film 2394 is also integrally and continuously formed for the memory cells which are adjacent to each other along one direction.

<Fabrication Method>

The semiconductor device having the aforementioned structure is fabricated as follows: First, the Si substrate 2391 is thermally oxidized to form the silicon oxide film 2392. Thereafter a polycrystalline or amorphous silicon film 2402 is stacked by CVD as shown in FIGS. 183 and 184, and thereafter a silicon single-crystalline film 2403 (see FIGS. 185 and 186) is formed by radical beam irradiation similarly to the twenty-first embodiment.

Then, the insulating film 2401 of silicon oxide is formed in each isolation region of the silicon single-crystalline film 2403 between cells by a LOCOS method or the like, as shown in FIGS. 185 and 186. Before or after formation of the oxide, film 2401, phosphorus is implanted into the silicon single-crystalline film 2403 by ion implantation and diffused/activated by heat treatment, thereby bringing the film into a p-type single-crystalline state.

Then, lithography, ion implantation and diffusion steps are combined to form the $n^+$-type source 2396, the $n^+$-type drain 2397, the active region 2398 and the substrate electrode 2400 of each transistor, as shown in FIG. 187.

Then, a ferroelectric film of PZT consisting of mixed crystals of $PbZrO_3$ and $PbTiO_3$, for example, is stacked by CVD, a sol-gel method or sputtering and thereafter single-crystallized by the radical beam irradiation similarly to the twenty-first embodiment, for forming the gate insulating film 2394 of a perovskite crystal system ferroelectric film without employing a specific material such as Pt, as shown in FIGS. 188 and 189. At this time, the ferroelectric film may be directly formed on the silicon single-crystalline film 2403 for defining the transistor, or a thin oxide film (not shown) may be grown on the silicon single-crystalline film 2403 by thermal oxidation so that the ferroelectric film is formed on its upper surface.

Then, a polysilicon film or a polycide film with a high melting point metal is stacked on an upper surface of the gate insulating film 2394 by CVD and thereafter patterned to form the gate electrode 2395 for serving as the word line, to complete each memory cell TR as shown in FIGS. 180, 181 and 182. Thereafter an electrically rewritable ferroelectric nonvolatile memory cell array is completed through a general silicon semiconductor interconnection process.

In the aforementioned fabrication method, an amorphous thin film, for example, is formed by CVD or a sol-gel method and thereafter single-crystallized by radical beam irradiation similarly to the twenty-first embodiment in formation of each single-crystalline film. Thus, it is possible to obtain a single crystal of a desired crystal orientation according to the aforementioned radical beam irradiation, with no regard to the electrode material or crystallinity. While CVD is employed in this embodiment, a gel solution of a mixture of organic compounds of complement elements may be applied by a spinner, fired and thereafter irradiated with a radical beam similarly to the above, when the film is formed by a sol-gel method.

While every one of the single-crystalline films of the gate insulating film 2394, the $n^+$-type source 2396, the $n^+$-type drain 2397 and the active region 2398 may simply be single-crystallized after formation of a single amorphous thin film since the same is preferably minimized in thickness in the semiconductor memory device according to this embodiment, it is possible to obtain a stable single-crystalline film having high homogeneity even if the thickness is increased, by forming a single-crystalline thin film by the aforementioned method and thereafter growing a single-crystalline film on an upper surface of the thin film serving as a seed crystal or repeating the aforementioned method, when a constant thickness is required for the single-crystalline film. According to this embodiment, it is possible to prevent a leakage current and deterioration of film characteristics due to the single crystallization, whereby it is not necessary to take a multilayer film structure including a Pt layer for preventing a leakage current, dissimilarly to Prior Art 21. Thus, it is possible to contribute to simplification of fabrication steps.

Further, it is possible to grow/form a plurality of $p^-$-type Si substrates 2393 which are isolated from each other by clearances and insulating films on the upper surface of the Si substrate 2391 to thereafter easily form single-crystalline films on upper layer portions or upper surfaces of the $p^-$-type Si substrates 2393, whereby the clearances between adjacent ones of the second substrates 2393 can be minimized with partial provision of the single-crystalline films, for improving the degree of integration of the cell array.

While amorphous thin films are formed to be thereafter single-crystallized in the above description, polycrystalline films may be formed in place of the amorphous thin films, to be thereafter single-crystallized.

<Employing Operation>

In employment of the semiconductor device which is fabricated by the aforementioned method, data "1" or "0" is held depending on the remanence direction of the gate insulating film 2394 of a ferroelectric film, as shown in FIG. 178. When an electric field exceeding V(0) is applied to the ferroelectric film in FIG. 178, remanence of P(0) is generated even if the electric field is removed after this point of time. This is regarded as data "0". When an electric field below V(1) is applied to the ferroelectric film, on the other hand, remanence P(1) is generated even if the electric field is removed after this point of time. This is regarded as data "1".

FIG. 190 shows voltage-to-current characteristics of a gate voltage (Vg) and a drain current (Id) of the transistor in relation to the data "0" and "1". When the data is "0", the transistor becomes a depression type as shown by $\alpha 0$ in FIG. 190, while the same becomes an enhancement type as shown by $\alpha 1$ in FIG. 190. In the following description, a high level of a gate voltage which is applied to the gate electrode (word line) 2395 is 0 V and a low level is a minus level, while a high level of a voltage which is applied to the $n^-$-type source (plate line) 2396 is a plus level, and a low level is 0 V.

<Read Operation>

In data reading, the gate electrode (word line) 2395, the $n^+$-type source (plate line) 2396 and the $n^+$-type drain (bit line) 2397 which are connected to a memory cell for reading in FIG. 179 are brought into a high level (0 V), a low level (0 V) and a sense level of a sense circuit, while other gate electrodes (word lines) 2395 are brought into low levels, i.e., between $-Vg(1)$ and 0 V in FIG. 190, so that the current of the depression type transistor is sufficiently small. At this time, it is the best to bring other $n^+$-type sources (plate lines) 2396 and $n^+$-type drains (bit lines) 2397 into sense levels of sense circuits in order to increase the operating speed, while the $n^+$-type sources (plate lines) and $n^+$-type drains (bit lines) 2397 may be substantially at the same potentials at degrees not inverting the data of the memory cell. The potential of the $n^+$-type drain (bit line) 2397 which is connected to the memory cell for reading, or a current flowing in the $n^+$-type drain (bit line) 2397 is detected by the sense circuit, to detect whether the data is "0" or "1".

When "1" is written as the data, the memory cell is of a depression type and hence a current flows from the $n^+$-type drain (bit line) 2397 to the $n^+$-type source (plate line) 2396, so that the potential of the $n^+$-type drain (bit line) 2397 is reduced. When "0" is written as the data, on the other hand, the memory cell is of an enhancement type and the transistor will not operate and both of the current and the potential remain unchanged. The difference in the aforementioned current or potential change may be detected by the sense circuit.

The potential relation between the gate electrode (word line) 2395 and the $n^+$-type source (plate line) 2396 is set at least in a range from an intermediate level between V(3) and V(1) to V(2) in FIG. 178 causing no inversion of remanence.

<Write Operation>

In data writing, one of the gate electrode (word line) 2395 and the $n^+$-type source (plate line) 2396 which are connected to the memory cell for reading in FIG. 179 is brought into a high level and the other one is brought into a low level, in response to data to be written. Other gate electrodes (word lines) 2395 and $n^+$-type sources (plate lines) 2396 are set at intermediate levels, i.e., at potentials of about ½ of potential difference between the gate electrode 2395 and the $n^+$-type source 2396 of the memory cell for writing, so that no data are written in other memory cells. In more concrete terms, the absolute value of the potential difference between the gate electrode (word line) 2395 and the $n^+$-type source (plate line) 2396 of the memory cell for writing is made larger than V(0) to V(1) shown in FIG. 178 and the other gate electrodes (word lines) 2395 and $n^+$-type sources (plate lines) 2396 are held at the aforementioned intermediate levels to generate remanence of P(0) or P(1) depending on the direction of an applied electric field when the applied electric field is removed from only the memory cell for writing, thereby holding the data.

When "1" is written as the data, the gate electrode (word line) 2395 shown in FIG. 179 is brought into 0 V, and a positive voltage V1 having a larger absolute value than V(1) shown in FIG. 178 is applied to the $n^+$-type source (plate line) 2396. At this time, a voltage of V1/2 is applied to the other gate electrodes (word lines) 2395 and $n^+$-type sources (plate lines) 2396 and all $n^+$-type drains (bit lines) 2397. Consequently, remanence of P(1) is generated only in the memory cell for writing, so that this memory cell becomes a depression type.

When "0" is written as the data, on the other hand, the gate electrode (word line) 2395 is brought into a voltage V0 which is larger than V(0) shown in FIG. 178, and the n⁺-type source (plate line) 2396 is brought into 0 V. At this time, a voltage of V0/2 is applied to the other gate electrodes (word lines) 2395 and n⁺-type sources (plate lines) 2396 and all n⁺-type drains (bit lines) 2397. Consequently, remanence of P(0) is generated only in the memory cell for writing, so that this memory cell becomes an enhancement type.

Thus, polarization of a ferroelectric film for serving as a gate insulating film of a memory cell has changeability only in data writing and remains unchanged in data reading, whereby it is possible to minimize film fatigue of the ferroelectric film. Further, it is possible to form a high quality film with extremely small film fatigue by single-crystallizing the ferroelectric film, in particular.

(Twenty-Fifth Embodiment)
<Structure>

A semiconductor device according to a twenty-fifth embodiment of the present invention is similar to that according to the twenty-fourth embodiment in a point that the same is an MFSFET whose memory cells are formed by thin film transistors (TFT) employing ferroelectric substances for gate insulating films, while the former is different from the latter in a point that a memory cell array has a layout shown in FIG. 191. Referring to FIG. 191, numeral 2411 denotes a gate electrode for serving as a word line, numeral 2412 denotes an n⁺-type source for serving as a plate line, numeral 2413 denotes an n⁺-type drain for serving as a bit line, and numeral 2414 (slanted region) denotes an active region (channel) which is held between the n⁺-type source 2412 and the n⁺-type drain 2413.

FIGS. 192 and 193 are sectional views taken along the lines C—C and D—D in FIG. 191 respectively. Referring to FIGS. 192 and 193, numeral 2415 denotes an n-type Si substrate, numeral 2416 denotes a p⁺-type silicon oxide film (SiO₂), numeral 2417 denotes a p⁺-type diffusion layer for serving as a substrate electrode, and numeral 2418 denotes a gate insulating film. According to this embodiment, the n⁺-type source 2412 of a single memory cell and the n⁺-type drain 2413 of another memory cell which is adjacent to the single memory cell along the direction C—C are utilized in common. As shown in FIG. 192, further, the gate electrode 2411 is integrally and continuously formed as a word line for those of the memory cells which are adjacent to each other along one direction (C—C in FIG. 191), while the gate insulating film 2418 is also integrally and continuously formed for the adjacent memory cells. While each p⁺-type diffusion layer 2417 is closely in conduction with each active region 2414 in FIG. 192, a thin insulating film may alternatively be arranged therebetween.

Similarly to the twenty-fourth embodiment, the gate electrode 2411 has a polycrystalline structure of polysilicon or polycide, while the gate insulating film 2418 is formed by a ferroelectric film. Further, the gate insulating film 2418, the n⁺-type source 2412, the n⁺-type drain 2413 and the active region 2414 are brought into single-crystalline structures by the radical beam irradiation, also similarly to the twenty-fourth embodiment.

<Fabrication Method>

The semiconductor memory device having the aforementioned structure is fabricated as follows: First, the n-type Si substrate 2415 is thermally oxidized by a LOCOS method, so that each p⁺-type silicon oxide film 2416 is selectively formed on a prescribed position of its upper surface. Thereafter boron or BF₂ is ion-implanted into each region provided with no p⁺-type silicon oxide film 2416 to form each p⁺-type diffusion layer 2417 for defining a substrate electrode through a diffusion step, as shown in FIGS. 194 and 195.

Thereafter a polycrystalline or amorphous silicon layer is stacked by CVD, and thereafter a silicon single-crystalline film 2414a is formed by radical beam irradiation similarly to the twenty-first embodiment, as shown in FIGS. 196 and 197. The polycrystalline or amorphous silicon layer may be directly stacked on the p⁺-type diffusion layer 2417 etc., or a thin oxide film (not shown) may be formed on the p⁺-type diffusion layer 2417 etc. so that the polycrystalline or amorphous silicon layer is stacked thereon to be single-crystallized. When a thin oxide film is formed on the p⁺-type diffusion layer 2417 etc., the substrate potential is decided by coupling of the capacitance of the gate insulating film 2418 in each memory cell and that of the thin oxide film. In this case, the Si substrate 2415 may be of a p type and the diffusion layer 2417 for defining a substrate electrode may be of n⁺diffusion.

Then, lithography, ion implantation and diffusion steps are combined on regions of the silicon single-crystalline film 2414a located immediately above the p⁺-type silicon oxide films 2416 to form n⁺-type diffusion layers, thereby defining the n⁺-type source 2412 and the n⁺-type drain 2413, as shown in FIGS. 198 and 199. Further, the active region (channel) 2414 is defined by each region which is held between the n⁺-type source 2412 and the n⁺-type drain 2413.

Then, a ferroelectric film is stacked on the overall upper surface of the silicon single-crystalline film 2414a including the n⁺-type source 2412, the n⁺-type drain 2413 and the active region (channel) 2414 by CVD or combination of a sol-gel method and sputtering to be thereafter single-crystallized by radical beam irradiation similarly to the twenty-first embodiment, thereby forming the gate insulating film 2418 as shown in FIGS. 200 and 201. This gate insulating film 2418 may be directly formed on the silicon single-crystalline film 2414a, or a thin oxide film (not shown) may be grown on the silicon single-crystalline film 2414a by thermal oxidation, so that the silicon single-crystalline film 2414a is thereafter formed thereon.

Then, polysilicon or polycide containing a high melting point metal is stacked by CVD to form the gate electrode 2411, and thereafter the gate electrode 2411 and the gate insulating film 2418 are patterned as shown in FIGS. 192 and 193, to form transistors of the memory cell array. Thereafter an electrically rewritable ferroelectric nonvolatile memory device is completed through a general silicon semiconductor interconnection process and the like. It is possible to attain actions/effects which are similar to those of the twenty-fourth embodiment, also according to this embodiment.

(Twenty-Sixth Embodiment)
<Structure>

A semiconductor device according to a twenty-sixth embodiment of the present invention is similar to that according to the twenty-first or twenty-fifth embodiment in a point that the same is an MFSFET whose memory cells are formed by thin film transistors (TFT) employing ferroelectric substances for gate insulating films, while the former is different from the latter in a point that a memory cell array has a sectional structure shown in FIG. 202. According to this embodiment, a gate insulating film 2421 consisting of a single-crystalline film of a ferroelectric substance is formed only in a part of a lower surface of a gate electrode 2422, while a silicon oxide film 2424 is formed between the gate insulating film 2421 and a p-type semiconductor substrate 2423 as well as between the gate electrode 2422 and the p-type semiconductor substrate 2423. Referring to FIG. 202, numeral 2425 denotes a source, and numeral 2426 denotes a drain. The layout of the memory cell array according to this embodiment is similar to that of the twenty-fifth embodiment shown in FIG. 191.

FIG. 203 illustrates gate voltage-to-drain current characteristics of the semiconductor device according to this embodiment. Referring to FIG. 203, curves α0 and α1 indicate characteristics with respect to data "0" and "1" respectively. As shown in FIG. 203, enhancement type gate voltage-to-drain current characteristics are attained with respect to both of the data "1" and "0"while threshold voltages are different from each other.

FIG. 204 is a circuit diagram showing a memory cell array MA of the semiconductor device according to this embodiment, and FIG. 205 shows peripheral circuits thereof. The memory cell array MA according to this embodiment is divided into small blocks called banks so that only one bank is selected and the remaining banks are electrically isolated therefrom during its operation, thereby remarkably reducing load capacitance of bit lines and attaining a high processing speed. As shown in FIGS. 204 and 205, a plurality of the same type of memory cells are interconnected as single banks Bank0 to Bank3, and a plurality of such banks Bank0 to Bank3 are electrically connected with each other in an automatic switching system. As shown in FIG. 204, all memory cells, including TR1, provided in one of the banks such as the bank Bank2, for example are necessarily connected to any of main bit lines such as a main bit line BL2, for example, in common while memory cells of the remaining banks Bank0, Bank1 and Bank3 are not connected to the main bit line BL1, thereby reducing load capacitance of the main bit lines BL0 to BL4. Referring to FIG. 204, symbol TR0 denotes a memory cell which is interposed between the adjacent pair of banks Bank1 and Bank2, and symbol TR2 denotes a memory cell which is interposed between the other adjacent pair of banks Bank2 and Bank3. Symbols Q01, Q02, Q1 and Q2 denote selection elements (selection gate transistors) for selecting the banks Bank0 to Bank3, and gate electrodes thereof are connected to three selection lines SE0, SE1 and SE2 respectively. One source/drain electrode p1 of the selection element Q01 is connected to all sources 2425 of n memory cells, including TR1 in the aforementioned bank Bank2, as well as to a drain 2426 of the memory cell TR0 provided between this bank and the adjacent bank Bank1. One source/ drain electrode p2 of the selection element Q02 is connected to all drains 2426 of the n memory cells, including TR1, of the aforementioned bank Bank2, as well as to a source 2425 of the memory cell TR2 provided between this bank and the adjacent bank Bank3. Other source/drain electrodes p3 and p4 of the selection elements Q01 and Q02 are connected to the main bit line BL2 corresponding to the aforementioned bank Bank2. Further, one source/drain electrode p5 of the selection element Q1 is connected to all drains 2426 of the n memory cells, including TR1, of the aforementioned bank Bank2, as well as to the source 2425 of the memory cell TR2 provided between this bank and the adjacent bank Bank3. Another source/drain electrode p6 of this selection element Q1 is connected to the main bit line BL2 corresponding to the aforementioned bank Bank2. One source/drain electrode p7 of the selection element Q2 is connected to all sources 2425 of the n memory cells, including TR1, of the aforementioned bank Bank2, as well as to the drain 2426 of the memory cell TR0 provided between this bank and the adjacent bank Bank1. Another source/drain electrode p8 of this selection element Q2 is connected to the main bit line BL1 corresponding to the adjacent bank Bank1.

Referring to FIG. 204, symbols Q3 and Q4 denote transistors, whose gate electrodes are connected to selection lines SE3 and SE4 respectively. One source/drain electrode p9 of the transistor Q3 is connected to the main bit line BL1 corresponding to the adjacent bank Bank1, while one source/drain electrode p10 of the transistor Q4 is connected to the main bit line BL2 corresponding to the aforementioned bank Bank2.

Gate electrodes 2422 of the respective memory cells, i.e., word lines WL0 to WLn and the selection lines SE0 to SE2 are connected to a word line (WL) bank decoder/driver 2431 as shown in FIG. 205, to be selection-controlled. Further, all main bit lines BL0 to BL4 are connected to a bias generation circuit 2432 through transistors Qm and Qn. Gate electrodes of the transistors Qm and Qn are connected to a bias selector circuit 2433 for selecting a bit line to be supplied with a bias voltage. Thus, the respective memory cells are precharged at a constant potential.

As shown in FIG. 205, each of the main bit lines BL0 to BL4 is connected to first source/drain electrodes p11 and p12 of a pair of transistors Qc and Qd provided in a driver circuit 2434. Gate electrodes of the transistors Qc and Qd provided in each driver circuit 2434 are connected to a bit line (BL)/plate line (PL) decoder 2435. Another source/drain electrode p13 of the transistor Qc is connected to a sense amplifier (SA) 2437 and a write bias generation circuit 2438 through a sense amplifier (SA)/write bias selector circuit 2436, to be precharged at a sense level of the ordinary sense amplifier (SA) 2437. Another source/drain electrode p14 of each transistor Qd is ground-connected.

<Employing Operation>

In employment (reading/writing) of the semiconductor device having the aforementioned structure, selection control is made in the word line (WL) bank decoder/driver 2431 through the selection lines SE0 to SE2 and the selection elements Q01, Q02, Q1 and Q2 as to target memory cells, to connect only that of the main bit lines BL0 to BL3 for the corresponding one of the banks Bank0 to Bank3 to a target bit or plate line. At this time, the main bit lines corresponding to the remaining banks are electrically isolated from the bit and plate lines corresponding thereto. The bit or word lines carrying out no data reading/writing are biased at intermediate potentials of about decision threshold values for "0" and "1" of the sense amplifier 2437, to read or write data at a high speed. This operation is now described in more concrete terms.

<Read Operation>

In reading, signals are first transmitted to the selection lines SE0 to SE2 to drive the selection elements Q01, Q02, Q1 and Q2. When data is read from the memory cell TR1, for example, the selection lines SE1 and SE2 are brought into high levels, so that the selection elements Q1 and Q2 are brought into ON states. Further, the source/drain electrodes of the respective memory cells are connected to the main bit lines BL1 and BL2 respectively. Assuming that R0 and R1 represent end-to-end diffusion resistance values of the sources and the drains in the banks, resistance of R0+R1 is connected in series with the sources and the drains of the transistors. Among the word lines WL0 to WLn, only that for the read transistor is brought into a high level by the WL bank decoder/driver 2431. Further, the transistor Qd of the driver circuit 2434 for the main bit line BL0 which is connected with one source/drain electrode is turned on by the bit line/plate line decoder 2435 so that the main bit line BL0 is ground-connected, while the transistor Qc of the driver circuit 2434 for the main bit line BL1 which is connected with the other source/drain electrode is turned on so that this main bit line BL1 is connected to the SA/write bias selector circuit 2436, which in turn selects bias of the sense amplifier 2437 to read the data.

As to an independent read operation in each memory cell, data may be read from the memory cell TR0 in FIG. 204 in the following procedure when this memory cell has the current-to-voltage characteristics shown in FIG. 190:

[1] In an initial state, all main bit lines BL0 to BL3 are connected to the bias generation circuit 2432 shown in FIG. 205, to be precharged at the sense level of the sense amplifier 2437. This voltage level is represented by Vref. At this time, all word lines WL0 to WLn are set at a voltage level of Vref−Vg(2), in order to maintain the memory cells in OFF states.

[2] Then, the word line WL0 is brought into the Vref level, while the selection line SE0 is simultaneously brought into a high level (ON state). The remaining selection lines SE1 to SE4 are brought into low levels (OFF states). The bit line/plate line decoder/driver 2435 connects the bit line BL1 to the ground, while connecting the bit line BL2 to the sense amplifier 2437. Further, the bias selector circuit 2433 isolates the bit line BL1 from the bias generation circuit 2432.

[3] When the memory cell TR0 is of a depression type, a current flows from the main bit line BL2 to the main bit line BL2, whereby the potential of the main bit line BL2 is reduced. When the memory cell TR0 is of an enhancement type, on the other hand, no current flows from the main bit line BL2 to the main bit line BL1, and the potential of the main bit line BL2 remains unchanged. The amount of this current or voltage change is detected by the sense amplifier 2437, to read the data.

Data reading from the memory cell TR1 shown in FIG. 204 is enabled by bringing the selection lines SE1 and SE2 into high levels (ON states) while bringing the remaining selection lines into low levels (OFF states).

<Write Operation>

In data writing, signals are first transmitted to the selection lines SE0 to SE2 to drive the selection elements Q01, Q02, Q1 and Q2. In order to write data in the memory cell TR1, for example, the selection lines SE1 and SE2 are brought into high levels so that the selection elements Q1 and Q2 are brought into ON states. The source/drain electrodes of the respective memory cells are connected to the main bit lines BL1 and BL2 respectively. Assuming that R0 and R1 represent end-to-end diffusion resistance values of the sources and the drains in the banks, resistance of R0+R1 is connected in series to the sources and the drains of the transistors. The main bit line BL1 connecting the substrate electrode of the write transistor with one source/drain electrode serves as a plate line, and the bit line/plate line decoder 2435 turns on the transistor Qc of the driver circuit 2434 for the main bit line BL1 to connect the main bit line BL1 to the SA/write bias selector circuit 2436, which in turn selects the bias of the sense amplifier 2437 to apply a desired bias voltage across the word lines WL0 to WLn for the write transistor to write the data.

As to an independent write operation in each memory cell, data may be written in the memory cell TR0 in FIG. 204 in the following procedure:

[1] In an initial state, all main bit lines BL0 to BL3 are connected to the bias generation circuit 2432 shown in FIG. 205 similarly to the read operation, to be precharged at the sense level of the sense amplifier 2437. This voltage level is represented by Vref. At this time, all word lines WL0 to WLn are set at a voltage level of Vref−Vg(2), in order to maintain the memory cells in OFF states.

[2] Only the main bit line BL1 is connected to the write bias generation circuit 2438.

[3] the selection line SE1 is brought into a high level (ON state), and the remaining selection lines are brought into low levels (OFF states).

[4] When "0" is written as the data, the word line WL0 and the main bit line BL1 are biased at Vref−Vg(1)/2 and Vref+Vg(1)/2 respectively. Vg(1) represents the voltage value shown in FIG. 190.

[5] When "1" is written as the data, the word line WL0 and the main bit line BL1 are biased at Vref−Vg(0)/2 and Vref +Vg(0)/2 respectively. Vg(0) represents the voltage value shown in FIG. 190.

When the data is written in the memory cell TR1 shown in FIG. 204, the selection line SE2 may be brought into a high level (ON state) so that the remaining selection lines are brought into low levels (OFF states).

Thus, the plate line is connected to only the ground in reading and only to the write bias generation circuit 2438 in writing, whereby no current pass to others takes place and hence a stable operation can be guaranteed.

(Twenty-Seventh Embodiment)
<Structure>

A semiconductor device according to a twenty-seventh embodiment of the present invention is similar to that according to the twenty-sixth embodiment in a point that the same is an MFSFET whose memory cells are formed by thin film transistors (TFT) employing ferroelectric substances for gate insulating films, while the former is different from the latter in a point that its memory cell array has a structure shown in FIG. 206. While the twenty-sixth embodiment is provided with three bank selection lines SE0, SE1 and SE2, this embodiment is provided with four selection lines SE0, SE1, SE2 and SE3. Referring to FIG. 206, symbol σ denotes a bank region. Further, symbols Qa0, Qa1, Qa2 and Qa3 denote selection elements (selection gate transistors) for selecting banks Bank0 to Bank3, and gate electrodes thereof are connected to the aforementioned four selection lines SE0, SE1, SE2 and SE3 respectively. Among these, one source/drain electrode p21 of the selection element Qa0 is connected to all drains 2426 of n memory cells, including TR1, in the bank Bank2, as well as to a source 2425 of a memory cell TR2 which is provided between this bank and the adjacent bank Bank3. One source/drain electrode p22 of the selection element Q01 is connected to all sources 2425 of the n memory cells, including TR1, of the aforementioned bank Bank2, as well as to a drain 2426 of a memory cell TR0 which is provided between this bank and the adjacent bank Bank1. Other source/drain electrodes p23 and p24 of the selection elements Qa0 and Qa1 are connected to the main bit line BL2 corresponding to the aforementioned bank Bank2. Further, one source/drain electrode p25 of the selection element Qa2 is connected to all sources 2425 of the n memory cells, including TR1, of the aforementioned bank Bank2, as well as to the drain 2426 of the memory cell TR0 which is provided between this bank and the adjacent bank Bank1. Another source/drain electrode p26 of the selection element Qa2 is connected to the main bit line BL1 corresponding to the adjacent bank Bank1. One source/drain electrode p27 of the selection element Qa2 is connected to all drains 2426 of the n memory cells, including TR1, of the aforementioned bank Bank2, as well as to the source 2425 of the memory cell TR2 which is provided between this bank and the adjacent bank Bank3. Another source/drain electrode p28 of this selection element Qa2 is connected to the main bit line BL2 corresponding to the aforementioned bank Bank2.

Referring to FIG. 206, symbols Qa4 and Qa5 denote transistors, whose gate electrodes are connected to selection lines SE4 and SE5 respectively. One source/drain electrode p29 of the transistor Qa4 is connected to the main bit line BL2 corresponding to the aforementioned bank Bank2, while one source/drain electrode p30 of the transistor Qa5 is connected to the main bit line BL1 corresponding to the adjacent bank Bank1.

<Read/Write Operation>

When data is written in/read from the memory cell TR1, for example, the selection lines SE0 and SE2 are brought into high levels to bring the transistors Qa0 and Qa2 into ON states so that the source/drain electrode of the memory cell is connected to the main bit lines BL1 and BL2, whereby a resistance value which is connected in series to the source/drain of the memory cell is regularly R0 (R1) assuming that resistance values R0 and R1 are substantially equal to each other, whereby it is possible to attain a higher speed.

(Twenty-eighth Embodiment)

<Structure>

FIG. 216 is a sectional view showing a semiconductor device according to a twenty-eighth embodiment of the present invention, in which the pMOS transistor P1 in the SRAM shown in FIG. 231 is formed by a TFT. Referring to FIG. 216, numeral 2500 denotes an Si substrate, numeral 2501 denotes LOCOS oxide films, numeral 2502 denotes an Si wiring film to be connected to the gate of the nMOS transistor N1, numeral 2503 denotes a first insulating film, numeral 2504 denotes an Si gate of the transistor P1, numeral 2505 denotes an Si wiring film to be connected to the gates of the pMOS transistor P2 and the nMOS transistor N2, numeral 2506 denotes a second insulating film (gate insulating film), numeral 2507 denotes an Si drain of the transistor P1, numeral 2508 denotes an Si source of the transistor P1, and numeral 2509 denotes a channel interposed between the drain 2507 and the source 2508.

According to this embodiment, the wiring films 2502 and 2505, the gate 2504, the source 2508, the drain 2507 and the channel 2509 are formed by single-crystalline films. Since the wiring films 2502 and 2505, the gate 2504, the source 2508 and the drain 2507 are formed by single-crystalline films, it is possible to increase the ratio of a drain current in an ON state of the transistor to that in an OFF state as compared with a case of forming these by polycrystalline or amorphous films. Therefore, it is possible to enable a high-speed operation by increasing the ON-state current and reducing a time for charging condensed capacitance immediately after writing, while simultaneously reducing an OFF-state current thereby reducing a standby current.

Since the insulating films 2503 and 2506 are formed by single-crystalline films, further, it is possible to remarkably reduce formation areas thereof while ensuring withstand voltages thereof, thereby reducing the cell area of the overall field-effect thin-film transistor and improving its numerical aperture. Thus, it is possible to reduce a consumption current for employment in a portable device or a color display.

<Fabrication Method>

The semiconductor device having the aforementioned structure is fabricated as follows: First, the LOGOS oxide films 2501 and a gate oxide film (not shown) are formed on the upper surface of the Si substrate 2500 by thermal oxidation, and thereafter a polysilicon film is deposited by CVD or the like and irradiated with atoms of He or the like as shown in FIG. 217 by radical beam irradiation described later to form a single-crystalline film, which in turn is patterned to form the Si wiring film 2502.

Then, the first insulating film 2503 is formed on parts of upper surfaces of the LOCOS oxide film 2501 and the Si wiring film 2502 by a method of thermally oxidizing the Si wiring film 2502 or a method of depositing the same by CVD or in a two-layer structure employing both of these methods, and partially opened to upwardly release a part of the upper surface of the Si wiring film 2502, as shown in FIG. 218.

Then, polysilicon is deposited on the upwardly released portion of the wiring film 2502 and the upper surface of the first insulating film 2503 by CVD or the like and irradiated with atoms of He or the like by radical beam irradiation described later to form a single-crystalline film, which in turn is patterned as shown in FIG. 219 to form the Si gate 2504 and the Si wiring film 2505.

Then, the Si gate 2504 and the Si wiring film 2505 are thermally oxidized to form the second insulating film 2506, which is a gate oxide film. Thereafter a part of the second insulating film 2506 located immediately above the Si wiring film 2505 is opened as shown in FIG. 220, for connecting the Si wiring film 2505 to the Si drain 2507.

Then, a polysilicon film is deposited on the upper surface and the opening portion of the second insulating film 2506 by CVD or the like and irradiated with atoms of He or the like by radical beam irradiation described later to form a single-crystalline film, which in turn is patterned as shown in FIG. 216 to form the Si drain 2507, the Si source 2508 and the channel 2509 interposed therebetween, thereby completing the semiconductor device.

<Single-Crystalline Film Forming Method>

In relation to the aforementioned fabrication method, a single-crystalline film forming method (radical beam irradiation) for forming a polycrystalline or amorphous thin film of each of the wiring films 2502 and 2505, the gate 2504, the source 2508, the drain 2507 and the channel 2509 and thereafter single-crystallizing the same is now described in detail. Each of the wiring films 2502 and 2505, the gate 2504, the source 2508, the drain 2507 and the channel 2509 is hereinafter referred to as a sample upper surface coat.

<Overall Structure of Single-Crystalline Film Forming Apparatus>

FIG. 221 is a front sectional view showing a structure of an exemplary single-crystalline thin film forming apparatus 2510 for effectively implementing a method of forming each single-crystalline thin film according to the embodiment of the present invention. This apparatus 2510 comprises a reaction vessel 2511, and an electron cyclotron resonance (ECR) ion generator 2512 which is built in an upper portion of the reaction vessel 2511. The ECR ion generator 2512 comprises a plasma container 2513 which defines a plasma chamber 2514 in its interior. A magnetic coil 2515 is provided around the plasma container 2513, to apply a dc high magnetic field to the plasma chamber 2514. Further, a waveguide 2516 and an inert gas inlet pipe 2517 are provided on an upper surface of the plasma container 2513 for introducing a microwave and an inert gas such as neon (Ne) or oxygen (O) into the plasma chamber 2514 respectively.

The reaction vessel 2511 defines a reaction chamber 2518 in its interior. The bottom portion of the plasma container 2513 defines an outlet 2519 for passing a plasma in its center. The reaction chamber 2518 and the plasma chamber 2514 communicate with each other through the outlet 2519. In the interior of the reaction chamber 2518, a sample holder 2520 is arranged on a position immediately under the outlet 2519. A sample 2521, on which a sample upper surface coat to be single-crystallized is deposited/patterned as shown in FIG. 217, 219 or 216, is placed on the sample holder 2520, while a reflector 2522 is placed to be located above the sample 2521. Desired single-crystalline films are formed on the sample 2521. The reflector 2522 is preferably made of a metal. The sample holder 2520 is coupled to a rotation driving mechanism (not shown), to be rotatable in a horizontal plane. Further, the sample stand 2520 can horizontally move the sample 2521 while fixing the reflector 2522.

The reaction chamber 2518 communicates with reaction gas supply pipes 2523. Reaction gases are supplied through the reaction gas supply pipes 2523, for forming films of prescribed materials on the sample 2521 by plasma CVD. The example shown in FIG. 221 is provided with three reaction gas supply pipes 2523a, 2523b and 2523c. The reaction chamber 2518 further communicates with an evacuation pipe 2524. An end of the evacuation pipe 2524 is coupled with a vacuum unit (not shown) to evacuate the reaction chamber 2518 through the evacuation pipe 2524, thereby maintaining the reaction chamber 2518 at a prescribed degree of vacuum. A vacuum gauge 2525 for displaying the degree of vacuum in the reaction chamber 2518 is provided in communication with the reaction chamber 2518.

<Structure of Reflector>

FIG. 222 is a perspective view showing an exemplary reflector 2522a. This reflector 2522a is adapted to form a single crystal having a diamond structure. The reflector 2522a defines an opening on a central portion of a flat plate type base 2531. Three blocks 2532 in the form of rectangular parallelopipeds are fixedly provided around the opening, and reflecting blocks 2533 are fixed to inner sides of the blocks 2532 respectively. Consequently, an equilateral triangular opening 2534 which is trimmed with the reflecting blocks 2533 is defined at the central portion of the base 2531. In the reflecting blocks 2533, slopes 2535 facing the opening 2534 serve as reflecting surfaces for reflecting a gas beam. Therefore, the angles of inclination of the slopes 2535 are set at proper levels in correspondence to the directions of crystal axes of the single crystal to be formed.

FIGS. 223A, 223B and 223C are a plan view, a side elevational view and a front elevational view of the reflector 2522a which is formed by the blocks 2532 and the reflecting blocks 2533 respectively. As shown in FIG. 223B, the angle of inclination of each slope 2535 is set at 55°. The reflector 2522a is in a structure not fixing the sample 2521, whereby the sample 2521 can be relatively horizontally moved with respect to the reflector 2522a. Therefore, it is possible to form single-crystalline films on the sample 2521 having a large area by horizontally moving the sample 2521 while fixing the reflector 2522a on the sample holder 2520.

<Operation of ECR Ion Generator>

Referring again to FIG. 221, the operation of the ECR ion generator 2512 is now described. An inert gas such as Ne, O or Ar is introduced from the inert gas inlet pipe 2517 into the plasma chamber 2514, while a microwave is simultaneously introduced from the waveguide 2516 into the plasma chamber 2514. Further, a dc current is also simultaneously supplied to the magnetic coil 2515, to form a dc magnetic field in the plasma chamber 2514 and its periphery. The gas as supplied is maintained in a plasma state by actions of the microwave and the dc magnetic field. This plasma is formed by high-energy electrons which are in screw motion in the principle of cyclotron by the microwave and the dc magnetic field.

These electrons, which have diamagnetic properties, are moved to a weaker magnetic field side, to form an electron stream along a line of magnetic force. Consequently, positive ion beams also form an ion current along the line of magnetic force following the electron stream, in order to maintain electrical neutrality. In other words, the electron stream and the ion current are downwardly directed from the outlet 2519 into the reaction chamber 2518. The ion current and the electron stream thus flowing in parallel with each other are recombined with each other after a lapse of a deionization time, to form a neutral atom current. Therefore, substantially only a neutral atom current is formed in a position downwardly separated from the outlet 2519 beyond a prescribed distance.

FIG. 224 is a graph showing the result of relation between ion current density and the distance from the outlet 2519 actually measured when $Ar^+$ ion beams of 10 eV were discharged from the outlet 2519 by the ECR ion generator 2512. It is understood from this graph that the ion current density is abruptly reduced at a distance of about 4 to 5 cm from the outlet 2519, and attenuated to a level of 1/10 to 1/12 at a position of 14 cm. The neutral atom current is increased by such attenuation of the ion current, whereby substantially only a neutral atom current downwardly flows in a position downwardly separated from the outlet 2519 in excess of 14 cm.

Thus, the ECR ion generator 2512 for generating ion beams forms an ion current in parallel with the electron stream, whereby it is possible to easily obtain a neutral atom current having high density by employing the ECR ion generator 2512, with no employment of other means for neutralizing the ion current. Since the ion current is formed in parallel with the electron stream, further, it is possible to obtain an ion current which is close to a parallel current having a regulated direction of progress substantially with no divergence. Since the parallel ion current is converted to the neutral atom current, the atom current is also close to a parallel current having a regulated direction of progress.

<Operation of Single-Crystalline Film Forming Apparatus>

Referring again to FIG. 221, the operation of the ECR ion generator 2512 is now described. The reflector 2522 is prepared from the reflector 2522a shown in FIGS. 222, 223A, 223B and 223C and the sample 2521 is prepared from that on which the sample upper coat to be single-crystallized is deposited/patterned as shown in FIG. 217, 219 or 216, for forming an amorphous thin film on the upper surface of the sample 2521 and thereafter single-crystallizing the same, for example. Reaction gases are supplied from the respective ones of the reaction gas supply pipes 2523a, 2523b and 2523c. At this time, inert gas of atoms having relatively small atomic weight is introduced from the inert gas inlet pipe 2517.

Due to the action of the ECR ion generator 2512, a plus ion current and an electron stream are formed downwardly from the outlet 2519. The distance between the outlet 2519 and the reflector 2522a (2522) is preferably set at a sufficient level for substantially converting the plus ion current to a neutral atom current. The reflector 2522a (2522) is set in a position receiving the downwardly directed Ne atom current. The reaction gas which is supplied from the reaction gas supply pipe 2523a is dashed against the sample 2521 by the plus ion current or the atom current. Consequently, a plasma CVD reaction progresses on the upper surface of the sample 2521, to grow a sample upper surface coat of an amorphous structure.

All this time, the sample 2521 is not heated but maintained substantially at an ordinary temperature, whereby the amorphous thin film is grown substantially under the ordinary temperature. In other words, the amorphous thin film is formed at a temperature not more than a level facilitating crystallization by plasma CVD.

A part of the downwardly directed atom current of Ne or the like is reflected by the three slopes 2535 which are formed in the reflector 2522a, to be incident upon the upper surface of the sample 2521 through the opening 2534. Another part of the atom current is not incident upon the slopes 2535 but directly incident upon the upper surface of the sample 2521 through the opening 2534. In other words, the amorphous thin film being formed on the upper surface of the sample 2521 is irradiated with four atom current components, i.e., a component straightly received from the outlet 2519 and three components reflected by the three slopes 2535. Since the angles of inclination of the slopes 2535 are set at 55°, directions of incidence of the four atom current components correspond to four directions which are perpendicular to four independent densest crystal planes of the single crystal to be formed, i.e., (111) planes.

The energy of the plasma which is formed by the ECR ion generator 2512 is so set that the atoms reaching the sample 2521 are at energy levels causing no sputtering in the amorphous thin film, i.e., levels lower than a value (=27 eV) which is known as the threshold energy level in sputtering of GaAs by irradiation with atoms. Therefore, the so-called law of Bravais acts on the as-grown amorphous thin film. Namely, molecules in the amorphous thin film are rearranged so that planes which are perpendicular to the atom current components applied to the amorphous thin film define densest crystal planes. Since the atom current as applied has four components which are incident in directions corresponding to those perpendicular to densest planes of a single-crystalline film having a single crystal orientation, the molecules are so rearranged that all planes perpendicular to the directions of incidence of the respective components define the densest planes. The directions of the (111) planes are controlled by the plurality of atom current components having directions of incidence which are independent of each other, whereby a single-crystalline film having a single crystal orientation is formed by such rearrangement of the molecules. In other words, the amorphous thin film being grown by plasma CVD is sequentially converted to a single-crystalline film having a regulated crystal orientation.

As hereinabove described, the sample 2521 is not heated and the single-crystalline film is formed under a temperature which is lower than that facilitating crystallization by plasma CVD. This is because the crystal orientation is arbitrarily directed regardless of the directions of the atom current components and cannot be controlled while a polycrystal is inevitably formed under a high temperature facilitating crystallization of molecules by plasma CVD alone with no application of the atom current.

As hereinabove described, relatively light Ne is preferably selected as an element forming the atom current which is applied to the single-crystalline film. This is because Ne atoms hardly penetrate into the single-crystalline film to remain in the same since there is a high probability that relatively heavy molecules rearwardly scatter the relatively light Ne atoms when the single-crystalline film is irradiated with the atom current. Further, the element for forming the atom current as applied is prepared from an inactive element since the inactive element forms no compound with either original molecules or as-doped impurities even if the same remains in the single-crystalline film and hardly exerts an influence on electronic/physical properties of the single-crystalline film, while the same can be easily removed to the exterior when the as-formed single-crystalline film is increased in temperature to some extent.

As hereinabove described, the reflector 2522 is preferably made of a metal, since $Ne^+$ ion beams are converted to neutral atoms when an $Ne^+$ ion current which is slightly mixed in the neutral atom current is reflected by the conductive reflector 2522, so that the sample 2521 is irradiated with the as-converted neutral atom current. The neutral atom current is advantageously incident upon the sample 2521 as a flow having a regulated direction since its direction of progress hardly diverges dissimilarly to an ion current.

In the apparatus 2510, conversion to a single crystal sequentially progresses at the same time in the process of growth of the amorphous thin film by plasma CVD. Thus, it is possible to form a single-crystalline film having a large thickness under a low temperature. Since a single-crystalline film can be formed under a low temperature, it is possible to further form a new single-crystalline film on a sample which is already provided with a prescribed device without changing properties of the device, for example.

While the aforementioned method utilizes CVD, a gel solution of a mixture of an organic compound of the component elements may be applied by a spinner, fired and irradiated with radical beams similarly to the above, when the film is prepared by a sol-gel method.

While the amorphous thin film may be formed once to be thereafter simply single-crystallized since the sample upper surface coat according to this embodiment is preferably minimized in thickness, it is possible to obtain a stable single-crystalline film having high uniformity even if its thickness is increased by forming a single-crystalline thin film in the aforementioned method and thereafter growing a single-crystalline film on the upper surface of the single-crystalline thin film serving as a seed crystal or repeating the aforementioned method a plurality of times, when a constant thickness is required for the single-crystalline film.

(Twenty-ninth Embodiment)

<Structure>

FIG. 225 is a sectional view showing a semiconductor device according to a twenty-ninth embodiment of the present invention, in which a TFT is built into a display device of an active matrix liquid crystal display. Referring to FIG. 225, numeral 2541 denotes a condensed capacitance part, numeral 2542 denotes a TFT, numeral 2543 denotes a glass substrate, numeral 2544 denotes a lower electrode of aluminum or the like for the condensed capacitance part 2541, numeral 2546 denotes a transparent upper electrode (liquid crystal back electrode) of ITO for the condensed capacitance part 2541, numeral 2547 denotes a gate of aluminum or the like for the TFT 2542, numeral 2548 denotes an Si channel for the TFT 2542, numeral 2549 denotes a source of $n^+$-type Si or the like for the TFT 2542, numeral 2551 denotes a drain of $n^+$-type Si or the like for the TFT 2542, numeral 2552 denotes a dielectric film (gate insulating film) of $SiN_x$ or $SiO_2$, and numeral 2555 denotes an electrode of Mo/Al or the like. The lower electrode 2544 for the condensed capacitance part 2541, the gate 2547, the Si channel 2548, the source 2549, the drain 2551 and the dielectric film (gate insulating film) 2552 are in single-crystalline structures.

Since the lower electrode 2544 for the condensed capacitance part 2541, the gate 2547, the Si channel 2548, the source 2549 and the drain 2551 are formed by single-crystalline films, high electron mobility is attained in an ON state of the transistor. In an OFF state of the transistor, on the other hand, it is possible to reduce a percent defective in the film since the Si channel 2548 is densely single-crystallized, thereby sufficiently preventing occurrence of a leakage current. Thus, it is possible to increase the ratio of a drain current in an ON state of the transistor to that in an OFF state as compared with a case of forming these by polycrystalline or amorphous films. Therefore, it is possible to enable a high-speed operation by increasing the ON-state current and reducing a time for charging condensed capacitance immediately after writing while simultaneously reducing the OFF-state current for reducing the standby current. Since the dielectric film (gate insulating film) 2552 is formed by a single-crystalline film, further, it is possible to attain thickness reduction (to not more than 200 nm, for example) while ensuring its withstand voltage. Thus, it is possible to increase the driving force of the transistor. Since thickness reduction can be attained, in addition, it is possible to remarkably reduce the formation area for reducing the cell areas of the condensed capacitance part 2541 and the overall TFT 2542 for improving its numerical aperture. Thus, it is possible to reduce a consumption current for employment for a portable device or a color display. In more concrete terms, electron mobility of at least 10 times can be attained as compared with a case of employing amorphous silicon, whereby ON-OFF characteristics are extremely improved.

Due to the aforementioned structure, it is possible to improve the transistor performance while simultaneously reducing the cell size.

<Fabrication Method>

The semiconductor device having the aforementioned structure is fabricated as follows: First, a thin film 2553 of aluminum or the like is formed in a thickness of about 300 to 400 nm on an upper surface of the glass substrate 2543 by sputtering or CVD, as shown in FIG. 226. This thin film 2553 is irradiated with ion beams or atomic beams of He or Ne by radical beam irradiation which is similar to that in the twenty-eighth embodiment from a plurality of directions at levels of not more than 25 eV as shown in FIG. 226, to be converted to a (111) single-crystalline structure. The current processing temperature is set at about 400° C. The single-crystalline film is patterned to form the lower electrode 2544 for the condensed capacitance part 2541 and the gate 2547 for the TFT 2542, and a polycrystalline $SiO_2$ or $SiN_x$ film of not more than 200 nm in thickness is formed by CVD, or SOG spin coating and sintering (300° to 500° C.). Thereafter ion beams or atomic beams of He or Ne are applied by radical beam irradiation which is similar to that in the twenty-eighth embodiment from a plurality of directions at levels of not more than 25 eV as shown in FIG. 227 to single-crystallize the film, thereby forming the dielectric film (gate insulating film) 2552.

Thereafter the transparent upper electrode 2546 is selectively formed by ITO on a part of the upper surface of the dielectric film (gate insulating film) 2552 located immediately above the lower electrode 2544, and a polysilicon thin film 2554 is formed on upper surfaces of the transparent upper electrode 2546 and the dielectric film (gate insulating film)102 by CVD and irradiated with ion beams or atomic beams of He or Ne by radical beam irradiation which is similar to that in is the twenty-eighth embodiment as shown in FIG. 228, to be single-crystallized. Then, the film is patterned to be left only immediately above the gate 2547 to form the Si channel 2548, and an N-type silicon layer 2556 is formed over a region slightly wider than the Si channel 2548 as shown in FIG. 229 and patterned to form the source 2549 and the drain 2551. Then, electrodes are formed on respective upper surfaces of the source 2549 and the drain 2551, to complete the semiconductor device for a liquid crystal display shown in FIG. 225.

In the aforementioned fabrication method, particularly the lower electrode 2544 for the condensed capacitance part 2541 and the gate 2547 of the TFT 2542 are single-crystallized by radical beam irradiation, whereby it is possible to eliminate nuclei defining hillocks in heat treatment for smoothing the surface. Thus, it is not necessary to form thick $Al_2O_3$ layers by anodization on the lower electrode and the gate dissimilarly to the prior art shown in FIG. 233, whereby the fabrication cost can be reduced due to reduction in number of components and omission of steps.

(Thirtieth Embodiment)

A thirtieth embodiment of the present invention is directed to a semiconductor device for liquid crystal display having a condensed capacitance part 2541 and a TFT 2542 which are similar to those of the twenty-ninth embodiment, while a part of a dielectric film 2552 is converted to a high dielectric film 2562 by PLZT, BST or the like as shown in FIG. 230, in order to reduce the area of the condensed capacitance part 2541. The high dielectric film 2562 is single-crystallized by radical beam irradiation which is similar to that in the twenty-eighth embodiment. Other structure of this embodiment is similar to that of the twenty-ninth embodiment, and hence portions having similar functions are denoted by the same reference numerals. The high dielectric film can alternatively be formed by a ferroelectric film.

According to this embodiment, it is possible to remarkably reduce the formation area of the dielectric film while stably ensuring sufficient capacitance for implementing reduction in thickness of the dielectric film, thereby reducing the cell area of the overall condensed capacitance part and improving its numerical aperture. Thus, it is possible to provide a semiconductor device having high speed performance and high numerical aperture.

(Thirty-first Embodiment)

<Method of Forming Single-Crystalline or Polycrystalline Thin Film>

A method of forming a single-crystalline or polycrystalline thin film forming a method of fabricating a liquid crystal display according to the present invention is now described.

<Basic Structure of Apparatus 2601>

FIG. 235 is a front sectional view showing an exemplary basic structure of an apparatus 2601 for forming a single-crystalline thin film. This apparatus 2601 converts an amorphous thin film, which is previously formed on a substrate 2609, to a single-crystalline thin film, thereby forming a single-crystalline thin film on the substrate 2609.

This apparatus 2601 comprises a treatment vessel 2611, and an electron cyclotron resonance (ECR) ion source 2612 which is built in an upper portion of the treatment vessel 2611. The ECR ion source 2612 comprises a plasma container 2613 which defines a plasma chamber 2614 in its interior. A magnetic coil 2615 is provided around the plasma container 2613, to apply a dc high magnetic field to the plasma chamber 2614. Further, a waveguide 2616 and an inert gas inlet pipe 2617 are provided on an upper surface of the plasma container 2613 for introducing a microwave and an inert gas such as Ne gas into the plasma chamber 2614 respectively.

The treatment vessel 2611 defines an irradiation chamber 2618 in its interior. The bottom portion of the plasma container 2613 defines an outlet 2619 for passing a plasma in its center. The irradiation chamber 2618 and the plasma chamber 2614 communicate with each other through the outlet 2619. In the interior of the irradiation chamber 2618, a sample holder 2620 is arranged on a position immediately under the outlet 2619. The substrate 2609 is placed on the sample holder 2620, while a reflector 2622 is placed to be located above the substrate 2609. The sample holder 2620 comprises a heater (not shown), to heat the substrate 2609 and hold the same at a proper high temperature level.

The irradiation chamber 2618 communicates with an evacuation pipe 2624. An end of the evacuation pipe 2624 is coupled with a vacuum unit (not shown) to evacuate the irradiation chamber 2618 through the evacuation pipe 2624, thereby maintaining the irradiation chamber 2618 at a prescribed degree of vacuum. A vacuum gauge 2625 for displaying the degree of vacuum in the irradiation chamber 2618 is provided in communication with the irradiation chamber 2618.

<Structure of Reflector>

FIG. 236 is a perspective view showing an exemplary reflector 2622a. This reflector 2622a is adapted to form a single crystal having a diamond structure, such as single-crystalline Si. The reflector 2622a defines an opening on a central portion of a flat plate type base 2631. Three blocks 2632 in the form of rectangular parallelopipeds are fixedly provided around the opening, and reflecting blocks 2633 are fixed to inner sides of the blocks 2632 respectively. Consequently, an equilateral triangular opening 2634 which is trimmed with the reflecting blocks 2633 is defined at the central portion of the base 2631. In the reflecting blocks 2633, slopes 2635 facing the opening 2634 serve as reflecting surfaces for reflecting a gas beam. Therefore, the angles of inclination of the slopes 2635 are set at proper levels in correspondence to the directions of crystal axes of the single crystal to be formed.

FIGS. 237A, 237B and 237C are a plan view, a side elevational view and a front elevational view of the reflector 2622a which is formed by the blocks 2632 and the reflecting blocks 2633 respectively. As shown in FIG. 237B, the angle of inclination of each slope 2635 is set at 55°.

<Operation of ECR Ion Source>

Referring again to FIG. 235, the operation of the ECR ion source 2612 is now described. An inert gas such as Ne or Ar is introduced from the inert gas inlet pipe 2617 into the plasma chamber 2614, while a microwave is simultaneously introduced from the waveguide 2616 into the plasma chamber 2614. Further, a dc current is also simultaneously supplied to the magnetic coil 2615, to form a dc magnetic field in the plasma chamber 2614 and its periphery. The gas as supplied is maintained in a plasma state by actions of the microwave and the dc magnetic field. This plasma is formed by high-energy electrons which are in screw motion in the principle of cyclotron by the microwave and the dc magnetic field.

These electrons, which have diamagnetic properties, are moved to a weaker magnetic field side, to form an electron stream along a line of magnetic force. Consequently, positive ions also form an ion current along the line of magnetic force following the electron stream, in order to maintain electrical neutrality. In other words, the electron stream and the ion current are downwardly directed from the outlet 2619 into the irradiation chamber 2618. The ion current and the electron stream thus flowing in parallel with each other are recombined with each other after a lapse of a deionization time, to form a neutral atom current. Therefore, substantially only a neutral atom current is formed in a position downwardly separated from the outlet 2619 beyond a prescribed distance.

Thus, the ECR ion source 2612 for generating ions forms an ion current in parallel with the electron stream, whereby it is possible to easily obtain a neutral atom current having high density by employing the ECR ion source 2612, with no employment of other means for neutralizing the ion current. Since the ion current is formed in parallel with the electron stream, further, it is possible to obtain an ion current which is close to a parallel current having a regulated direction of progress substantially with no divergence. Since the parallel ion current is converted to the neutral atom current, the atom current is also close to a parallel current having a regulated direction of progress. Therefore, no other means such as a collimator is required for correcting directivity.

<Operation of Apparatus 2601>

Referring again to FIG. 235, the basic operation of the apparatus 2601 is now described. It is assumed that the reflector 2622 is implemented by the reflector 2622a shown in FIGS. 236, 237A, 237B and 237C and the substrate 2609 is prepared from a glass substrate, so that a single-crystalline Si thin film is formed on this substrate 2609. An amorphous Si thin film is previously formed on the substrate 2609 by carrying out a well-known method such as plasma CVD (CVD: chemical vapor deposition) under a temperature which is sufficiently lower than the crystallization temperature of Si, such as a substantially normal temperature, for example.

First, a sample is mounted between the sample holder 2620 and the reflector 2622a (2622). The heater provided in the sample holder 2620 holds the sample, i.e., the substrate 2609 and the amorphous Si thin film, at a temperature of 550° C. This temperature is lower than the crystallization temperature of silicon, whereby single-crystalline Si as formed will not be deteriorated to polycrystalline Si. At the same time, the temperature is at such a high level that polycrystalline Si can be grown to single-crystalline Si if a seed crystal is present.

An inert gas which is introduced from the inert gas inlet pipe 2617 is preferably prepared from Ne gas having a smaller atomic weight than Si atoms. Due to the action of the ECR ion source 2612, an Ne$^+$ ion current and an electron stream are formed downwardly from the outlet 2619. The distance between the outlet 2619 and the reflector 2622a (2622) is preferably set at a sufficient level for substantially converting the Ne$^+$ ion current to a neutral Ne atom current. The reflector 2622a (2622) is set in a position receiving the downwardly directed Ne atom current.

A part of the downwardly directed Ne atom current is reflected by the three slopes 2635 which are formed in the reflector 2622a, to be applied to the amorphous Si thin film provided on the SiO$_2$ substrate 2609 through the opening 2634. Another part of the Ne atom current is not incident upon the slopes 2635 but directly incident upon the amorphous Si thin film through the opening 2634. In other words, the amorphous Si thin film is irradiated with four Ne atom current components, i.e., a component straightly received from the outlet 2619 and three components reflected by the three slopes 2635. Since the angles of inclination of the slopes 2635 are set at 55°, directions of incidence of the four Ne atom current components correspond to four directions which are perpendicular to four independent densest crystal planes of the Si single crystal to be formed, i.e., (111) planes.

The energy of the plasma which is formed by the ECR ion source 2612 is so set that the Ne atoms reaching the substrate 2609 are at energy levels which are lower than threshold energy (=27 eV) in sputtering of Si by irradiation with Ne atoms. Therefore, the law of Bravais acts on the amorphous Si thin film. Namely, the Si atoms in the vicinity of the surface of the amorphous Si thin film are so rearranged that planes which are perpendicular to the direction of incidence of the Ne atomic current as applied define densest crystal planes. Since the Ne atom current as applied has four components which are incident in directions corresponding to those perpendicular to four independent densest planes of the single-crystalline Si, the Si atoms are so rearranged that all planes perpendicular to the directions of incidence define the densest planes. Namely, the directions of rearrangement of the four independent (111) planes are controlled by four Ne atomic beams having directions of incidence which are independent of each other, whereby the crystal orientation is univocally decided. Thus, a layer in the vicinity of the surface of the amorphous Si thin film is converted to a single-crystalline Si layer having a regulated crystal orientation.

The temperature of the amorphous Si thin film is adjusted to 550° C., i.e., a level within a range suitable for growing a seed crystal, as hereinabove described. Therefore, the single-crystalline Si layer which is formed on the surface of the amorphous Si thin film serves as a seed crystal, to be grown toward a deep portion of the amorphous Si thin film. Then, the overall region of the amorphous Si thin film is converted to a single-crystalline Si layer. Thus, a single-crystalline Si layer having a regulated crystal orientation is formed on the substrate 2609.

<Preferable Conditions>

An element forming the atomic beams which are applied to the amorphous Si thin film is preferably prepared from Ne which is lighter than Si atoms, as hereinabove described. This is because there is a high possibility that the relatively heavy Si atoms rearwardly scatter the relatively light Ne atoms when the Ne atoms are applied to the Si thin film, whereby the Ne atoms hardly penetrate into the Si thin film to remain therein. When the thin film as irradiated is formed not by a simple substance such as Si but a compound such as GaAs, for example, it is advisable to apply atoms which are lighter than an dement having the maximum atomic weight. Further, beams of a compound such as those of $N_2$ may be applied in place of beams of simple atoms, for example. In this case, an element (for example, N atoms) forming the compound is preferably lighter than the element having the maximum atomic weight forming the thin film as irradiated.

Further, an inert element such as Ne is preferably selected as an element forming the as-applied atomic beams. This is because the inert element forms no compound with any element forming the thin film such as Si even if the same remains in the Si thin film, whereby the electronic/physical properties of the Si thin film are hardly influenced by this element and this element can be easily removed by increasing the temperature of the as-finished single-crystalline Si thin film to some extent.

The reflector 2622 is preferably made of a metal. This is because $Ne^+$ ions are converted to neutral atoms when an $Ne^+$ ion current which is slightly mixed in the neutral Ne atom current is reflected by the conductive reflector 2622, so that the substrate 2609 is irradiated with the as-converted neutral Ne atom current. The neutral atom current is advantageously incident upon the substrate 2609 as a flow having a regulated direction since its direction of progress hardly diverges dissimilarly to an ion current.

<Basic Structure and Basic Operation of Apparatus 2640>

FIG. 238 is a front sectional view showing the basic structure of another apparatus 2640 for forming a single-crystalline thin film on a substrate 2609. This apparatus 2640 forms an amorphous thin film on the substrate 2609 while simultaneously irradiating the same with beams, thereby sequentially converting the amorphous thin film as being grown to a single-crystalline thin film. In the apparatus 2640, a reaction gas supply tube 2623 communicates with an irradiation chamber 2618. Through this reaction gas supply tube 2623, a reaction gas is supplied to form a thin film of a prescribed material on the substrate 2609 by plasma CVD. In the example shown in FIG. 238, three reaction gas supply tubes 2623a, 2623b and 2623c are provided.

The apparatus 2640 operates as follows: It is assumed that the reflector 2622 is implemented by the reflector 2622a shown in FIGS. 236, 237A, 237B and 237C and the substrate 2609 is prepared from a glass substrate, so that a thin film of single-crystalline Si is formed on the substrate 2609. The reaction gas supply tubes 2623a, 2623b and 2623c supply $SiH_4$ (silane) gas for supplying Si, which is a main material for the single-crystalline Si, and $B_2H_3$ (diborane) gas and $PH_3$ (phosphine) gas for doping the substrate 2609 with p-type and n-type impurities respectively. Further, Ne gas is introduced from an inert gas inlet pipe 2617 into a plasma chamber 2614.

The silane gas which is supplied from the reaction gas supply tube 2623a is dashed against the substrate 2609 by an $Ne^+$ ion current or an Ne atom current which is formed by an ECR ion source 2612. Consequently, a plasma CVD reaction progresses on the upper surface of the substrate 2609, to grow a thin film formed by Si which is supplied by the silane gas, i.e., an Si thin film. On the other hand, the diborane gas or the phosphine gas is supplied with a properly adjusted flow rate, whereby a plasma CVD reaction caused by this gas also progresses to form the Si thin film containing B (boron) or P (phosphorus) in desired density.

The substrate 2609 is not heated and hence maintained substantially at an ordinary temperature. Therefore, the Si thin film is grown substantially under the ordinary temperature. In other words, the Si thin film is formed at a temperature not more than a level facilitating crystallization by plasma CVD. Thus, the Si thin film is first formed as an amorphous Si film by plasma CVD.

The downwardly directed Ne atom current is separated into four components by action of the reflector 2622a similarly to the case of the apparatus 2601, to be incident upon the Si thin film being formed on the upper surface of the substrate 2609. Directions of incidence of the four components of the Ne atom current correspond to four directions which are perpendicular to four independent densest crystal planes, i.e., (111) planes, of the Si single crystal to be formed. The energy of the plasma which is formed by the ECR ion source 2612 is so set that incident energy levels of these four components are lower than the threshold energy (=27 eV) for Si. Therefore, the law of Bravais acts on the amorphous Si thin film as being grown. Namely, the Si atoms in the amorphous Si are rearranged so that planes which are perpendicular to the Ne atom current of four components applied to the amorphous Si define the densest crystal planes. Consequently, single-crystalline Si having a single crystal orientation is formed. In other words, the amorphous Si thin film being grown by plasma CVD is sequentially converted to a single-crystalline Si thin film having a regulated crystal orientation.

The diborane gas or the phosphine gas is supplied by the reaction gas supply pipe 2623b or 2623c simultaneously with the silane gas, thereby forming a p-type or n-type single-crystalline Si thin film containing B or P. It is also possible to form an equiaxed n-type single-crystalline Si layer on a p-type single-crystalline Si layer, for example, by alternately supplying these reaction gases containing impurity elements.

As hereinabove described, the substrate 2609 is not heated and the Si thin film is formed under a temperature which is lower than that facilitating crystallization by plasma CVD. This is because the crystal orientation is arbitrarily directed regardless of the directions of the Ne atom current components and cannot be controlled while a polycrystal is inevitably formed under a high temperature facilitating crystallization of Si by plasma CVD alone with no application of the Ne atom current components.

In the apparatus 2640, conversion to a single crystal sequentially progresses at the same time in the process of growth of the Si thin film by plasma CVD. Thus, it is possible to form a single-crystalline Si thin film having a large thickness under a lower temperature than the apparatus 2601.

<Other Examples of Single-Crystalline Thin Film Formation>

It is also possible to form a single-crystalline thin film having a crystal structure other than a diamond structure. In this case, still another reflector may be prepared to have a crystal structure which is suitable for the target crystal structure. Further, it is also possible to form a single-crystalline thin film having various crystal orientations in the same crystal structure. In this case, a reflector which is suitable for respective crystal orientations is prepared, as hereinafter described.

In each of the apparatuses 2640 and 2601, it is possible to form not only the aforementioned Si single-crystalline thin film but various types of single-crystalline thin films on substrates such as compound single-crystalline thin films of GaAs, GaN and the like and a single-crystalline thin film of an insulator such as $SiO_2$, for example.

In order to form a single-crystalline thin film of GaN, for example, $N_2$ (nitrogen) gas or $NH_3$ (ammonia) gas containing N atoms may be introduced into the inert gas inlet pipe 2617 of the apparatus 2601 or 2640, to apply a molecular flow of the gas or a dissociated N atom current, for example. The as-applied N atoms which may remain in the interior of GaN are incorporated into the single crystal as an element forming GaN, and hence there is no possibility of exerting a bad influence on the properties of GaN. In order to form a GaAs single-crystalline thin film, on the other hand, the apparatus 2601 or 2640 may be employed, the irradiated gas may be prepared from low-priced Ar gas, and the reflector may be prepared from a Ta plate, while the substrate temperature may be maintained at 500° C. when the apparatus 2601 is employed, and other conditions may be identical to those for forming an Si single-crystalline thin film.

<Method of Forming Polycrystalline Thin Film>

While a method of forming a single-crystalline thin film has been described, it is possible to form a polycrystalline Si thin film by irradiating an amorphous Si thin film with a gas beam from only one direction. This also applies to a thin film of a material, such as GaAs, for example, other than Si. In order to carry out this method, either the apparatus 2601 or 102 from which the reflector 2622 is removed may be employed to irradiate the substrate 2609 with an atom current from one direction. Exemplary formation of a polycrystalline Si thin film on the substrate 2609 is now described.

When the apparatus 2601 is employed, plasma CVD is carried out under a temperature which is sufficiently lower than the crystallization temperature of Si, such as a substantially ordinary temperature, for example, to previously form an amorphous Si thin film on the substrate 2609. Then, the apparatus 2601 from which the reflector 2622 is removed is employed to apply an Ne atom current from one direction. It is possible to irradiate the substrate 2609 with the Ne atom current from a direction perpendicular thereto, by horizontally placing the substrate 2609 on the sample holder 2620, for example. Due to irradiation with the Ne atom current, a portion of the amorphous Si thin film provided on the substrate 2609 which is close to its surface is converted to a polycrystalline layer. Namely, the law of Bravais acts on the amorphous Si thin film by irradiation with the Ne atom current, to form a polycrystalline layer which is formed by aggregation of such crystal grains that one densest crystal plane is orientated in a direction perpendicular to that of incidence of the Ne atom current while other densest planes are in arbitrary directions.

The temperature of the amorphous Si thin film is adjusted at 500° C., i.e., in a range suitable for growing a seed crystal, by action of the heater provided in the sample holder 2620. Thus, the polycrystalline Si layer which is formed on the surface of the amorphous Si thin film serves as a seed crystal, so that the polycrystalline Si layer is grown toward a deep portion of the amorphous Si thin film. Then, the overall region of the amorphous Si thin film is converted to a polycrystalline Si layer. Thus, a polycrystalline Si layer is formed on the substrate 2609.

When the apparatus 2640 is employed, on the other hand, an amorphous Si thin film is grown by supplying a reaction gas onto the substrate 2609 which is placed on the sample holder 2620 without heating the substrate 2609 while an Ne atom current is simultaneously applied from one direction without employing the reflector 2622. Consequently, the amorphous Si thin film as being grown is sequentially converted to a polycrystalline Si thin film by action of the law of Bravais. This polycrystalline thin film is formed by aggregation of such crystal grains that one densest crystal plane is orientated in a direction perpendicular to that of incidence of the Ne atom current while other densest planes are in arbitrary directions.

As hereinabove described, the substrate 2609 is not heated to a temperature exceeding 550° C., which is necessary for growing a seed crystal of Si, in the method employing the apparatus 2601, whether a single-crystalline Si thin film or a polycrystalline Si thin film is prepared. In the method employing the apparatus 2640, on the other hand, the substrate 2609 is not heated but maintained substantially at an ordinary temperature. Namely, it is possible to form single-crystalline and polycrystalline thin films under low temperatures according to these methods employing irradiation with atom currents. This enables employment of a low-priced glass substrate having a low withstand temperature in place of the substrate 2609, for example. This also applies to a case of forming a single-crystalline or polycrystalline thin film of another material other than Si.

<B. Embodiments Related to Liquid Crystal Display and Method of Fabricating the Same>

Embodiments which are related to a liquid crystal display and a method of fabricating the liquid crystal display employing the aforementioned method are now described.

(Thirty-second Embodiment)

First, a liquid crystal display and a fabrication method according to a thirty-second embodiment are now described.

<Structure and Operation of Unit>

FIG. 239 is a perspective view showing the overall structure of a liquid crystal display according to the thirty-second embodiment of the present invention. Portions identical to those of the conventional unit shown in FIG. 267 (prior art 25) are denoted by the same reference numerals, to omit redundant description. In this unit, TFTs 3854, pixel electrodes 2642 of liquid crystal elements, signal lines 3851 and scanning lines 3852 are formed on a transparent glass substrate 2641. The TFTs 3854 and the pixel electrodes 2642 are provided for the respective pixels, and arranged in the form of a matrix. A common electrode 264 is arranged above the glass substrate 2641. Namely, this unit is an active matrix liquid crystal display. A portion between the glass substrate 2641 and the common electrode 2647 is filled up with a liquid crystal layer 2645. A polarizing plate 2643 is provided under the glass substrate 2641, while a color filter 2649, a glass plate 2651 and another polarizing plate 2655 are successively provided above the common electrode 2647. In the color filter 2649, filters corresponding to three original colors of red (R), green (G) and blue (B) are arranged oppositely to the pixel electrodes 2642.

This unit operates as follows: White light 2653 is upwardly applied from below the polarizing plate 2643. This white light 2653 successively passes through the elements between the polarizing plates 2643 and 2655. A plane of polarization of the white light 2653 passing through the polarizing plate 2643 is rotated when the white light 2653 passes through the liquid crystal layer 2645. The polarized light as rotated is converted to red, green or blue light by passage through the color filter 2649.

When an image signal is inputted in each pixel electrode 2642 by operation of each TFT 3854, a voltage responsive thereto is applied across the pixel electrode 2642 and the common electrode 2647, i.e., between upper and lower surfaces of the liquid crystal layer 2645 in relation to each pixel. The rotation of the plane of polarization is changed in response to the voltage which is applied to the liquid crystal 2645 in passage through the liquid crystal layer 2645. Angles of polarization defined by the two polarizing plates 2643 and 2655 are at constant angles with each other, whereby intensity of the light passing through the polarizing plate 2655 is varied with the amount of rotation of the plane of polarization in passage through the liquid crystal layer 2645. Consequently, three original colors modulated in intensity in response to the image signal appear from the upper surface of the polarizing plate 2655.

<Structure of TFT>

FIGS. 240 and 241 are a front sectional view and a plan view showing the unit according to the thirty-second embodiment. FIG. 240 is a sectional view taken along the line A—A in FIG. 241, showing a portion around each TFT 3854 in an enlarged manner. As shown in FIG. 240, each TFT 3854 formed on the glass substrate 2641, which is an n-channel MOS field-effect transistor, for example, has two gate electrodes 2663 and 2664. Its active layer 2661 is formed on the glass substrate 2641, so that the two gate electrodes 2663 and 2664 are opposed to the active layer 2661 through an insulating film 2665. Namely, this transistor has the so-called dual gate structure. The transistor of the dual gate structure has such an advantage that a breaking current is small due to relaxation of an electric field which is applied to an end portion of a drain.

The active layer 2661 is made of single-crystalline or polycrystalline Si having carrier mobility exceeding 10 $cm^2/(V.sec.)$. Two channel regions 2661d and 2661e of the active layer 2661 which are opposed to the gate electrodes 2663 and 2664 are p-type Si regions, while a source region 2661a, a drain region 2661b, and a relay region 2661c which is held between the two channel regions 2661d and 2661e are n-type Si regions. The source region 2661a is connected with a source electrode 2671, which is connected to the signal line 3851. On the other hand, the drain region 2661b is connected with the pixel electrode 2642. Namely, the circuit structure of this unit is identical to that shown in the circuit diagram of FIG. 267, except that no holding capacitance 3855 is provided. Also in this unit, the holding capacitance 3855 may be connected in parallel with the liquid crystal element 3853. The liquid crystal element 3853 is formed by the pixel electrode 2642, the common electrode 2647 and the liquid crystal layer 2645 filled up therebetween.

The glass substrate 2641, the active layer 2663 and the gate electrodes 2663 and 2664 are covered with a protective $SiO_2$ insulating film 2667 which is adapted to protect these portions. The source electrode 2671 and the pixel electrode 2642 are connected with the active layer 2661 through an opening which is defined in the $SiO_2$ insulating film 2667. The pixel electrode 2642 is not directly formed on the glass substrate 2641, but formed through the $SiO_2$ insulating film 2667.

The glass substrate 2641 is prepared from low-priced glass having a withstand temperature of not more than 600° C., preferably from glass known as #7059 by *. This glass, which has been developed for a thin-film circuit, has a distortion point of 590° C., and its expansion coefficient is coincided with that of silicon, to be adaptive up to about 500° C. This glass is extremely low-priced as compared with $SiO_2$ (quartz) glass.

In this unit, the active layer 2661 of each TFT 3854 is made of single-crystalline or polycrystalline Si having high carrier mobility, whereby a high-quality image can be displayed. Further, the glass substrate 2641 is prepared from low-priced glass having a withstand temperature of not more than 600° C., whereby the fabrication cost is reduced. Namely, the unit according to this embodiment compatibly implements high picture quality and a low cost.

<Method of Fabricating Unit>

FIGS. 242 to 253 are process drawings showing an exemplary method of fabricating the liquid crystal display according to the thirty-second embodiment. In order to fabricate the unit according to this embodiment, a transparent glass substrate 2641 is first prepared as shown in FIG. 242. This glass substrate 2641 is prepared from the aforementioned #7059, for example.

Then, plasma CVD, for example, is executed to form a p-type amorphous Si thin film 2681 on the glass substrate 2641, as shown in FIG. 243. The plasma CVD is executed under a reaction temperature of 300° to 450° C., for example, utilizing $SiH_4$ (silane) gas and a small amount of $B_2H_3$ (diborane) gas as reaction gases. This reaction temperature is within a range of withstand temperatures of #7059.

Then, the apparatus 2640 is employed to irradiate an upper surface of the amorphous Si thin film 2681 with a gas beam 2683 of Ne, as shown in FIG. 244. At this time, the temperature of the sample is maintained at 550° C. This temperature is also within the range of withstand temperatures of #7059. Due to the irradiation with the gas beam 2683, the amorphous Si thin film 2681 is converted to a crystalline Si thin film 2685. The gas beam 2683 may be applied from only one direction, or a plurality of directions through the reflector 2622. The Si thin film 2685 becomes single-crystalline in the former case, while the same becomes polycrystalline in the latter case. The apparatus 2601 may be employed to finally form the crystalline Si thin film 2685 by applying the gas beam 2683 while forming the amorphous thin film 2681, in place of forming the crystalline Si thin film 2685 through the apparatus 2640 after completely forming the amorphous Si thin film. In other words, the steps shown in FIGS. 243 and 244 may be carried out at the same time.

Then, the crystalline Si thin film 2685 is selectively removed, thereby forming a crystalline Si thin film 2687 corresponding to the active layer 2661 of the TFT 3854, as shown in FIG. 245. The crystalline Si thin film 2685 is selectively removed by selectively carrying out etching through a screen of a resist mark which is formed by photolithography. The technique of such selective etching is well known in the art, and hence no detail of this etching is shown in FIG. 245.

Then, an insulating film 2689 is formed on an upper surface of the crystalline Si thin film 2687, as shown in FIG. 246. This insulating film 2689 is implemented by forming an oxide ($SiO_2$) or a nitride ($Si_3N_4$) on the upper surface of the crystalline Si thin film 2687 by plasma CVD, for example. Alternatively, TaOx (tantalum oxide) may be formed by anodization.

Then, a single-crystalline or polycrystalline Si thin film 2691 is formed on the overall upper surface of the sample, as shown in FIG. 247. Formation of this crystalline Si thin film 2681 is implemented through a step which is similar to that for forming the crystalline Si thin film 2685. Namely, simultaneously with or after formation of an amorphous Si thin film on the overall upper surface of the sample through plasma CVD, for example, application of a gas beam is carried out to convert the amorphous Si thin film to a polycrystalline or single-crystalline Si thin film, thereby forming the crystalline Si thin film 2691. Thereafter P (phosphorus) of high concentration is injected into the overall surface of the crystalline Si thin film 2691. A film of a metal having a high melting point such as Ti (titanium) may be formed on the crystalline Si thin film 2691, so that a silicide film is thereafter formed on the upper surface of the crystalline Si thin film 2691 by lamp annealing described later etc.

Then, both of the crystalline Si thin film 2691 and the insulating film 2689 are selectively removed, thereby forming gate electrodes 2663 and 2664 and a gate insulating film 2665 respectively, as shown in FIG. 248. Namely, the gate electrodes 2643 and 2664 are electrically insulated from the crystalline Si thin film 2687 by the gate insulating film 2665.

The crystalline Si thin film 2691 and the insulating film 2689 are selectively removed by selectively carrying out etching through a screen of a resist mask (screen film) which is formed by photolithography. If the crystalline Si thin film 2691 is single-crystalline, in particular, no irregular reflection is caused by crystal grains of the crystalline Si thin film 2691 when resist which is applied onto the crystalline Si thin film 2691 is exposed, whereby a resist mask having prescribed patterns corresponding to the gate electrodes 2663 and 2664 can be easily formed. Also when etching is carried out, control of the etching is easy to make since no heterogeneous progress of etching is caused by crystal grains. Further, the aforementioned silicide film can be homogeneously formed on the crystalline Si thin film 2691. Consequently, the fabrication steps are simplified while homogeneity and reliability are improved in quality of the unit as fabricated.

Then, an n-type impurity such as P (phosphorus) is injected from the upper surface of the sample, as shown in FIG. 249. At this time, the gate electrodes 2663 and 2664 and the gate insulating film 2665 serve as screens, to selectively introduce the impurity. A source region 2661a, a drain region 2661b and a relay region 2661c are formed as the result, thereby completing an active layer 2661 from the crystalline Si thin film 2687. Formation of the source region 2661a, the drain region 2661b and the relay region 2661c requires no redundant design, since these regions are formed through a self-alignment technique.

Then, an $SiO_2$ insulating film 2695 is formed on the overall upper surface of the sample, as shown in FIG. 250. Formation of this $SiO_2$ film 2695 is carried out through plasma CVD, not to heat the glass substrate 2641 in excess of its withstand temperature. Thereafter the sample is annealed under a high temperature which is in a range lower than 600° C. not to melt the glass substrate 2641, thereby densifying the $SiO_2$ insulating film 2695. The $SiO_2$ insulating film 2695 is densified by this treatment. At the same time, the impurity introduced into the gate electrodes 2663 and 2664, the source region 2661a, the drain region 2661b and the relay region 2661c is activated by the annealing of the sample. The annealing can be carried out through the so-called lamp annealing. Namely, strong infrared rays may be instantaneously applied from the upper surface of the sample, to execute the annealing under a high temperature exceeding 600° C. in a short time causing no melting of the glass substrate 2641. The $SiO_2$ film 2695 is densified and the impurity is activated in the gate electrodes 2663 and 2664 etc. also by this means.

Then, openings 2697 and 2699 are formed in the $SiO_2$ insulating film 2695 in prescribed portions above the source region 2661a and the drain region 2661b, as shown in FIG. 251. Thus, an $SiO_2$ insulating film 2667 (FIG. 240) is completed from the $SiO_2$ insulating film 2695. Formation of the openings 2697 and 2699 is executed by selectively etching the $SiO_2$ insulating film 2695 through a screen of a resist mask which is formed by photolithography.

Then, a source electrode 2671 and a pixel electrode 2642 having prescribed patterns are arranged on the $SiO_2$ insulating film 2667, as shown in FIG. 252. The source electrode 2671 is connected with the source region 2661a through the opening 2697, while the pixel electrode 2642 is connected with the drain electrode 2661b through the opening 2699. A signal line 3851 and a scanning line 3852 are also arranged simultaneously with the source electrode 2671 and the pixel electrode 2642. These electrodes and lines are arranged by applying a wiring material such as aluminum, for example, onto the overall surface of the sample and thereafter selectively etching the wiring material through a screen of a resist mask which is formed by photolithography. At least a wiring material for the pixel electrode 2642 is preferably prepared from ITO (iridium tin oxide) in place of aluminum.

Then, an upper plate member 2701 which is formed by superposing a common electrode 2647, a color filter 2649 and a glass plate 2651 is arranged above the sample, and a liquid crystal layer 2645 is filled up between the upper plate member 2701 and the sample as shown in FIG. 253. Thereafter a polarizing plate 2643 is arranged under the glass substrate 2641 while a polarizing plate 2655 is arranged above the upper plate member 2701, to complete the liquid crystal display shown in FIG. 239.

In the active layer 2661 of the TFT 3854 which is formed through the aforementioned steps, carrier mobility sufficiently exceeds 10 $cm^2/(V.sec.)$. This guarantees the unit to display a high-quality image. Further, the glass substrate 2641 can be prepared from low-priced glass in the aforementioned steps, since the maximum process temperature is not more than 600° C. Namely, it is possible to fabricate a unit displaying a high-quality image at a low cost in the fabrication method according to this embodiment. In the fabrication method according to this embodiment, further, the source region 2661a is formed in a self-alignment manner by preparing the gate electrodes 2663 and 2664 from crystalline Si, whereby a fine TFT 3854 can be implemented. This enables implementation of a unit displaying an image of higher definition.

When the active layer 2661 is single-crystalline, carrier mobility in this active layer 2661 is higher as compared with that in a polycrystalline layer. Thus, a unit having a single-crystalline active layer 2661 can display an image of higher quality. Namely, it is possible to fabricate a transmission-type liquid crystal display comprising the active layer 2661 which is single-crystalline for guaranteeing high picture quality in the form of a thin film at a low cost in the fabrication method according to this embodiment. When the gate electrodes 2663 and 2664 are single-crystalline, further, carrier mobility in these gate electrodes 2663 and 2664 is higher as compared with that in polycrystalline electrodes, whereby propagation delay of a control signal is small.

(Thirty-third Embodiment)

A liquid crystal display according to a thirty-third embodiment of the present invention is now described.

<Structure and Operation of Unit>

FIG. 254 is a component arrangement diagram showing the structure of the liquid crystal display according to the thirty-third embodiment of the present invention. In this unit, a pixel array 2711 which is formed by arranging TFTs 3854 and liquid crystal elements 3853 in the form of a matrix, and a driving circuit 2713 arranged on its periphery for driving the TFTs 3854 are formed on a single glass substrate 2641. The glass substrate 2641 is prepared from low-priced glass having a withstand temperature of not more than 600° C., preferably #7049, similarly to the unit according to the thirty-second embodiment. The structure of the pixel array 2711 is similar to that in the unit according to the thirty-second embodiment, and hence redundant description is omitted.

The driving circuit 2713 includes Y-drivers 2721, X-drivers 2723 and sample-and-hold circuits 2725. The Y-drivers 2721 transmit high-level voltage signals to a number of scanning lines 3852 in prescribed order in synchronization with periodically rising clock pulse signals Y-CLK. The sample-and-hold circuits 2725 are provided with sample-and-hold elements (not shown) corresponding to respective ones of a number of signal lines 3851. These sample-and-hold elements sample and simultaneously hold picture signals VS in response to selection signals which are transmitted from the X-drivers 2723. The picture signals VS as held are transmitted to the signal lines 3851.

The X-drivers 2723 transmit the selection signals to the sample-and-hold elements which are arranged in the sample-and-hold circuits 2725 in prescribed order in synchronization with periodically rising clock pulse signals X-CLK. The X-drivers 2723 completely select all signal lines 3851 during one cycle of the clock pulse signals Y-CLK.

As hereinabove described, the driving circuit 2713 for inputting the picture signals VS in the liquid crystal elements 3853 by successively driving the TFTs 3854 is formed on the glass substrate 2641 with the pixel array 2711, whereby it is possible to display an image without providing the driving circuit 2713 in the exterior. Namely, it is possible to compactly and easily use the unit at a low cost.

The Y-drivers 2721, the X-drivers 2723 and the sample-and-hold circuits 2725 are formed by TFTs having crystalline active layers. FIG. 255 is a sectional view showing such a state that one of the TFTs forming these circuits and each TFT 3854 are formed on the single glass substrate 2641. A TFT 2731 forming the driving circuit 2713 has a structure of a CMOS field-effect transistor, which is formed by complementarily coupling an n-channel MOS TFT 2733 and a p-channel MOS TFT 2735 with each other. On the other hand, the TFT 3854 is identical in structure to the TFT 3854 in the thirty-second embodiment, and hence redundant description is omitted.

In the TFT 2733, an active layer 2741 is formed on the glass substrate 2641, and a gate electrode 2743 is opposed to this active layer 2741 through a gate insulating film 2745. The active layer 2741 is made of the same crystalline Si as that forming the active layer 2661 of the TFT 3854. A channel region 2741c of the active layer 2741 which is opposed to the gate electrode 2743 is a p-type Si region, while both of source and drain regions 2741a and 2741b are n-type Si regions. A source electrode 2751 is connected to the source region 2661a, while a drain electrode 2752 is connected to the drain region 2741b.

The other TFT 2735 is similar in structure to the TFT 2733, except that the same is inverted in conductivity type. In this TFT 2735, an active layer 2761 is formed on the glass substrate 2641, and a gate electrode 2763 is opposed to this active layer 2761 through a gate insulating film 2765. The active layer 2761 is made of the same crystalline Si as that forming the active layer 2661. A channel region 2761c of the active layer 2741 which is opposed to the gate electrode 2763 is an n-type Si region, while both of drain and source regions 2761a and 2761b are p-type Si regions. A drain electrode 2771 is connected to the drain region 2761a, while a source electrode 2772 is connected to the source region 2761b. The drain electrodes 2752 and 2771 are connected with each other, while the gate electrodes 2743 and 2763 are also connected with each other (not shown). Namely, these two TFTs 2733 and 2735 are complementarily coupled with each other. When the TFT 2731 is a circuit element of a final stage forming the Y-driver 2721, for example, the drain electrodes 2752 and 2771 are connected to the gate electrodes 2663 and 2664 of the TFT 3854 through the scanning line 3852.

The SiO$_2$ insulating film 2667 covers not only the TFT 3854 but the active layers 2741 and 2761 and the gate electrodes 2743 and 2763, thereby protecting the same. The source electrodes 2751 and 2752 and the drain electrodes 2752 and 2771 are connected with the active layers 2741 and 2761 respectively through openings formed in the SiO$_2$ insulating layer 2667.

As hereinabove described, the TFTs 2733 and 2735 forming the driving circuit 2713 for driving the TFTs 3854 have MOS field-effect transistor structures similarly to the TFTs 3854, while the active layers thereof are identically crystalline in the unit according to this embodiment. Therefore, common steps can be applied to fabricate these TFTs 3854, 2733 and 2735, whereby the unit is easy to fabricate.

Also in this unit, it is possible to display a high-quality image since the active layer 2661 of each TFT 3854 is made of single-crystalline or polycrystalline Si similarly to the unit according to the thirty-second embodiment. Further, the fabrication cost is reduced since the glass substrate 2641 is prepared from low-priced glass having a withstand temperature of not more than 600° C. Namely, the unit according to this embodiment simultaneously implements compactness, easiness in handling, easiness in fabrication, high picture quality and a low cost.

<Method of Fabricating Unit>

FIGS. 256 to 265 are process drawings showing a method of fabricating the unit shown in FIG. 255. In order to fabricate this unit, a transparent glass substrate 2641 is first prepared, as shown in FIG. 242. The glass substrate 2641 is prepared from the aforementioned #7049, for example. Then, plasma CVD, for example, is executed to form a p-type amorphous Si thin film 2681 on the glass substrate 2641, as shown in FIG. 243. The plasma CVD is executed under a reaction temperature of 300° to 450° C., for example, utilizing $SiH_4$ (silane) gas and a small amount of $B_2H_3$ (diborane) gas as reaction gases. This reaction temperature is within a range of withstand temperatures of #7059.

Then, the apparatus 2640 is employed to irradiate an upper surface of the amorphous Si thin film 2681 with a gas beam 2683 of Ne, as shown in FIG. 256. At this time, the temperature of the sample is maintained at 550° C. This temperature is also within the range of withstand temperatures of #7059. Due to the irradiation with the gas beam 2683, the amorphous Si thin film 2681 is converted to a crystalline Si thin film 2685. The gas beam 2683 may be applied from only one direction, or a plurality of directions through the reflector 2622. The Si thin film 2685 becomes singe-crystalline in the former case, while the same becomes polycrystalline in the latter case. The apparatus 2601 may be employed to finally form the crystalline Si thin film 2685 by applying the gas beam 2683 while forming the amorphous thin film 2681, in pace of forming the crystalline Si thin film 2685 through the apparatus 2640 after completely forming the amorphous Si thin film. In other words, the steps shown in FIGS. 243 and 256 may be carried out at the same time.

Then, the crystalline Si thin film 2685 is selectively removed, to form a crystalline Si thin film 2687 corresponding to the active layer 2661 of the TFT 3854, a crystalline Si thin film 2781 corresponding to the active layer 2741 of the TFT 2733, and a crystalline Si thin film 2783 corresponding to the active layer 2761 of the TFT 2735, as shown in FIG. 257. The crystalline Si thin film 2685 is selectively removed by selectively carrying out etching through a screen of a resist mask which is formed by photolithography. Namely, these crystalline Si thin films 2687, 2781 and 2783 are simultaneously formed through a single resist mask.

Thereafter a resist mask 2785 is selectively formed on upper surfaces of the crystalline Si thin films 2687 and 2781 by photolithography while leaving the crystalline Si thin film 2783, as also shown in FIG. 257. This resist mask 2785 is employed as a screen, to inject an n-type impurity such as P (phosphorus), for example. Through this step, the p-type crystalline Si thin film 2783 is converted to n-type crystalline Si.

Then, insulating films 2689, 2787 and 2789 are formed on upper surfaces of the crystalline Si thin films 2687, 2781 and 2783 respectively, as shown in FIG. 258. These insulating films 2689, 2787 and 2789 are easily implemented by forming oxide ($SiO_2$) films or nitride ($Si_3N_4$) films on the upper surfaces of the crystalline Si thin films 2687, 2781 and 2783 by plasma CVD, for example. Alternatively, TaOx (tantalum oxide) may be formed by anodization.

Then, a single-crystalline or polycrystalline Si thin film 2691 is formed on the overall upper surface of the sample, as shown in FIG. 259. Formation of this crystalline Si thin film 2681 is implemented through a step which is similar to that for forming the crystalline Si thin film 2685. Namely, simultaneously with or after formation of an amorphous Si thin film on the overall upper surface of the sample by plasma CVD, for example, application of a gas beam is carried out to convert the amorphous Si thin film to a polycrystalline or single-crystalline Si thin film, thereby forming the crystalline Si thin film 2691. Thereafter P (phosphorus) of high concentration is injected into the overall surface of the crystalline Si thin film 2691.

A film of a metal having a high melting point such as Ti (titanium) may be formed on the crystalline Si thin film 2691, so that a silicide film is thereafter formed on the upper surface of the crystalline Si thin film 2691 by lamp annealing or the like.

Then, the crystalline Si thin film 2691 is selectively removed with the insulating films 2689, 2787 and 2789, thereby forming gate electrodes 2663, 2664, 2743 and 2763 and gate insulating films 2665, 2745 and 2765 respectively, as shown in FIG. 260. Namely, the gate electrodes 2663 and 2664 are electrically insulated from the crystalline Si thin film 2687 by the gate insulating film 2665, while the gate electrode 2743 and the crystalline Si thin film 2781, and the gate electrode 2763 and the crystalline Si thin film 2783 are electrically insulated from each other by the gate insulating films 2745 and 2765 respectively.

The crystalline Si thin film 2691 and the insulating films 2689, 2787 and 2789 are selectively removed by selectively carrying out etching through a screen of a resist mask (screen film) which is formed by photolithography. When the crystalline Si thin film 2691 is single-crystalline in particular, the resist mask can be easily formed and control of the etching is easy to make similarly to the thirty-second embodiment. Further, the aforementioned silicide film can be homogeneously formed on the crystalline Si thin film 2691. Consequently, the fabrication steps are simplified while homogeneity and reliability are improved in quality of the unit as fabricated.

Then, a resist mask 2791 is formed to selectively cover the crystalline Si thin film 2783, as shown in FIG. 261. Thereafter an n-type impurity such as P (phosphorus) is injected from the upper surface of the sample. At this time, the gate electrodes 2663, 2664 and 2743 and the gate insulating films 2665 and 2745 serve as screens in addition to the resist mask 2791, whereby the impurity is selectively introduced. Consequently, a source region 2661a, a drain region 2661b and a relay region 2661c are formed to complete an active layer 2661 from the crystalline Si thin film 2687. Similarly, a source region 2741a and a drain region 2741b are formed, to complete an active layer 2741 from the crystalline Si thin film 2781. Thereafter the resist mask 2791 is removed. Formation of the source region 2661a, the drain region 2661b, the relay region 2661c, the source region 2741a and the drain region 2741b requires no redundant design, since these regions are formed through a self-alignment technique.

Then, a resist mask 2793 is formed to selectively cover the active layers 2661 and 2741, as shown in FIG. 262. Thereafter a p-type impurity such as B (boron) is injected from the upper surface of the sample. At this time, the gate electrode 2763 and the gate insulating film 2765 serve as screens in addition to the resist mask 2793, whereby the impurity is selectively introduced. Consequently, a drain region 2761a and a source region 2761b are so formed that an active layer 2761 is completed from the crystalline Si thin film 2783. Thereafter the resist mask 2793 is removed. Formation of the drain region 2761a and the source region 2761b also requires no redundant design, since these regions are also formed through a self-alignment technique.

Then, an SiO₂ insulating film 2695 is formed on the overall upper surface of the sample, as shown in FIG. 263. This SiO₂ insulating film 2695 is formed by plasma CVD, for example, not to heat the glass substrate 2641 in excess of its withstand temperature. Thereafter the sample is annealed under a high temperature which is in a range lower than 600° C. not to melt the glass substrate 2641, thereby densifying the SiO₂ insulating film 2695. The SiO₂ insulating film 2695 is densified by this treatment. At the same time, the impurities introduced into the gate electrodes 2663, 2664, 2743 and 2763, the source regions 2661a, 2741a and 2761b, the drains region 2661b, 2741b and 2761a and the relay region 2661c are activated by the annealing of the sample. The annealing can be carried out through the so-called lamp annealing. Namely, strong infrared rays may be instantaneously applied from the upper surface of the sample, to execute the annealing under a high temperature exceeding 600° C. in a short time causing no melting of the glass substrate 2641. The SiO₂ insulating film 2695 is densified and the impurity is activated in the gate electrodes 2663 and 2664 etc. also by this means.

Then, openings 2697 and 2699 are formed in the SiO₂ insulating film 2695 in prescribed portions above the source region 2661a and the drain region 2661b, as shown in FIG. 264. At the same time, openings 2795, 2801, 2797 and 2799 are formed in prescribed portions above the source regions 2741a and 2761 b and the drain regions 2741b and 2761a respectively. Thus, an SiO₂ insulating film 2667 (FIG. 255) is completed from the SiO₂ insulating film 2695. The openings 2697, 2699, 2795, 2801, 2797 and 2799 are simultaneously formed by selectively etching the SiO₂ insulating film 2695 through a screen of a resist mask which is formed by photolithography.

Then, source electrodes 2671, 2751 and 2772, drain electrodes 2752 and 2771 and a pixel electrode 2642 having prescribed patterns are arranged on the SiO₂ insulating film 2667, as shown in FIG. 265. The source electrodes 2671, 2751 and 2772 are connected with the source electrodes 2661a, 2741a and 2761b through the openings 2697, 2795 and 2801 respectively, while the pixel electrode 2642 and the drain electrodes 2741b and 276a are connected with the drain electrodes 2661b, 2741b and 2761b through the openings 2699, 2797 and 2799 respectively. A line 3851 and a scanning line 3852 are also arranged simultaneously with the arrangement of these electrodes. These electrodes and wires are arranged by applying a wiring material such as aluminum, for example, onto the overall surface of the sample and thereafter selectively etching the wiring material through a screen of a resist mask which is formed by photolithography. At least a wiring material for the pixel electrode 2642 is preferably prepared from ITO (iridium tin oxide) in place of aluminum.

Then, an upper plate member 2701 which is formed by superposing a common electrode 2647, a color filter 2649 and a glass plate 2651 is arranged above the sample, and a liquid crystal layer 2645 is filled up between the upper plate member 2701 and the sample, as shown in FIG. 266. Thereafter a polarizing plate 2643 is arranged under the glass substrate 2641 while a polarizing plate 2655 is arranged above the upper plate member 2701, to complete the liquid crystal display shown in FIG. 255.

In the active layer 2661 of the TFT 3854 formed through the aforementioned steps, carrier mobility sufficiently exceeds 10 cm²/(V.sec.). This also applies to the active layers 2741 and 2761 of the TFTs 2733 and 2735. Further, the glass substrate 2641 can be prepared from low-priced glass in the aforementioned steps, since the maximum process temperature is not more than 600° C. In the fabrication method according to this embodiment, the respective members of the TFTs 3854, 2733 and 2735 are simultaneously formed through common steps, whereby a unit comprising the driving circuit 2713 is efficiently fabricated. In the fabrication method according to this embodiment, further, the source region 2661a etc. are formed in a self-alignment manner by preparing the gate electrodes 2663, 2664, 2743 and 2763 from crystalline Si, whereby fine TFTs 3854, 2733 and 2735 can be implemented.

(Thirty-Fourth Embodiment)

<Structure>

FIG. 268 shows a semiconductor device according to a thirty-fourth embodiment of the present invention. The semiconductor device according to this embodiment comprises an Si substrate and a MOS transistor which is formed thereon. Referring to FIG. 268, numeral 2851 denotes the Si substrate, numeral 2852 denotes an oxide insulating film, numeral 2853 denotes a channel, numeral 2854 denotes an oxidized gate insulating film, numeral 2855 denotes a gate, numeral 2856 denotes a source, numeral 2857 denotes a drain, numeral 2858 denotes an insulating film, and numeral 2859 denotes an interconnection film. The channel 2853 is made of single-crystalline silicon.

<Fabrication Method>

The semiconductor device having the aforementioned structure is fabricated as follows: As shown in FIG. 269, the oxide insulating film 2852 is formed on the SI substrate 2851 by a heat treatment or the like. Then, a thin film 2860 of polycrystalline silicon is grown on an upper surface of the oxide insulating film 2852 by CVD or the like, as shown in FIG. 270. Thereafter the polycrystalline silicon thin film 2860 is single-crystallized by radical beam irradiation as described later, to form a single-crystalline film for defining the channel 2853, as shown in FIG. 271. Thereafter the gate oxide film 2854 is deposited by CVD or the like, or the single-crystalline film 2853 is thermally oxidized to form the gate insulating film 2854, and p-type impurity ions are implanted as shown in FIG. 272. Further, a polysilicon layer for defining the gate is deposited, as shown in FIG. 273. N-type impurity ions are implanted from above to form the source 2856 and the drain 2857, and the insulating film 2858 and the interconnection film 2859 are formed to complete an n-type MOS transistor.

<Single-Crystalline Film Forming Method>

In relation to the aforementioned fabrication method, a single-crystalline film forming method (radical beam irradiation) of forming the polycrystalline thin film 2860 for defining the channel 2853 and thereafter single-crystallizing the same is now described in detail. The polycrystalline film 2860 to be single-crystallized is hereafter referred to as a sample upper film.

<Overall Structure of Single-Crystalline Film Forming Apparatus>

FIG. 274 is a front sectional view showing a structure of a single-crystalline thin film forming apparatus 2860 for effectively implementing a method of forming a single-crystalline thin film according to the embodiment of the present invention. This apparatus 2860 comprises a reaction vessel 2861, and an electron cyclotron resonance (ECR) ion generator 2862 which is built in an upper portion of the reaction vessel 2861. The ECR ion generator 2862 comprises a plasma container 2863 which defines a plasma chamber 2864 in its interior. A magnetic coil 2865 is provided around the plasma container 2863, to apply a dc high magnetic field to the plasma chamber 2864. Further, a waveguide 2866 and an inert gas inlet pipe 2867 are provided on an upper surface of the plasma container 2863 for introducing a microwave and an inert gas such as neon (Ne) or oxygen (O) into the plasma chamber 2864 respectively.

The reaction vessel 2861 defines a reaction chamber 2868 in its interior. The bottom portion of the plasma container 2863 defines an outlet 2869 for passing a plasma in its center. The reaction chamber 2868 and the plasma chamber 2864 communicate with each other through the outlet 2869. In the interior of the reaction chamber 2868, a sample holder 2870 is arranged on a position immediately under the outlet 2869. A sample 2871 provided with the oxide insulating film 2852 which is deposited on its upper surface as shown in FIG. 269 is placed on the sample holder 2870, while a reflector 2872 is placed to be located above the sample 2871. A desired single-crystalline film is formed on the sample 2871. The reflector 2872 is preferably made of a metal. The sample holder 2870 is coupled to a rotation driving mechanism (not shown), to be rotatable in a horizontal plane. Further, the sample stand 2870 can horizontally move the sample 2871 while fixing the reflector 2872.

The reaction chamber 2868 communicates with reaction gas supply pipes 2873. Reaction gases are supplied through the reaction gas supply pipes 2873, for forming a film of a prescribed material on the sample 2871 by plasma CVD. The embodiment shown in FIG. 274 is provided with three reaction gas supply pipes 2873a, 2873b and 2873c. The reaction chamber 2868 further communicates with an evacuation pipe 2874. An end of the evacuation pipe 2874 is coupled with a vacuum unit (not shown) to evacuate the reaction chamber 2868 through the evacuation pipe 2874, thereby maintaining the reaction chamber 2868 at a prescribed degree of vacuum. A vacuum gauge 2875 for displaying the degree of vacuum in the reaction chamber 2868 is provided in communication with the reaction chamber 2868.

<Structure of Reflector>

FIG. 275 is a perspective view showing an exemplary reflector 2872a. This reflector 2872a is adapted to form a single crystal having a diamond structure. The reflector 2872a defines an opening on a central portion of a flat plate type base 2881. Three blocks 2882 in the form of rectangular parallelopipeds are fixedly provided around the opening, and reflecting blocks 2883 are fixed to inner sides of the blocks 2882 respectively. Consequently, an equilateral triangular opening 2884 which is trimmed with the reflecting blocks 2883 is defined at the central portion of the base 2881. In the reflecting blocks 2883, slopes 2885 facing the opening 2884 serve as reflecting surfaces for reflecting a gas beam. Therefore, the angles of inclination of the slopes 2885 are set at proper levels in correspondence to the directions of crystal axes of the single crystal to be formed.

FIGS. 276A, 276B and 276C are a plan view, a side elevational view and a front elevational view of the reflector 2872a which is formed by the blocks 2882 and the reflecting blocks 2883 respectively. As shown in FIG. 276B, the angle of inclination of each slope 2885 is set at 55°. The reflector 2872a is in a structure not fixing the sample 2871, whereby the sample 2871 can be relatively horizontally moved with respect to the reflector 2872a. Therefore, it is possible to form a single-crystalline film on the sample 2871 having a large area by horizontally moving the sample 2871 while fixing the reflector 2872a on the sample holder 2870.

<Operation of ECR Ion Generator>

Referring again to FIG. 274, the operation of the ECR ion generator 2862 is now described. An inert gas such as Ne, O or Ar is introduced from the inert gas inlet pipe 2867 into the plasma chamber 2864, while a microwave is simultaneously introduced from the waveguide 2866 into the plasma chamber 2864. Further, a dc current is also simultaneously supplied to the magnetic coil 2865, to form a dc magnetic field in the plasma chamber 2864 and its periphery. The gas as supplied is maintained in a plasma state by actions of the microwave and the dc magnetic field. This plasma is formed by high-energy electrons which are in screw motion in the principle of cyclotron by the microwave and the dc magnetic field.

These electrons, which have diamagnetic properties, are moved to a weaker magnetic field side, to form an electron stream along a line of magnetic force. Consequently, positive ions also form an ion current along the line of magnetic force following the electron stream, in order to maintain electrical neutrality. In other words, the electron stream and the ion current are downwardly directed from the outlet 2869 into the reaction chamber 2868. The ion current and the electron stream thus flowing in parallel with each other are recombined with each other after a lapse of a deionization time, to form a neutral atom current. Therefore, substantially only a neutral atom current is formed in a position downwardly separated from the outlet 2869 beyond a prescribed distance.

FIG. 277 is a graph showing the result of relation between ion current density and the distance from the outlet 2869 actually measured when $Ar^+$ ions of 10 eV were discharged from the outlet 2869 by the ECR ion generator 2862. It is understood from this graph that the ion current density is abruptly reduced at a distance of about 4 to 5 cm from the outlet 2869, and attenuated to a level of $\frac{1}{10}$ to $\frac{1}{12}$ at a position of 14 cm. The neutral atom current is increased by such attenuation of the ion current, whereby substantially only a neutral atom current downwardly flows in a position downwardly separated from the outlet 2869 beyond a prescribed distance.

Thus, the ECR ion generator 2862 for generating ions forms an ion current in parallel with the electron stream, whereby it is possible to easily obtain a neutral atom current having high density by employing the ECR ion generator 2862, with no employment of other means for neutralizing the ion current. Since the ion current is formed in parallel with the electron stream, further, it is possible to obtain an ion current which is close to a parallel current having a regulated direction of progress substantially with no divergence. Since the parallel ion current is converted to the neutral atom current, the atom current is also close to a parallel current having a regulated direction of progress.

<Operation of Single-Crystalline Film Forming Apparatus>

Referring again to FIG. 274, the operation of the apparatus 2860 is now described. It is assumed that the reflector 2872 is implemented by the reflector 2872a shown in FIGS. 275, 276A, 276B and 276C and the sample 2871 is prepared from that provided with the oxide insulating film 2852 which is deposited on its upper surface as shown in FIG. 269, so that a polycrystalline thin film is formed on the upper surface of this sample 2871 to be thereafter single-crystallized. The reaction gas supply tubes 2873a, 2873b and 2873c supply reaction gases respectively. At this time, an inert gas of atoms having relatively small atomic weights is introduced from the inert gas inlet pipe 2867.

Due to the action of the ECR ion generator 2862, a plus ion current and an electron stream are formed downwardly from the outlet 2869. The distance between the outlet 2869 and the reflector 2872a (2872) is preferably set at a sufficient level for substantially converting the plus ion current to a neutral atom current. The reflector 2872a (2872) is set in a position receiving the downwardly directed Ne atom current. Silane gas which is supplied from the reaction gas supply tube 2873a is dashed against the sample 2871 by the plus ion current or the atom current. Consequently, a plasma CVD reaction progresses on the upper surface of the sample 2871, to grow a sample upper surface film of a polycrystalline structure.

At this time, the sample 2871 is not heated but maintained substantially at an ordinary temperature, whereby the polycrystalline thin film is grown substantially under the ordinary temperature. In other words, the polycrystalline thin film is formed at a temperature not more than a level facilitating crystallization by plasma CVD.

A part of the downwardly directed atom current of Ne or the like is reflected by the three slopes 2885 which are formed in the reflector 2872a, to be incident upon the upper surface of the sample 2871 through the opening 2884. Another part of the atom current is not incident upon the slopes 2885 but directly incident upon the upper surface of the sample 2871 through the opening 2884. In other words, the polycrystalline thin film being formed on the upper surface of the sample 2871 is irradiated with four atom current components, i.e., a component straightly received from the outlet 2869 and three components reflected by the three slopes 2885. Since the angles of inclination of the slopes 2885 are set at 55°, directions of incidence of the four atom current components correspond to four directions which are perpendicular to four independent densest crystal planes of the single crystal to be formed, i.e., (111) planes.

The energy of the plasma which is formed by the ECR ion generator 2862 is so set that the atoms reaching the sample 2871 are at energy levels causing no sputtering in the polycrystalline thin film, i.e., levels lower than a value (=27 eV) which is known as the threshold energy level in sputtering of Si, for example, by irradiation with atoms. Therefore, the so-called law of Bravais acts on the as-grown polycrystalline thin film. Namely, molecules in the polycrystalline thin film are rearranged so that planes which are perpendicular to the atom current components applied to the polycrystalline thin film define densest crystal planes. Since the atom current as applied has four components which are incident in directions corresponding to those perpendicular to densest planes of a single-crystalline film having a single crystal orientation, the molecules are so rearranged that all planes perpendicular to the directions of incidence of the respective components define the densest planes. The directions of the (111) planes are controlled by the plurality of atom current components having directions of incidence which are independent of each other, whereby a single-crystalline film having a single crystal orientation is formed by such rearrangement of the molecules. In other words, the polycrystalline thin film being grown by plasma CVD is sequentially converted to a single-crystalline film having a regulated crystal orientation.

As hereinabove described, the sample 2871 is not heated and the single-crystalline film is formed under a temperature which is lower than that facilitating crystallization by plasma CVD. This is because the crystal orientation is arbitrarily directed regardless of the directions of the atom current components and cannot be controlled while a polycrystal is inevitably formed under a high temperature facilitating crystallization of molecules by plasma CVD alone with no application of the atom current.

As hereinabove described, relatively light Ne is preferably selected as an element forming the atom current which is applied to the single-crystalline film. This is because Ne atoms hardly penetrate into the single-crystalline film to remain in the same since there is a high probability that relatively heavy molecules rearwardly scatter the relatively light Ne atoms when the single-crystalline film is irradiated with the atom current. Further, the element for forming the atom current as applied is prepared from an inactive element since the inactive element forms no compound with either original molecules or as-doped impurities even if the same remains in the single-crystalline film and hardly exerts an influence on electronic/physical properties of the single-crystalline film, while the same can be easily removed to the exterior when the as-formed single-crystalline film is increased in temperature to some extent.

As hereinabove described, the reflector 2872 is preferably made of a metal, since $Ne^+$ ions are converted to neutral atoms when an $Ne^+$ ion current which is slightly mixed in the neutral atom current is reflected by the conductive reflector 2872, so that the sample 2871 is irradiated with the as-converted neutral atom current. The neutral atom current is advantageously incident upon the sample 2871 as a flow having a regulated direction since its direction of progress hardly diverges dissimilarly to an ion current.

In the apparatus 2860, conversion to a single crystal sequentially progresses at the same time in the process of growth of the polycrystalline thin film by plasma CVD. Thus, it is possible to form a single-crystalline film having a large thickness under a low temperature. Since a single-crystalline film can be formed under a low temperature, it is possible to further form a new single-crystalline film on a sample which is already provided with a prescribed device without changing properties of the device, for example.

While the aforementioned method utilizes CVD, a gel solution of a mixture of an organic compound of the component elements may be applied by a spinner, fired and irradiated with radical beams similarly to the above, when the film is prepared by a sol-gel method.

In the aforementioned embodiment, the polycrystalline thin film may be formed once to be thereafter single-crystallized since the sample upper surface film is preferably formed as thin as possible. When a constant thickness is required for the single-crystalline film, on the other hand, it is possible to obtain a stable single-crystalline thin film having high homogeneity even if the thickness is increased, by forming a single-crystalline thin film by the aforementioned method and growing a single-crystalline film on the upper surface of the single-crystalline thin film serving as a seed crystal, or repeating the aforementioned method a plurality of times.

When radical beam irradiation is employed as hereinabove described, it is possible to easily single-crystallize the channel 2853 which is provided on the upper surface of the oxide insulating film 2852 in a semiconductor device of a MIS structure utilizing the oxide insulating film 2852 for insulation/isolation. Thus, it is possible to improve electron mobility in the channel 2853 and reduce the resistance value when the transistor is turned on, while it is possible to prevent occurrence of a leakage current by a regular crystal structure thereby reducing an OFF-state current when the transistor is turned off. In the aforementioned radical beam irradiation, further, it is possible to obtain excellent characteristics through a low-priced apparatus while preventing the crystal from a large defect since an ion beam or an atomic beam of extremely low energy may be applied. Particularly according to this embodiment, it is possible to omit a step of cladding wafers as compared with Prior Art 26, thereby lowering the cost with reduction of the fabrication time.

According to this embodiment, further, it is possible to stably improve electric characteristics of the transistor by regulating the crystal structure, even if the transistor is reduced to about 100 Å in thickness. Thus, it is possible to set parasitic capacitance at a small level.

Thus, it is possible to easily increase an ON-OFF drain current ratio and improve electric characteristics at a low cost.

(Thirty-Fifth Embodiment)

<Structure>

FIG. 278 shows a semiconductor device according to a thirty-fifth embodiment of the present invention. The semiconductor device according to this embodiment comprises an Si substrate and a MOS transistor which is formed thereon, similarly to the thirty-fourth embodiment. Referring to FIG. 278, numeral 2891 denotes the Si substrate, numeral 2892 denotes a LOCOS oxide film, numeral 2893 denotes a gate insulating film, numeral 2894 denotes a gate of polysilicon, numeral 2895 denotes a source, numeral 2896 denotes a drain, numeral 2897 denotes a first insulating film of silicon glass such as NSG, PSG or BPSG, numeral 2898 denotes an interconnection film, numeral 2899 denotes a second insulating film (interlayer isolation film), and numeral 2901 denotes a flattening film for an etchback operation which is made of spin-on-glass (SOG). The second insulating film 2899 and the flattening film 2903 are provided with a contact hole 2903 for connecting an upper interconnection film with the interconnection film 2898. The gate insulating film 2893, the source 2895, the drain 2896, the interconnection film 2898, the second insulating film 2899 and the flattening film 2901 are prepared from single-crystalline films respectively. Due to the single-crystalline structures of the source 2895 and the drain 2896 in particular, it is possible to reduce a leakage current which is caused by crystal defects in employment.

<Fabrication Method>

The semiconductor device having the aforementioned structure is fabricated as follows: As shown in FIG. 279, the thick LOCOS oxide film 2892 for insulation is formed on an upper surface of the Si substrate 2891 by a LOCOS method, and thereafter the gate insulating film 2893 is formed by thermal oxidation in a thickness of not more than 200 Å. Thereafter ions of P, As or B are implanted to control the threshold value of the transistor.

Then, He atoms or Ne atoms are applied from desired directions by radical beam irradiation similarly to the thirty-fourth embodiment, to recover crystal defects of the gate insulating film 2893 caused in the previous ion implantation without damaging the wafer, as shown in FIG. 280. At this time, it is possible to prevent the wafer from damage by employing atoms which are smaller in mass than the Si atoms forming the wafer and applying the beams at low energy levels of about 10 eV. The current treatment temperature is set to be not more than 800° C., to cause no impurity diffusion. Thus, the as-implanted ions are neither diffused nor incorporated in the gate insulating film 2893, whereby it is possible to accurately control the threshold value of the high-quality gate insulating film 2893. Consequently, it is possible to prevent carrier trap in the film interface and occurrence of a leakage current, thereby remarkably improving the insulating film withstand voltage.

Polysilicon is deposited on an upper surface of the gate insulating film 2893 by CVD or the like, and thereafter the gate 2894 is formed through lithography and etching steps. At this time, a part of the gate insulating film 2893 is simultaneously etched to upwardly expose parts of the Si substrate 2891. Then, ions of P, As, B or $BF_2$ are implanted as shown in FIG. 281, to form the source 2895 and the drain 2896 in the as-exposed regions.

Thereafter He atoms or Ne atoms are applied from desired directions by radical beam irradiation similarly to the thirty-fourth embodiment as shown in FIG. 282, to recover crystal defects of the source 2895 and the drain 2896 caused in the previous ion implantation and activate the as-implanted impurity at a low temperature. This treatment can be performed at a temperature of not more than 800° C., whereby it is possible to substantially suppress impurity diffusion, thereby implementing shallow junction.

Then, the insulating film 2897 of silicon glass such as NSG, PSG or BPSG is deposited by CVD or the like, and thereafter a contact hole is formed on an upper surface of the Si substrate 2891 or the gate 2894 at desire by a contact step. Thereafter Al—Si or Al—Si—Cu is deposited by sputtering or the like to form the interconnection film 2898, as shown in FIG. 283. Before the formation of the insulating film 2897, a thin thermal oxide film may be formed on a part of the upper surface of the Si substrate 2891 and the upper surface of the gate 2894.

Then, He atoms or Ne atoms are applied from desired directions by radical beam irradiation similarly to the thirty-fourth embodiment as shown in FIG. 283, to regulate crystal orientation of the interconnection film 2898 and single-crystallize the same, whereby the interconnection film 2898 is improved in migration withstand voltage. At this time, the treatment temperature is set to be not more than 600° C., so that the as-employed material of Al—Si or Al—Si—Cu is not melted. Thus, it is possible to form an interconnection layer which is excellent in (111) orientation by a single Al alloy layer.

Then the interconnection film 2898 is patterned as shown in FIG. 284, thereafter NSG, PSG or BPSG, or a multilayer film thereof is deposited by CVD or the like, and the flattening film 2901 is applied by a spinner method, as shown in FIG. 278. Then, the flattening film 2901 is sintered at a temperature of not more than 600° C. to convert the same to an oxide film by scattering an organic solvent. Thereafter He atoms or Ne atoms are applied from desired directions by radical beam irradiation similarly to the thirty-fourth embodiment, so that the second insulating film 2899 is identical in crystallinity to the flattening film 2901. Thereafter the overall surface is etched back to be flattened. In this etching step, the second insulating film 2899 and the flattening film 2901 are at the same etching rates to facilitate the flattening step since these films are identical in crystallinity to each other through the radical beam irradiation. Thereafter the contact hole 2903 is formed by selective etching through the upper surface of the flattening film 2901 and the second insulating film 2899 to reach the upper surface of the interconnection film 2898. In this etching step, the second insulating film 2899 and the flattening film 2901 are at the same etching rates since these films are identical in crystallinity to each other through the radical beam irradiation, whereby the contact hole 2903 can be easily formed. Thereafter a second layer interconnection film 2902 is formed by Al—Si or Al—Si—Cu, to finally complete the semiconductor device as shown in FIG. 285.

(Thirty-Sixth Embodiment)

FIG. 286 shows a fabrication step for a semiconductor device (MOS transistor) according to a thirty-sixth embodiment of the present invention. Referring to FIG. 286, numeral 2911 denotes an Si substrate, numeral 2912 denotes a source, numeral 2913 denotes a drain, numeral 2914 denotes a gate insulating film, and numeral 2915 denotes a gate. The gate insulating film 2914 is prepared from a material (high dielectric substance) having a high dielectric constant such as PZT, PLZT or BST, or a material (ferroelectric substance) generating remanence. This gate insulating film 2914 is formed by CVD or spinner application/sintering of an organic solution of the aforementioned component. The gate insulating film 2914 is temporarily formed in a polycrystalline or amorphous structure, and thereafter converted to a single-crystalline film by radical beam irradiation through Ne or the like, as hereinabove described. The gate insulating film 2914 is about 1000 to 3000 Å in thickness, in excess of 10 times as compared with those of Prior Art 28 and Prior Art 29 having thicknesses of 100 Å. Thus, it is possible to prevent the gate insulating film 2914 from deterioration when hot electrons are injected into the gate 2915. Further, it is possible to prevent carrier trap in the film interface and occurrence of a leakage current by single-crystallizing the gate insulating film 2914, thereby remarkably improving the insulating film withstand voltage.

Thereafter an insulating film (not shown) is deposited on the overall surfaces of the gate 2915, the source 2912 and the drain 2913, contact holes (not shown) are formed on portions of the insulating film immediately above the source 2912 and the drain 2913, and a metal interconnection film is formed over the contact holes and a part of an upper surface of the insulating film, thereby fabricating a MIS or MFS transistor.

According to this embodiment, a constant thickness is required for the gate insulating film 2914 as a single-crystalline film, and hence a homogeneous and stable single-crystalline film cannot be formed by simply forming a polycrystalline thick film once and thereafter single-crystallizing the same dissimilarly to the thirty-fourth embodiment, since energy levels of the as-applied atoms are attenuated in an intermediate stage. Therefore, an extremely thin single-crystalline thin film is first formed and a single-crystalline film is grown on an upper surface of the thin film serving as a seed crystal, or the aforementioned formation of a single-crystalline thin film by radical beam irradiation is repeated a plurality of times, so that a stable single-crystalline film having high homogeneity can be obtained even if the single-crystalline film has a relatively large thickness. While this embodiment is related to an n-type transistor, a p-type transistor can also be fabricated by an absolutely similar method, as a matter of course.

According to this embodiment, a semiconductor device (MOS transistor) can be formed by a high dielectric film of BST or PLZT. The gate insulating film 2914 of a high dielectric substance can be formed by controlling a composition ratio of $BaTiO_3$ when BST is employed, or controlling an amount of La when PLZT is employed, in particular.

(Thirty-Seventh Embodiment)

FIG. 287 shows a semiconductor device (NPN bipolar transistor) according to a thirty-seventh embodiment of the present invention. Referring to FIG. 287, numeral 2921 denotes an n-type collector, numeral 2922 denotes a p-type base, numeral 2923 denotes an n-type emitter, numeral 2924 denotes a first insulating film for defining an area of the base 2922 which is in contact with the collector 2921, and numeral 2925 denotes a second insulating film for defining an area of the emitter 2923 which is in contact with the base 2922. According to this embodiment, an impurity such as B is introduced into the base 2922 and impurity ions of P or As are introduced into the emitter 2923 simultaneously when the base 2922 and the emitter 2923 are formed in polycrystalline or amorphous structures by CVD or the like. While such impurities are diffused and activated by a heat treatment in Prior Art 30, the base 2922 and the emitter 2923 are low-temperature activated by radical beam irradiation (single-crystalline film formation) similarly to the thirty-fourth embodiment under low temperature environment of not more than 800° C. after introduction of the impurities, dissimilarly to Prior Art 30. The temperature of not more than 800° C. is so selected that the as-introduced impurities are not diffused. When the base 2922 and the emitter 2923 are irradiated with beams by radical beam irradiation under such low temperature environment, target atoms jump out in the single-crystalline films 2922 and 2923 by impacts of local irradiation heat caused by the beam irradiation, so that the impurities are activated with no diffusion by sputtering phenomenons (thermal spike) including movement of a number of particles contained in the targets. Thus, no high-temperature treatment is required and hence the films 2921, 2922 and 2923 can be activated with no impurity diffusion. Consequently, the thicknesses and activation characteristics of the films 2921, 2922 and 2923 can be accurately controlled to reduce characteristic dispersion of the semiconductor device.

Further, the base 2922 and the emitter 2923 are single-crystallized, whereby electron mobility can be improved to reduce the resistance when the transistor is turned on, while occurrence of a leakage current can be prevented to suppress current consumption by regulating the crystal structure when the transistor is turned off. In other words, it is possible to provide a high-characteristic semiconductor device having a high ON-OFF ratio of a collector current.

<Other Embodiments>

(1) In each of the first to the eleventh embodiments, the ECR ion generator may be replaced by another ion source such as a Cage type or Kaufmann type one. In this case, however, flow of the as-formed ion current is problematically diffused by repulsion caused by static electricity between ions, leading to reduction of directivity. When the ion current is directly applied to the substrate 11, further, an electrical insulating substrate cannot be employed since progress of irradiation is disabled due to storage of charges in the substrate 11. Therefore, it is necessary to provide means for neutralizing ions and converting the same to an atom current in a path of the ion current. Alternatively, the reflector 12 may be made of a conductive material such as a metal, to simultaneously carry out reflection of the ion current and conversion to a neutral atom current. In an apparatus comprising the ECR ion generator, on the other hand, a neutral atom current can be easily obtained in a form close to a parallel current with no employment of means for neutralizing the ion current. Therefore, the thin film can be easily irradiated with an atom current having high incidence angle accuracy. Since a neutral atom current is mainly incident upon the thin film, further, the substrate 11 can be prepared from an insulating substrate such as an $SiO_2$ substrate.

(2) In each of the first to the eleventh embodiments, the substrate 11 may be irradiated with a molecular current or an ion current, in place of a neutral atom current. Namely, the same may be irradiated with a gas beam in general. It is possible to form a single-crystalline thin film also in this case. When the substrate is irradiated with an ion current, however, an electrical insulating substrate cannot be employed, as hereinabove described.

(3) While reaction gases are supplied under a low temperature below a crystallization temperature and beams are simultaneously applied from directions which are perpendicular to densest crystal planes of a plurality of different directions for forming each single-crystalline film in the radical beam irradiation in each of the twelfth and thirteenth embodiments, an amorphous or polycrystalline thin film may alternatively be formed previously so that the same is irradiated with beams from directions which are perpendicular to densest planes of a plurality of different directions under a low temperature below a crystallization temperature to form each single-crystalline film.

(4) In each of the twelfth and thirteenth embodiments, while the first and second semiconductor films 2012 and 2014 are prepared from GaAs as group III–V compound semiconductors, the first semiconductor film 2012 may be prepared from n-type InP, or the second semiconductor film 2014 may be prepared from p-type InP, in place of GaAs. In this case, $(CH_3)_3In$, $PH_3$ and $H_2Te$ are supplied from the reaction gas supply pipes 2073a, 2073b and 2073c respectively for forming the first semiconductor (n-type InP) film 2012 in formation of an amorphous or polycrystalline thin film by the radical beam irradiation. In formation of the second semiconductor (p-type InP) film 2014, on the other hand, the reaction gas supply pipe 2073 may supply $Zn(CH_3)_2$, in place of $H_2Te$. Other structure and the manufacturing method are similar to those of the twelfth embodiment, and hence redundant description is omitted.

(5) While group III–V compound semiconductors are employed in the twelfth embodiment, the same may be replaced by group II–VI compound semiconductors such as CdS, CdTe or ZnTe.

When CdS is employed, i.e., when the first semiconductor 2012 is prepared from n-type CdS or the second semiconductor film 2014 is prepared from p-type CdS, a gaseous compound such as $Cd(CH_3)_2$, $SF_6$ and $AgR\{P(C_2H_5)_3\}$ are supplied from the reaction gas supply pipes 2073a, 2073b and 2073c for forming the semiconductor (n-type CdS) film 2012 in formation of an amorphous or polycrystalline thin film by the radical beam irradiation.

When CdTe is employed, i.e., when the first semiconductor film 2012 is prepared from n-type CdTe or the second semiconductor film 2014 is prepared from p-type CdTe, on the other hand, a gaseous compound such as $Cd(CH_3)_2$, $TeH_2$ gas and a gaseous compound of halogen are supplied from the reaction gas supply pipes 2073a, 2073b and 2073c respectively for forming the first semiconductor (n-type CdTe) film 2012 in formation of an amorphous or polycrystalline thin film by the radical beam irradiation. In formation of the second semiconductor (p-type CdTe) film 2014, on the other hand, the reaction gas supply pipe 2073c may supply a group I gaseous compound, in place of the gaseous compound of halogen. When ZnTe is employed, i.e., when the first semiconductor film 2012 is prepared from n-type ZnTe or the second semiconductor film 2014 is prepared from p-type ZnTe, a gaseous compound such as $Zn(CH_3)_2$, $TeH_2$ gas and a gaseous compound of halogen are supplied from the reaction gas supply pipes 2073a, 2073b and 2073c respectively for forming the first semiconductor (n-type ZnTe) film 2012 in formation of an amorphous or polycrystalline thin film by the radical beam irradiation. In formation of the second semiconductor (p-type ZnTe) film 2014, on the other hand, the reaction gas supply pipe 2073c may supply a group I gaseous compound, in place of the gaseous compound of halogen.

(6) While the group II–VI compound semiconductors such as CdS or CdTe are employed in the thirteenth embodiment, the same may be replaced by group III–V compound semiconductors such as GaAs, similarly to the twelfth embodiment.

(7) While the interlayer conductor 2025 is prepared from a thin tungsten film in the thirteenth embodiment, the same may alternatively be prepared from a thin film of titanium silicide, tungsten silicide or platinum silicide, or a transparent electrode of ITO (indium tin oxide) or the like. It is possible to improve light efficiency of the solar cell by improving transparency of the interlayer conductor 2025 through such a material.

(8) While a lens for improving light absorption efficiency is omitted in each of the twelfth and thirteenth embodiments, a condensing member such as a general circular or linear Fresnel lens may be integrally fixed to the solar cell.

(9) While each semiconductor film is formed in an amorphous state by CVD to be thereafter single-crystallized in each of the twelfth and thirteenth embodiments, the same may alternatively be formed in an amorphous state by screen printing, to be thereafter single-crystallized.

(10) In each of the fourteenth to twentieth embodiments, while the radical beam irradiation of supplying a reaction gas under a low temperature of less than a crystallization temperature and simultaneously applying beams from directions which are perpendicular to densest crystal planes of a plurality of different directions for formation of every single-crystalline film in each of the fourteenth, fifteenth, sixteenth and seventeenth embodiments, an amorphous thin film may be previously formed so that beams are applied from directions which are perpendicular to densest crystal planes of a plurality of different directions under a low temperature of less than a crystallization temperature to form a single-crystalline film, as to formation of every or partial single-crystalline film.

(11) In each of the fourteenth to twentieth embodiments, while each semiconductor layer is formed in an amorphous state by CVD and thereafter single-crystallized in each of the aforementioned embodiments, the same may be formed in an amorphous state by screen printing, to be thereafter single-crystallized.

(12) In each of the fourteenth to twentieth embodiments, while the first and second semiconductor layers 2153 and 2154 are formed by single-crystalline films in the fifteenth embodiment, one of these layers may be formed by a polycrystalline film. While the first, second and third semiconductor layers 2193, 2203, 2194, 2204, 2196 and 2206 are formed by single-crystalline films in the sixteenth and seventeenth embodiments, any ones of these layers may be formed by polycrystalline films. In this case, each polycrystalline film may be formed by supplying a reaction gas under a low temperature of less than a crystallization temperature and simultaneously applying a beam from a direction which is perpendicular to a densest crystal plane, by previously forming an amorphous thin film and applying a beam from one direction which is perpendicular to a densest crystal plane under a low temperature of less than a crystallization temperature, or by selectively applying either method to every forming member.

(13) In each of the eighteenth, nineteenth and twentieth embodiments, every polycrystalline film may be formed by supplying a reaction gas under a low temperature of less than a crystallization temperature and simultaneously applying a beam from one direction which is perpendicular to a densest crystal plane, or every or partial polycrystalline film may be formed by previously forming an amorphous thin film and applying a beam from one direction which is perpendicular to a densest crystal plane under a low temperature of less than a crystallization temperature.

(14) In each of the fourteenth to twentieth embodiments, while the transparent conductive oxide film is formed on the transparent substrate of glass for serving as an undermost layer substrate so that the semiconductor layers are successively formed from that provided on the photoreceiving side to that provided on the light travelling direction side in each of the fourteenth, fifteenth and sixteenth embodiments, the back electrode may be formed by a substrate such as a semi-texture structure (SuS) layer so that the semiconductor layers are successively formed thereon from that provided on the light travelling direction side to that provided on the photoreceiving side. In this case, the first and third semiconductor layers may be arranged on the light travelling direction side and the photoreceiving side respectively.

(15) In each of the fourteenth to twentieth embodiments, while the first conductivity type first semiconductor layer provided on the photoreceiving side is of a p type and the second conductivity type second semiconductor layer is of an n type in each of the aforementioned embodiments, the first and second conductivity types may be of n and p types respectively.

(16) In each of the fourteenth to twentieth embodiments, while the transparent substrate of glass is provided on the photoreceiving side in each of the aforementioned embodiments, the transparent substrate provided on the photoreceiving side may be omitted when the semiconductor layers are successively formed on a substrate of a semi-texture structure layer from that provided on the light travelling direction side to that provided on the photoreceiving side as in the seventeenth or twentieth embodiment, for example.

(17) In each of the twenty-first to twenty-seventh embodiments, while an amorphous thin film is previously formed and irradiated with beams from directions perpendicular to densest crystal planes of a plurality of different directions under a low temperature below a crystallization temperature thereby forming a single-crystalline film in the radical beam irradiation in each of the aforementioned embodiments, a polycrystalline thin film may alternatively be previously formed to be irradiated with beams from directions perpendicular to densest crystal planes of a plurality of different directions under a low temperature below a crystallization temperature for forming a single-crystalline film.

(18) In each of the twenty-first to twenty-seventh embodiments, alternatively, a single-crystalline film may be formed in radical beam irradiation by supplying a reaction gas under a low temperature below a crystallization temperature and simultaneously applying beams from directions perpendicular to densest crystal planes of a plurality of different directions.

(19) While the twenty-sixth embodiment employs the n-channel MFSFET structure as shown in FIG. 202, this semiconductor device may alternatively be formed by a p-channel MFSFET.

(20) In each of the twenty-first to twenty-seventh embodiments, when the memory cells have sufficient drivability, the bias selector circuit 2433 shown in FIG. 205 may be omitted so that the bias voltage (Vref) is regularly applied.

(21) In each of the twenty-first to twenty-seventh embodiments, while the gate insulating film is formed by a single-layer film in each of the aforementioned embodiments, this film may alternatively be formed by a multilayer film.

(22) While the silicon oxide film and TFT are stacked on the semiconductor substrate of silicon serving as a first substrate in the twenty-fourth embodiment, a low-priced substrate of glass, for example, may be employed since it is absolutely unnecessary to take the material for the underlayer into consideration in the aforementioned radical beam irradiation.

(23) In the twenty-eighth, twenty-ninth and thirtieth embodiments, while an amorphous thin film is previously formed and irradiated with beams from directions perpendicular to densest crystal planes of a plurality of different directions under a low temperature below a crystallization temperature to form a single-crystalline film, a polycrystalline thin film may alternatively be formed in advance so that the same is irradiated with beams from directions perpendicular to densest crystal planes of a plurality of different directions under a low temperature below a crystallization temperature for forming a single-crystalline film.

(24) Alternatively, in the twenty-eighth, twenty-ninth and thirtieth embodiments, a reaction gas may be supplied under a low temperature below a crystallization temperature with simultaneous beam irradiation from directions perpendicular to densest crystal planes of a plurality of different directions to form a single-crystalline film in radical beam irradiation.

(25) While an Si (semiconductor) substrate is employed in the twenty-eighth embodiment, an insulating substrate of glass or the like may alternatively be employed.

(26) While the insulating film is formed on the upper surface of the gate on the substrate side in the twenty-eighth embodiment, the insulating film may alternatively be formed on upper surfaces of the source and the drain on the substrate side, so that the gate is formed on the upper surface of the insulating film.

(27) In each of the thirty-first embodiment to the thirty-third embodiment, the active layer 2661 of the TFT 3854 may be prepared from another crystalline semiconductor such as GaAs or GaN, for example, in place of the crystalline Si. Also in this case, an effect similar to that in employment of the crystalline Si is attained. Namely, it is possible to implement both of high picture quality and a low cost.

(28) In each of the thirty-first embodiment to the thirty-third embodiment, in order to form the crystalline Si thin film, the ECR ion source may be replaced by another ion source such as a Cage type or Kaufmann type one. In this case, however, flow of the as-formed ion current is problematically diffused by repulsion caused by static electricity between ions, leading to reduction of directivity. Further, the ion current cannot be directly applied to the glass substrate 2641, since progress of irradiation is disabled due to storage of charges in the electrically insulating glass substrate 2641. Therefore, it is necessary to provide means for neutralizing ions and converting the same to an atom current in a path of the ion current. Alternatively, the reflector 2622 may be made of a conductive material such as a metal, to simultaneously carry out reflection of the ion current and conversion to a neutral atom current, although the efficiency is inferior to the above.

In the apparatus comprising the ECR ion source, on the other hand, a neutral atom current can be easily obtained with no employment of means for neutralizing the ion current in a form which is close to a parallel current. Therefore, the thin film can be easily irradiated with an atom current having high incidence angle accuracy. Since a neutral atom current is mainly incident upon the thin film, further, it is possible to employ an insulating substrate such as the glass substrate 2641.

(29) In each of the thirty-first embodiment to the thirty-third embodiment, further, the ECR ion source may be replaced by a beam source which generates a neutral atom current or a neutral radical current. Such a beam source generating a neutral atom current or a radical current has already been on the market. Since a beam of neutral atoms or radicals can be obtained by employing this beam source, it is possible to form a single-crystalline thin film on an electrically insulating substrate 264 with no requirement for means for neutralizing an ion current, similarly to the case of employing an ECR ion source.

(30) In each of the thirty-first embodiment to the thirty-third embodiment, the glass substrate 2641 may be irradiated with a molecular flow or an ion current, in place of a neutral atom current. Namely, the same may be irradiated with a gas beam in general. It is possible to form a single-crystalline thin film also in this case. In order to employ an electrically insulating substrate as described above, however, it is preferable to apply a neutral atom current or molecular flow.

(31) In each of the thirty-fourth to thirty-seventh embodiments, while a polycrystalline thin film is previously formed and irradiated with beams from directions perpendicular to densest crystal planes of a plurality of different directions under a low temperature below a crystallization temperature to form a single-crystalline film, an amorphous thin film may alternatively be formed in advance so that the same is irradiated with beams from directions perpendicular to densest crystal planes of a plurality of different directions under a low temperature below a crystallization temperature.

(32) In each of the thirty-fourth to thirty-seventh embodiments, alternatively, a reaction gas may be supplied under a low temperature below a crystallization temperature with simultaneous beam irradiation from directions perpendicular to densest crystal planes of a plurality of different directions to form a single-crystalline film in radical beam irradiation.

(33) While the gate insulating film 2914 is prepared from a high dielectric substance in the aforementioned thirty-sixth embodiment, a memory transistor (EPROM or flash EPROM) for an electrically writable and erasable non-volatile memory can be prepared through polarization of the gate insulating film 2914 if the same is prepared from a ferroelectric substance in place of the high dielectric substance. A ferroelectric film, which diverges at a certain critical temperature (Curie temperature) to cause phase transition and generate spontaneous dielectric polarization since its crystal dielectric constant is increased with temperature reduction, is prepared from PZT which is a mixed crystal of $PbZrO_3$ and $PbTiO_3$ or BST which is a mixed crystal of $BaTiO_3$ and $SrTiO_3$. Such a material has either a perovskite structure or a pyrochlore structure, a perovskite crystal system is preferably employed since a pyrochlore system has a low dielectric constant. In this case, the memory transistor can be in the MIS structure shown in FIG. 286, to be implementable through a simple process as compared with Prior Art 29 shown in FIG. 297.

(34) While the thirty-fourth to thirty-seventh embodiments have been described with reference to a MOS transistor, an EPROM or a flash EPROM, and a bipolar transistor respectively, a circuit having a complicated structure such as BiCMOS can be relatively easily fabricated in addition to the structures of the aforementioned embodiments and a circuit of high performance can be fabricated at a low cost by employing the aforementioned method of single-crystallizing the respective films by radical beam irradiation since fine portions can be relatively easily single-crystallized to attain high characteristics.

(35) With respect to any one of the micromachine according to the first to the eleventh embodiments, the solar battery according to the twelfth to the twentieth embodiments, the memory according to the twenty-first to the twenty-seventh embodiments, the semiconductor device according to the twenty-eighth to the thirtieth embodiments, the liquid crystal display according to the thirty-first to the thirty-third embodiments and the semiconductor device according to the thirty-fourth to the thirty-seventh embodiments, the step of crystallizing the prescribed material may comprise: the step of depositing the prescribed material under a low temperature causing no crystallization of the prescribed material and simultaneously irradiating the prescribed material Which is being deposited with a gas beam of low energy causing no sputtering of the prescribed material from one direction, thereby forming an axially oriented polycrystalline thin film; and the step of irradiating the axially oriented polycrystalline thin film with gas beams of low energy causing no sputtering of the prescribed material under a high temperature below a crystallization temperature of the prescribed material from different directions in the single-crystalline thin film to be formed which are perpendicular to a plurality of densest crystal planes, thereby converting the polycrystalline thin film into a single-crystalline thin film.

In this case, even if the beams from the plurality of the directions fail to uniformly irradiate the substrate, it is possible to form either at least a single-crystalline thin film or an axially oriented polycrystalline thin film of the prescribed material on every portion of the substrate partly because the substrate has a cubic structure and partly because of other reasons. Further, since there is irradiation of the beams at least from one direction, it is possible to cause crystallization in a considerably large region including crystallization in the horizontal direction.

(36) Alternatively, with respect to any one of the micromachine according to the first to the eleventh embodiments, the solar battery according to the twelfth to the twentieth embodiments, the memory according to the twenty-first to the twenty-seventh embodiments, the semiconductor device according to the twenty-eighth to the thirtieth embodiments, the liquid crystal display according to the thirty-first to the thirty-third embodiments and the semiconductor device according to the thirty-fourth to the thirty-seventh embodiments, the step of crystallizing the prescribed material may be a method of forming a single-crystalline thin film semiconductor layer on the substrate. In this step, preferably, an amorphous thin film or a polycrystalline thin film of the semiconductor layer is formed on the substrate in advance. Further, gas beams of low energy causing no sputtering of the semiconductor layer are preferably irradiated at a high temperature below a crystallization temperature of the semiconductor layer upon the amorphous or the polycrystalline thin film from different directions in the single-crystalline thin film to be formed which are perpendicular to the plurality of the densest crystal planes.

In this case, even if the beams from the plurality of the directions fail to uniformly irradiate the substrate, it is possible to form either at least a single-crystalline thin film or an axially oriented polycrystalline thin film of the prescribed material on every portion of the substrate partly because the substrate has a cubic structure and partly because of other reasons. Further, since there is irradiation of the beams at least from one direction, it is possible to cause crystallization in a considerably large region including crystallization in the horizontal direction.

While the invention has been shown and described in detail, the foregoing description is in all aspects illustrative and not restrictive. It is therefore understood that numerous modifications and variations can be devised without departing from the scope of the invention.

What is claimed is:

1. A solar cell comprising:

a first junction part having a first conductivity type first semiconductor film and a second conductivity type second semiconductor film being formed on an upper surface of said first semiconductor film; and a second junction part having a first conductivity type third semiconductor film being formed on an upper surface of said second semiconductor film and a second conductivity type fourth semiconductor film being formed on an upper surface of said third semiconductor film, said junction parts being arranged from that having a larger forbidden bandwidth along a direction of progress of light, said first, second, third and fourth semiconductor films being formed by single-crystalline films;

wherein an interlayer conductor prepared from a metal having an ohmic junction property with respect to said junction parts and having a thickness capable of transmitting light is interposed between said first and second junction parts; and wherein said second semiconductor film being arranged on one side of said interlayer conductor is different in crystal orientation from said third semiconductor film being arranged on another side of said interlayer conductor.

2. A solar cell in accordance with claim 1, further comprising:

a substrate;

a first electrode being connected to said first semiconductor film and being formed on an upper surface of said substrate; and a second electrode being connected to said fourth semiconductor film.

3. A solar cell in accordance with claim 1, wherein each said single-crystalline film is formed by supplying reaction gases at a low temperature below a crystalline temperature and simultaneously applying beams from a plurality of directions being perpendicular to densest crystal planes of a plurality of different directions of single-crystalline film to be formed.

4. A solar cell in accordance with claim 1, wherein each said single-crystalline film is formed by applying beams from a plurality of directions being perpendicular to densest crystal planes of a plurality of different directions of single-crystalline film to be formed at a low temperature below a crystallization temperature of a previously formed amorphous or polycrystalline thin film.

5. A solar cell in accordance with claim 1, wherein each said single-crystalline film is prepared from a group II–VI compound.

6. A solar cell in accordance with claim 1, wherein each said single-crystalline film is prepared from a group III–V compound.

* * * * *

UNITED STATES PATENT AND TRADEMARK OFFICE
CERTIFICATE OF CORRECTION

PATENT NO. : 5,738,731
DATED : April 14, 1998
INVENTOR(S) : Masahiro SHINDO, et al.

It is certified that error appears in the above-identified patent and that said Letters Patent is hereby corrected as shown below:

On the title page, item [54] and on top of column 1, the title should be:

--[54] PHOTOVOLTAIC CELL DEVICE--

On the title page, item [30] Foreign Application Priority Data, the 8th priority should read:

--Feb. 9, 1994 [JP] Japan ......... 6-15505--

Signed and Sealed this

Twenty-eighth Day of July, 1998

Attest:

BRUCE LEHMAN

*Attesting Officer*  *Commissioner of Patents and Trademarks*